US006811608B1

(12) United States Patent
Stewart et al.

(10) Patent No.: US 6,811,608 B1
(45) Date of Patent: Nov. 2, 2004

(54) METHOD AND SYSTEM FOR CREATING A CRYSTALLIZATION RESULTS DATABASE

(75) Inventors: Lansing J. Stewart, Bainbridge Island, WA (US); Hidong Kim, Bainbridge Island, WA (US); Lucius B. C. A. Fleuchaus, Bellevue, WA (US); Paul M. Dunn, Bainbridge Island, WA (US)

(73) Assignee: Emerald Biostructures, Inc., Bainbridge Island, WA (US)

( * ) Notice: Subject to any disclaimer, the term of this patent is extended or adjusted under 35 U.S.C. 154(b) by 725 days.

(21) Appl. No.: 09/631,185

(22) Filed: Aug. 2, 2000

Related U.S. Application Data

(60) Provisional application No. 60/146,737, filed on Aug. 2, 1999.

(51) Int. Cl.[7] .................................................. C30B 7/14
(52) U.S. Cl. ............................ 117/68; 117/69; 117/927
(58) Field of Search ............................ 117/68, 69, 927, 117/925

(56) References Cited

U.S. PATENT DOCUMENTS

| | | | | |
|---|---|---|---|---|
| 4,886,646 A | * | 12/1989 | Carter et al. ................. | 117/202 |
| 5,891,357 A | * | 4/1999 | Akashi et al. ......... | 252/299.01 |
| 6,368,402 B2 | * | 4/2002 | DeTitta et al. ................ | 117/68 |
| 6,406,903 B2 | * | 6/2002 | Bray et al. ............... | 435/235.1 |

OTHER PUBLICATIONS

Gray, Peter M.D., et al., "Macromolecular Structure Information and Databases," *TIBS 21*, Jul. 1996, pp. 251–256.

Nienhaus, G.U., et al., "A Data Collection System for Protein Crystallography With Area–Sensitive Proportional Counters," *Review of Scientific Instruments* 62(4):1063–1066, Apr. 1991.

Hennessy et al., "Statistical Methods for the Objective Design of Screening Procedures for Macromolecular Crystallization," *Acta Cryst.* D56:817–827, 2000.

Hassell et al., "Two Distinct Approaches to Crystallization Results–Recording Databases," *Acta Cryst.* D50:459–465, 1994.

* cited by examiner

*Primary Examiner*—Robert Kunemund
(74) *Attorney, Agent, or Firm*—Christensen O'Connor Johnson Kindness PLLC

(57) ABSTRACT

Disclosed is a system and a method for depositing crystallization observations into a relational database. The system includes a computer, microscope, and a headset having a microphone and headphones. Crystallization observations are deposited into the database by verbal commands. Verbal commands also drive the crystallization apparatus plates to position the apparatus wells within the microscope field of vision. The system is integrated with a software application which enables the user to build the trials, matrices, solutions, and macromolecules to be used in the crystallization trials. The user is guided through the crystallization trial setup by a multitude of managers and builders of the software application. The software application also provides numerous tools to query the database and display results in a multitude of formats.

94 Claims, 262 Drawing Sheets

New Trial Wizard - Copy Well

Select Source Matrix

Wzrd1 (48 conditions)

| pH 9.50 | pH 7.50 | pH 9.50 | pH 8.00 | pH 5.50 |
|---------|---------|---------|---------|---------|
| pH 6.00 | pH 5.50 | pH 4.50 | pH 7.00 | pH 8.00 |
| pH 6.50 | pH 6.50 | pH 8.00 | pH 6.00 | pH 8.00 |
| pH 7.00 | pH 8.00 | pH 7.50 | pH 6.20 | pH 7.00 |
| pH 8.50 | pH 9.50 | pH 10.50 | pH 8.50 | pH 4.50 |
| pH 4.20 | pH 6.20 | pH 10.50 | pH 7.50 | pH 8.00 |
|         |         |         | pH 8.00 | pH 8.00 |
|         |         |         | pH 4.50 |         |

Dilution(%): 100  Dilute sel  Clear  Sel all...  1  Copy  4x Combi Copy

VDX plate 4x combi  ☒ 4x Combinatorial

| pH 9.50 Wzrd1 1 | pH 9.50 Wzrd1 1 | pH 7.50 Wzrd1 2 | pH 7.50 Wzrd1 2 | pH 9.50 Wzrd1 3 | pH 9.50 Wzrd1 3 |
| pH 9.50 Wzrd1 1 | pH 9.50 Wzrd1 1 | pH 7.50 Wzrd1 2 | pH 7.50 Wzrd1 2 | pH 9.50 Wzrd1 3 | pH 9.50 Wzrd1 3 |
| pH 6.00 Wzrd1 7 | pH 6.00 Wzrd1 7 | pH 5.50 Wzrd1 8 | pH 5.50 Wzrd1 8 | pH 4.50 Wzrd1 9 | pH 4.50 Wzrd1 9 |
| pH 6.00 Wzrd1 7 | pH 6.00 Wzrd1 7 | pH 5.50 Wzrd1 8 | pH 5.50 Wzrd1 8 | pH 4.50 Wzrd1 9 | pH 4.50 Wzrd1 9 |
| pH 6.50 Wzrd1 13 | pH 6.50 Wzrd1 13 | pH 6.50 Wzrd1 14 | pH 6.50 Wzrd1 14 | pH 8.00 Wzrd1 15 | pH 8.00 Wzrd1 15 |

Emerald's Wizard I Crystal Growth Matrix. A random sparse matrix of crystallants (1-48).

[Back] [Next>] [Cancel] [Help]

|   | 1 | 2 | 3 | 4 | 5 | 6 |
|---|---|---|---|---|---|---|
| 1 | ammonium sulfate storage solution | | | | | |
| 2 | | | | | | |
| 3 | molecular weight | | 132 | | | |
| 4 | total volume (ml) | | 1000 | | | |
| 5 | concentration (mM) | | 200 | | | |
| 6 | | | | | | |
| 7 | amount to use (g) | | 26.4 | | | |
| 8 | | | | | | |
| 9 | | | | | | |

Cell R7C3: `=R[-4]C*(R[-2]C/1000)*(R[-3]C/1000)`

Matrix Viewer

| | | | | | |
|---|---|---|---|---|---|
| (2) | (2) | (2) | (2) | (2) | (2) |
| (2) | (2) | (2) | (2) | (2) | (2) |
| (2) | (2) | (2) | (2) | (2) | (2) |
| (2) | (2) | (2) | (2) | (2) | (2) |

Matrix Name: newsys061599
Matrix Type: Systematic
Commercial: No
Preparator: Admin
X-Axis (systematically varied): polyethylene glycol 200
Y-Axis (systematically varied): sodium chloride
Comment:

Calc. Stock Sol. Vol. needed

OK
Cancel

Fig. 85

Stock solution volumes to build matrix newsys061599

What is the final desired Crystallant volume? 10 ml — Calculate !

| WellID | Volume | Stock Name | Stock Conc. | Chemical Name |
|---|---|---|---|---|
| 1 | 1.000 ml | PEG-200 stock | 100.000 %v/v | PEG-200 (Sigma Chemical... |
| 1 | 0.200 ml | sodium chloride 5 M stock | 5000.000 mM | sodium chloride (Sigma Ch... |
| 1 | 8.800 ml | | n/a | H2O |
| 2 | 1.500 ml | PEG-200 stock | 100.000 %v/v | PEG-200 (Sigma Chemical... |
| 2 | 0.200 ml | sodium chloride 5 M stock | 5000.000 mM | sodium chloride (Sigma Ch... |
| 2 | 8.300 ml | | n/a | H2O |
| 3 | 2.000 ml | PEG-200 stock | 100.000 %v/v | PEG-200 (Sigma Chemical... |
| 3 | 0.200 ml | sodium chloride 5 M stock | 5000.000 mM | sodium chloride (Sigma Ch... |
| 3 | 7.800 ml | | n/a | H2O |
| 4 | 2.500 ml | PEG-200 stock | 100.000 %v/v | PEG-200 (Sigma Chemical... |
| 4 | 0.200 ml | sodium chloride 5 M stock | 5000.000 mM | sodium chloride (Sigma Ch... |
| 4 | 7.300 ml | | n/a | H2O |
| 5 | 3.000 ml | PEG-200 stock | 100.000 %v/v | PEG-200 (Sigma Chemical... |
| 5 | 0.200 ml | sodium chloride 5 M stock | 5000.000 mM | sodium chloride (Sigma Ch... |

Close  Help...  View in Browser...  Save to HTML...

Fig. 88

| WELLID | VOLUME | STOCK NAME | STOCK CONC. | CHEMICAL NAME | CHEMICAL TYPE | FINAL CONC. |
|---|---|---|---|---|---|---|
| 1 | 1.000 ML | PEG-200 STOCK | 100.000 %V/V | PEG-200 (SIGMA CHEMICAL CO.) | PRECIPITANT | 10.000 %V/V CONC. |
| 1 | 0.200 ML | SODIUM CHLORIDE 5 M STOCK | 5000.000 mM | SODIUM CHLORIDE (SIGMA CHEMICAL CO.) | PRECIPITANT | 100.000 mM |

*Fig. 89A*

| 1 | 8.800 ML | | N/A | H2O | SOLVENT | N/A |
|---|---|---|---|---|---|---|
| 2 | 1.500 ML | PEG-200 STOCK | 100.000 %V/V | PEG-200 (SIGMA CHEMICAL CO.) | PRECIPITANT | 15.000 %V/V |
| 2 | 0.200 ML | SODIUM CHLORIDE 5 M STOCK | 5000.000 mM | SODIUM CHLORIDE (SIGMA CHEMICAL CO.) | PRECIPITANT | 100.000 mM |
| 2 | 8.300 ML | | N/A | H2O | SOLVENT | N/A |
| 3 | 2.000 ML | PEG-200 STOCK | 100.000 %V/V | PEG-200 (SIGMA CHEMICAL CO.) | PRECIPITANT | 20.000 %V/V |
| 3 | 0.200 ML | SODIUM CHLORIDE 5 M STOCK | 5000.000 mM | SODIUM CHLORIDE (SIGMA CHEMICAL CO.) | PRECIPITANT | 100.000 mM |
| 3 | 7.800 ML | | N/A | H2O | SOLVENT | N/A |
| 4 | 2.500 ML | PEG-200 STOCK | 100.000 %V/V | PEG-200 (SIGMA CHEMICAL CO.) | PRECIPITANT | 25.000 %V/V |
| 4 | 0.200 ML | SODIUM CHLORIDE 5 M STOCK | 5000.000 mM | SODIUM CHLORIDE (SIGMA CHEMICAL CO.) | PRECIPITANT | 100.000 mM |
| 4 | 7.300 ML | | N/A | H2O | SOLVENT | N/A |
| 5 | 3.000 ML | PEG-200 STOCK | 100.000 %V/V | PEG-200 (SIGMA CHEMICAL CO.) | PRECIPITANT | 30.000 %V/V |
| 5 | 0.200 ML | SODIUM CHLORIDE 5 M STOCK | 5000.000 mM | SODIUM CHLORIDE (SIGMA CHEMICAL CO.) | PRECIPITANT | 100.000 mM |
| 5 | 6.800 ML | | N/A | H2O | SOLVENT | N/A |
| 6 | 3.500 ML | PEG-200 STOCK | 100.000 %V/V | PEG-200 (SIGMA CHEMICAL CO.) | PRECIPITANT | 35.000 %V/V |

*Fig. 89B*

| | | | | | | |
|---|---|---|---|---|---|---|
| 6 | 0.200 ML | SODIUM CHLORIDE 5 M STOCK | 5000.000 mM | SODIUM CHLORIDE (SIGMA CHEMICAL CO.) | PRECIPITANT | 100.000 mM |
| 6 | 6.300 ML | | N/A | H2O | SOLVENT | N/A |
| 7 | 1.000 ML | PEG-200 STOCK | 100.000 %V/V | PEG-200 (SIGMA CHEMICAL CO.) | PRECIPITANT | 10.000 %V/V |
| 7 | 0.400 ML | SODIUM CHLORIDE 5 M STOCK | 5000.000 mM | SODIUM CHLORIDE (SIGMA CHEMICAL CO.) | PRECIPITANT | 200.000 mM |
| 7 | 8.600 ML | | N/A | H2O | SOLVENT | N/A |
| 8 | 1.500 ML | PEG-200 STOCK | 100.000 %V/V | PEG-200 (SIGMA CHEMICAL CO.) | PRECIPITANT | 15.000 %V/V |
| 8 | 0.400 ML | SODIUM CHLORIDE 5 M STOCK | 5000.000 mM | SODIUM CHLORIDE (SIGMA CHEMICAL CO.) | PRECIPITANT | 200.000 mM |
| 8 | 8.100 ML | | N/A | H2O | SOLVENT | N/A |
| 9 | 2.000 ML | PEG-200 STOCK | 100.000 %V/V | PEG-200 (SIGMA CHEMICAL CO.) | PRECIPITANT | 20.000 %V/V |
| 9 | 0.400 ML | SODIUM CHLORIDE 5 M STOCK | 5000.000 mM | SODIUM CHLORIDE (SIGMA CHEMICAL CO.) | PRECIPITANT | 200.000 mM |
| 9 | 7.600 ML | | N/A | H2O | SOLVENT | N/A |
| 10 | 2.500 ML | PEG-200 STOCK | 100.000 %V/V | PEG-200 (SIGMA CHEMICAL CO.) | PRECIPITANT | 25.000 %V/V |

*Fig. 89C*

| 10 | 0.400 ML | SODIUM CHLORIDE 5 M STOCK | 5000.000 mM | SODIUM CHLORIDE (SIGMA CHEMICAL CO.) | PRECIPITANT | 200.000 mM |
|---|---|---|---|---|---|---|
| 10 | 7.100 ML | | N/A | H20 | SOLVENT | N/A |
| 11 | 3.000 ML | PEG-200 STOCK | 100.000 %V/V | PEG-200 (SIGMA CHEMICAL CO.) | PRECIPITANT | 30.000 %V/V |
| 11 | 0.400 ML | SODIUM CHLORIDE 5 M STOCK | 5000.000 mM | SODIUM CHLORIDE (SIGMA CHEMICAL CO.) | PRECIPITANT | 200.000 mM |
| 11 | 6.600 ML | | N/A | H20 | SOLVENT | N/A |
| 12 | 3.500 ML | PEG-200 STOCK | 100.000 %V/V | PEG-200 (SIGMA CHEMICAL CO.) | PRECIPITANT | 35.000 %V/V |
| 12 | 0.400 ML | SODIUM CHLORIDE 5 M STOCK | 5000.000 mM | SODIUM CHLORIDE (SIGMA CHEMICAL CO.) | PRECIPITANT | 200.000 mM |
| 12 | 6.100 ML | | N/A | H20 | SOLVENT | N/A |
| 13 | 1.000 ML | PEG-200 STOCK | 100.000 %V/V | PEG-200 (SIGMA CHEMICAL CO.) | PRECIPITANT | 10.000 %V/V |
| 13 | 0.600 ML | SODIUM CHLORIDE 5 M STOCK | 5000.000 mM | SODIUM CHLORIDE (SIGMA CHEMICAL CO.) | PRECIPITANT | 300.000 mM |
| 13 | 8.400 ML | | N/A | H20 | SOLVENT | N/A |
| 14 | 2.500 ML | PEG-200 STOCK | 100.000 %V/V | PEG-200 (SIGMA CHEMICAL CO.) | PRECIPITANT | 25.000 %V/V |
| 14 | 0.600 ML | SODIUM CHLORIDE 5 M STOCK | 5000.000 mM | SODIUM CHLORIDE (SIGMA CHEMICAL CO.) | PRECIPITANT | 300.000 mM |

*Fig. 89D*

| | | | | | | |
|---|---|---|---|---|---|---|
| 14 | 7.900 ML | | N/A | H2O | SOLVENT | N/A |
| 15 | 2.000 ML | PEG-200 STOCK | 100.000 %V/V | PEG-200 (SIGMA CHEMICAL CO.) | PRECIPITANT | 20.000 %V/V |
| 15 | 0.600 ML | SODIUM CHLORIDE 5 M STOCK | 5000.000 mM | SODIUM CHLORIDE (SIGMA CHEMICAL CO.) | PRECIPITANT | 300.000 mM |
| 15 | 7.400 ML | | N/A | H2O | SOLVENT | N/A |
| 16 | 2.500 ML | PEG-200 STOCK | 100.000 %V/V | PEG-200 (SIGMA CHEMICAL CO.) | PRECIPITANT | 25.000 %V/V |
| 16 | 0.600 ML | SODIUM CHLORIDE 5 M STOCK | 5000.000 mM | SODIUM CHLORIDE (SIGMA CHEMICAL CO.) | PRECIPITANT | 300.000 mM |
| 16 | 6.900 ML | | N/A | H2O | SOLVENT | N/A |
| 17 | 3.000 ML | PEG-200 STOCK | 100.000 %V/V | PEG-200 (SIGMA CHEMICAL CO.) | PRECIPITANT | 30.000 %V/V |
| 17 | 0.600 ML | SODIUM CHLORIDE 5 M STOCK | 5000.000 mM | SODIUM CHLORIDE (SIGMA CHEMICAL CO.) | PRECIPITANT | 300.000 mM |
| 17 | 6.400 ML | | N/A | H2O | SOLVENT | N/A |
| 18 | 3.500 ML | PEG-200 STOCK | 100.000 %V/V | PEG-200 (SIGMA CHEMICAL CO.) | PRECIPITANT | 35.000 %V/V |
| 18 | 0.600 ML | SODIUM CHLORIDE 5 M STOCK | 5000.000 mM | SODIUM CHLORIDE (SIGMA CHEMICAL CO.) | PRECIPITANT | 300.000 mM |

*Fig. 89E*

| 18 | 5.900 ML | | N/A | H2O | SOLVENT | N/A |
|---|---|---|---|---|---|---|
| 19 | 1.000 ML | PEG-200 STOCK | 100.000 %V/V | PEG-200 (SIGMA CHEMICAL CO.) | PRECIPITANT | 10.000 %V/V |
| 19 | 0.800 ML | SODIUM CHLORIDE 5 M STOCK | 5000.000 mM | SODIUM CHLORIDE (SIGMA CHEMICAL CO.) | PRECIPITANT | 400.000 mM |
| 19 | 8.200 ML | | N/A | H2O | SOLVENT | N/A |
| 20 | 1.500 ML | PEG-200 STOCK | 100.000 %V/V | PEG-200 (SIGMA CHEMICAL CO.) | PRECIPITANT | 15.000 %V/V |
| 20 | 0.800 ML | SODIUM CHLORIDE 5 M STOCK | 5000.000 mM | SODIUM CHLORIDE (SIGMA CHEMICAL CO.) | PRECIPITANT | 400.000 mM |
| 20 | 7.700 ML | | N/A | H2O | SOLVENT | N/A |
| 21 | 2.000 ML | PEG-200 STOCK | 100.000 %V/V | PEG-200 (SIGMA CHEMICAL CO.) | PRECIPITANT | 20.000 %V/V |
| 21 | 0.800 ML | SODIUM CHLORIDE 5 M STOCK | 5000.000 mM | SODIUM CHLORIDE (SIGMA CHEMICAL CO.) | PRECIPITANT | 400.000 mM |
| 21 | 7.200 ML | | N/A | H2O | SOLVENT | N/A |
| 22 | 2.500 ML | PEG-200 STOCK | 100.000 %V/V | PEG-200 (SIGMA CHEMICAL CO.) | PRECIPITANT | 25.000 %V/V |
| 22 | 0.800 ML | SODIUM CHLORIDE 5 M STOCK | 5000.000 mM | SODIUM CHLORIDE (SIGMA CHEMICAL CO.) | PRECIPITANT | 400.000 mM |

*Fig. 89F*

| 22 | 6.700 ML | | N/A | H2O | SOLVENT | N/A |
|---|---|---|---|---|---|---|
| 23 | 3.000 ML | PEG-200 STOCK | 100.000 %V/V | PEG-200 (SIGMA CHEMICAL CO.) | PRECIPITANT | 30.000 %V/V |
| 23 | 0.800 ML | SODIUM CHLORIDE 5 M STOCK | 5000.000 mM | SODIUM CHLORIDE (SIGMA CHEMICAL CO.) | PRECIPITANT | 400.000 mM |
| 23 | 6.200 ML | | N/A | H2O | SOLVENT | N/A |
| 24 | 3.500 ML | PEG-200 STOCK | 100.000 %V/V | PEG-200 (SIGMA CHEMICAL CO.) | PRECIPITANT | 35.000 %V/V |
| 24 | 0.800 ML | SODIUM CHLORIDE 5 M STOCK | 5000.000 mM | SODIUM CHLORIDE (SIGMA CHEMICAL CO.) | PRECIPITANT | 400.000 mM |
| 24 | 5.700 ML | | N/A | H2O | SOLVENT | N/A |

Database Object Manager

Crystal Monitor Objects:
- Base Objects
  - Chemicals
    - Buffering Agent
    - pHConjugate
    - Precipitant
    - Salt
    - CSI
    - Chelator
    - Detergent
    - ReducingAgent
    - CryoCoolant
    - NucleationSuppressant
    - Organic
    - heavyAtomCompound
    - Metal
    - Gas
    - Solvent
    - Other
  - Solutions
  - Data Mining

Attributes:

| ChemicalName | ShortName | Formula | MolecularMass |
|---|---|---|---|
| dimethylarsinic... | sodium cacodyl... | C2H6AsO2Na | 160. |
| sodium citrate tri... | sodium citrate | C6H5Na3O7*2H... | 294.1 |
| ammonium sulfate | ammonium sulfate | (NH4)2SO4 | 132.1 |
| ammonium sulfate | ammonium sulfate | (NH4)2SO4 | 132.1 |
| ammonium sulfate | ammonium sulfate | (NH4)2SO4 | 132.1 |
| lithium sulfate m... | lithium sulfate | Li2SO4*H2O | 128. |
| ammonium phos... | dibasic ammoniu... | (NH4)2HPO4 | 132.1 |
| sodium chloride | sodium chloride | NaCl | 58.44 |
| sodium phospa... | monobasic sodi... | NaH2PO4 | 120. |
| sodium phospa... | monobasic sodi... | NaH2PO4 | 120. |
| sodium phospa... | monobasic sodi... | NaH2PO4 | 119.96 |
| potassium sodiu... | K/Na tartrate | C4H4O6NaK*4H... | 282.2 |
| sodium formate | sodium formate | CHO2Na | 68.01 |
| zinc acetate dih... | zinc acetate | Zn(C2H3O2)2*2... | 219.5 |
| magnesium chlo... | magnesium chlo... | MgCl2*6H2O | 203.3 |
| calcium acetate | calcium acetate | Ca(C2H3O2)2 | 158.2 |
| magnesium acet... | magnesium acet... | Mg(C2H3O2)2*4... | 214.5 |

Execute SQL Query 26 rows. Query time: 411ms

Help...

Database Object Manager

Crystal Monitor Objects:
- Base Objects
  - Chemicals
    - Buffering Agent
    - pHConjugate
    - Precipitant
    - Salt
    - CSI
    - Chelator
    - Detergent
    - ReducingAgent
    - CryoCoolant
    - NucleationSuppressant
    - Organic
    - heavyAtomCompound
    - Metal
    - Gas
    - Solvent
    - Other
  - Solutions Attributes:

| Catalog | CAS | ChemicalName | ShortName | F |
|---------|-----|--------------|-----------|---|
| 20,781-0 | 151-50-8 | potassium cyani... | KCN | X |
| 78-1970 | 10025-99-7 | potassium tetra... | K2PtCl4 | X |
| F1502 | 103213-47-4 | D-fructose 6-ph... | K2 D-fructose 6... | X |
| H7273 | 21799-87-1 | hydroquinonesu... | K HQSA | C |
| HR2-539 | 6381-59-5 | potassium/sodiu... | K/Na tatrate | X |
| HR2-553 | 7778-77-0 | potassium dihyd... | K H2 phosphate | X |
| HR2-635 | 7758-11-4 | di-potassium hy... | K2 H phosphate | X |
| P0165 | 6381-59-5 | potassium sodiu... | K/Na tartrate | C |
| P0662 | 7778-77-0 | potassium phos... | K H2 phosphate | X |
| P2569 | 7789-23-3 | potassium fluoride | KF | X |
| P2713 | 333-20-0 | potassium thioc... | KSCN | X |
| P3786 | 7758-11-4 | potassium phos... | K2 H phosphate | X |
| P5708 | 127-08-2 | potassium acetate | KAc | X |
| P9333 | 7447-40-7 | potassium chlori... | KCl | X |
| P9458 | 7779-80-5 | potassium sulfate | K2 sulfate | X |
| T6897 | 921-53-9 | potassium tartrate | K2 tatrate | X | select * from chemicals where chemicalname like '%potass%'; — 21700

[ Execute SQL Query ]   [ Help... ]

16 rows. Query time: 361 ms

Database Object Manager

Crystal Monitor Objects:
- Base Objects
  - Chemicals
    - Buffering Agent
    - pHConjugate
    - Precipitant
    - Salt
    - CSI
    - Chelator
    - Detergent
    - ReducingAgent
    - CryoCoolant
    - NucleationSuppressant
    - Organic
    - heavyAtomCompound
    - Metal
    - Gas
    - Solvent
    - Other
  - Solutions

Attributes:

| Catalog | CAS | ChemicalName | ShortName |
|---|---|---|---|
| A7330 | 631-61-8 | ammonium acet... | NH4 aC |
| HR2-565 | 631-61-8 | ammonium acet... | NH4 aC |
| A6141 | 1066-33-7 | ammonium bicar... | NH4 bicarbinate |
| A5666 | 12125-02-9 | ammonium chlori... | NH4 chloride |
| HR2-555 | 7722-76-1 | ammonium dihyd... | NH4 H2 phosph... |
| F2004 | 540-69-2 | ammonium form... | NH3 formate |
| A7455 | 6484-52-2 | ammonium nitrate | NH4 nitrate |
| A1167 | 7783-28-0 | ammonium phos... | (NH4)2 H phosp... |
| A2939 | 7783-20-2 | ammonium sulfate | (NH4)2 sulfate |
| A938-500 | 7783-20-2 | ammonium sulfate | (NH4)2 sulfate |
| HR2-541 | 7783-20-2 | ammonium sulfate | (NH4)2 sulfate |
| JT0792-5 | | | |
| 86394 | | barium chloride... | Ba chloride |
| C4705 | 62-54-4 | calcium acetate | CaAc2 |
| HR2-567 | 62-54-4 | calcium acetate | CaAc2 |
| C5080 | 10035-04-8 | calcium chloride... | CaCl2 |

21800

Execute SQL Query 77 rows. Query time: 81 ms

Help...

*Fig. 218*

PREPARATORS
- PREPARATORID
- PREPARATORNAME

*Fig. 245*

TRIALS
- TRIALID
- TRIALTYPE
- USERID
- SETUPDATE
- PROJECTID
- MATRIXID
- RANGEFROM
- RANGETO
- APPARATUSID
- TEMPERATUR
- TEMPUNITID
- RESVOL
- RESVOLUNITID
- GASPURGECATALOG
- GASPURGECAS
- COLLABORATORID
- SCORE
- COMMENT

*Fig. 246*

PROJECTS
- PROJECTID
- PROJECTNAME
- COMMENT

METHOD AND SYSTEM FOR CREATING A CRYSTALLIZATION RESULTS DATABASE

CROSS-REFERENCE TO RELATED APPLICATIONS

This application claims the benefit of U.S. Provisional Patent Application Ser. No. 60/146,737, filed on Aug. 2, 1999.

FIELD OF THE INVENTION

This invention relates to the crystallization of molecules, in particular, to a method and system for capturing a large number of crystallization trial observations and creating a relational database based on the trial observations.

BACKGROUND OF THE INVENTION

Macromolecular x-ray crystallography is an essential aspect of modern drug discovery and molecular biology. Using x-ray crystallographic techniques, the three-dimensional structures of biological macromolecules, such as proteins, nucleic acids, and their various complexes, can be determined at practically atomic level resolution. The enormous value of three-dimensional information has led to a growing demand for innovative products in the area of protein crystallization, which is currently the major rate limiting step in x-ray structure determination.

One of the first and most important steps of the x-ray crystal structure determination of a target macromolecule is to grow large, well diffracting crystals with the macromolecule. As techniques for collecting and analyzing x-ray diffraction data have become more rapid and automated, crystal growth has become a rate limiting step in the structure determination process.

Vapor diffusion is the most widely used technique for crystallization in modern macromolecular x-ray crystallography. In this technique, a small volume of the macromolecule sample is mixed with an approximately equal volume of a crystallization solution. The resulting drop of liquid (containing macromolecule and dilute crystallization solution) is sealed in a chamber with a much larger reservoir volume of the crystallization solution. The drop is kept separate from the reservoir, either by hanging from a glass cover slip or by sitting on a tiny pedestal. Over time, the crystallization drop and the reservoir solutions equilibrate via vapor diffusion of the volatile species. Supersaturating concentrations of the macromolecule are achieved, resulting in crystallization in the drop when the appropriate reservoir solution is used.

The process of growing biological macromolecule crystals remains, however, a highly empirical process. Macromolecular crystallization is a hyperdimensional phenomena, dependent on a host of experimental parameters including pH, temperature, and the concentration of salts, macromolecules, and the particular precipitating agent (of which there are hundreds). A sampling of this hyperspace, via thousands of crystallization trials, eventually leads to the precise conditions for crystal growth. Thus, the ability to rapidly and easily generate many crystallization trials is important in determining the right conditions for crystallization. Also, since so many multidimensional data points are generated in these crystallization trials, it is imperative that the experimenter be able to accurately record and analyze the data so that promising conditions are pursued, while no further time, resources, and effort are spent on negative conditions.

Recently, an international protein structure initiative has taken shape with the goal of determining the three dimensional structures of all representative protein folds. This massive undertaking in structural biology which may some day rival the human genome sequencing project in size and scope, is estimated to require a minimum of 100,000 x-ray structure determinations of newly discovered proteins for which no structural information is currently available or predicted. For perspective, the total number of reported novel crystal structures determined to date (spanning nearly 50 years of work) is only approximately 10,000.

Using existing methods for the crystallization of proteins (random screens of conditions) the protein structure initiative will require a minimum of approximately 100 million crystallization trials. In addition the biological information gleaned from genomic research in the protein structure initiative are expected to create even more demand for structural information. Specifically, the biotechnology and pharmaceutical industries are estimated to require upwards of ten fold more protein crystallization experiments (one billion) as a result of research and structure based drug design and the use of crystallized therapeutic proteins. This would require that each of the approximately 500 macromolecular crystallography labs worldwide be responsible for setting up approximately 2000 crystallization trials every working day of the year for five years. Currently, there is no known device available for collecting for analysis macromolecular crystallization data on this scale. Thus, there is a need for a device that permits the efficient capture and storing of large amounts of crystallization trial data information.

SUMMARY OF THE INVENTION

The present invention is directed to a providing a system and method for capturing large amounts of crystallization trial data and storing the captured data in a relational database for subsequent analysis. The preferred implementation of the present invention includes software having a plurality of database managers. Preferably, the database managers include a trial manager, a solution manager, a matrix manager, a compound buffer manager, a chemical manager, an apparatus manager, a subunit manager, a macromolecule manager, a macromolecule formulation manager, a complex macromolecule formulation manager, a manufacturer manager, a collaborator manager, a project manager, and a user manager. Preferably, the software also includes query tools for mining the database and a database object manager for managing database objects. To assist a user of the database, preferably, the software also includes a help tool for managing help documentation. In essence, the software provides a crystallographer with a graphical user interface (GUI) to facilitate the entry of relevant data into a relational database. In addition, to the software, the presently preferred implementation of the present invention includes a trial observation system; i.e., a microscope for viewing the results of crystallization trials; and, preferably, a positioning mechanism for positioning the results of multiple crystallization trials within the observation area of the trial observation system.

In accordance with other aspects of this invention, the software resides in a computer having a central processing unit (CPU) and a memory.

In accordance with further aspects of the invention, the trial manager includes a sequence of executable steps that causes the computer to launch "builders" to guide the user through the initial setup of the trials in order to arrive at the ultimate goal of collecting crystallization trial data for storage in a relational database. The builders include a crystallization trial builder that, in its normal mode, captures all aspects of a crystallization trial in which all crystallization drops receive the same composition of macromolecule formulations and other solutions together with a specified volume of crystallant from each of the crystallants that comprise a specified crystallization matrix. A GUI builder takes the user through all necessary steps required to set up a crystallization trial.

In accordance with further aspects of this invention, the information captured by the crystallization, trial builder includes, but is not limited to information such as: a unique trial ID, a project name, gas purge information (specifies the use of gasses to bathe the crystallization setup), temperature (the temperature at which the crystallization trial will be conducted), temperature units, reservoir volume, reservoir volume units, preparation date, an oil overlay specification (oil can be chosen and the volume specified for the placement of oil on top of the crystallization drop or on top of the reservoir solution), oil overlay units, the order of addition and volume of macromolecule formulations and other solutions that are added to the crystallization drop including the volume of the crystallant that is added to the crystallization drop, barcode IDs for each crystallization apparatus that is used in the trial, the name of the apparatus, the name of the collaborator, and the name of the user (defaults to the user that is logged on).

As noted above, preferably, the crystallization trial builder captures all aspects of a complex or combinatorial crystallization trial where the reservoir chambers of a crystallization apparatus can be filled with a specified volume of any crystallant from any existing matrix. The crystallization drops can individually receive specified compositions of macromolecule formulations and other solutions together with a specified volume of crystallant and in a specified order of addition. The crystallization trial builder includes a GUI that takes the user through all necessary steps required to set up a complex or combinatorial crystallization trial.

In accordance with still other aspects of this invention, the solutions database manager captures the composition of all the solutions that are not part of a crystallization matrix. Preferably, solutions can be categorized as either: buffer, heavy atom, additive, formulations, or stock solutions. Solutions are given a name and can contain a descriptive comment. The user can build any solution from the chemicals in a database. To do this, a solvent is defined and then chemicals are selected and final concentrations are specified. Individual chemical components of solutions include a tag that indicates the user's intended use of each chemical in the solution. For each solution created, preferably, the user can specify the solution name, the pH of solution, the pH determination method, the viscosity, the vapor pressure osmolality, the osmolality units, the conductivity, and the conductivity units. Stock solutions have the special feature that they can be created with only one compound buffer or chemical. This rule is enforced by a GUI that forms part of the solutions database manager. The utility of stock solutions is that they provide a source of chemicals and solutions from which crystallization solutions can be prepared.

In accordance with still further aspects of this invention, the matrix manager captures information on the crystallization conditions present in any crystallization screen or crystal growth matrix (sets of solutions used to promote protein crystallization) that the user may build. Preferably, a database containing commercially available crystal growth matrices is preloaded into the memory of the computer.

As for other, less commercially available crystallization matrices, new matrices are created using a new matrix builder GUI included in the matrix manager that is comprised of a series of window utilities that enable a user to specify the total number of crystallization solutions in a matrix, and how they are arranged in a grid with a specified number of columns. Preferably, the user can specify the name of the matrix, the name of a manufacturer if the matrix is commercial, or the name of the user responsible for preparing the matrix if the matrix is noncommercial. Preferably, the individual crystallization solutions that comprise a matrix are created using several powerful GUI tools that enable a user to do the following: drag and drop an existing crystallization solution from one matrix into a specific position within a matrix that is being newly created, copy an existing crystallization solution from one matrix into any number of specific positions within a matrix that is being newly created, copy a diluted (with specified percentage dilution factor) crystallization solution from one matrix into any number of specific positions within a matrix that is being newly created, add any chemical at a specified concentration to any crystallization solution that is being created, specify the physical properties of the crystallization solution including the vapor pressure, osmolality, pH (estimated or measured), conductivity, the conductivity and osmolality units, and the viscosity. If a matrix has one or more chemicals or buffers that have been systematically varied in concentration within the matrix grid, preferably, the user is allowed to specify which component has been varied along either the X or Y axis of the matrix grid.

In accordance with yet other aspects of this invention, the compound buffer manager captures and maintains a list of compound buffers and their final pHs. The compound buffer manager includes a GUI that enables a user to select a buffering agent and combine it with the pH conjugate. Preferably, only one buffering agent and pH conjugate is allowed for any one compound buffer. Once the combination of buffering agent and pH conjugate has been made, the user can specify the final pH.

In accordance with still further aspects of this invention, the chemicals manager captures and maintains information used in macromolecular crystallography, preferably including the following properties: chemical name, abbreviated chemical name, chemical formula, molecular mass, physical state at room temperature, density, manufacturer of the chemical, catalog number, and CAS number. The chemicals manager allows a user to categorize chemicals according to their intended use in a crystallization experiment. Preferably, the categories include: buffering agents, pH conjugates, precipitants (or crystallants), salts, CSI's (co-factors, substrates, and inhibitors), chelators, detergents, reducing agents, cryocoolants, nucleation suppressants, organics, heavy atom compounds, metals, gases, solvents or other. Once a chemical has been put into a database, it can be associated with one or more of the different chemical classes. Preferably, the database comes preloaded with over 500 standard chemicals.

In accordance with still further aspects of this invention, the apparatus manager captures and maintains information relating to crystallization apparatuses. Preferably, the captured information includes the apparatus name, the number of columns, the number of rows, the manufacturer and the drop and reservoir dimensions.

In accordance with yet further aspects of this invention, the subunits manager includes a GUI that captures the name, source (e.g., species), molecular mass, pI (Isoelectric point), macromolecule class (several classes are available and are expandable, for example, protein, DNA, RNA), and a comment that is associated with individual macromolecular subunits (single polymeric chains of biological building blocks).

In accordance with still further aspects of this invention, the macromolecule manager captures and maintains descriptions of complex assemblages of macromolecule subunits including, but not limited to, stoichiometry of subunits (the number of each of the subunits present in the complex), source (e.g., species), and a comment that is associated with a particular macromolecular assemblage. Preferably, the macromolecule manages includes a GUI that enables a user to build macromolecules from subunits.

In accordance with yet further aspects of this invention, the macromolecule formulation manager captures and maintains descriptions of macromolecule formulations (macromolecules in a solution). Preferably, the macromolecule formulation manager includes a GUI that enables a user to place any number of macromolecules at a specified concentration into any single solution. The resulting macromolecule formulation is given a name, and additional information is specified including the preparation date, storage temperature, storage temperature units, the preparator name (derived from the user list), and any needed comment and objects, such as image files, or applications, such as spreadsheets or word processing documents and the like.

In accordance with yet still other aspects of this invention, the complex macromolecule formulation manager captures and maintains descriptions of complex macromolecule formulations (mixtures of macromolecule formulations and other solutions). Preferably, the complex macromolecule formulation manager includes a GUI that enables users to mix any number of macromolecule formulations or other solutions at specified volumes. The result of concentrations of all components are recalculated and the new complex macromolecule formulation is given a name, and additional information is specified including the preparations date, storage temperature, storage temperature units, and preparator name (derived from the user list) and any needed comment.

In accordance with yet other aspects of this invention, the manufacturers manager captures and maintains information relating to manufacturers of chemicals, reagents and apparatuses. Preferably, the information is captured by a GUI that includes space for the manufacturer name, phone, street, city, state, zip, country, e-mail, fax, department and web site address. Preferably, clicking on the web address of the manufacturer launches an internet browser that serves up the relevant web pages.

In accordance with yet other aspects of this invention, the collaborators manager captures and maintains information relating to collaborators. Preferably, the information is captured by a GUI that includes space for the collaborator name, phone, street, city, state, zip, country, e-mail, fax, department, and web site address. Preferably, clicking on the web address of the collaborator launches an internet browser that serves up the relevant web pages.

In accordance with yet other aspects of this invention, the projects manager captures and maintains information relating to projects. Preferably, the information is captured by a GUI that includes space for the project name and a comment used to describe the nature of the project.

In accordance with yet other aspects of this invention, the users manager captures and maintains information related to users. Preferably, the information is captured by a GUI that includes space for the user name, password and enrolled status (restricted, user, power user, or administrator). The use of different roles enables the software to limit access to the database and/or aspects of the software through defined levels of security.

In accordance with other further aspects of this invention, the database object manager has features that enable rapid analysis of crystallization trial data. Preferably, crystallization trial data is rapidly retrieved by scanning of barcode labels on crystallization apparatuses or in notebooks. Preferably, the database object manager includes a GUI that allows a user to open multiple trial observation sessions so that they can be viewed side by side. This enables the rapid identification of important factors in crystallization. Individual walls can display pictographical representations of results.

Preferably, the database object manager GUI also provides a crystal query that creates a table describing all of the parameters associated with trial observation data wherein a crystal was observed. Preferably, the table includes information on well position, observation session, trial ID, crystal morphology, crystallant name, crystallant composition, and crystallization drop composition. Also preferably, the table is designed so that it can be alphabetically or numerically sorted by clicking on the heading of any one of these categories. Also preferably, a user can export the entire crystal query table, or portions thereof, to HTML for printing or sharing of information via e-mail or the internet.

In accordance with yet other further aspects of this invention, the software includes a drop composition calculator that allows the user to quickly calculate the concentration of components in a crystallization drop using variable "vapor diffusion equilibration" settings.

In accordance with other aspects of this invention, preferably, the software includes extensive results reporting features suitable for creating hypertext mark-up language (HTML) reports of crystallization trial results including all relevant information and any digital images that may have been captured. Such reports can be printed by an Internet browser or shared via e-mail. Preferably, the reports have the following features: a print well feature that prints only information that pertains to a single crystallization setup, a print plate feature that prints information that pertains to all crystallization setups in a crystallization plate, and a print trial feature that prints all crystallization setups and plates in a trial. Each of the three print options has two modifiers for a single chosen observation session (session with current focus) and all observation sessions (entire history).

In addition to the features that enable the rapid analysis of crystallization trial data, preferably, the software includes special support features such as a database object manager that allows administrator users to have access to a powerful database object manager. This utility allows users to update, delete (as long as database integrity is not violated), backup, and output (HTML text, or SQL script). Also, preferably, the software allows multiple users to be networked to others via a local access network (LAN) that allows simultaneous access. Preferably, this feature is enabled by the use of Windows NT and Microsoft SQL server 7.0. Such enablement allows data security and backup to be managed at both the level of windows NT login account, and at the level of the user login. Enablement using Microsoft SQL server 7.0 also provides various levels of security. If desired, database backup can be achieved by direct copying of a mirrored database to additional storage devices. In addition, this enablement allows the entire database to be output to a SQL text script that can be used to recreate the entire database from scratch, if necessary. In addition, this enablement allows individual database tables to be output to text, SQL script, or HTML files for printing and viewing in a browser. The text files can also be imported into spreadsheet programs or other databases. The SQL scripts run by the enterprise manager of SQL server 7.0 recreate a specific component object within the database. This feature allows multiple users to share composite objects such as crystal growth matrices in the absence of a LAN environment.

As noted above, in a Windows NT/Microsoft SQL Server 7.0 embodiment of the invention, user security can be provided at the level of the Windows NT login, and at the level of user passwords within the application. Multiple user profiles ensure various levels of access to the database. While the platform for an embodiment is the Microsoft Windows Operation System, it should be readily understood other operating system environments may be used.

Also, preferably, the software provides extensive help documentation to a user through the GUI that answers most common questions. If desired, help may be in HTML format and accessed via a call to an external web site.

Other preferred features of the invention are directed to facilitate the collection of crystallization trial data. Barcode stickers may be used to label the crystallization apparatuses. This enables crystallization trial information to be quickly recalled with a simple scan of a barcode that is located on a crystallization apparatus, or which has been placed in a notebook. This allows the user to unambiguously keep track of crystallization apparatuses and crystallization trials. With a simple trace of the barcode, a user is able to immediately access all information on a given trial or immediately start to collect more trial data. Preferably, the software system employs speech recognition and audio feedback. This allows a user to easily capture trial results without having to look away from the trial observation system, i.e., the microscope. Simple commands and an audio feedback allow a user to keep track of where he or she is in the data collection session without having to continuously crosscheck the crystallization trial well that he or she is observing. Preferably, the voice commands are user definable, resulting in very high accuracy of speech recognition. In addition, the user definable speech commands enable languages other than English to be handled. For example, the Russian word for "clear" is "glasnost." Typing "glasnost" into the command line for "clear" directs the speech recognition utility to interpret "glasnost" as being equivalent to the word "clear." Hence, any language that has words which can be phonetically spelled in English can be supported. Preferably, the "audio" feedback is fed in stereo through computer speakers or a headset. This allows for directionality of sound, which provides a user with a sense of direction as the user examines a crystallization trial well under a microscope. For example, a "next well" command can result in a swishing sound that moves from left to right which is a standard direction of movement in crystallization examination apparatuses. Preferably, after a result has been input, it is repeated to the user so that the user can be sure that the result was accurately captured. In addition to speech recognition, the GUI allows users to use the pointer to click on a set of defined crystallization results and thereby input the results into the database.

Preferably, trial results are presented pictographically, which allows a user to "see" rather than read the results. Pictographs are highly intuitive and can capture greater than 95 percent of all standard crystallization trial results. Preferably, the results are presented pictographically in a computer monitor (laptop or PC) in a grid array. Preferably, the monitor is positioned comfortably next to the microscope, an arrangement which takes advantage of a user's peripheral vision and enables the user to maintain a sense of positioning during a data collection session. This provides an additional crosscheck to ensure that the correct data is being collected. Preferably, audio feedback is mirrored by written text that appears on the computer monitor, which provides further cross-checking to ensure accurate results reporting. The pictographical results include: clear, precipitate, spherulite skin, phase separation, microcrystal, big block, medium block, small block, tiny block, big pyramid, medium pyramid, small pyramid, tiny pyramid, big hexagon, medium hexagon, small hexagon, tiny hexagon, big needle, medium needle, small needle, tiny needle, big plate, medium plate, small plate, tiny plate, big urchin, medium urchin, small urchin, tiny urchin, big rod, medium rod, small rod, tiny rod, big leaf, medium leaf, small leaf and tiny leaf. Preferably, five different length red bars are used to indicate: the number of crystals or microcrystals, the density of precipitant, the number of spherulites, the number of phase separation and the thickness of skin. One crystal descriptor called "twin" that can apply to all crystals with clear morphology is also displayed. Preferably, Datatypes are used to map the conditions which caused crystallization to occur. Other features allow a user to map by chemical type or subunit or macro molecule class. These data fields provide powerful data mining and query capabilities to the relational database of the invention.

Preferably, the GUI of the trial data collection component of the present invention includes a video window which displays a digital video stream of data generated by a digital color camera that is mounted to the microscope via a standard C mount. Also, preferably, a simple voice command can directs the camera to "take a picture" which provides a high resolution color digital record of the specific observation that is made. Preferably, the digital cameras supported by the software include all cameras that support video for windows drivers and can be supplied with a PCMCIA card that can be used in a laptop and a PCI card that can be used in a PC.

If desired, the present invention can be used as a front end component of a bigger software application that controls liquid handling robots designed to set up new crystallization trials. Specifically, an embodiment of the present invention can be used as an interface to a liquid handling robot that sets up crystallization trials using plasticware and chemical reagents Crystallization trials may be monitored by an embodiment of the present invention so as to allow a user to design a series of optimized crystallization solutions. The optimization solutions may be prepared by a second liquid handling robot also under the control of an embodiment of the present invention, which could direct the first liquid handling robot to physically create the optimized crystallization trials solutions. In this way, all aspects of crystallization trials except those that require the trained eye of a user would be mechanized.

The benefits achieved by the present invention are numerous. Prior to the present invention, capturing crystallization trial data required that users spend countless hours behind the microscope, continuously looking away from the microscope to write their observations on sheets of paper in a notebook. Crystallization trials can last for periods of a year or more. The end result has been reams of notebook pages containing the results of thousands of crystallization trials. Since the information was written in notebooks, there was no efficient means for analyzing the data. The present invention provides a customized relational database that allows crystallization trial data to be captured in real time; i.e., crystallization setups are viewed through a microscope. Allowing command and control of the trial observation session to be driven by the user's voice, via a speech recognition interface, and facilitated by audio feedback ensures a high level of accuracy. Accuracy is high because researchers do not-have to look up from the microscope to write crystallization trial data into a database.

Displaying the results of a crystallization trial pictographically represents a major breakthrough in how crystallization trial observations are presented for analysis. The relational database created by an embodiment of the present invention allows a powerful query language to be used to create specific query tools for analyzing crystallization trial data.

Preferably, all of the graphical user interface is designed to be highly intuitive by minimizing the activities that go on in a crystallization laboratory. In essence, the present invention provides an "electronic wet lab" that can be used to capture all aspects of the preparation work that goes into setting up modern crystallization trials.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 28 shows a GUI for a complex copy well builder according to the present invention;

FIG. 31 shows a GUI for a complex drop composition builder according to the present invention;

FIG. 37 shows a GUI for a combinatorial copy well builder according to the present invention;

FIG. 38 shows a GUI for a combinatorial drop composition builder according to the present invention;

FIG. 76 shows a GUI for an attachment builder according to the present invention;

FIG. 78 shows a GUI for a solution compound buffer builder according to the present invention;

FIG. 80 shows a GUI for a solution chemical builder according to the present invention;

FIG. 85 shows a GUI for a matrix viewer according to the present invention;

FIG. 88 shows a GUI for a calculate stock solution volume builder according to the present invention;

FIGS. 89A–89G show a report from the stock solution volume calculator of FIG. 88;

Figure 106:
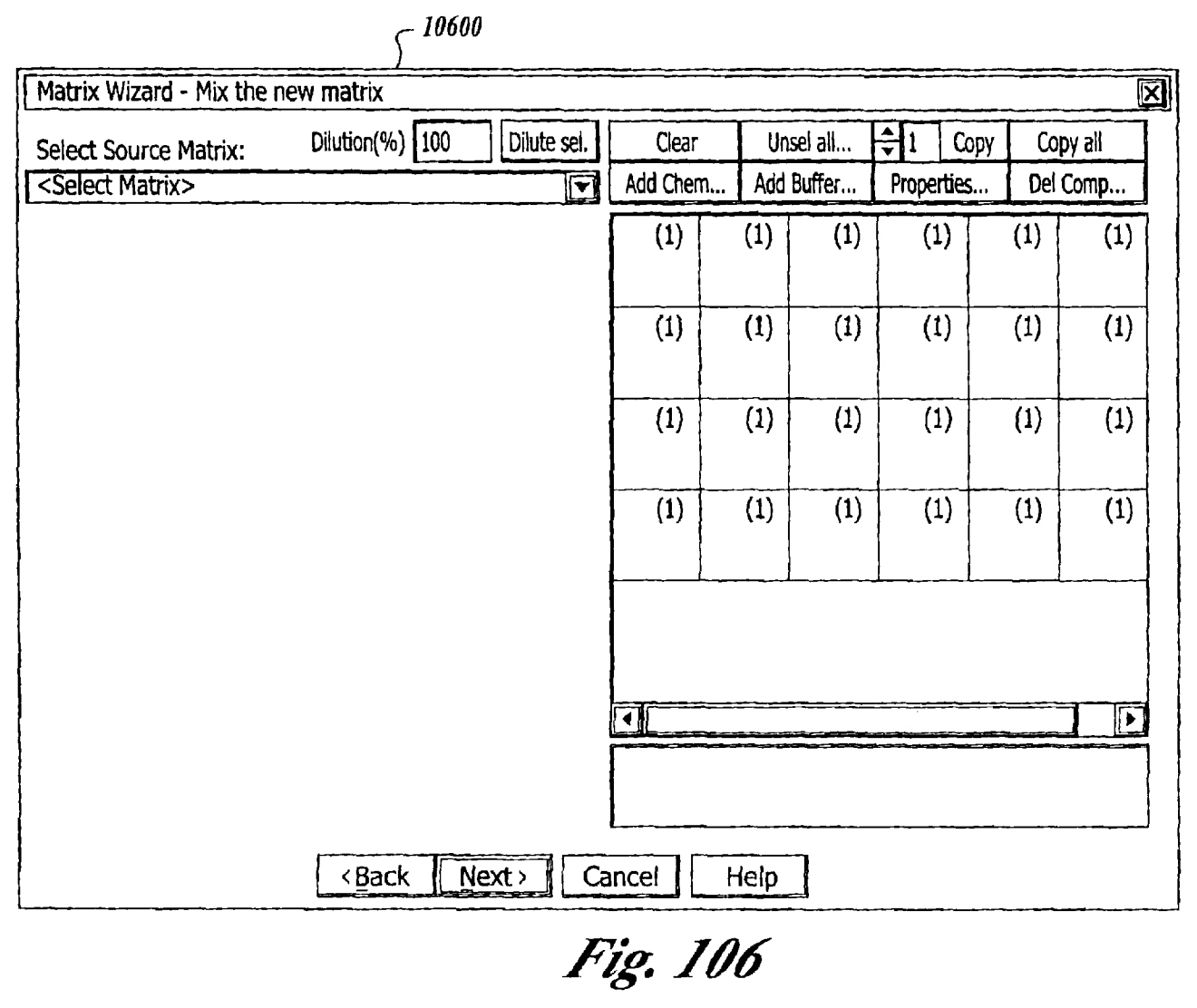

FIG. 106 shows a GUI for a matrix mix builder according to the present invention;

FIG. 135 shows a GUI for an apparatus well data tab according to the present invention;

FIG. 143 shows a GUI for an apparatus well data tab according to the present invention;

FIG. 155 shows a GUI for a subunit manager according to the present invention;

FIG. 156 shows a functional flow diagram for a subunit manager according to the present invention;

FIG. 157 shows a GUI for a new subunit builder according to the present invention;

FIG. 158 shows a functional flow diagram for a new subunit builder according to the present invention;

FIG. 159 shows an update subunit builder according to the present invention;

FIG. 160 shows a generic functional flow diagram for a macromolecule manager according to the present invention;

FIG. 161 shows a GUI for a macromolecule manager according to the present invention;

FIG. 162 shows a functional flow diagram for a macromolecule manager according to the present invention;

FIG. 163 shows a GUI for a new macromolecule builder according to the present invention;

FIG. 164 shows a functional flow diagram for a new macromolecule builder according to the present invention;

FIG. 165 shows a generic functional flow diagram for a macromolecule formulation manager according to the present invention;

FIG. 166 shows a GUI for a macromolecule formulation manager according to the present invention;

Figure 167:
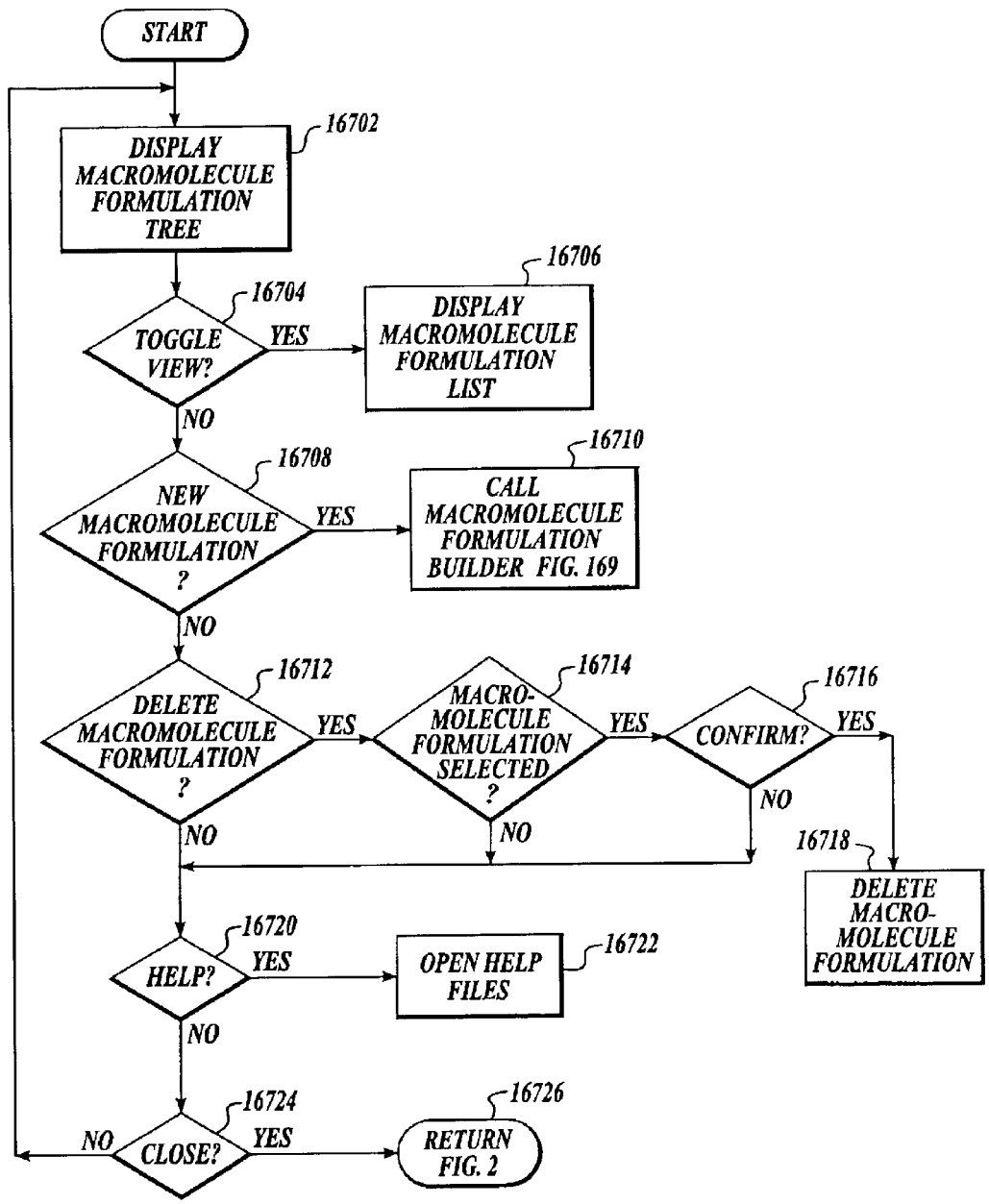
Figure 168:
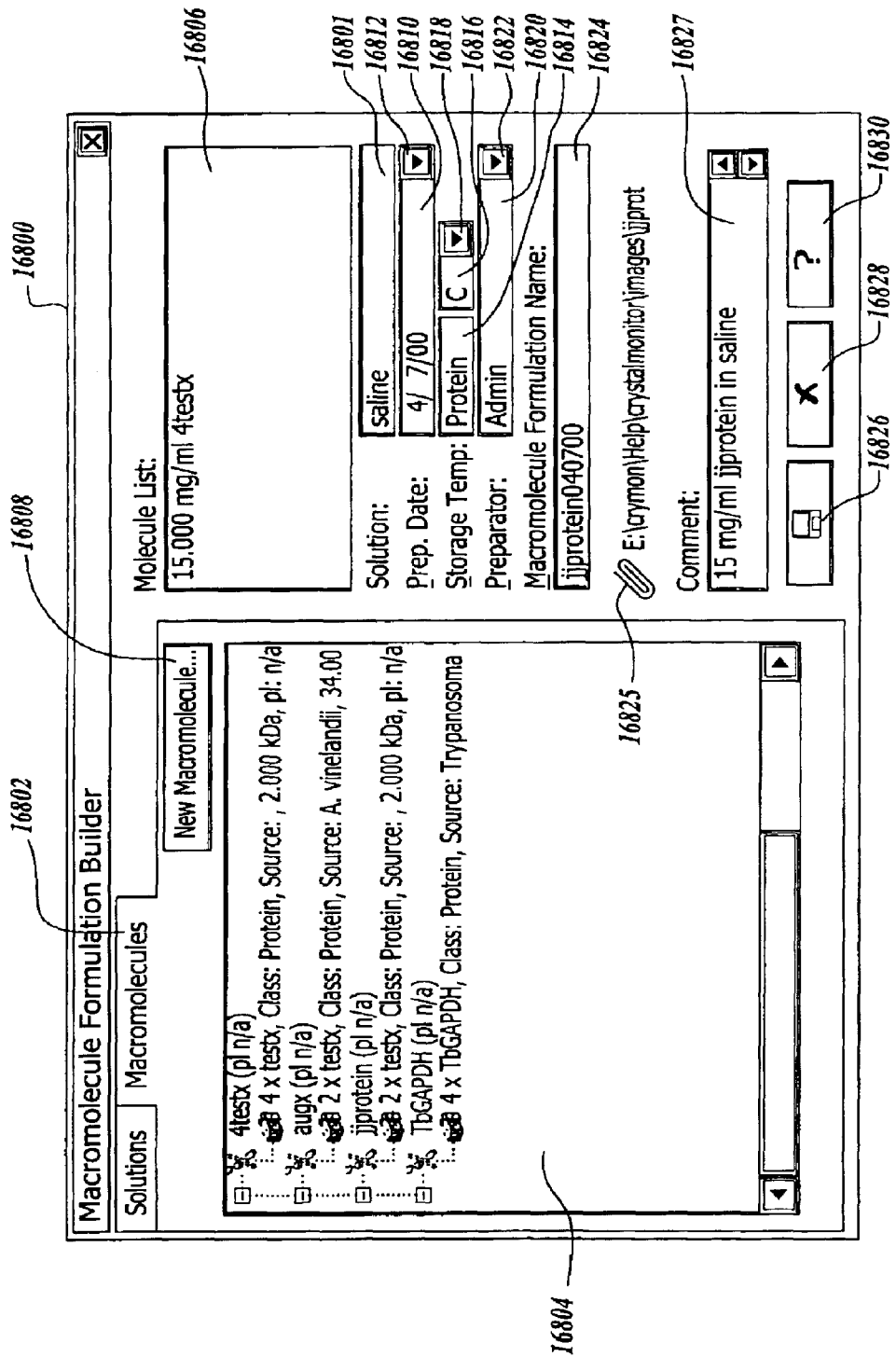
Figure 169:
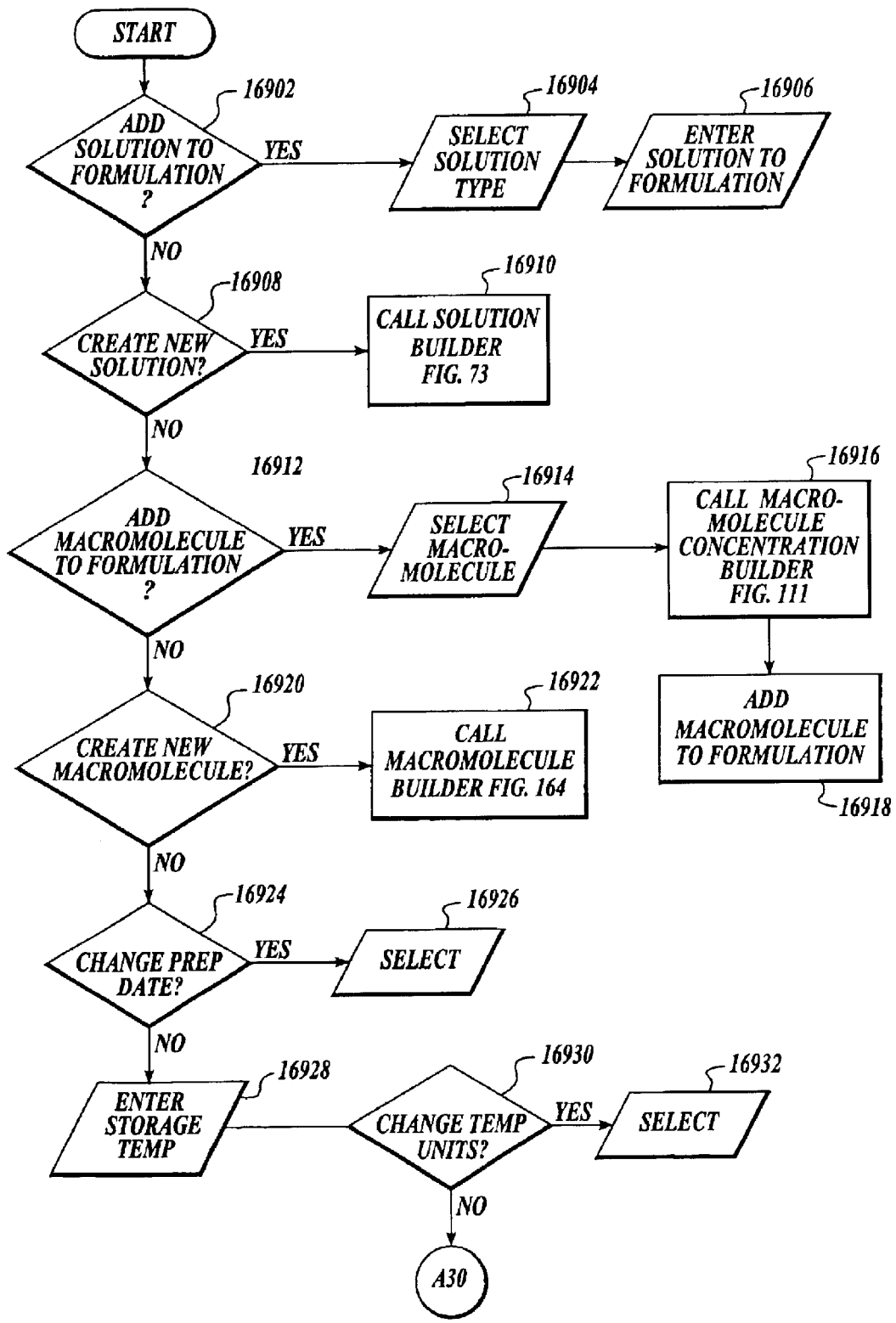
Figure 170:
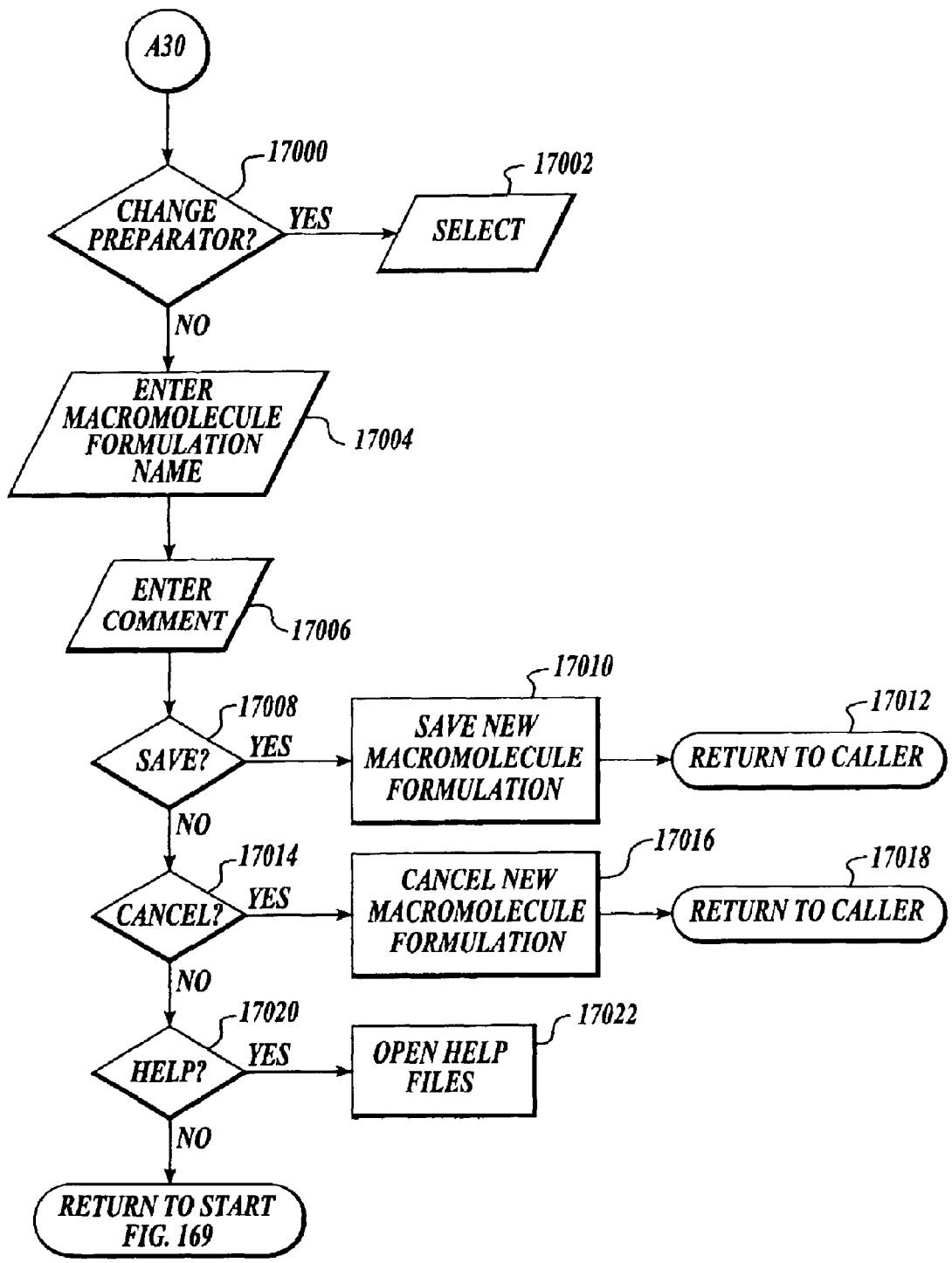
Figure 171:
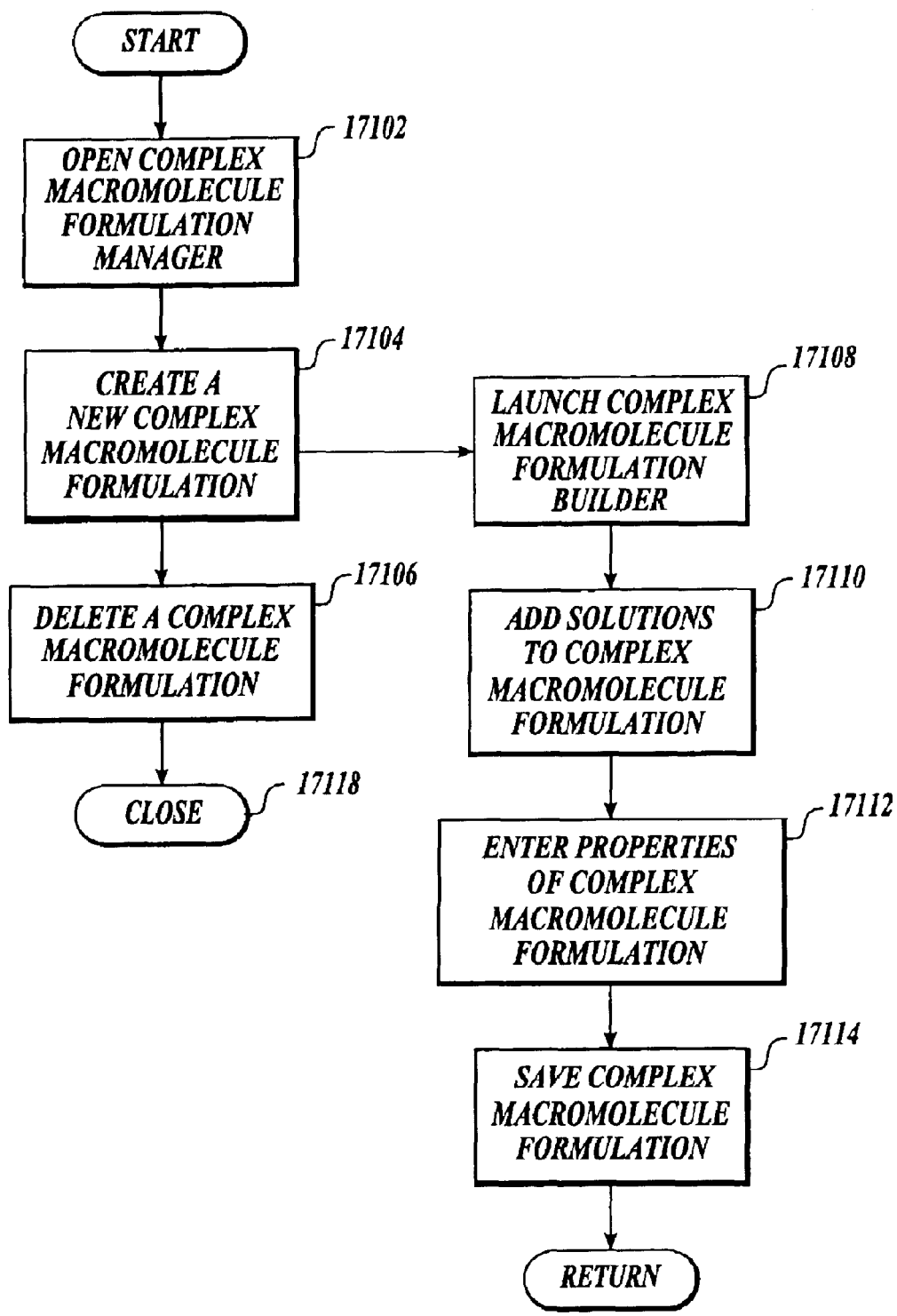
Figure 172:
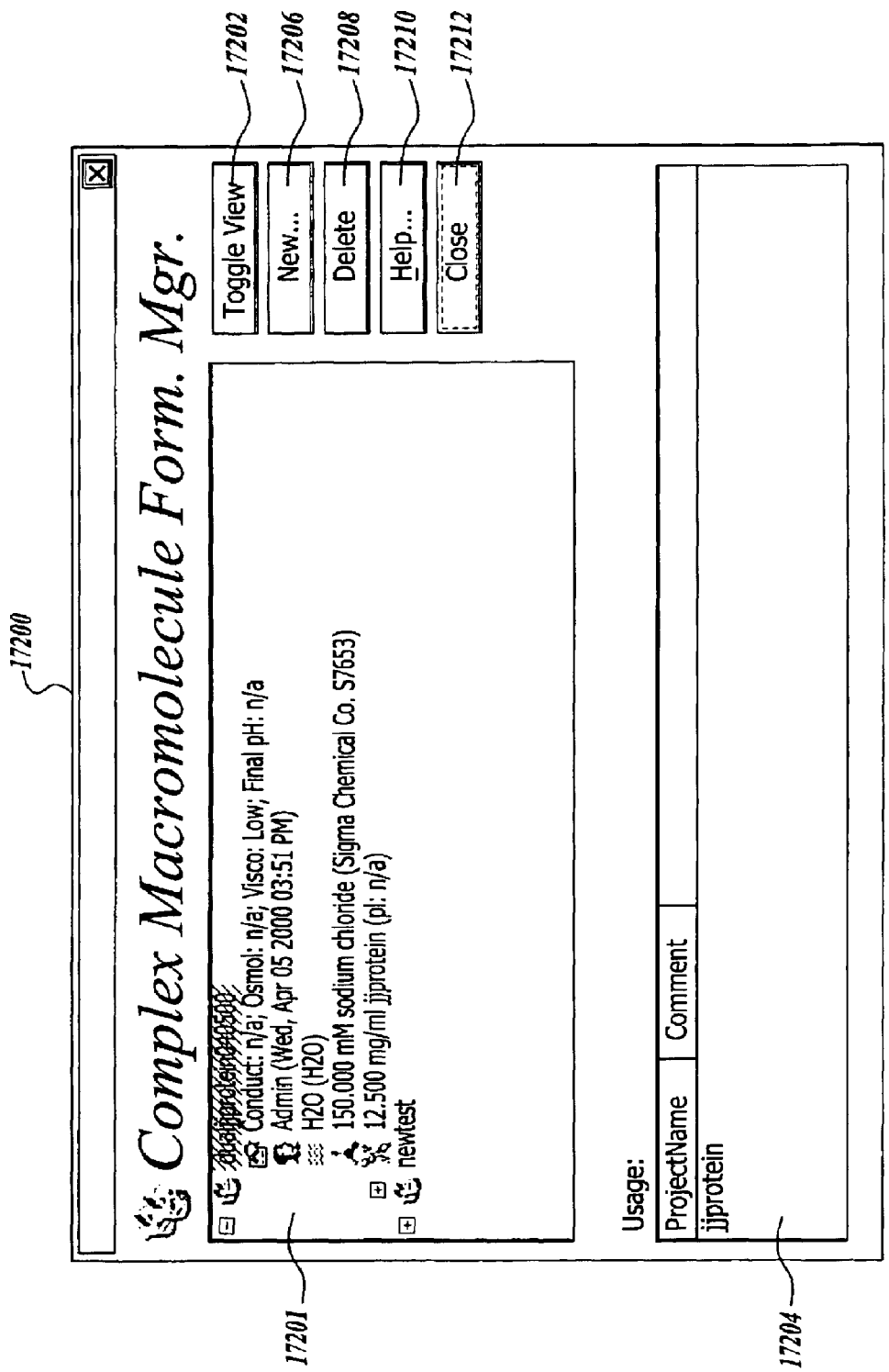
Figure 173:
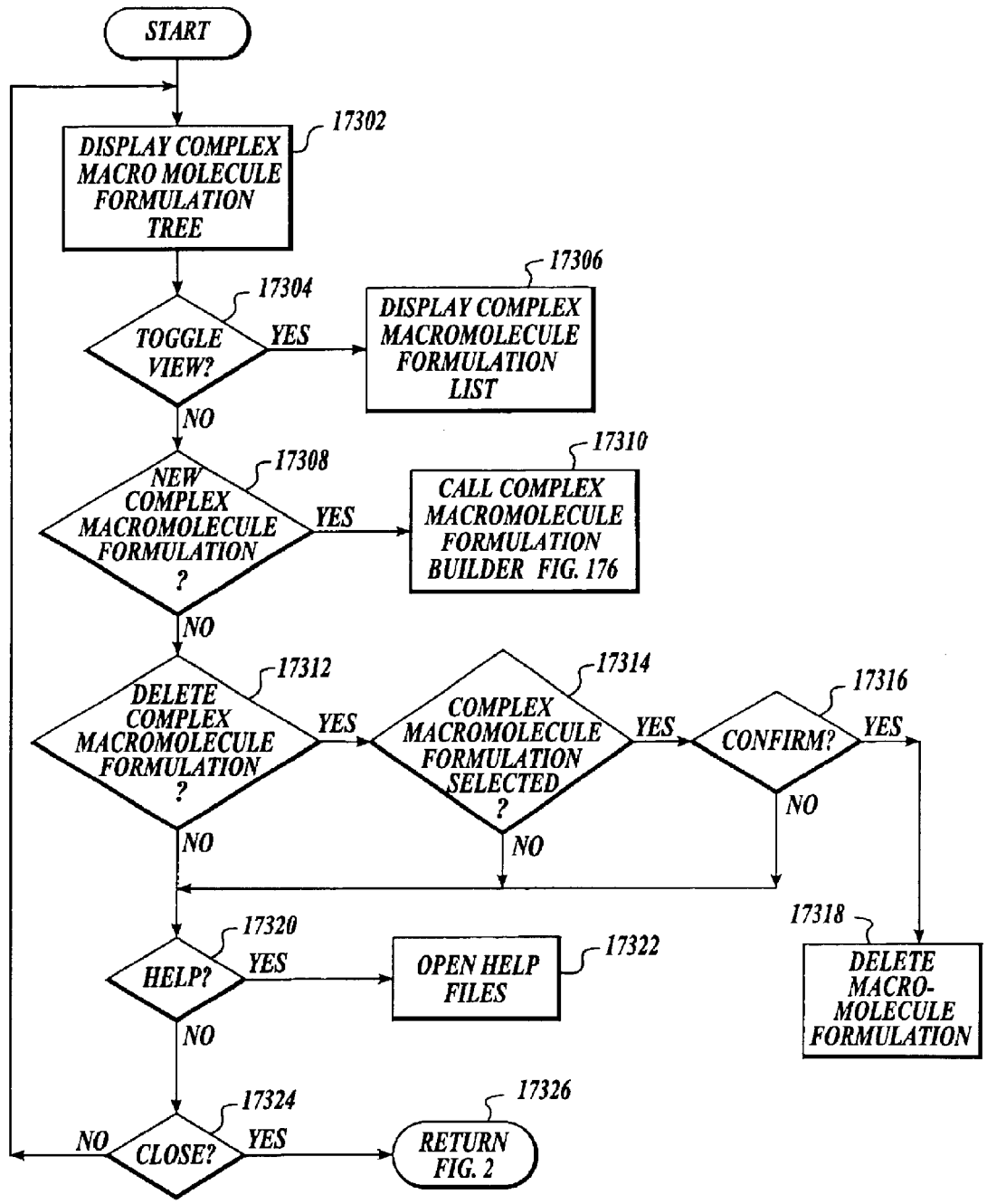
Figure 174:
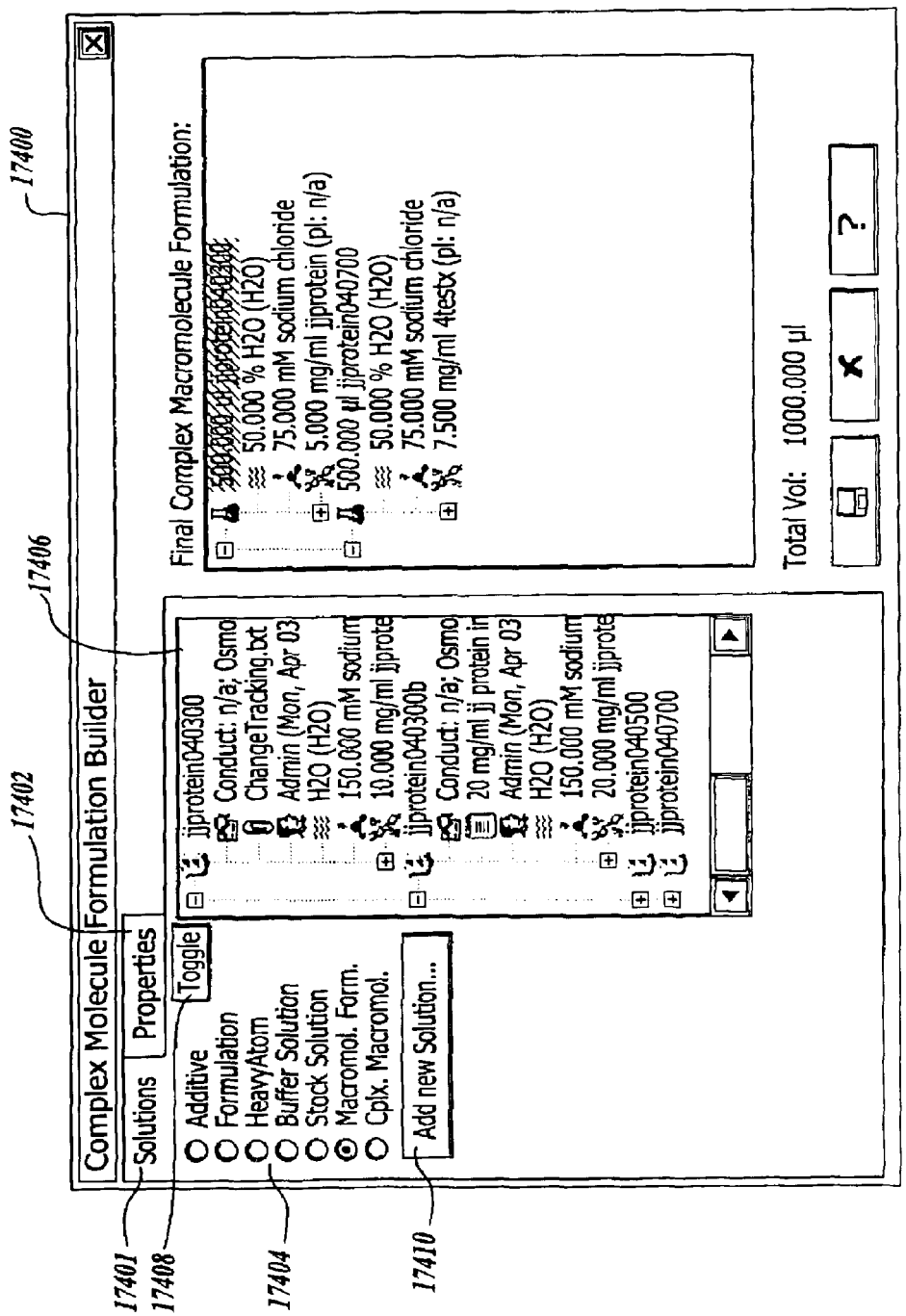
Figure 176:
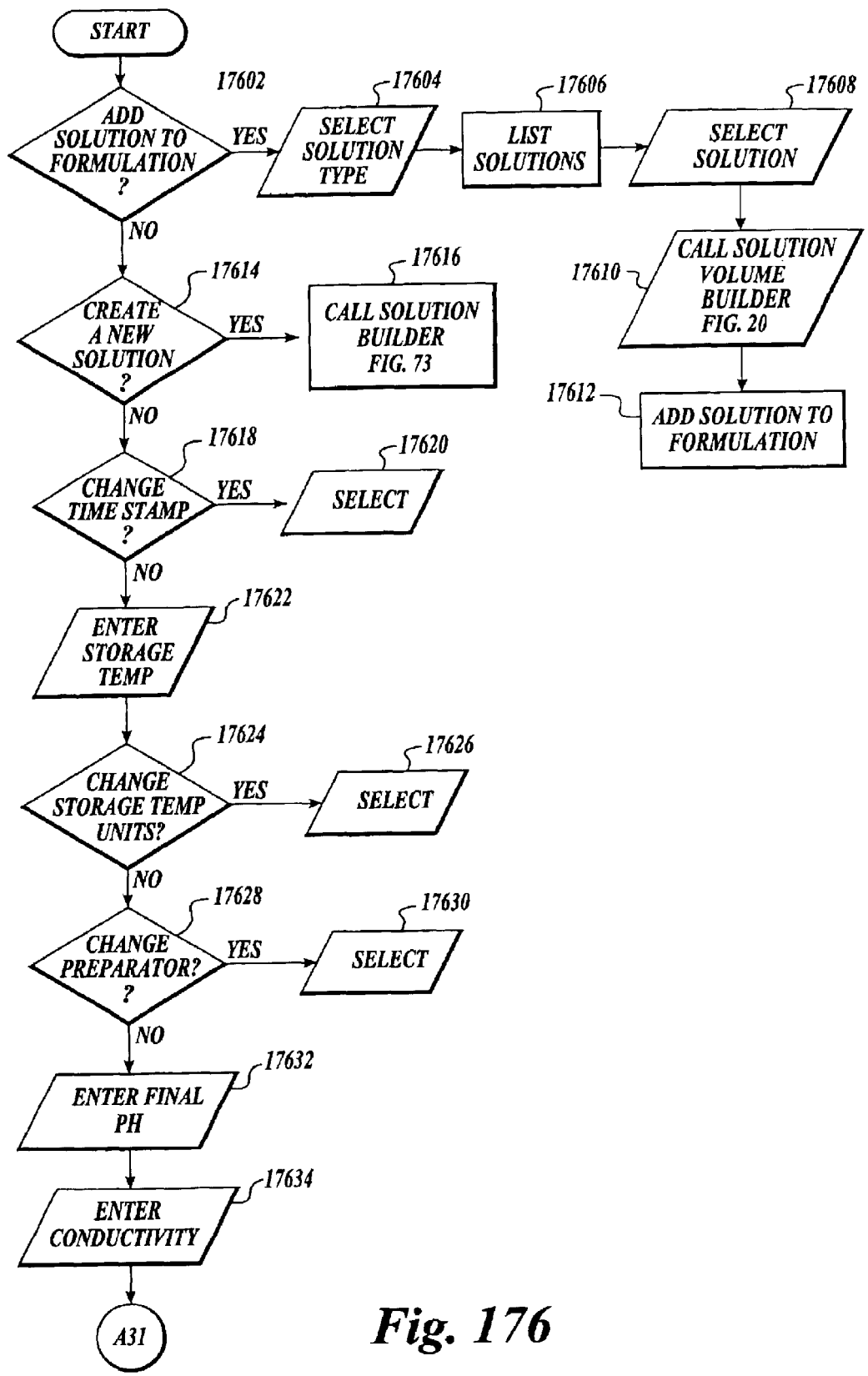
Figure 177:
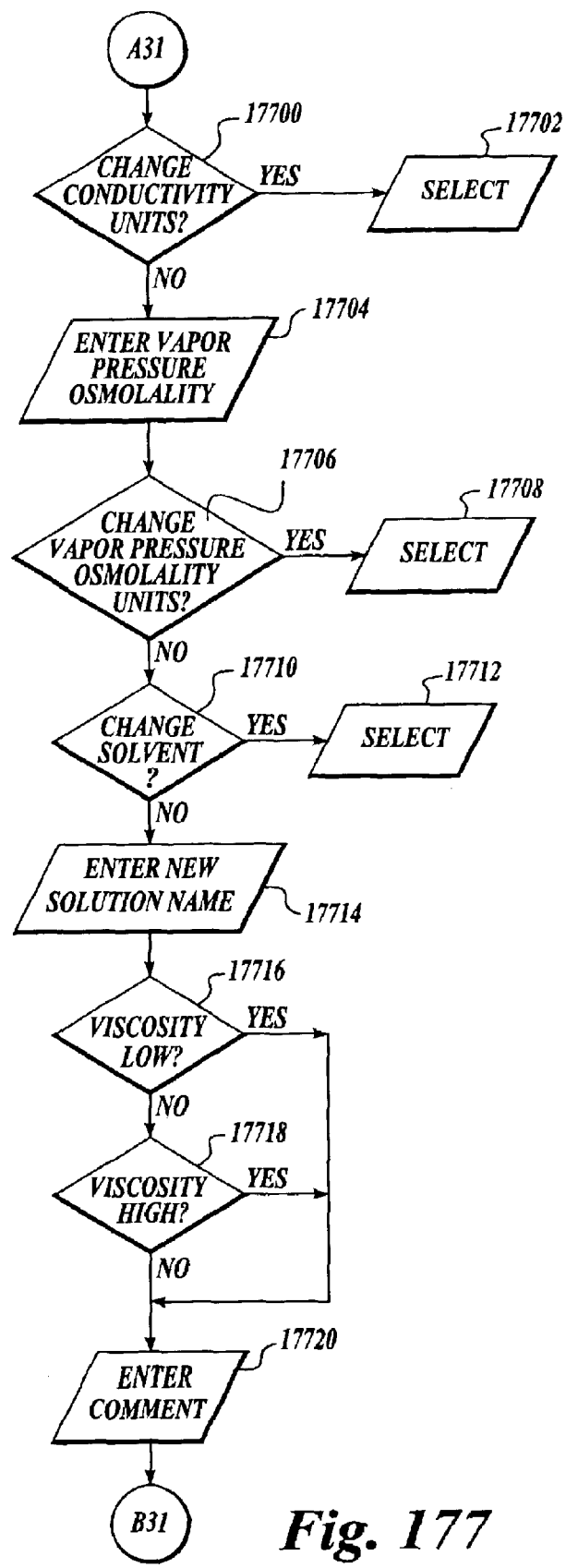
Figure 178:
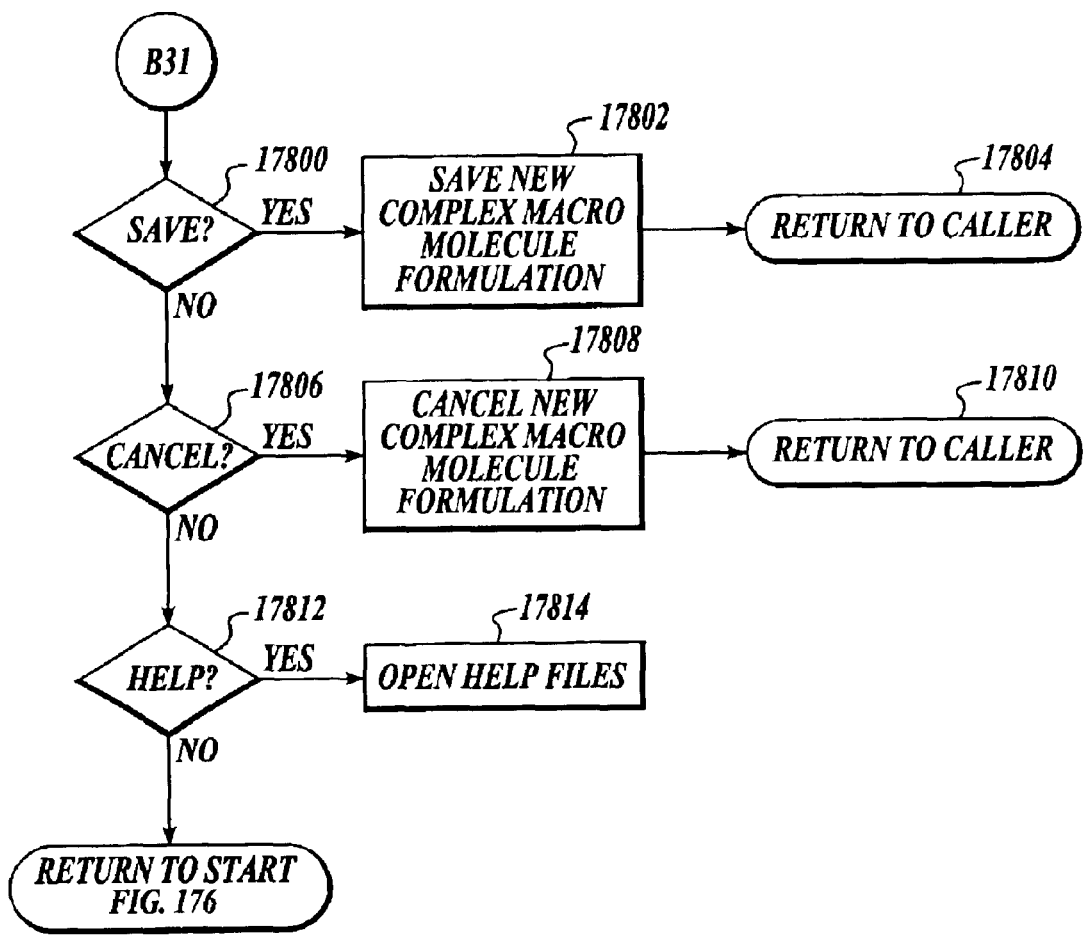
Figure 179:
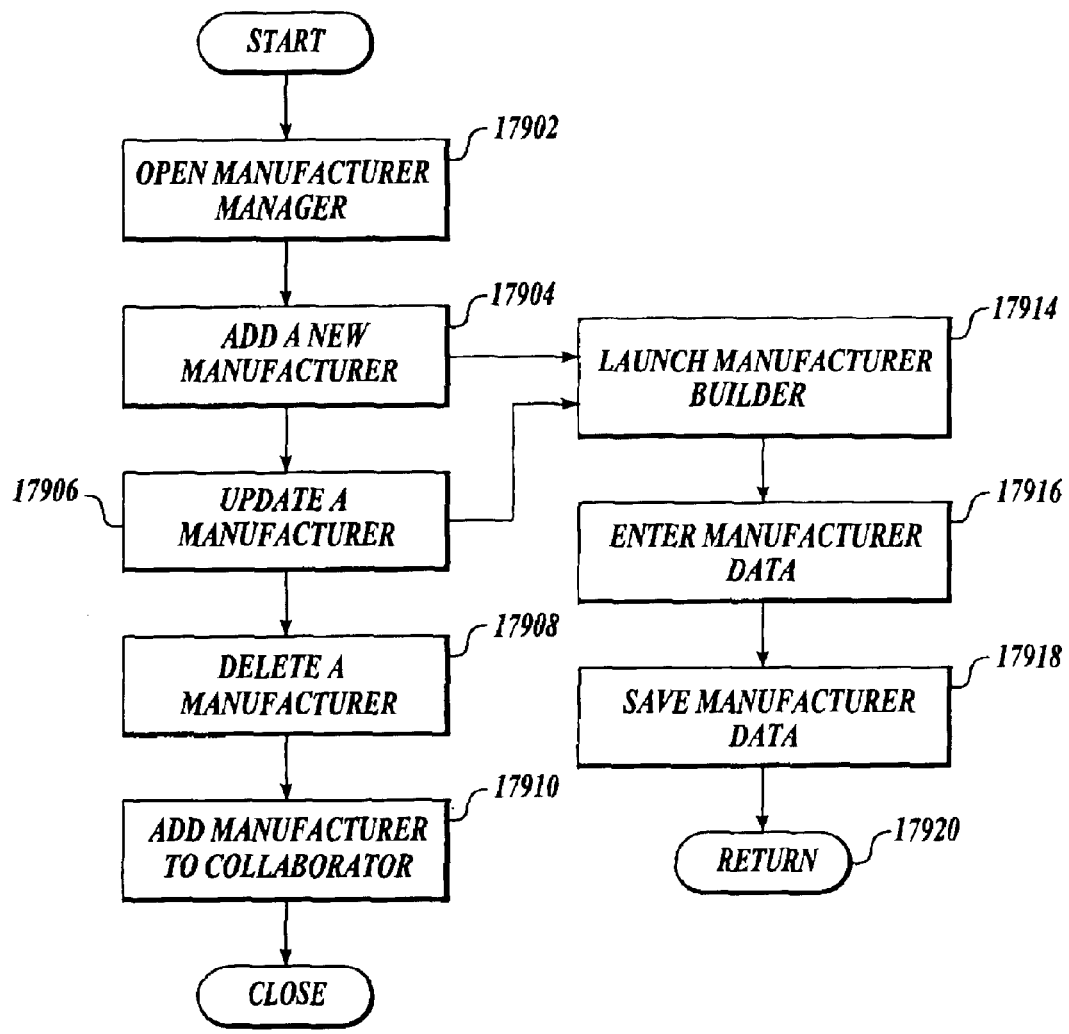
Figure 180:
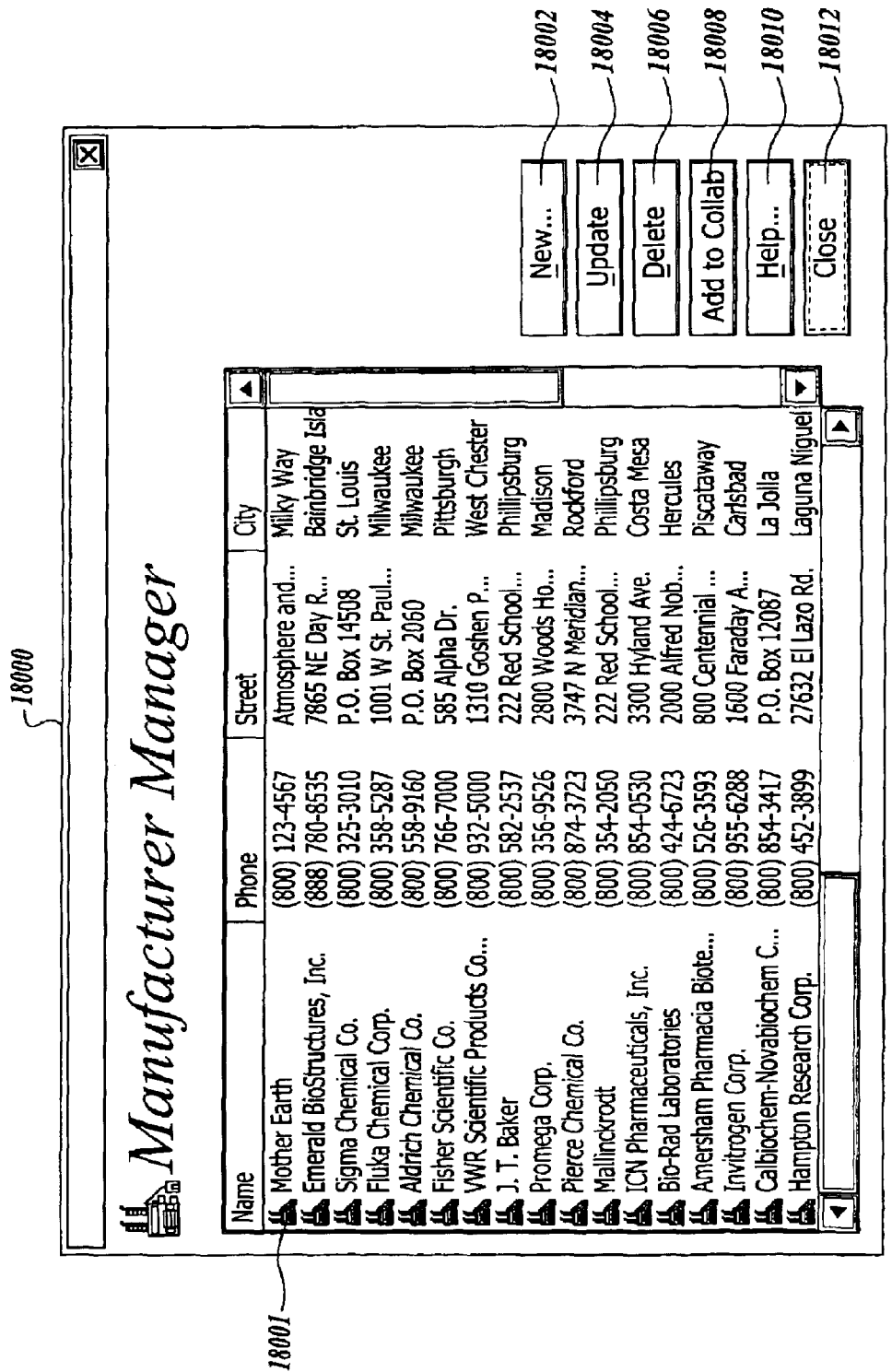
Figure 181:
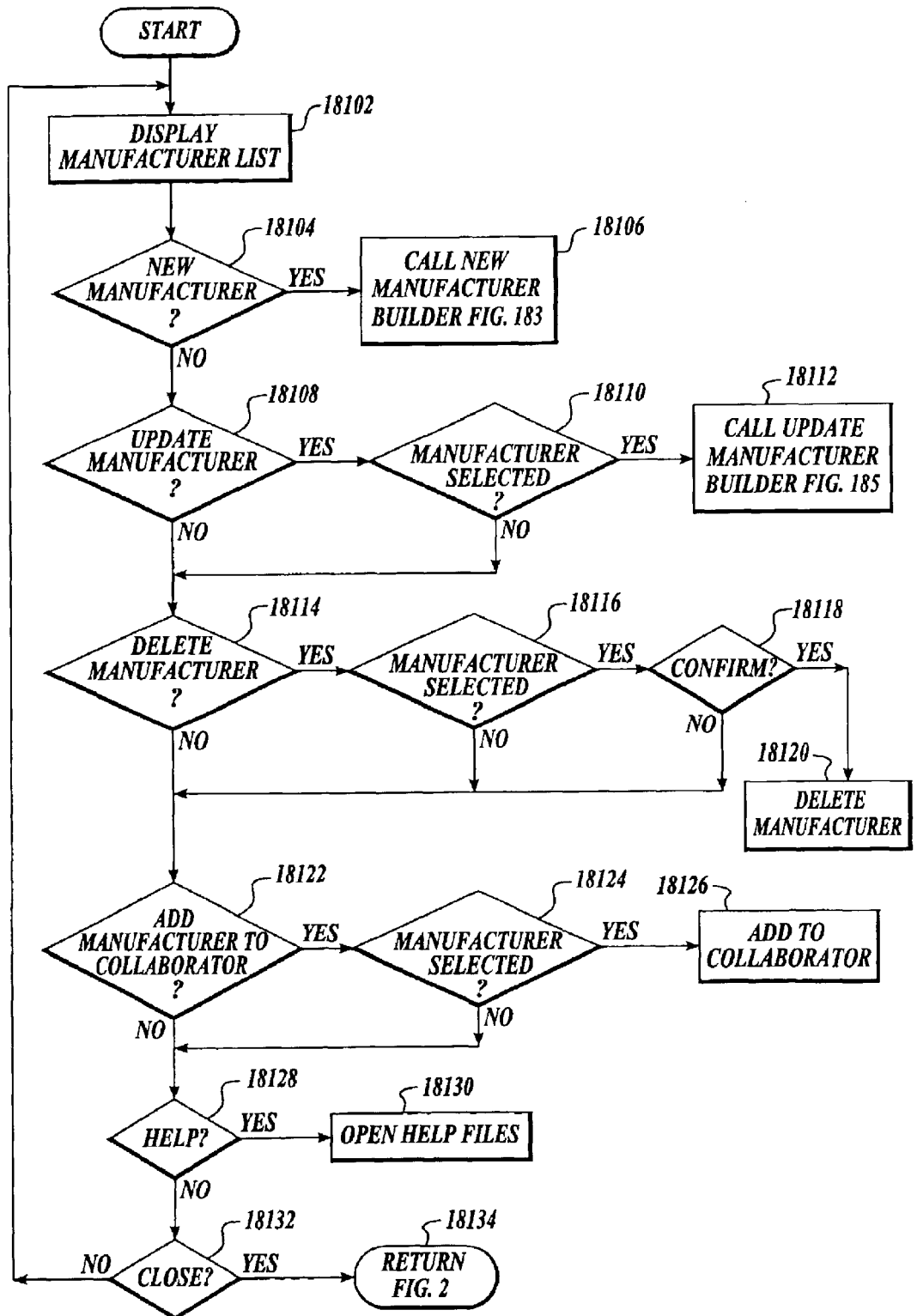
Figure 182:
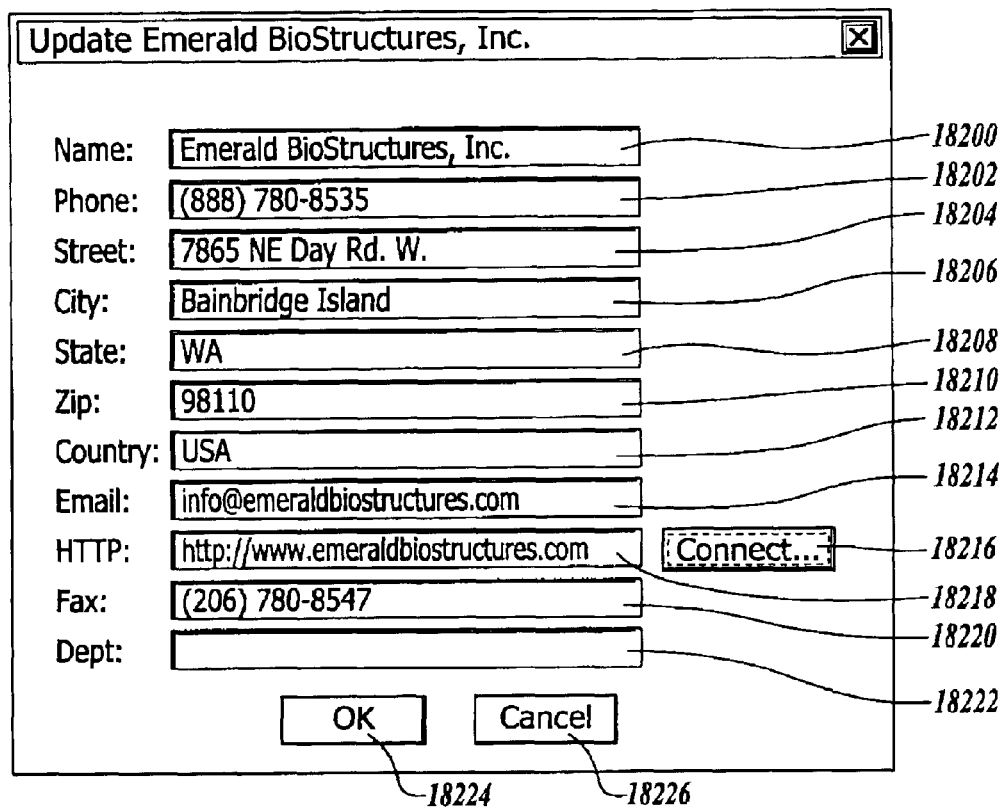
Figure 183:
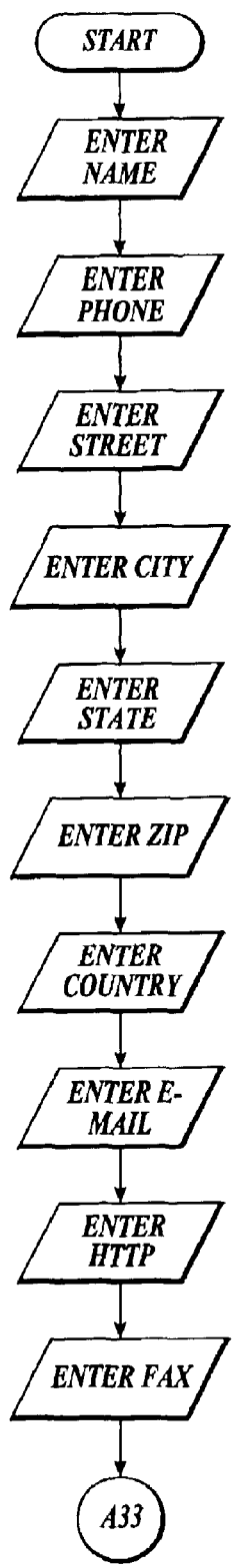
Figure 184:
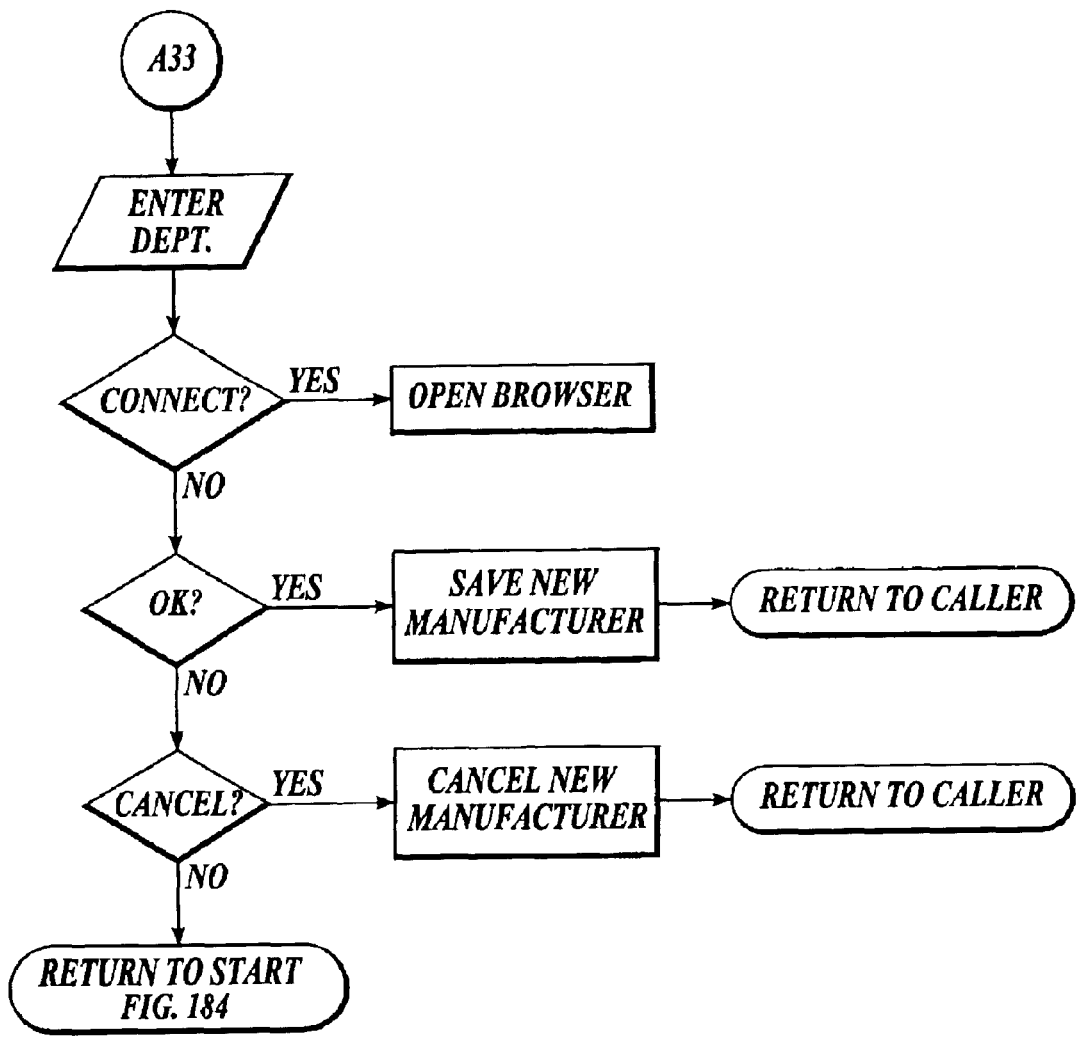
Figure 185:
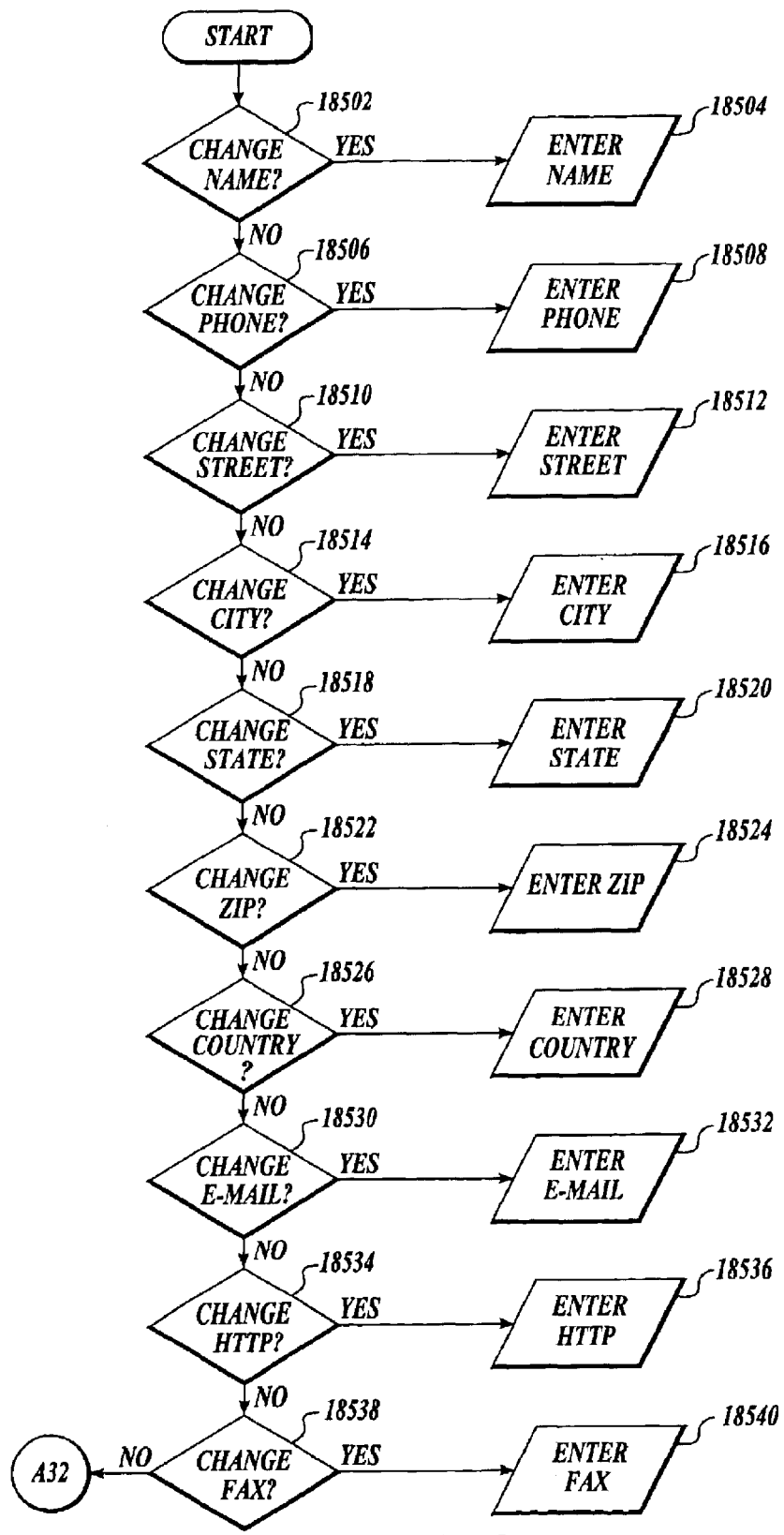
Figure 186:
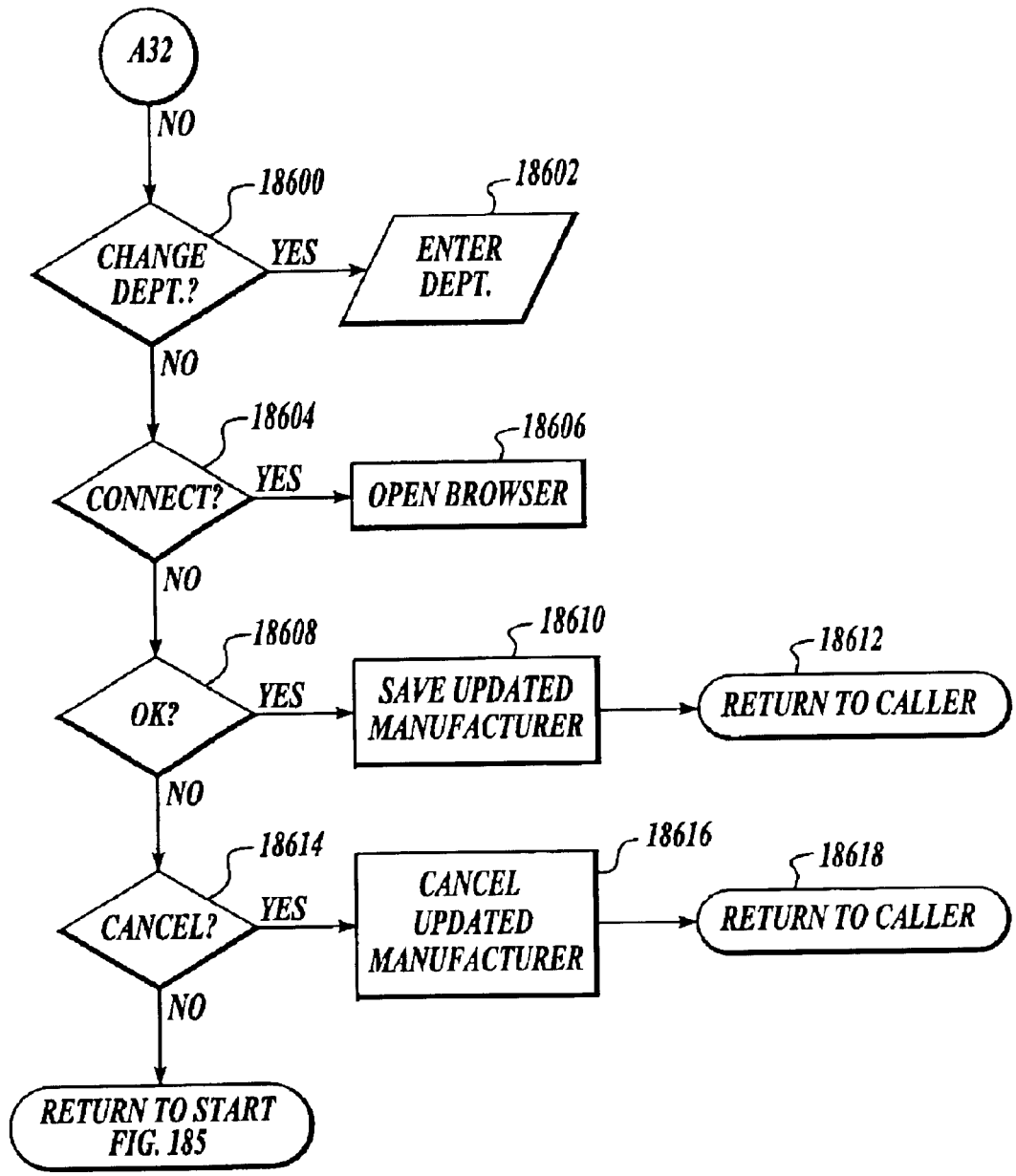
Figure 187:
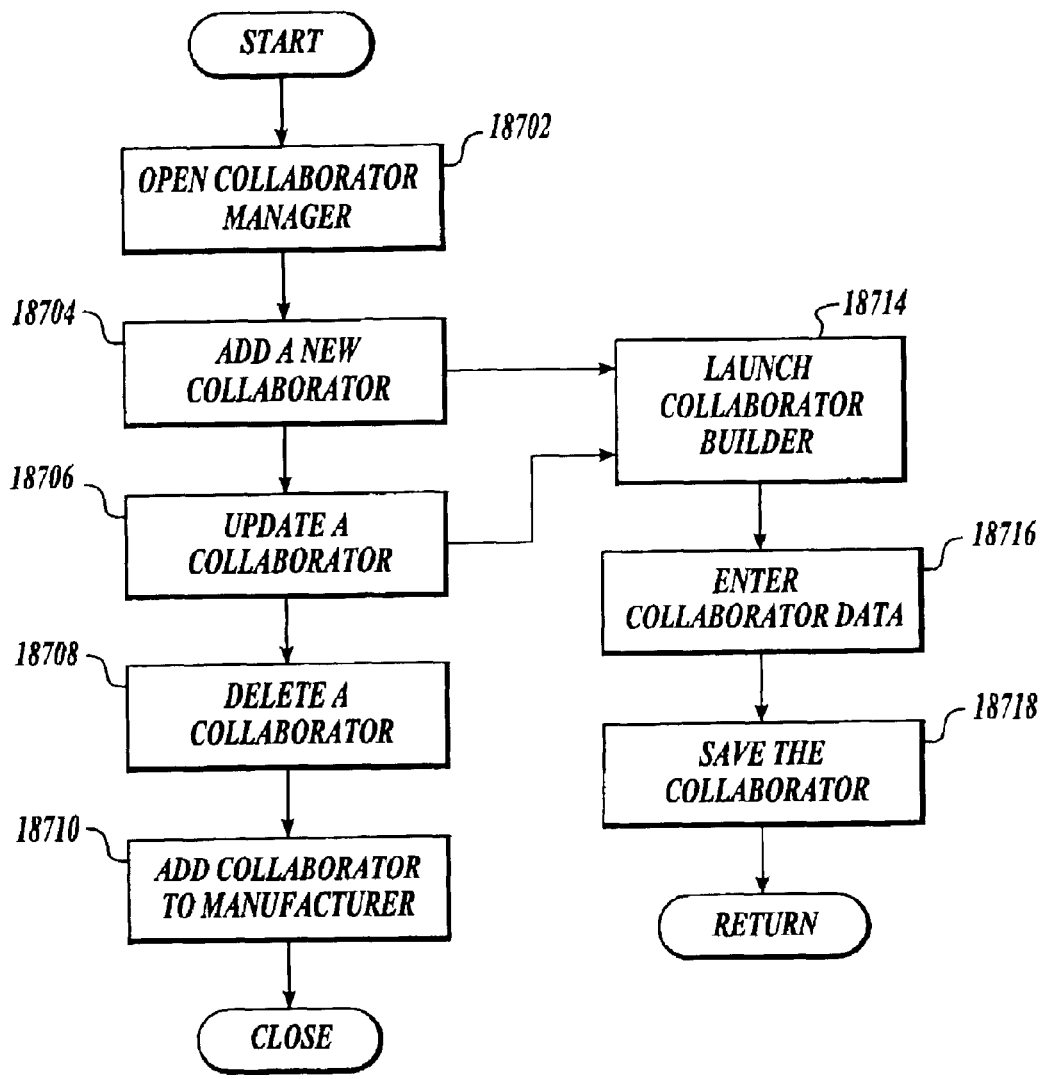
Figure 188:
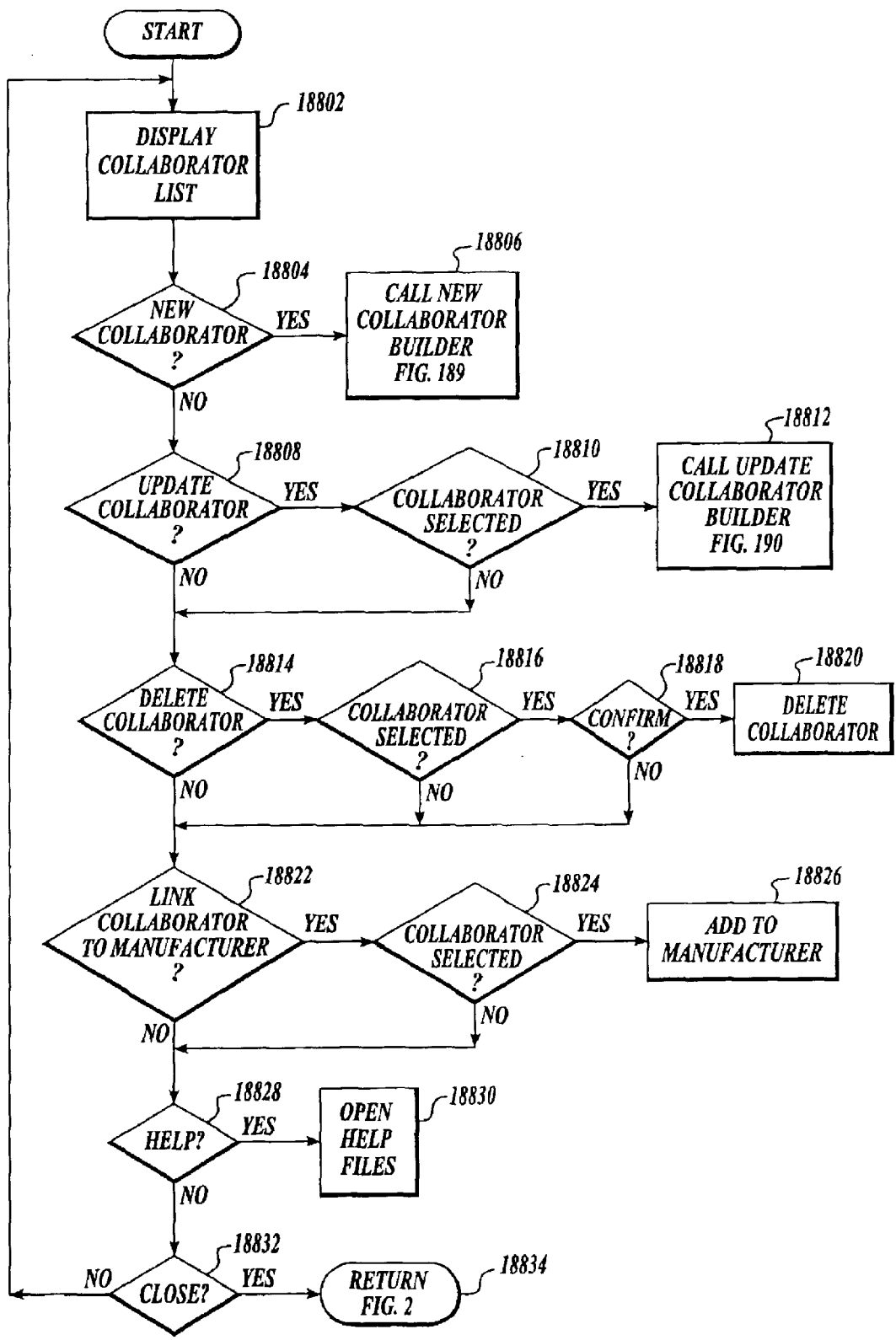
Figure 189:
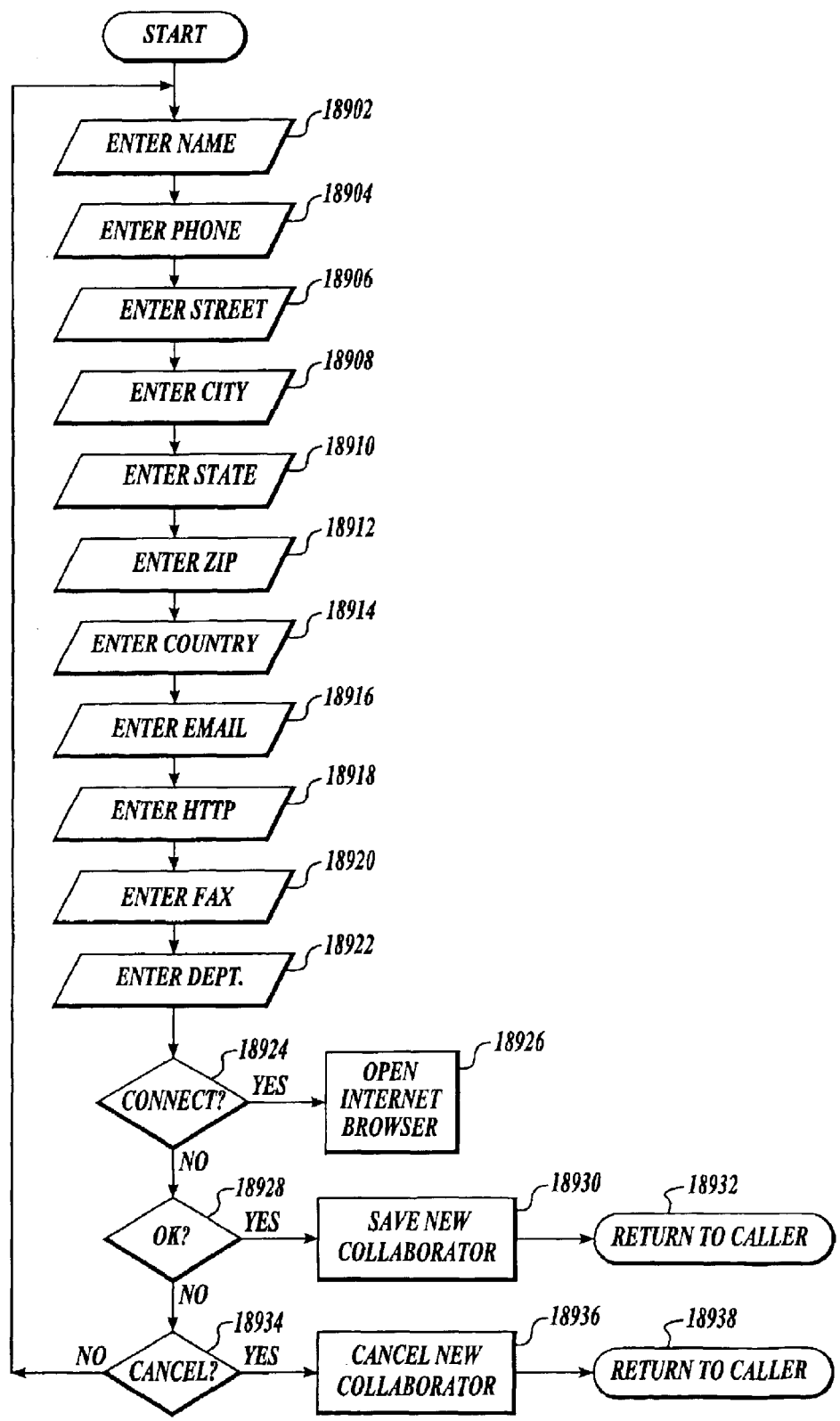
Figure 190:
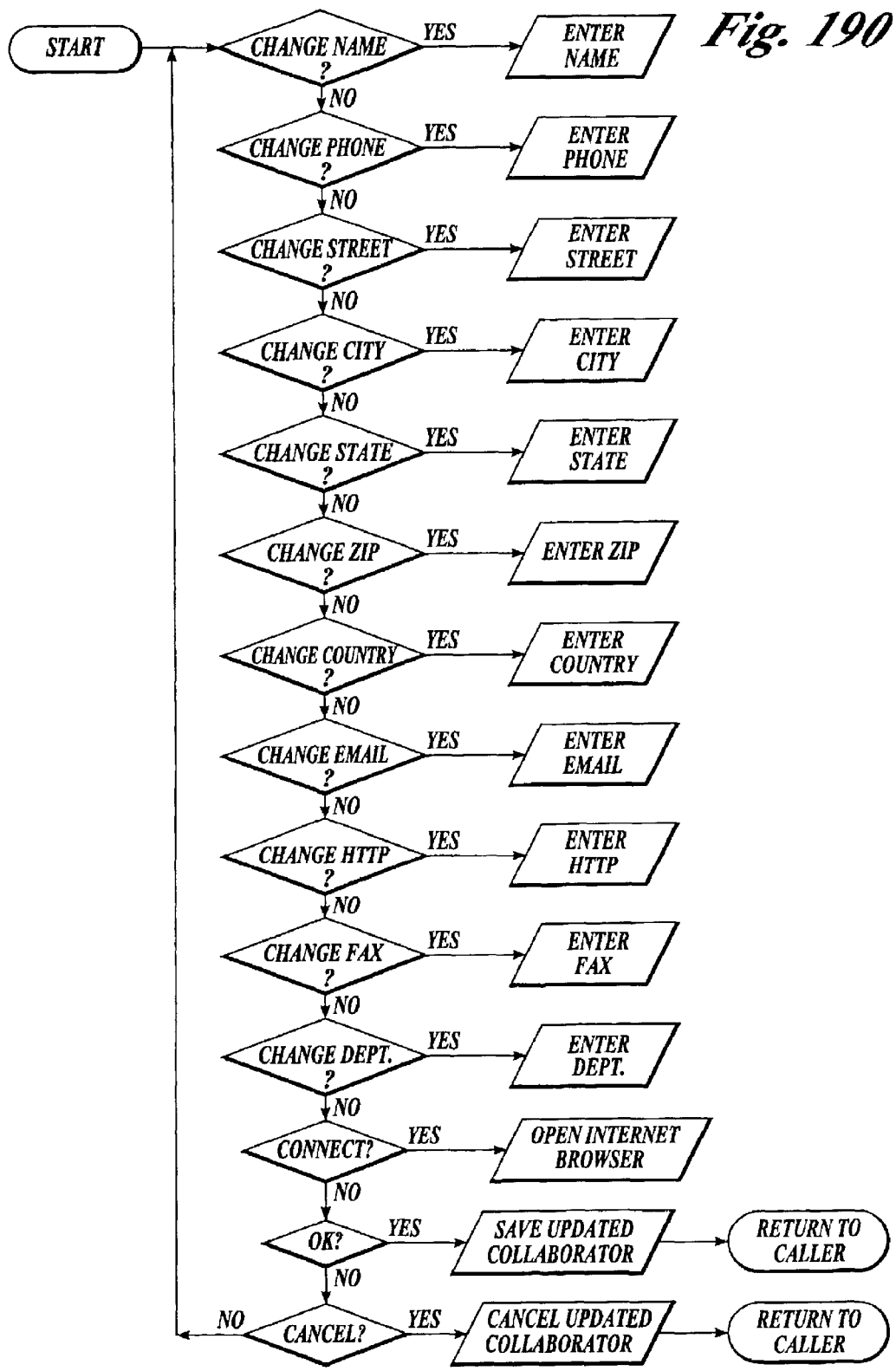
Figure 191:
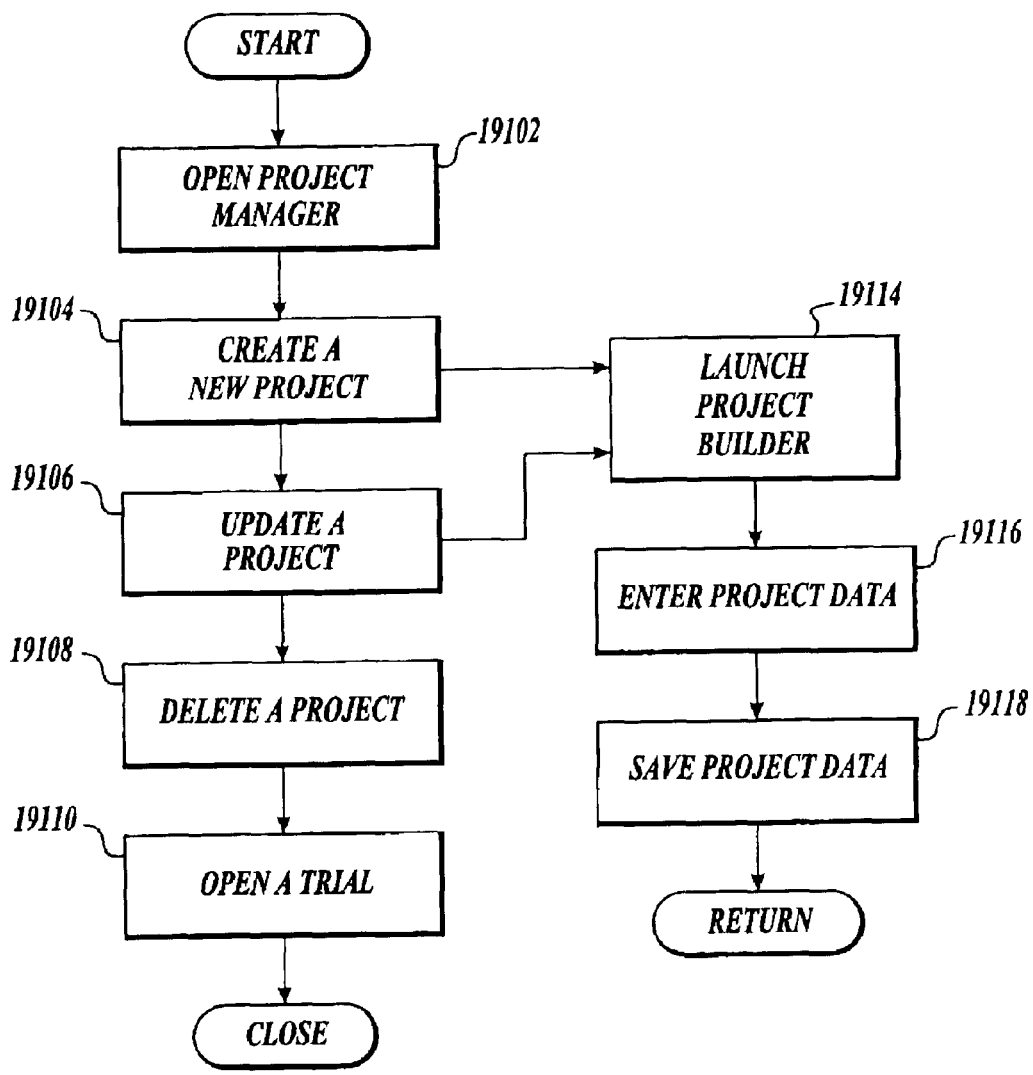
Figure 192:
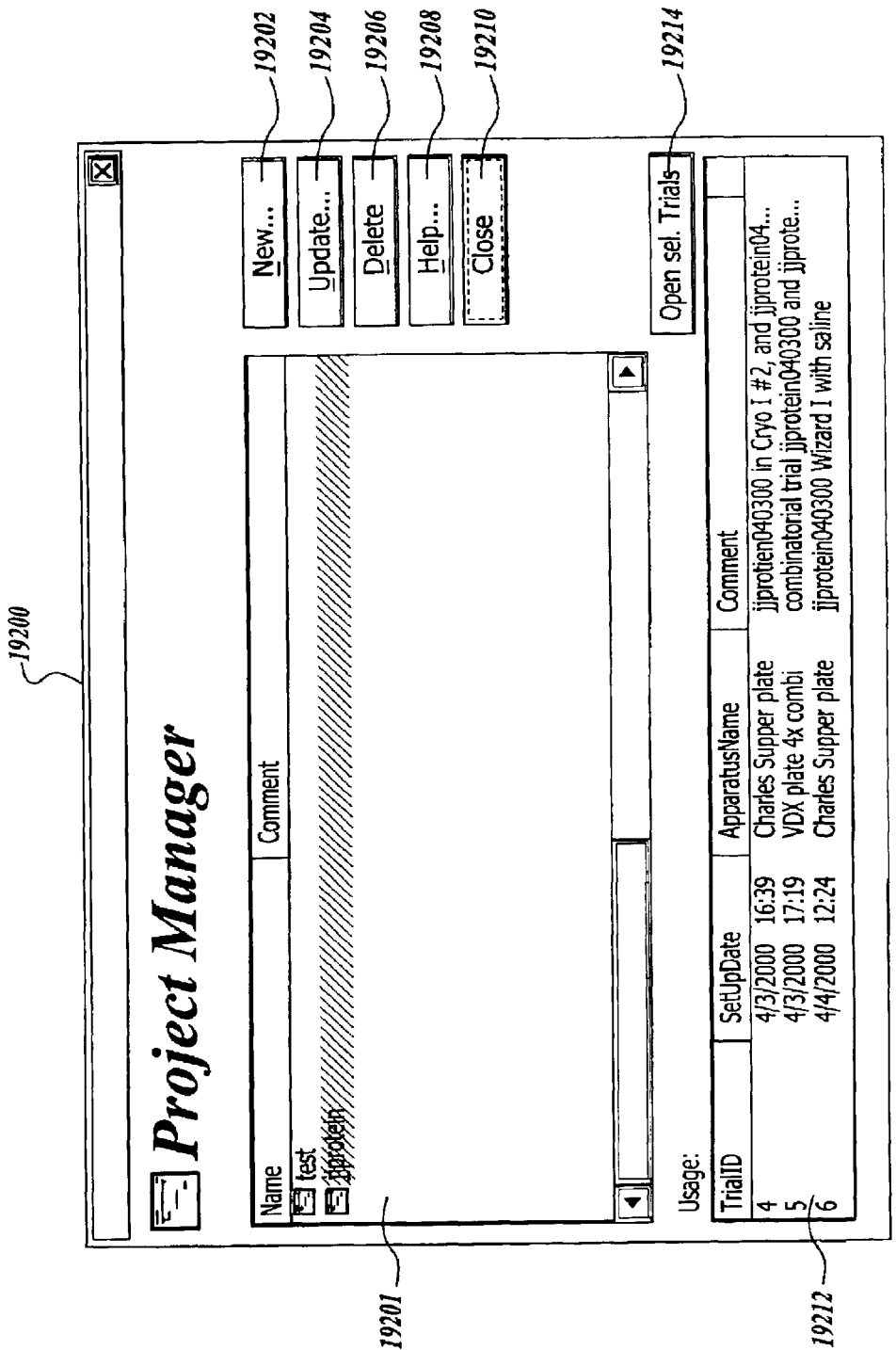
Figure 193:
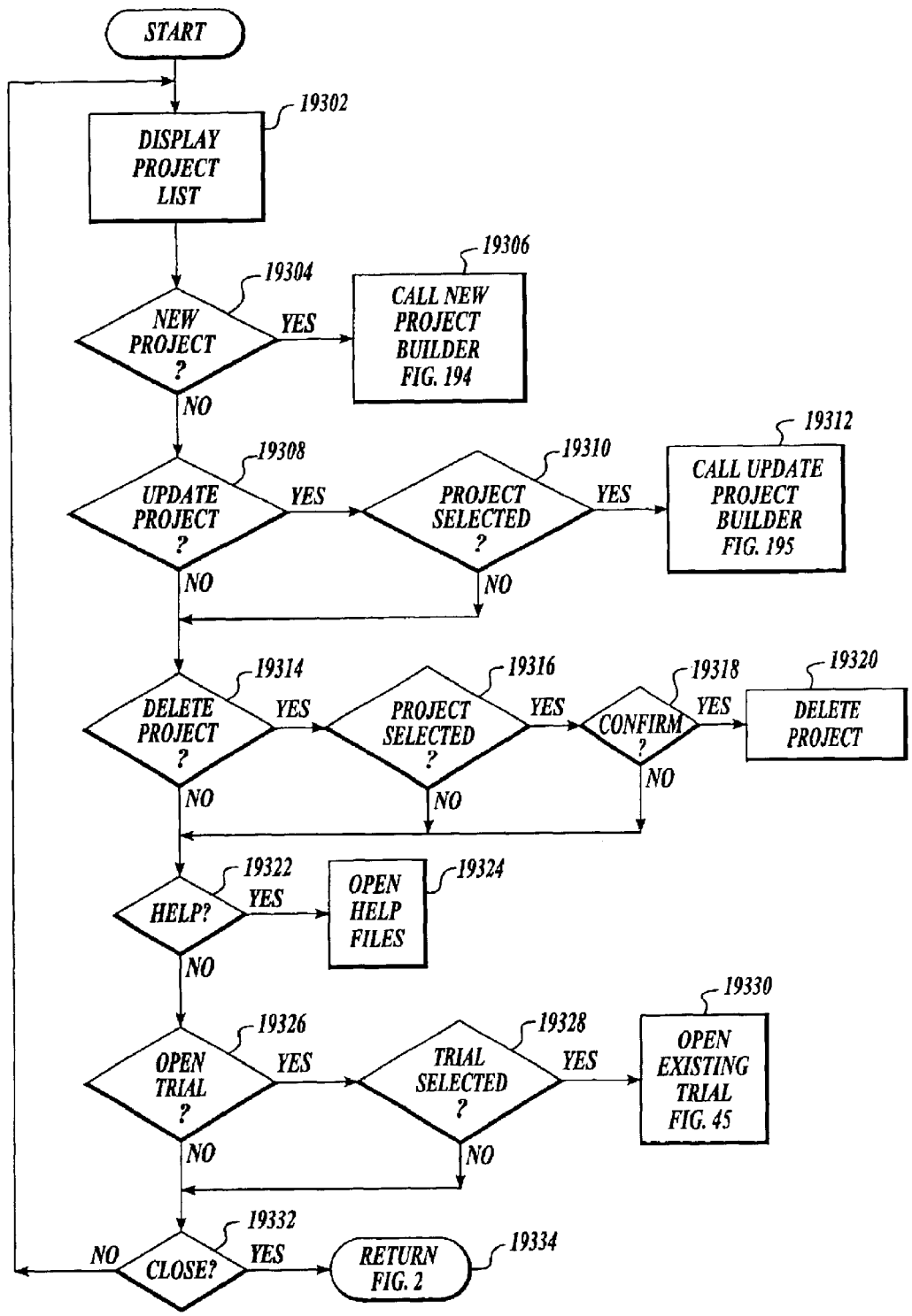
Figure 194:
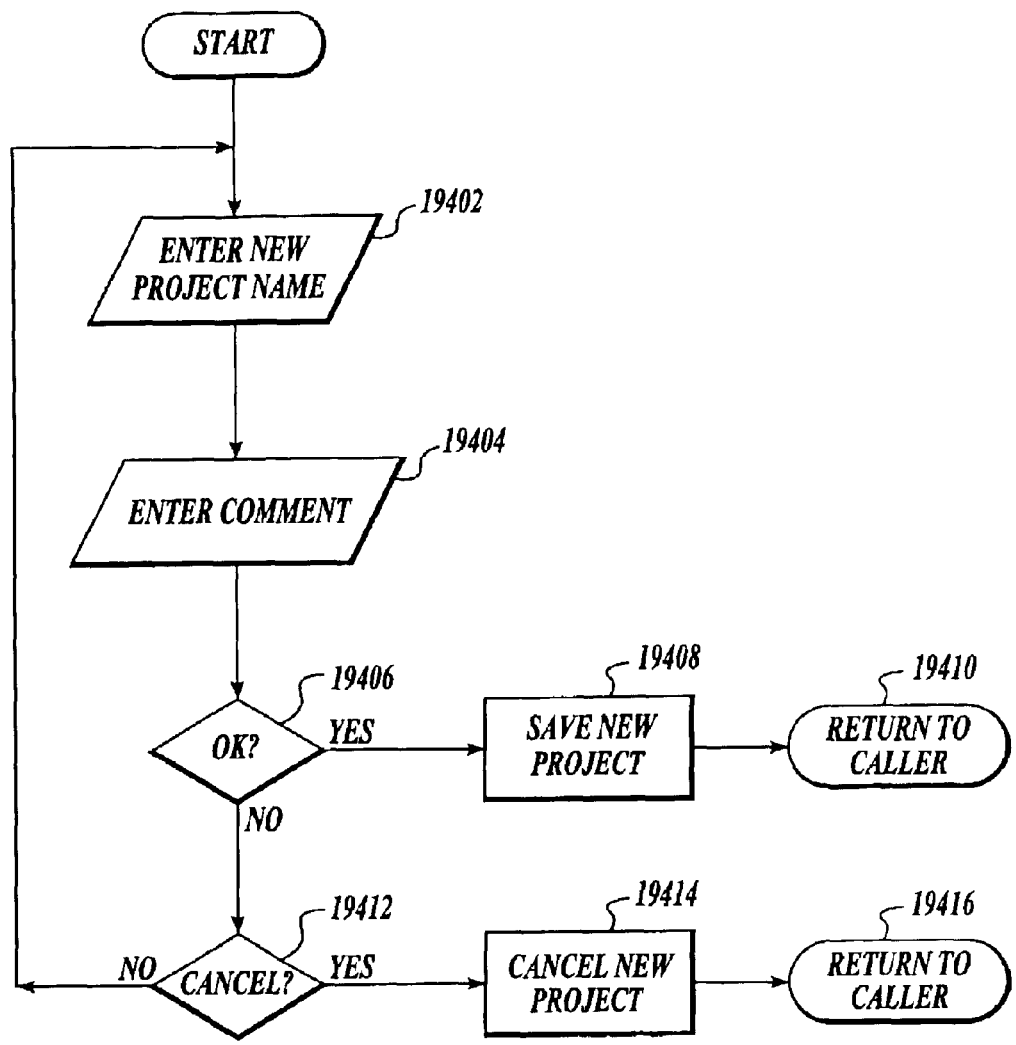
Figure 195:
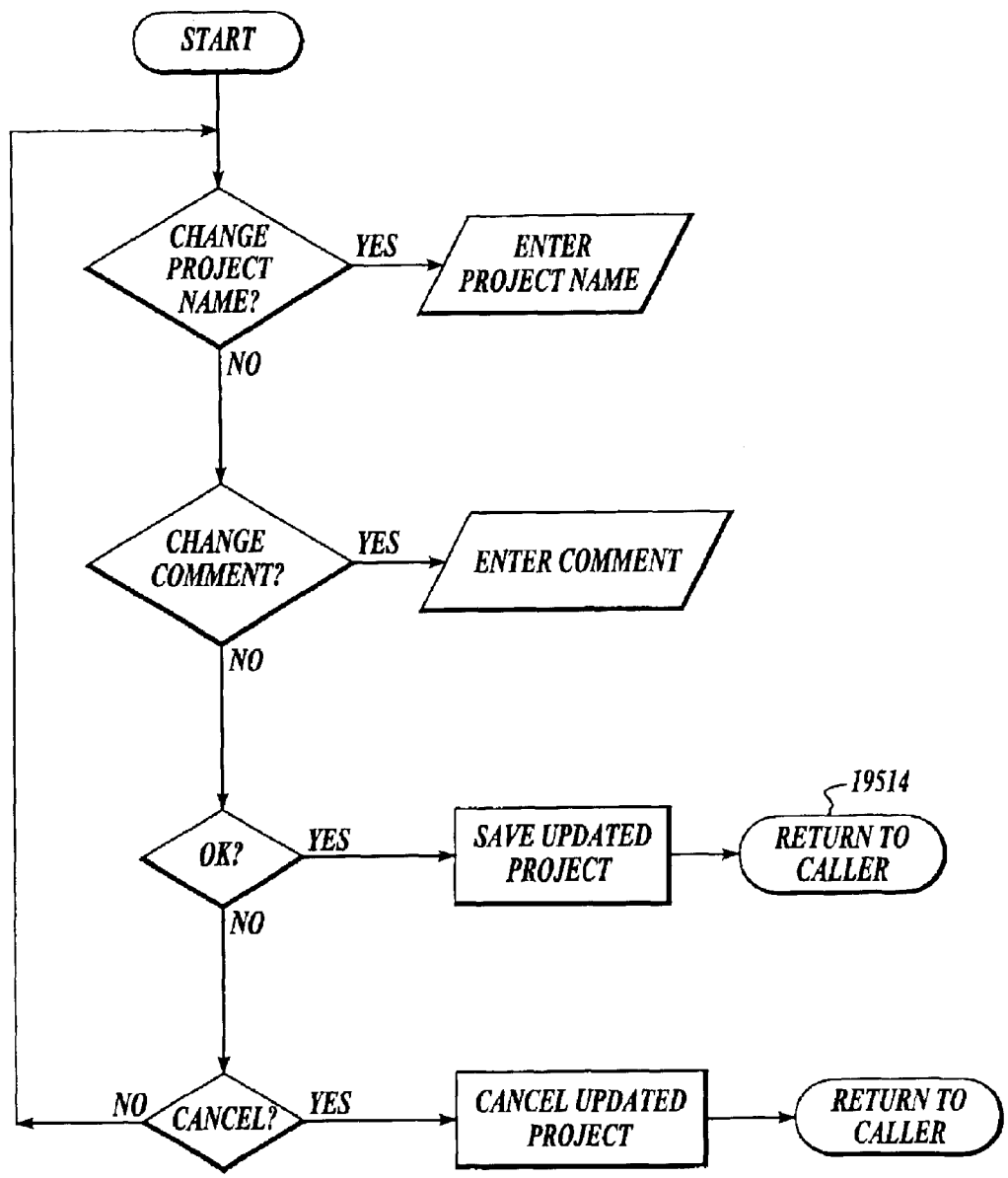
Figure 196:
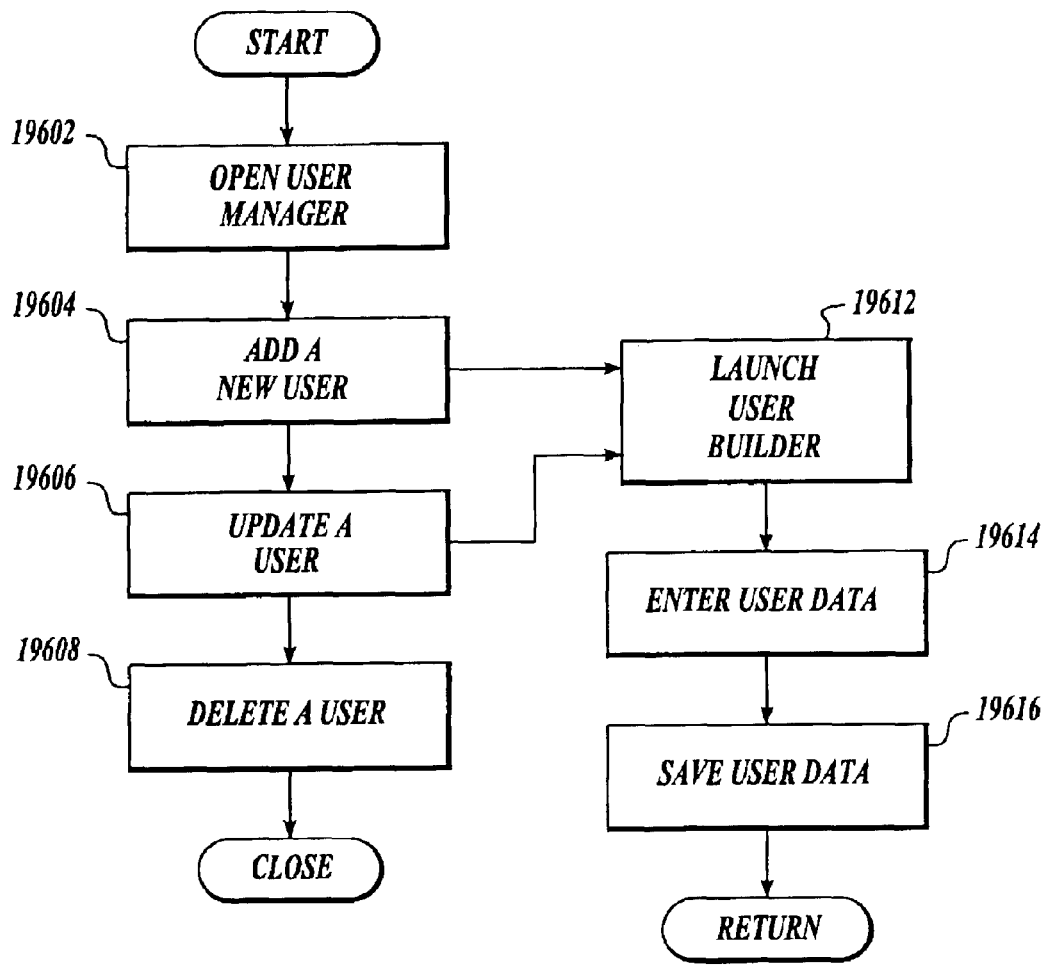
Figure 197:
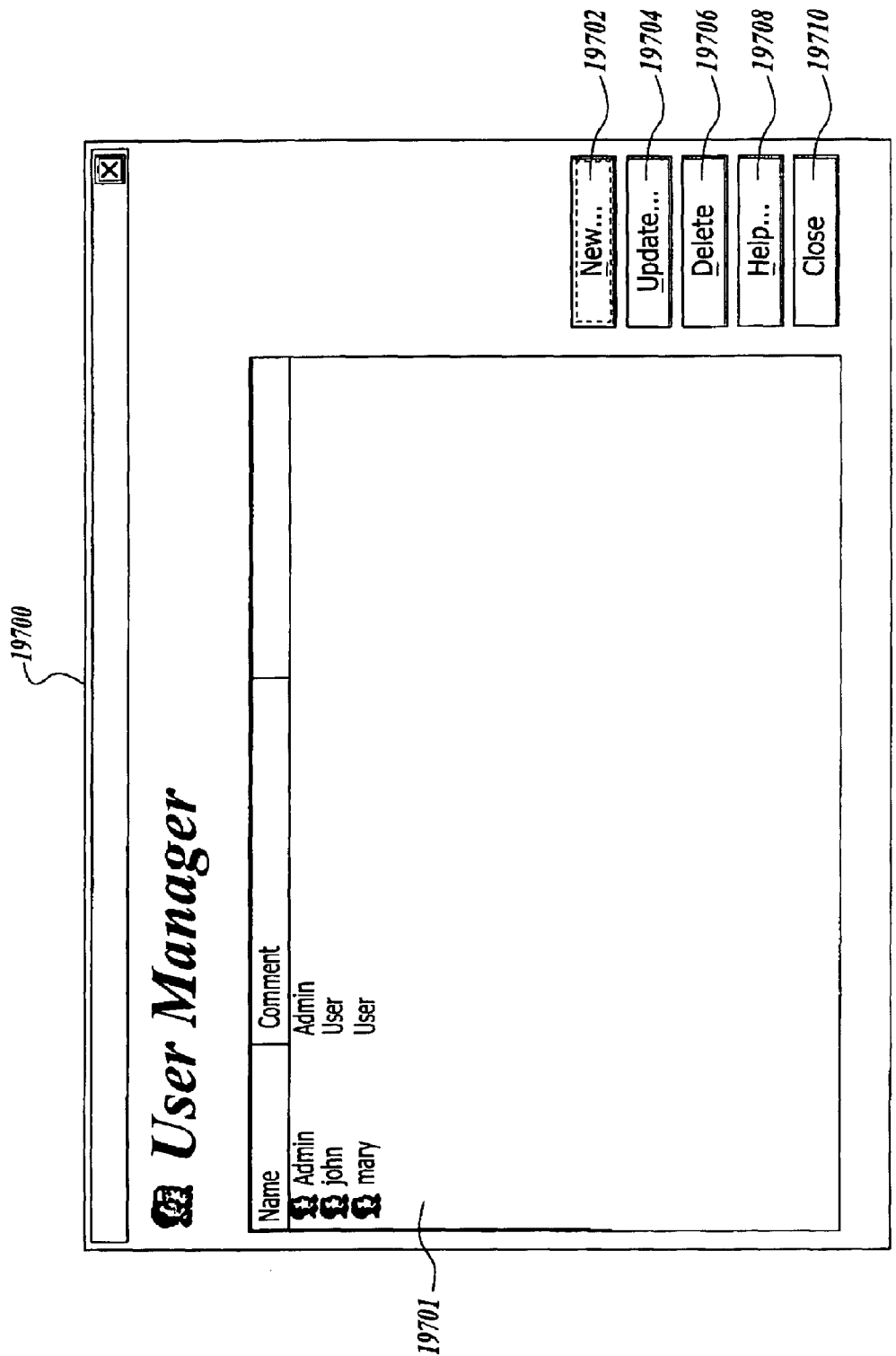
Figure 198:
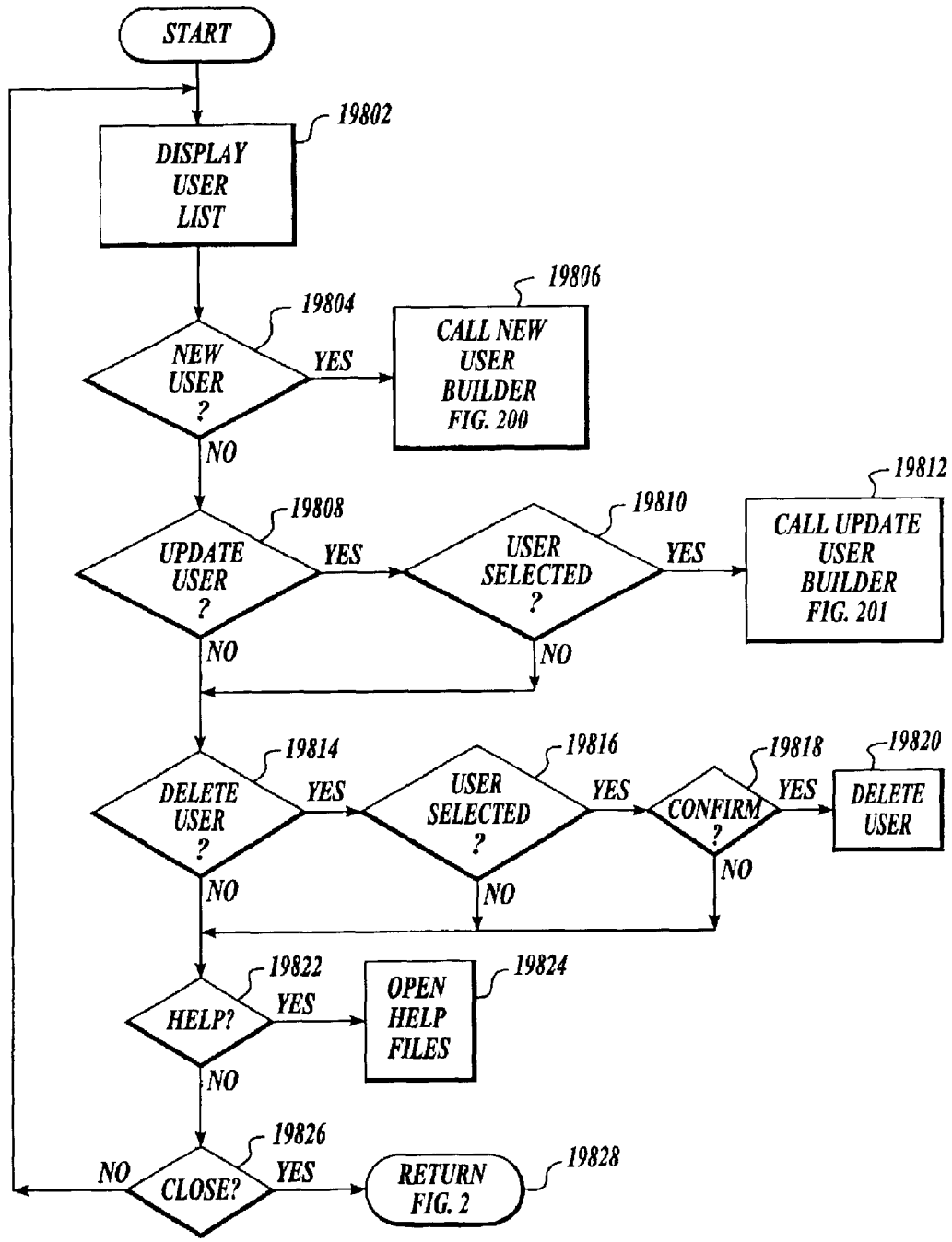
Figure 199:
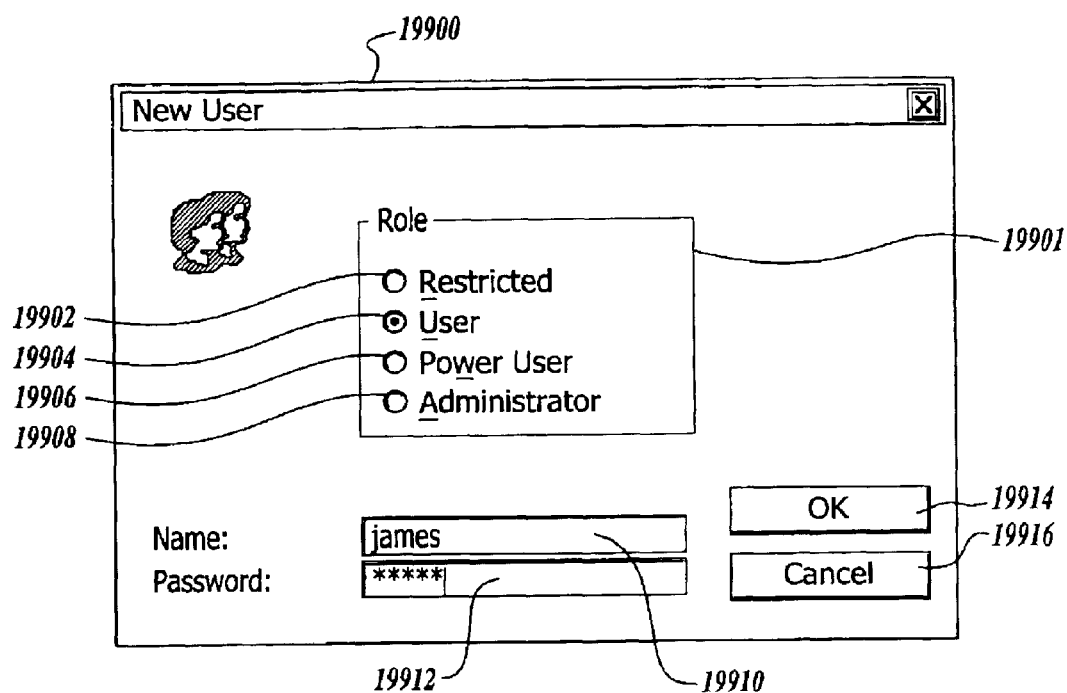
Figure 200:
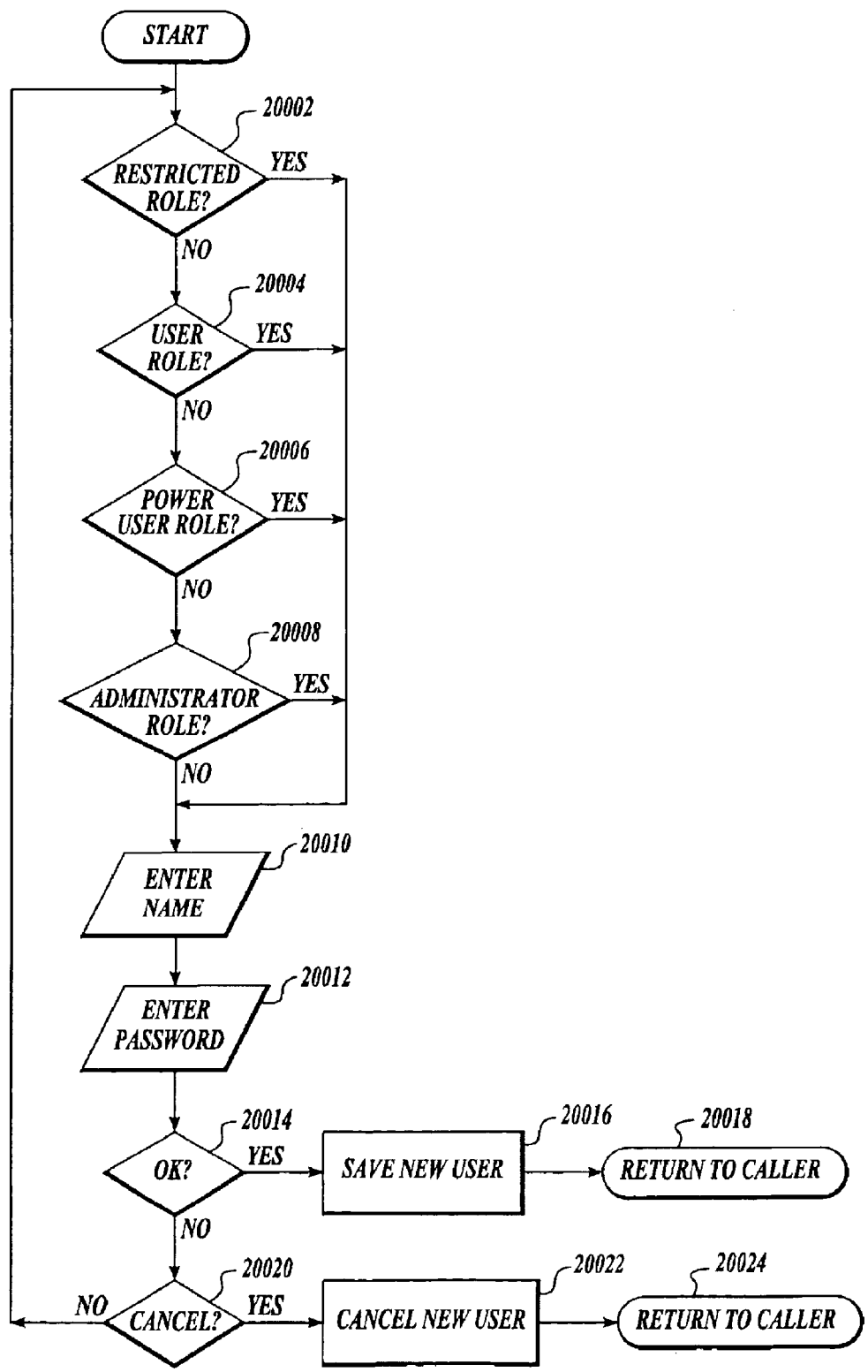
Figure 201:
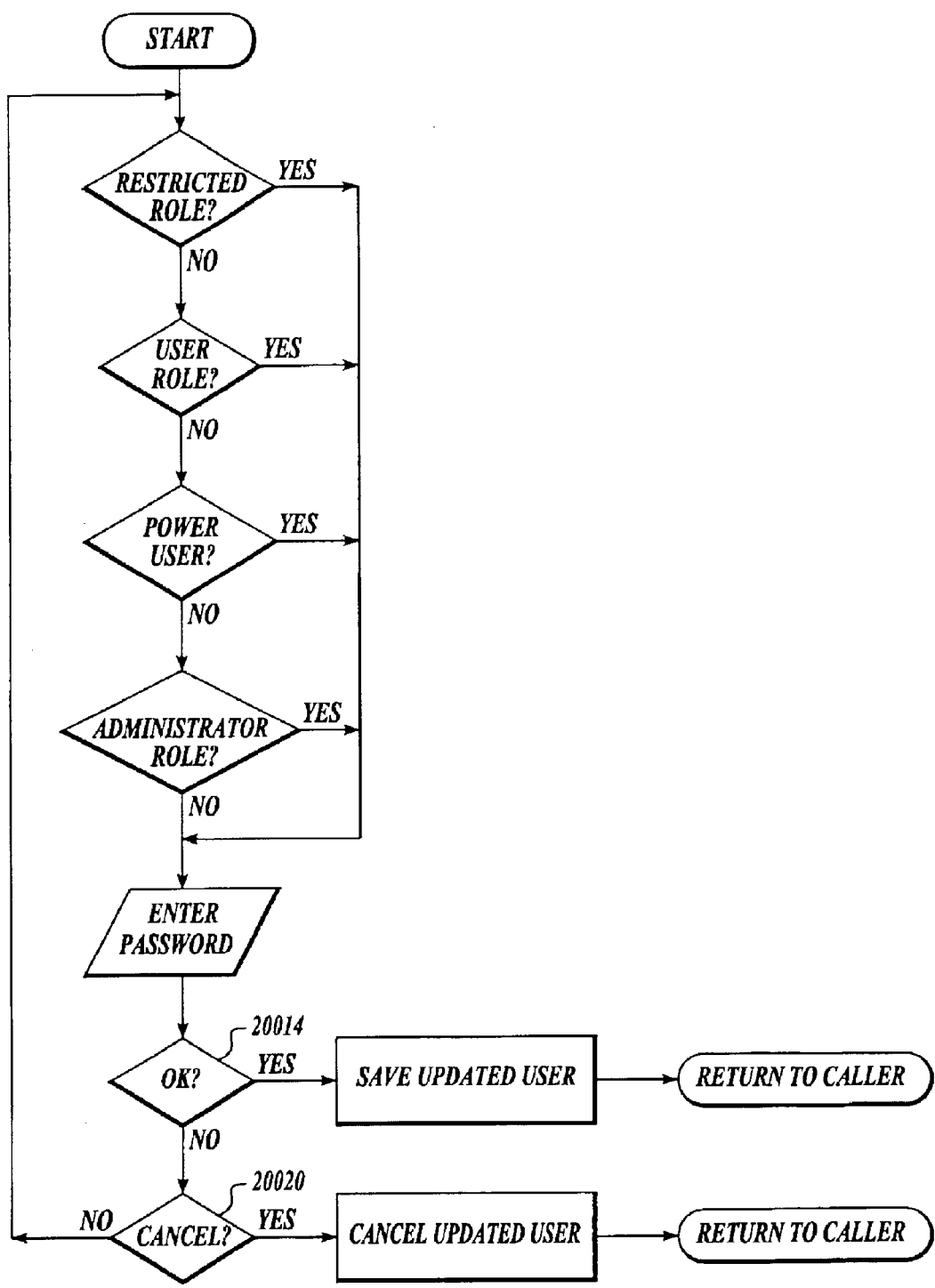
Figure 202:
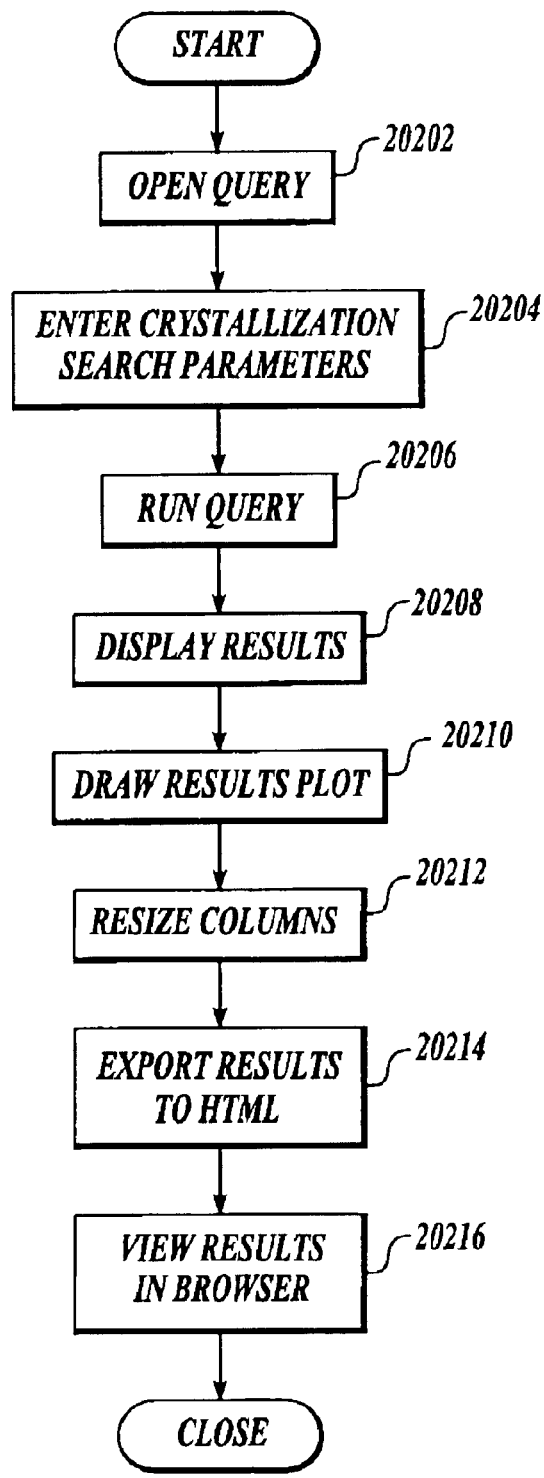
Figure 204:
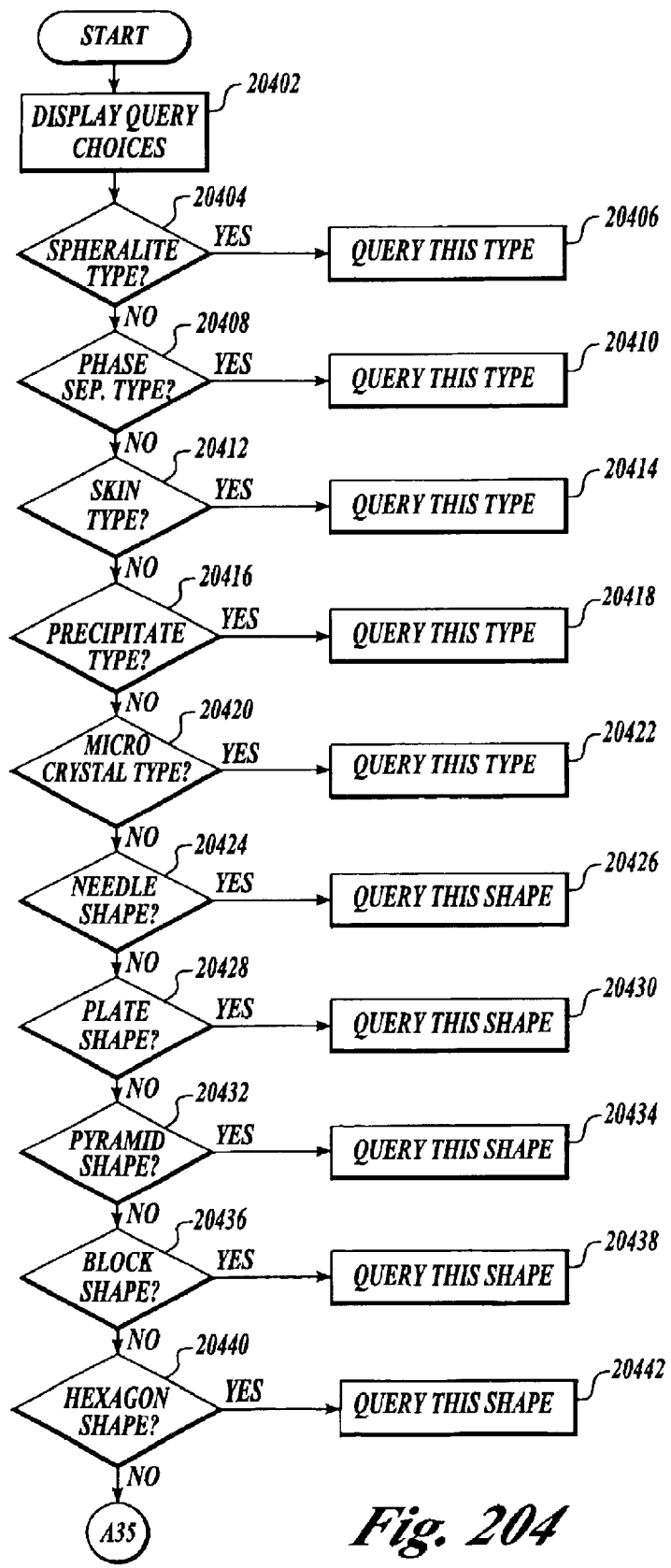
Figure 205:
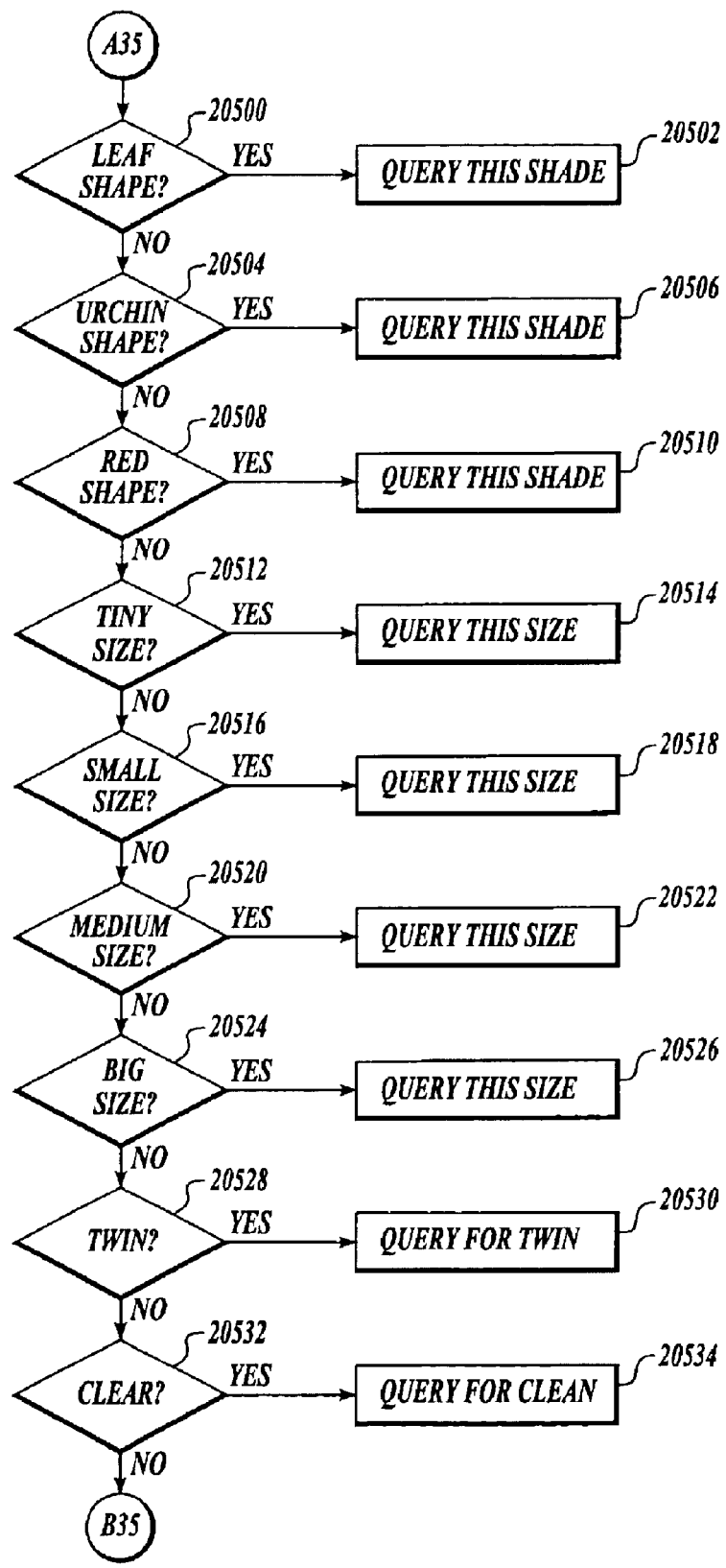
Figure 206:
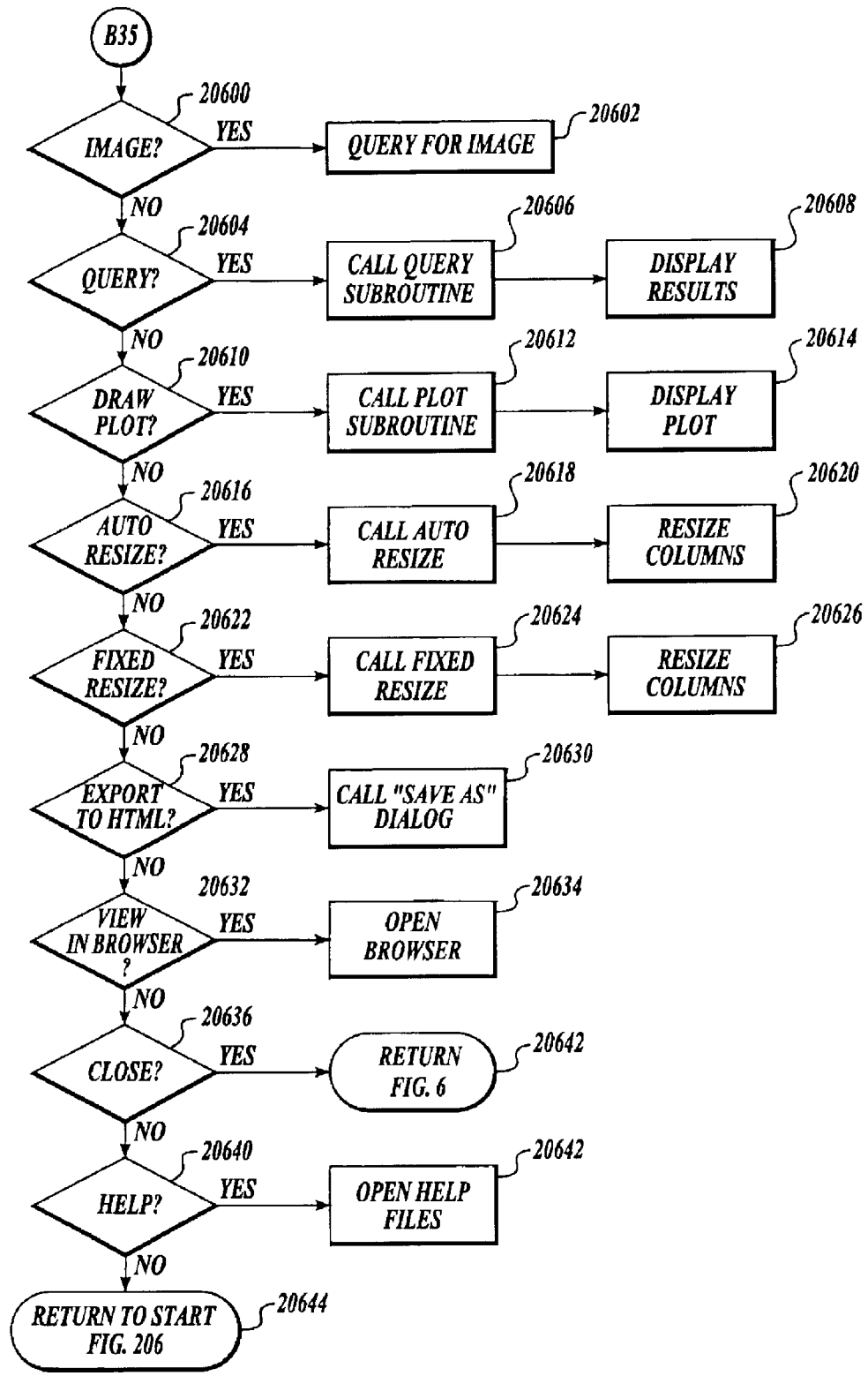
Figure 207:
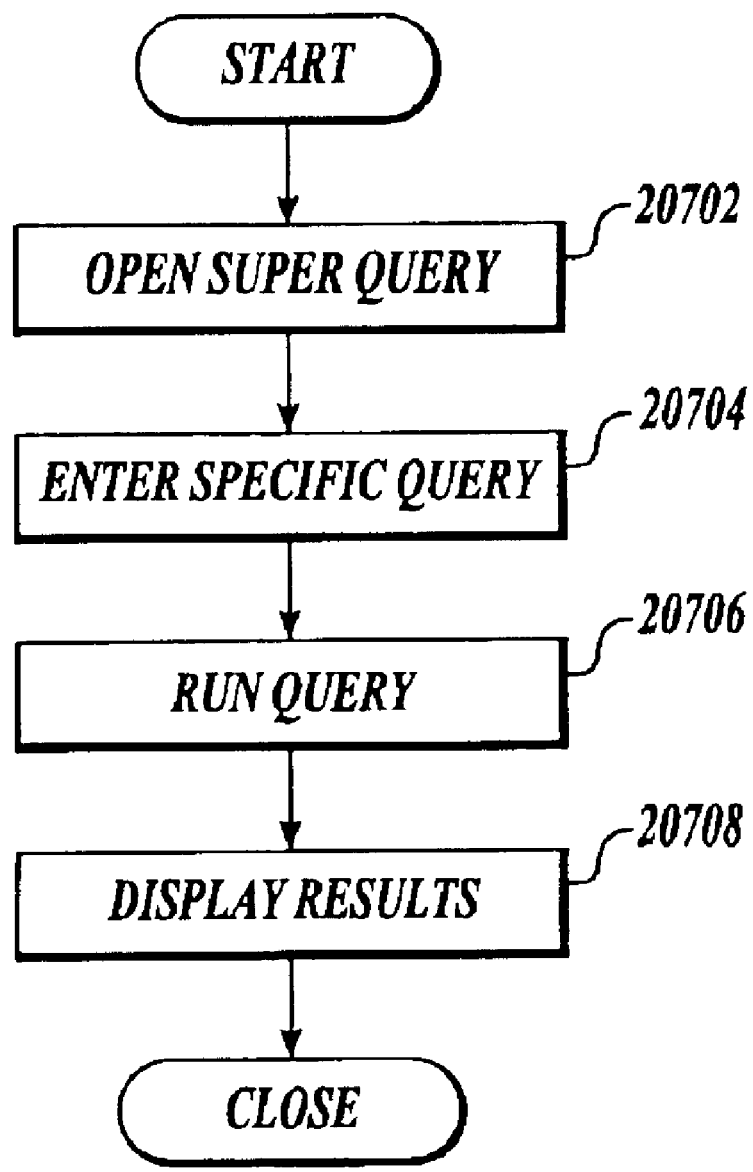
Figure 208:
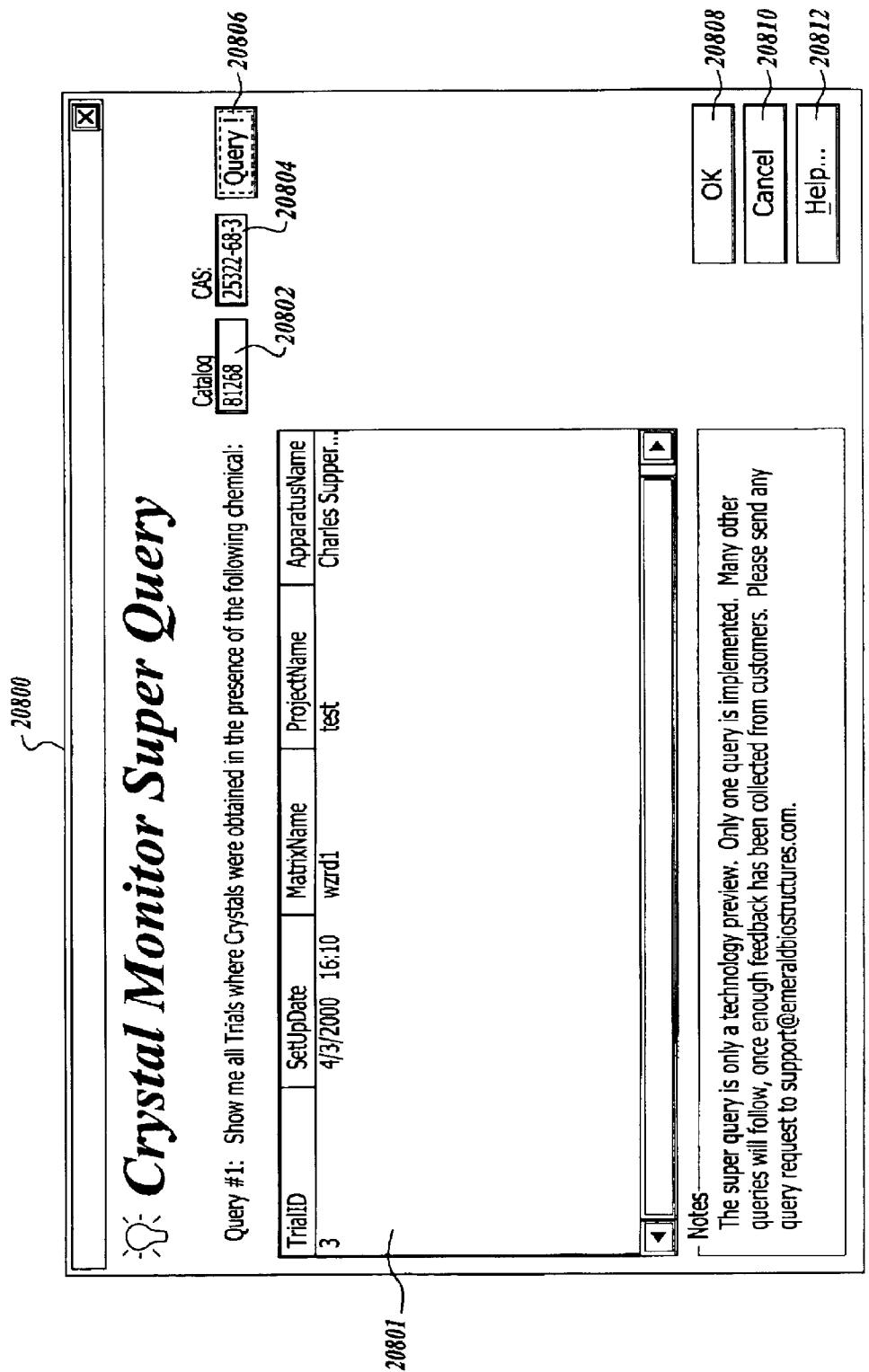
Figure 209:
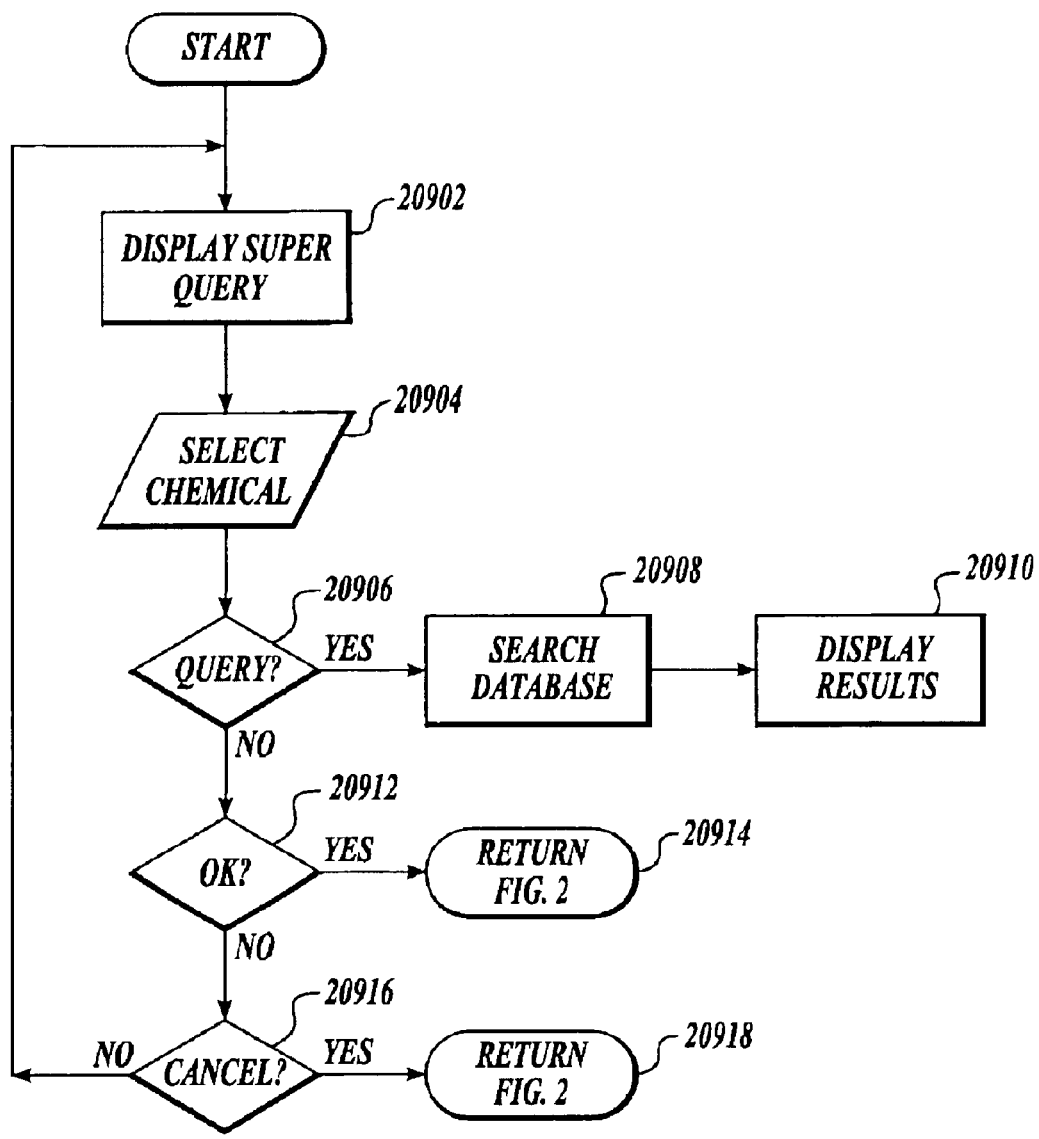
Figure 210:
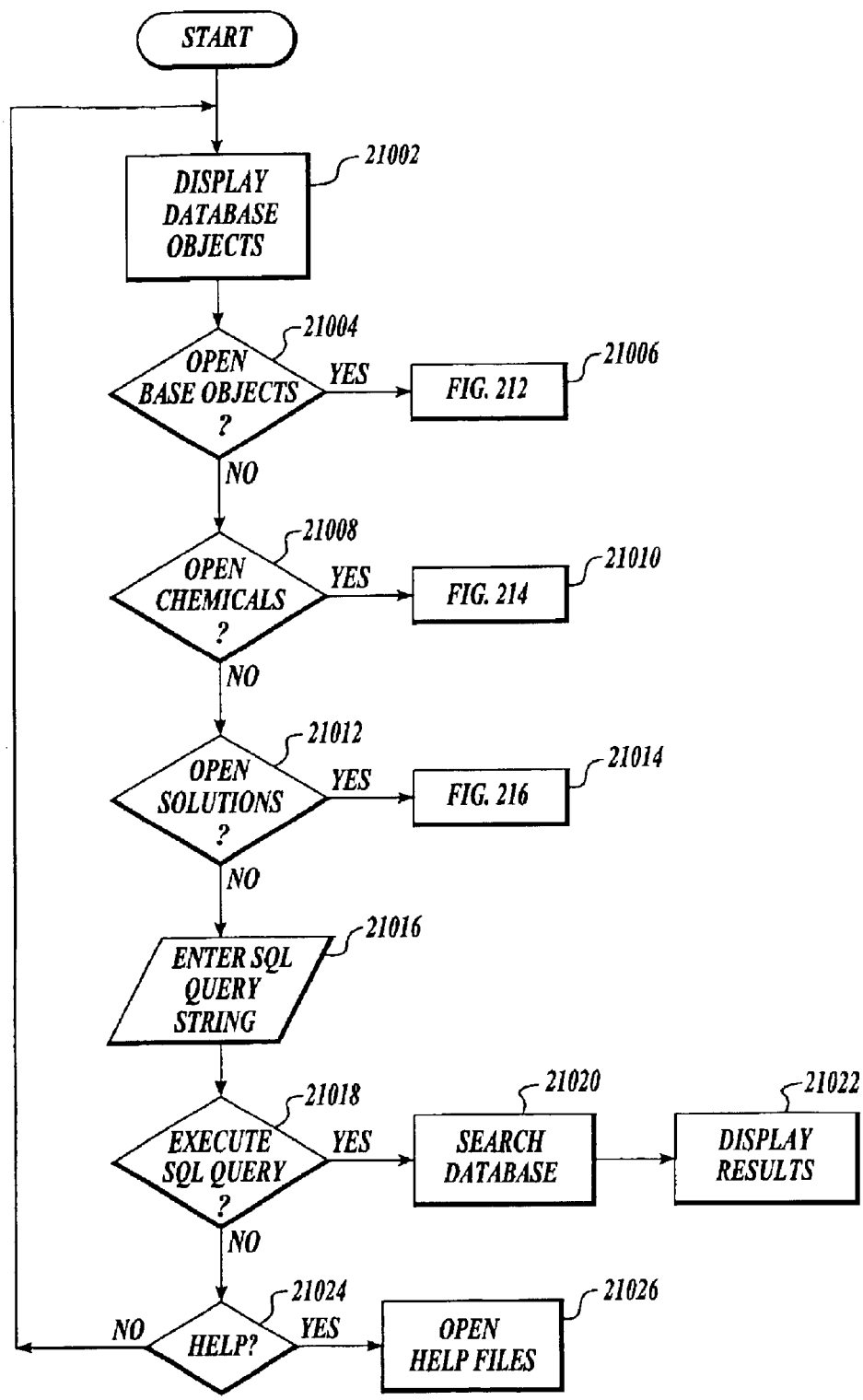
Figure 212:
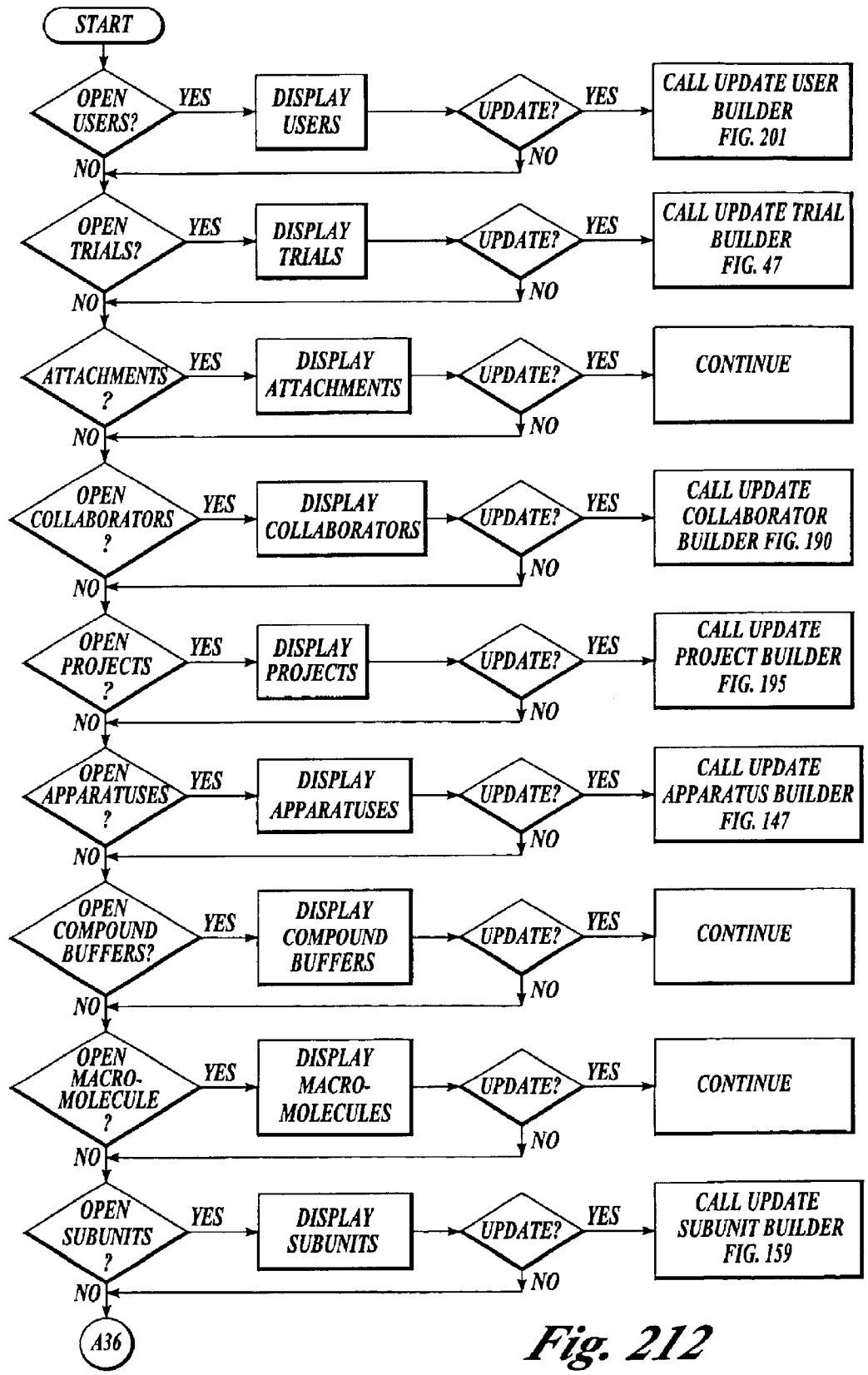
Figure 213:
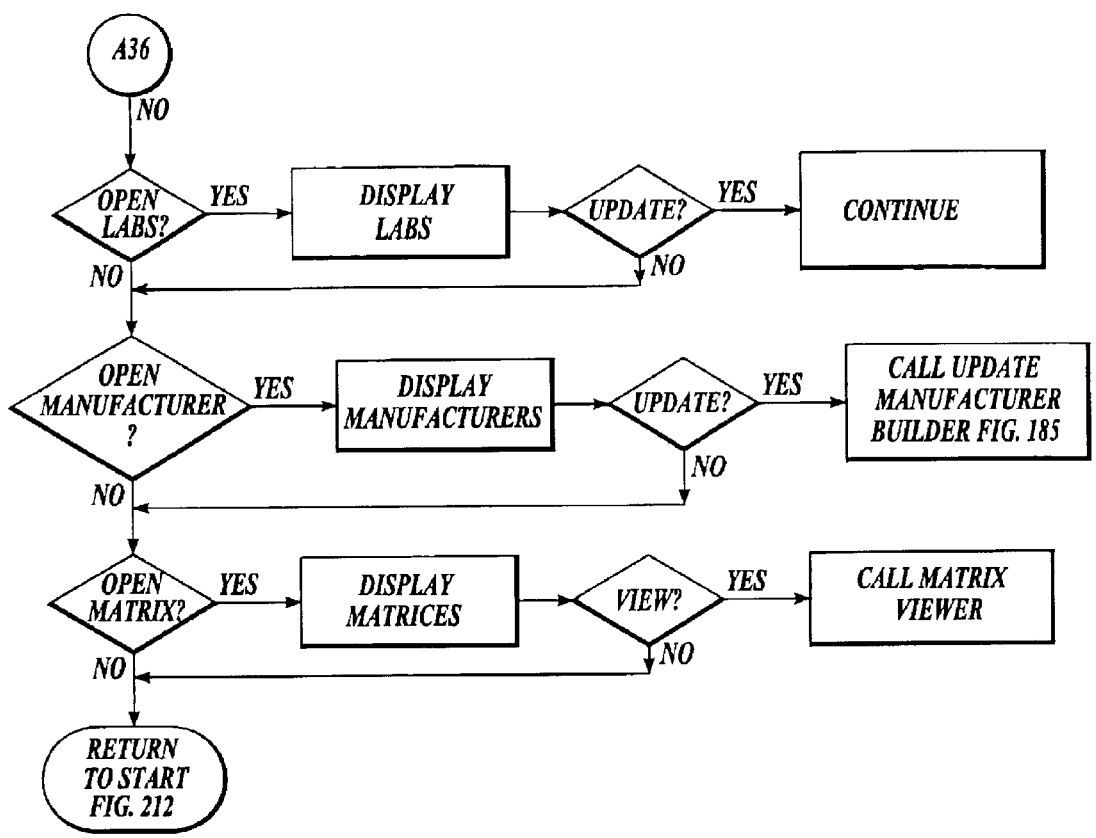
Figure 214:
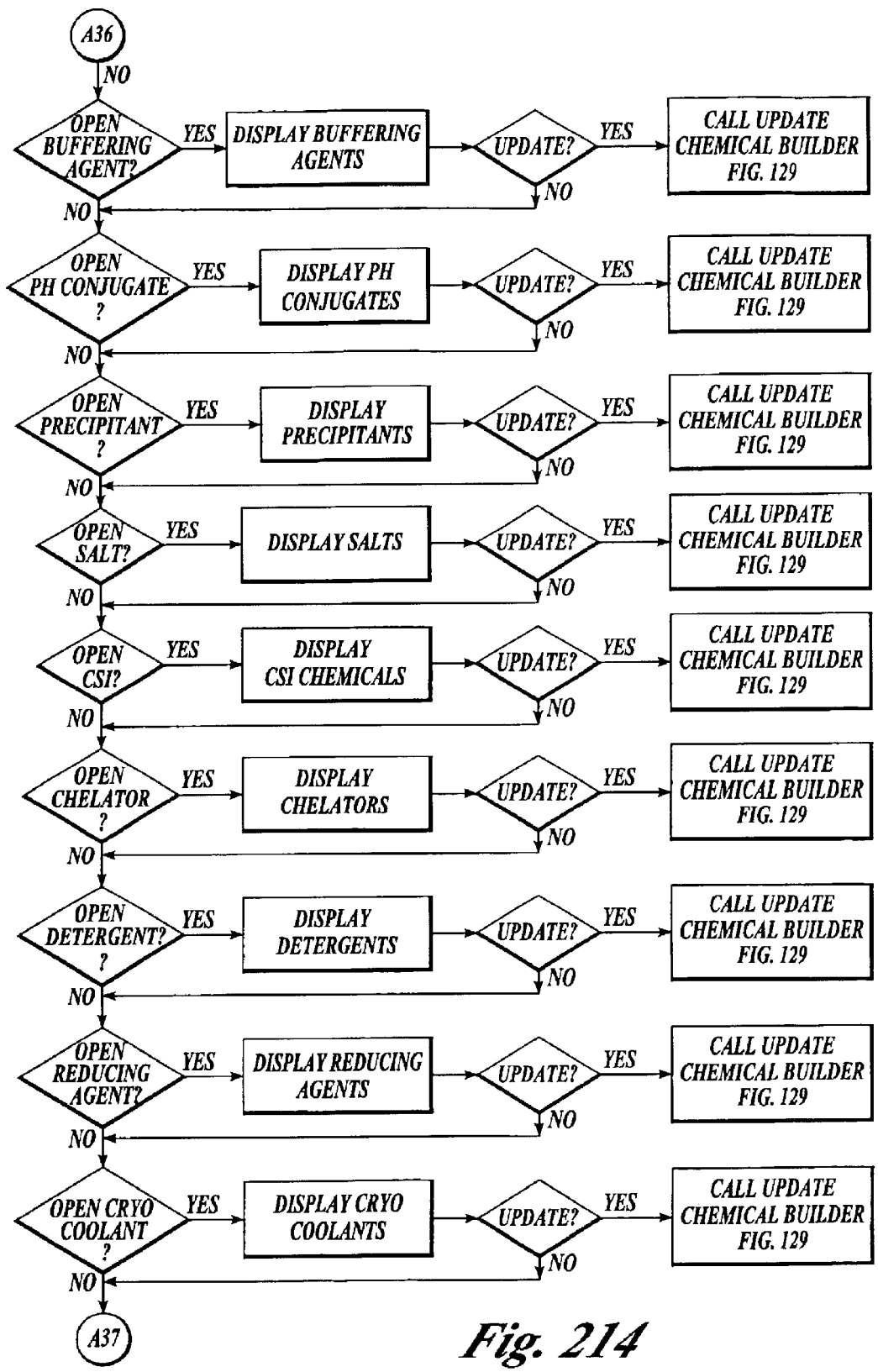
Figure 215:
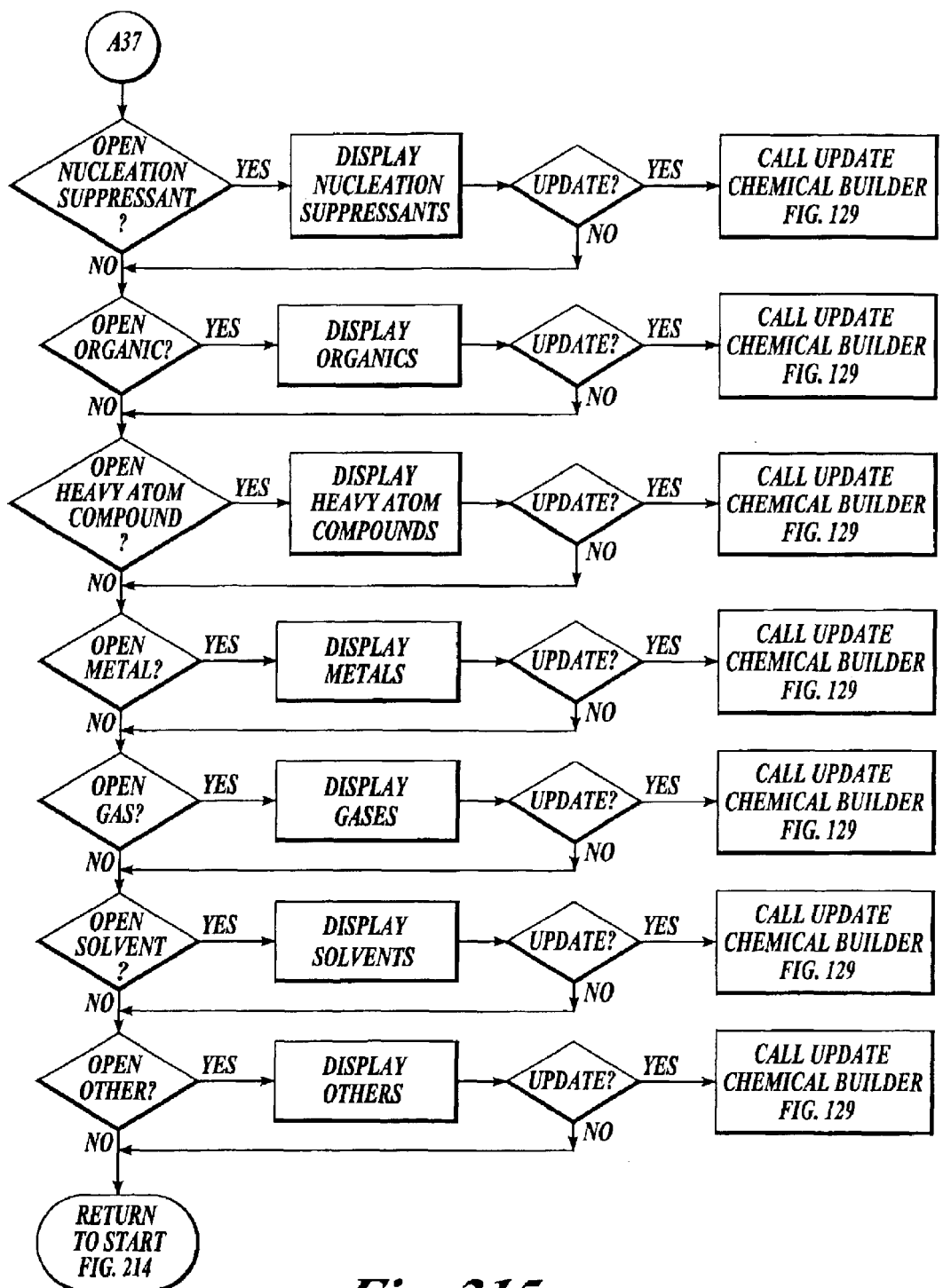
Figure 216:
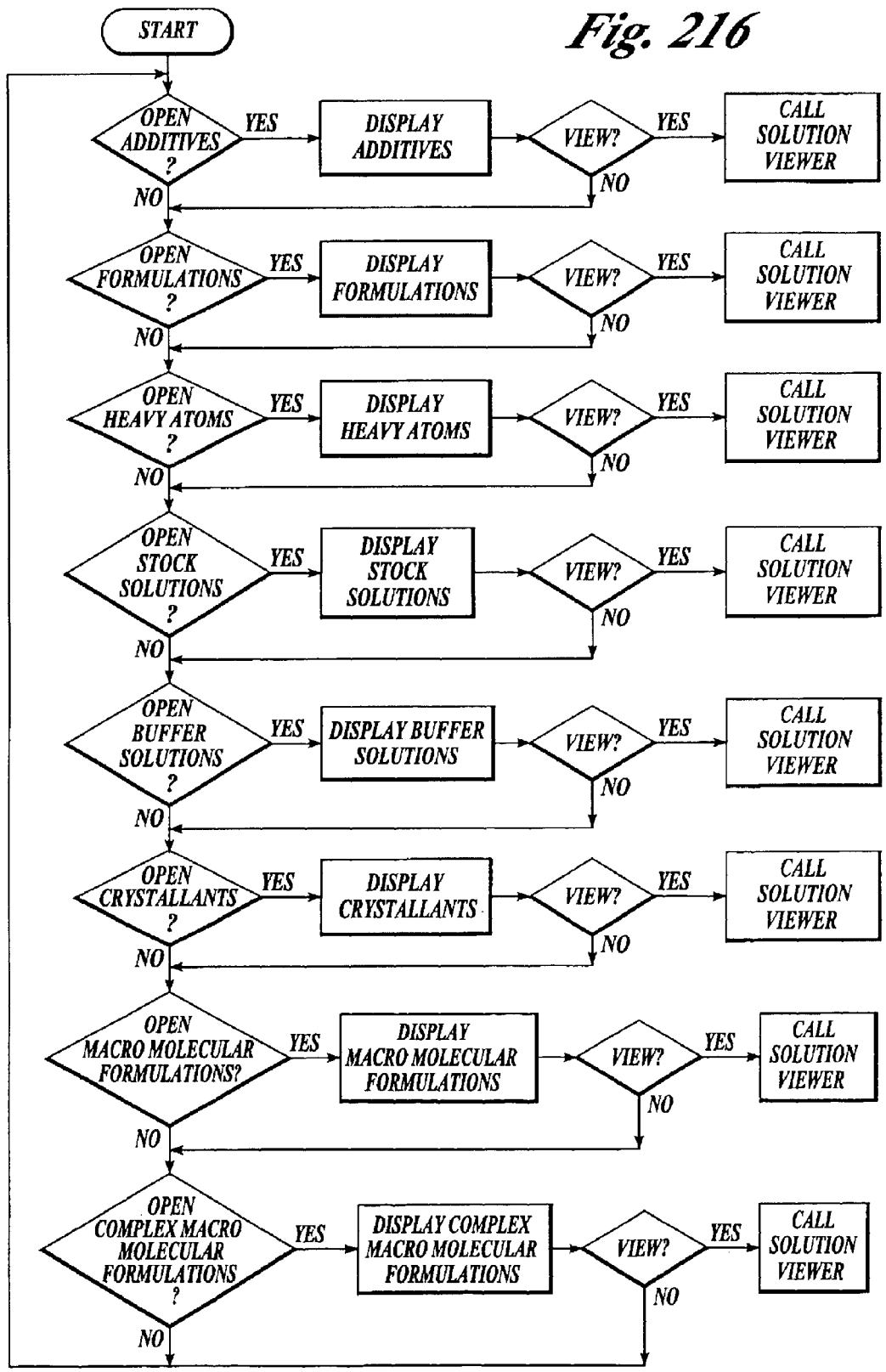

FIG. 167 shows a functional flow diagram for a macromolecule formulation manager according to the present invention;

FIG. 168 shows a GUI for a new macromolecule formulation builder according to the present invention;

FIGS. 169–170 show a functional flow diagram for a new macromolecule formulation builder according to the present invention;

FIG. 171 shows a generic functional flow diagram for a complex macromolecule formulation manager according to the present invention;

FIG. 172 shows a GUI for a complex macromolecule formulation manager according to the present invention;

FIG. 173 shows a functional flow diagram for a complex macromolecule formulation manager according to the present invention;

FIG. 174 shows a GUI for a complex macromolecule formulation builder according to the present invention;

Figure 175:
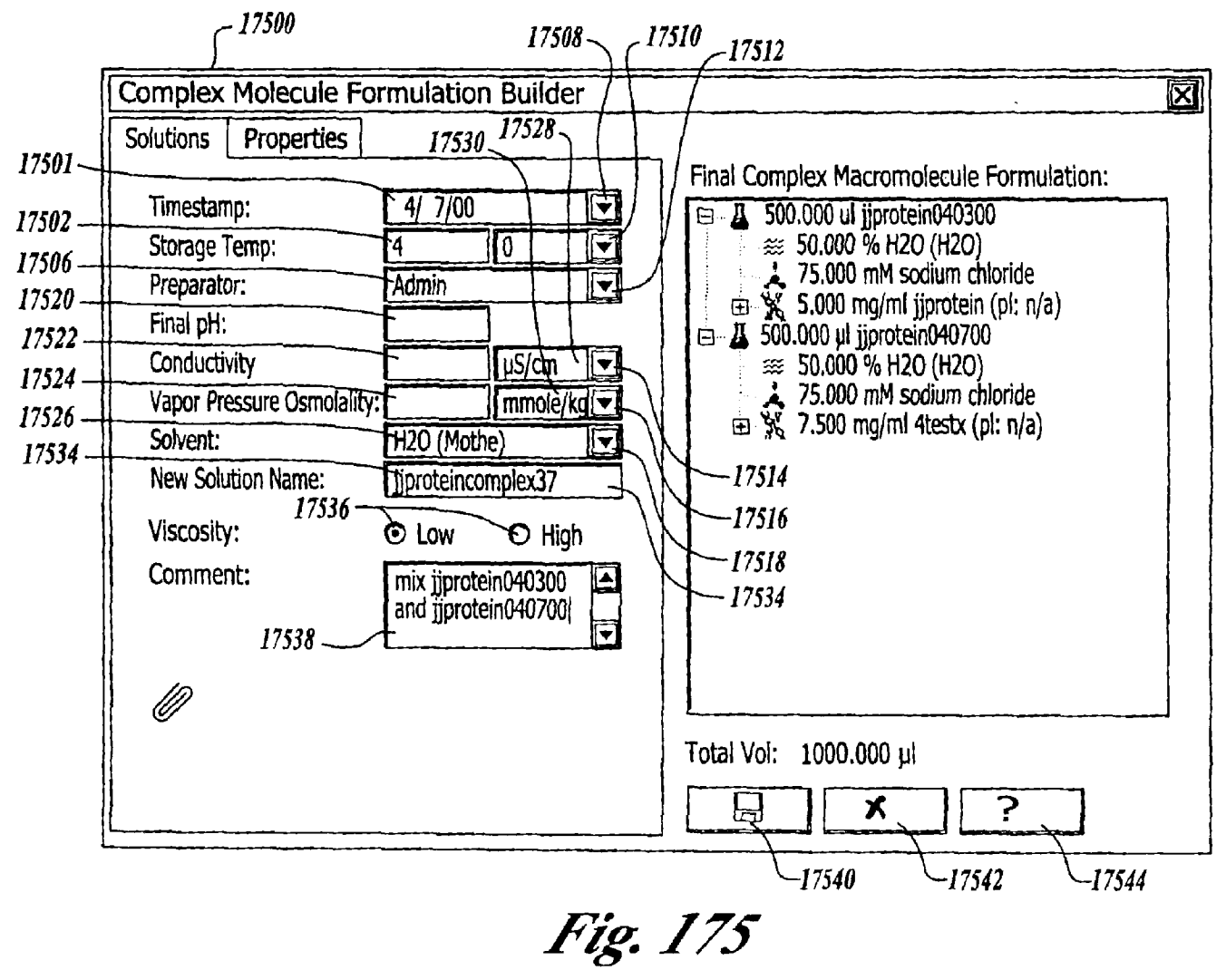

FIG. 175 shows a GUI for a complex macromolecule formulation builder according to the present invention;

FIGS. 176–178 show a functional flow diagram for a complex macromolecule formulation builder according to the present invention;

FIG. 179 shows a generic functional flow diagram for a manufacturer manager according to the present invention;

FIG. 180 shows a GUI for a manufacturer manager according to the present invention;

FIG. 181 shows a functional flow diagram for a manufacturer manager according to the present invention;

FIG. 182 shows a functional flow diagram for an update manufacturer builder according to the present invention;

FIGS. 183–184 show a functional flow diagram for a new manufacturer builder according to the present invention;

FIGS. 185–186 show a functional flow diagram for an update manufacturer builder according to the present invention;

FIG. 187 shows a generic functional flow diagram for a collaborator manager according to the present invention;

FIG. 188 shows a functional flow diagram for a collaborator manager according to the present invention;

FIG. 189 shows a functional flow diagram for a new manufacturer builder according to the present invention;

FIG. 190 shows a functional flow diagram for an update manufacturer builder according to the present invention;

FIG. 191 shows a generic functional flow diagram for a project manager according to the present invention;

FIG. 192 shows a GUI for a project manager according to the present invention;

FIG. 193 shows a functional flow diagram for a project manager according to the present invention;

FIG. 194 shows a functional flow diagram for a new project builder according to the present invention;

FIG. 195 shows a functional flow diagram for an update project builder according to the present invention;

FIG. 196 shows a generic functional flow diagram for a user manager according to the present invention;

FIG. 197 shows a GUI for a user manager according to the present invention;

FIG. 198 shows a functional flow diagram for a new user builder according to the present invention;

FIG. 199 shows a GUI for a new user builder according to the present invention;

FIG. 200 shows a functional flow diagram for a new user builder according to the present invention;

FIG. 201 shows a functional flow diagram for an update user builder according to the present invention;

FIG. 202 shows a generic functional flow diagram for a crystal query builder according to the present invention;

Figure 203:
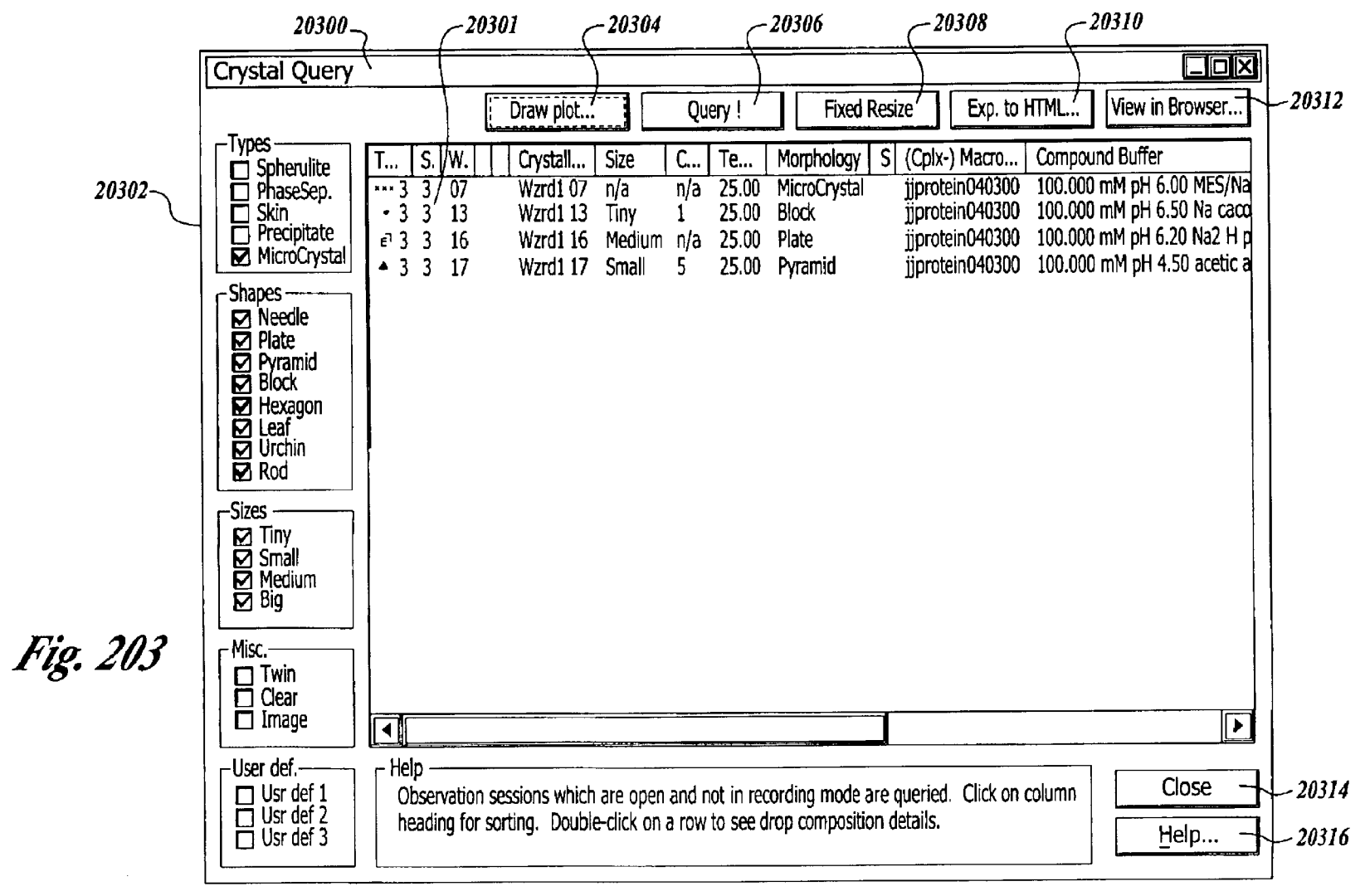

FIG. 203 shows a GUI for a crystal query builder according to the present invention;

FIGS. 204–206 show a functional flow diagram for a crystal query builder according to the present invention;

FIG. 207 shows a generic functional flow diagram for a super query builder according to the present invention;

FIG. 208 shows a GUI for a super query builder according to the present invention;

FIG. 209 shows a functional flow diagram for a super query builder according to the present invention;

FIG. 210 shows a functional flow diagram for a database object manager according to the present invention;

FIG. 211 shows a GUI for a database object manager according to the present invention;

FIGS. 212–216 show a functional flow diagram for a database object manager according to the present invention;

FIG. 217 shows a GUI for a database object manager according to the present invention;

FIG. 218 shows a GUI for a database object manager according to the present invention; and FIGS. 219–263 show table relationship diagrams and table fields according to the present invention.

DETAILED DESCRIPTION OF THE PREFERRED EMBODIMENT

The present invention is directed to providing a relational database containing the results of macromolecular crystallization trials. As will be better understood from the following description, the invention provides a method and system for easily and accurately entering macromolecular crystallization data into a relational database so that the entered data can be readily organized and analyzed. In addition to the relational database aspect, as will be better understood from the following description, preferred embodiments of the present invention include customizable speech recognition and digital image capture.

Embodiments of the present invention may be built on top of Microsoft SQL server 7.0, available from the Microsoft Corporation at Redmond, Wash. (hereinafter "Microsoft"). Such embodiments can be constructed to capture all aspects of a crystallization trial from base chemicals through trial observations. Microsoft SQL server 7.0 has the advantage of providing a powerful query language for the analysis of trial data. One actual embodiment of the present invention runs on Windows NT/98/95, also available from Microsoft Corporation, and is supported by SDK applications available from Microsoft Corporation (engine for speech recognition and audio feedback), and Pixera Corporation (software for image capture). Pixera is also the manufacturer of the digital camera employed in one actual embodiment of the invention. While these sources are presently preferred, the present invention may equally be implemented using other server software, digital cameras, etc. now available or that may become available in the future.

Figure 1:
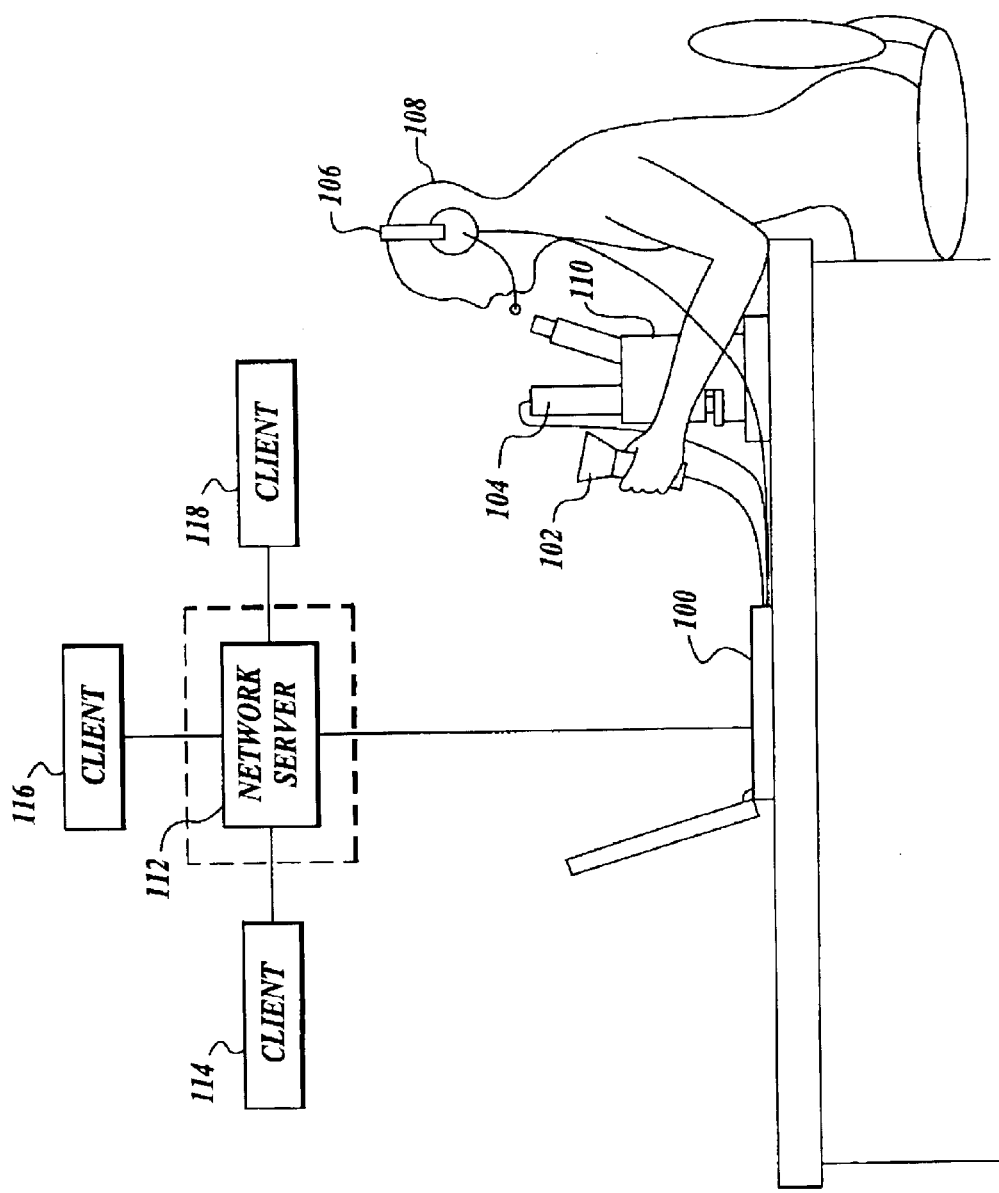
FIG. 1 shows a schematic of an embodiment of the hardware configuration according to the present invention.

FIG. 1 illustrates a typical hardware configuration for implementing the present invention. In general, embodiments of the present invention include at least one client computer 100, which may be a stand alone computer, or, more preferably, is connected along with a plurality of other client computers 114, 116 and 118 to a network server 112 by a local area network (LAN). The client computers can be laptop or desktop computers (or other computer if desired). As is conventional, the computer 100 includes a cursor control device and a keyboard (not shown). The computer may have a mouse as the cursor control device. Attached to each client computer via suitable interfaces are a number of peripheral devices including a barcode scanner 102, a digital camera 104 and a microphone headset 106. The microphone headset provides audio speech recognition and audio feedback. Alternatively, a table top microphone and speaker can be used. The presently preferred computer includes a suitably fast CPU (433 mHz or greater) and a high end sound card, as well as a suitable amount of random access memory (RAM) and other well known and necessary components. Embodiments of the invention also include a crystallization trial observation device, such as a microscope 110 and a positioning mechanism for positioning the wells of a crystallization trial tray for viewing by a user.

Figure 1A:
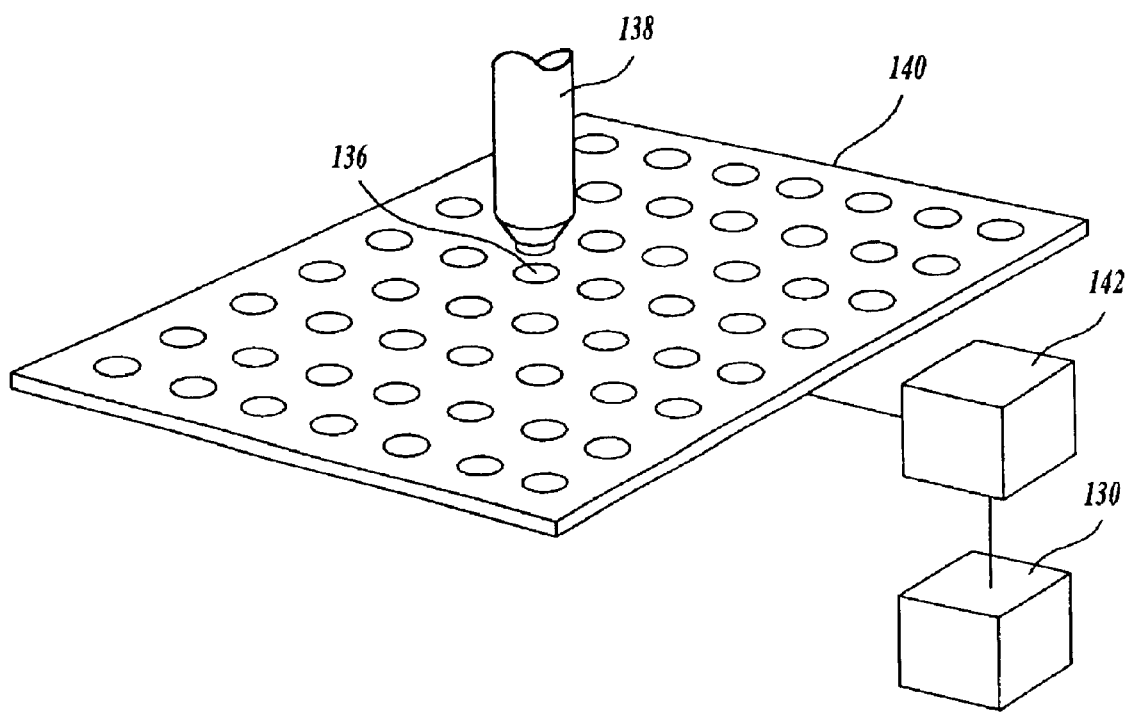
FIG. 1a shows a schematic of an embodiment at a platemover according to the present invention.

FIG. 1 also shows a user 108 seated at the viewing microscope 110. The microscope 110 is fitted with the digital camera 104 for image capture of the crystallization trial data that is also observable through the microscope. The user may use the barcode scanner 102 to read a barcode on a crystallization trial tray prior to the tray being mounted on the positioning mechanism. This enables quick and accurate identification of the trial number. As shown in FIG. 1A and described below, the positioning mechanism is an electromechanical mechanism that includes a plate 140 whose position is controlled by x-y transducers 142. The position of the x-y transducers 142 is controlled by client computer 130. The client computer 130 can control the position of the plate 140 so that the desired well 136 can be seen through the microscope 138 and photographed by the digital camera. These features of the present invention will be described in greater detail below.

In addition to hardware, embodiments of the invention include software managers on the client computers that creates crystallization trial data in the manner hereinafter described for storage in a relational database that, preferably, is stored on the network server. The software includes a plurality of graphical user interfaces (GUIs) that provide user interfaces with various database managers which are described below.

Main Manager

When software formed in accordance with the present invention is first launched, preferably a main manager GUI 200 which includes a title bar 202, menu bar 204, and unique pictographical command buttons 206 representing each of a plurality of database managers, is displayed on the client computer. Included as part of the menu bar are a series of menu identifiers, namely File, Crystal Monitor, View, Tools, Window and Help, each of which has an associated drop down menu (not shown).

As will be better understood from the following discussion, the GUI 200 and other GUIs employed by the preferred embodiment of the invention respond to user input by means of a cursor command device such as a mouse, or keyboard strokes, or in some instances to voice commands.

In a conventional manner, moving the pointer of a cursor control device over each of the pictographical buttons displays the title of the unique button. Single clicking on the appropriate cursor control device button opens a corresponding database manager. The illustrated database managers include a new trial manager 208, an existing trial manager 210, a solution manager 212, a matrix manager 214, a compound buffer manager 216, a chemical manager 218, an apparatus manager 220, a subunit manager 222, a macromolecule manager 224, a macromolecule formulation manager 226, a complex macromolecule formulation manager 228, a manufacturer manager 230, a collaborator manager 232, a project manager 234, and a user manager 236. The illustrated pictographic command buttons 206 also include buttons for a crystallization result query 238, a structured query 240, a database object manager 242, and help documentation 244. Each of these will be described in turn, in more detail below.

Figure 2:
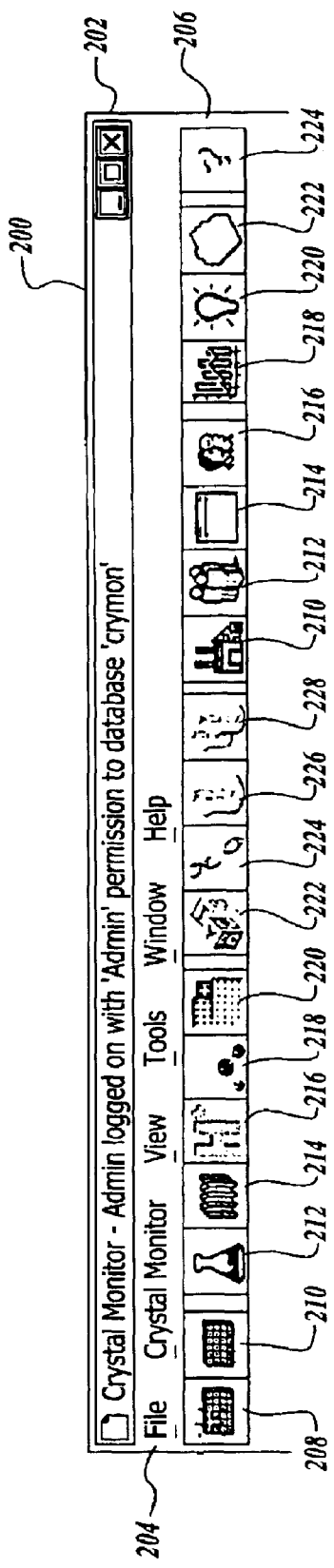
FIG. 2 shows a GUI of a main manager according to the present invention.
Figure 3:
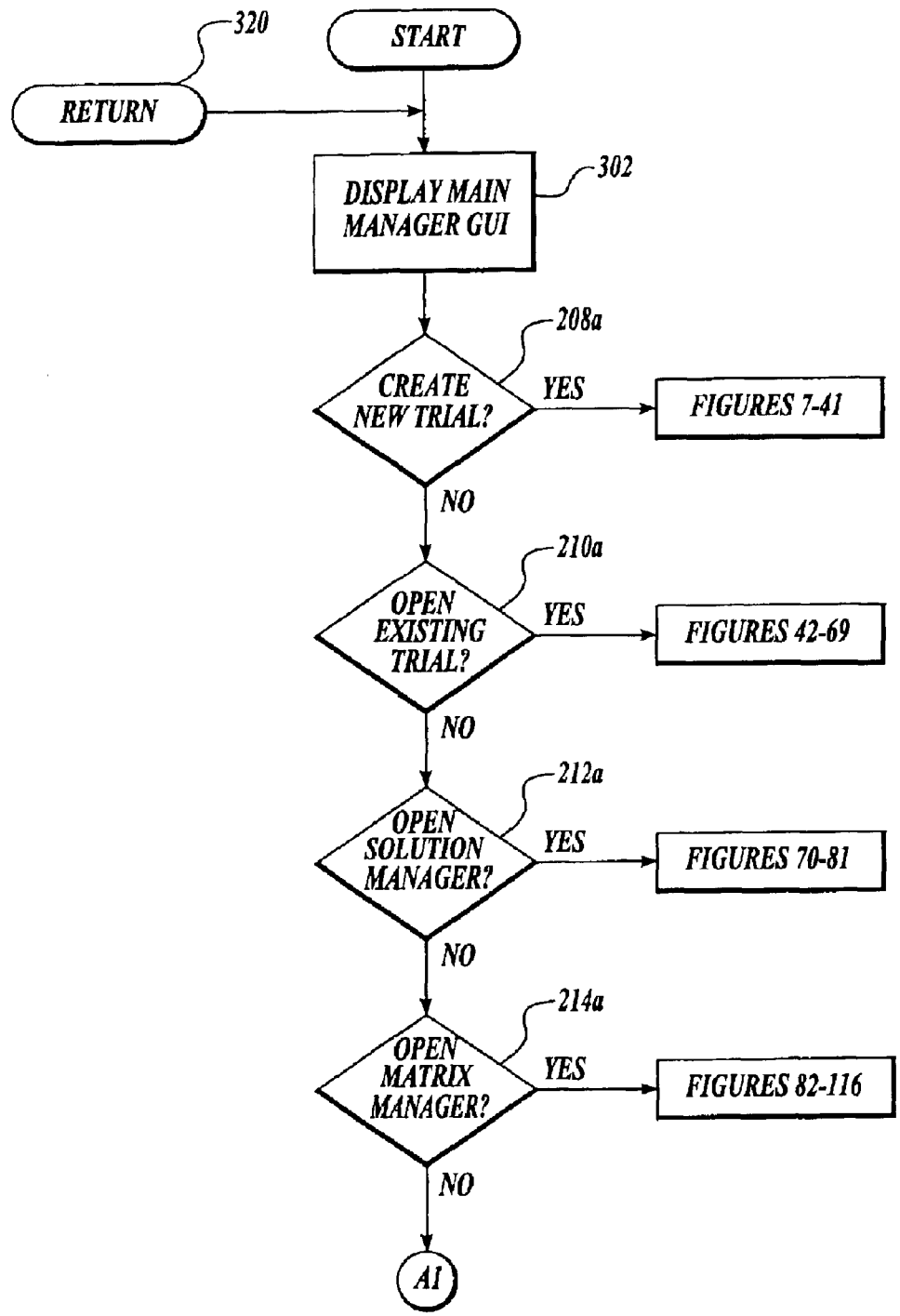
FIGS. 3–6 show a functional flow diagram of the main manager according to the present invention.
Figure 4:
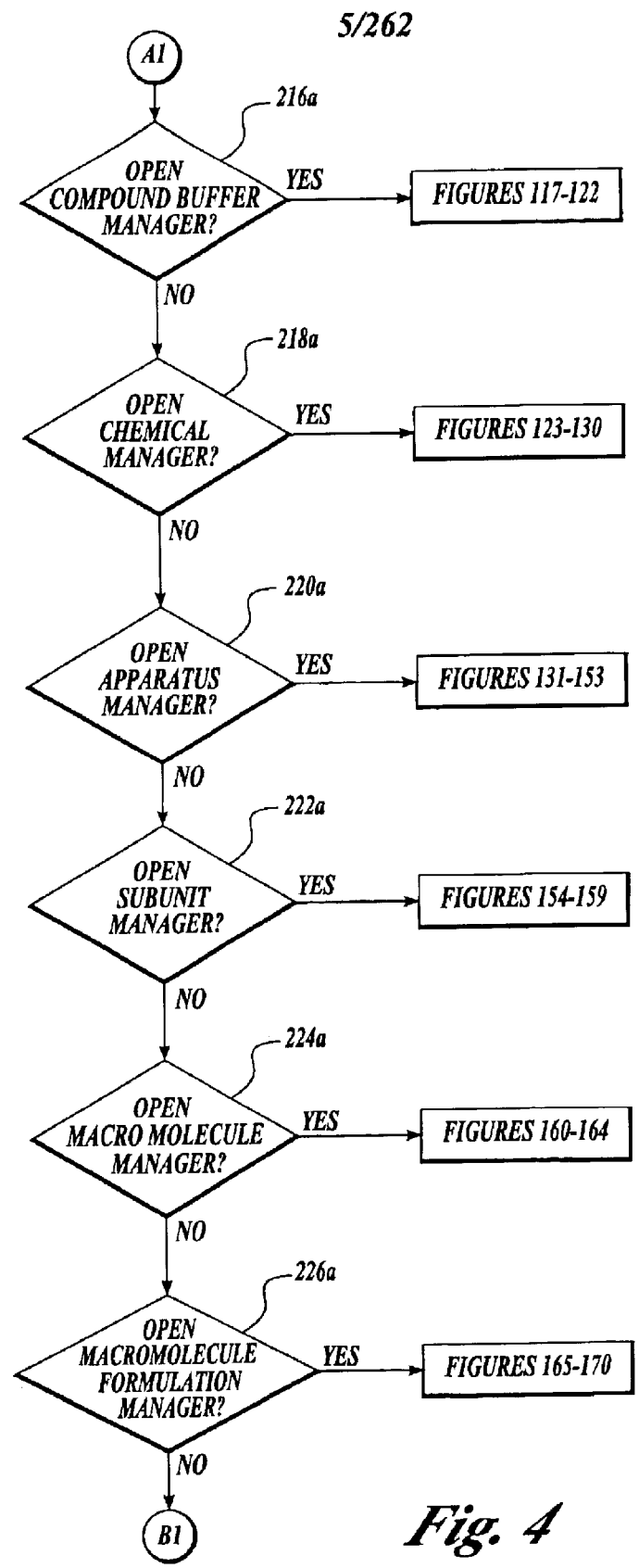
Figure 5:
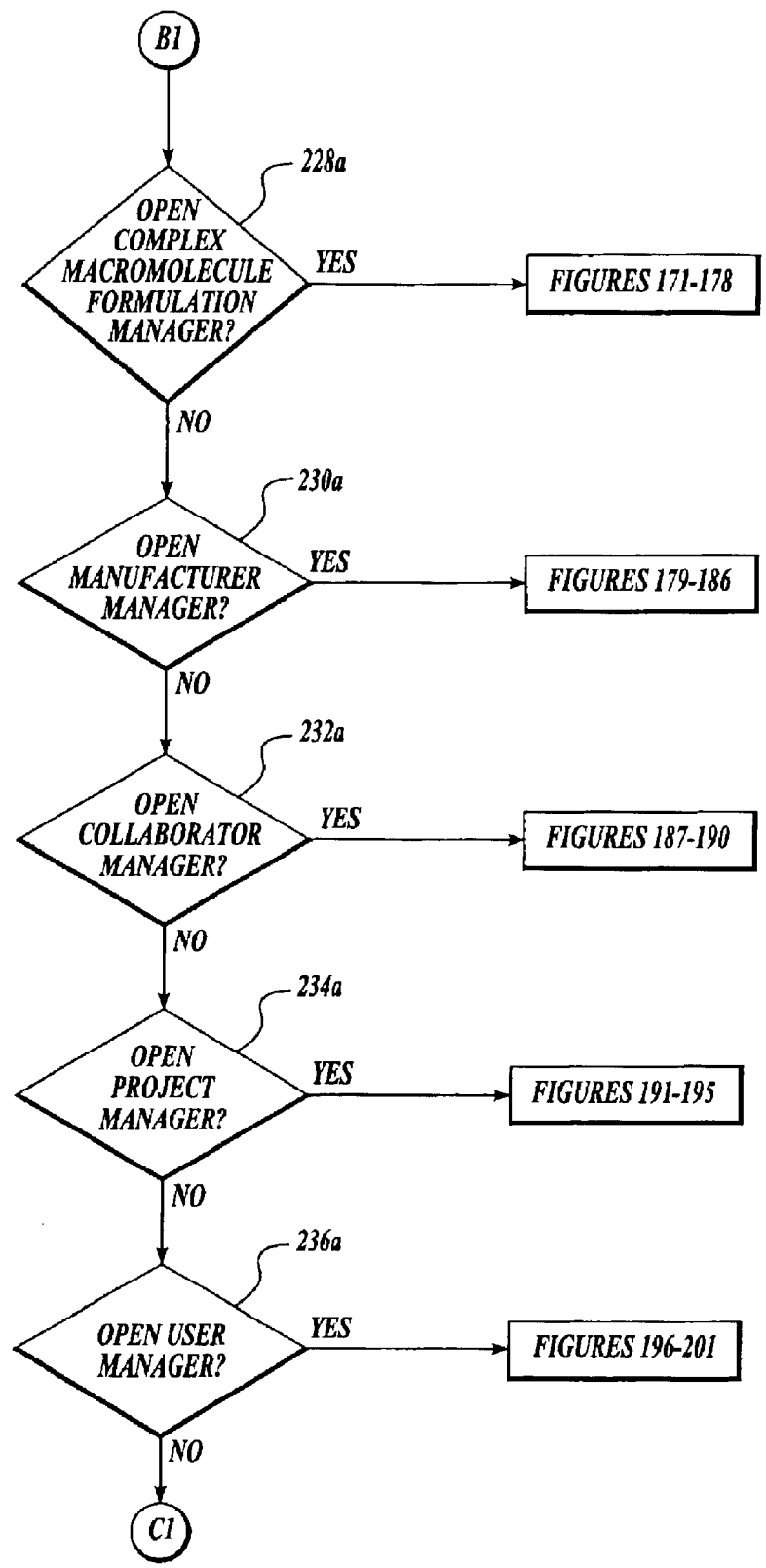
Figure 6:
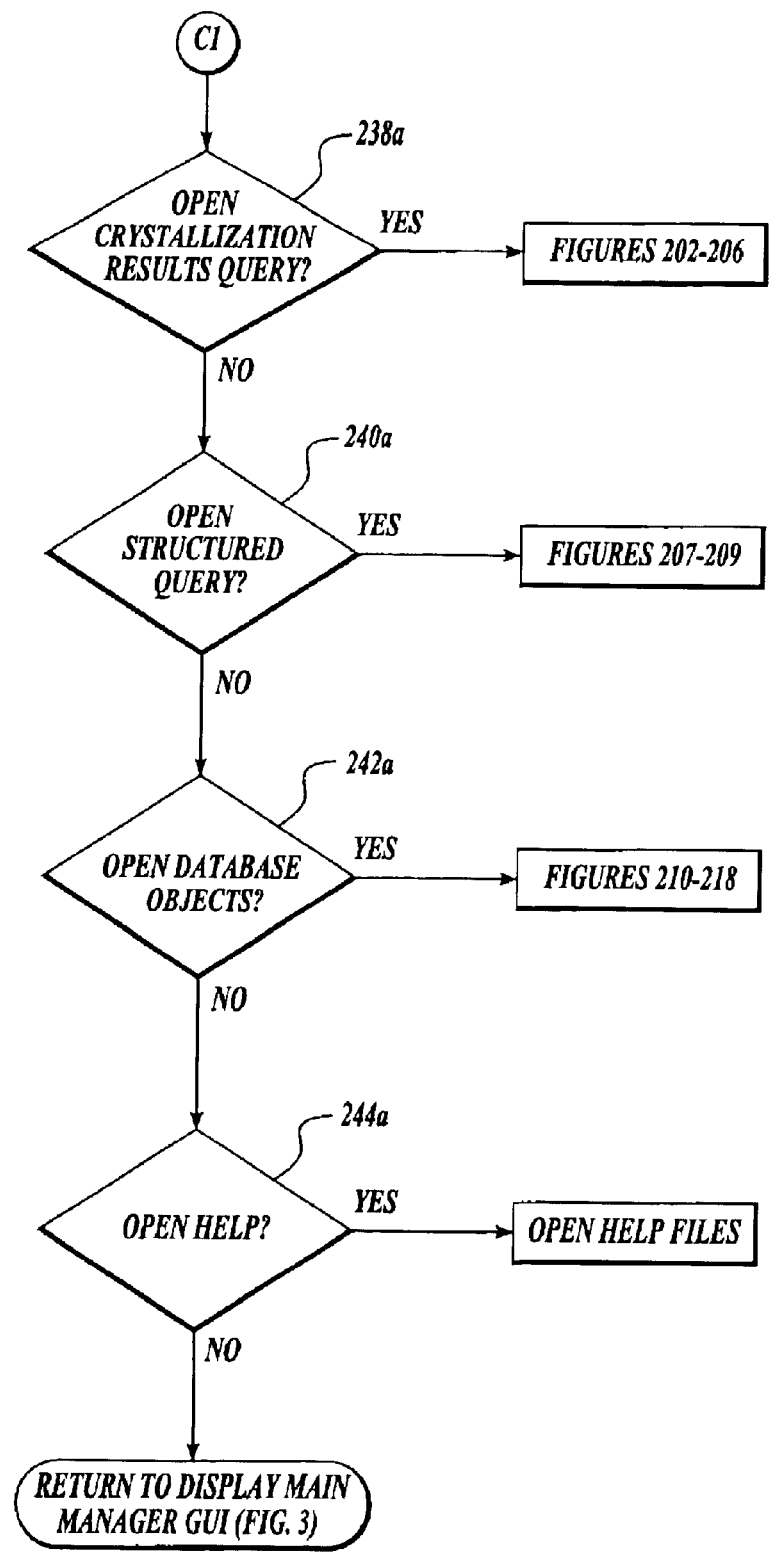

FIGS. 3–6 form a functional flow diagram illustrating the operation of software that responds to the activation of the pictorial command buttons illustrated in the GUI shown in FIG. 2 and described above. For ease of illustration, the reference number of the decision blocks is keyed to the pictographic command buttons by adding an "a" to the reference number of the corresponding pictographic command button. Activation of a pictographic command button by a user launches or opens the corresponding database manager. In a conventional manner, pictographical command buttons are activated by positioning a cursor controlled pointer over the button to be activated operating a key of the cursor control device. It should be readily apparent that windows included in the herein described implementation of the present invention may also have functions not shown but well known to windows programmers such as minimize and maximize buttons, resize borders or the close ("X") button, and the like.

New Trial Manager

Figure 7:
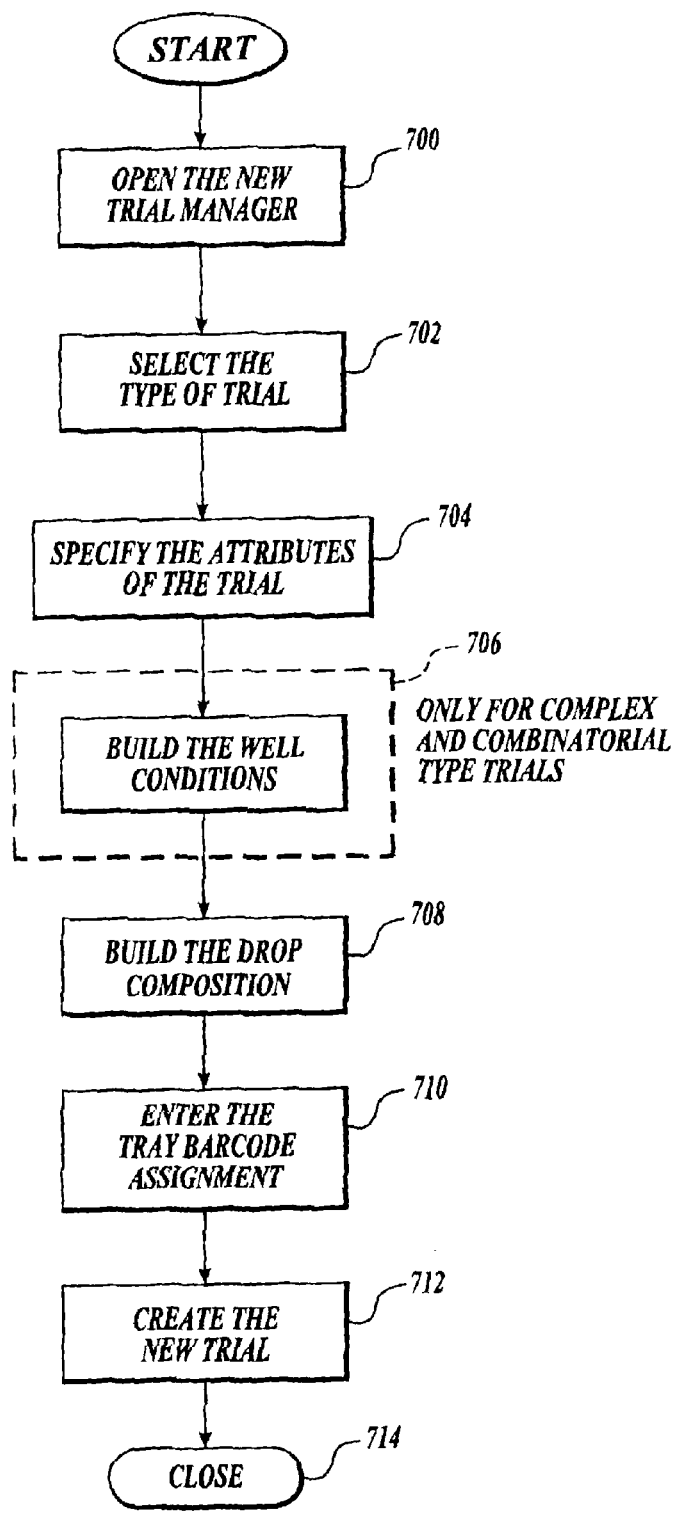
FIG. 7 shows a generic functional flow diagram of a new trial manager according to the present invention.

FIG. 7 is a functional flow diagram that illustrates the executable steps of the new trial manager. The new trial manager is opened or launched when the button of the new trial manager 208 is actuated. At step 700, when the new trial manager is opened, the GUI is displayed. A suitable GUI for receiving user choices is shown and described below in FIGS. 8 and 9. Next, at step 702, the user is prompted to select the type of trial desired. At step 704, the user is asked to specify the attributes of the trial. Step 706 is applicable only for complex and combinatorial type trials. These types of trials, as well as normal trials, will be hereinafter described in greater detail. In any event, at step 706, the user is asked to build the well crystallant conditions for each of the individual wells of the specified apparatus. Step 708 is applicable to all types of trials. At this step 708, the user is asked to build the drop composition. At step 710 the user is asked to enter the tray barcode assignments for each of the apparatus plates. For complex and combinatorial type trials, the user is restricted to the use of a single plate. Finally, at step 712, the user is allowed to either save the new trial or cancel the new trial and return (step 714) to the main manager (FIG. 3) to select more options if desired.

New Trial Manager: New Trial Builder: Select a Trial

Figure 8:
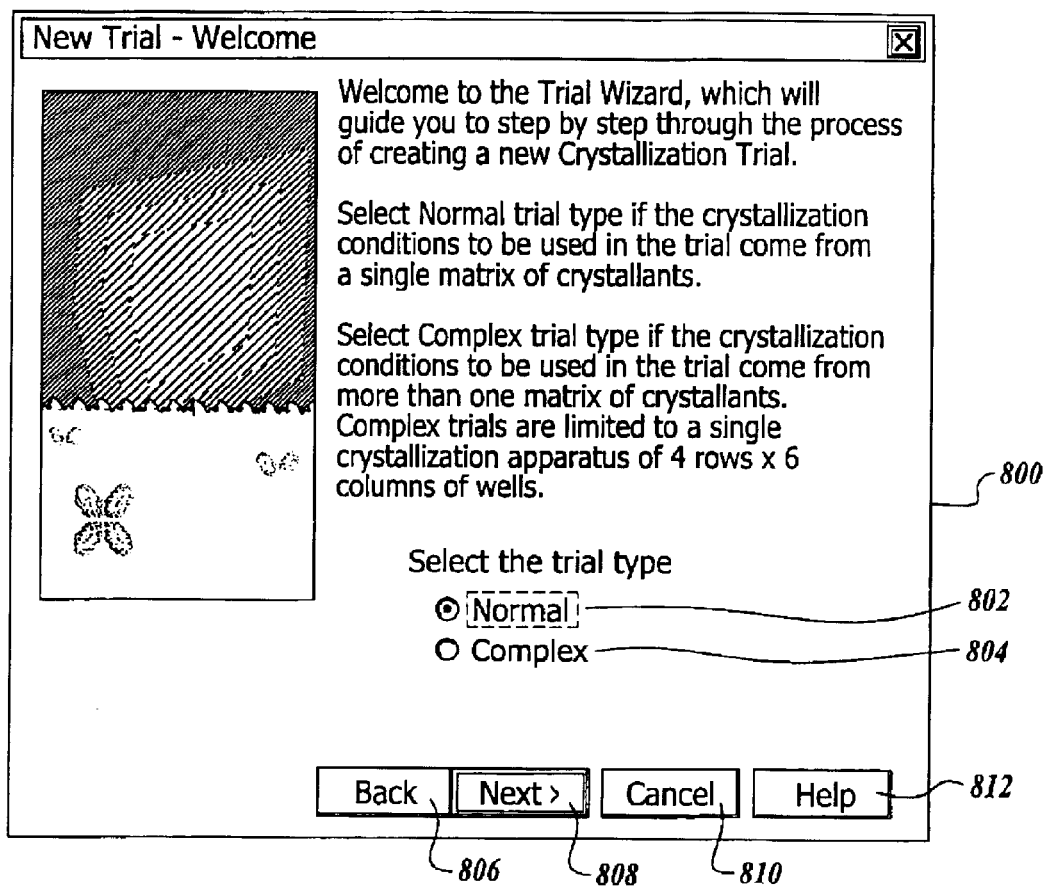
FIG. 8 shows a GUI of a select trial builder according to the present invention.

Referring to FIG. 8, the initial dialog window 800 of the new trial manager shows how the functional features for selecting a trial type may be implemented in a windowed environment. Labels are utilized in the dialog window to provide useful information. Selecting the type of trial may be implemented, for example, by radio buttons, where the selection of one button is exclusive and cancels the selection of the other button. Buttons also have labels alongside the input fields to distinguish their function. User choices include normal 802 and complex 804 trial buttons. A normal crystallization trial uses crystallization solutions from an existing single matrix of crystallization solutions. A complex crystallization trial uses crystallization solutions from more than one existing matrices of crystallization solutions. A further species of complex trial is called a combinatorial trial. A combinatorial crystallization trial has multiple crystallization drops associated with a single reservoir of crystallant. A combinatorial trial is specified in a later step. The dialog window of FIG. 9 also includes a back command button 806, a next command button 808, a cancel command button 810 and a help command button 812. The back command button 806 is disabled in the initial dialog window of the new trial manager.

Figure 9:
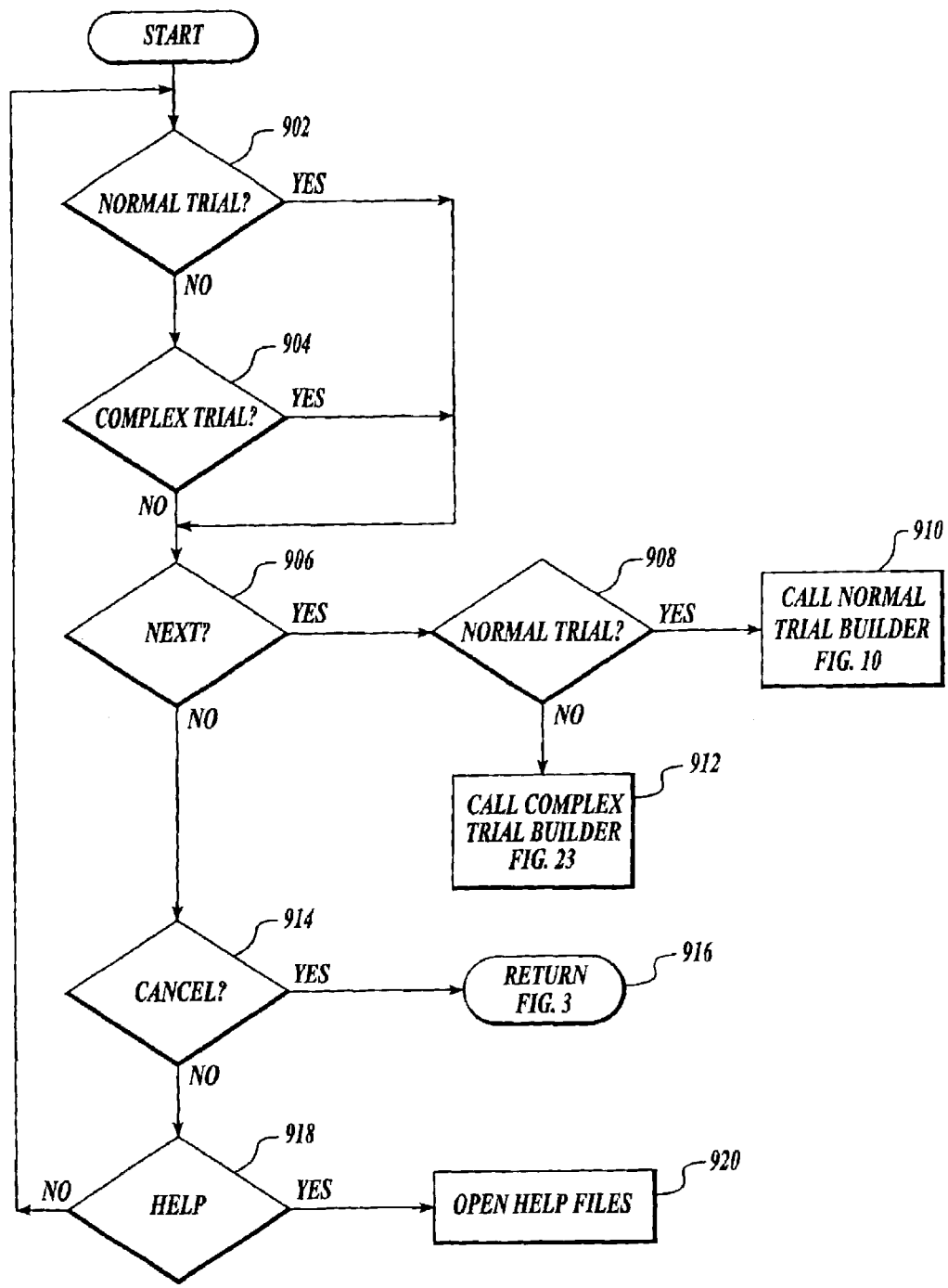
FIG. 9 shows a functional flow diagram of a select trial builder according to the present invention.

The functions represented by the radio and command buttons of FIG. 8 are shown in FIG. 9 as a sequence of tests and actions. Depending on the state of the normal and complex radio buttons 802 and 804, as shown by steps 902, 904 and 908, when the next command button 808 is actuated, either a normal trial builder 910 or a complex trial builder 912 is called. If the cancel command button 810 is actuated, as shown by steps 914 and 916, the software returns to FIG. 3. Activation of the cancel command button 810 also aborts all previously entered data. If the help command button 812 is actuated, as shown by steps 918 and 920, help files are opened. If no command is actuated, the steps recycle. Recycling continues until a command button is actuated.

New Trial Manager: Normal Trial Builder: Normal Attributes Builder

Figure 10:
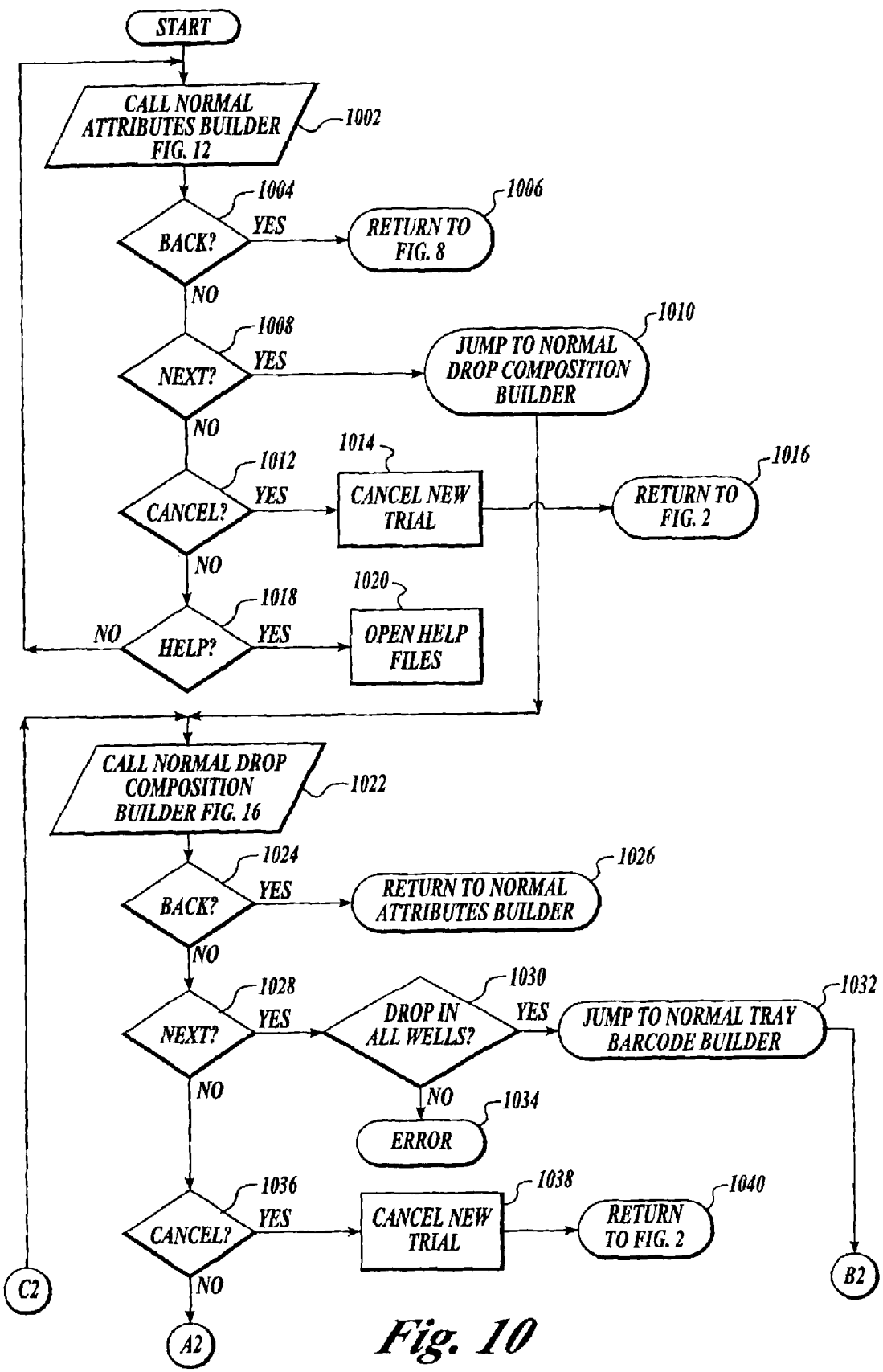
FIGS. 10 and 11 show a functional flow diagram of a new trial builder according to the present invention.
Figure 11:
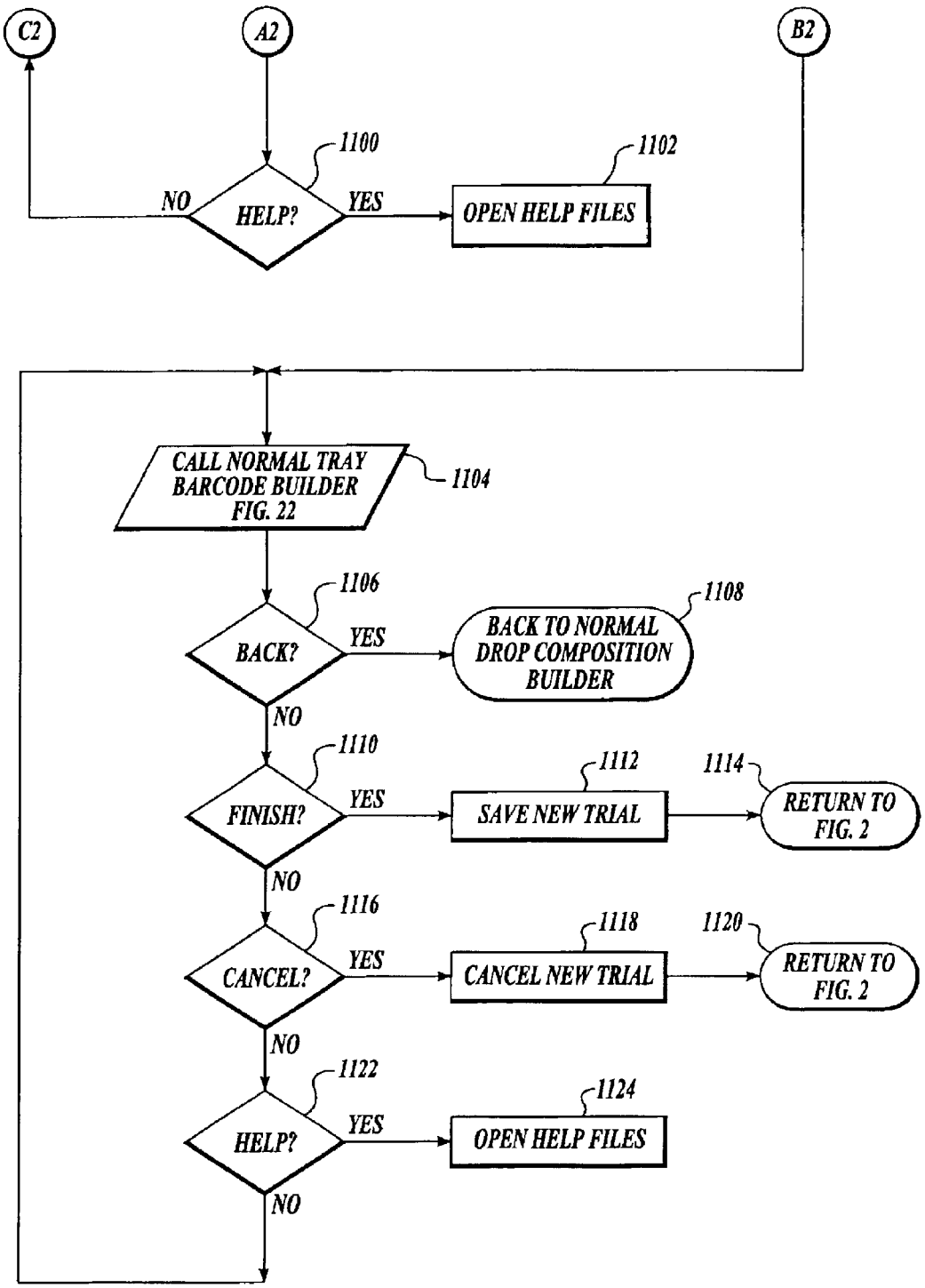

FIGS. 10 and 11 form a functional flow diagram illustrating the normal crystallization trial builder, i.e., the crystallization trial builder that is launched when the normal radio button 802 is activated and the next command button 808 is actuated. Starting or launching as shown in block 1002, a normal attributes builder is called. The GUI of the builder is shown in FIG. 12, and a functional flow diagram for the GUI is illustrated in FIG. 13, both of which are described below.

Figure 12:
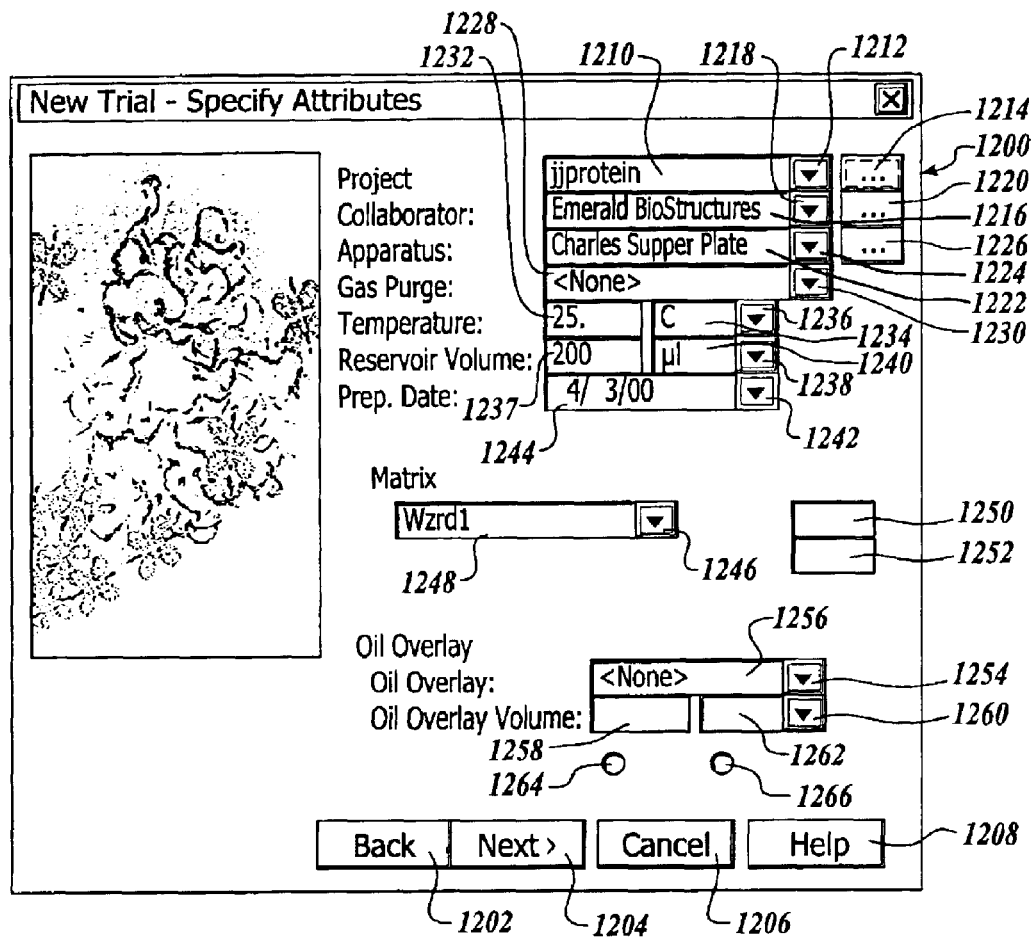
FIG. 12 shows a GUI of a normal attributes builder according to the present invention.
Figure 13:
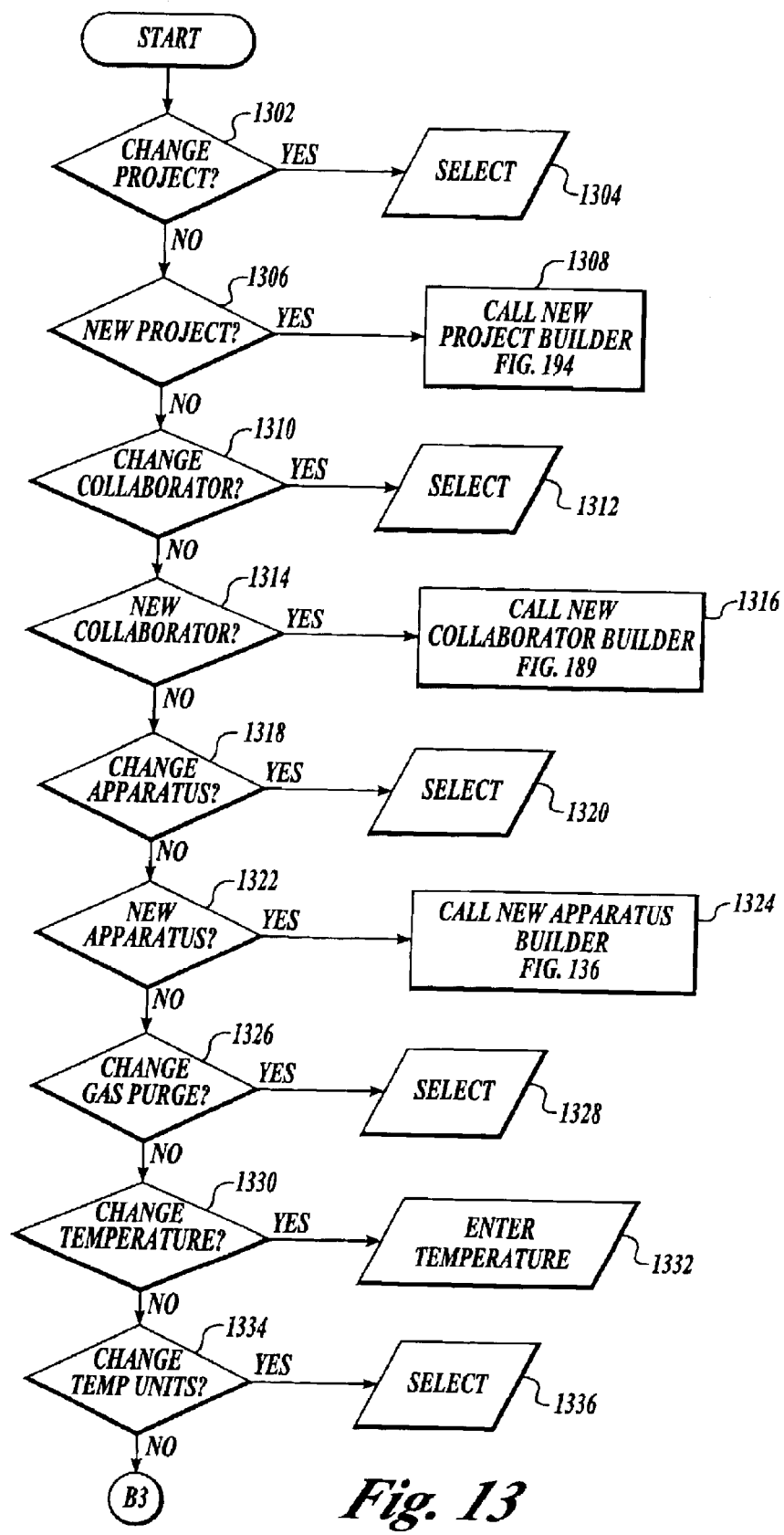
FIGS. 13–15 show a functional flow diagram of a normal attributes builder according to the present invention.
Figure 16:
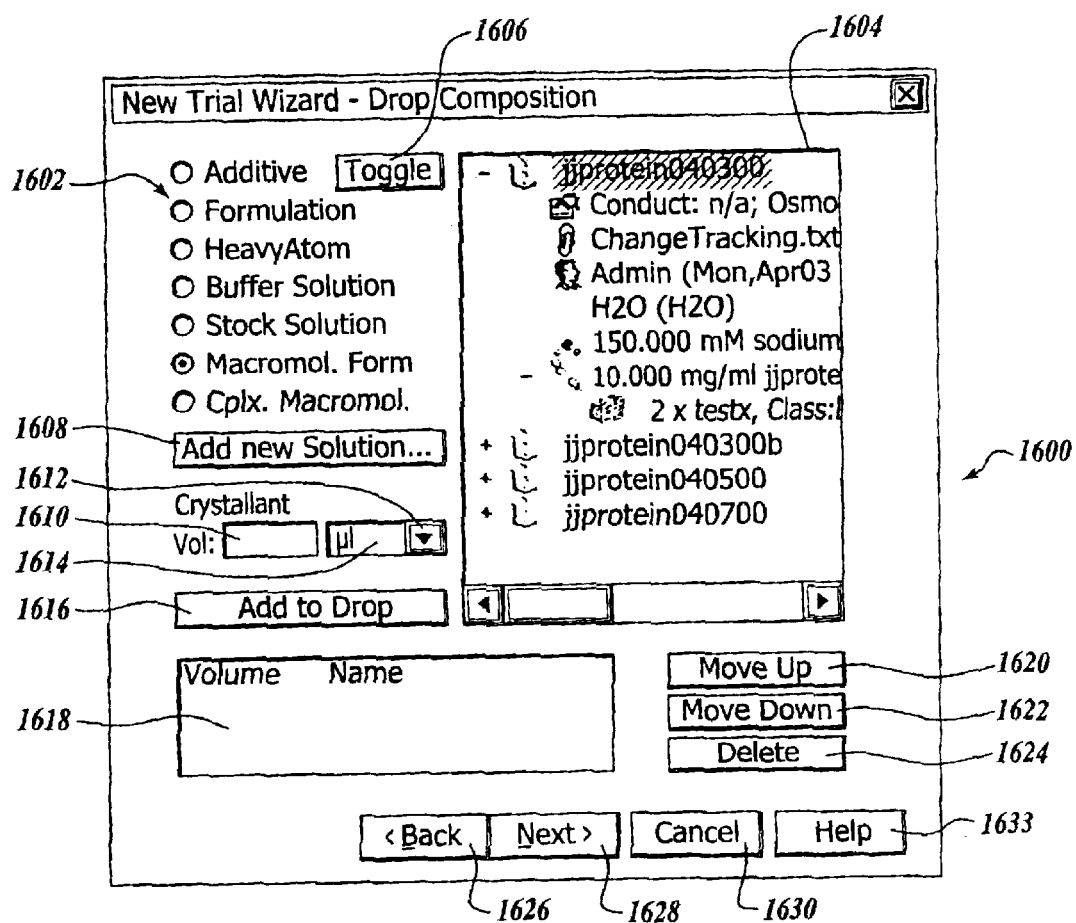
FIG. 16 shows a GUI for a normal drop composition builder according to the present invention.

As shown pictorially in FIG. 12 and functionally in FIG. 10, in addition to data attributes entry blocks, the normal attributes builder includes back, next, cancel and help command functions. These function are represented in FIG. 10 by back, next, cancel and help decision steps 1004, 1008, 1012 and 1018. These functions are represented in the GUI window of FIG. 12 by command buttons, namely a back command button 1202, a next command button 1204, a cancel command button 1206 and a help command button 1208. As shown in FIG. 10, actuating the back command button 1202 (step 1006) returns the user to the specify trial type GUI shown in FIG. 8 and described above. When the next command button 1204 is actuated, a normal drop composition builder, the GUI of which is shown in FIG. 16, is called. See block 1010. Actuating the cancel command button 1206 cancels the new trial and returns the user to the main GUI shown in FIG. 2. As shown in blocks 1014 and 1016, actuating the help button 1208 opens the help files as shown by block 1020. Since help files are well-known features of many software applications operating in a GUI environment, they are not described in detail.

Figure 14:
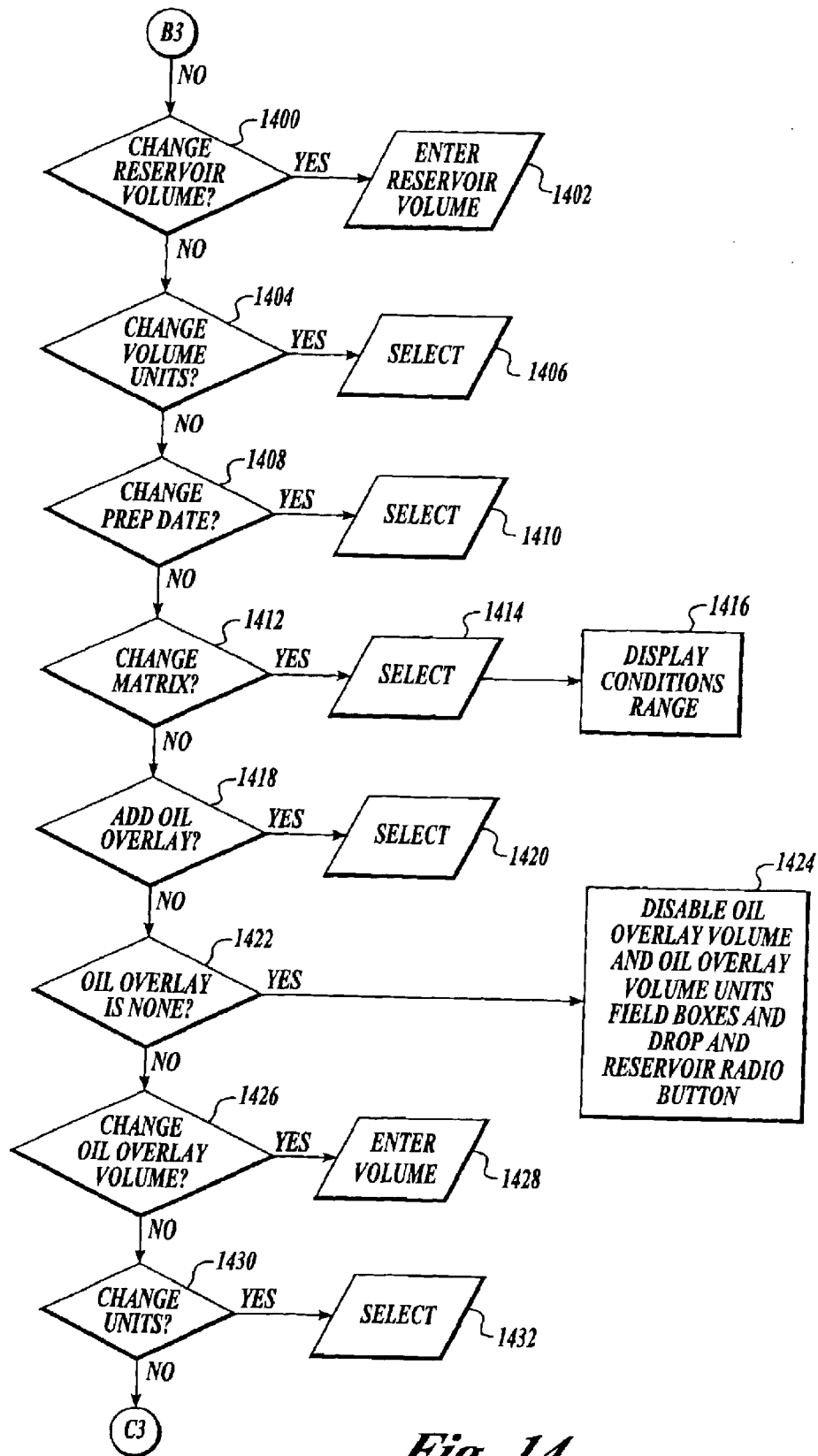
Figure 15:
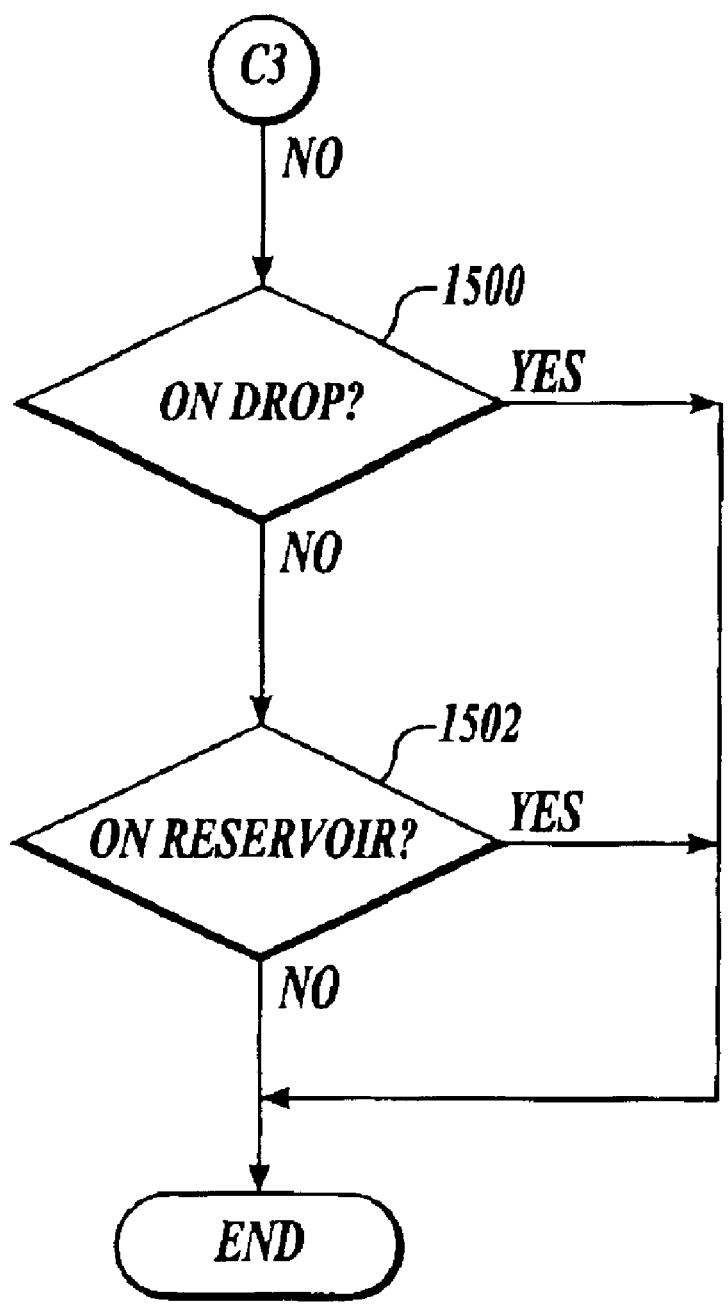

Referring now to FIG. 12, the GUI or dialog window for entering the attributes of a new normal trial are next described. The dialog window of FIG. 12 is represented functionally by FIGS. 13, 14 and 15.

As shown in FIG. 12, attributes are entered into a plurality of field boxes using drop down lists. The related drop down list is opened by clicking on the down button alongside the attribute field box. In a conventional manner, this desired entry is inserted into the field box by using the cursor to highlight the entry. Located alongside each field box is a label indicating the nature of the trial attribute. Generally, field boxes are filled with previous new trial data. This allows a user the choice of keeping the old data or entering new data. The field boxes include project 1210, collaborator 1216, apparatus 1222, gas purse 1228, temperature 1232 and 1234, reservoir volume 1237 and 1240, preparation date 1244, matrix 1248, oil overlay 1256 and oil overlay volume 1258 and 1262. The project field box 1210 includes an associated down arrow button 1212 that allows a user to display a drop down list of the current projects in the database. Using a cursor control device to move the pointer over a chosen project and clicking on the project enters the selected project in the field box 1210 and closes the list. This functionality is represented by steps 1302 and 1304 of FIG. 13. Located alongside the project field box 1210 is a command button 1214 that when actuated causes a new project builder, shown in functional flow diagram form in FIG. 194 and described below, to be opened. This command is provided so that a user may add a new project without leaving the normal attributes dialog window shown in FIG. 12. This function is represented schematically as steps 1306 and 1308 of FIG. 12.

The collaborator field box 1216 is changed by a user clicking on a down arrow button 1218 located adjacent to the collaborator field box. Clicking on the down arrow button 1218 opens a drop down list of all the collaborators in the database. Using a cursor control device to move a pointer over a chosen collaborator and clicking on the collaborator enters the collaborator name into the field box 1216 and closes the drop down list. This function is represented as steps 1310 and 1312 of FIG. 13. Located alongside the collaborator field box is a command button 1220 for calling the new collaborator builder shown in functional flow diagram form in FIG. 189 and described below. This allows a user to add a new collaborator without leaving the dialog window of FIG. 12. This function is represented by steps 1314 and 1316 in FIG. 13.

The apparatus information contained in the apparatus field box 1222 is changed by a user clicking on a down arrow button 1224 located adjacent to the apparatus field box. Clicking on this down arrow button 1224 opens a drop down list of all the apparatuses in the database. Using a cursor control device to move a pointer over the desired apparatus selection and clicking enters the selection into the apparatus field box 1222. This is represented by steps 1318 and 1320 in FIG. 13. Preferably, the software comes preloaded with a number of commercial apparatuses, such as, but not limited to, a Charles Supper plate, CombiClover, CompactClover, Costar plate, Cryschem plate, Linbro plate, Nunc, Q plate, Q plate II, VDX plate, or the VDX plate 4× combi. Located alongside the apparatus field box 1222 is a command button 1226 that when actuated calls a new apparatus builder. An example of a new apparatus builder is shown in functional flow diagram form in FIG. 137 and described below. This allows a user to add a new apparatus to the database without leaving the dialog window of FIG. 12. In summary, clicking on the command buttons associated with the project, collaborator and apparatus field boxes allows a user to create new database entries without having to exit the new trial manager. Alternatively, a user may create new entries for these objects outside of the new trial manager by accessing the project manager, collaborator manager, or apparatus manager from the main tool bar shown in FIG. 3 and described above.

Next, a user has the option of changing the gas purge field box 1228. The gas purge field box is changed by clicking on the down arrow button 1230 located adjacent to the gas purge field box. As noted above, clicking is accomplished by using a cursor control device to position an arrow over the down button and actuating a key of the cursor control device. Clicking on the down arrow button 1230 opens a drop down list of the available purge gases. Using a cursor control device to move the pointer over the user's selection and clicking enters the selection into the purge gas field box 1228 and closes the list. These actions are represented in steps 1326 and 1328 in FIG. 13. Preferably, software formed in accordance with this invention comes preloaded with a number of gasses to be used as the purge gas, such as argon, carbon dioxide, nitrogen, oxygen, or xenon. The user may also decide not to use a purge gas, in which case the user will click on the selection titled "none." As noted above, clicking on a selection enters the selected purge gas into the purge gas field box 1228 and closes the drop down list. In accordance with normal crystallization trial procedures, a purge gas is specified if the crystallizations trial is set up under nonambient air conditions.

A user also has the option of changing the temperature. A user changes the temperature by entering a new temperature in the temperature field box 1232 through the use of a keyboard after selecting the temperature field box by, for example, causing a temperature legend to be highlighted. This is represented as steps 1330 and 1332. If necessary, a user can change the temperature units by clicking on a down arrow button 1236 located adjacent to the temperature units field box 134. Clicking on the down arrow button 136 opens a drop down list of the available temperature units. Moving the pointer of a cursor control device over the units and clicking enters the new unit into the units field box 1234. This is represented by steps 1334 and 1336 of FIG. 13. Preferably, the software formed in accordance with this invention comes preloaded with temperature units, centigrade, Fahrenheit, etc.

A user also has the choice of changing the reservoir volume by entering a new reservoir volume in the reservoir volume field box 1237 by selecting the reservoir volume field box 1237 and using a keyboard to enter a desired volume. This is represented as steps 1400 and 1402 of FIG. 14. The reservoir volume field box 1237 specifies the volume of the crystallization solution to be used for all of the crystallization compartments in the trial. A user can change the volume units for the reservoir by clicking on the down arrow button 1238 located adjacent to the reservoir volume units field box 1240. Clicking on the down arrow button 1238 opens a drop down list of volume unit choices. Moving the pointer over the selection and clicking enters the new units in the reservoir volume units field box 1240. This is represented as steps 1404 and 1406 of FIG. 14. Preferably, the software formed in accordance with this invention comes preloaded with either the microliter or the milliliter units. A user has the option of inserting or changing the preparation date of the trial by clicking on a down arrow 1242 located alongside the date field box 1244. Clicking on this arrow opens a calendar (not shown). In a conventional manner, a user can increment or decrement the calendar by months by clicking on either the left or the right arrow buttons located on a menu included in the calendar window. To select a preparation date, the user uses a cursor control device to move a pointer over the date and actuates a key of the cursor; i.e., the user clicks on the desired date. Clicking on the date enters the date in the preparation date field box 1244 and closes the calendar. This is represented by steps 1408 and 1410 of FIG. 14.

A user also has the option of changing the matrix by clicking on a down arrow button 1246 located alongside the matrix field box 1248. Clicking on the down arrow button 1246 opens a drop down list of the commercial matrices in the database. A user selects a new matrix by using a cursor control device to move a pointer over the selection and clicking on the selection. Clicking enters the matrix in the field box 1248 and closes the list. This is represented by steps 1412 and 1414 of FIG. 14. Preferably, the software formed in accordance with this invention comes preloaded with commercial matrices including, but not limited to: CRYO 1, CRYO 2, CRYO F, MBFAC, NAMSC, NATRIX, WZRD 1, WZRD 2, WZRD F, XLSCCY, XLSNL, XTLS 1, and XTLS 2. The range of conditions in the specified matrix is shown in field boxes 1250 and 1252. This is represented as step 1416 in FIG. 14. For a normal crystallization trial, the entire range of crystallant solutions in the matrix will normally be used. The number of crystallizations selected for the trial is automatically determined based on the number of crystallization compartments in the selected apparatus and the number of crystallants in the specified matrix.

A user also has the option of deciding whether or not to specify an oil overlay if oil is to be used to modulate vapor diffusion rates. A user selects an oil overlay by clicking on a down arrow button 1254 located adjacent to the oil overlay field box 1256. Clicking on this down arrow button opens a drop down list of the available oils to be used. Using a cursor control device to move a pointer over the desired selection and clicking enters the oil overlay selection in the field box 1256. This is represented by steps 1418 and 1420. Preferably, the software formed in accordance with this invention comes preloaded with a number of oil overlay chemicals. The user may also specify "none" in the oil overlay field box 1256. If the oil overlay selected is other than "none", the user has the option of entering an oil overlay volume and changing the oil overlay volume units. The oil overlay volume is changed by selecting the oil overlay volume field box 1258 and entering a new value in the oil overlay volume field box using a keyboard. These actions are represented by steps 1426 and 1428 in FIG. 14. The oil overlay volume units are changed by clicking on a down arrow button 1260 located adjacent to the oil overlay volume units field box 1262. Clicking on this down arrow button opens a drop down list of the available volume units. The user may select the desired volume units by moving the pointer over the selection and clicking. Clicking enters the units in the oil overlay volume units field box 1262 and closes the list. This is represented by steps 1430 and 1432 in FIG. 14.

A user can also specify whether the oil overlay is to be placed on the drop or on the reservoir. The user makes this choice by clicking on the appropriate one of two radio buttons 1264 or 1266. Clicking on one or the other radio button cancels the previous entry such that the user can specify only one choice, either the drop or the reservoir location. This is represented by steps 1500 and 1502 of FIG. 15.

If the user has specified "none" in the oil overlay text field, preferably, software disables the oil overlay volume, the oil overlay volume units and the drop and reservoir radio buttons. This is represented as steps 1422 and 1424.

Normally, after all the fields have been completed but actually at any time during the process, as shown functionally in FIG. 10, the user can actuate any of the back, next, cancel, or help command buttons. These command buttons appear on the bottom of the specify attributes dialog window (FIG. 12).

New Trial Manager: Normal Trial Builder: Normal Drop Composition Builder

Figure 17:
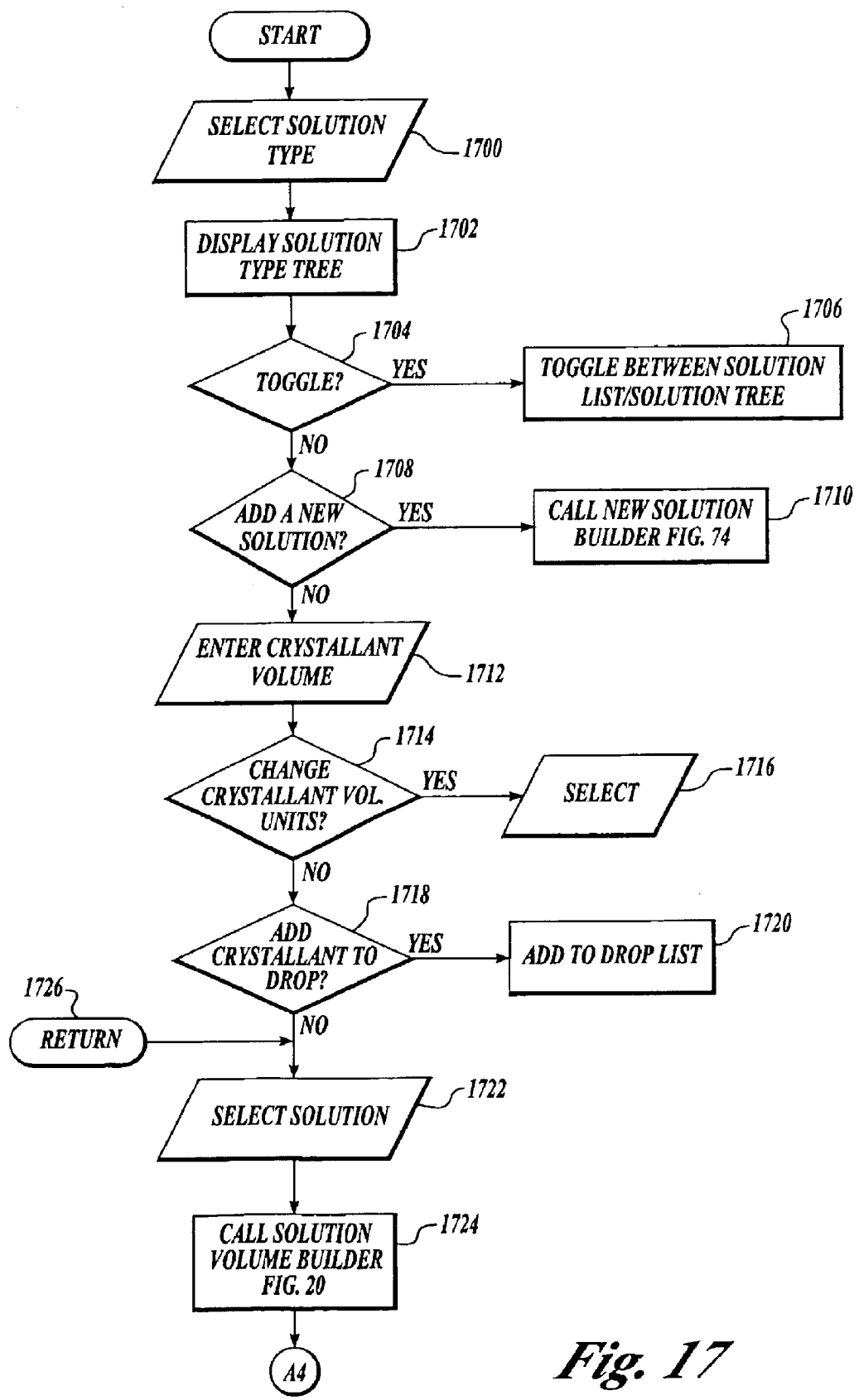
FIGS. 17–18 show a functional flow diagram of a normal drop composition builder according to the present invention.

Referring again to FIG. 10, when the next command button of the specify normal attributes dialog window is clicked on, as shown by block 1010, the program goes to the normal drop composition builder 1022, which opens a GUI or dialog window 1600 of the type shown in FIG. 16. A functional flow diagram for the normal drop composition builder is shown FIG. 17. The enter drop composition builder allows a user to build a drop composition from various solutions and add a crystallant.

The first step in building a drop composition is to select the desired solution type. Solution types are selected by choosing the associated one of a plurality of radio buttons 1602 included in the enter drop composition builder dialog window 1600 (FIG. 16). Located alongside the radio buttons are labels indicating the solution type. Using a cursor control device to move a pointer over a choice and clicking selects the solution type and clears the radio buttons associated with different solution types. This is represented functionally by step 1700 of FIG. 17. Preferably, the software formed in accordance with this invention allows the following types of solutions: additive, formulation, heavy atom, buffer solutions, stock solutions, macromolecule formulations, and complex macromolecule formulations. Preferably, the software also comes preloaded with various kinds of stock solutions. Clicking on a radio button for a solution type displays all of the current entries in the database for the solution type in a list box 1604 of the normal drop composition builder dialog window 1600 located to the right of the solution radio buttons 1602. This function is represented as step 1702 in FIG. 17. Preferably, the solutions are shown in a tree format that can be expanded in a conventional manner by clicking on the appropriate solution. Expanding the solution causes the properties of the solution to be displayed, again in tree format. Double clicking on the properties entry of the solution allows the solution properties to be changed without leaving the current dialog window. The list box 1604 can have conventional vertical and horizontal scroll bars located on the right side and on the bottom side, if desired. Clicking on the up, down, left or right arrow buttons scrolls the solution tree. Also, in a conventional manner, using a cursor control device to move a pointer over an entry displays the properties associated with the entry. Preferably, a user has the choice of toggling between a solution tree (shown in FIG. 16) and a solution list (not shown) by moving the pointer over a toggle command button 1606 and clicking. This is represented by step 1704 of FIG. 17. Preferably, the solution list displays the solution and associated properties in tabular format with the solution attributes in the first row.

Referring to FIG. 16, preferably, a user is given a choice of adding new solutions. New solutions can be added by clicking on a add new solution command button 1608. Clicking on the add new solution command button 1608 calls up the new solution builder illustrated in functional diagram form in FIG. 74 and described below. This action is represented by steps 1708 and 1710 in FIG. 17.

A user enters a crystallant volume in a crystallant volume field box 1610 by selecting the crystallant volume field box and entering the desired value using a keyboard. This is represented as step 1712 in FIG. 17. A user can change the crystallant volume units by clicking on a down arrow button 1612 located adjacent to a crystallant volume units field box 1614. Clicking on the down arrow button 1612 opens a drop down menu that contains a choice of units. Using a cursor control device to move a pointer over the desired units selection and clicking enters the selected units into the crystallant volume unit field box 1614. This action is represented by steps 1714 and 1716 in FIG. 17.

Figure 18:
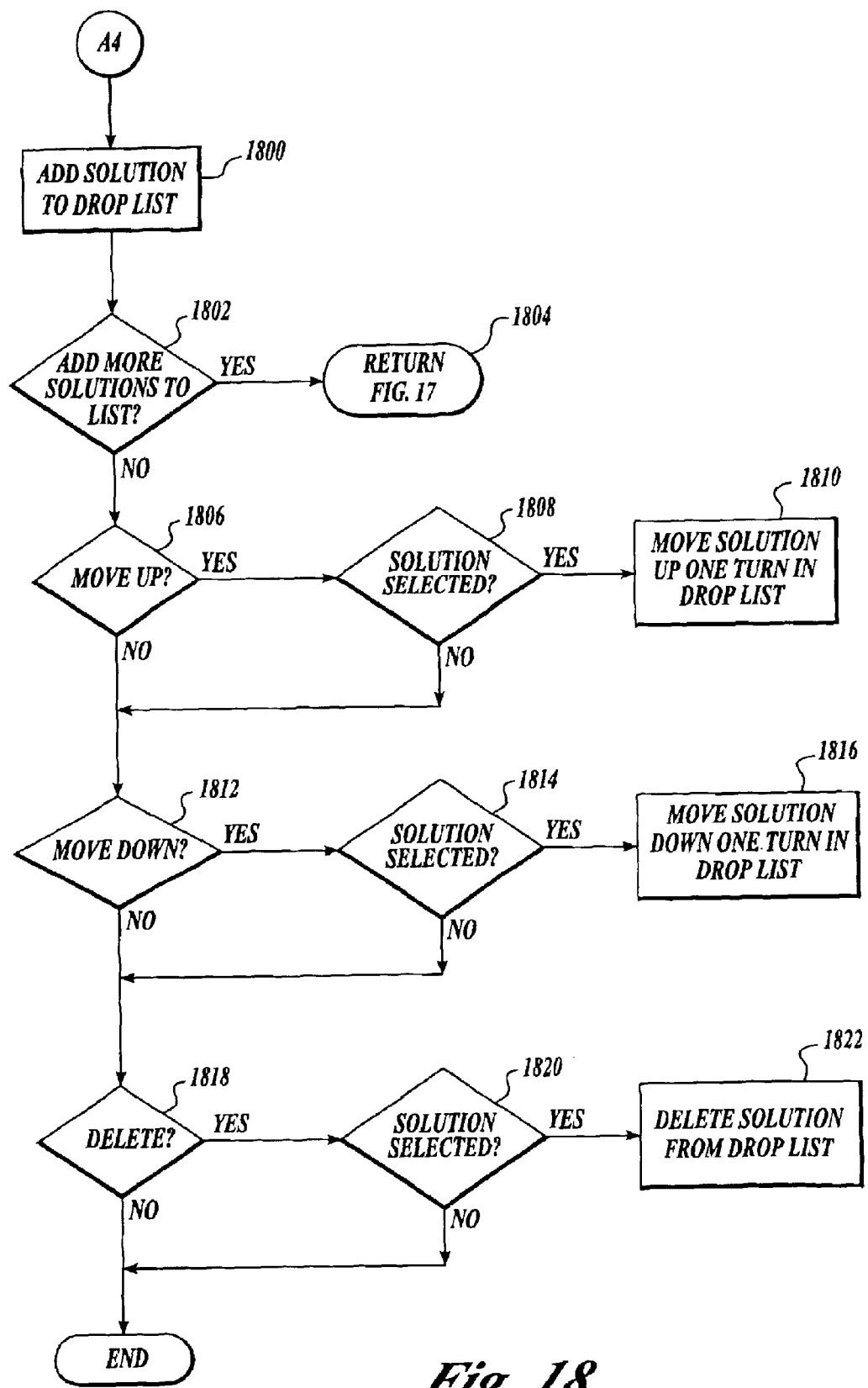
Figure 19:
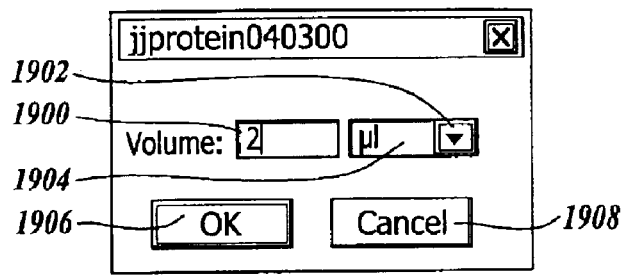
FIG. 19 shows a GUI of a volume builder according to the present invention.
Figure 20:
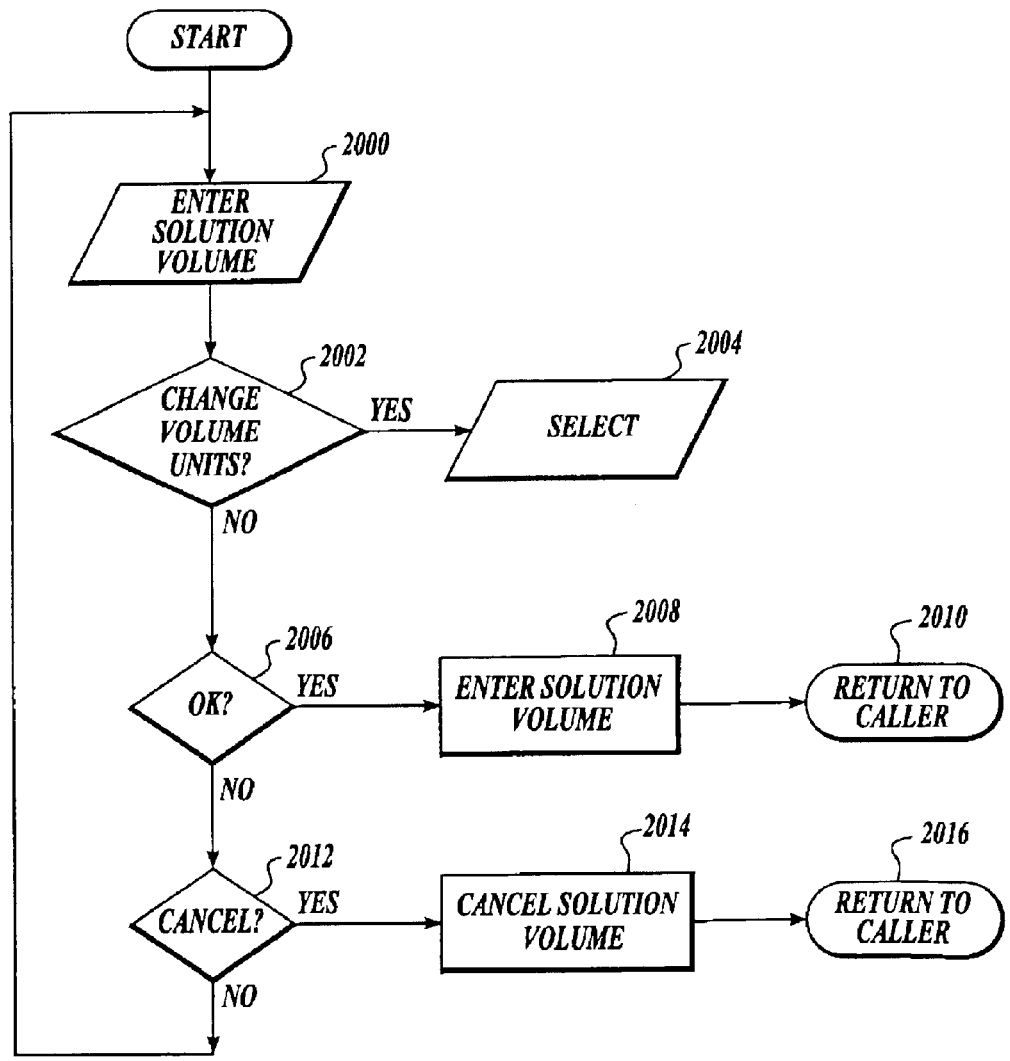
FIG. 20 shows a functional flow diagram of a volume builder according to the present invention.

A user also has the choice of adding the crystallant to the drop composition by clicking on the add to drop command button 1616. Clicking on the add to drop button 1616 adds the crystallant into a drop composition list box 1618. This action is represented by steps 1718 and 1720 in FIG. 17. The user will next select a solution to enter into the drop composition list box 1618. Changing solution types displays all of the current entries in the database for that solution type. A user enters a solution into the drop composition list box 1618 by double clicking on the icon for a solution. Double clicking on the icon produces the solution volume builder. The GUI or dialog window of a suitable volume builder is shown in FIG. 19. A functional flow diagram for FIG. 19 is shown in FIG. 20. The step of calling the solution volume builder is represented by step 1724 of FIG. 17. The dialog window of FIG. 19 includes a solution volume in the solution volume field box 1900 into which a user can enter a volume value using a keyboard. This is represented as step 2000 in FIG. 20. A user can change the solution volume units by clicking on a down arrow button 1902 located adjacent to a solution volume units field box 1904. Clicking on the down arrow button 1902 opens a drop down list of units. Using a cursor control device to move a pointer over the desired units and clicking enters the units in the field box 1904 and closes the list. This is represented as steps 2002 and 2004 in FIG. 20. If a user then clicks an okay command button 1906, the solution volume and name are entered into the drop composition list box 1618 (step 1800 of FIG. 18), the solution volume dialog window of FIG. 19 is closed, and the normal drop composition dialog window of FIG. 16 is activated. These actions are represented as steps 2006, 2008, and 2010 in FIG. 20. Alternatively, if a user clicks a cancel command button 1908, the solution volume is canceled whereby the solution is not entered into the drop composition list box. Cancellation also results in the drop composition dialog window of FIG. 16 being activated. This action is represented by steps 2012, 2014, and 2016 of FIG. 20. New solutions are selected and added to the drop composition list box using the foregoing procedure. This is represented as steps 1802 and 1804 in FIG. 18.

For a normal trial, the specified volume of the solution will be used in all of the crystallization drops in the trial. After solution entry is completed, or during entry, a user can change the pipetting order or delete a solution by the use of move up, move down and delete command buttons 1620, 1622, 1624 located alongside the drop composition list box. The pipetting order to be used in the drop composition is indicated by the order of the solutions in the drop composition list box 1618. A user changes the pipetting order by clicking on a solution and then clicking on the move up command button 1620 or the move down command button 1622. If the user clicks on the move up command button 1620, the selected solution moves up one turn in the list. This action is represented by steps 1806, 1808, and 1810 in FIG. 18. If the user clicks on the move down command button 1622, the selected solution is moved down one turn in the list. This action is represented by steps 1812, 1814, and 1816 in FIG. 18. The user can also delete a solution from the drop composition list box 1618 by selecting the solution and clicking on the delete command button 1624. This command clears the selected solution from the drop composition list box 1618. This action is represented by steps 1818, 1820 and 1822 in FIG. 18.

Also included in the drop composition dialog window are the back, next, cancel, and help command buttons 1626, 1628, 1630 and 1632. As shown at step 1024 in FIG. 10, the back command button 1626 takes the user back to the normal attributes dialog window (FIG. 12); the next command button 1628 takes the user to a normal tray builder barcode (FIG. 22) which causes a tray barcode assignment dialog window (illustrated in FIG. 21 and described below) to open, provided a drop in all wells test 1030 is passed; the cancel command button 1630, which cancels the new trial, returns the user to the main dialog window (FIG. 2); and the help command button 1633 opens the help files. The drop in all wells test checks to determine if the user has specified all necessary information, such as at least one solution for the drop composition. If the drop in all wells test is not passed, an error message appears as shown by block 1034.

New Trial Manager: Normal Trial Builder: Normal Tray Barcode Builder

Figure 21:
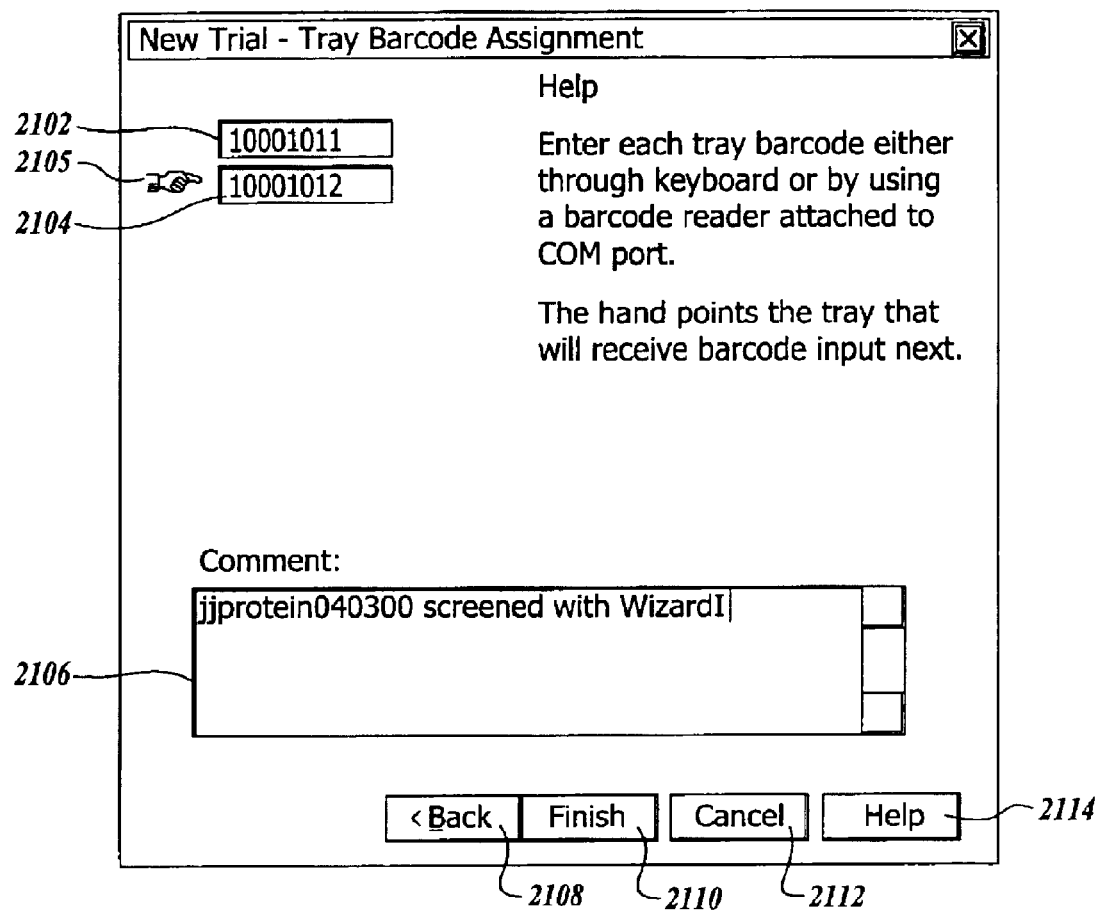
FIG. 21 shows a GUI for a tray barcode assignment builder according to the present invention.
Figure 22:
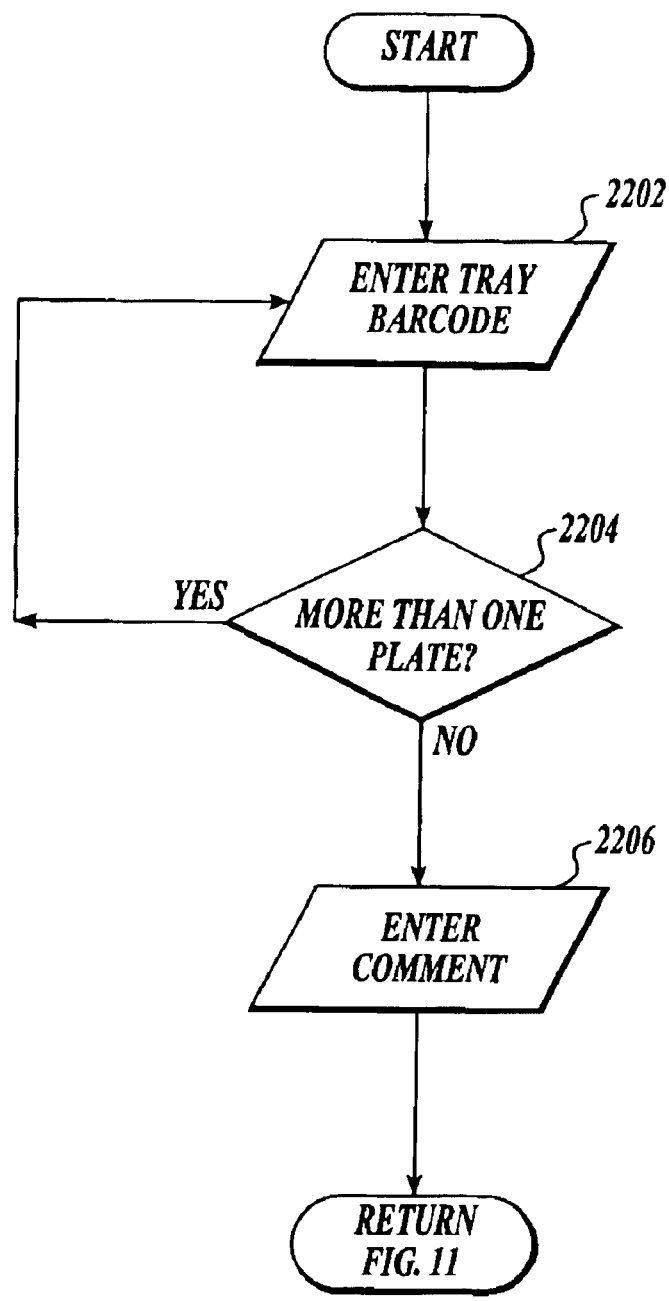
FIG. 22 shows a functional flow diagram for a tray barcode assignment builder according to the present invention.

Referring to FIG. 11, when the program jumps to the normal tray barcode builder (step 1032, FIG. 10), a GUI or dialog window is opened that asks a user to specify a unique barcode number for each plate apparatus. FIG. 21 shows a suitable GUI or dialog window, and FIG. 22 is a functional flow diagram of the normal tray barcode builder. The dialog window of FIG. 21 includes a barcode field box 2102 and 2104, for each plate, and a comment field box 2106. A user enters tray barcode numbers in the field boxes by the program associating a pointer 2105 with a field box and the user inserting the bar code using a keyboard. This action is represented by step 2202 in FIG. 22. Preferably, the program checks whether there are a plurality of plates associated with the trial by determining the number of matrix conditions and the number of wells in an apparatus. Thus, for example, if the Wizard 1 matrix of 48 solutions and a 24 well crystallization apparatus were specified, the present invention would expect that each apparatus in a trial be assigned a barcode. Thus, in this example, two barcode fields must be filled in by a user. This is represented by step 2204 in FIG. 22 which asks if another barcode needs to be entered. If the result is true, the pointer 2105 moves to the next bar code field, and the user enters another barcode (step 2202). As an alternative to barcodes being manually typed in, barcodes can be entered using a barcode scanner 102 (FIG. 1). If desired, in addition to entering barcodes, a user can enter a brief comment in the comment field box 2106. This is represented by step 2206 in FIG. 22. In addition to barcode and comment fields, the barcode assignment dialog window includes back, finish, cancel and help command buttons 2108, 2110, 2112 and 2114. As shown in FIG. 11, clicking on the back command button 2108 returns the user to the normal drop composition dialog window (FIG. 16); see steps 1106 and 1108; clicking on the cancel command button 2112 cancels the new trial manager and returns the user to the main manager dialog window (FIG. 2); see steps 1116, 1118 and 1120; clicking on the help command button 2114 opens the help files; see steps 1122 and 1124; and clicking on the finish command button 2110 saves the new trial and returns the user to the main menu dialog window (FIG. 2); see steps 1110, 1112 and 1114.

New Trial Manager: Complex Trial Builder

As shown by block 912 in FIG. 9, if a complex trial, rather than a normal trial, was selected (see FIG. 8 and the foregoing description), a complex trial builder is called on and launched. As will be better understood from the following discussion, the complex trial builder allows a user to specify crystallization solutions from more than one matrix, or an incomplete range of conditions from a single matrix. Also, the crystallization drops can be specified that do not all have the same macromolecule solution. Complex trials are restricted to a single crystallization apparatus.

Figure 23:
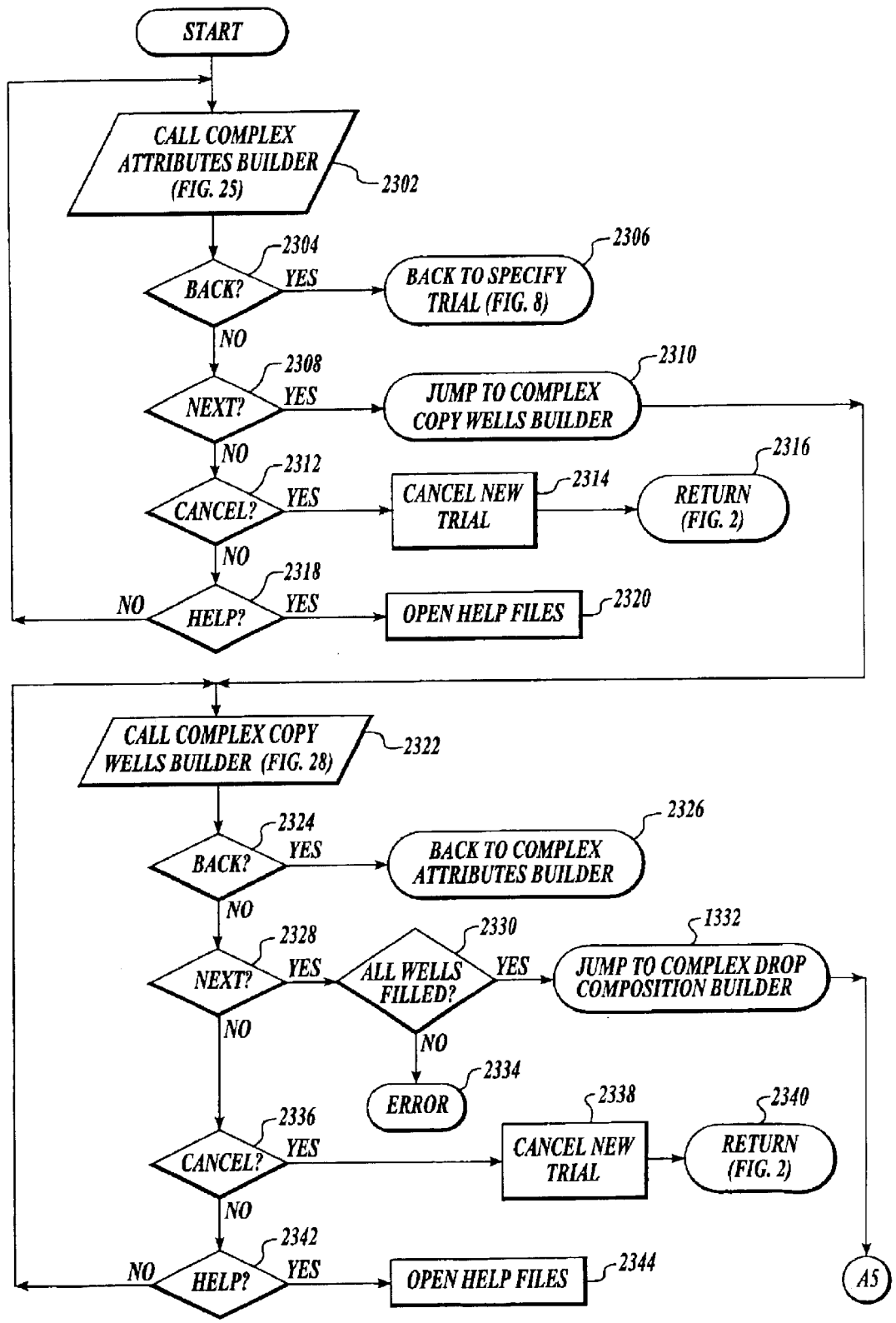
FIGS. 23–24 show a functional flow diagram for a complex trial builder according to the present invention.

As discussed above, a complex crystallization trial is set up by a user selecting the complex radio button 804 in the initial dialog window 800 shown in FIG. 8. Thereafter clicking on the next command button 808 opens or launches the complex trial builder as shown by step 912 in FIG. 9. FIG. 23 is a functional flow diagram of a complex trial builder formed in accordance with this description. The complex trial builder includes dialog windows for specifying complex trial attributes, copying wells with a crystallant composition, entering drop compositions and entering tray barcode assignments. These dialog windows are represented by the flow diagrams of FIGS. 26, 29, 33, and 36, respectively, and their functions are illustrated in related functional flow diagrams described below.

New Trial Manager: Complex Trial Builder: Complex Attributes Builder

Figure 25:
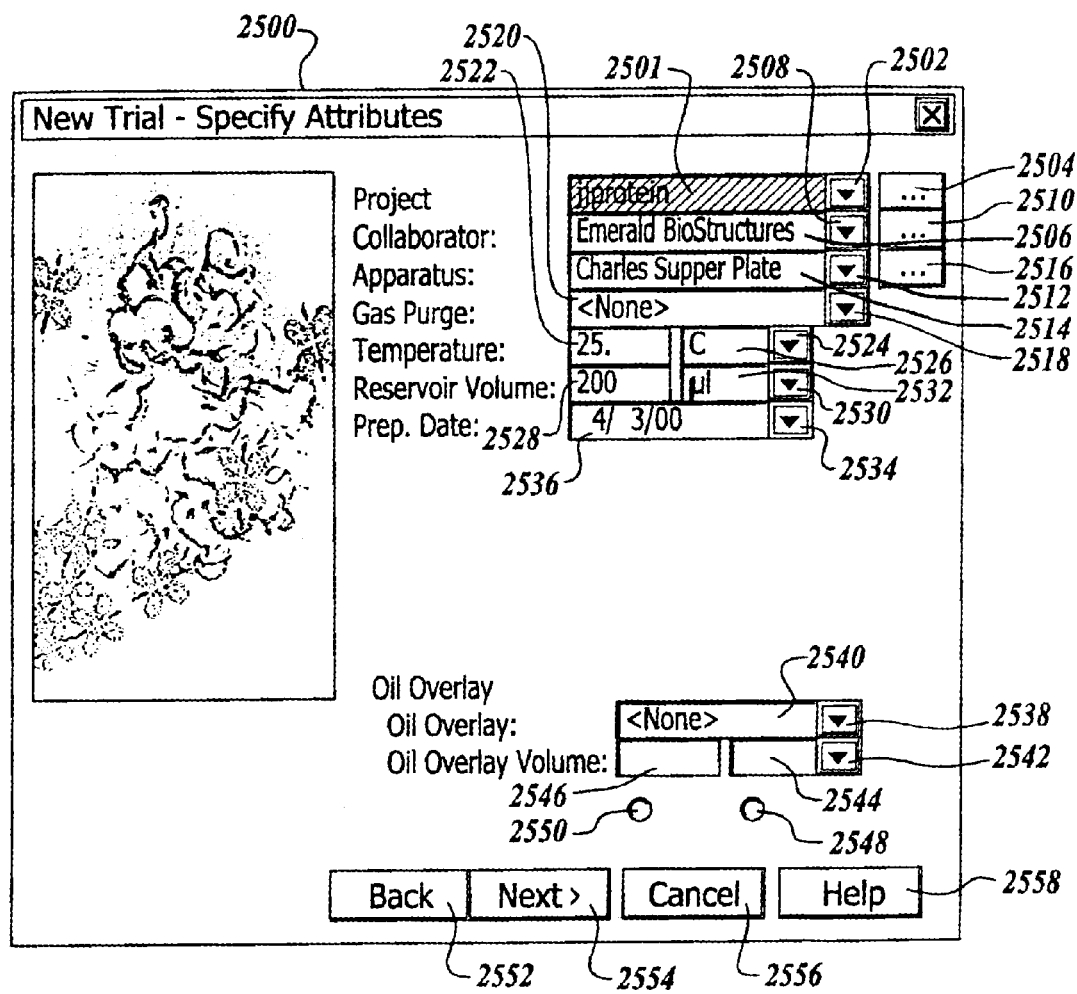
FIG. 25 shows a GUI for complex attributes builder according to the present invention.

FIG. 25 illustrates a specify attributes GUI or dialog window 2500 formed in accordance with this invention.

Figure 26:
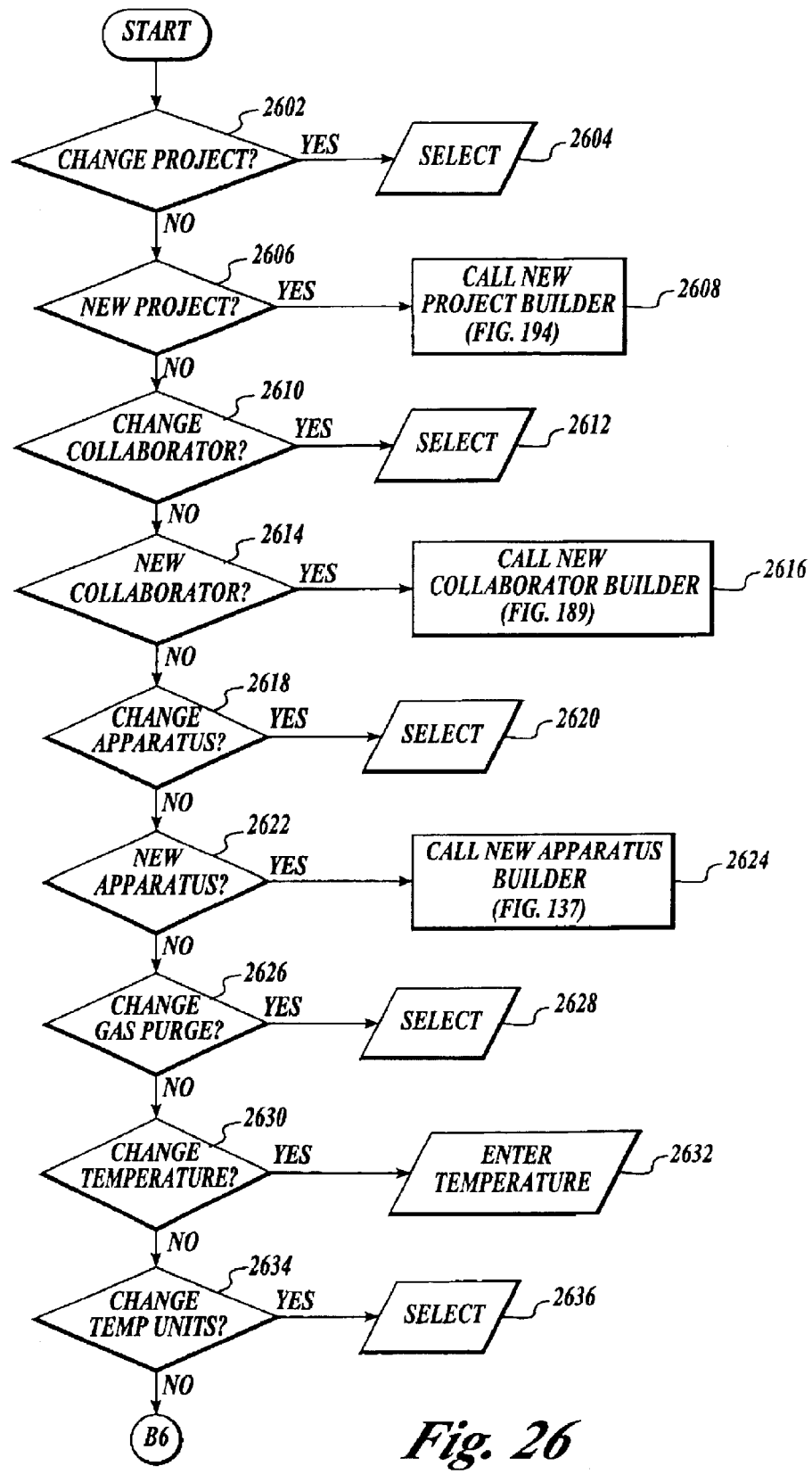
FIGS. 26–27 show a functional flow diagram for a complex attributes builder according to the present invention.
Figure 27:
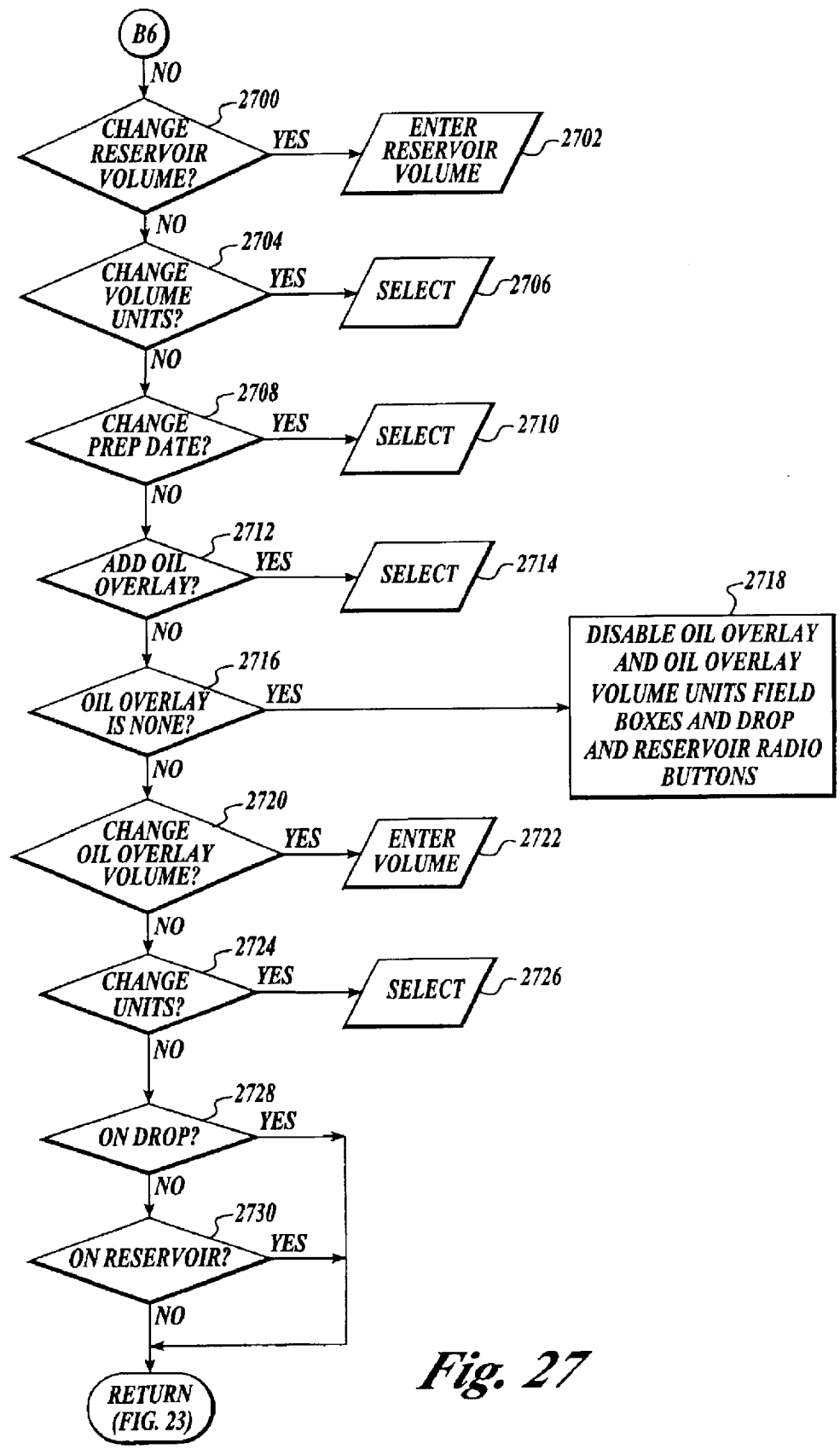

FIGS. 26 and 27 are functional flow diagrams that illustrate the operation of the dialog window shown in FIG. 25. Referring now to FIG. 25, attributes are entered in a number of field boxes. Alongside the field boxes are labels relating to the specific attributes of the trial. The field boxes initially contain the attributes of the previous trial, so the user must decide to change the attribute or can skip entering a field value if the current value is acceptable. The dialog window of the complex trial looks and functions much like the corresponding dialog window for the normal trial. However, in setting up a complex trial, there is no field to specify a matrix of crystallization solutions.

The user can change the project field box 2501 by clicking on the down arrow button 2502 alongside the field box 2501 which opens a drop down list of all the projects in the database. The user selects a new project by moving the pointer over the choice and clicking on the choice. Clicking enters the new project in the project field box 2501 and closes the list. This is represented by steps 2602 and 2604 in FIG. 26. Alongside the field box is a command button 2504; if the user wishes to add a new project, the user can move the pointer over the command button 2504 and click to open the new project builder, FIG. 194 without leaving the current dialog window. This is represented by steps 2606 and 2608 in FIG. 26. The user is next prompted to change the collaborator field box 2506 by clicking on the down arrow button 2508 which opens a drop down list containing all of the collaborators in the database. Moving the pointer over the choice and clicking will enter the collaborator in the field box 2506 and close the drop down list. This is represented by steps 2610 and 2612 in FIG. 26. The user can choose to add a new collaborator by clicking on the command button 2510 alongside the collaborator field box which opens the new collaborator builder of FIG. 189 without having to close the current dialog window. This is represented as steps 2614 and 2616 in FIG. 26. The user is next prompted to change the apparatus by clicking on the down arrow button 2512 which opens a drop down list of all the apparatuses in the database. Moving the pointer over the choice and clicking on it enters the apparatus in the apparatus field box 2514 and the drop down list closes. This is represented in steps 2618 and 2620 of FIG. 26. The software has been preprogrammed with a list of commercial apparatuses for the user's convenience. The user can add a new apparatus by clicking on the command button 2516 alongside the apparatus field box 2514 and opening the new apparatus builder of FIG. 137 without leaving the current dialog window. Next, the user is prompted to change the gas purge by clicking on the down arrow button 2518 which displays a drop down list of all the suitable purge gasses available. The software is preprogrammed with a number of suitable purge gasses such as, but not limited to: argon, carbon dioxide, nitrogen, oxygen, and xenon. Clicking on a purge gas enters the purge gas into the gas purge field box 2520 and closes the drop down list. This is represented by steps 2626 and 2628 in FIG. 26. The user is next prompted to enter the temperature of the trial in the temperature field box 2522, represented by step 2630 in FIG. 26. The user may choose to change the temperature units by clicking on the down arrow button 2524 alongside the temperature units field box. Clicking on the down arrow opens a drop down list of suitable temperature units, such as Celsius and Kelvin. Moving the pointer over the choice and clicking will enter the new units in the field box 2526 and close the list, represented by steps 2634 and 2636 in FIG. 26. The user is next prompted to enter the reservoir volume in the reservoir volume field box 2528, represented as step 2700 in FIG. 27. The user can decide to change the reservoir volume units by clicking on the down arrow button 2530 alongside the reservoir volume units field box 2532 which opens a drop down list of suitable volume units, such as microliter or milliliter. Moving the pointer over the units and clicking enters the new volume unit in the field box 2532 and closes the list. This is represented by steps 2704 and 2706 in FIG. 27. The user is then prompted to change the preparation date by clicking on the down arrow button 2534 alongside the preparation date text box 2536. Clicking on the down arrow 2534 opens a calendar. The user selects a date by moving the pointer over a date and clicking which enters the date into the date field box 2536 and closes the calendar. This is represented by steps 2708 and 2710 in FIG. 27. As mentioned previously, there is no field in this dialog window to specify a matrix of crystallization solutions. The user is therefore prompted to enter the oil overlay if applicable. The user clicks on the down arrow button 2538 alongside the overlay field 2540 which opens a drop down list of suitable oil overlay compositions. Moving the pointer over a choice and clicking on a composition enters the composition into the oil overlay field box 2540 and closes the list. This is represented as steps 2712 and 2714 in FIG. 27. If the choice is other than none, the oil overlay volume field box 2546 and the oil overlay volume units field box 2544 will be enabled, otherwise the user returns schematically to FIG. 23. The oil overlay volume is entered in the oil overlay volume field box 2546, represented as step 2720 and step 2722 in FIG. 27. The user can change the oil overlay volume units by clicking on the down arrow button 2542 alongside the oil overlay volume unit field box 2544 which causes a drop down list to open. Moving the pointer over a choice and clicking on a unit enters the units into the units field and closes the drop down list. This is represented as steps 2724 and 2726 in FIG. 27. Entering an oil overlay other than none also enables the placement of the oil overlay either on the drop or on the reservoir. The user can click either the on drop or the on reservoir radio buttons 2550 and 2548 to select the location of the oil overlay, represented as steps 2728 and 2730 in FIG. 27. If none is selected for the oil overlay, then the oil overlay volume field box 2546, the oil overlay volume unit field box 2544 and the on drop and on reservoir radio buttons 2548 and 2550 are not enabled, block 2718 in FIG. 27. The specify attributes dialog window of a complex trial also includes a back 2552, next 2554, cancel 2556, and help 2558 command buttons. After entering attributes, the user can go back to specify trial type, FIG. 7, in steps 2304 and 2306 of FIG. 23 by clicking on the back command button 2552. The user can go forward to continue setting up the complex trial by clicking on the next command button 2554, which is step 2308. The user is taken to step 2322, the complex copy wells step. The user can select to cancel the trial in steps 2312 and 2314 and return to FIG. 3 by clicking on the cancel command button 2556, or the user can get help in step 2318 by clicking on the help command button 2558. If the user had selected to go forward the user is taken to step 2322, where the user is asked to fill the wells with a crystallant composition with conditions from one or more matrices or the user can build his own composition.

New Trial Manager: Complex Trial Builder: Complex Copy Wells Builder

Figure 28:
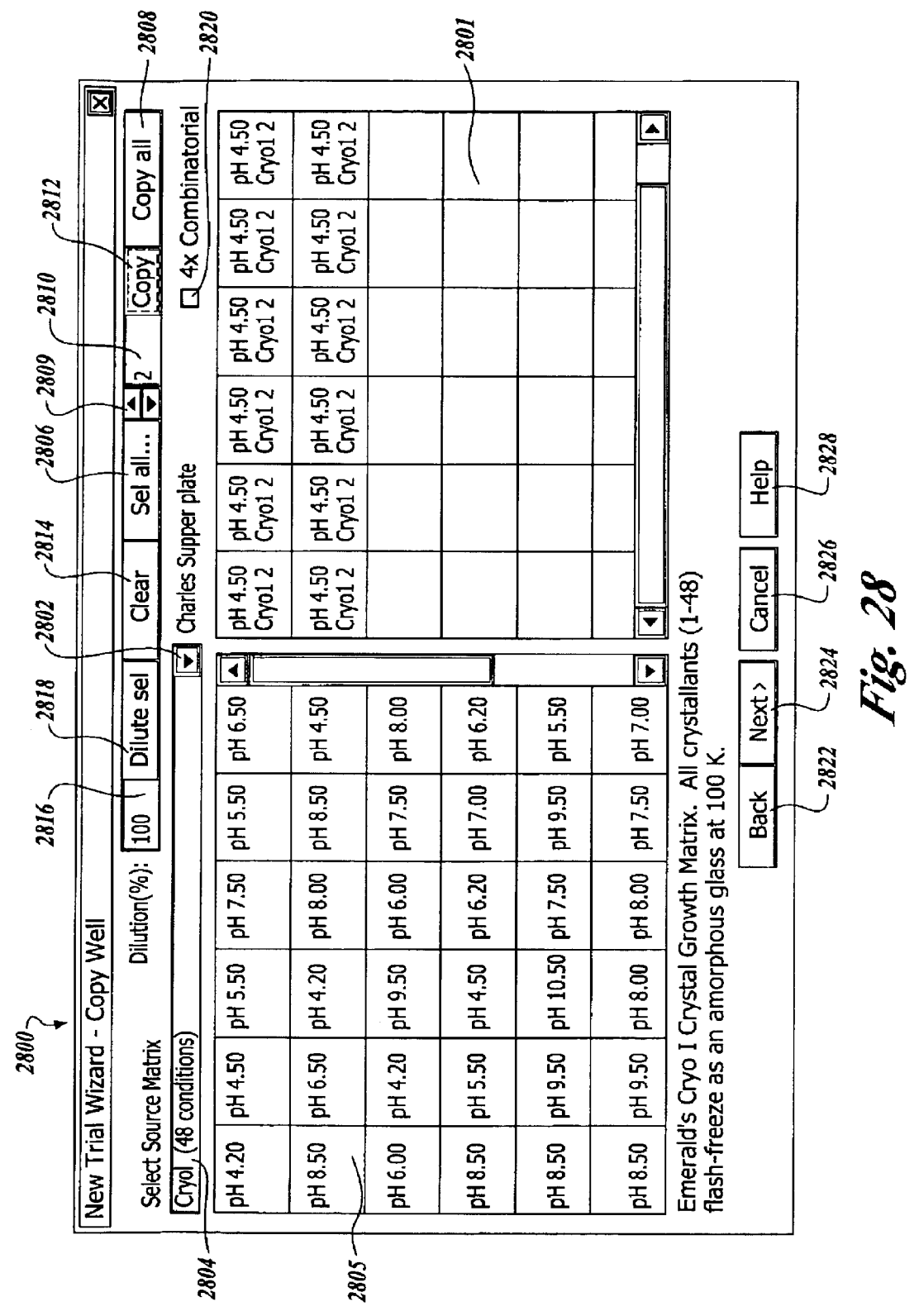
Figure 29:
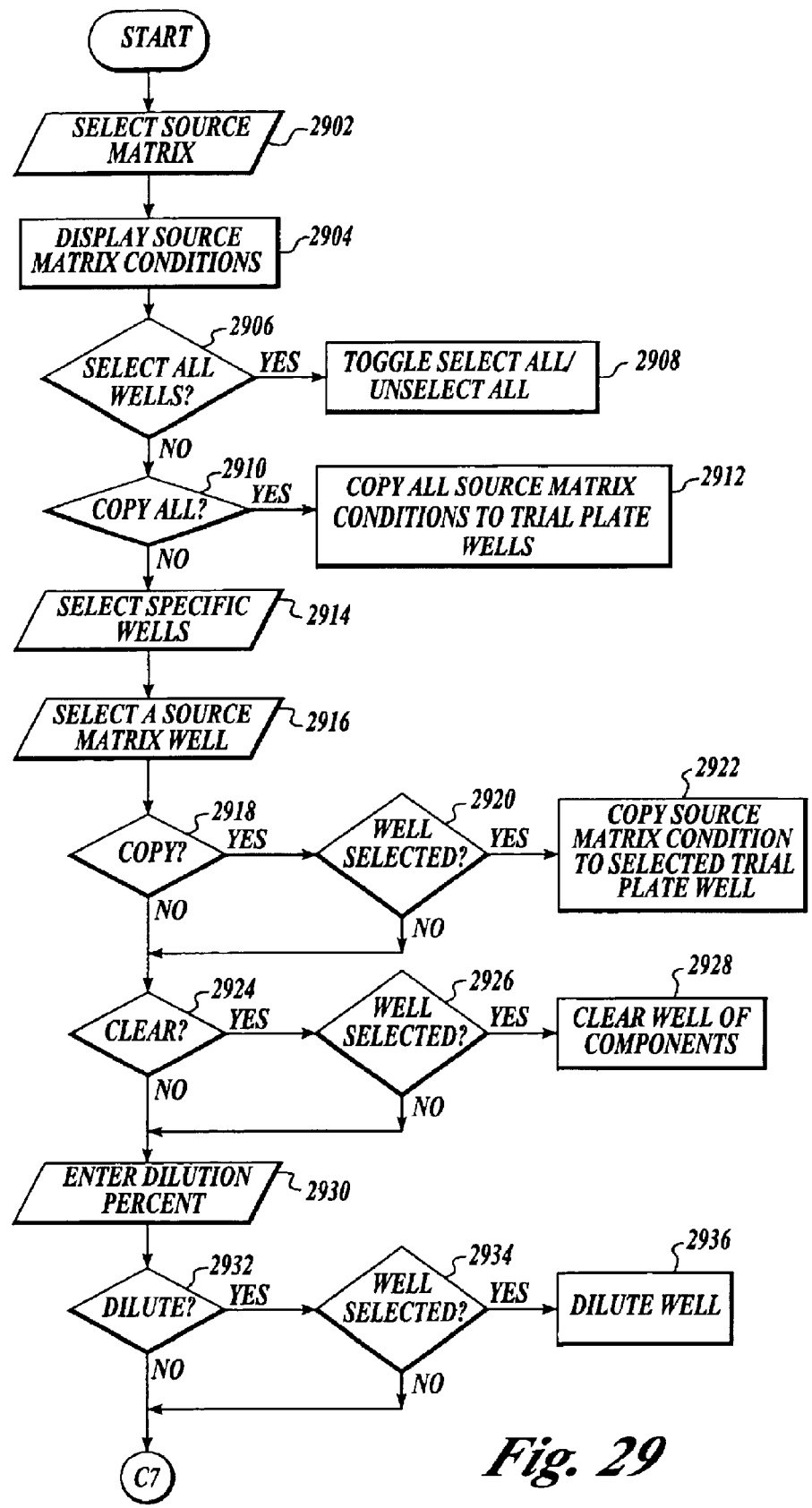
FIGS. 29–30 show a functional flow diagram for a complex copy wells builder according to the present invention.
Figure 30:
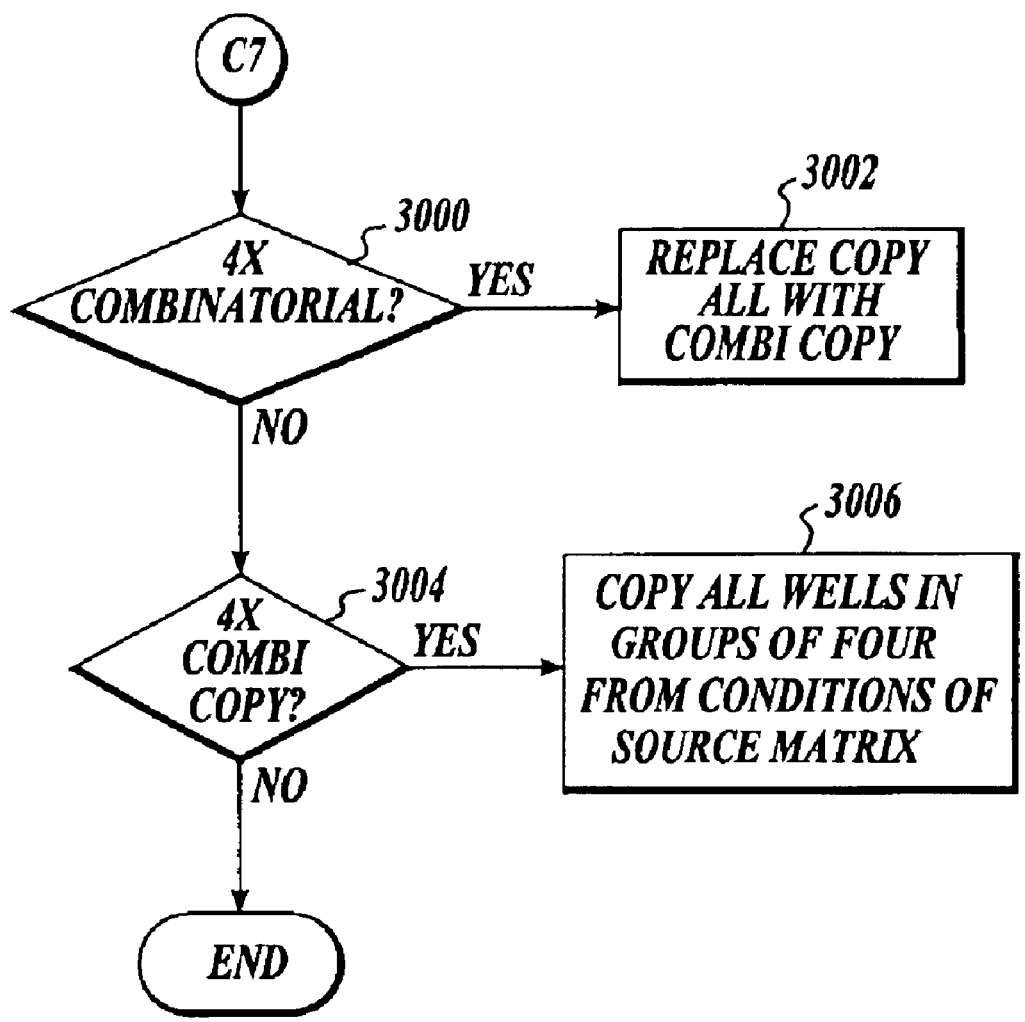

FIG. 28 shows a complex copy well builder GUI or dialog window 2800 formed in accordance with the present invention. FIGS. 29 and 30 are functional flow diagrams illustrating the operation of the copy well builder. The copy well builder dialog window is opened by clicking on the next command button 2554 of the specify attributes dialog window (FIG. 25). The copy well builder dialog window 2800

(FIG. 28) includes a list box 2801 located within the dialog window. The list box 2801 contains a template of the wells of the chosen apparatus. The first step in populating the wells of the list box is to select a source matrix. A source matrix is selected by a user clicking on a down arrow button 2802 located alongside a field box 2804 labeled "select source matrix." Clicking on the down arrow button 2802 opens a drop down list of all of the matrices available in a database. Clicking on a selected matrix enters the matrix into the source matrix field box 2804. Clicking on a selected matrix also causes source matrix wells to be displayed in a list box 2805 located to the left of the list box 2801. These actions are represented as steps 2902 and 2904 in FIG. 29.

A user can populate the wells of the list box in any one of several ways. A crystallant can be simultaneously copied from the source matrix to multiple wells in the list box. The result can be accomplished by a user first actuating a select all/unselect all command button 2806. Preferably actuating the select all wells command button 2806, causes a label on the button to toggle changes from one state to another state, specifically from select all to unselect all. This action is represented by step 2906 in FIG. 29. Clicking on the select all/unselect all command button so that the select all label occurs highlights all of the wells of the apparatus. For example, if the selected apparatus is a Charles supper plate having six columns with four rows, the list box 2801 of the dialog window will have 24 wells. Actuating the select all/unselect all command button 2806 so that select all appears cause all 24 wells to be highlighted in this example. Thereafter the actuation of a copy all command button 2808 by a user causes all of the source matrix conditions to be copied to the well of the list box 2801. This action is represented by steps 2910 and 2912 in FIG. 29. Preferably, the copy well builder checks to determine if the apparatus plate can accommodate all of the conditions of the source matrix and generates an error message if the source matrix contains fewer or more conditions than the apparatus plate will allow. The copying that occurs when the copy all command button 2808 is clicked on is such that condition 1 appears in well 1 and condition 2 appears in well 2 and so on for all of the wells of the list box.

Figure 24:
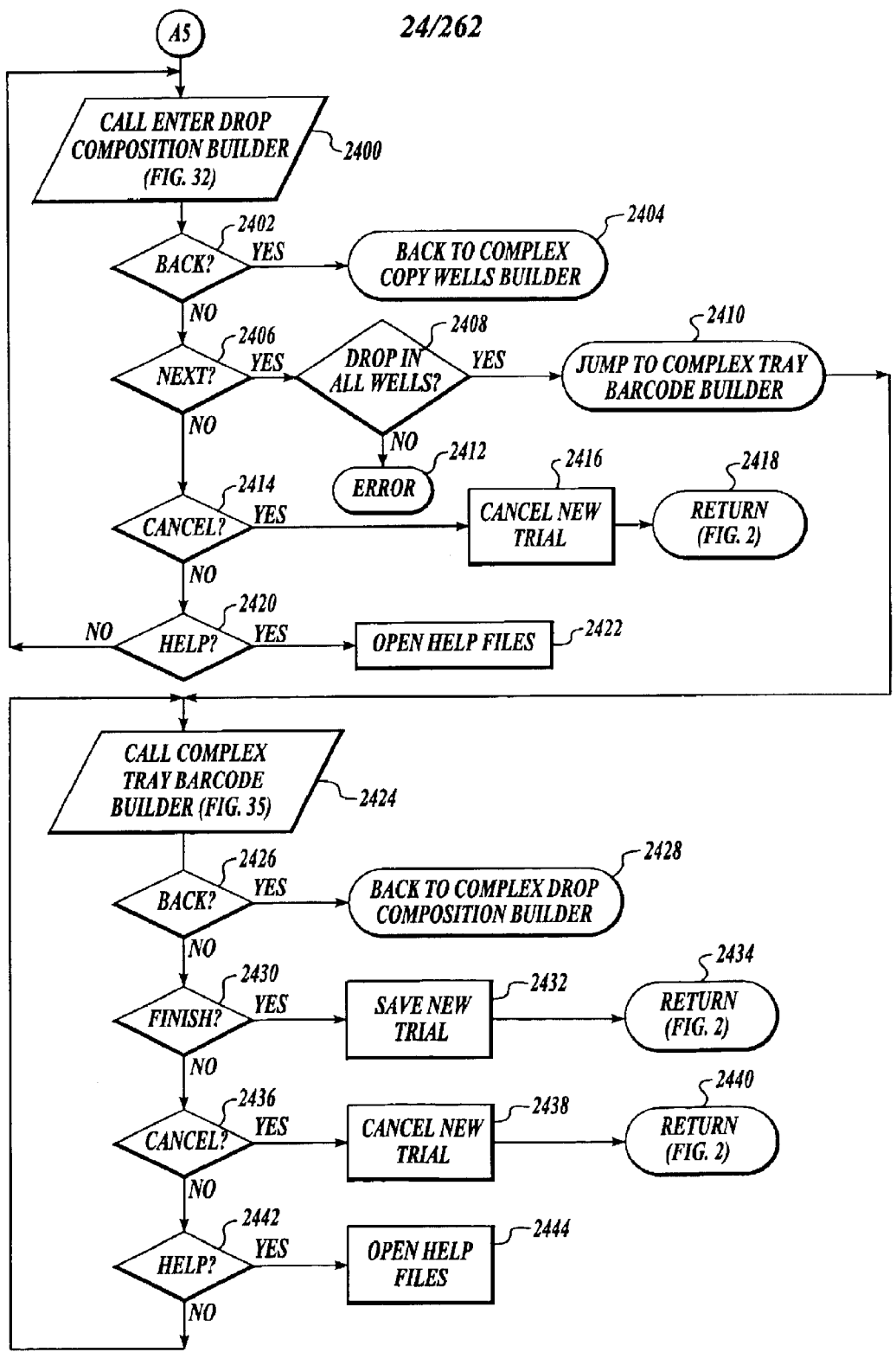

Alternatively, a user may select one or a plurality of wells rather than all wells. Selection is accomplished by using a cursor control device to move a pointer over the wells and actuating an appropriate key of the cursor control device while the pointer is dragged over the wells of interest. Releasing the cursor control key highlights the selected wells. The selected wells are populated by a user selecting a well from the source matrix by using matrix condition incrementing or decrementing keys 2809 located adjacent to a matrix number field 2810. Thereafter, clicking the copy command button 2812 causes the selected matrix condition to be copied into the highlighted wells. These actions are represented by steps 2914, 2916, 2918, 2920 and 2922 of FIG. 24. Alternatively, a user can copy the wells of the list box 2801 by positioning the cursor pointer over a source matrix condition, actuating the appropriate cursor control key and dragging the condition into one of the wells. In this case the well is not highlighted. Preferably, positioning a cursor pointer over a source matrix condition causes the components and solution properties of the condition to be displayed in a window (not shown). Also, preferably, when dragging a source matrix condition, the pointer displays an icon indicating that a condition is being copied from the source matrix into a well of the list box 2801. Preferably a user can clear a well of conditions by dragging the pointer over the well or wells to be cleared while actuating a predetermined key of the cursor control device. This action highlights the selected wells. Thereafter, the wells are cleared by the user clicking on a clear command button 2814. This action is represented in steps 2924, 2926 and 2928 in FIG. 29. Finally, preferably, hovering a cursor pointer over one of the template wells in the list box will cause the crystallant composition to be displayed.

A user can enter a dilution percent by entering a desired dilution percent in a dilution percent field box 2816. The dilution percent is entered via a keyboard after the dilution percent field box 2816 is selected. This action is represented by step 2930 in FIG. 29. Clicking on a dilute selection command button 2818 causes wells highlighted in the manner previously described to be diluted to the entered dilution percent. This action is represented by steps 2932, 2934, and 2936 in FIG. 29. Deselecting the wells temporarily enters or saves the deselected well crystallant composition.

If desired, a user may specify a 4× combinatorial type trial by clicking on a check box 2820 labeled 4× combinatorial. This action is represented by step 3000 in FIG. 30. Clicking on the 4× combinatorial check box causes grid lines that divide the wells of the list box into groups of four. Clicking on the 4× combinatorial checkbox also changes the copy all command button 2808 into a 4× combi copy command button. See step 3002 of FIG. 30. The operation of the 4× combi copy command button and setting up combinatorial type trials (blocks 3004 and 3006, FIG. 30) are described in detail in a later section.

Figure 31:
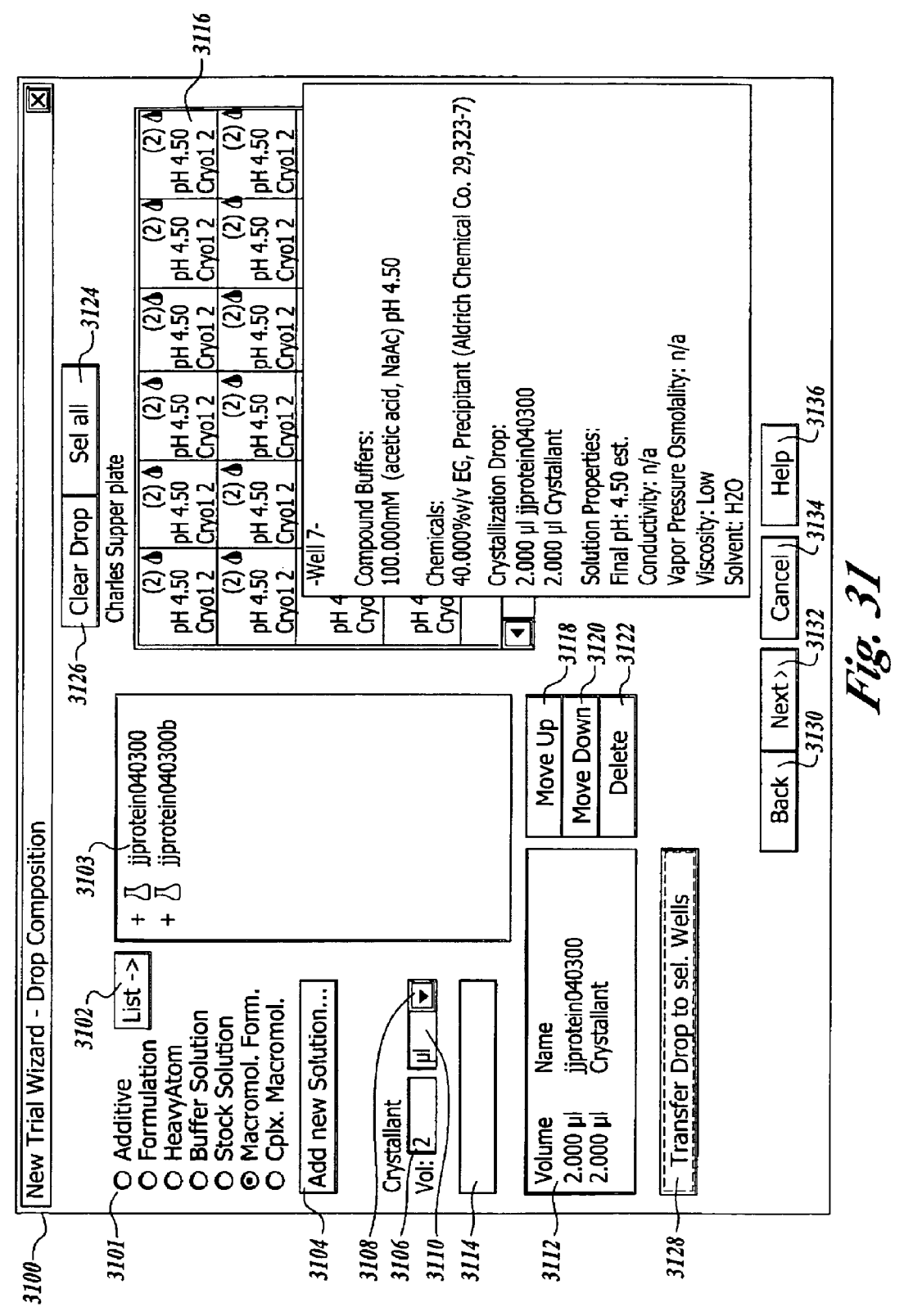

The copy wells builder dialog window (FIG. 28) also contains back, next, cancel, and help command buttons 2822, 2824, 2826 and 2828, respectively. As shown in FIG. 23, provided that all the wells are filled with a crystallant composition, when a user clicks on the next command button 2824 the program jumps to the complex drop composition builder whose dialog window is shown in FIG. 31. If all of the wells are not filled, an error message occurs that prompts the user to fill in all the wells. These functions are represented by steps 2328, 2330 and 2332 in FIG. 23. If while the user is in the copy wells window, the user clicks on the back command button 2822, the program cycles back to the complex attributes builder. See steps 2324 and 2326. If the user clicks on the cancel command button 2826, the trial is canceled and program cycles to the main manager (FIG. 2). Finally, if the user clicks on the help command button 2828, the help file is opened.

New Trial Manager: Complex Trial Builder: Complex Drop Composition Builder

Figure 32:
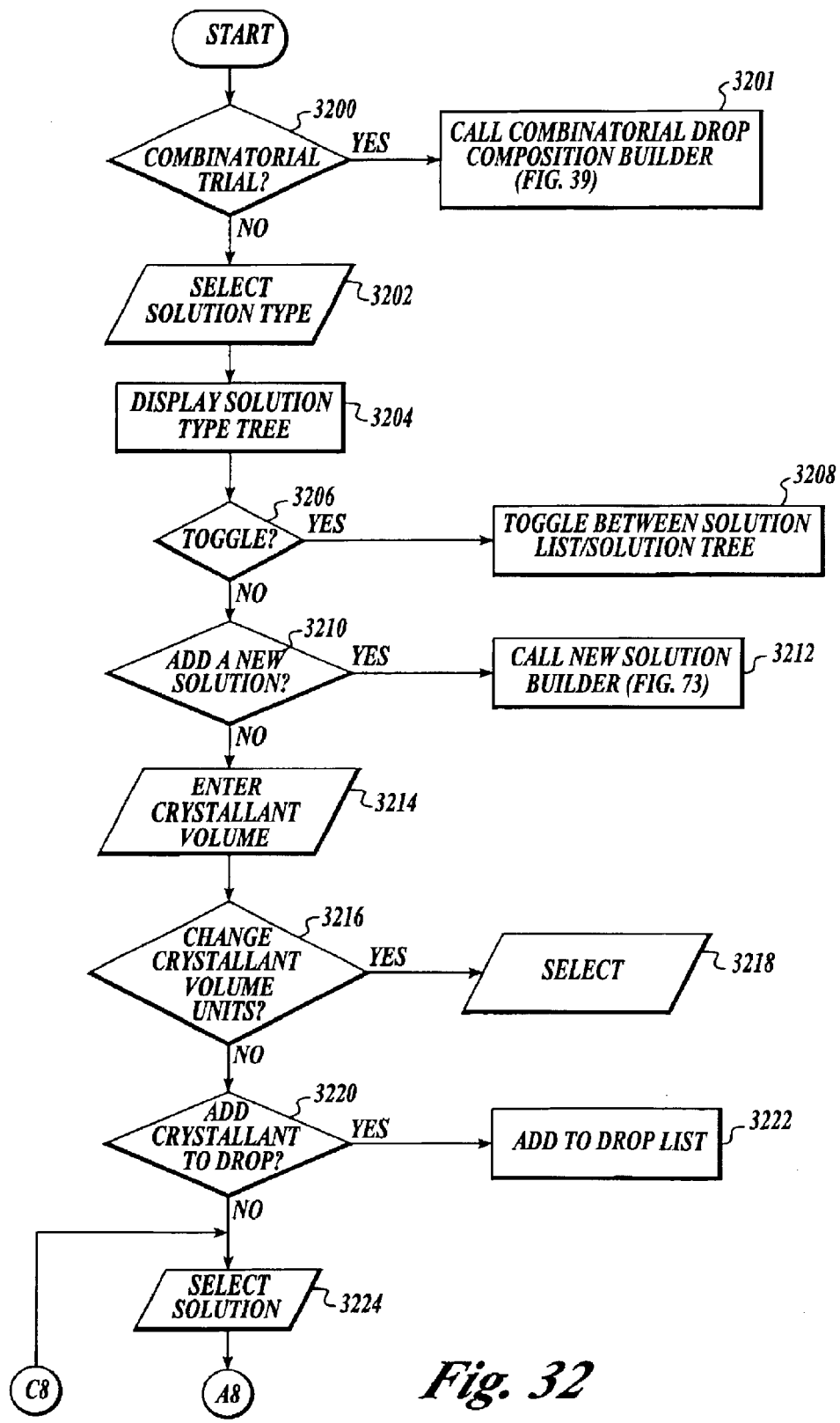
FIGS. 32–34 show a functional flow diagram for a complex drop composition builder according to the present invention.
Figure 33:
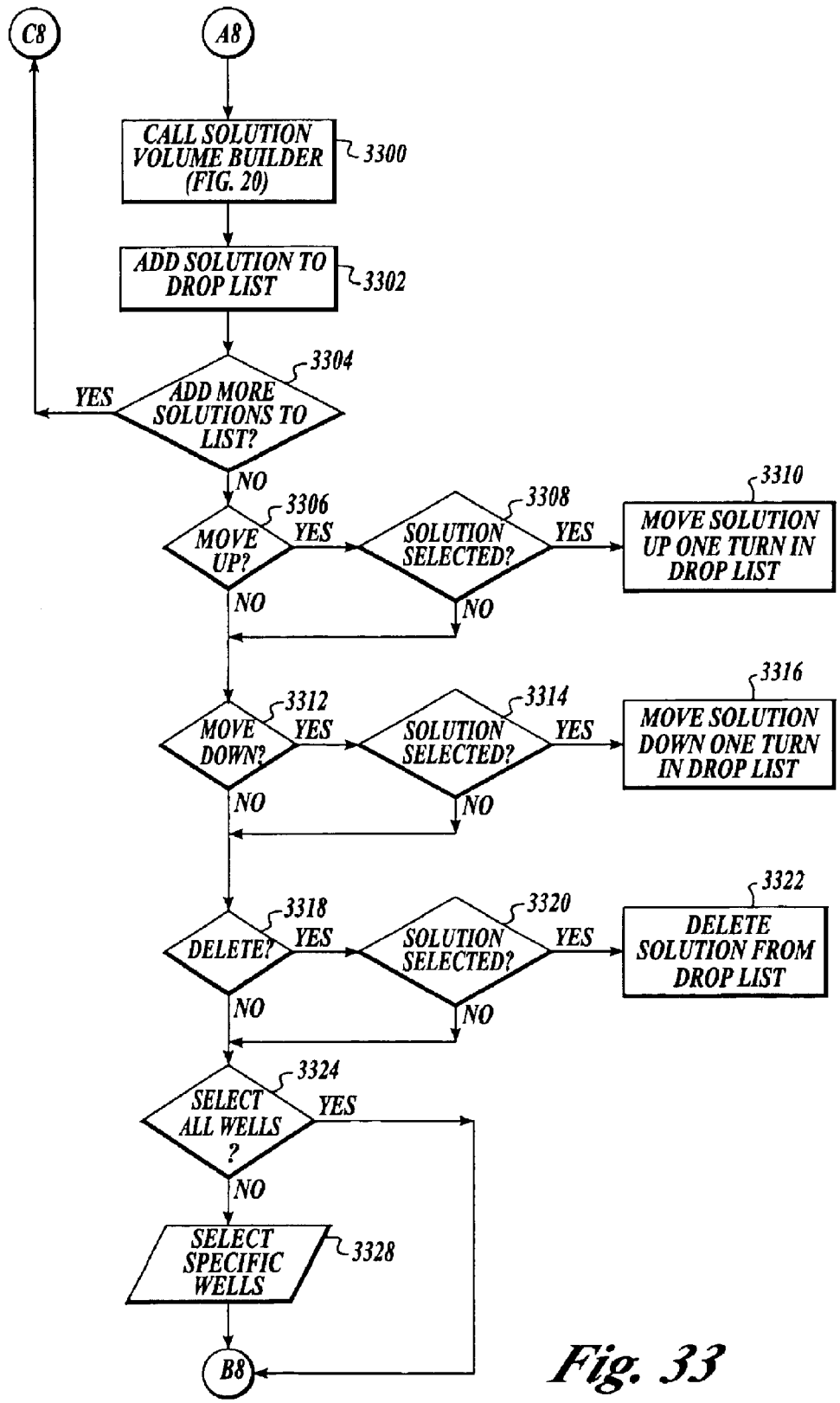
Figure 34:
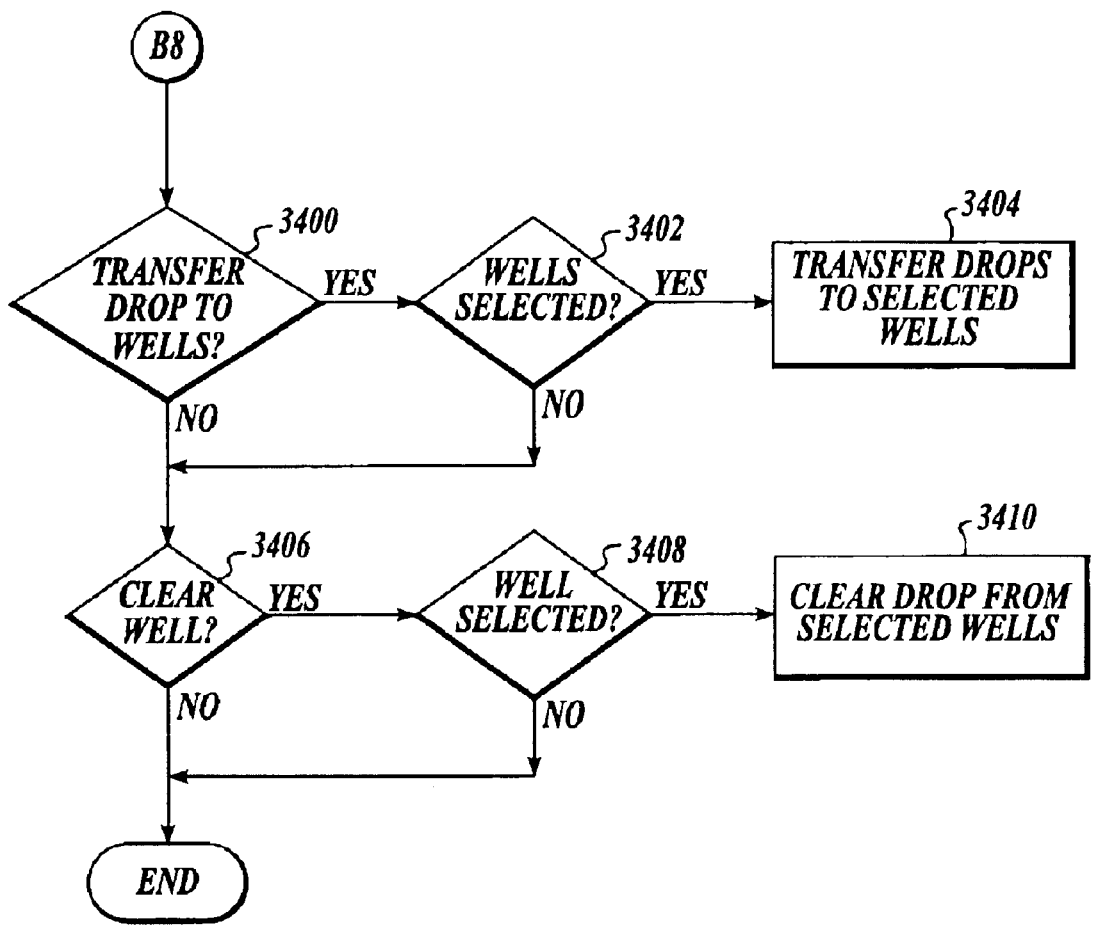
Figure 38:
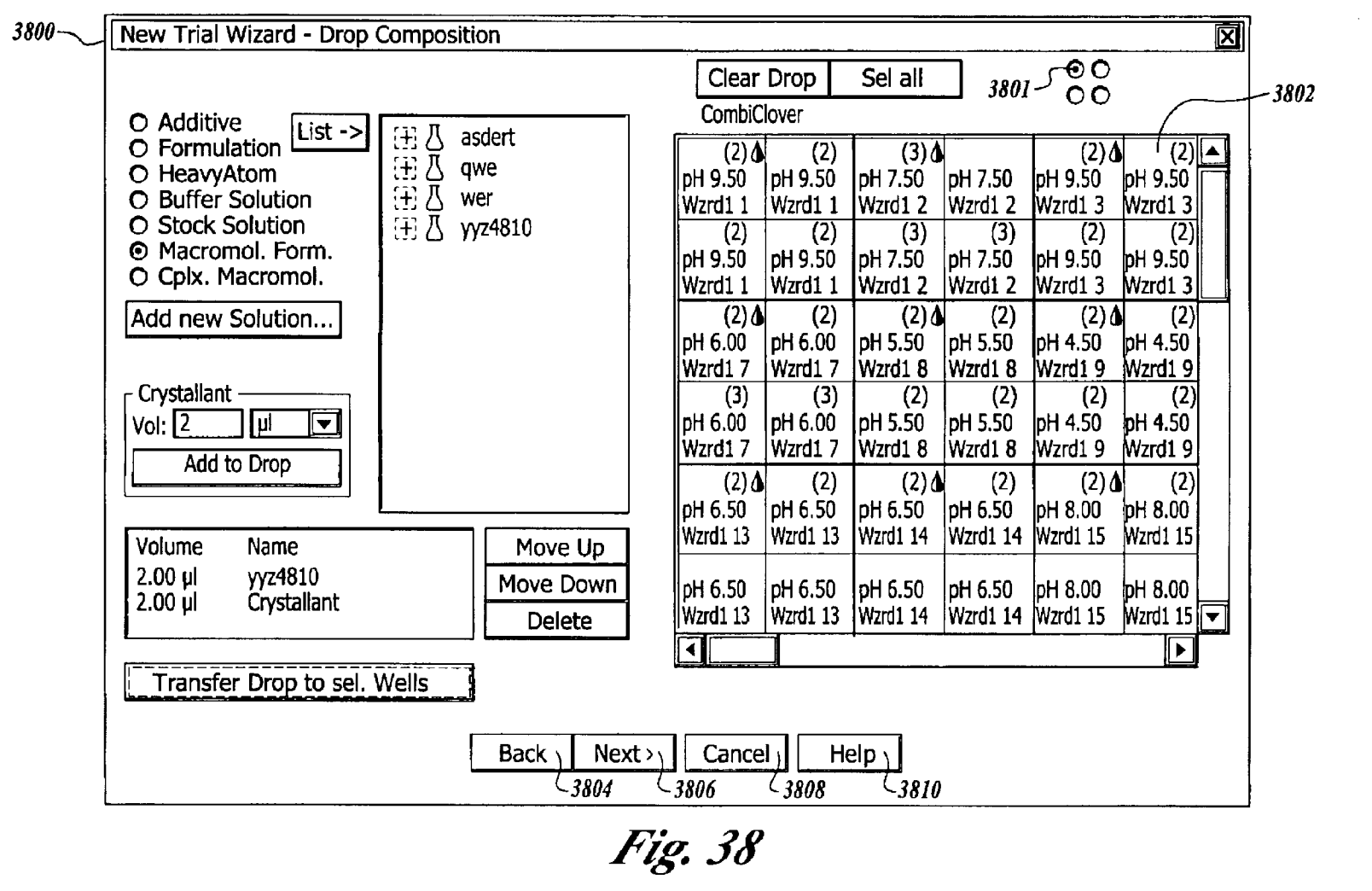
Figure 39:
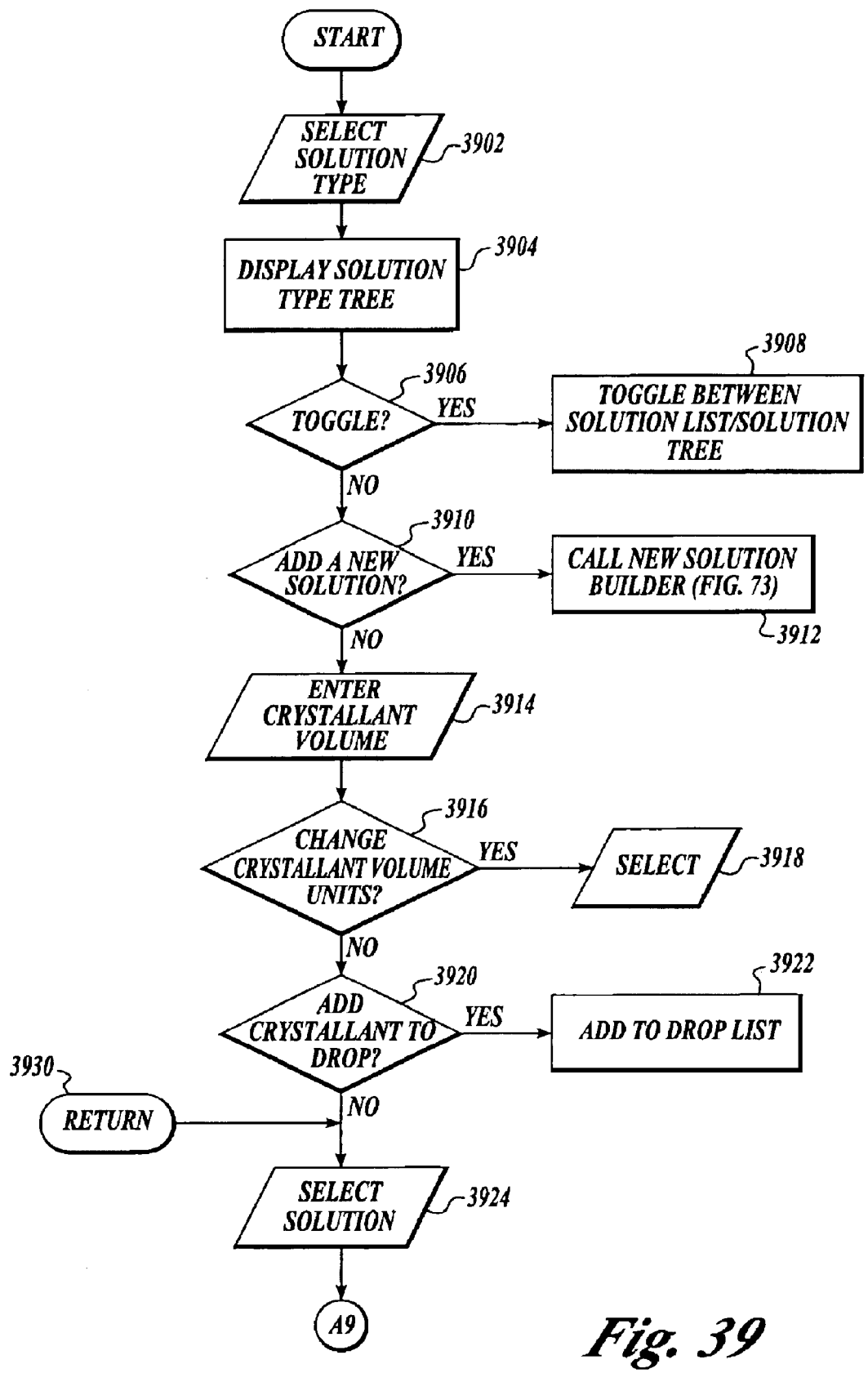
FIGS. 39–41 show a functional flow diagram for a combinatorial drop composition builder according to the present invention.
Figure 40:
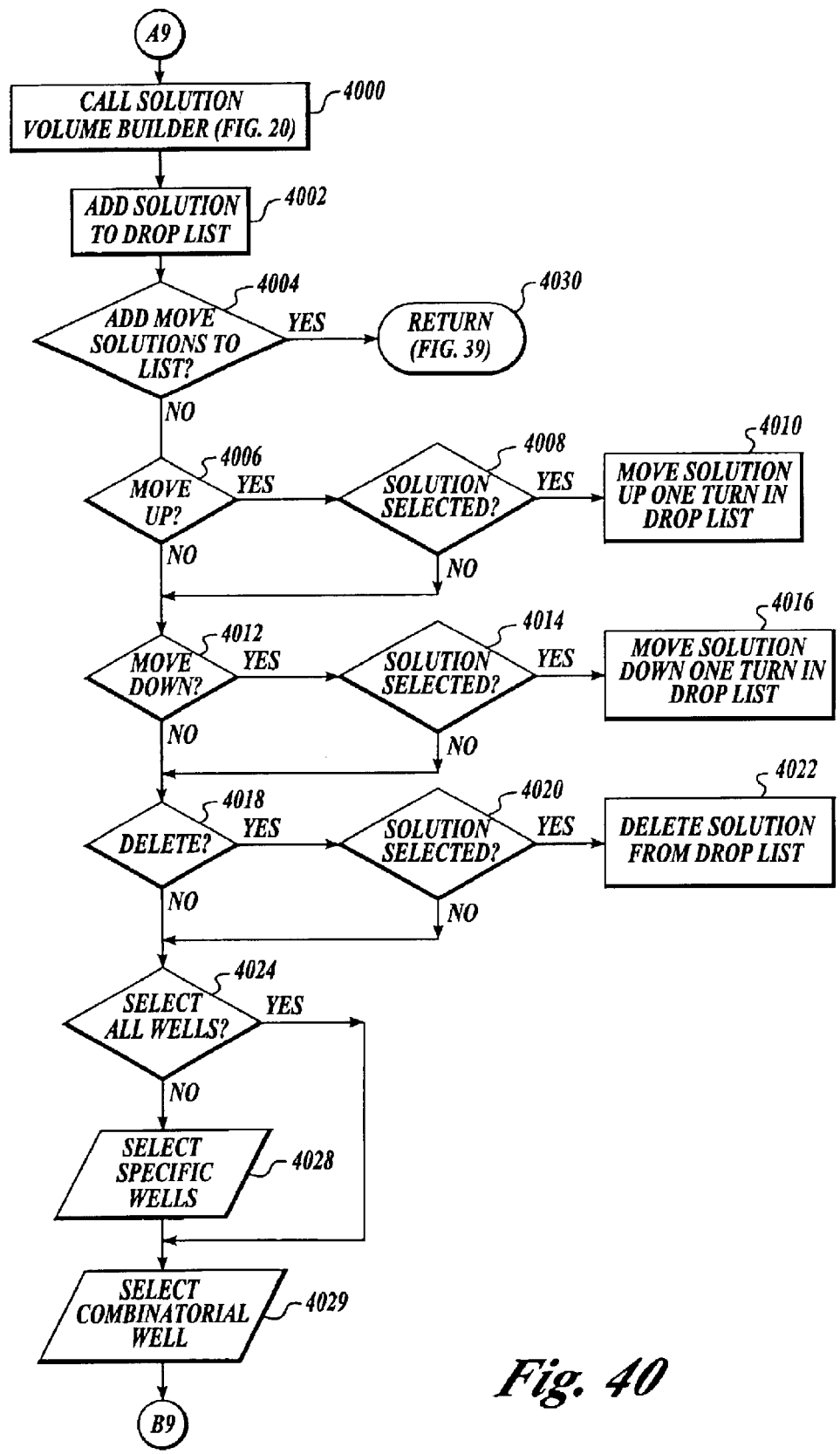
Figure 41:
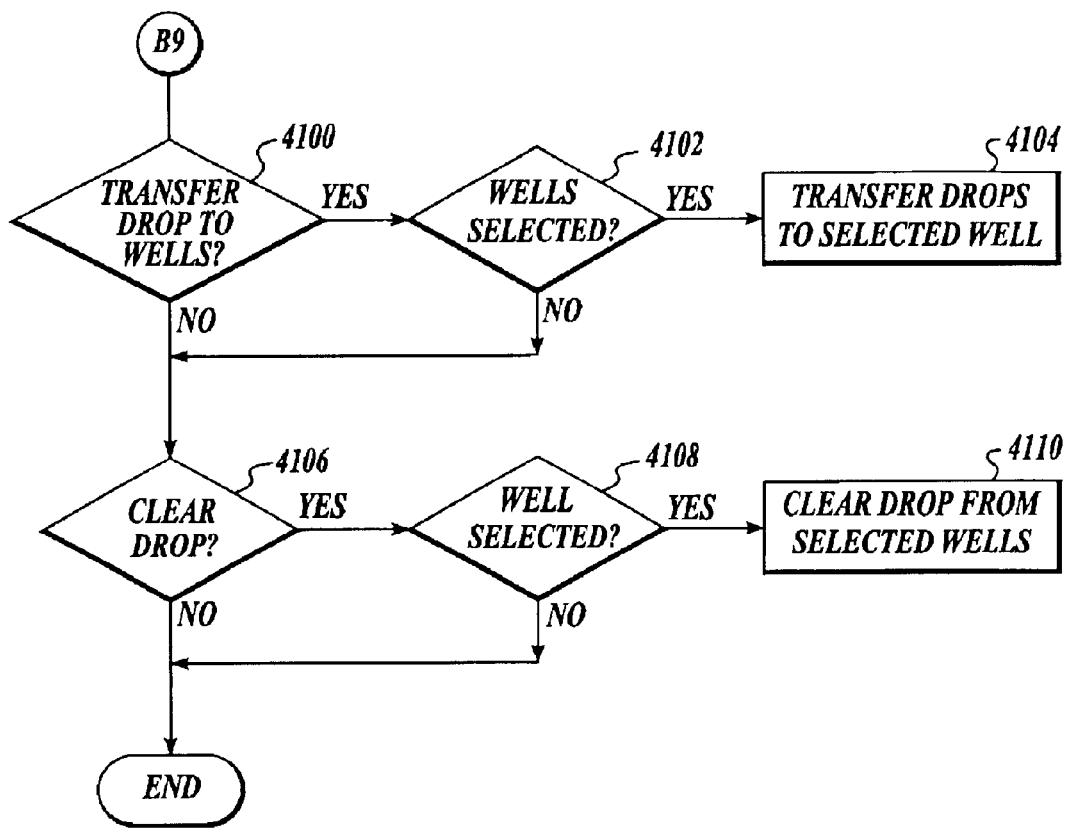

FIG. 31 illustrates a complex drop composition builder GUI or dialog window 3100 formed in accordance with the present invention. This dialog window is enabled when specified drop compositions are to be used in a complex trial. The drop composition builder dialog window 3100 shown in FIG. 31 functions much like the normal drop composition dialog builder window 1600 shown in FIG. 16. If the user had selected a combinatorial trial, a drop composition builder dialog window 3800 of the type shown in FIG. 38 would have opened. FIGS. 32–34 are functional flow diagrams illustrating the operation of the drop composition builder dialog window FIG. 31 blocks 3200 and 3201 in FIG. 32. Which drop composition builder is opened is determined by a user decision as shown by FIGS. 39–41 are functional flow diagrams illustrating the operation of the drop composition builder dialog window 3800 shown in FIG. 38.

Referring to FIG. 31, as in the normal trial setup, a user clicks on the appropriate radio button 3101 to select a drop composition of available solutions. See step 3202 of FIG.

32. Clicking on a radio button displays the available solutions in a list box 3103 located within the drop composition builder dialog window 3100. This action is represented by step 3204 in FIG. 32. A toggle command button 3102 can be used to display the solutions in either a tree format or a list format. This action is represented by step 3206 in FIG. 32. As with the normal trial setup, a user can add a new solution by clicking on an add new solution command button 3104. Using the new solution command button 3104, allows a user to add a new solution without leaving the new trial manager. This action is represented by steps 3210 and 3212 in FIG. 32. Users can enter a crystallant volume in the crystallant volume field box 3106, (see step 3214, FIG. 32) and change the volume units by clicking on a down arrow button 3108 located alongside a volume unit field box 3110 which displays a drop down list of available crystallant volume units (see steps 3216 and 328, FIG. 32) as in the normal trial set up. A user can add crystallant to the drop composition list box 3112 by clicking on an add crystallant command button 3114. See steps 3220 and step 3222 of FIG. 32. Displayed on the right side of the drop composition builder dialog window 3100 is an apparatus template list box 3116 showing all of the crystallant conditions by well number. Horizontal or vertical scrollbars having up, down, right and left arrow buttons appear if the apparatus template does not fit in the box. The user can enter other solutions besides the crystallant by selecting a solution from the list 3103. Selection is accomplished by the user using a cursor control device to move a pointer over the desired selection and actuating a key on the cursor control device. This action is represented by step 3224 in FIG. 32. Double clicking on a solution opens the solution volume builder. This action is represented by step 3300 of FIG. 33. Previously described FIG. 19 illustrates the dialog window and FIG. 20 illustrates the functional flow diagram. As described above, a user clicks the OK command button 1906, the solution and the solution volume are entered into the drop composition list 3112 (step 3302, FIG. 33). If a user clicks on the cancel command button 1908 the entry of the solution into the drop composition list box is canceled. A user may enter one or a plurality of solutions to the drop composition list box, as shown by step 3304 of FIG. 33.

As with the normal trial set up, a user can change the order of pipetting by selecting (i.e., highlighting) a solution from the drop composition list box 3112 and clicking on the move up 3118 or the move down 3120 command buttons, or the solution can be deleted by clicking on the delete command button 3122. Clicking on the move up command button 3118 moves the solution up one turn in the drop composition list box 3112. This action is represented by steps 3306, 3308, and 3310 of FIG. 33. Clicking on the move down command button 3120 moves the solution down one turn in the drop composition list box 3112. This action is represented by steps 3312, 3314, and 3316 of FIG. 33. Clicking on the delete command button 3122 deletes the solution from the drop composition list box entirely. This action is represented by steps 3318, 3320, and 3322 in FIG. 33.

A user also can select the wells into which the drop composition is to be entered. Unlike a normal trial, the drop composition solutions can vary among wells. There are several ways to highlight wells. A select all/unselect all command button 3124 can be toggled to select all the wells at once. See step 3324 of FIG. 33. The select all/unselect all command button 3126 toggles between select all and unselect all wells. If the unselect all state is toggled, a user can select specific wells by using a cursor control device to position a pointer over one well, clicking the appropriate key of a cursor control device and dragging to highlight the desired wells. This is step 3328 of FIG. 33. The user can then transfer the drop composition to the selected wells by clicking on a transfer drop command button 3128. These actions are represented by steps 3400, 3402, and 3404 in FIG. 34. A user may also clear wells of drop composition by clicking on a clear drop command button 3126. Provided wells have been selected in the manner described above, clicking on the clear drop command button clears the drop composition from the selected wells. This action is represented by steps 3406, 3408, and 3410 of FIG. 34. If desired, the user may be prompted to continue adding drop compositions into the newly cleared wells. After the drop transfer, hovering a mouse pointer over the wells in the complex matrix template list box 3116 will display the crystallant and drop compositions. A user may build a different drop composition having different solutions for a different well or any number of wells by selecting a new solution type and repeating the procedure. At any time a user can click on the back, next, cancel or help command buttons 3130, 3132, 3134 or 3136. If all wells have received a drop composition, as shown by steps 2406, 2408 and 2410 of FIG. 24, when a user clicks on the next command button 3132, a complex tray barcode builder is launched. If all the wells do not have a drop composition, an error message box is displayed that warns the user that some wells need a drop composition. Clicking on the back command button 3130 causes the program to cycle back to the copy wells builder, the dialog window of which is shown in FIG. 28. See steps 2402 and 2404 of FIG. 24. The user also can select to cancel the trial by clicking on the cancel command button 3134, which returns the program to FIG. 2. See steps 2414, 2416 and 2418. The user can get help by clicking on the help command button 3136, which opens the help file. See step 2420 and 2422.

New Trial Manager: Complex Trial: Complex Tray Barcode Builder

Figure 35:
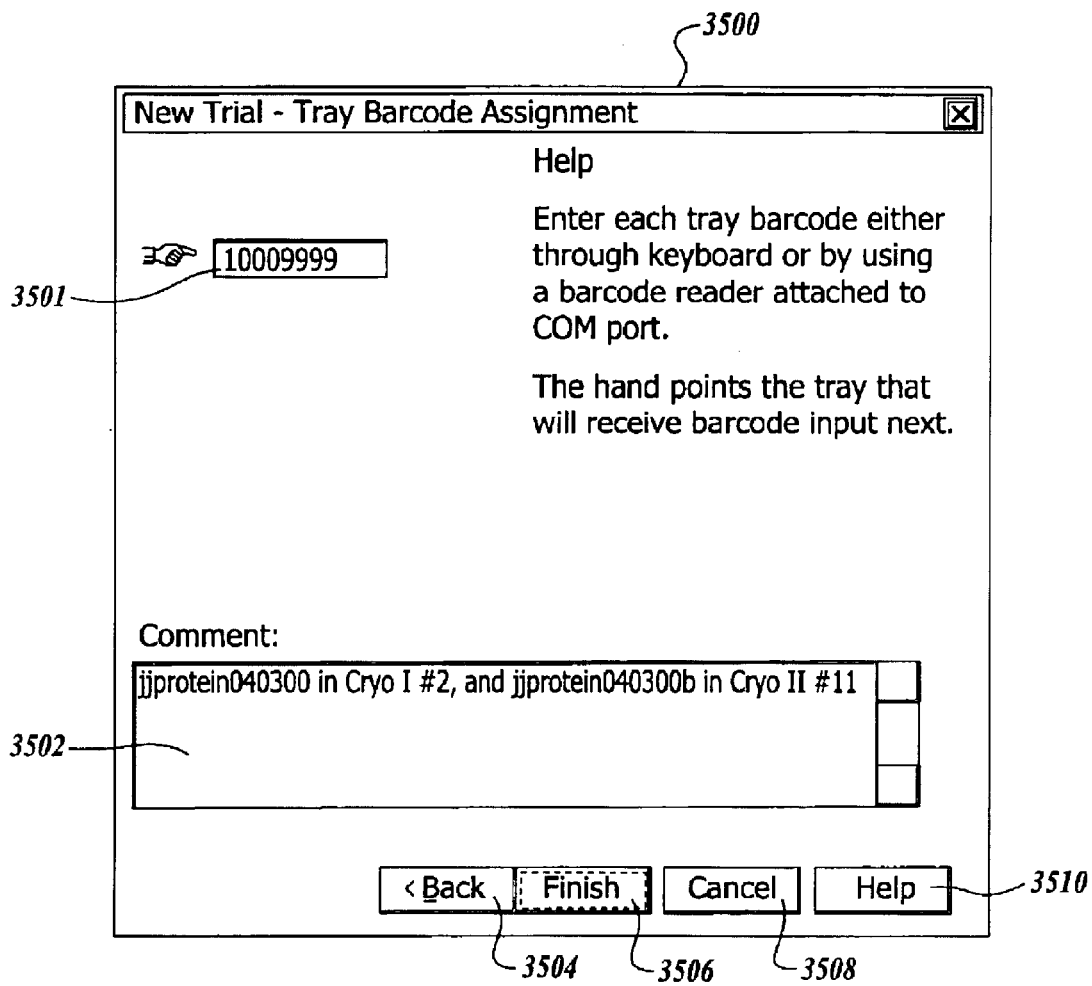
FIG. 35 shows a GUI for a complex tray barcode assignment builder according to the present invention.
Figure 36:
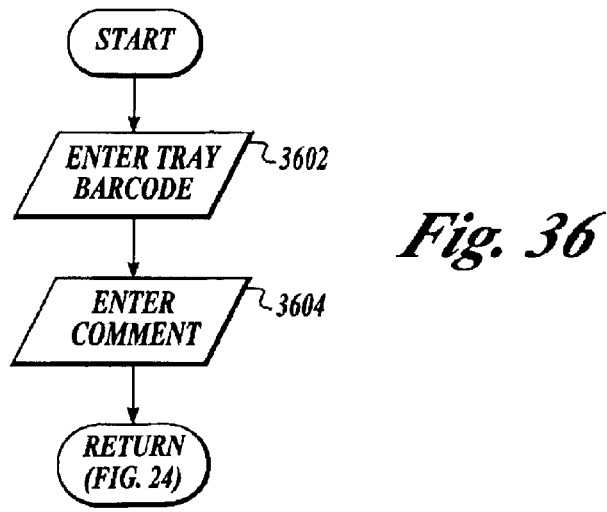
FIG. 36 shows a functional flow diagram for a complex tray barcode assignment builder according to the present invention.

FIG. 35 illustrates a complex tray barcode builder GUI or dialog window 3500 formed in accordance with the present invention. FIG. 36 is a functional flow diagram illustrating the operation of the complex tray barcode builder dialog window shown in FIG. 35. The tray barcode assignment dialog window of the complex trial builder, has only one barcode field 3501, since complex trials are limited to a single crystallization apparatus. In contrast, as noted above and shown in FIG. 21, the tray barcode builder dialog window for a normal trial may have multiple barcode fields. Entry of the single barcode is represented by step 3602 in FIG. 36. If desired, a user may enter a comment in a comment field box 3502 in the tray bar code builder dialog window 3500. See step 3604, FIG. 36. As with other dialog windows, the user also has the choice of clicking on a back command button 3504, a finish command button 3506, a cancel command button 3508 or a help command button 3510. Clicking on the finish command button 3506 results in the new complex trial being saved and the user returning to the main manager GUI (FIG. 2). See steps 2430, 2432 and 2434 of FIG. 24. If the back command button 3504 is clicked, the program cycles back to the complex drop composition builder. See steps 2426 and step 2428. Clicking the cancel command button 3508 causes the new trial to be canceled and the program to cycle back to the main manager GUI (FIG. 2). See step 2436, 2438, and 2440. Clicking the help command button 3510 opens the help files. See step 2444 of FIG. 24.

New Trial Manager: Complex Trial: Combinatorial Trial Builder: Combinatorial Copy Wells Builder FIG. 37 shows a copy well builder GUI or dialog window 3700 for the combinatorial trial builder formed in accordance with the present invention. Since the copy well builder dialog window 3700 shown in FIG. 37 for the combinatorial trial builder is substantially the same as the copy well builder dialog window 2800 for the complex trial builder a separate functional flow diagram is not provided. Rather, attention is directed to the functional flow diagram for the copy well builder shown in FIGS. 29 and 30. Further, only the differences between the copy well builder for the combinatorial trial builder and the copy well builder for the complex trial builder are discussed.

Referring now to the copy well builder dialog window of FIG. 37, as in a complex trial, a user can specify a matrix of crystallization conditions from several different existing matrices. In a combinatorial trial, as compared to a complex trial, four different crystallization drops are associated with each crystallization reservoir. A combinatorial crystallization trial is set up by selecting the complex radio button 804 in the new trial manager dialog window 900. The specify properties of the combinatorial trial are entered into a specify attributes dialog window similar to the specify attributes dialog window included in a complex trial. It is important that the correct crystallization apparatus be selected in setting up a combinatorial trial. For example, it is popular to set up four hanging crystallization drops on a single cover slip, and seal the cover slip over a well in a VDX plate. This effectively turns a 24 well VDX plate into a 96 well plate. If such a combinatorial crystallization trial is being set up employing an embodiment of the present invention, VDX plate 4× combi, and not VDX plate must be chosen from the list of crystallization apparatuses to capture the eight rows by twelve columns drop configuration of the trial. The setup in the combinatorial trial proceeds in much the same fashion as illustrated in FIG. 29 and described above for a complex trial, except for the fact that the 4× combinatorial checkbox 2820 of FIG. 28 can be specified in step 3000 of FIG. 30. When this occurs an identifier, such as heavy green lines, will appear on the list box 3701 that organize the template wells into quads containing four crystallization compartments each, as shown in FIG. 37. Each of the quads represents a single crystallant reservoir, while each of the four wells (quadrants) within a quad represents a separate crystallization drop. The well template can be populated with crystallization conditions by dragging and dropping crystallants from a selected source matrix to selected compartments in the apparatus template, as previously described with respect to complex trials. For combinatorial trials, dragging and dropping a crystallant into any of the four wells in a quad will populate all four wells. A quicker way to populate the wells of list box 3701 with crystallization conditions is to use the 4× combi copy command button 3704. This feature is useful for copying an entire sequential range of conditions from a source matrix 3708 into template wells 3702. First, a user enters the first condition number of the range of conditions from the source matrix to be copied in the copy field 3706. The user then clicks on the 4× combi copy command button 3704. This is represented by steps 3004 and 3006 in FIG. 30. This action transfers the first condition in the specified range in the source matrix to the first quad in the plate template. Subsequent conditions in the source matrix can be sequentially transferred in the same way to the quads in the plate template, until all quads in the plate template are populated with crystallization conditions. After all crystallization conditions have been entered, as previously described when a user clicks on the next command button 3712, the program cycles to a complex drop composition builder, the dialog window of which is shown in FIG. 38 and the functional flow diagram of which is shown in FIGS. 39 through 41.

New Trial Manager: Complex Trial: Combinatorial Trial Builder: Drop Composition Builder Since the drop composition builder for the combinatorial trial builder is substantially the same as the drop composition builder for the complex trial builder, the drop composition builder for the combinatorial trial builder will not be described in detail. As noted above, a drop composition builder for a combinatorial trial builder formed in accordance with the invention is shown in FIG. 38. A functional flow diagram of a drop composition builder for a combinatorial trial builder formed in accordance with the invention is shown in FIGS. 39–41. The only differences between FIGS. 32–34 and FIGS. 39–41 is the elimination of the initial test sequence (steps 3200 and 3201, FIG. 32) and a few minor additions discussed below. The reference numbers and functions are identical except that the reference numbers shown in FIGS. 39–41 are raised by 700 with respect to the related reference numbers shown in FIGS. 32–34.

As noted above, FIG. 38 is a dialog window and is similar to FIG. 31 except that it is for a combinatorial trial. The main difference is that, when selecting trial wells for receiving drop compositions, a user has the option of selecting combi copy radio buttons 3801 located above the trial well list box 3802. This difference is shown by step 4028 in FIG. 40. The radio buttons are grouped in a quad form. Clicking on one of the radio buttons highlights a corresponding well of a quad in the list box 3802. For example, clicking on the upper most left-hand one of the four radio buttons highlights the upper left well in a quad. As with a complex trial, when a user clicks on a next command button 3806, after entering the drop composition for all of the template wells, the setup for the combinatorial trial is finished in the same way as a complex trial. See steps 2406, 2408 and 2410 of FIG. 24. More specifically, clicking on the next command button 3806 cycles the program to a complex tray barcode builder and causes a tray barcode dialog window (FIG. 35) to open. Again only one barcode is necessary for a complex, albeit, combinatorial trial. As with the normal or complex trials, the user may enter the barcode number assignment with a barcode scanner. If desired, the user can enter a comment in the comment field 3502. After the tray barcode and any comment are entered, a user may click on the finish command button 3506 of FIG. 35, to save the combinatorial type trial and return to the main dialog window of FIG. 2. Or, the user may click the cancel command button 3508 which cancels the combinatorial trial and returns the user to FIG. 2. Alternatively, the user may click on the back command button 3504 and be taken back to the drop composition builder or the user may click on the help command button 3510, which cause the help files to open.

Existing Trial Manager

As noted above, the main manager GUI (FIG. 2) also allows a user to open an existing trial. This is accomplished by the user clicking on the open existing trial manager command button 210. This is step 210a of FIG. 3.

Figure 42:
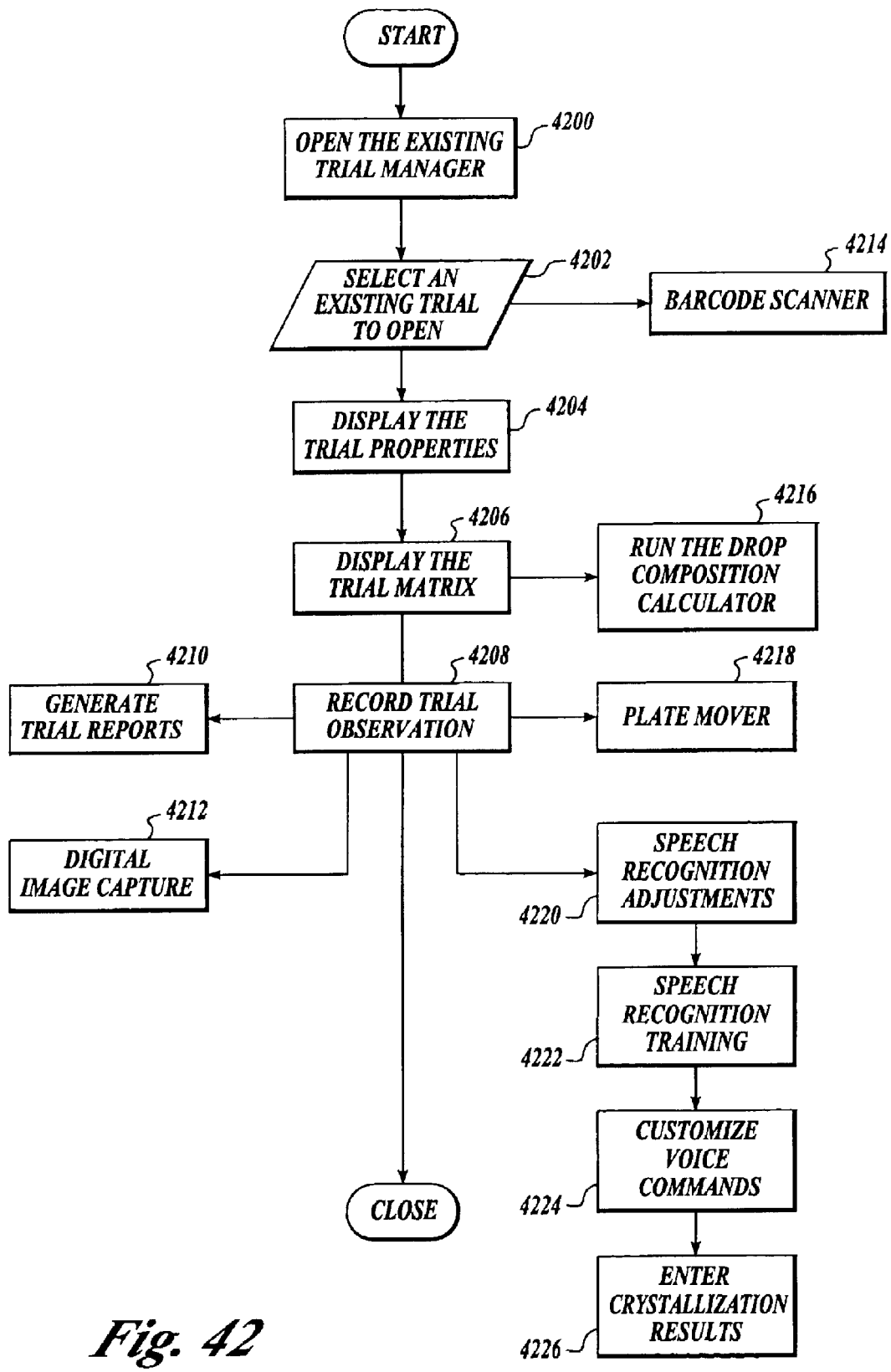
FIG. 42 shows a generic functional flow diagram for an existing trial manager according to the present invention.

FIG. 42 is a simplified flow diagram representing the sequence of executable steps performed by a preferred embodiment of the present invention when the existing trial manager command button 210 is actuated. The first step the program executes is the opening of the existing trial manager, step 4200. The user selects a trial to open in step

4202. The user can open a trial by reading a barcode sticker in step 4214, for example. The manager includes three options: display trial properties 4204, display trial matrix 4206, or record trial observation data 4208. In this regard, the existing trial manager is used to record and review crystallization trial results. When the record trial observation step 4208 is selected, certain tools become available to the user, such as: a trial report generator, step 4210; a digital camera tool that is used to set the digital camera 104 so that the camera can capture digital images of the results 4212; a connect to a barcode scanner tool 4214; a connect to a plate mover tool 4218; or a configure speech recognition tool to enter crystallization results tools 4220 through 4226. As will be understood from the following description, speech recognition is combined with an optional automated plate mover to provide completely hands free crystallization trial observations recording. Preferably, the existing trial manager GUI includes a listing of all the trials accessible to the user. An example of an existing trial manager GUI or dialog window 4300 formed in accordance with the present invention is illustrated in FIG. 43.

Figure 43:
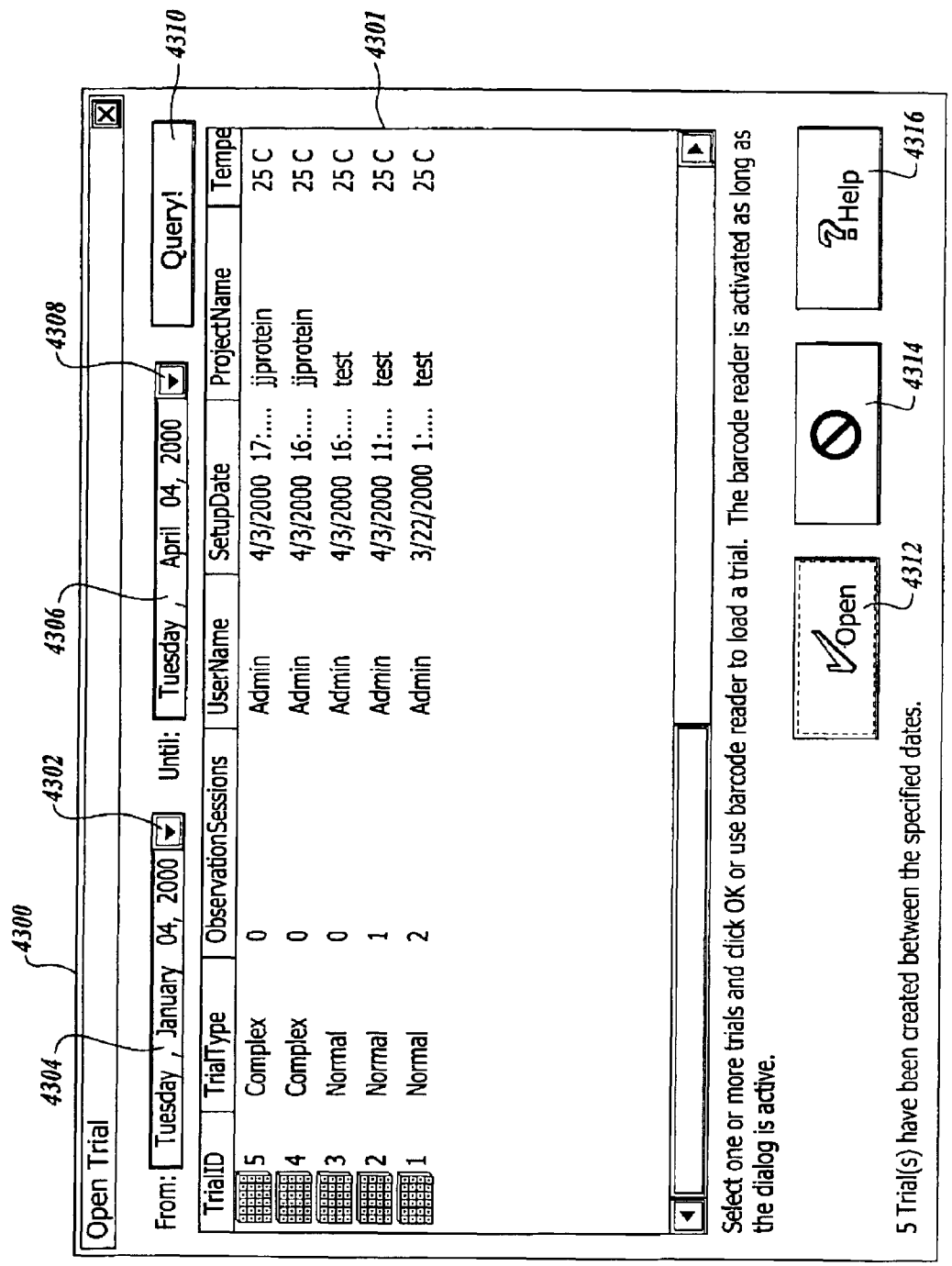
FIG. 43 shows a GUI of an existing trial manager according to the present invention.

The existing trial manager dialog window 4300 shown in FIG. 43 includes a list box 4301 containing trial attributes such as trial ID, trial type, number of observation sessions, user name, setup date, project name, temperature, comments, and collaborator.

Figure 44:
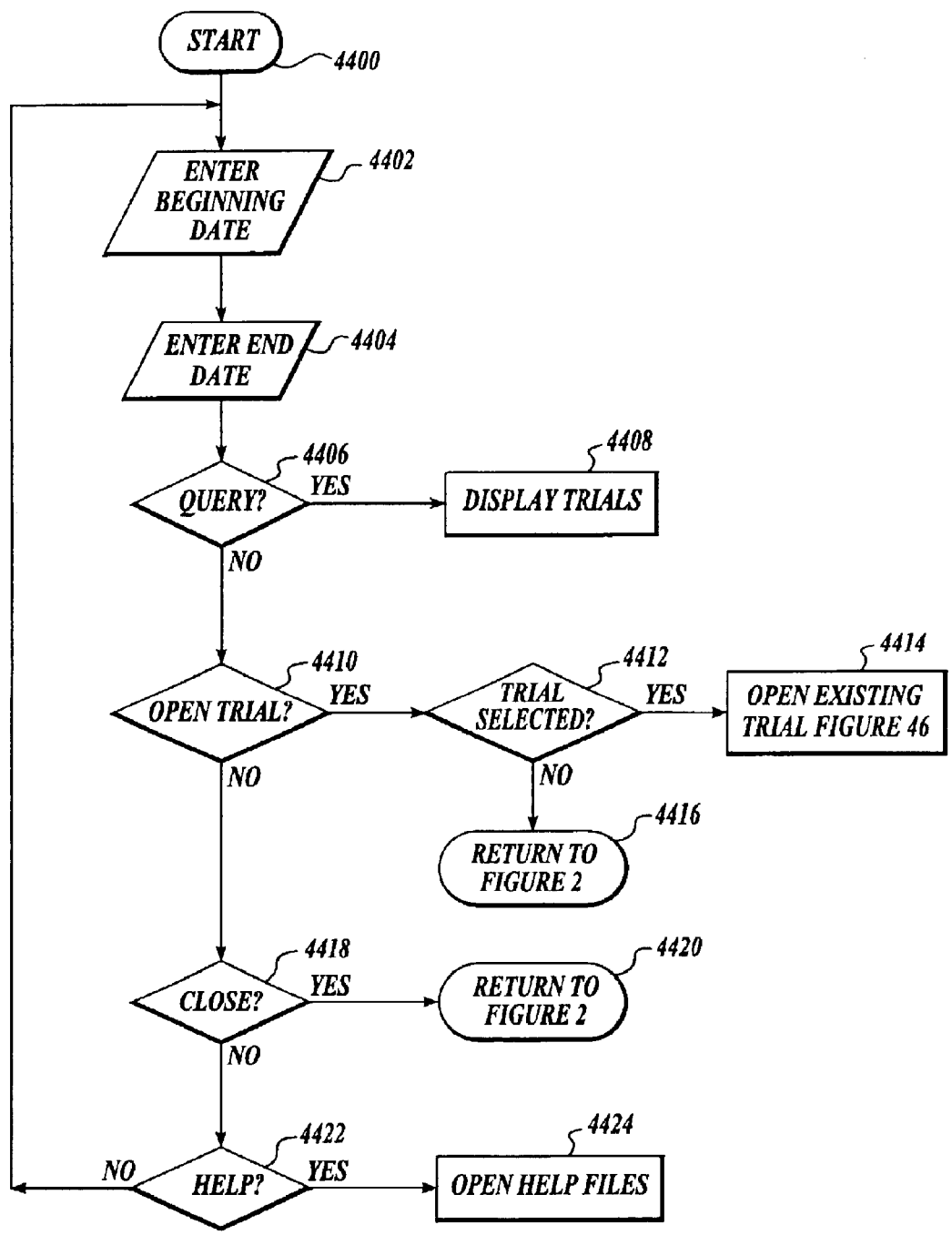
FIG. 44 shows a functional flow diagram for an existing trial manager according to the present invention.

FIG. 44 is a functional flow diagram illustrating a sequence of executable steps performed by the program for carrying out the functions of the existing trial manager dialog window shown in FIG. 43. After the existing trial manager is opened or launched, step 4400, a user can select an existing trial to open. This is accomplished by using a cursor control device for highlighting the desired trial and clicking, i.e., activating a key on the cursor control device. Alternatively, the user can use the barcode scanner 102, to read barcode stickers and pull up the trial data. As described more fully below, after opening a trial, the user has the choice of viewing the trial properties, viewing the trial matrix or recording a new trial observation session. When viewing a trial matrix, the user is able to operate a drop composition calculator, which is described in detail below. If the record new trial observation session is chosen, the user is able to generate trial reports, use a digital camera to capture digital images of the crystallization results, enable a plate mover to facilitate the movement of the plate apparatus, enable speech recognition, speech recognition training or customize voice commands.

If no existing trials appear in the list box 4301, the user is prompted to enter a beginning date in a from field box 4304 by clicking on a down arrow button 4302, which opens a calendar. See step 4402 of FIG. 44. In a conventional manner, the user can scroll through the calendar to select a beginning date for the existing trial search. After entering a date, the calendar closes and the user is next prompted to enter an ending date in an until field box 4306. Clicking on a down arrow button 4308 alongside the until field box 4306 opens a calendar which the user can scroll through and select an end date for the existing trial search request. Clicking on a date enters the date into the until field box 4306 and closes the calendar, see step 4404 of FIG. 46. The user is next prompted to click on the query command button 4310 (step 4406, FIG. 44). Clicking on the query command button 4310 displays the trials which were created between the beginning date and the end date entered by the user. See step 4408 of FIG. 44. The user is next prompted to open a trial by highlighting an existing trial in the trial list box 4300 and either double clicking on the trial or clicking on an open command button 4312 (step 4410, FIG. 44). If a trial is selected, the dialog window of FIG. 45 will open. Alternatively, the barcode of one of the crystallization apparatuses in the trial can be scanned to open up the trial. All of the information pertaining to the crystallization trial is contained in three tabs, trial properties, trial matrix, and trial observation recording, as illustrated schematically in FIG. 46. Briefly referring to FIG. 46, the trial properties tab is illustrated in more detail in FIG. 47, the trial matrix tab is illustrated in more detail in FIG. 52, and the trial observation recording tab is illustrated in more detail in FIG. 55.

Returning to FIGS. 43 and 44, a user has the choice of closing the existing trial manager by clicking on a close command button 4314. Doing so returns the user to the main menu GUI (FIG. 2). See steps 4418 and 4420 of FIG. 44. A user may also choose to click a help command button 4316, which opens the help file. See steps 4422 and 4424 of FIG. 44.

The existing trial manager cycles through the above described steps until user input is received.

Existing Trial Manager: Trial Properties Tab

Figure 45:
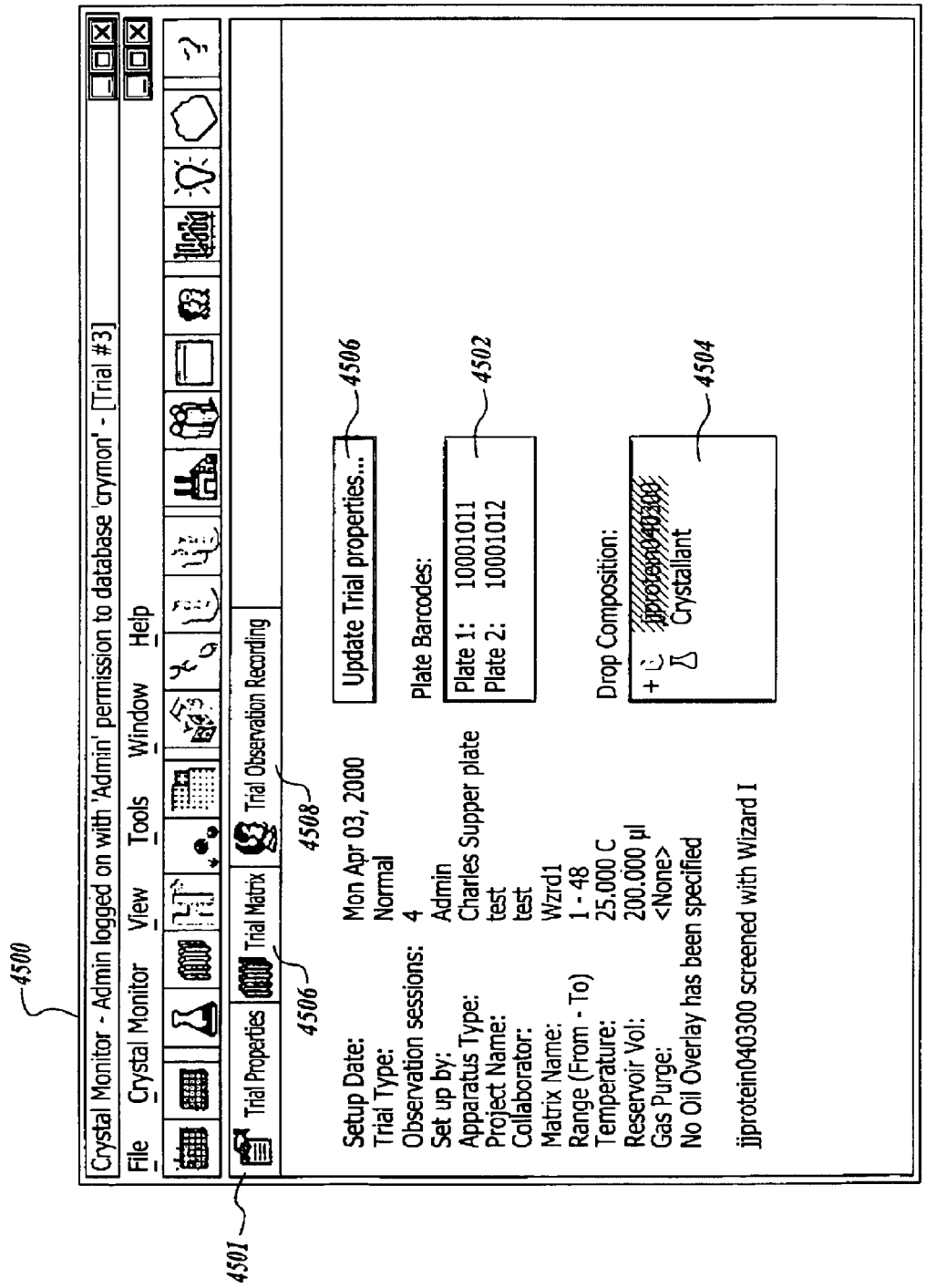
FIG. 45 shows a GUI for a display trial properties tab according to the present invention.
Figure 46:
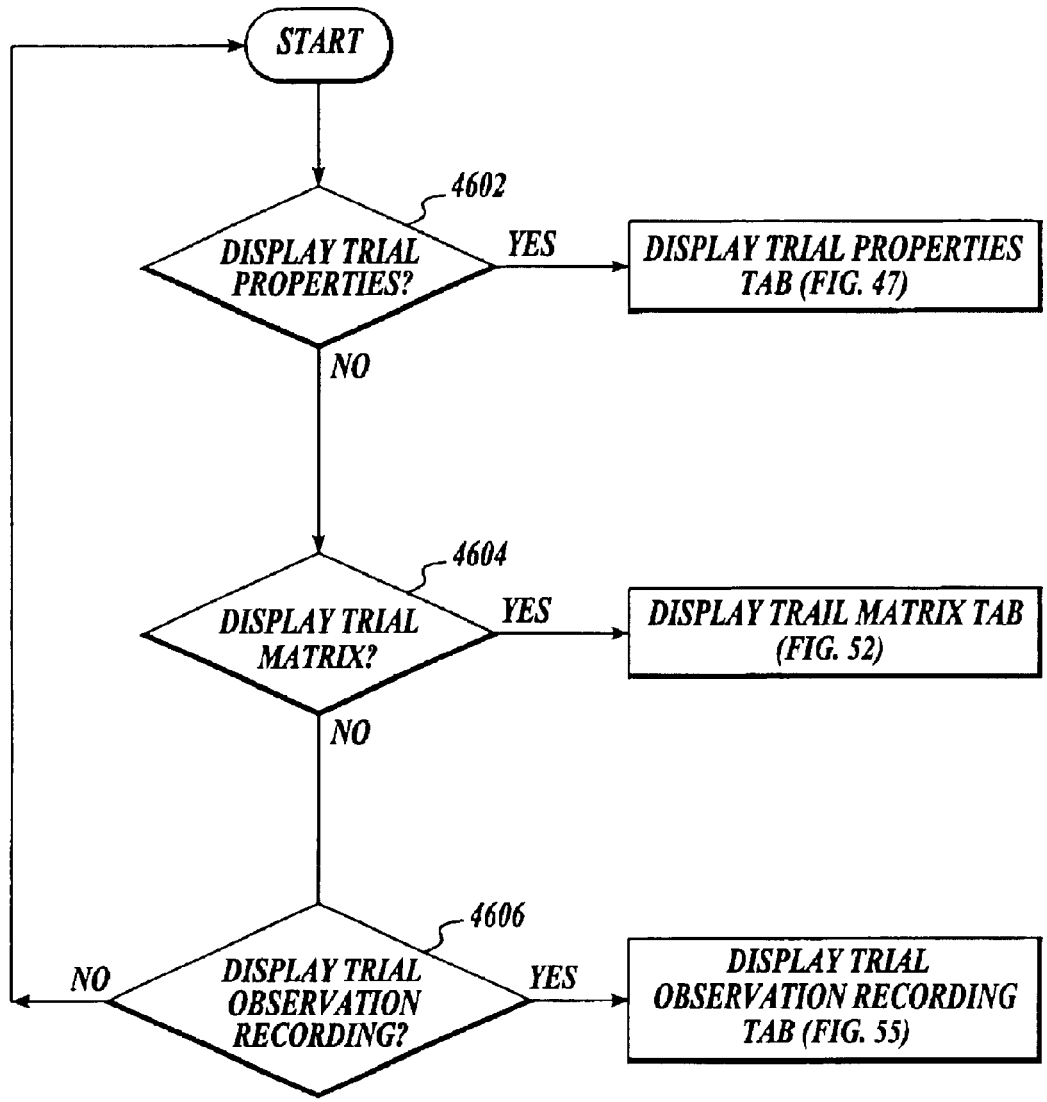
FIG. 46 shows a functional flow diagram for an existing trial manager according to the present invention.
Figure 47:
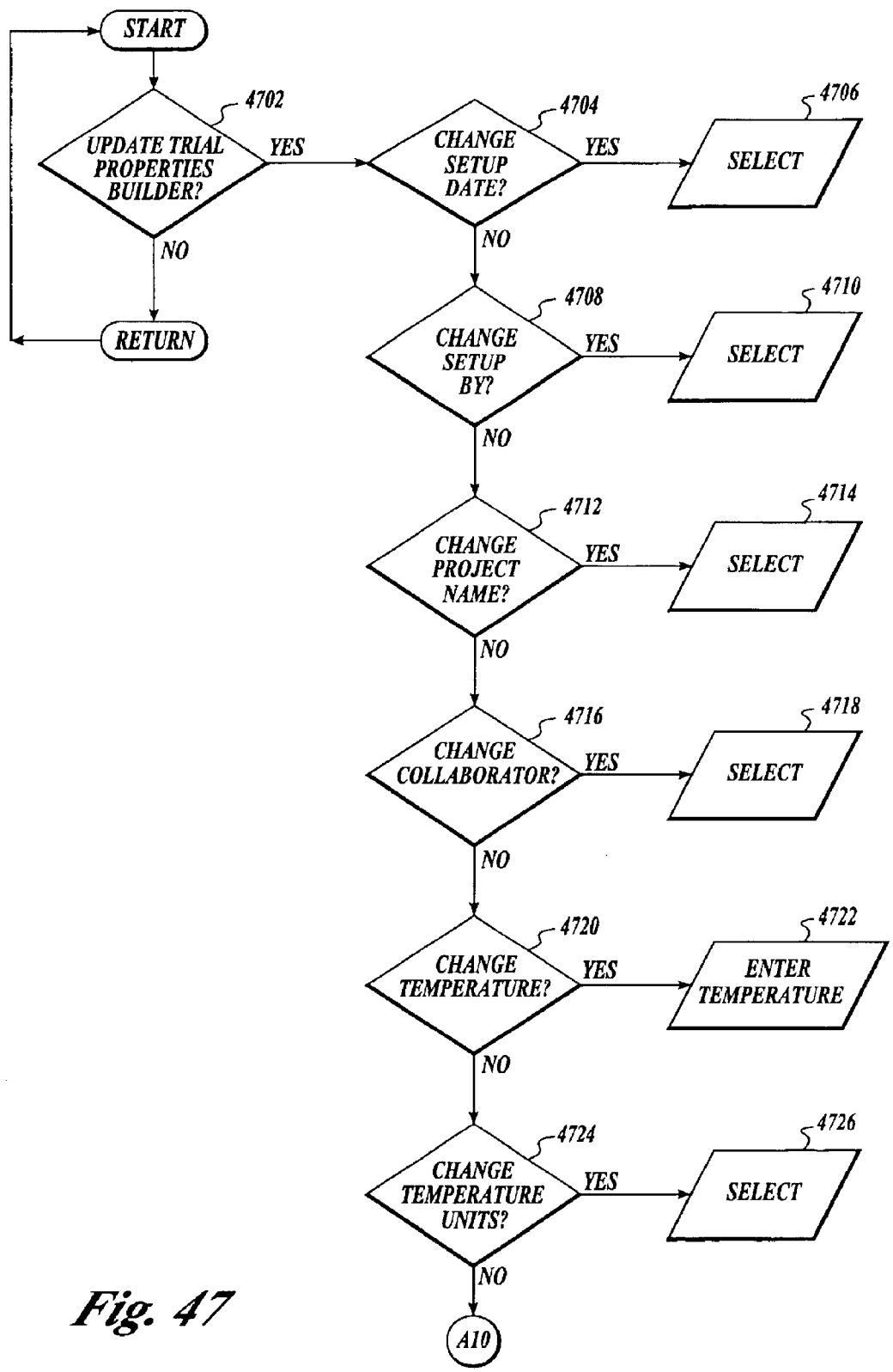
FIGS. 47–49 show a functional flow diagram for an update trial properties builder according to the present invention.

FIG. 45 illustrates a trial properties GUI or dialog window 4500 formed in accordance with the present invention. The trial properties dialog window 4500 shown in FIG. 45 has three tabs—a trial properties tab 4501, a trial matrix tab 4506 and a trial observation recording tab 4508. FIG. 46 shows the executable steps 4602, 4604 and 4606 that are sequenced through when determining which of the tabs to display.

As shown in FIG. 45, when the trial properties tab is selected, the global properties of the trial, including the set-up date, the trial type, the observation sessions, the set-up by, the apparatus type, the project name, the collaborator name, the matrix name, the range of wells, the temperature, the reservoir volume, the gas purge, and whether or not an oil overlay has been specified are displayed. The trial properties dialog window also includes: a list box 4502 that lists any barcodes associated with each of the crystallization apparatuses, and a drop composition list box 4504 that lists the solutions used in the crystallization drops. Preferably, the drop compositions on the list can be expanded to a tree display. Also, preferably using a cursor control device to move a pointer over the drop compositions displays the properties thereof and double clicking on a solution opens a dialog window that allows a user to enter and change solution properties. The trial properties tab includes a command button 4506 that allows a user to update the trial properties without leaving the existing trial manager.

Existing Trial Manager: Trial Properties Tab: Update Trial Properties Builder

Referring to FIG. 45, if a user wishes to update the trial properties, the user clicks on the update trial properties command button 4506, and a new dialog window (not shown) is opened. See step 4702 of FIG. 47. The new dialog window includes a plurality of field boxes that contain the information previously entered for the existing trial. If desired, the user can change the set-up date. See step 4704. The set-up date is changed by clicking on a down arrow button adjacent to the set-up date field which causes a calendar to be displayed. The user selects a set-up date by clicking on a calendar date. Clicking enters the calendar date into the set-up date field box and closes the calendar. See step 4706. Next, if desired, the user can change the user who set up the data by clicking on a down arrow button located alongside a set-up by field box. Clicking on the down arrow button opens a drop-down list of all of the users in a database. Moving a pointer over a choice and clicking on a user enters the user into the set-up by field box and closes the list, steps 4708 and 4710. Next, if desired, the user can change the project name. The project name is changed by clicking on a down arrow button located alongside a project name field box. Clicking on the down arrow button opens a drop-down list of all the projects in the database. Moving the pointer over a choice and clicking on a project enters the project name into the project name field box and closes the drop-down list, steps 4712 and 4714. If desired, the user also can change the collaborator name. The collaborator's name is changed by clicking on a down arrow button located alongside a collaborator field box, which opens a drop-down list of all the collaborators in the database. Moving the pointer over a choice and clicking on a collaborator enters the collaborator name into the collaborator name field box and closes the drop-down list, steps 4716 and 4718.

Also, if desired, the user can change the temperature. The temperature is changed by selecting the temperature field and entering a new temperature in the temperature field box using a keyboard or other data entry device, steps 4720 and 4722. The user may also change the temperature units. Temperature units are changed by clicking on a down arrow button located alongside the temperature unit field box which opens a drop-down list of available units. Moving the pointer over a choice and clicking on a unit enters the unit into the field box and closes the drop-down list, steps 4724 and 4726.

Figure 48:
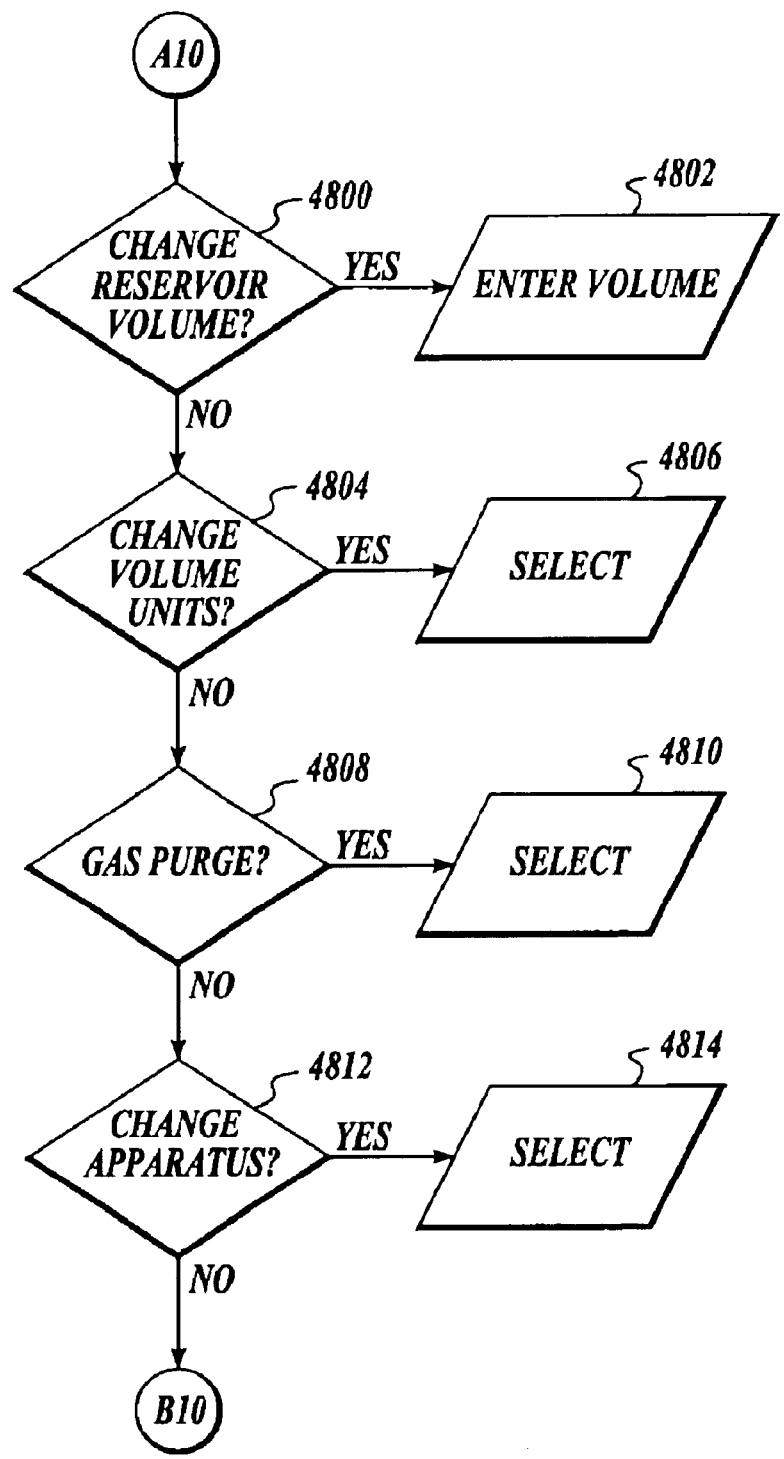

Referring now to FIG. 48, the user can also enter or change a reservoir volume by entering the new value into the reservoir volume field box, steps 4800 and 4802. This change is created by selecting the reservoir volume field box and entering a value using a keyboard or other data input device. The user can change volume units by clicking on a down arrow button located alongside a volume units field box, which opens a drop-down list of available volume units. Moving the pointer over a choice and clicking on a unit enters the unit into the volume field box and closes the drop-down list, steps 4804 and 4806. The user can either add a gas purge or enter no gas purge by the use of a pair of radio buttons. Clicking on the no gas purge radio button disables a gas purge field box and associated drop-down list. Clicking on the radio button alongside the gas purge field box enables the user to click on the down arrow button located alongside the gas purge field box which opens a drop-down list of available purge gases. Moving the pointer over a choice and clicking on a purge gas enters the purge gas into the field box and closes the drop-down list, steps 4808 and 4810. Preferably, the software comes preloaded with a list of available purge gases.

If desired, a user can change the apparatus by clicking on a down arrow button located alongside an apparatus field box, which opens a drop-down list of the apparatuses in a database. Moving the pointer over a choice and clicking on an apparatus enters the apparatus into the field box and closes the drop-down list, steps 4812 and 4814.

Figure 49:
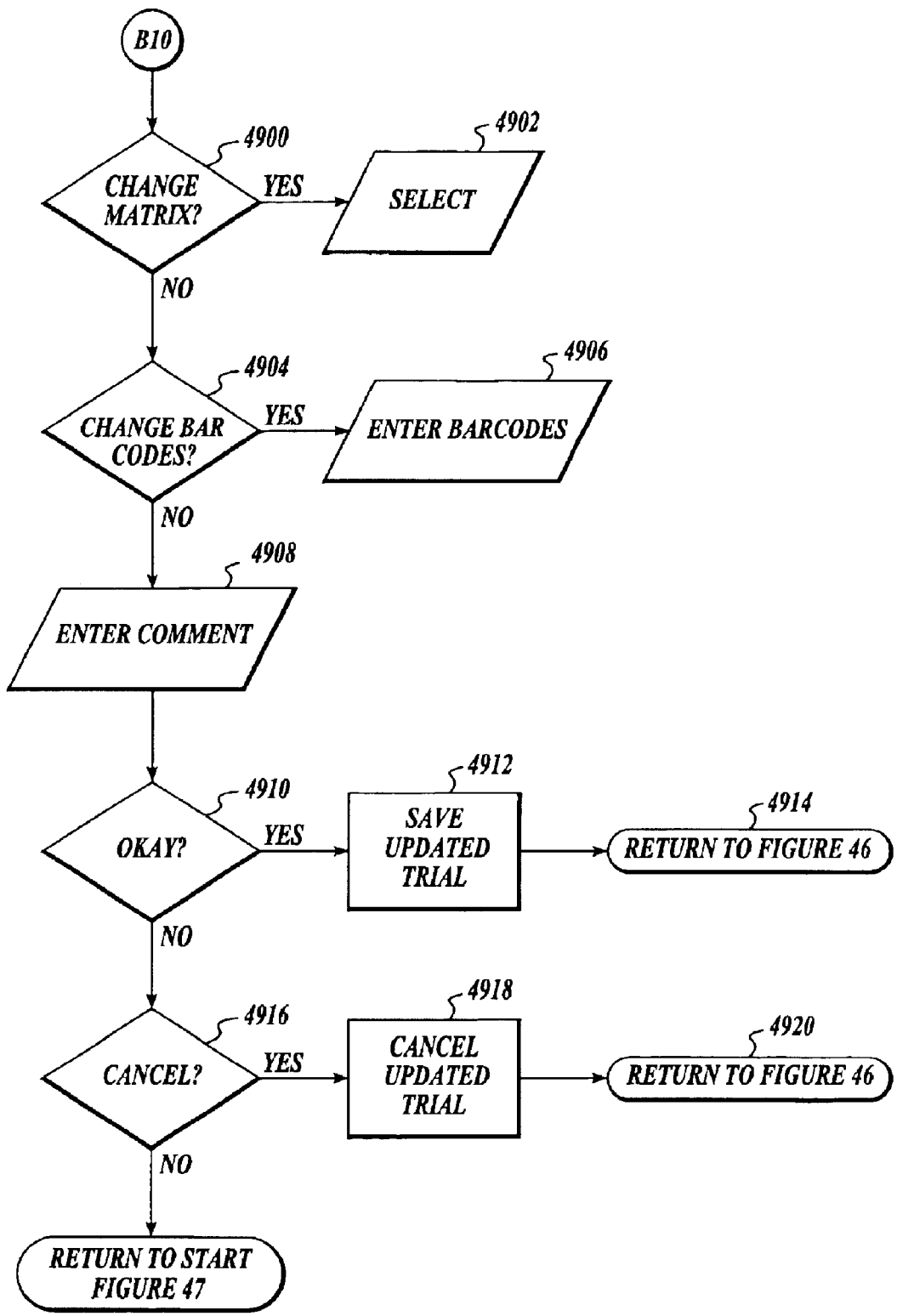

Referring now to FIG. 49, a user can change the matrix by clicking on a down arrow button located alongside a matrix field box, which opens a drop-down list of the available matrices in the database. Moving the pointer and clicking on a matrix enters the matrix name into the matrix field box and closes the drop-down list, steps 4900 and 4902. A user can also change plate barcode assignments by entering a new assignment in the plate barcode field box, steps 4904 and 4906, by selecting the plate barcode field box and entering data using a keyboard or other data entry device. The user may also enter a new comment in a comment field, step 4908. The user may either click the OK command button and save the updated trial in the database, which returns the user to the dialog window shown in FIG. 45, or the user may click on the cancel command button, in which case the updated trial data is cancelled before the user is returned to the dialog window shown in FIG. 45.

As will be readily appreciated from the foregoing description data is entered in generally the same manner as data is entered in previously described dialog windows.

Existing Trial Manager: Trial Matrix Viewer Tab

Figure 50:
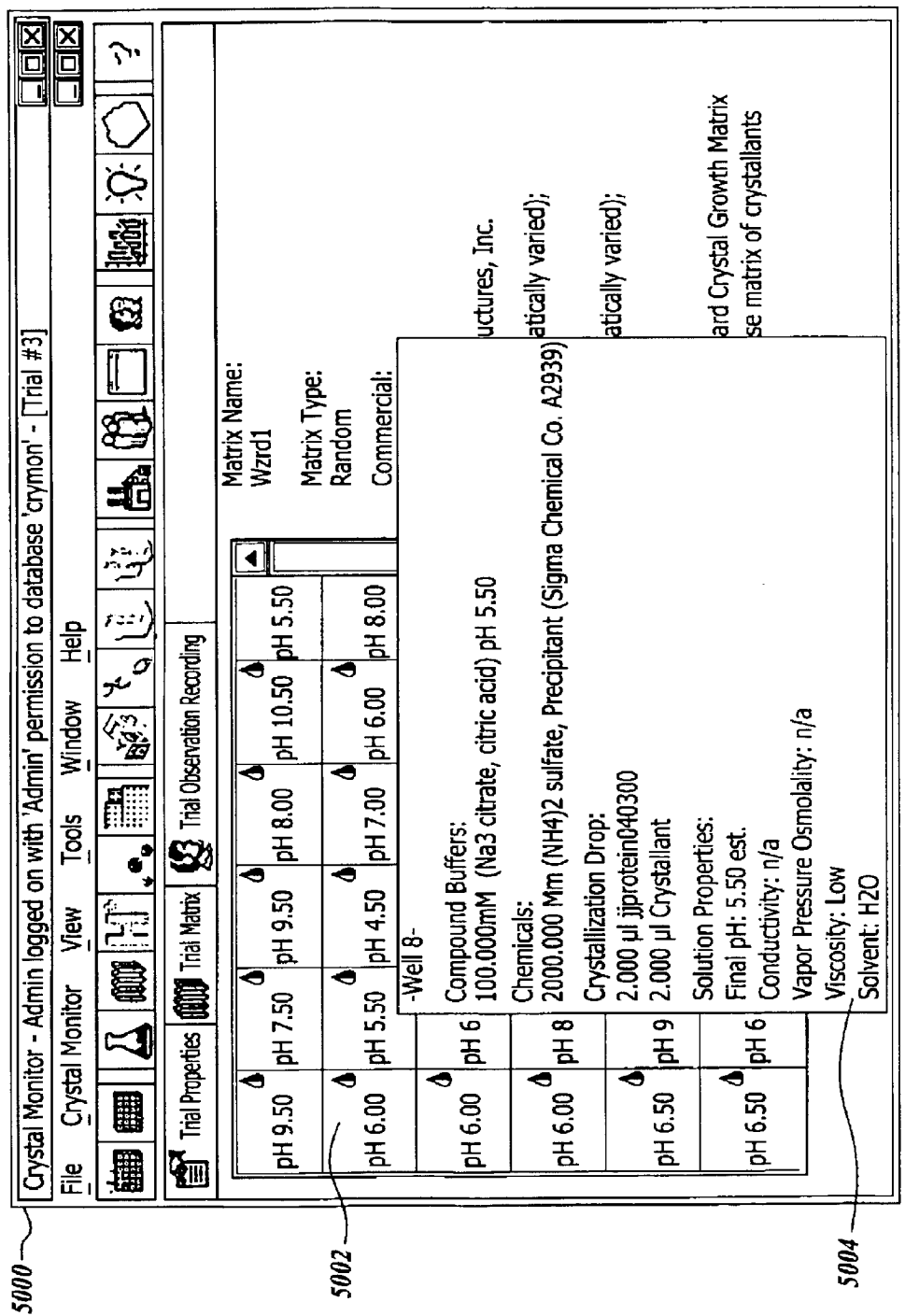
FIG. 50 shows a GUI for a trial matrix tab according to the present invention.
Figure 52:
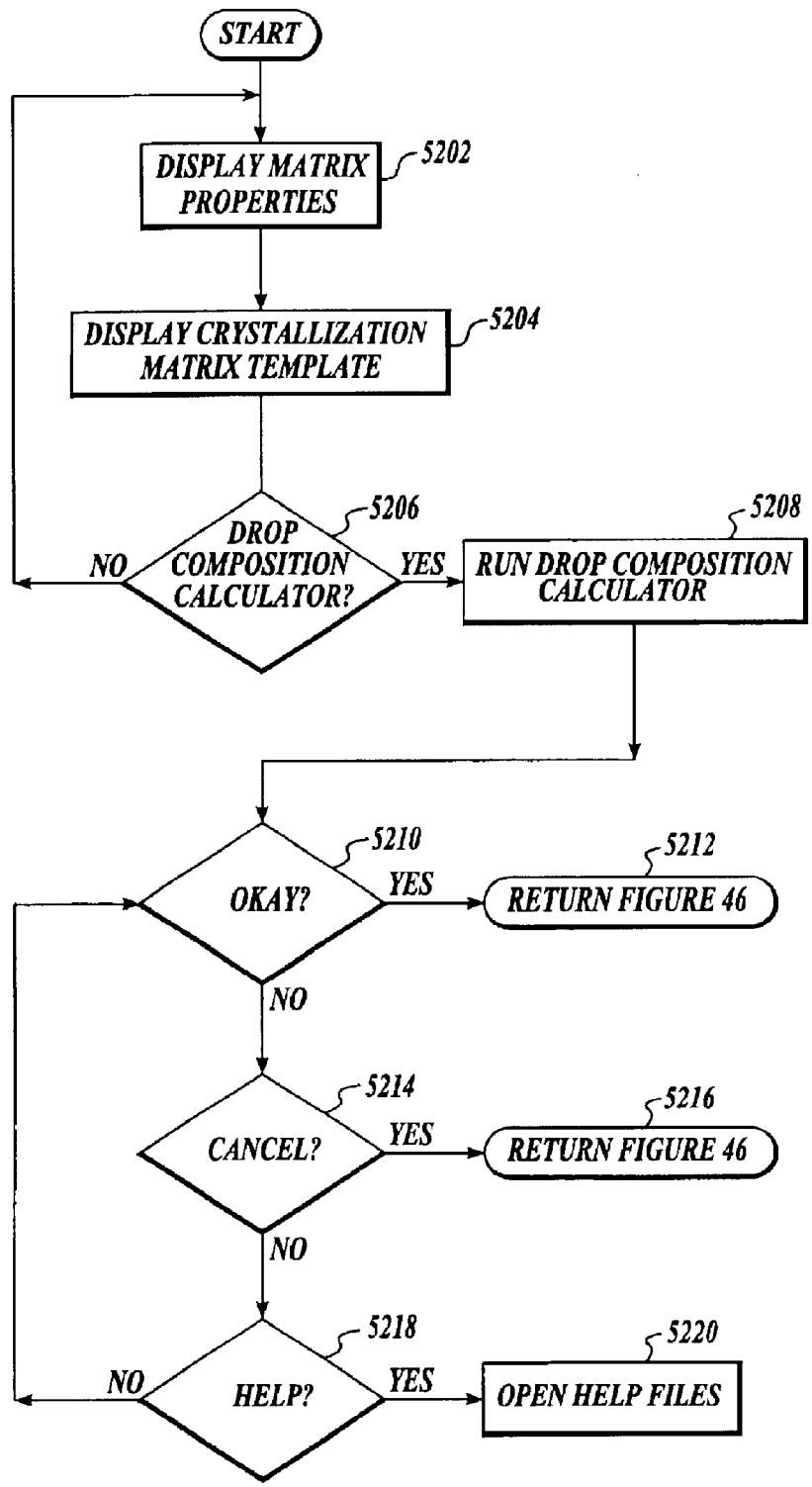
FIG. 52 shows a functional flow diagram for a display matrix properties tab according to the present invention.

Returning to FIG. 45, if a user clicks on the trial matrix tab 4506, a trial matrix viewer is opened. A trial matrix viewer GUI or dialog window 5000 formed according to the present invention is shown in FIG. 50. FIG. 52 is a functional flow diagram of a trial matrix viewer that illustrates a sequence of executable steps carried out by a trial matrix viewer formed in accordance with the present invention.

The trial matrix viewer dialog window shown in FIG. 50 displays matrix properties such as the matrix name, the matrix type, the commercial manufacturer of the matrix, the preparator of the matrix, whether the X axis is varied systematically or whether the Y axis is varied systematically, etc. See step 5202 of FIG. 52. The crystallization matrix 5002 is also displayed in the trial matrix viewer dialog window, step 5204, FIG. 52. When a user hovers the pointer of a cursor control device over a well, the formulation of the crystallant and the crystallization drop composition are displayed in a window 5004 that opens. Preferably, double clicking on a well in the trial matrix template opens the drop composition calculator. A drop composition calculator GUI or dialog window 5100 formed according to the present invention is shown in FIG. 51.

Existing Trial Manager: Trial Matrix Tab: Drop Composition Calculator

Figure 51:
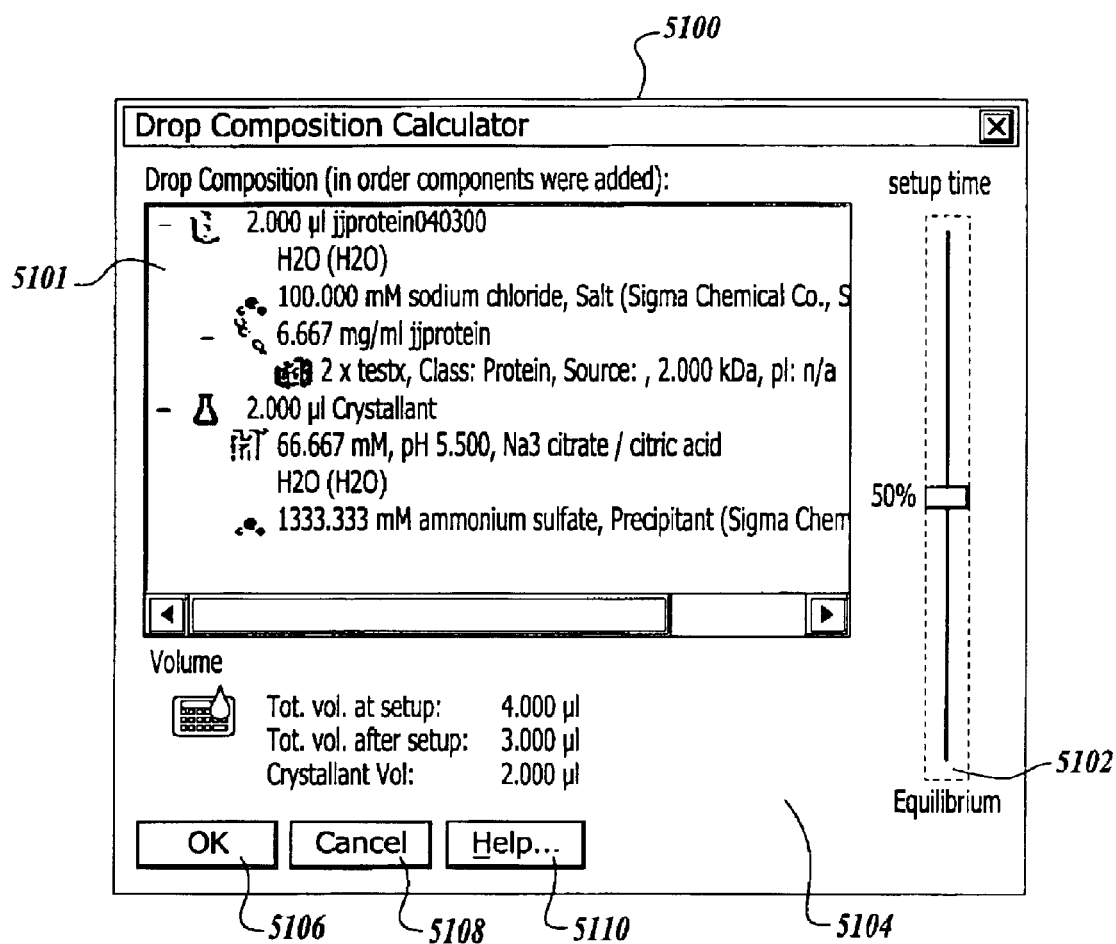
FIG. 51 shows a GUI for a drop composition calculator according to the present invention.

The drop composition calculator dialog window shown in FIG. 51 includes a list box 5101 containing a drop composition displayed in a tree format. The drop composition calculator is used to calculate the composition of the crystallization drop, which can be useful in formulating a crystal mounting solution. The drop composition calculator assumes that the volume of the crystallization drop at equilibrium is equal to the initial volume of the crystallant used. Preferably the drop composition calculator includes a slider button 5102 capable of traveling in a line and having a starting set-up time and an ending equilibrium time. In accordance with conventional window control techniques, the slider button 5102 can be "grabbed" by a cursor control device by moving a pointer over the button and dragging the button along the path while a key of the cursor control device is activated. Starting at the set-up time and moving toward the equilibrium time adjusts the drop volume linearly. The concentrations of the chemical components in the crystallization drop are updated accordingly. The results are displayed simultaneously with moving the slider button in a frame 5104. Preferably, within the calculator dialog window, solutions and macromolecules can be expanded to tree displays to show their components. After use of the drop composition calculator is finished, a user can click on an OK command button 5106 which returns the user to the trial matrix viewer dialog window (FIG. 50). This action is represented functionally by steps 5210 and 5212 of FIG. 52. Or, the user may click on a cancel command button 5108 which cancels the user's changes before entering the user to the trial matrix viewer dialog window. This action is represented functionally by steps 5214 and 5216 of FIG. 52. Or alternately, the user may click on a help command button 5110 which opens the help files. This action is represented functionally by steps 5218 and 5220 of FIG. 52.

Existing Trial Manager: Trial Observation Recording Tab

Figure 53:
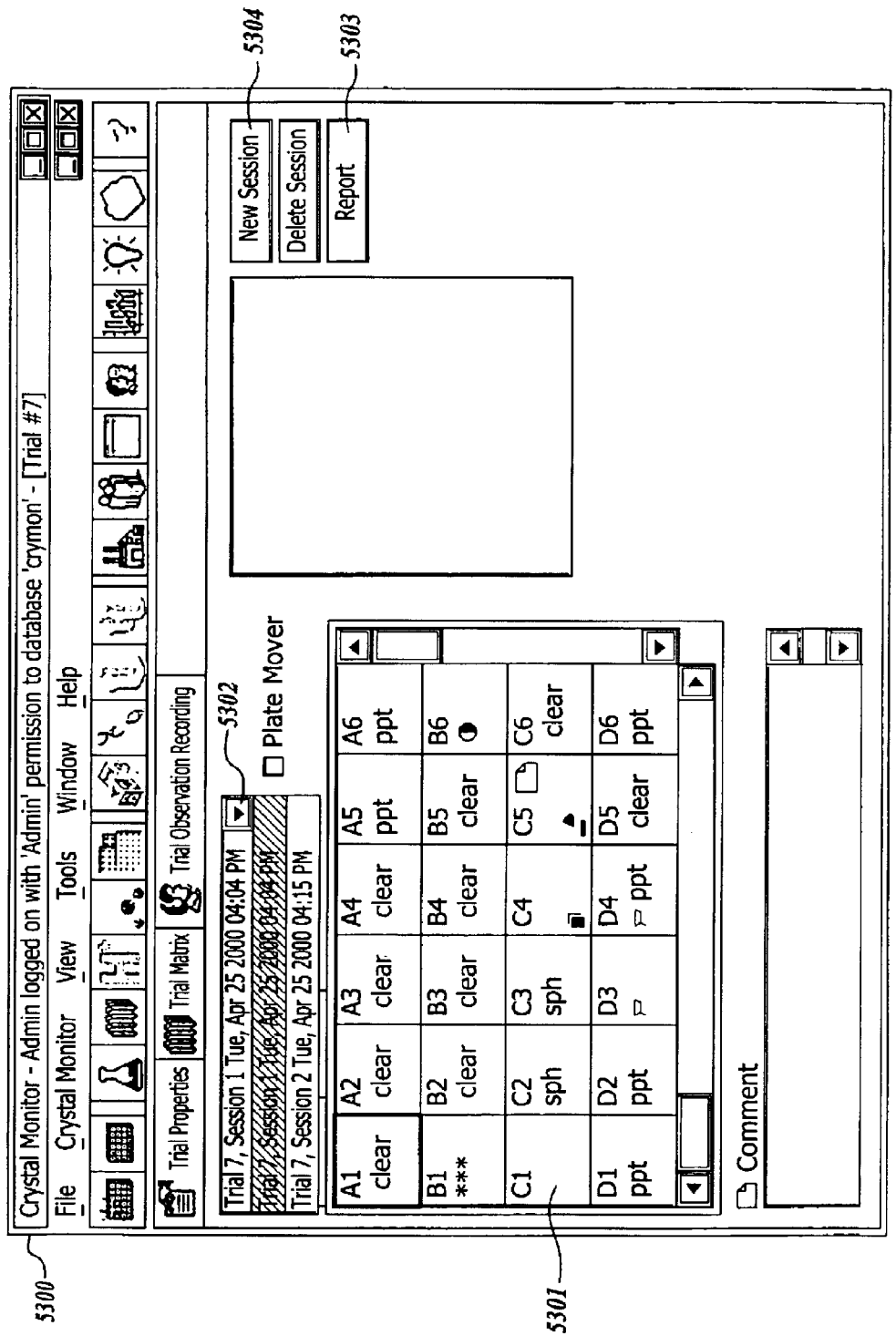
FIG. 53 shows a GUI for a trial observation recording tab for an inactive session according to the present invention.
Figure 55:
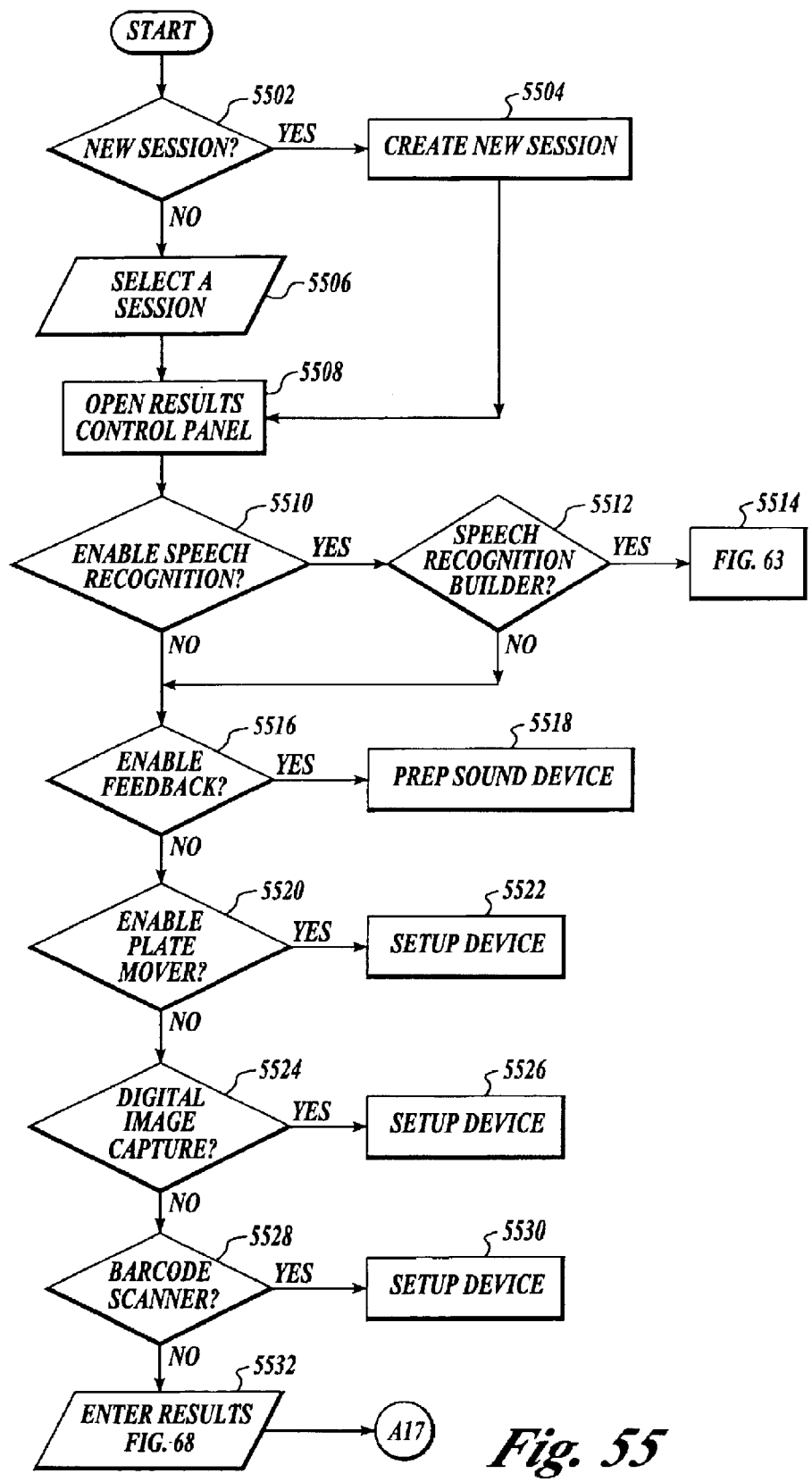
FIGS. 55–56 show a functional flow diagram for a trial observation recording tab according to the present invention.
Figure 56:
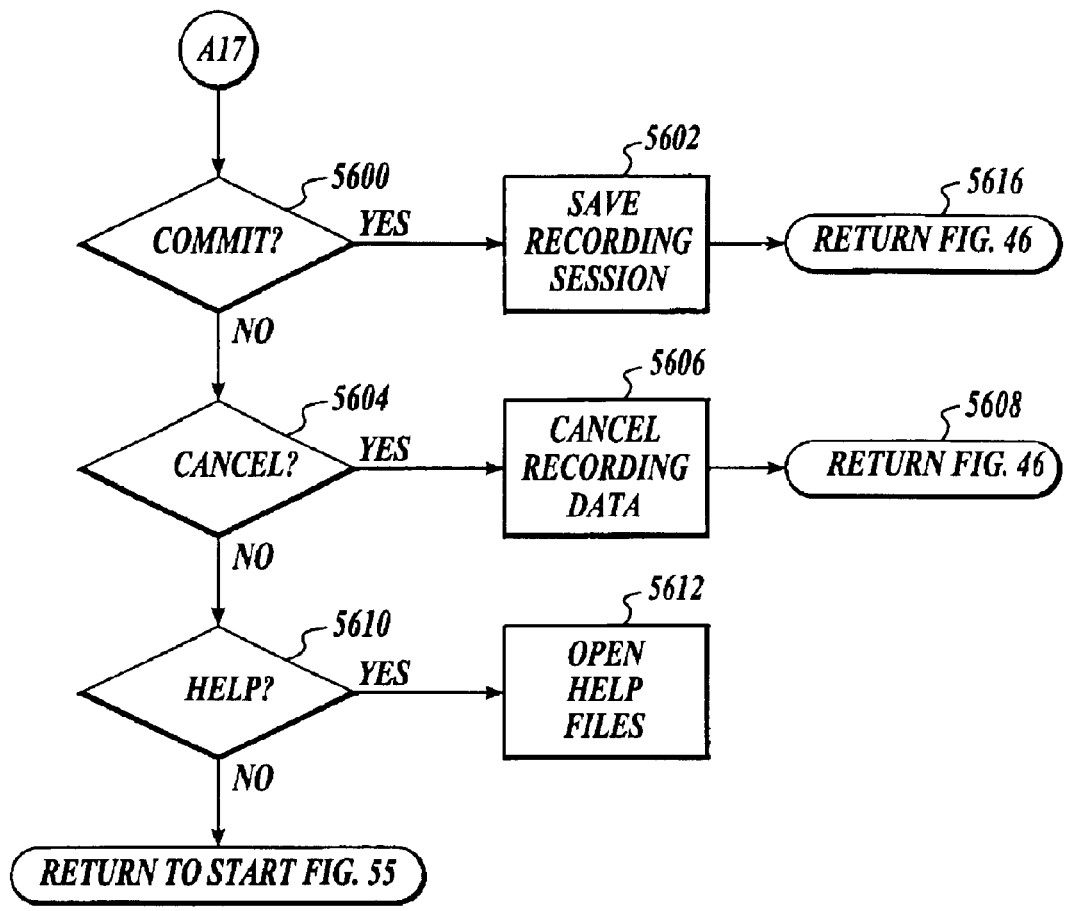

Returning to FIG. 45, if a user clicks on the trial observation recording tab 4508, a trial observation recording is opened. A trial observation recording GUI or dialog window 5300 formed in accordance with the invention is shown in FIG. 53. The trial observation recording dialog window 5300 for an inactive session includes a list box 5301 on one side that displays the well crystallization results. FIGS. 55–56 are functional flow diagrams of a trial observation recording process formed in accordance with this invention. That is FIG. 55 illustrates a sequence of executable steps carried out by a trial observation recording process formed in accordance with this invention.

Figure 54:
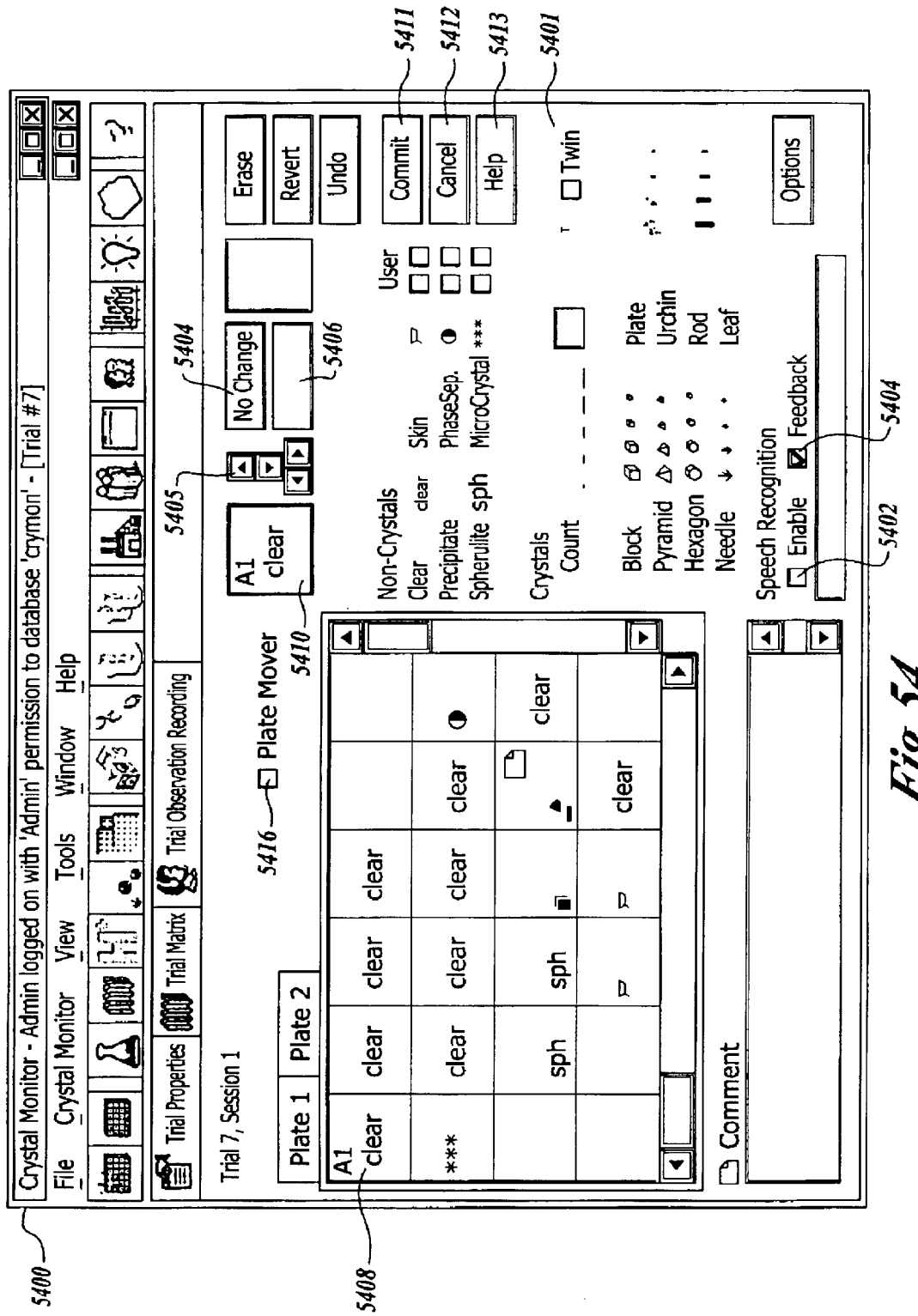
FIG. 54 shows a GUI for a trial observation recording tab for an active session according to the present invention.

The trial observation recording dialog window is used to capture crystallization results for review and analysis. The trial observation recording dialog window displays the crystallization matrix template for a trial session on the one side of the window by clicking on a down arrow button 5302, and selecting a session. Clicking on the new session command button 5304 opens up the crystallization results control panel 5401 on the right side of the window to begin recording crystallization results, as shown in FIG. 54, which is a view of a trial observation recording dialog window 5400 after this action has occurred. These actions are functionally represented by steps 5502, 5504, 5506 and 5508 in FIG. 55.

A user has several options to enter crystallization results data. A user can click on individual results buttons in the crystallization results control panel, or a user can enter data by voice using speech recognition software that forms part of this invention and is more fully described below. In this regard, a user has the option of enabling speech recognition by checking a speech recognition check box 5402. This action is functionally represented by step 5510 in FIG. 55. A user also has the option of hearing the input by checking a feedback checkbox 5404 (step 5516, FIG. 55). Speech recognition permits the user to maintain their focus on the microscope 110 and determining crystallization trial results during an observation session. This results in faster crystallization data collection as there is no physical motion required of the user, such as taking focus away from the microscope to write observations in a notebook. The audio feedback confirmation of the speech recognition commands ensures practically complete accuracy of the speech recognition.

In order to realize the full potential of the present invention's speech recognition capabilities, some settings may need to be adjusted. Clicking on an options command button 5404 in the crystallization results control panel 5401 of the trial observation recording dialog window 5400 to customize the voice command settings while an observation session is active. This action is functionally represented by steps 5512 and 5514 in FIG. 55.

Figure 57:
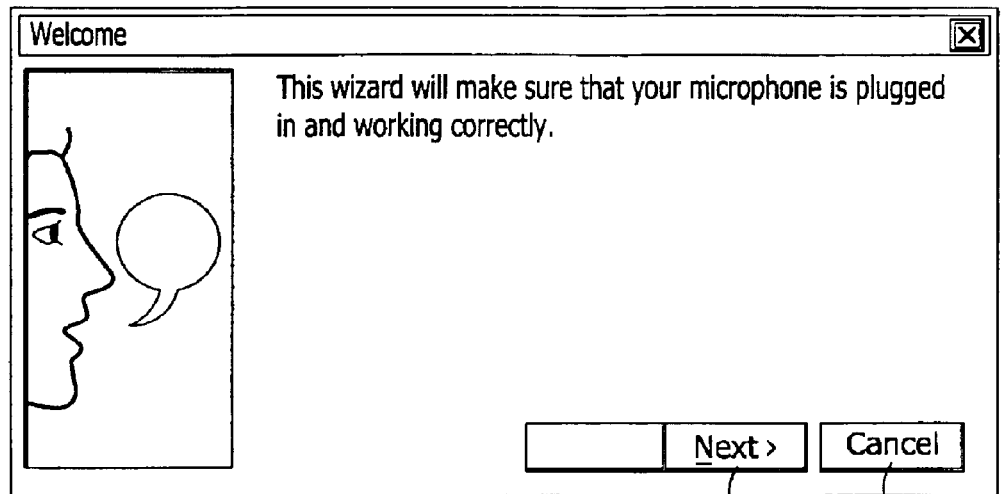
FIG. 57 shows a GUI for a microphone builder according to the present invention.
Figure 63:
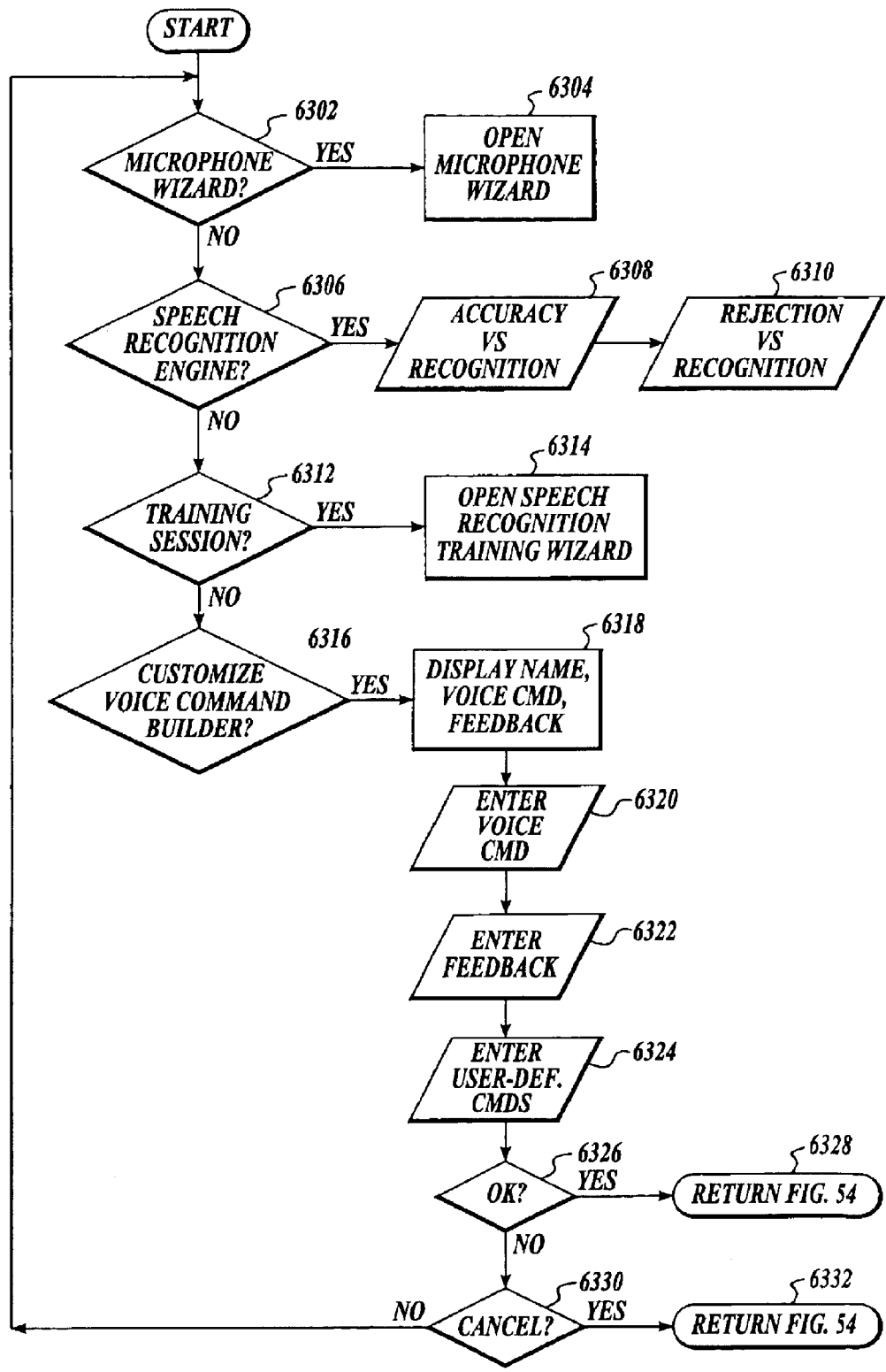
FIG. 63 shows a functional flow diagram for a speech recognition builder according to the present invention.

Existing Trial Manager: Trial Observation Recording Tab: Speech Recognition Builder The present invention allows adjustments to customize the voice command feature to accommodate particular users and environments. Features are customized by opening dialog windows and receiving user input. FIGS. 57–62 show dialog windows suitable for receiving customizing voice recognition user input. Functionally, the user inputs received via these dialog windows are shown in FIG. 63. FIG. 57 shows the opening microphone adjustment dialog window 5700. The recording input level of the microphone is properly set in a conventional manner via subsequent dialog windows (not shown). The opening microphone adjustment window prompts a user to complete the microphone adjustment by clicking a next command button 5702 or canceling microphone adjustment by clicking a cancel command button 5704. These actions are functionally represented by steps 6302 and 6304 in FIG. 63.

Figure 58:
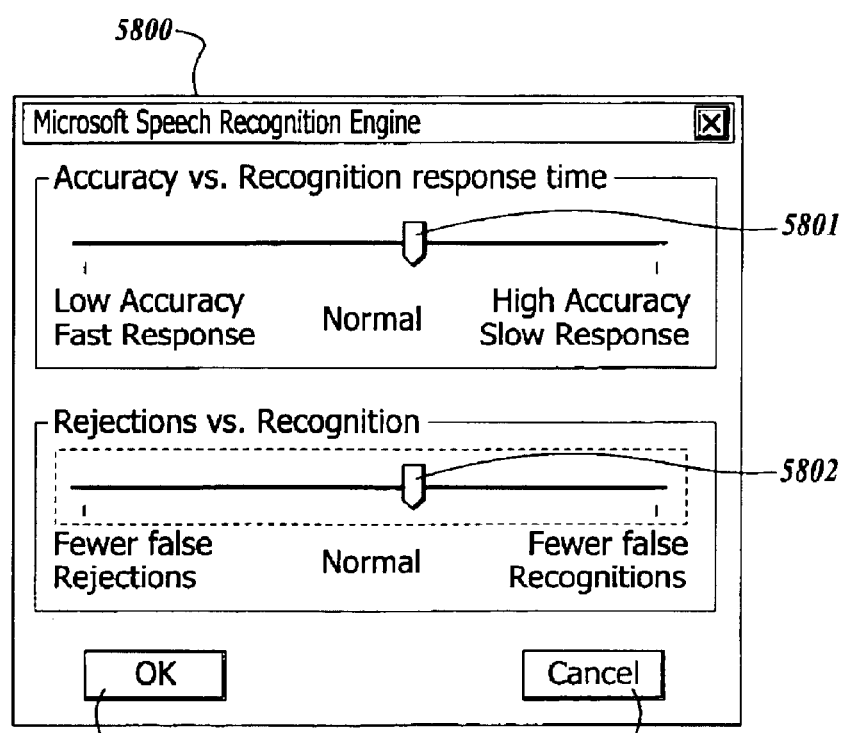
FIG. 58 shows a GUI for a speech recognition engine according to the present invention.

After the microphone adjustment is completed, a user is prompted to open the speech recognition engine to make adjustments. An example of a speech recognition dialog window 5800 is shown in FIG. 58 and the related actions are functionally illustrated as steps 6306, 6308, and 6310 of FIG. 63. A suitable speech recognition engine is available from the Microsoft Corp., Redmond, Wash. The Microsoft speech recognition engine allows the accuracy versus recognition response time to be adjusted by a slider button 5801. Moving the button from left to right represents going from low accuracy, fast response to high accuracy, slow response. Another adjustment included in the Microsoft speech recognition engine is rejection versus recognition. This feature is implemented by another slider button 5802. Moving the button from left to right represents going from fewer false rejections to fewer false recognitions. If speech recognition commands are being incorrectly interpreted by the Microsoft speech recognition engine, moving the two sliders to the right will increase the accuracy, with a corresponding increase in response time.

An option of the Microsoft speech recognition engine is a speech training session, functionally represented by steps 6312 and 6314 of FIG. 63. Beginning with a speech recognition training wizard opening dialog window 5900 (FIG. 59), the wizard guides a user through a speech recognition training session, during which the user reads a prepared text for about ten minutes. The text to be read is selected in the speech recognition training opening dialog window 5900. After the training session is finished, a speech recognition profile for the logged on user is saved.

Figures 59, 60:
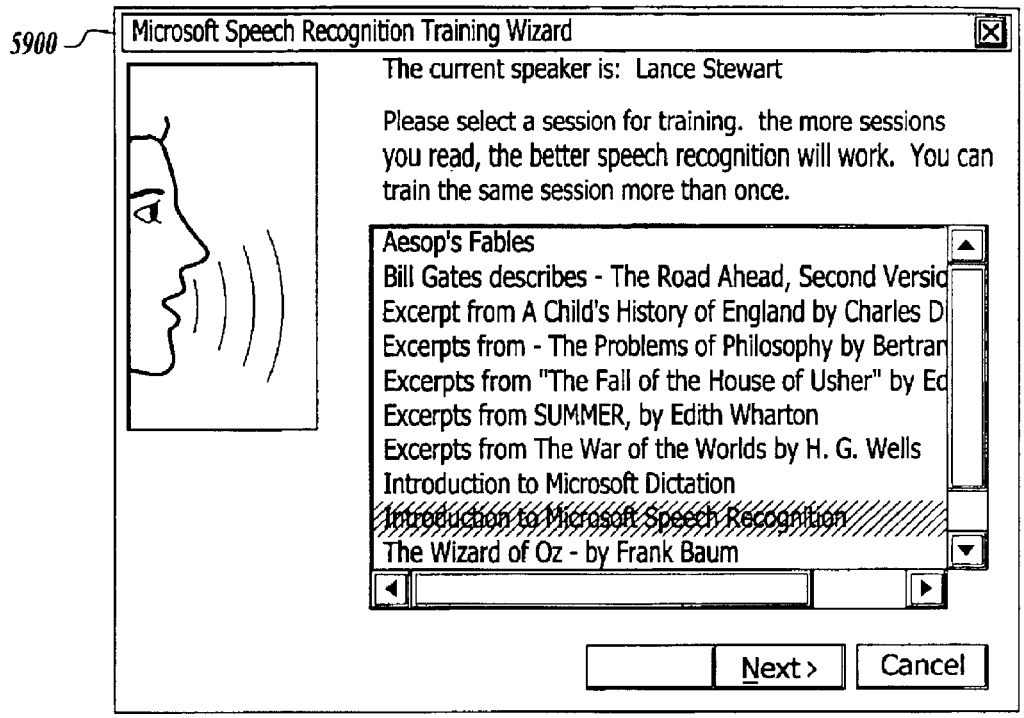
FIG. 59 shows a GUI for a speech recognition training builder according to the present invention.
FIG. 60 shows a GUI for a customize voice command builder according to the present invention.
Figure 61:
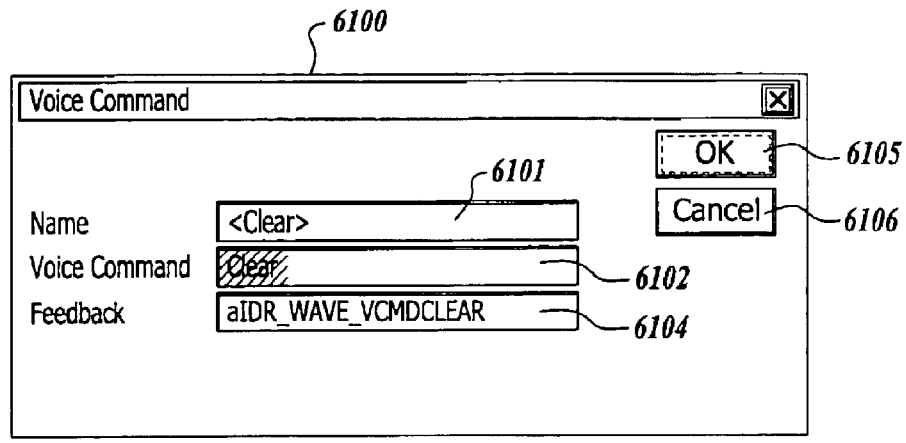
FIG. 61 shows a GUI for a voice command builder according to the present invention.
Figure 62:
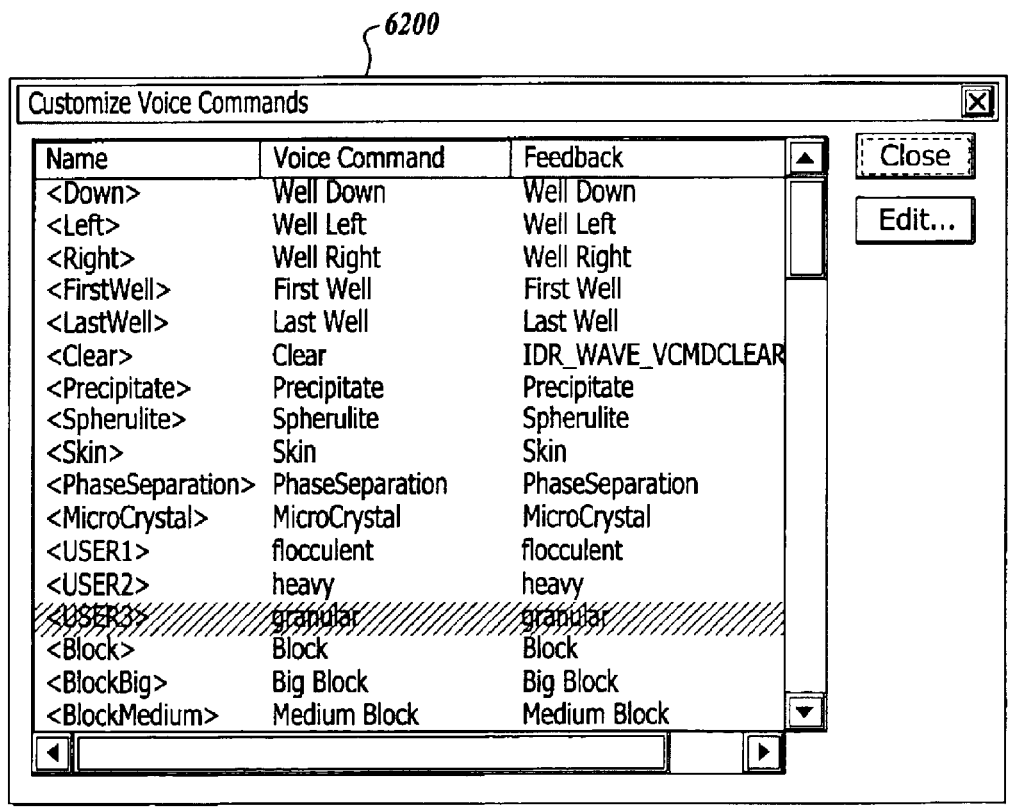
FIG. 62 shows a GUI for a customize voice command builder according to the present invention.

As also shown in FIG. 63, voice commands recognized by the speech recognition engine can be customized to a user. This function is represented by step 6318 through 6332. As shown in a customize voice commands dialog window 6000 (FIG. 60), this program has a large number of preprogrammed stored voice commands. FIG. 60 shows the commands in tabular form. The table includes the name of the voice command 6001, the voice command 6002 and the feedback 6004. The table is functionally shown as step 6318 of FIG. 63. The name of the voice command identifies the data to be inserted into a relational database when the command is spoken or an action to be taken. In this regard, as more fully described below, the voice commands include both data commands and action or control commands. The middle column in the table, i.e., voice command 6002, lists the voice recognition commands that are presently recognizable. A user can change a voice recognition command by double clicking on the command, which accesses a voice command dialog window 6100 (FIG. 61). The voice command dialog window has three field boxes—a name field box 6101, a voice command field box 6102, and a feedback field box 6104. Both the voice command and feedback can be changed by entering a new line of text in the voice command field box 6102 and the feedback field box 6104. This action is represented by steps 6320 and 6322 of FIG. 63. However, the name of the voice command 6104 cannot be changed. This is the name of the descriptor for the database. For example, the voice command Clear can be changed to the voice command Zero. After this change, the voice command Zero is recognizable. However, Clear will still appear in the name field. Further, the action associated with name clear will occur when zero is spoken. For example, if clear means that a well is cleared, when zero is spoken, a Clear result will be stored in the database. This voice command customization feature is especially useful for non-English settings. Any non-English word which can be phonetically spelled in English can form a valid voice command.

Certain user defined voice commands, called for purpose of description, User 1–User 6 voice commands, initially have no associated voice recognition, command, or feedback. Voice recognition commands and feedback must be set by the user for these six commands. This action is represented by step 6324 of FIG. 63. After being set, the settings are saved for the current logged on user. User-defined commands are crystallization results modifiers and not results in themselves. Most users use these commands as modifiers to precipitate, for example. These commands may be used to indicate flocculent, heavy, and granular precipitates. See FIG. 62. As with other commands, when inputting the user defined commands by speech recognition, there must be pause for audio feedback after a user issues a defined command. For example, if the result "flocculent precipitate" is to be entered by speech recognition, the user input and feedback would be user: flocculent (pause), feedback: flocculent, user: precipitate (pause), feedback: precipitate. If a user clicks the OK command button 6105 after entering customizable features, the new settings are saved and the user is returned to the crystallization results control panel 5401 (FIG. 54), functionally represented by steps 6326 and 6328. If the user clicks on the CANCEL command button, the changes are cancelled before the user is returned to the crystallization results control panel. This action is represented by steps 6330 and 6332 of FIG. 63.

Existing Trial Manager: Trial Observation Recording Tab: Plate Mover

Figure 64:
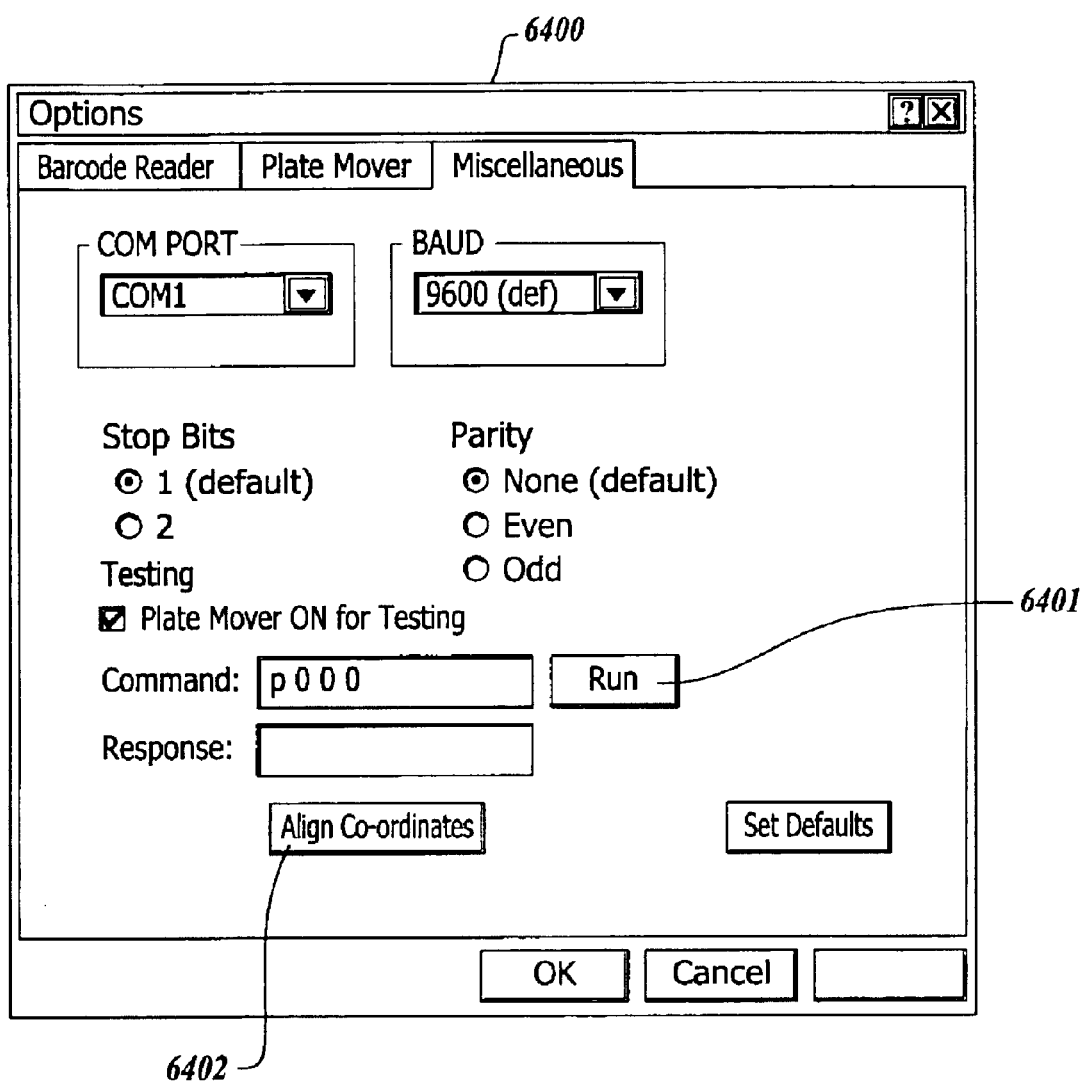
FIG. 64 shows a GUI for a plate mover builder according to the present invention.

Returning to FIGS. 54 and 55, after customizing the voice commands, the user may choose to enable a plate mover, step 5520. As noted above, the optional automated plate mover allows precise, reproducible plate translations for recording crystallization observations. Preferably, the plate mover is controlled by cursor controller clicks, selected keyboard keys, or speech recognition. Using the plate mover requires that crystallization trays be appropriately inserted into or mounted on a plate insert which fits into the microscope support structure. Preferably, software formed in accordance with the present invention comes preloaded with the positions of the trial wells (drop chambers) for all available crystallization trays or plates. New trays and/or plates are definable using the apparatus manager in the manner described below. The plate mover is calibrated via an options dialog window, such as the options dialog window 6400 shown in FIG. 64, which can be accessed through the tools menu option in the main manager dialog window (FIG. 2). The main manager dialog window has a plate mover tab that, when selected, opens the options dialog window 6400. Calibration requires that a user place the plate insert with the plate or tray in the microscope stage so that a reference hole in the insert is in a predetermined position, i.e., the upper left corner, when the inserted plate is viewed from above. The user manually adjusts the plate mover using a joystick control until the reference hole is in the center of the viewing field of the microscope. In the plate calibration options dialog window, 6400 (FIG. 64), allows a user to test the plate mover by clicking on a run command button 6401. When a user clicks on the run command button and, then, clicks on a line coordinates command button 6402, the plate mover is calibrated with the plate definitions.

Because the reference hole has the same position for all plate inserts, calibrating the plate mover for one type of plate insert calibrates the mover for all plate inserts. The plate mover can be recalibrated if the plate mover is jarred.

The plate mover is optionally used to view or record crystallization trials by a user opening the trial and checking the plate mover checkbox 5416 in the trial observation recording dialog window. Since the type of crystallization plate used in the trial and its dimensions and well positions are stored in the database, clicking on a well using a cursor control device will automatically position the plate mover so that the selected well is centered in the microscope viewing field. The joystick can be used for fine adjustments so that a feature which is not in the center of the well can be viewed. After making fine adjustments, clicking the well will return the plate mover to the center of the well. Preferably, the plate mover can be moved in single well increments using the up, down, left, and right arrow keys of a keyboard. The plate mover can also be moved by voice commands during an active trial observation session. Suitably, navigational voice commands are: Next, Back, Well Left, Well Right, Well Up, Well Down, First Well, and Last Well. Alternatively, the up, down, left, and right arrow buttons 5405 in the results control panel 5401 (FIG. 54) can be used to move the plate mover during an active observation session.

Existing Trial Manager: Trial Observation Recording Tab: Digital Image Capture

Returning again to FIGS. 54 and 55, as denoted by functional step 5520, the digital image camera 104 may be used to capture digital images of the crystallization results. A suitable digital camera is the Pixera digital camera which is attachable to a microscope with a common C-mount. An observation session must be active in order to take a digital image. Referring to FIG. 54, when a user clicks an image command button 5406 in the crystallization results control panel 5401 an image capture options list opens.

Figure 65:
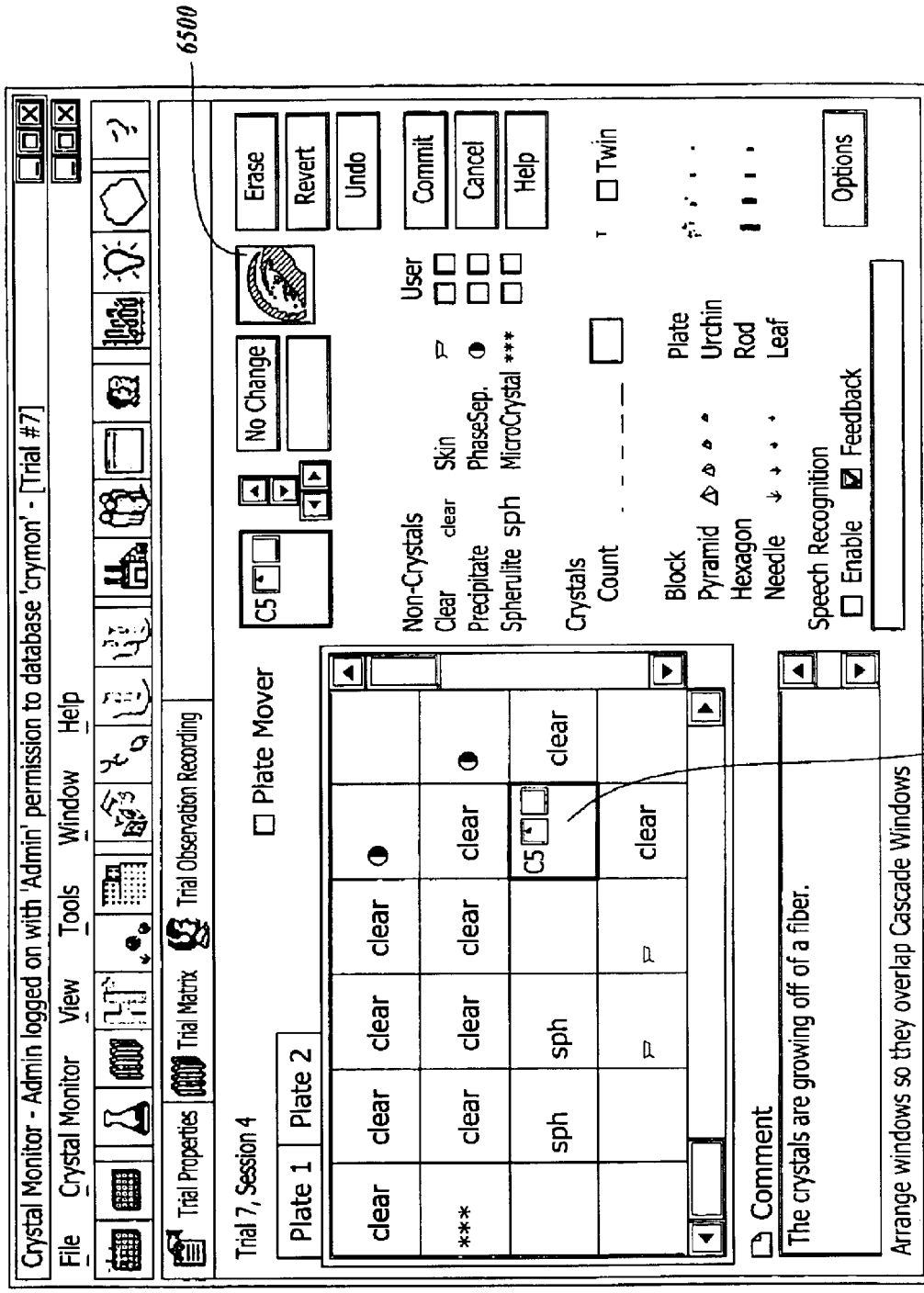
FIG. 65 shows a GUI for a trial observation recording tab according to the present invention.
Figure 66:
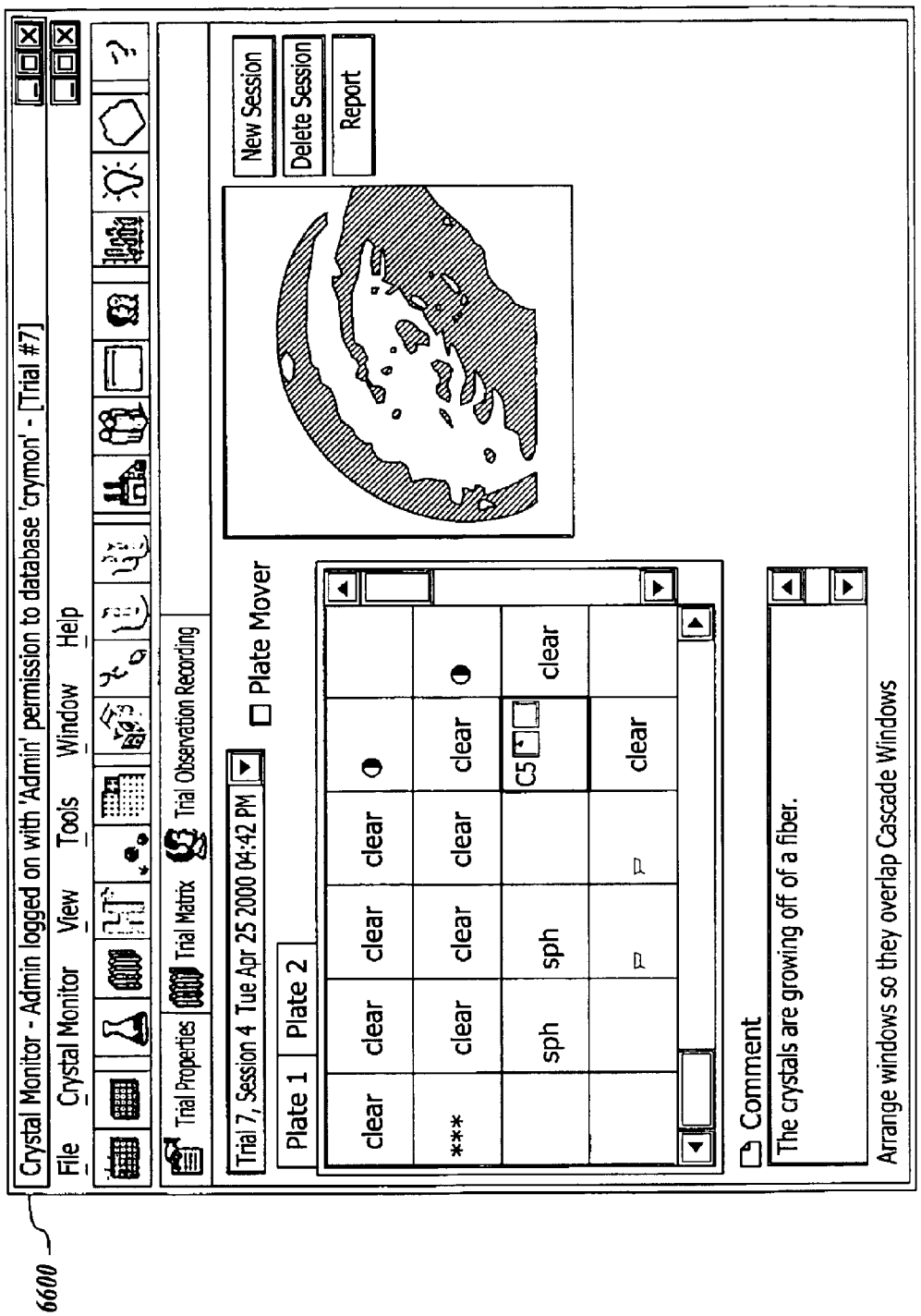
FIG. 66 shows a GUI for a digital image builder according to the present invention.

The image capture options list allows a user to select the pixel resolution of the image to be captured. Preferably, all images are saved in JPEG format. A 320 by 240 pixel image requires about 200 kB of data storage, and a 1,260 by 960 pixel image requires about 3 MB of data storage. After the pixel resolution is selected, an image is captured by a user clicking on the image and then clicking on a capture command button, or issuing a capture voice command. Several feedback beeps can be emitted, for example, to indicate to a user that the camera is preparing to capture an image. More beeps can be used to denote that a higher resolution image will be captured. A clicking shutter feedback sound can be emitted when the image is taken. Preferably, the captured image appears in a thumbnail box 6500 (FIG. 65) in the crystallization results control panel, and an image capture icon 6502 appears in the related well in the trial template. Preferably, double clicking an image in the thumbnail box will automatically launch a program such as the Microsoft paint program, that creates a larger size view of the image shown in FIG. 66. Preferably, the image is such that it can then be manipulated by any suitable graphics program and the edited version saved as a result. Further, preferably, while the image is only capturable during an active observation session, any captured image is viewable during a review of the data produced during an observation session. Preferably, clicking on the image capture command button 5406 turns on an observed flag for the related well, even if no other observations are recorded for that well. Preferably, clicking on an image remove command button will delete a captured image and the image capture icon from a well, but will not toggle the observed flag. The image remove command button is useful if an image has inadvertently been captured for a well.

Existing Trial Manager: Trial Observation Recording Tab: Barcode Scanner

Figure 67:
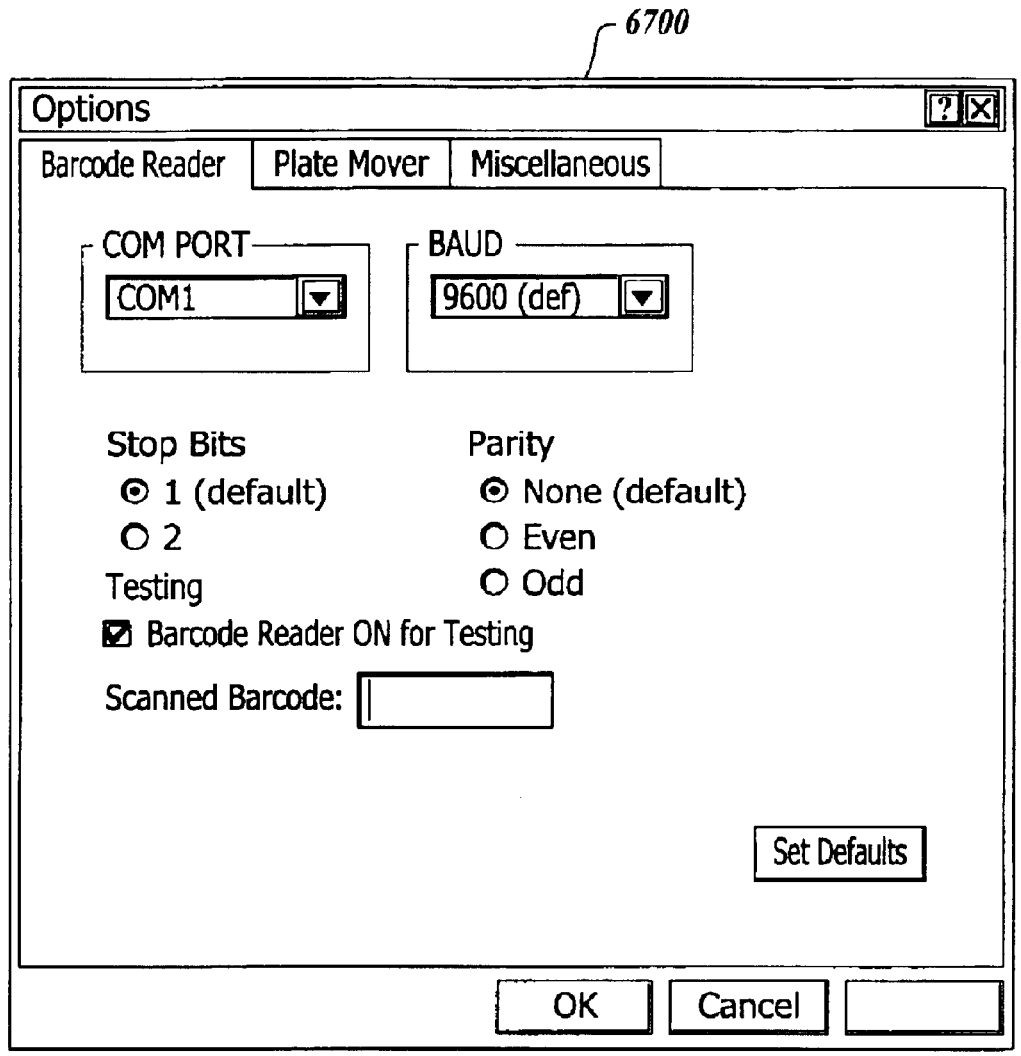
FIG. 67 shows a GUI for a barcode reader builder according to the present invention.

Referring again to FIGS. 54 and 55, as shown functionally by step 5522, a barcode scanner can be enabled to record crystallization results. The barcode scanning feature of the present invention allows quick access to all information on a particular crystallization trial. The barcode scanner configuration can be changed, by a user selecting the tools option from the main manager dialog window (FIG. 2), and then selecting the barcode scanner options, which opens a dialog window of the type illustrated in FIG. 67. The dialog window allows a user to make desired changes to the barcode scanner configuration.

Figure 68:
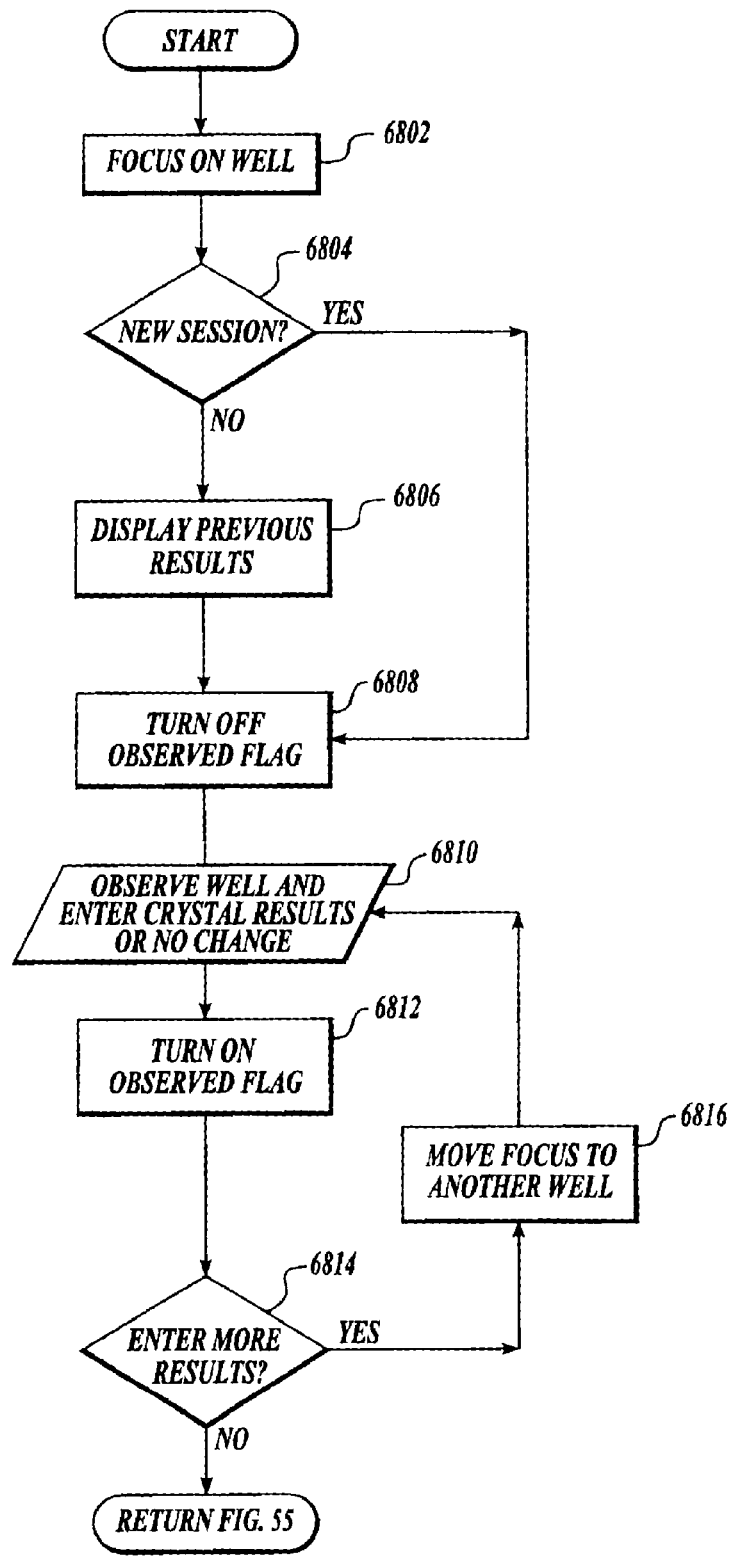
FIG. 68 shows a functional flow diagram well recording builder according to the present invention.

Existing Trial Manager: Trial Observation Recording Tab: Crystallization Results Builder Returning again to FIGS. 54 and 55, after initializing all of the customizable voice commands, and setting up the periphery apparatus, a user is now ready to enter crystallization results into the wells, as shown by functional step 5532. FIG. 68 is a functional flow diagram showing how crystallization trial results in capture. As noted above, crystallization trial results data can be input either by clicking on the results buttons in the crystallization results control panel (5401, FIG. 54), or more conveniently, by speech recognition. As shown in FIG. 54, the crystallization well 5408 which is expecting an observation is outlined in black in the trial matrix template. The well is also shown in the crystallization results control panel as a separate image 5410. The focus on well functions are represented by step 6802 in FIG. 68. If speech recognition is enabled, a program formed in accordance with this invention will reply by audio feedback to the user's speech commands, if the feedback checkbox is also enabled. The audio feedback is a text to speech echo of the input voice command, unless the user has defined otherwise. In one actual embodiment of the invention, the following voice commands are recognized.

Crystal Monitor—A diagnostic command to check if speech recognition is active.

Describe—Audio feedback will reply with the results entered into the currently highlighted well.

Next—navigation command which advances the focus to the next well in the trial. The audio feedback is a click going from left to right. Back-navigation command which moves the focus back to the previous well in the trial. The audio feedback is a click going from right to left.

Well up—navigation command which moves the focus to the well immediately above in the matrix template.

Well down—navigation command which moves the focus to the well immediately below in the matrix template.

Well down—navigation command which moves the focus to the previous well in the matrix template.

Well right—navigation command which moves the focus to the well immediately right in the matrix template.

First well—navigation command which moves the focus to the first well in the current plate.

Last well—navigation command which moves the focus to the last well in the current plate.

The following data types are recognized and can be stored in the relational database created by this embodiment of the invention:

Clear—a clear crystallization drop, no discernible crystallization or precipitation activity. The audio feedback is a whooshing sound going from left to right.

Precipitate—a crystallization result.

Spherulite—noncrystalline spheroidal aggregations of macromolecule.

Skin—a crystallization result which is a film, usually denatured protein, forming on the surface of the crystallization drop.

Phase separation—is a crystallization result.

Microcrystal—is a crystallization result.

The following crystal morphologies are recognized and cause related data to be stored in the relational database created by this embodiment of the invention:

block
big block
medium block
small block
tiny block
pyramid
big pyramid
medium pyramid
small pyramid
tiny pyramid
hexagon
big hexagon
medium hexagon
small hexagon
tiny hexagon
needle
big needle
medium needle
small needle
tiny needle
plate
big plate
medium plate
small plate
tiny plate
urchin
big urchin
medium urchin
small urchin
tiny urchin
rod
big rod
medium rod
small rod
tiny rod
leaf
big leaf
medium leaf
small leaf
tiny leaf The following quantify data-type descriptors are recognized and cause related data to be stored:

count one
count two
count three
count four
count five
count six
count seven
count eight
count nine
count ten (the user may count to count hundred by fives)

The following can be used as additional voice data descriptors of crystallization results and cause related data to be stored and/or voice commands, as appropriate:

Twin—used when the crystal appears to be twinned

User 1 through User 6 are customizable user-defined commands.

No change—the crystallization results for the well have not changed since the previous trial observation session, this command turns on the observed flag.

Erase—delete all current result entries in the well.

Revert—reverts results to those of the previous observation session, this command turns off the observed flag.

Undo—removes most recently input single result descriptor.

Speech-disabled—deactivates speech recognition.

The following speech commands are for digital image capture and are used in conjunction with the optional digital camera.

Image capture—takes a digital image and assigns it to the currently active well in the matrix template.

Image remove—deletes a digital image from the currently active well in the matrix template.

When a result (crystallization trial data) is input, a pictograph representing the result will appear in the crystallization well. Up to six different crystallization results plus a comment and a digital image can be entered for a crystallization well during an observation session. When all the results for a well have been entered, the focus is advanced to the next well using the navigation commands—next, back, well right, well left, well up, and well down. The crystallization results descriptors of undefined or poorly defined morphology, such as, precipitate, spherulite, skin, phase separation, and microcrystal do not take size descriptors. They can, however, take Count and user-defined descriptors. Count descriptors for these crystallization results of undefined or poorly defined morphology can be used to indicate the extent of the particular descriptor. For example, a light precipitate can be assigned a count one, while a very heavy precipitate can be assigned a count hundred. The results of descriptors of defined morphology, block, pyramid, hexagon, needle, plate, urchin, rod, leaf can take additional size and count descriptors. If no size descriptor is given for these results of defined morphology, the result will default to the medium size. Counts are input by speech recognition as count followed by a number. Counts can also be typed into the count field. Counts should be given before the size descriptor. When a count is given for a result, for example, a red bar will appear under the result pictograph. Longer red bars indicate larger counts. For example, the correct way to enter ("two small blocks" by speech recognition is: count two/small blocks). If the descriptor twin is to be added to a result of defined morphology, twin should be given before count or size descriptors. A comment can also be entered for a well by typing in the comment field, even for wells with clear descriptors. A predetermined colored, e.g., yellow comment icon in a predetermined position, e.g., the upper right-hand corner, of the crystallization well in the matrix template will indicate that a comment has been entered for that well during the observation session. Comments are not limited to the recognized speech commands. When speech recognition is active, the results will be read back, including any comments entered for the well, with the described command. FIG. 54 is an example of what the crystallization results might look like.

When a trial is reopened for any observation session, the trial matrix template with all of the results from the previous observation session automatically appears. When crystallization results have been saved, and the trial is recalled, the crystallization well IDs are grayed out instead of being in a color, such as red, used as a new trial designator. This is shown as steps 6804, 6806 and 6808 in FIG. 68. Preferably, the well ID functions as the observed flag for the well. For example, if the well ID is red, the observed flag is turned on, indicating that an observation has been input for that well during the current observation session. If a well ID is grayed out, the observation flag is turned off, indicating that no results observations have been input for that well during the current observation period. When a new observation session is started, the matrix template initially appears with all observation flags turned off, since no observations have yet been made for any of the wells during the new session.

A complete result description of a well during an observation session can be entered and the flag turned on. This action is represented by steps 6810 and 6812 of FIG. 68. Thus, for example, if the well originally had a precipitate descriptor, and the user now wants to enter phase separation, the user can specify both precipitate and phase separation for both descriptors to be entered. Entering only one descriptor can overwrite the previous descriptor and the original descriptor will not be entered for the well for the current observation session. If the results have not changed since the previous observation session, clicking on the no change command button will retain the previous sessions results while turning on the observed flag to indicate that an observation has been made of that well during the current session. The navigation commands do not turn on the observed flag.

The observed flag is useful for keeping track of how many times a particular well was actually observed during the duration of a crystallization trial. The number of observations for a particular well in a trial is not necessarily the same as the number of observation sessions for the trial, since the user may choose not to make observations for all wells during an observation session.

When an active observation session is not taking place, any previous observation session can be viewed by selecting the observation session from the session list box. See FIG. 53 and the previous descriptor. The well ID observed flag becomes part of the record for a crystallization well, just like any crystallization results descriptor. After all the results have been completed for one well, and more results are to be entered for another well, the focus is moved to the next well, as functionally represented by steps 6814 and 6816. Thus results entering continues. If no more results are to be entered the program cycles to FIG. 55, step 5532.

After the results have been entered, a user can click on a commit command button 5411 to save the trial observation session to the database. The observation session is then time stamped, and is placed in a read only status. This is shown schematically by steps 5600 and 5602 in FIG. 56. As shown by step 5616, the program then cycles to FIG. 46. Alternatively, the user can click on a cancel command button 5412. This action is represented by step 5604 in FIG. 56. If the user clicks on the cancel command button, the data input during the recording session is canceled, as functionally represented by step 5606. Then the program cycles to FIG. 46 as shown by step 5608. If desired, a user can ask for help by clicking on help command button 5413, which opens the help files. This action is represented by steps 5610 and 5612 of FIG. 56.

Existing Trial Manager: Trial Observation Recording Tab: Trial Reports

Figures 69, 70:
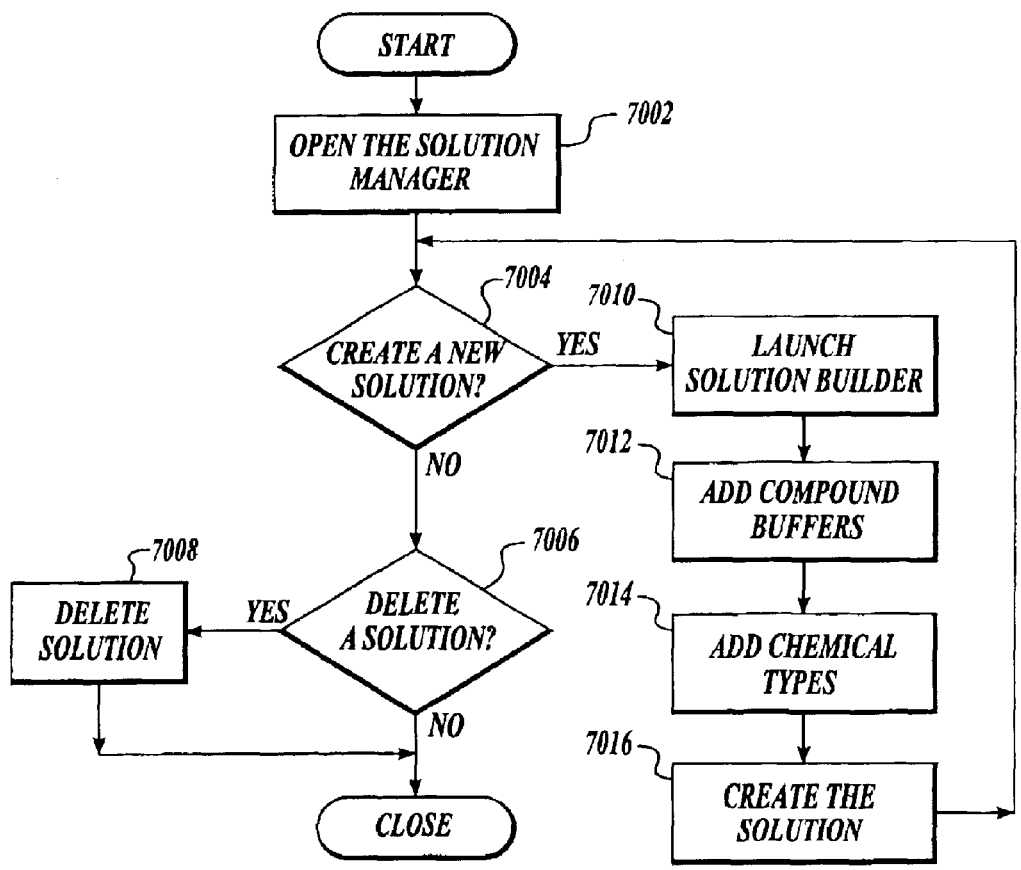
FIG. 69 shows a GUI for a session results builder according to the present invention.
FIG. 70 shows a generic functional flow diagram for a solution manager according to the present invention.

Crystallization reports, preferably in HTML format, are generated by embodiments of the present invention. To generate a report, a user opens a trial and clicks on a report command button 5303 (FIG. 53) on one side of the trial observation recording dialog window. As shown in FIG. 54, the report command button is not accessible if an active observation recording session is taking place. Clicking on the report command button opens a report type menu. Reports can be generated for a single well, for a single plate in a trial with multiple crystallization plates, and for all plates in the trial. Reports also can be generated for the open session in the trial or all sessions in the trial. Preferably, the reports include a header that contains all of the information in the trial properties tab of the trial, and the pictographical results of the trial. Preferably, when a report is generated, a browser, such as Microsoft's Internet Explorer, is launched, and the report appears in the browser window. Such report can easily be saved or printed using conventional browser controls. FIG. 69 is an example of a session report for all wells in a trial. For well reports, digital images captured for the well appear alongside the pictographical result. If reports are saved as HTML documents, preferably, subfolders and the folder to which the reports are saved are created. The subfolders should be designed to contain the images appearing in the report. If a report is saved as an HTML document, preferably, a subfolder called report files is automatically created in the save directory.

Solution Manager

The solution manager is used to create any solution to be used in setting up a crystallization trial, except for macromolecule formulations. A generalized functional flow diagram of the solution manager formed in accordance with this invention is illustrated in FIG. 70. FIG. 70 represents a sequence of steps which preferred embodiments of the present invention undertake to manage solutions. After the solution manager is opened 7002, a user is given the option to create a new solution 7004. If the user decides to create a new solution, a new solution builder is launched 7010. After launching, compound buffers can be added 7012. Other chemical types also can be added 7012. Further, a user has the option of creating and saving the new solution 7016, and returning to create other solutions. Alternatively, a user may delete a solution from the database 7006, 7008.

Figure 71:
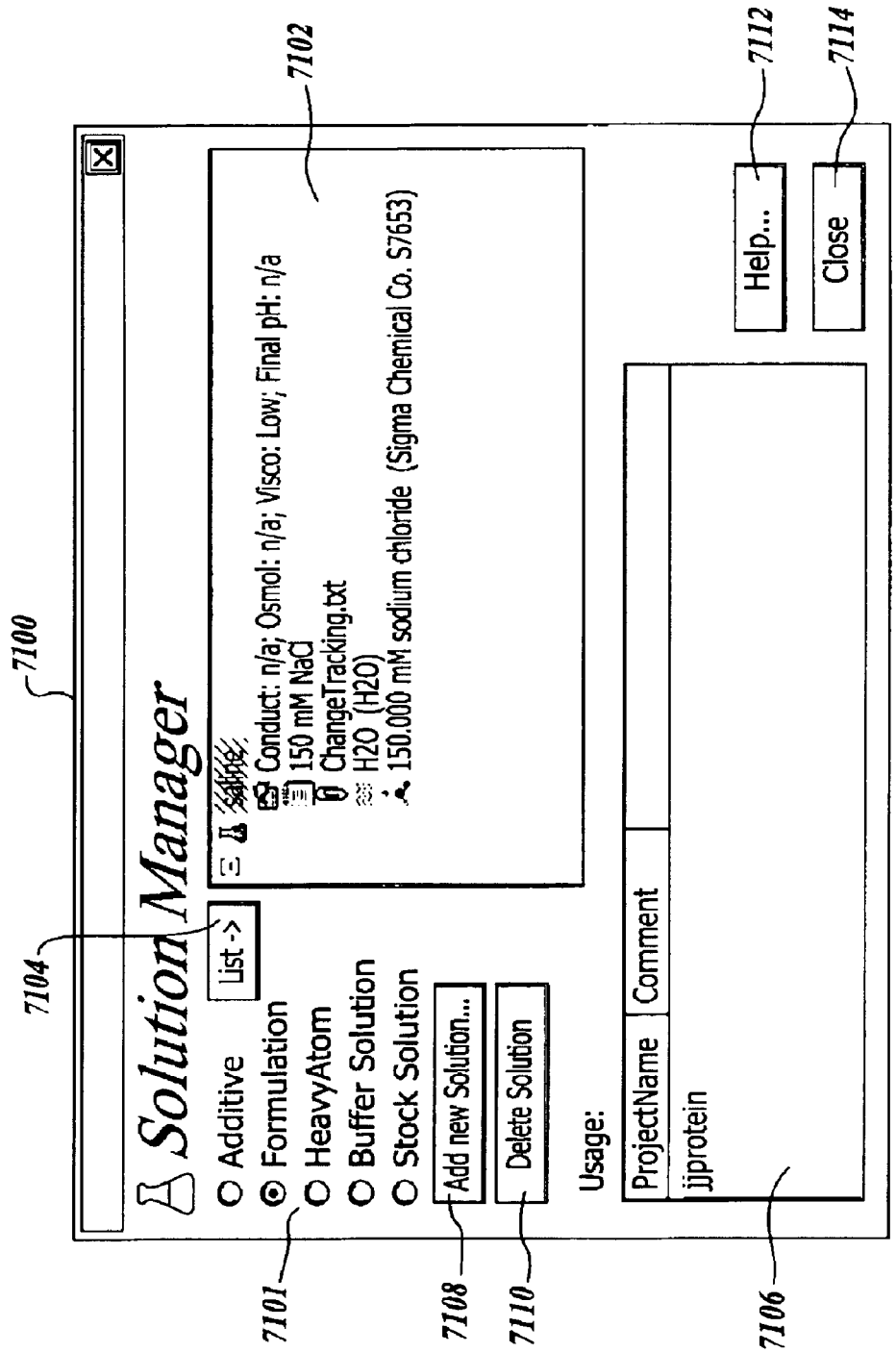
FIG. 71 shows a GUI for a solution manager according to the present invention.
Figure 72:
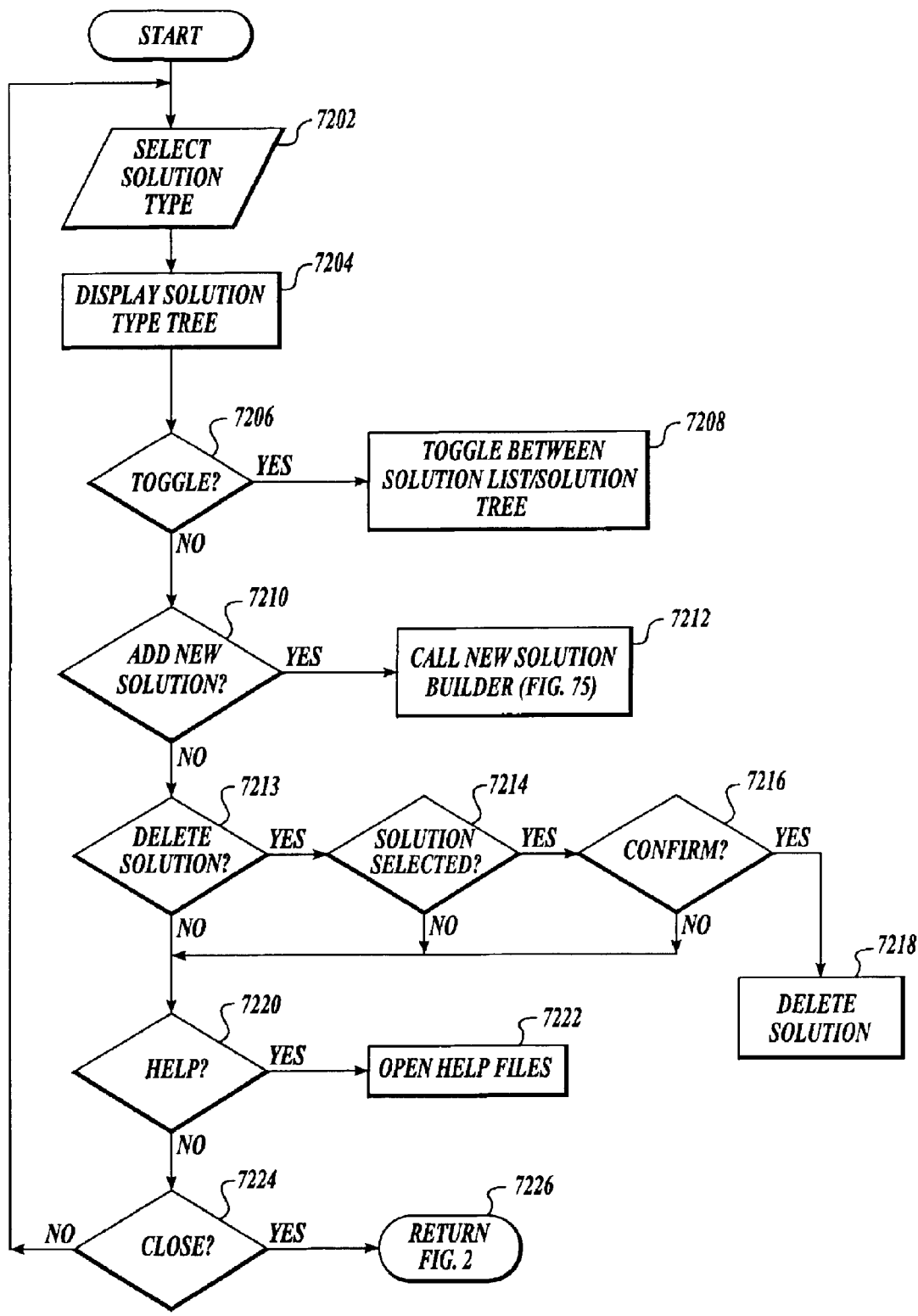
FIG. 72 shows a functional flow diagram for a solution manager according to the present invention.

A solution manager GUI or dialog window 7100 formed in accordance with the present invention is shown in FIG. 71. FIG. 72 is a functional flow diagram of a solution manager formed in accordance with this invention.

The solution manager dialog window 7100 illustrated in FIG. 71 includes a list box 7102 for displaying the solutions in a database. Step 7202 (FIG. 72) represents selecting a solution type. Preferably, software formed in accordance with the present invention is preloaded with various types of solutions, including, but not limited to: additive, formulation, heavy atom, buffer solution, and stock solutions. Moving a pointer over a selected one of a series of radio buttons 7101 and clicking on a solution, causes all of the solutions belonging to that category to be listed in the list box 7102. This action is represented by step 7204 of FIG. 72. In a conventional manner, the listed solutions can be expanded in a tree display manner to reveal the components of the solution, including its chemical composition, by clicking on a plus button located adjacent to a solution. Further, preferably, a user can toggle between a tree format and a list format by moving a pointer over a toggle command button 7104 and clicking. The list box 7102 shown in FIG. 71 displays solutions in list format with the solution attributes arranged in tabular form. The toggle action is represented by steps 7206 and 7208 in FIG. 72.

The solution manager dialog window shown in FIG. 71 also includes a usage box 7106. The usage box 7106 lists all projects associated with the selected solution. For example, when setting up a crystallization trial, a project is specified for the trial. If the selected solution has been specified for the trials, the projects will be listed in the usage box 7106.

The user can create or add a new solution by clicking on an add new solution command button 7108. This opens a new solution builder dialog window shown in FIG. 75 and described below. These functions are represented by steps 7210 and 7212 of FIG. 72.

Continuing on, if desired, a user can delete a solution by clicking on the delete solution command button 7110. This is shown by step 7213 in FIG. 72. After a solution has been selected for deletion (step 7214), the user is asked to confirm (step 7216). If the user confirms, the selected solution is deleted from the database (step 7218). The solution manager dialog window 7100 (FIG. 71) also includes a help command button 7112. Clicking the help command button 7112 opens the help file. This action is represented by steps 7220 and 7222 in FIG. 72. The solution manager dialog window is closed by clicking on a close command button 7114, i.e., a user using a cursor control device to move a pointer over the close command button and activating a key on the cursor control device. Closing the solution manager dialog window returns the user to the main manager dialog window (FIG. 2). This action is represented by steps 7224 and 7226 in FIG. 72. As shown by the return loop, the solution manager continuously cycles until a user's input is received.

Figure 73:
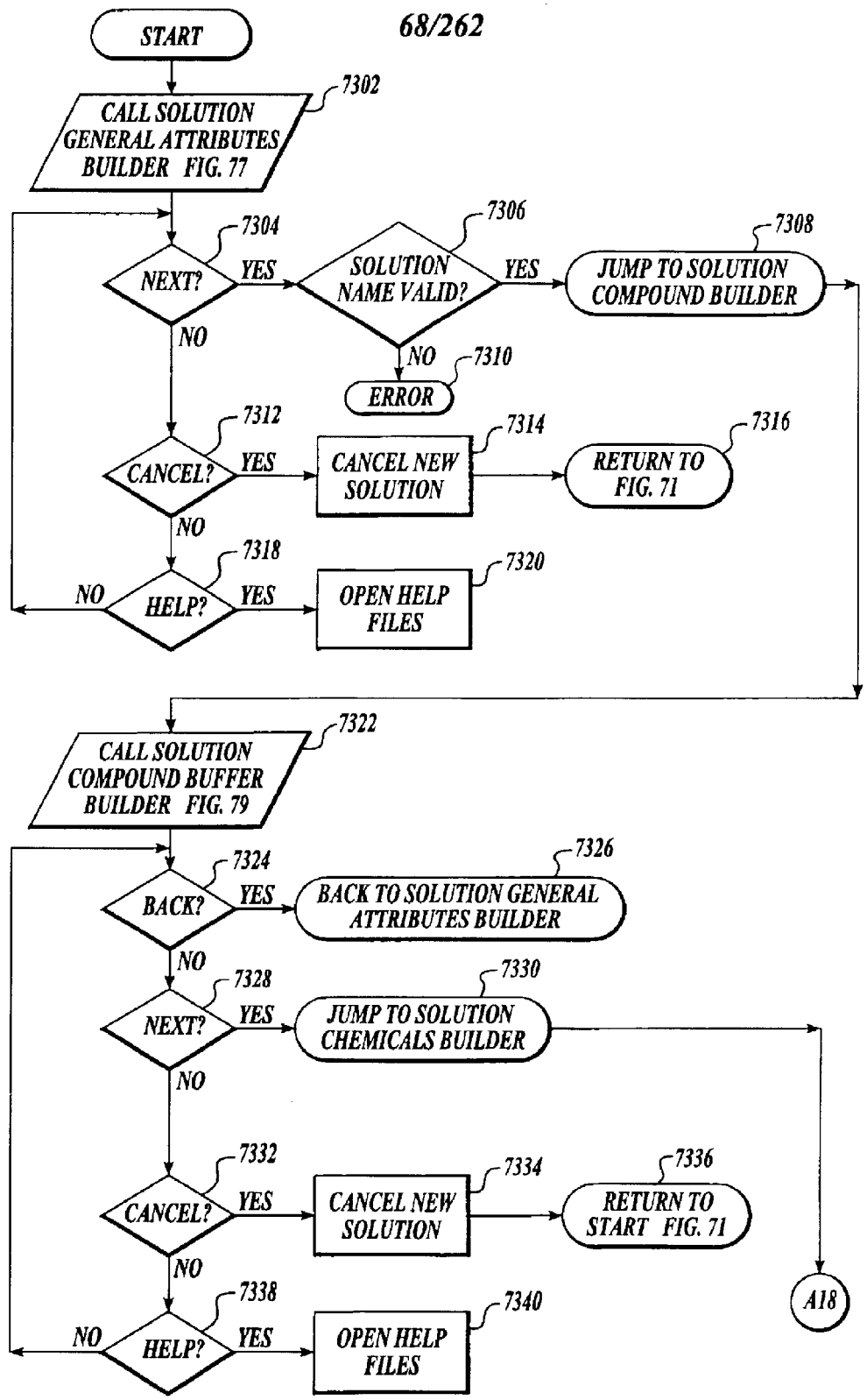
FIGS. 73–74 show a functional flow diagram for a new solution builder according to the present invention.
Figure 74:
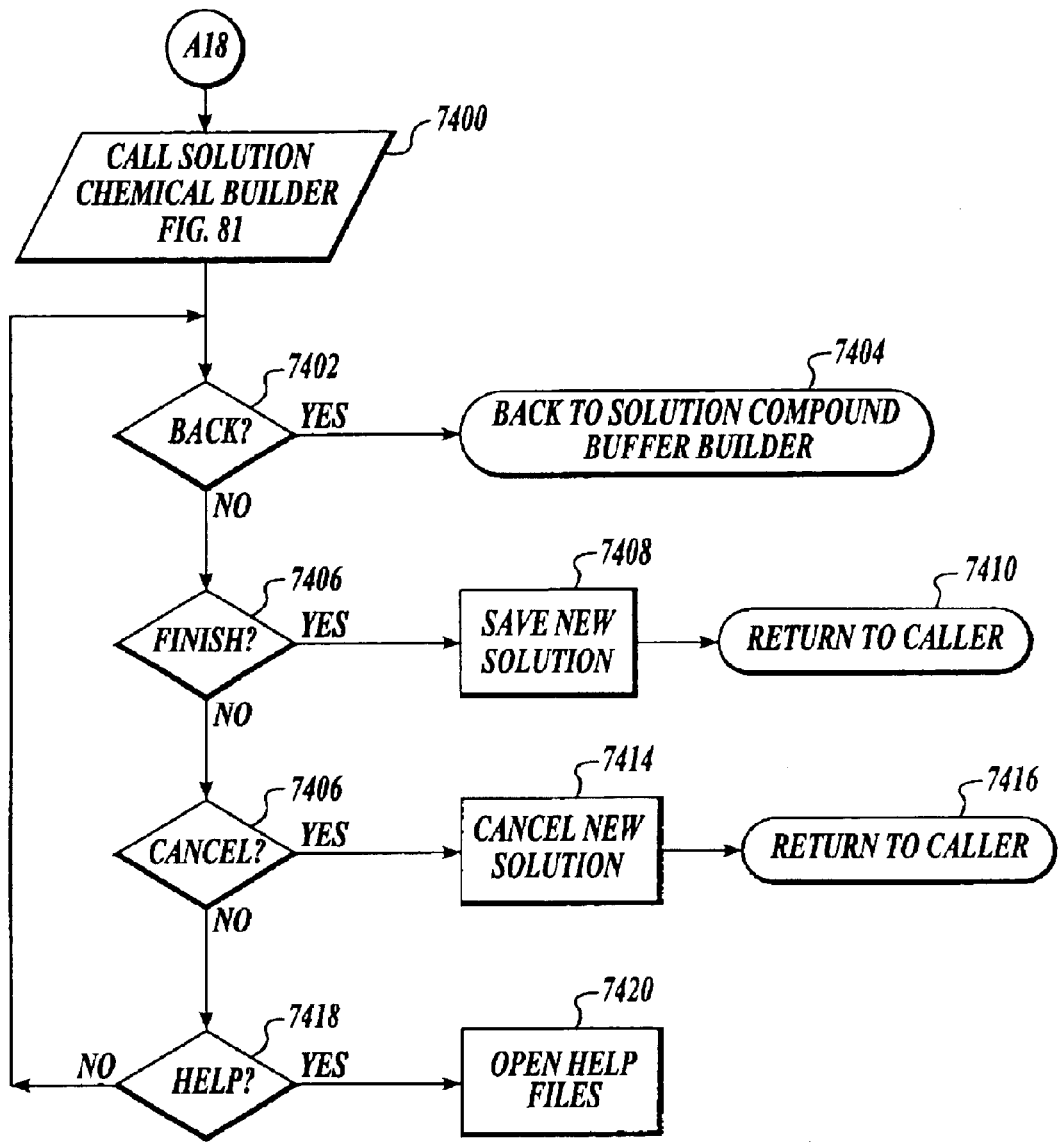

FIGS. 73 and 74 form a functional flow diagram illustrating a new solution builder formed in accordance with this invention. That is, FIGS. 73 and 74 show the sequence of executable steps performed by a new solution builder formed in accordance with the present invention. Execution of the functional flow diagram causes the launching of three builders all of which are described in detail below. The first builder is an enter solution general attribute builder, as represented by step 7302 of FIG. 73.

Solution Manager: Add New Solution Builder: Solution General Attributes Builder

Figure 75:
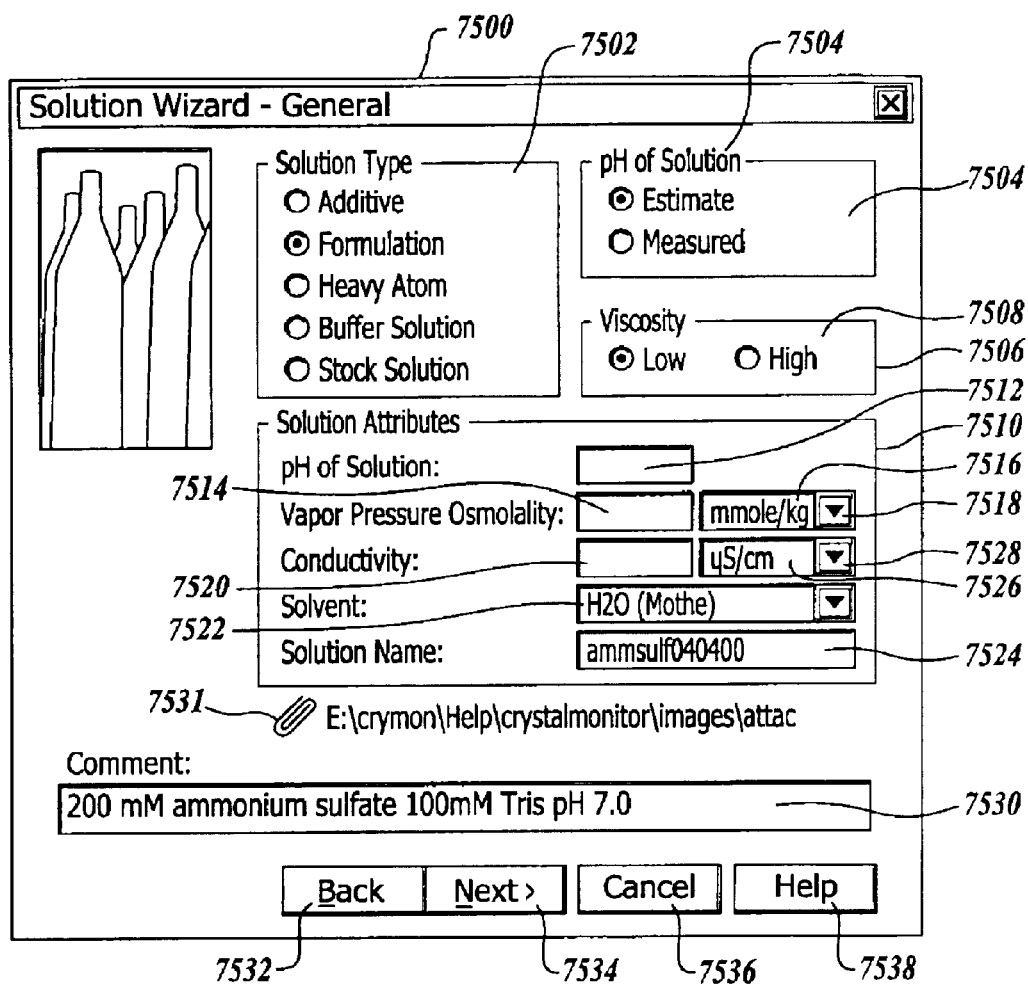
FIG. 75 shows a GUI for a solution general attributes builder according to the present invention.
Figure 77:
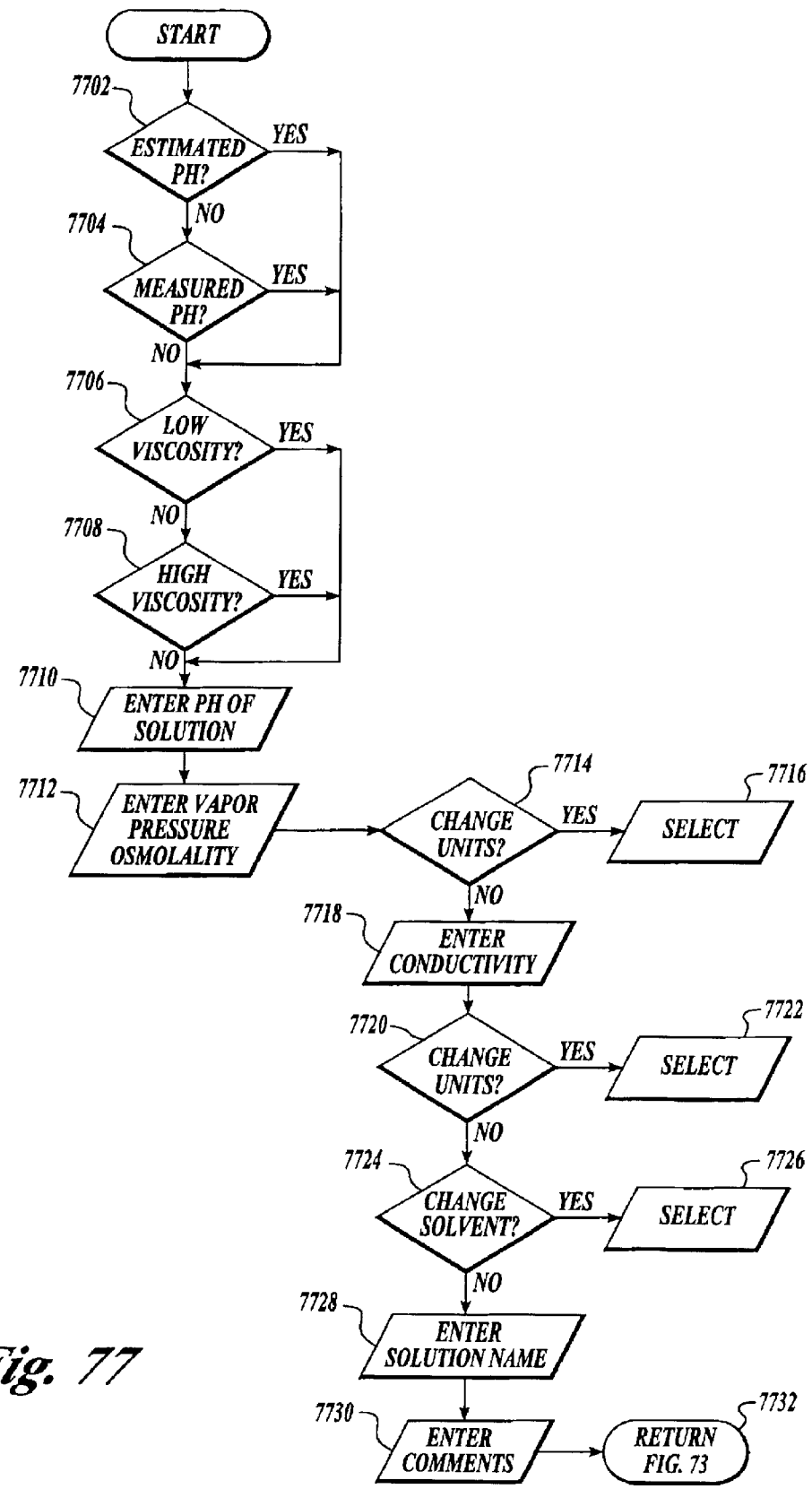
FIG. 77 shows a functional flow diagram for a new solution general attributes builder according to the present invention.

A solution general attributes builder dialog window 7500 formed in accordance with this invention is shown in FIG. 75 and a solution general attributes builder functional flow diagram is shown in FIG. 77. The solution general attributes builder dialog window includes a series of radio buttons 7502 for indicating solution type. While shown as radio buttons, a user cannot change the solution type from this dialog window. Rather a solution type can only be selected to changed from the solution manager dialog window (FIG. 71). FIG. 75 also includes a pair of pH of solution radio buttons 7504. One button is labeled "estimated" and the other button is labeled "measured." Clicking either of the radio buttons enters the related choice and cancels the other solution. This toggling is represented by steps 7702 and 7704 of FIG. 77.

The solution general attributes builder 7500 dialog window (FIG. 75) also includes high or low viscosity radio buttons 7506. Clicking either choice enters the selection and cancels the other selection. This toggling is represented by steps 7706 and 7708 of FIG. 77.

The solution general attributes builder dialog window 7510 also includes a plurality of field boxes 7510 for entering solution attributes. The field boxes include a pH of solution field box 7512. When selected, a user can enter a pH of solution value in the pH of solution field box using a keyboard or other suitable input device. This action is shown as step 7710 of FIG. 77.

The field boxes also include a vapor pressure osmolality field box 7514. When selected, a user can enter vapor pressure osmolality in the vapor pressure osmolality field box using a keyboard or other suitable input device. This action is represented as step 7712 of FIG. 77. The field boxes also include a vapor pressure osmolality units field 7516. The vapor pressure osmolality units field box is changed by clicking on a down arrow button 7518, which opens a drop down list of the available units. Clicking on the desired units enters the units into the vapor pressure osmolality unit field box 7516 and closes the list. This action is represented by steps 7714 and 7716 of FIG. 77.

The field boxes also include conductivity field box 7520 into which the conductivity of the solution is entered when the field box is selected via a keyboard or other suitable input device. This action is represented by step 7718 of FIG. 77. The field boxes also include a conductivity units field box 7526, which is changed by a user clicking on a down arrow button 7528. Clicking on the down arrow button 7528 opens a drop down list containing units conductivity choices. Clicking on a desired choice enters the choice into the conductivity units field box 7526 and closes the list. This action is represented by steps 7720 and 7722 of FIG. 77.

A user can enter a solvent name by clicking on a down arrow button 7530, which opens a list containing the names of the suitable solvents. Clicking on a solvent name enters the name into a solvent field 7522 and close the list box. This action is represented by steps 7724 and 7726 of FIG. 77.

A user also can enter a solution name in another field—the solution name field 7524. The solution name must be unique. This action is represented by step 7728 of FIG. 77. Finally, if desired, a user can add comments in a comment field 7530 by selecting this field and entering comments using a keyboard or other suitable input device. This action is shown as step 7730 in FIG. 77. Preferably the solutions general attributes builder can accept attachments created, for example, by dragging and dropping a file from a file manager, such as Microsoft's Windows Explorer, to an icon, such as the paperclip icon 7531. In a conventional manner such attachment are launched by double clicking on them. FIG. 76 illustrates a spreadsheet application, namely a Microsoft Excel spreadsheet used to calculate the amount of a chemical to use for a given volume of solution. In addition, if desired, instead of attaching a file, shortcuts to files can be attached. This allows the target file to be moved to another directory, with the shortcut keeping track of the file's location. Any common type of file, such as a Word document, an HTML page, or an image can be attached. Attachments may be removed by right clicking on the attachment and selecting clear, or in other conventional, well known manner.

When a user clicks on a next command button 7534 after entering all of the attributes of the solution, the program cycles to a solution compound buffer builder. This action is represented by step 7304 of FIG. 73. Such cycling only occurs if the solution has a valid name. If the solution name is not valid, an error message is produced. This action is represented by steps 7306, 7308, and 7310 of FIG. 73. The solution general attributes builder dialog window 7500 (FIG. 75) also includes a cancel command button 7536. Clicking on the cancel command button 7536 cancels the new solution and returns the user to the solutions manner dialog window 7100 (FIG. 71). This action is represented by steps 7312, 7314 and 7316 of FIG. 73. The solution general attributes builder dialog window 7500 also includes a help command button 7538. Clicking on the help command button 7538 opens the help file. This action is represented by steps 7318 and 7320 of FIG. 73.

Solution Manager: New Solution Builder: Solution Compound Buffer Builder

Figure 78:
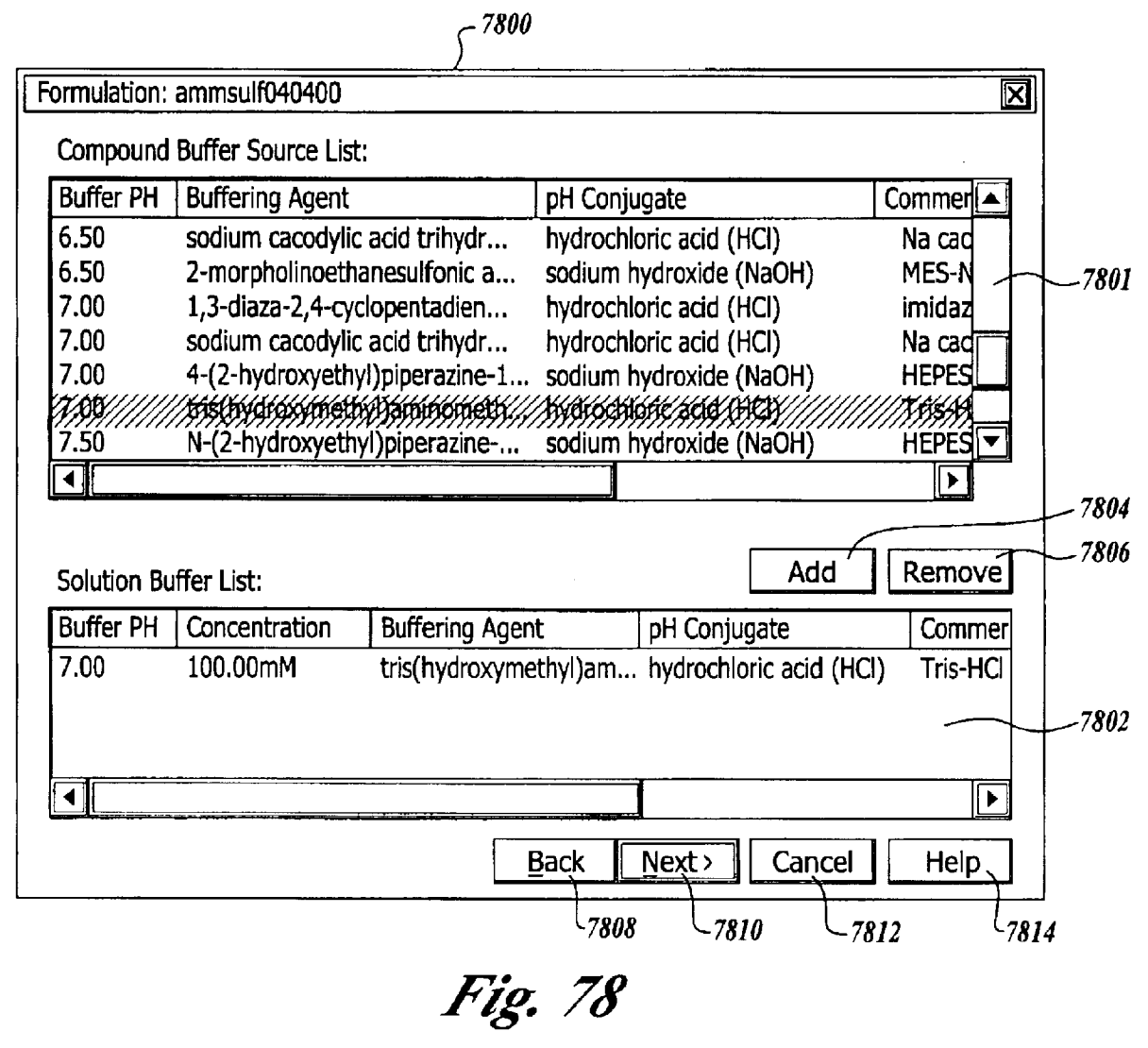
Figure 79:
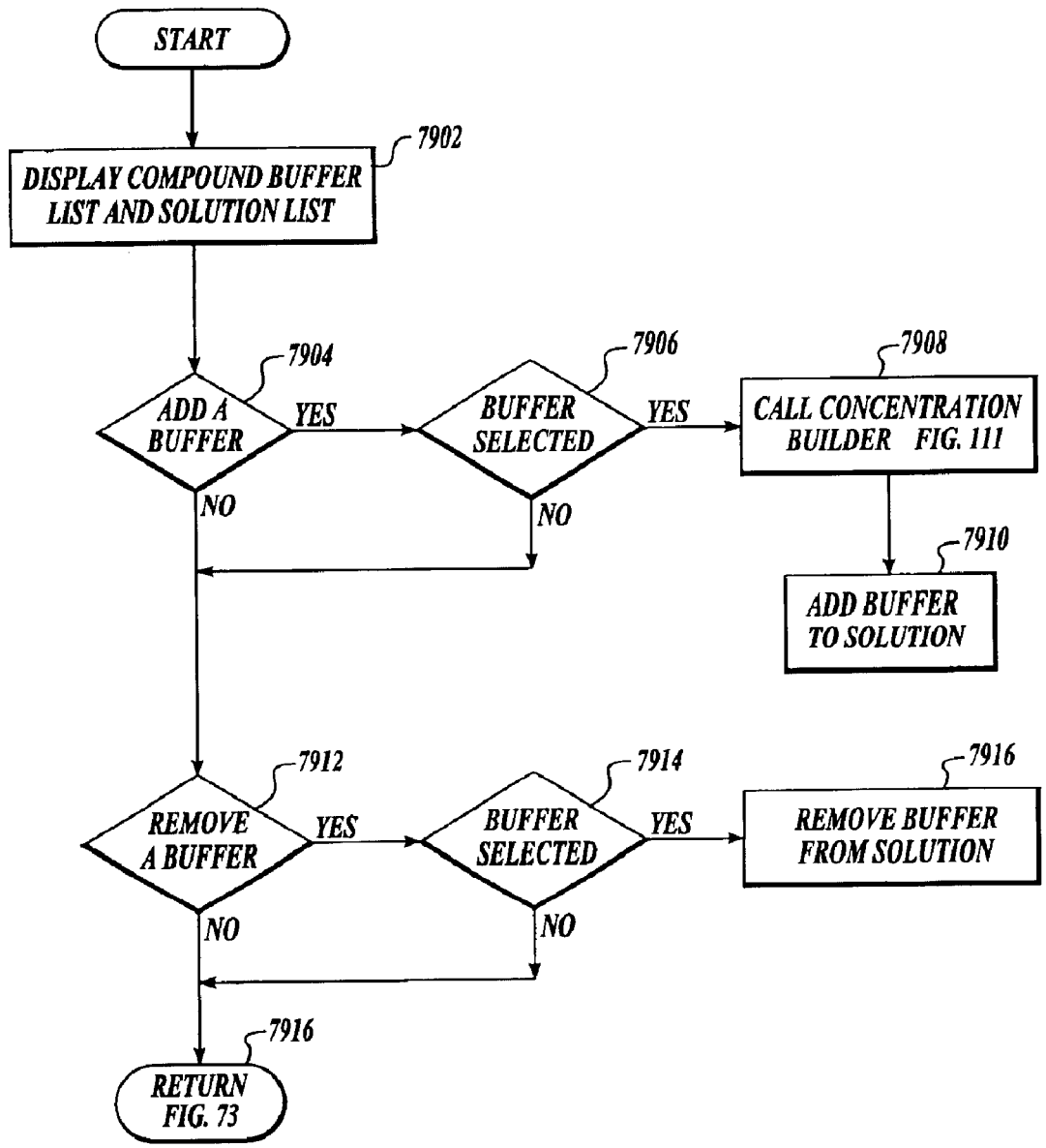
FIG. 79 shows a functional flow diagram for a solution compound buffer builder according to the present invention.

FIG. 78 illustrates an example of a solution compound buffer builder dialog window 7800 formed in accordance with this invention and FIG. 79 is a functional flow diagram of a solution compound buffer builder formed in accordance with this invention. The solution compound buffer builder dialog window 7800 includes a compound buffer source list box 7801. Each listed compound buffer includes a buffering agent and a pH conjugate. All of the available compound buffers are shown in the compound buffer source list box 7801. The action of displaying compound buffer source list is represented by 7902 of FIG. 79. The solution compound buffer builder dialog window 7800 (FIG. 78) also includes a solution buffer list box 7802 that displays the compound buffer systems added to a solution. Compound buffers may be added to a solution in one of two ways. In one method, double clicking on a compound buffer opens a dialog box where the buffer concentration is specified. Another method is to use an add command button 7804 in the solution compound buffer builder dialog window 7800. This action is represented by step 7904 of FIG. 79. After a compound buffer has been selected by highlighting the compound buffer, clicking on the add command button 7804 calls a concentration builder that is used to enter the concentration of the compound buffer. This action is represented by steps 7906 and 7908 of FIG. 79.

Figure 111:
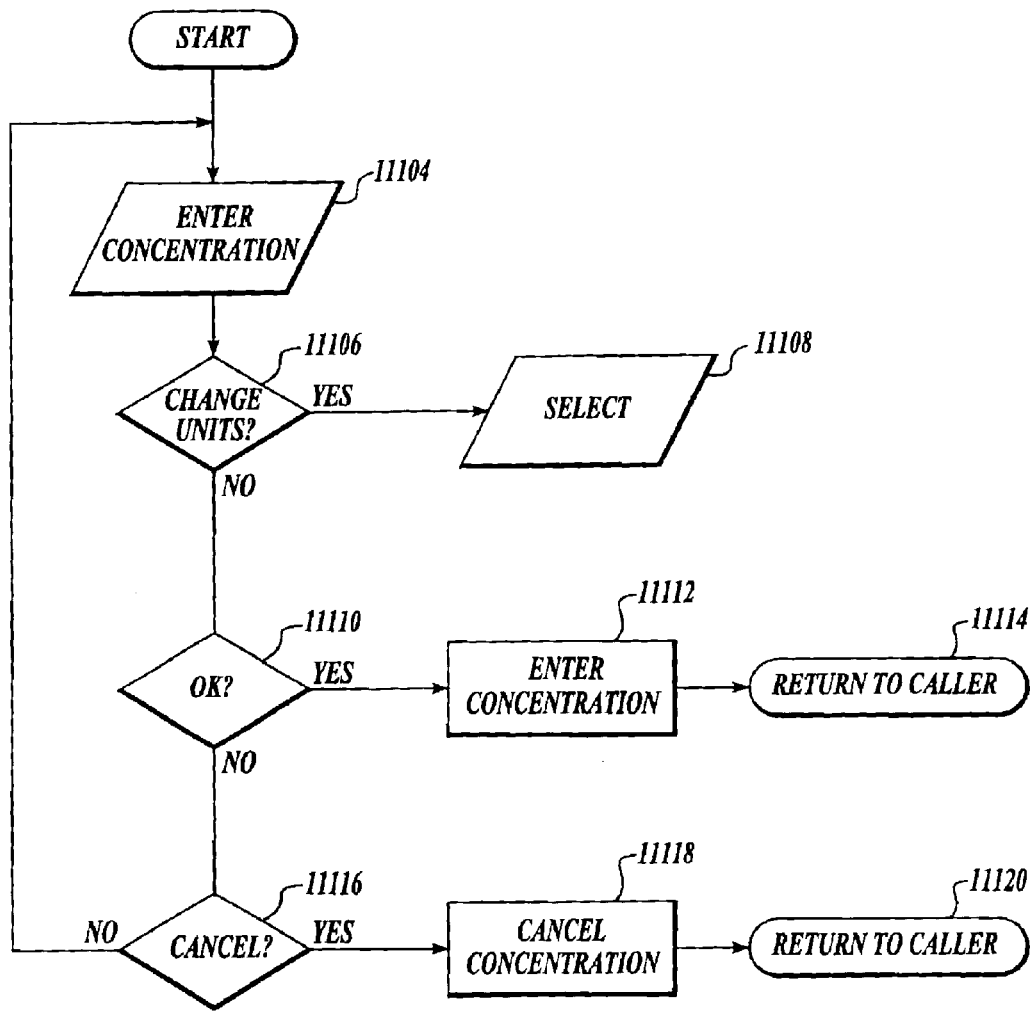
FIG. 111 shows a functional flow diagram for a concentration builder according to the present invention.

While a GUI or dialog window is not shown, a functional flow diagram of a suitable concentration builder is shown in FIG. 111. In step 11104, a concentration value is entered by a user using a keyboard or other suitable input device. If desired, the user can change units by clicking on a down arrow button. Clicking on the button opens a list of concentration units. As with prior windows, clicking enters the desired units into a unit field box and closes the list. This is shown as steps 11106 and 11108 in FIG. 111. Clicking an OK command button enters the concentration and solution in the solution buffer list 7802 of FIG. 78 and closes the concentration dialog window. Clicking a cancel command button cancels the concentration before closing the concentration dialog box and returns to the add compound buffer builder dialog window 7800 (FIG. 78). This action is represented by steps 11116, 11118, and 11120 of FIG. 111.

Returning to FIG. 78, the solution compound buffer builder dialog window 7800 also includes a remove command button 7806. Clicking on the remove command button 7806 removes a buffer from the solution buffer list 7802, provided a buffer has been selected, e.g., highlighted. This action is represented by steps 7912, 7914, and 7916 of FIG. 79.

The add compound buffer builder dialog window 7800 also includes a back command button 7808. Clicking on the back command button 7808 returns the user to the solution general attributes builder dialog window 7500 (FIG. 75). This is represented by steps 7324 and 7326 of FIG. 73. The solution compound buffer builder dialog window also includes a next command button 7810. Clicking on the next command button cycles the program to a solution chemicals builder. This is shown by steps 7328 and 7330 in FIG. 73. The solution compound buffer builder dialog window 7800 also includes a cancel command button 7812. Clicking on the cancel command button 7812 cancels the new solution and returns the user to the solution manager dialog window 7100 (FIG. 71). This action is functionally represented by steps 7332, 7334 and 7336 of FIG. 73. Finally, the solution compound buffer builder dialog window 7800 also includes a help command button 7814. Clicking on the help command button 7814 opens the help file. This action is represented by steps 7338 and 7340 of FIG. 73.

Solution Manager: New Solution Builder: Solution Chemicals Builder

Figure 80:
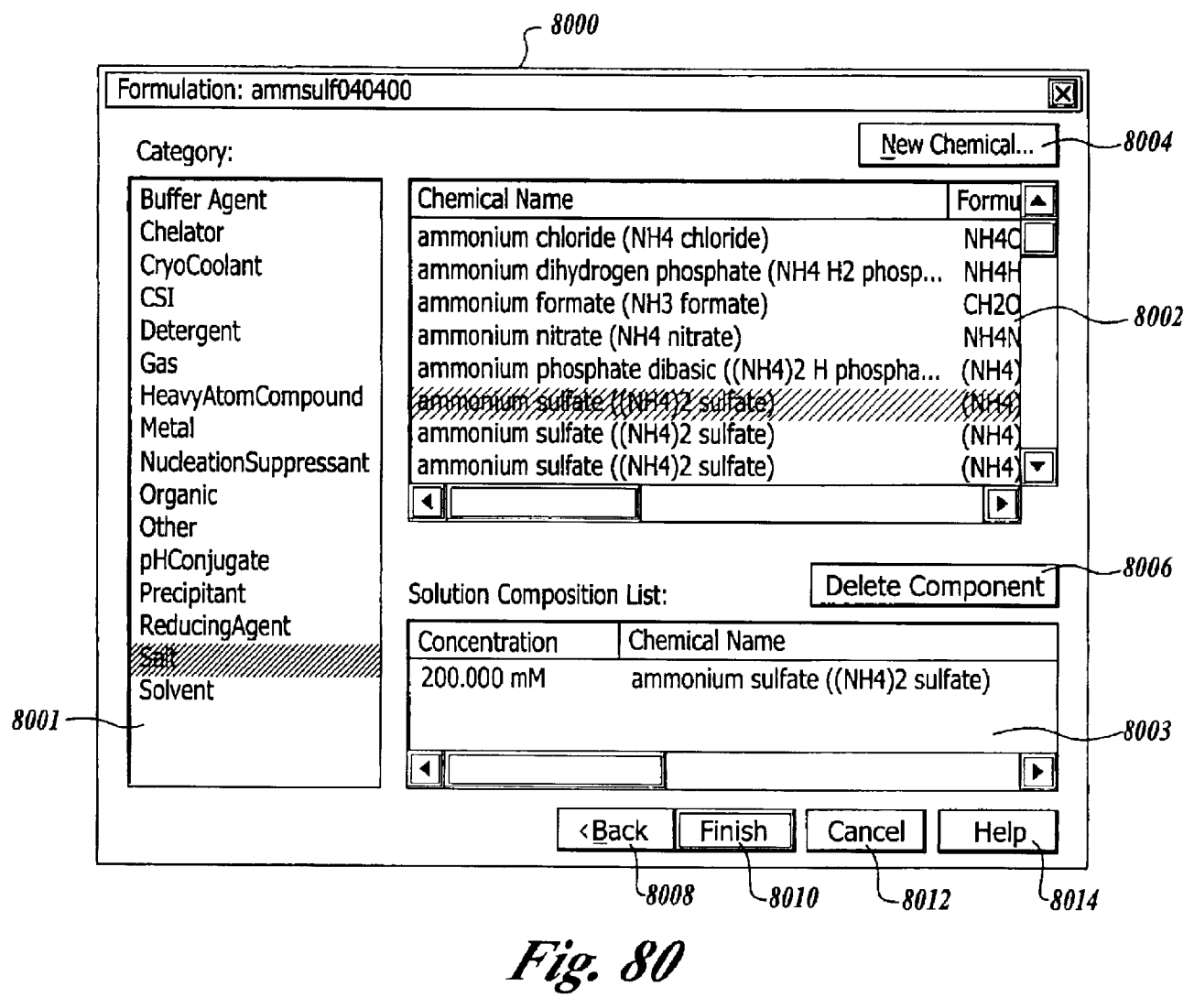

An solution chemicals builder dialog window 8100 formed in accordance with this invention is shown in FIG. 80 and a solution chemicals builder functional flow diagram formed in accordance with this invention is shown in FIG.

81. FIG. 80 displays lists of available chemicals. More specifically, a list of chemical categories 8001 is located on one side, e.g., the left side of the solution chemicals builder dialog window. A list of all of the chemicals in a chosen category 8002 is located on the other side, e.g., the right side of the solution chemicals builder dialog window. Below the chemical list 8002 is a solution composition list 8003 which displays the chemicals added to a solution.

Figure 81:
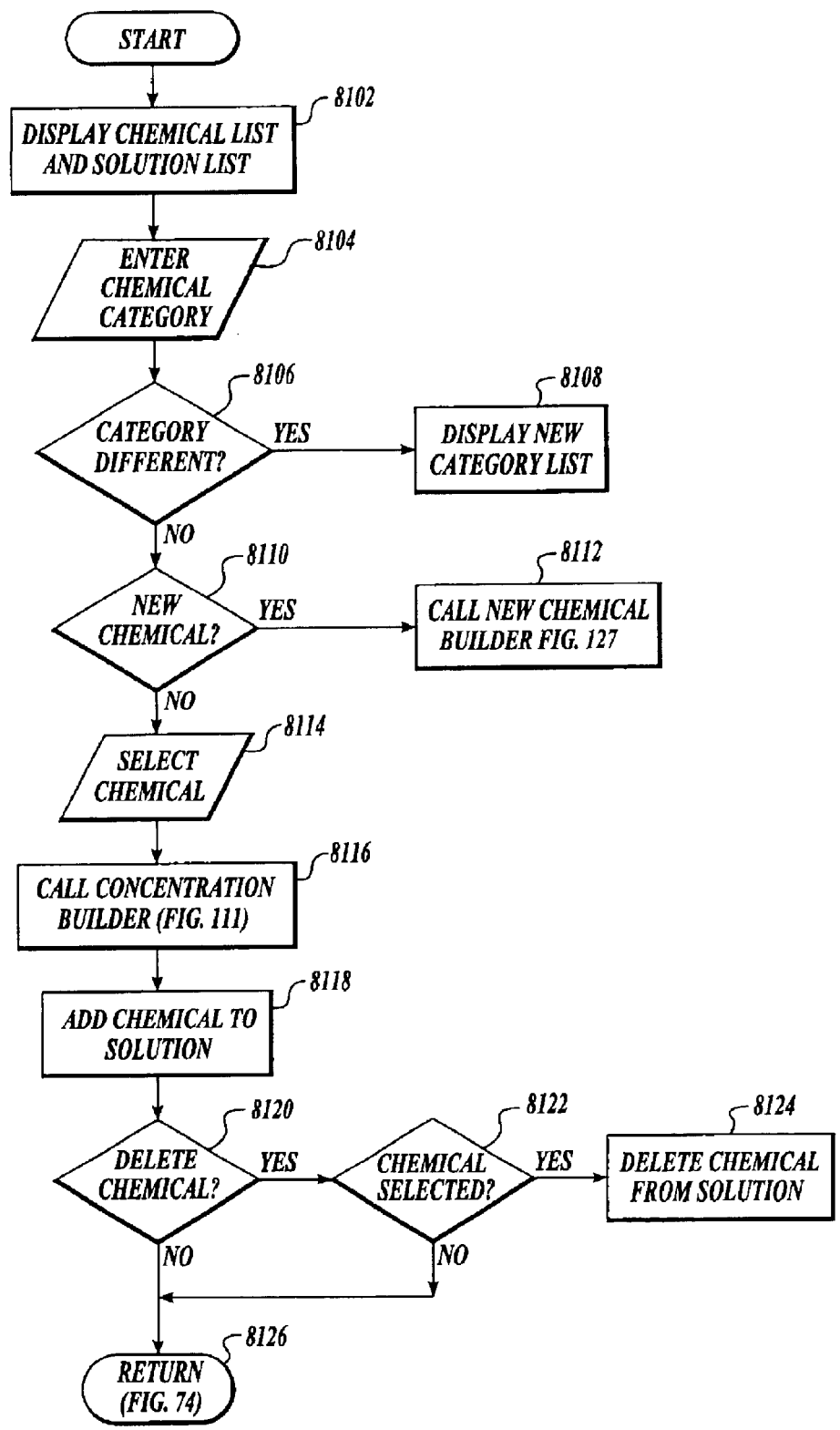
FIG. 81 shows a functional flow diagram for a solution chemical builder according to the present invention.

Turning to FIG. 81, displaying the category, chemical and solution lists represented by step 8102. In a conventional manner, a user selects a chemical category by clicking on the category. This is represented by step 8104 of FIG. 81. Clicking on a different category causes all of the chemicals in the database for that category to be displayed in the chemical list 8002. This action is represented by steps 8106 and 8108 of FIG. 81. If the user cannot find a desired chemical, the user can add a new chemical by clicking on the new chemical command button 8004. Clicking on the new chemical command button 8004 calls or launches a chemical builder illustrated in functional form in FIG. 127 and described below. This action is represented by steps 8110 and 8112 of FIG. 81.

A user can select a chemical from the chemical list by clicking on it. This action is represented by step 8114 of FIG. 81. Double clicking on the chemical calls a concentration builder (FIG. 111), which as described above allows the user to specify the concentration of the chemical to be used in the solution. This action is represented by step 8116 of FIG. 81.

The solution chemical builder dialog window 8000 also includes a delete component compound button 8006, which is used to delete a chemical from the solution list. First, a user selects a chemical in the solution list box 8003 by clicking on the selection. Then the user clicks the delete component command button. Clicking on the delete component command button erases the selected component from the solution list 8003. Multiple chemicals and buffer systems are added and deleted in the foregoing manner to the solution composition list 8003. Any number of chemicals can be used to make a solution, unless the solution is a stock solution. Stock solutions are solutions which contain only a single buffer system or chemical and cannot be changed, or changes are limited. Stock solutions are useful for creating recipes for crystallization matrices.

Referring again to FIG. 80, the solution chemical builder dialog window 8000 also includes a back command button 8008. As shown in FIG. 74, clicking on the back command button 8008 cycles the program back to the solution compound buffer builder. This action is represented by steps 7402 and 7404. The solution chemical builder dialog window 8000 also includes a finish command button 8010. Clicking on the finish command button 8010 saves the new solution and cycles the program to the solution manager dialog window 7100 (FIG. 71). Thereafter, the solution manager dialog window will display the newly created solution in the solution list box 7106. This action is represented by steps 7406, 7408, and 7410 of FIG. 74. Referring again to FIG. 80, the solution chemical builder dialog window also includes a cancel command button 8012. Clicking on the cancel command button 8012 cancels the new solution and cycles the program to the solutions manager dialog window 7100 (FIG. 71). This action is represented by steps 7412, 7414, and 7416 of FIG. 74. Returning again to FIG. 80, the dialog window also includes a help command button 8104. Clicking on the help command button 8104 opens the help file. This action is represented by steps 7418 and 7420 of FIG. 74.

Matrix Manager

Figure 82:
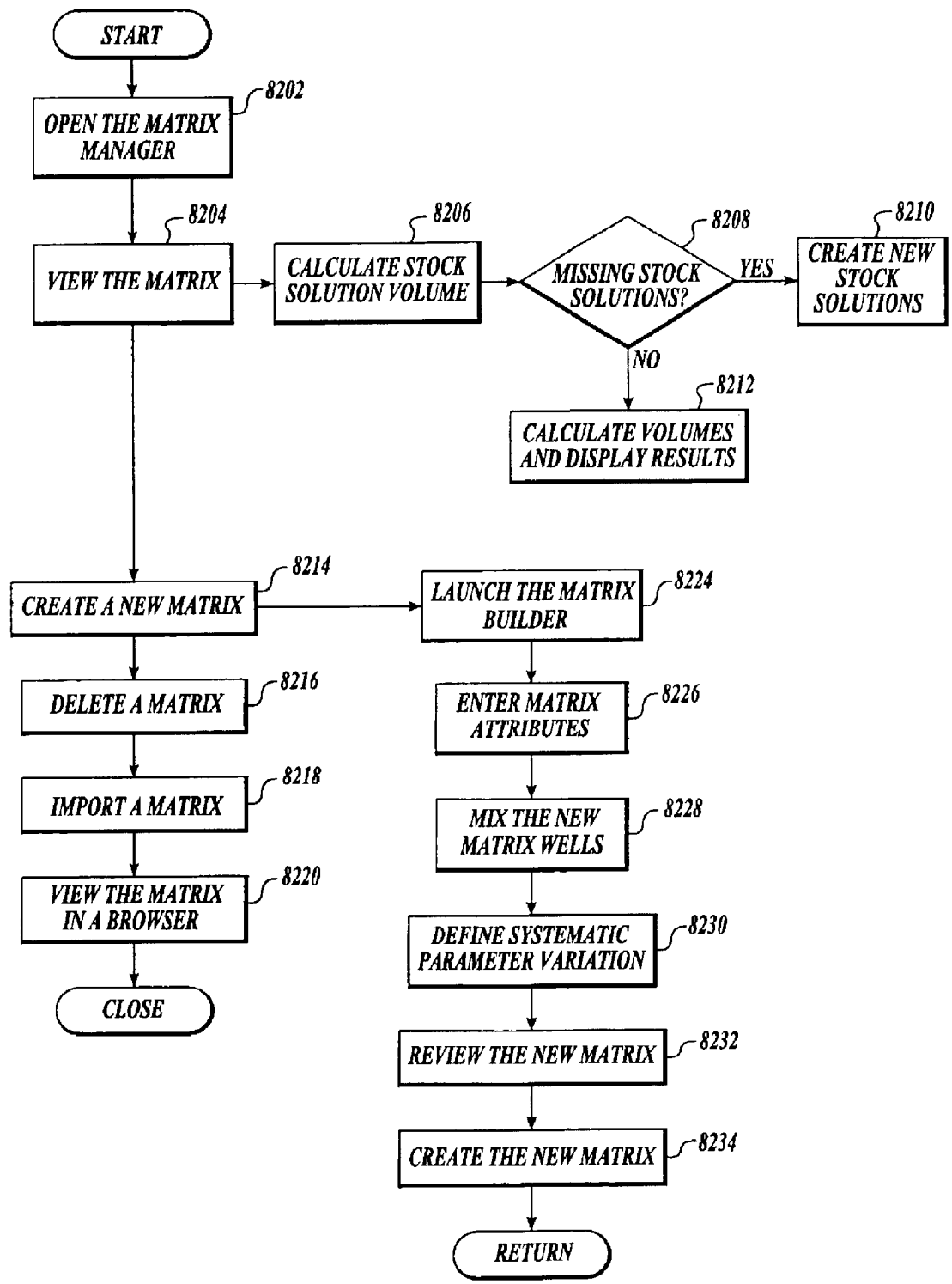
FIG. 82 shows a generic functional flow diagram for a matrix manager according to the present invention.

The matrix manager creates new matrices of crystallization solutions, either from scratch or by modifying existing crystallization screens. The general operation of the matrix manager is represented by a functional flow diagram shown in FIG. 82. More specifically, FIG. 82 illustrates a sequence of general steps that are carried out by a matrix manager formed in accordance with the present invention. When the matrix manager is opened or launched 8202, a list of all the matrices in the database is displayed for viewing 8204. If desired, a user can create a new matrix 8214. Or, a user can delete a matrix 8216. Or, a user can import a matrix 8218. If desired, a user can view a matrix in a browser format 8220.

If desired, a user can access a number of tools for calculating the stock solution volume 8206. If any stock solutions are not residing in the database 8208, a user can create new solutions 8210. A user can also calculate volumes and display results 8212. A user also can launch a new matrix builder 8224. After launching, a user can enter matrix attributes 8226, user mix new matrix wells 8228, define systematic parameter variations 8230, review the new matrix 8232, and create (and save) the new matrix 8234.

Figure 83:
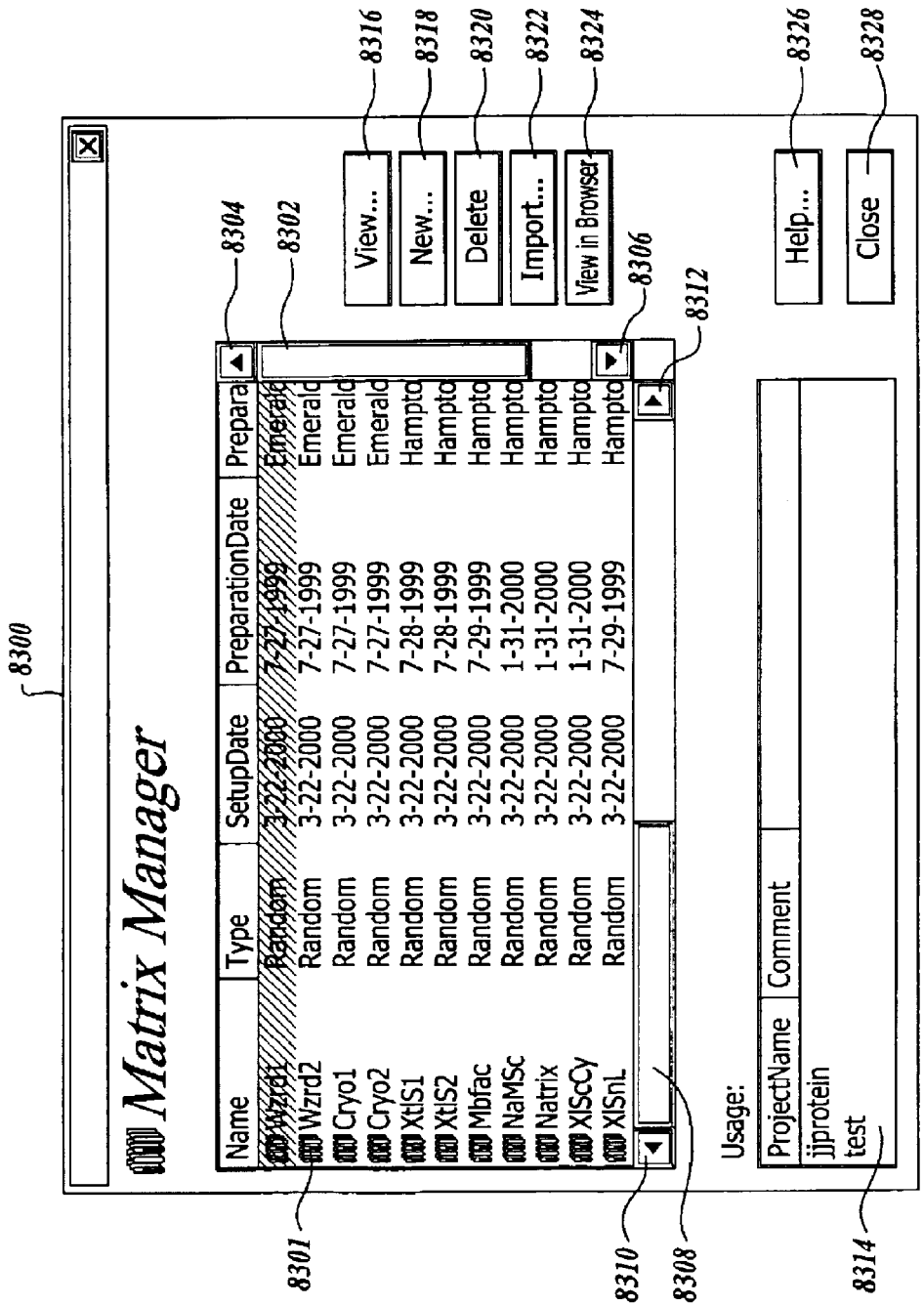
FIG. 83 shows a GUI for a matrix manager according to the present invention.
Figure 84:
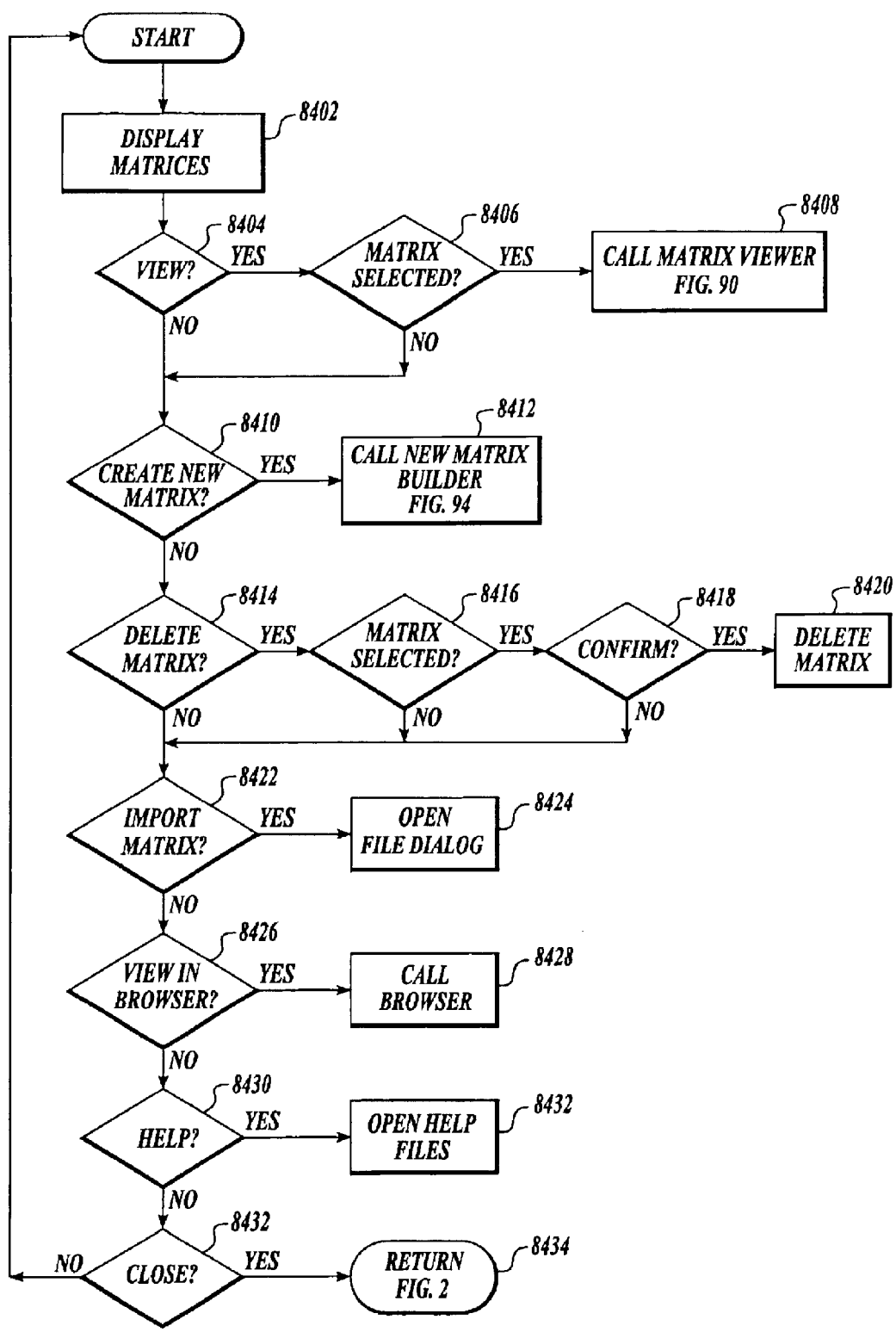
FIG. 84 shows a functional flow diagram for a matrix manager according to the present invention.

FIG. 83 is a matrix manager GUI or dialog window 8300 formed in accordance with this invention and FIG. 84 is a functional flow diagram of a matrix manager formed in accordance with this invention. The matrix manager dialog window 8300 includes a matrix list box 8301 showing all of the matrices in the database in tabular format. The table includes matrix attributes such as name, type, setup date, preparation date, preparator, number of conditions, number of columns, and comments. Located on one side, e.g., the right side, of the matrix list box 8301 is a vertical scroll bar 8302. Located above and below the vertical scroll bar are an up arrow button 8304 and a down arrow button 8306 respectively. In a conventional manner, a user can scroll through the matrix list by clicking on either the up or the down arrow button or moving the vertical scroll bar 8302 up or down. The matrix list box also includes a horizontal scroll bar 8308. Located to the left and right of the horizontal scroll bar are a left arrow button 8310 and a right arrow button 8312, respectively. In a conventional manner, a user can scroll the matrix list box 8301 to the left or right either by clicking on the left or the right arrow buttons or by moving the horizontal scroll bar 8308 to the left or right.

The matrix manager dialog window 8200 (FIG. 82) also includes a usage list box 8314. Selecting a matrix in the matrix list box 8301 by clicking on it displays all the projects associated with the matrix in the usage list box 8314. Double clicking on a matrix in the matrix list box displays all of the crystallization conditions of the matrix in the usage list box. Hovering a pointer over a condition causes the composition of the condition to be displayed.

The matrix manager dialog window 8300 also includes a plurality of command buttons, which are described below. As with prior dialog windows, clicking on a command button causes the matrix manager to perform a function.

Turning now to FIG. 84, when the matrix manager is opened or launched, the matrix list box 8301 is displayed. This action is represented by step 8402 of FIG. 84. If a user desires to view a matrix, he or she can do so by clicking on a view command button 8316. This action is illustrated in step 8404 of FIG. 84. If a matrix was selected by the user (by single clicking on the matrix), a matrix viewer is launched. See steps 8406 and 8408. Otherwise, the matrix manager awaits further user input.

If a user desires to create a new matrix, he or she can do so by clicking on a new command button 8318. This action is represented by step 8410 in FIG. 84. Clicking on the new command button 8318 launches a new matrix builder as shown by step 8412 of FIG. 84.

If a user desires to delete a matrix, he or she can do so by clicking on the delete command button 8320. This action is illustrated by step 8414 of FIG. 84. If a matrix was previously selected by a user, in step 8416, a confirm message box appears. See step 8418. If the user confirms that the matrix is to be deleted, the matrix is deleted from the database as shown by step 8420.

If a user desires to import a matrix, he or she can do so by clicking on an import command button 8322. This action is illustrated in step 8422 of FIG. 84. Clicking on the import command button 8322 opens a file dialog window that allows the user to select a directory from which to import the matrix. This action is illustrated by step 8424 in FIG. 84.

If the user desires to view a matrix in browser format, he or she can do so by clicking on a view in browser command button 8324. This action is represented by step 8426 of FIG. 84. Clicking on the view in browser command button 8324 opens a browser, such as Microsoft Internet Explorer®. This action is illustrated by step 8428 of FIG. 84.

If the user needs help, he can obtain help by clicking on a help command button 8326. This action is illustrated by step 8430 in FIG. 84 and results in the help file being opened, step 8432.

If the user wants to close the matrix manager dialog window, he or she can do so by clicking on a close command button 8328. Clicking on the close command button 8328 closes the matrix manager dialog window 8200 (FIG. 82), and the user returns to the main manager dialog window (FIG. 2). This action is illustrated by step 8434 of FIG. 84.

Matrix Manager: Matrix Viewer

Figure 90:
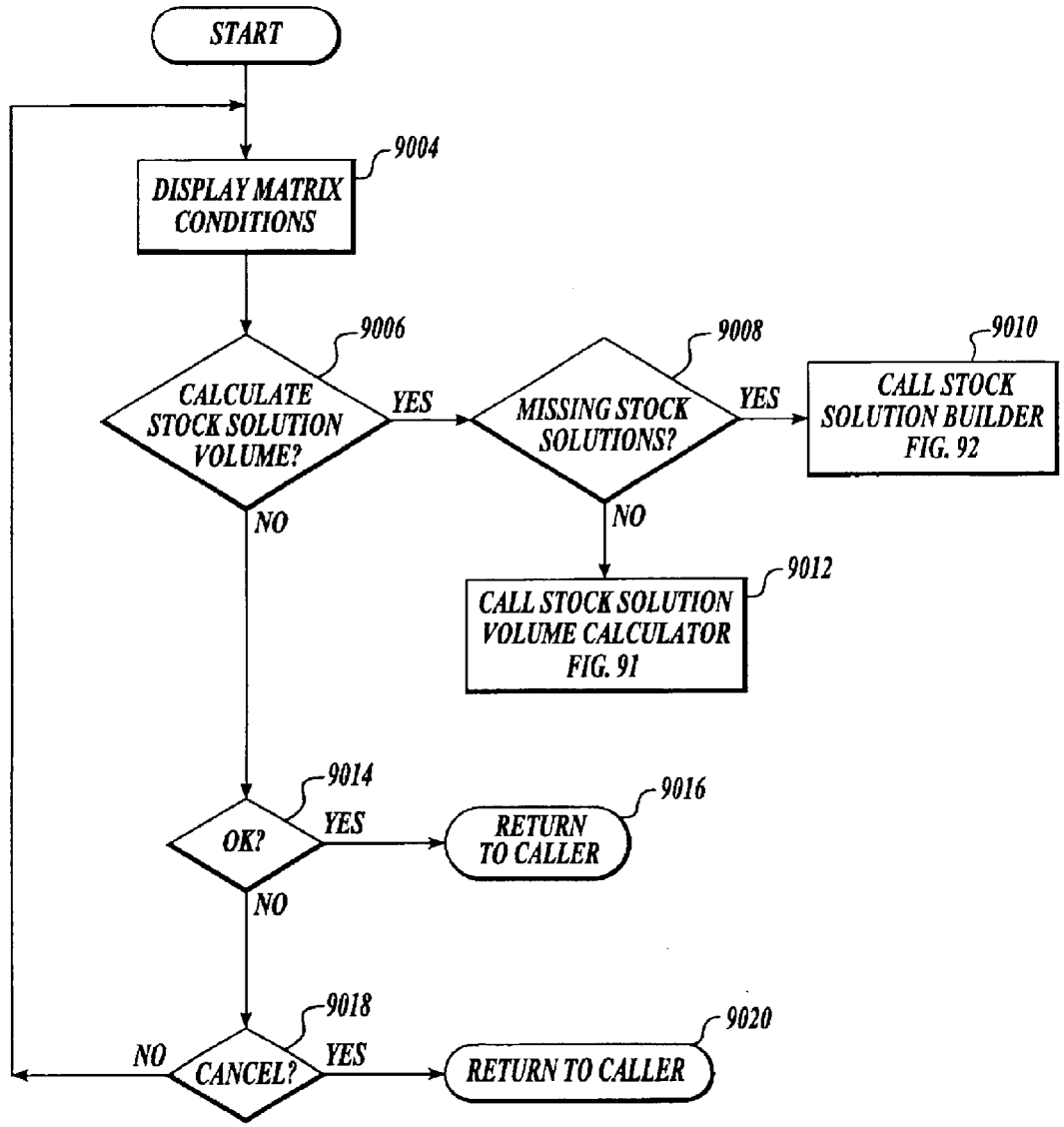
FIG. 90 shows a functional flow diagram for a matrix viewer according to the present invention.

FIG. 85 is an example of a matrix viewer GUI or dialog window 8500 formed in accordance with the present invention and FIG. 90 is a functional flow diagram of a matrix viewer formed in accordance with the present invention. Referring to FIG. 85, the matrix viewer dialog window includes a matrix list box 8501 that shows the grow conditions of individual wells of the matrix. On one side, e.g., the right side, of the matrix viewer dialog window 8500 are matrix attributes 8502. The illustrated matrix attributes include matrix name, matrix type, commercial, preparator, a systematically varied parameter along the X axis, a systematically varied parameter along the Y axis and comment. Each of the attributes includes an associated field box. The matrix viewer display is represented by step 9004 of FIG. 90. A user can calculate a stock solution volume by clicking on a calculate stock solution volume needed command button 8502. In this regard, it is useful to have recipes for crystallization matrices listing the volumes of available stock solutions required to make the various crystallants of a matrix. The stock solution calculator is used to generate stock solution recipes for crystallization matrices stored in a database. Clicking on the calculate stock solution volume needed command button 8502 opens the stock solution calculator. The database is searched for the availability of the necessary stock solutions. A stock solution is valid for the current matrix if the stock solution has the same chemical ID, as defined by the chemicals catalog and CAS numbers, and the same concentration units as the chemical used in the matrix.

The action of clicking on the calculate stock solution volume needed command button 8502 is shown by step 9006 of FIG. 90. As shown by step 9008, if a chemical is missing from any of the stock solutions required, a stock solution builder is launched. This action is represented by step 9010. If nothing is missing a stock solution calculation is launched. This action is represented by step 9012.

Figure 86:
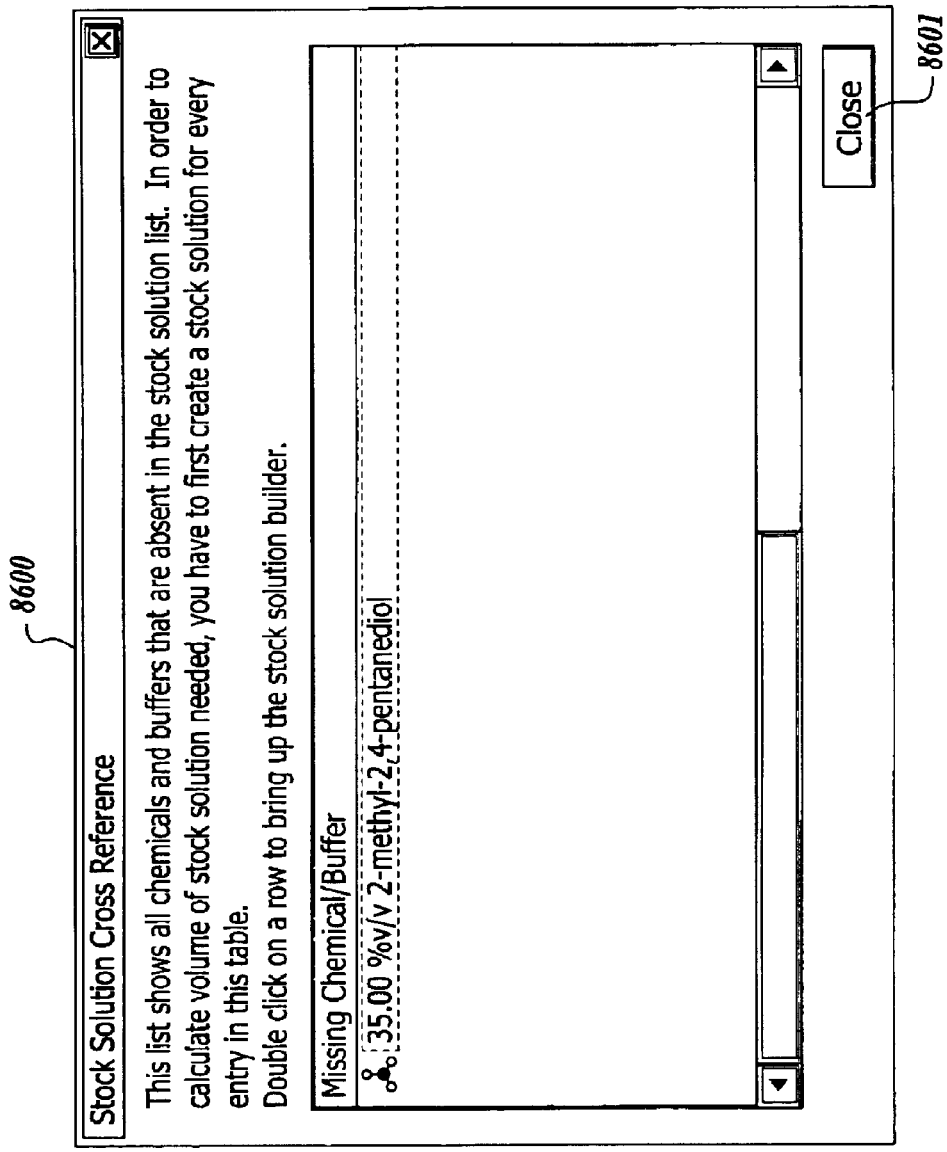
FIG. 86 shows a GUI for a stock solution cross-reference builder according to the present invention.

Chemicals for which no valid stock solutions are available in the database are listed in a stock solution cross reference dialog window, such as FIG. 86, which opens when the stock solution builder is launched. Double clicking on a listed chemical opens the stock solution dialog window shown in FIG. 87 which, as discussed below, is used to create the necessary stock solution.

Matrix Manager: Matrix Viewer: Stock Solution Builder

Figure 87:
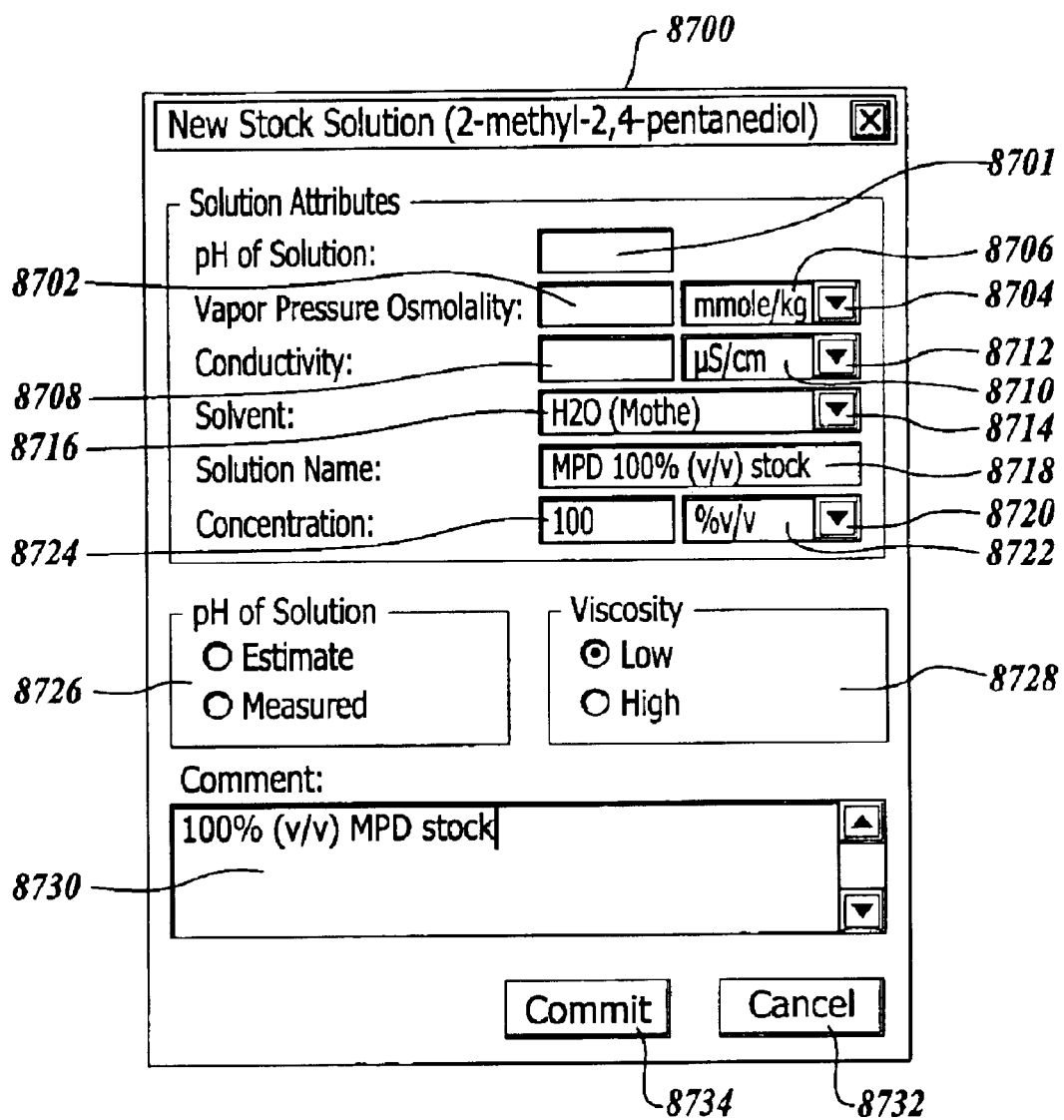
FIG. 87 shows a GUI for a stock solution builder according to the present invention.
Figure 92:
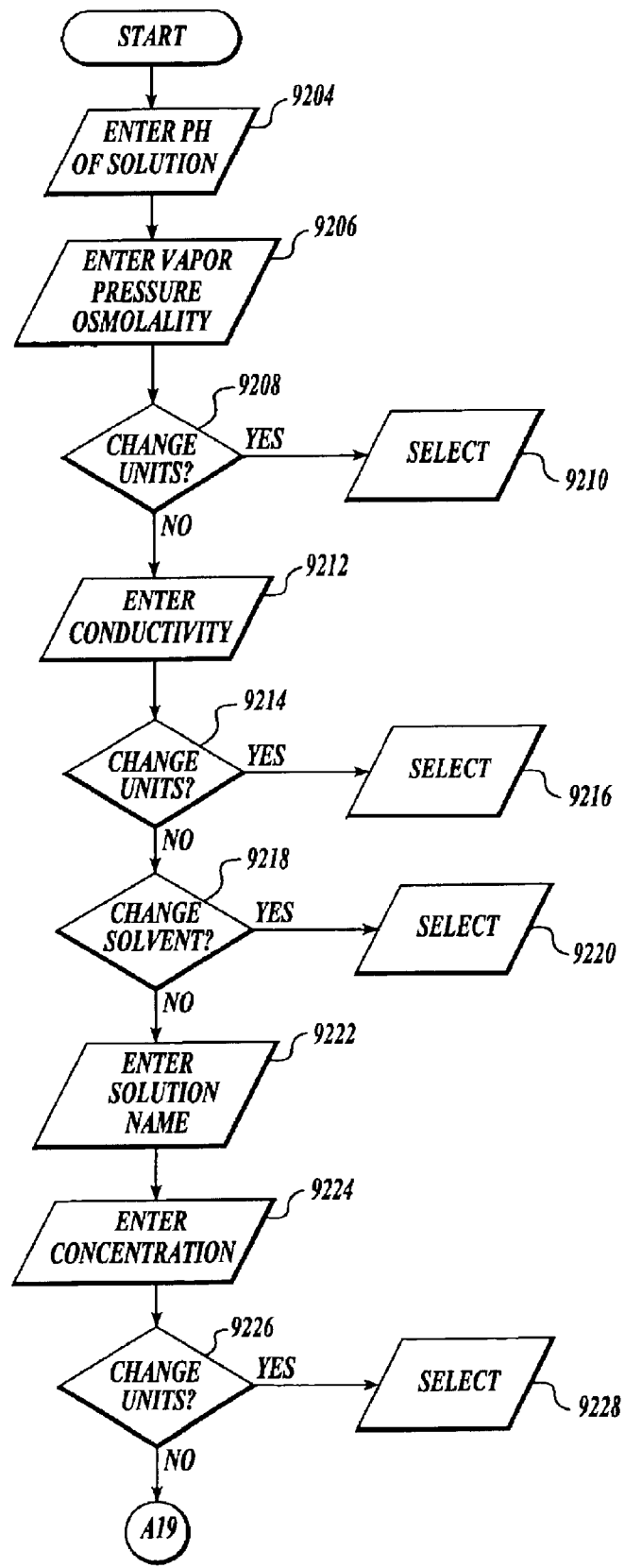
Figure 93:
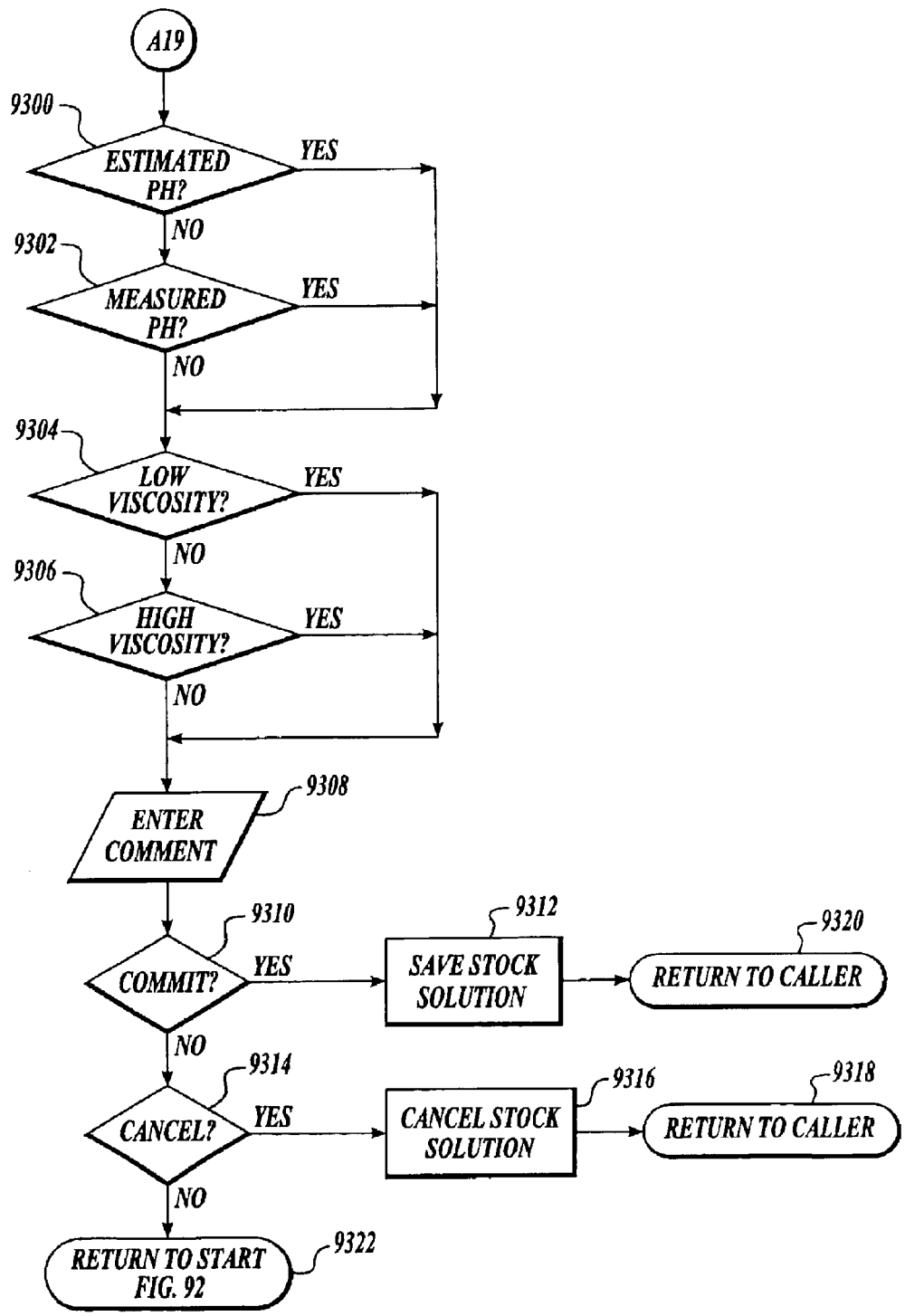

As noted above, a stock solution builder GUI or dialog window 8700 formed according to the present invention is shown in FIG. 87. FIGS. 92 and 93 form a functional flow diagram of a new stock solution builder formed in accordance with this invention.

Referring to FIGS. 87, 92 and 93, a user enters the pH of the solution in the solution pH field box 8701 by selecting the solution pH field box and entering a value using a keyboard or other input device. This action is represented by step 9204 FIG. 92. A user enters vapor pressure osmolality in a vapor pressure osmolality field box 8702 in the same way. This action is represented by step 9206 of FIG. 92. A user can change vapor pressure osmolality units by clicking on a down arrow button 8704 located alongside a vapor pressure osmolality unit field box 8706. Clicking on the down arrow button 8704 opens a units list. Clicking on the desired units enters the units into the vapor pressure osmolality unit field box 8706 and closes the drop down list. This action is represented by steps 9208 and 9210 of FIG. 92.

A user enters the conductivity of the solution in the conductivity field box 8708 in the same way that pH of solution and vapor pressure osmolality are entered. This action is represented by step 9212 of FIG. 92. A user can change conductivity units by clicking a down arrow button 8712 located alongside a conductivity units field box 8710. Clicking on the down arrow button 8712 opens a drop down list of units. Clicking on the desired units enters the units into the conductivity units field box 8710 and closes the drop down list. This action is represented by steps 9214 and 9216 of FIG. 92.

A user enters (or changes) a solvent by clicking on a down arrow button 8718 alongside a solvent field box 8716. Clicking on the down arrow button 8718 opens a drop down list of the available solvents. Clicking on a desired solvent enters the solvent into the solvent field box 8716 and closes the drop down list. This action is illustrated by steps 9218 and 9220 of FIG. 92. A user can enter a solution name in the solution name field box 8718 by selecting the solution name field box and using a keyboard or other suitable input device. This action is represented by step 9222 of FIG. 92. A user enters the concentration of the solution in a concentration field box 8724 in the same way. This action is represented by step 9224 of FIG. 92. A user can change the concentration units by clicking on a down arrow button 8720 located alongside a concentration units field box 8722. Clicking on the down arrow button 8720 opens a drop down list of available concentration units. Clicking on the desired units enters the units into the concentration units field box 8722 and closes the drop down list. This action is represented by steps 9226 and 9228 of FIG. 92.

A user enters the pH determination method by selecting one of a pair of radio buttons 8726. One button is labeled estimated and the other button is labeled measured. The user can select one, but not both methods of pH determination. This toggle action is represented by steps 9300 and 9302 of FIG. 93. A user enters viscosity by clicking on one of two radio buttons 8728 labeled low and high. The user may enter one, but not both choices. This toggle action is represented by steps 9304 and 9306 of FIG. 93. Finally, a user can enter a comment in the comment field box 8730 by selecting this field and entering the desired comment using a keyboard or other suitable input device. This action is represented by step 9308 of FIG. 93.

A user can save the new stock solution by clicking on a commit command button 8734. This action, which adds the stock solution to a database, is represented by steps 9310 and 9312 of FIG. 93. Clicking on the commit command button 8734 also closes the new stock solution dialog window of FIG. 87 and cycles the program to the dialog window 8610 shown in FIG. 86 if other missing stock solutions need to be entered. Clicking on a cancel command button 8732 cancels the new stock solution before cycling to the dialog window 8600 shown in FIG. 86. This action is represented by steps 9314, 9316, and 9318 in FIG. 93. After all missing stock solutions are entered in the database, clicking on the close command button 8601 of the dialog window shown in FIG. 86 closes that dialog window and cycles the program to the matrix viewer dialog window 8500 (FIG. 85). Since all the missing stock solutions have been entered, the program is now ready to calculate the needed stock solution volumes. This action is shown by step 9012 of the matrix viewer functional flow diagram (FIG. 90).

Matrix Manager: Matrix Viewer: Stock Solution Volume Calculator

Figure 91:
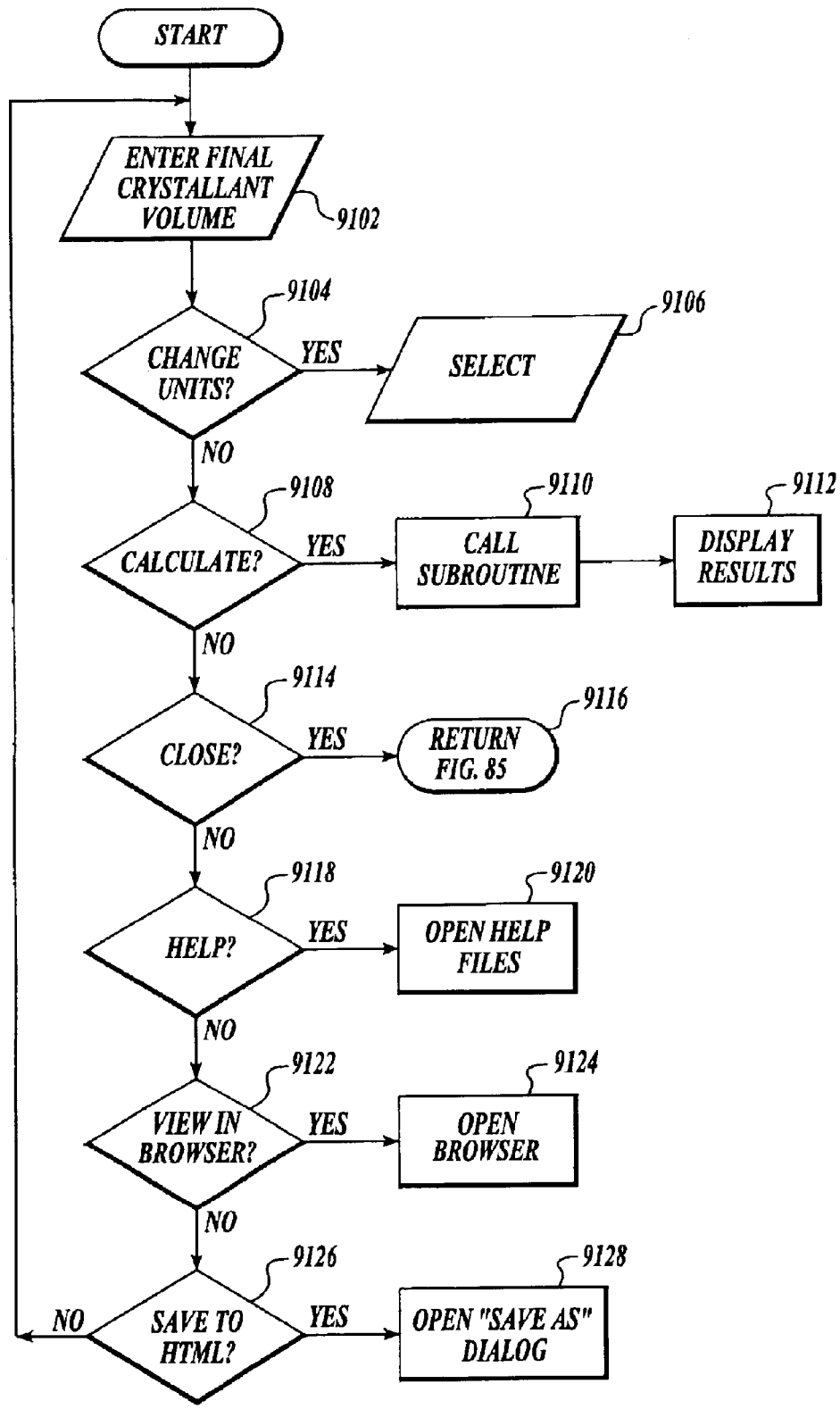
FIGS. 91–93 show a functional flow diagram for a stock solution volume calculator according to the present invention.

FIG. 88 shows a stock solution volume calculator GUI or dialog window 8800 formed in accordance with the invention and FIG. 91 shows a corresponding functional flow diagram. Referring to FIG. 88, the user is first asked to enter the final crystallant volume in the field box 8801. This action is represented by step 9102 of FIG. 91. A user can change volume units by clicking on a down arrow button 8802 alongside a crystallant volume units field box 8804. Clicking on the down arrow 8802 opens a drop down list of available units. Clicking on the desired units enters the units into the crystallant volume units field box 8804 and closes the drop down list. This action is represented by steps 9104 and 9106 of FIG. 91. A user calculates stock solution volumes by clicking on a calculate command button 8806. This action is illustrated by step 9108 of FIG. 91. Clicking on the calculate command button 8806 launches a subroutine that calculates the required volumes of the stock solutions for each chemical component in the matrix. This action is represented by step 9110 of FIG. 91. The launched subroutine performs the following functions:

1. Generate a list of all of the different Chemicals that are going to be used to make all of the Crystallants in the Matrix (a Matrix Chemicals List). The identifier is a combination of the Chemical ID and the Concentration Units ID for each Chemical that is used in the Crystallants that make up the chosen Matrix.
2. Make a list of all of the different Compound Buffers that are used to make all of the Crystallants in the Matrix (a Matrix Buffers List). The identifier is a combination of Buffering Agent/pH Conjugate, final pH and the Concentration Units ID.
3. Generate a list of all Chemicals that exist in all Stock Solutions (a Stock Chemicals List). The identifier is a combination of the Chemical ID and the Concentration Units ID for each Chemical that is present in the entire list of Stock Solutions.
4. Generate a list of all Compound Buffers that exist in all Stock Solutions (a Stock Buffers List). The identifier is a combination of Buffering Agent/pH Conjugate, Buffer pH and the Concentration Units ID for each Buffer that is present in the entire list of Stock Solutions.
5. Cross reference the "Matrix Chemicals List" with the "Stock Chemicals List" to determine if there are any Matrix Chemicals that are absent from the "Stock Chemicals List." For those Chemicals that are absent from the Stock Chemicals List, enable a GUI to tell the User which Chemical is missing from the Stock Solutions, and ask the User if they would like to create a new Stock Solution with the needed Chemical. In this case, the user can create the needed Stock Solution right away from the Solutions Data Base Manager. Alternatively the User can cancel out and would then need to create the various needed Stock Solutions before proceeding any further.
6. Cross reference the "Matrix Buffers List" with the "Stock Buffers List" to determine if there are any Matrix Buffers that are absent from the "Stock Buffers List." For those Buffers that are absent from the Stock Buffers List, enable a GUI to tell the User which Conjugate Buffer is missing from the Stock Solutions and ask the User if they would like to create a new Stock Solution with the needed Conjugate Buffer. In this case, the user would create the needed Stock Solution right away. Alternatively the user can cancel out and would need to create the various needed Stock Solutions before proceeding any further.
7. Steps 1 through 6 are repeated until there is at least one Stock Chemical for every Matrix Chemical and at least one Stock Buffer for every Matrix Buffer.
8. For all Matrix Chemicals, determine if there are more than one Stock Solution with the same Chemical. In the case where there are more than one Stock Solutions with the same Chemical (i.e. there may be a Stock Solution with 1 M NaCl, and another with 5 M NaCl), enable a GUI that queries the User as to which Stock Solution they will be using to make up the Crystallants. The GUI places the answers in a memory buffer.
9. For all Matrix Buffers, determine if there are more than one Stock Solution with the same Buffer (Buffering Agent/pH Conjugate, Buffer pH and Concentration Units ID). In the case where there are more than one Stock Solutions with the Same Buffer (i.e. there may be a Stock Solution with 1 M MES/NaOH pH 5.5, and another with 5 M I M MES/NaOH pH 5.5), enable a GUI that queries the User as to which Stock Solution they will be using to make up the Crystallants. The GUI places the answers in a memory buffer.
10. Once all of the Stock Solutions have been chosen, and there is a one-to-one relationship between Stock Solutions and the needed Chemicals and Buffers in the Crystallants, determine the volumes of each Stock Solution that are needed to arrive at a specified final volume of Crystallant. Enable a GUI that queries the User "WHAT IS THE FINAL DESIRED VOLUME OF CRYSTALLANT." The User then inputs the value (integer 1 to 10,000) and chooses a Volume Unit from a list box.
11. Calculate the desired volumes of each Stock Solution to arrive at complete mixtures for each Crystallant. For example:
Crystallant
10 mM NaCl
1 mM EDTA
10% v/v PEG-400
20% w/v PEG-8000
Stock Solutions
1000 mM NaCl 500 mM EDTA
100% v/v PEG-400
50% w/v PEG-8000

The formula for calculating the volume of each Stock Solution is the following:

{Total Volume of Desired Crystallant}×{Concentration of Chemical in Crystallant)/(Concentration of Chemical in Stock}. Say the User wanted 10 ml of Crystallant. Then the calculation for NaCl would be as follows:

10 ml×10 mM NaCl/1000 mM NaCl=0.1 ml. Therefore, 0.1 ml of 1000 mM NaCl would be needed to make a final 10 mM NaCl solution in 10 ml of Crystallant.

| Crystallant | | Stock Solutions |
|---|---|---|
| 10 mM NaCl | 0.1 ml of | 1000 mM NaCl |
| 1 mM EDTA | 0.02 ml of | 500 mM EDTA |
| 10% v/v PEG-400 | 1.0 ml of | 100% v/v PEG-400 |
| 20% w/v PEG-8000 | 4.0 ml of | 20% w/v PEG-8000 |

Total Volume of Stocks=5.12 ml

Total Volume of Solvent needed to make the final 10 ml of crystallant would be=10 ml−5.12 ml=4.88 ml. Note, if the amount of Solvent needed to make the final volume of crystallant is a negative number, then this means that the available Stock Solutions are not sufficiently concentrated to enable the User to make the desired solution.

12. Output the results in HTML so the user can print a table of the needed volumes of stocks and solvent to mix to arrive at the final needed Crystallants.

The results are displayed in tabular form along with the solvent volume necessary to make the specified volume of crystallant, such as shown in FIGS. 89A–G. This action is shown as step 9112 of FIG. 91. A negative volume is returned for a solvent, it is an indication that the concentration of one or more of the stock solutions was too low to make the condition.

The solution volume calculator dialog window 8800 (FIG. 88) includes a close command button 8808. Clicking on the close command button 8808 closes the stock solution volume calculator dialog window and returns the program to the matrix viewer dialog window 8800 (FIG. 85). This action is represented by steps 9114 and 9116 of FIG. 91. The solution volume calculator dialog window 8800 also includes a help command button 8810. Clicking on the help command button opens the help files. This action is illustrated by steps 9118 and 9120 of FIG. 91. The solution volume calculator dialog window 8800 also includes a view in browser command button 8812. Clicking on the view in browser command button 8812 opens an Internet browser, such as Microsoft's Internet Explorer®. This action, which allows the stock solution recipes to be viewed by the browser, is represented by steps 9122 and 9124 of FIG. 91. Finally, the solution volume calculator window 8800 includes a save to HTML command button 8814. Clicking on the save to HTML command button 881 causes the stock solution recipes list to be output and saved in HTML format, as shown by steps 9126 and 9128 in FIG. 91.

Returning to FIG. 85, when a user clicks on an OK command button 8504, the program returns to the matrix manager dialog window 8300 (FIG. 83).

Figure 94:
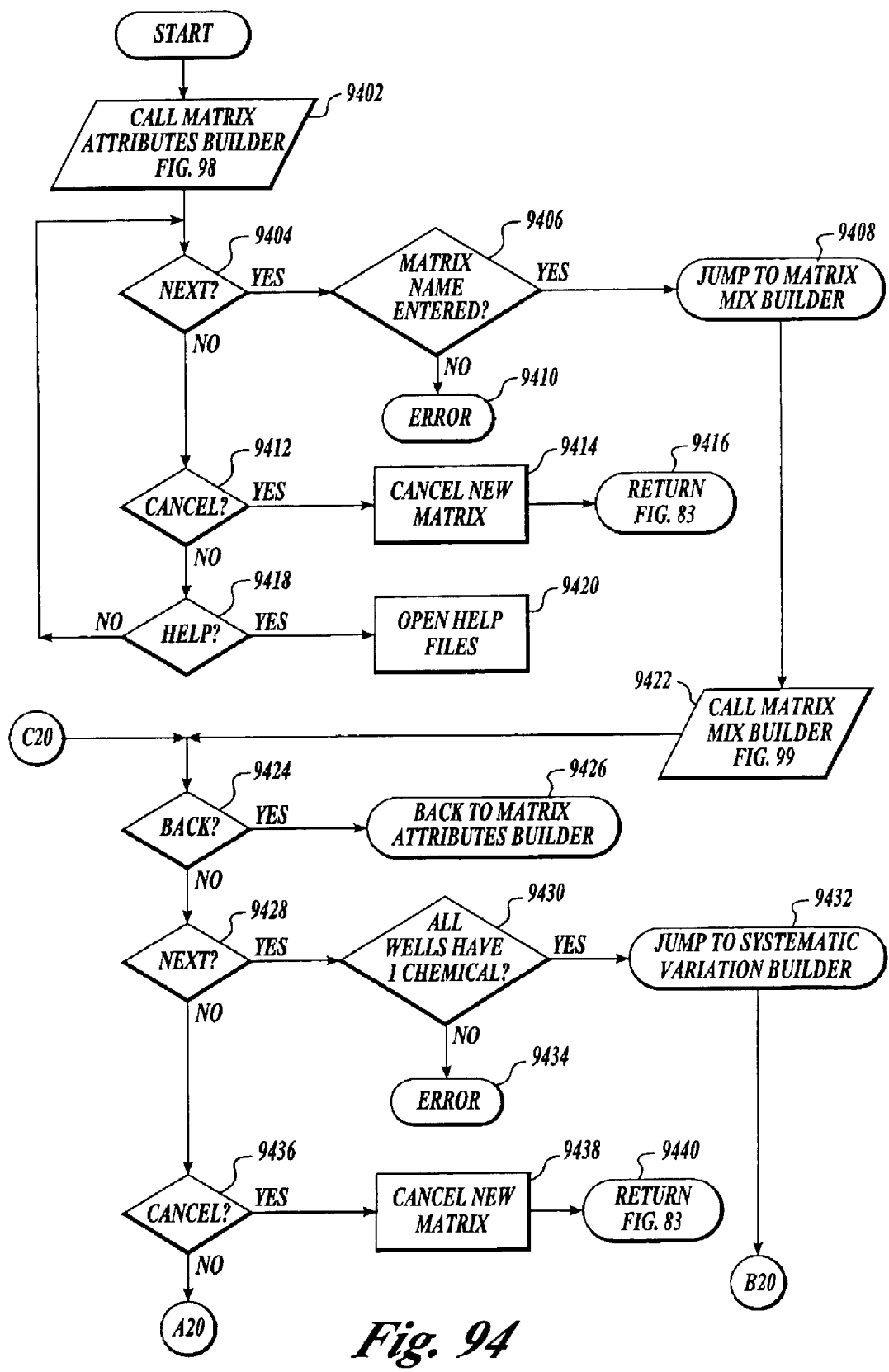
FIGS. 94–96 show a functional flow diagram for a new matrix builder according to the present invention.
Figure 95:
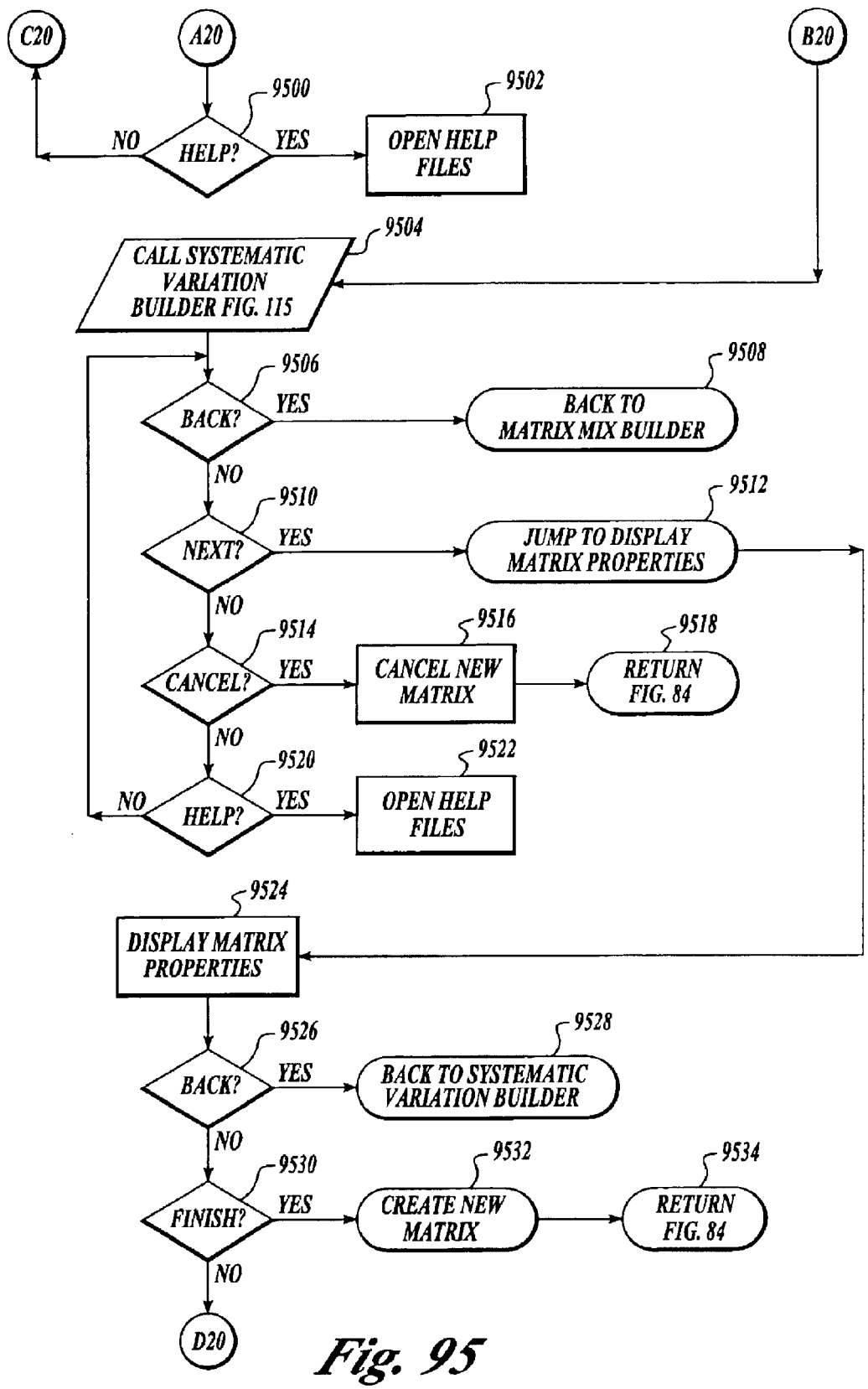
Figure 96:
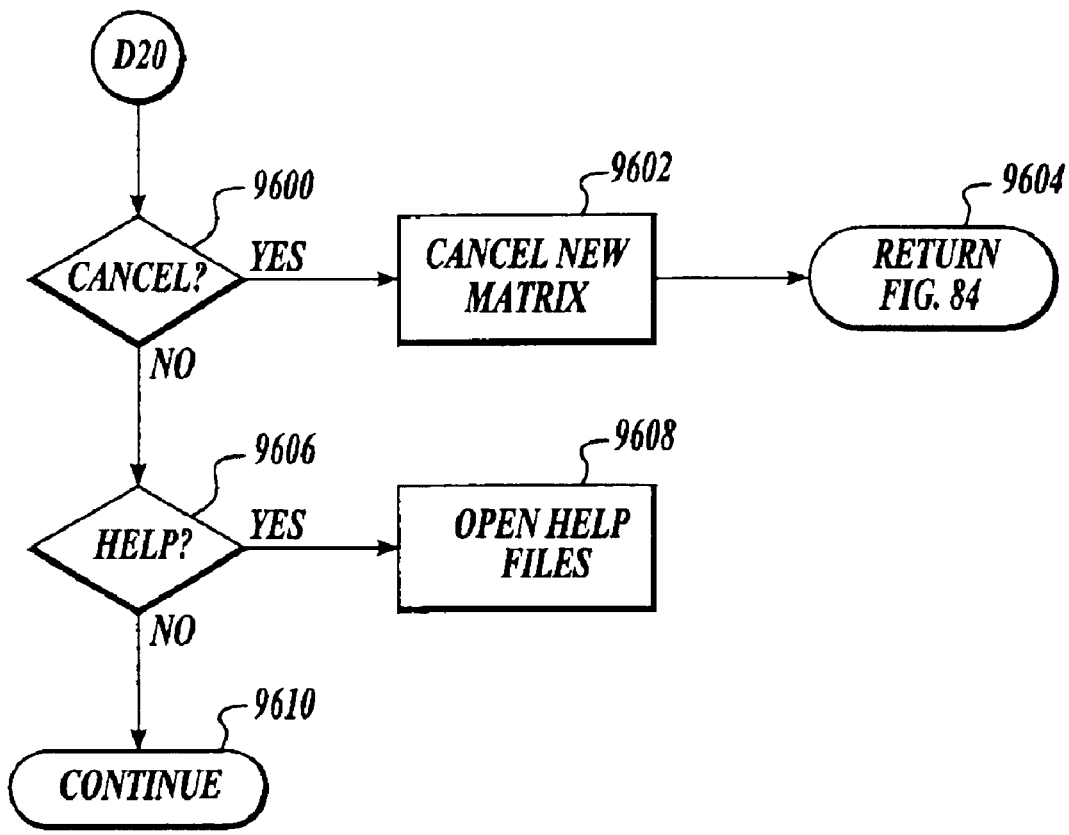
Figure 116:
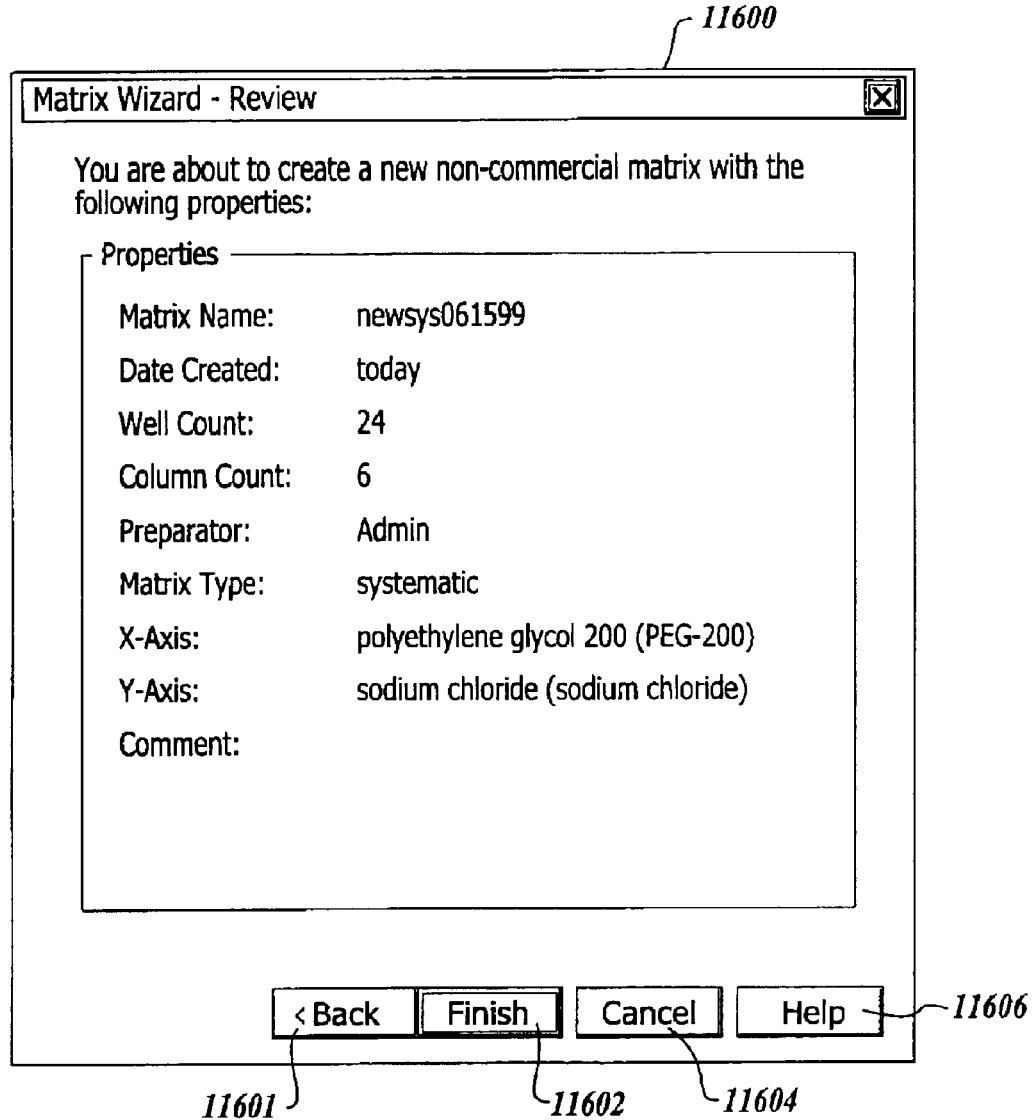
FIG. 116 shows a GUI for a matrix display according to the present invention.

Returning to the matrix manager dialog window 8300, if a user clicks on a new command button 8318, a new matrix builder is launched. FIGS. 94, 95 and 96 form a functional flow diagram of a new matrix builder formed in accordance with this invention. The new matrix builder includes four dialog windows, which are more fully described below. In general, the first dialog window (FIG. 97) is used to enter the matrix attributes. The second dialog window (FIG. 101) is used to enter the new matrix mix. The third dialog window (FIG. 114) is used to enter any systematic variation in either the X axis or the Y axis. The fourth dialog window, FIG. 116, is for displaying the new matrix properties.

Matrix Manager: New Matrix: Matrix Attributes Builder

Referring to FIG. 94, the first step of the matrix manager is to launch a matrix attributes builder. This is step 9402 of FIG. 94.

Figure 97:
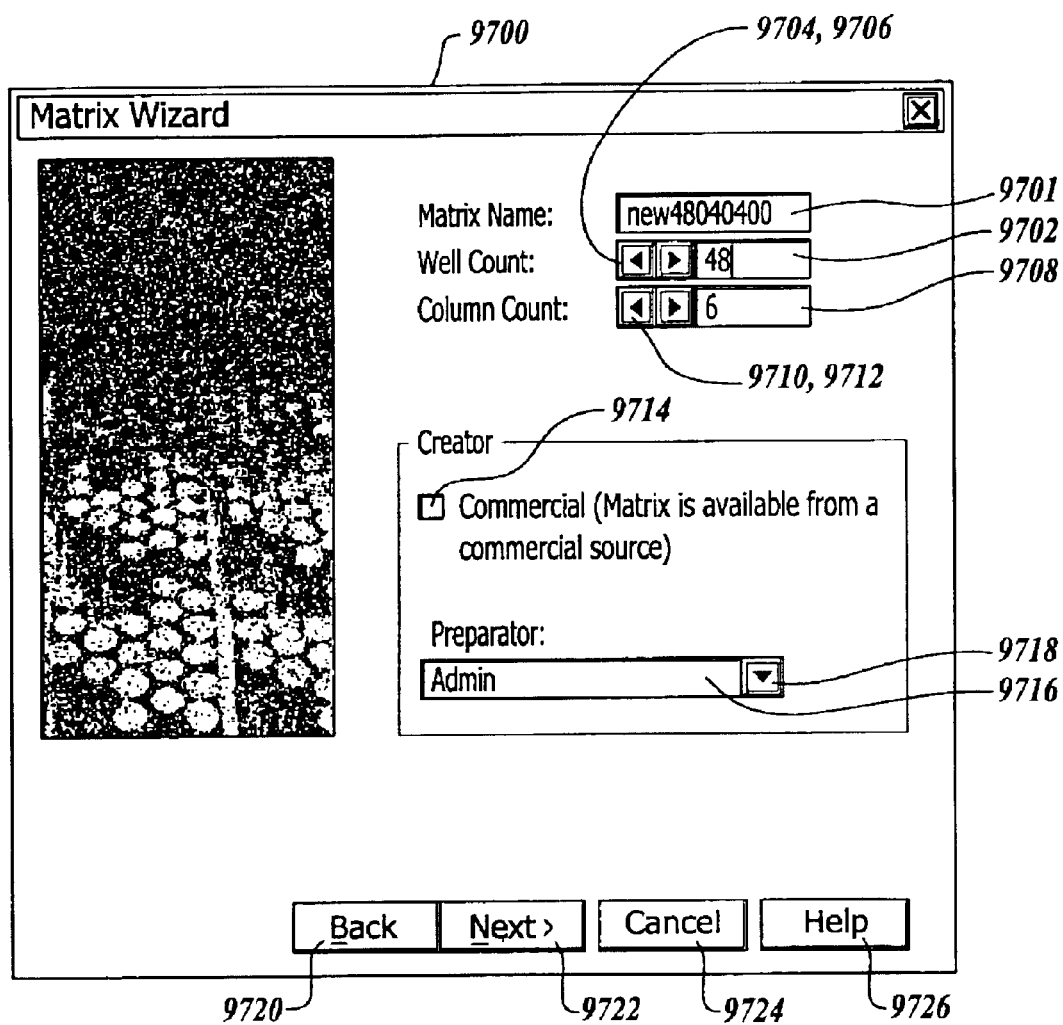
FIG. 97 shows a GUI for a matrix attributes builder according to the present invention.
Figure 98:
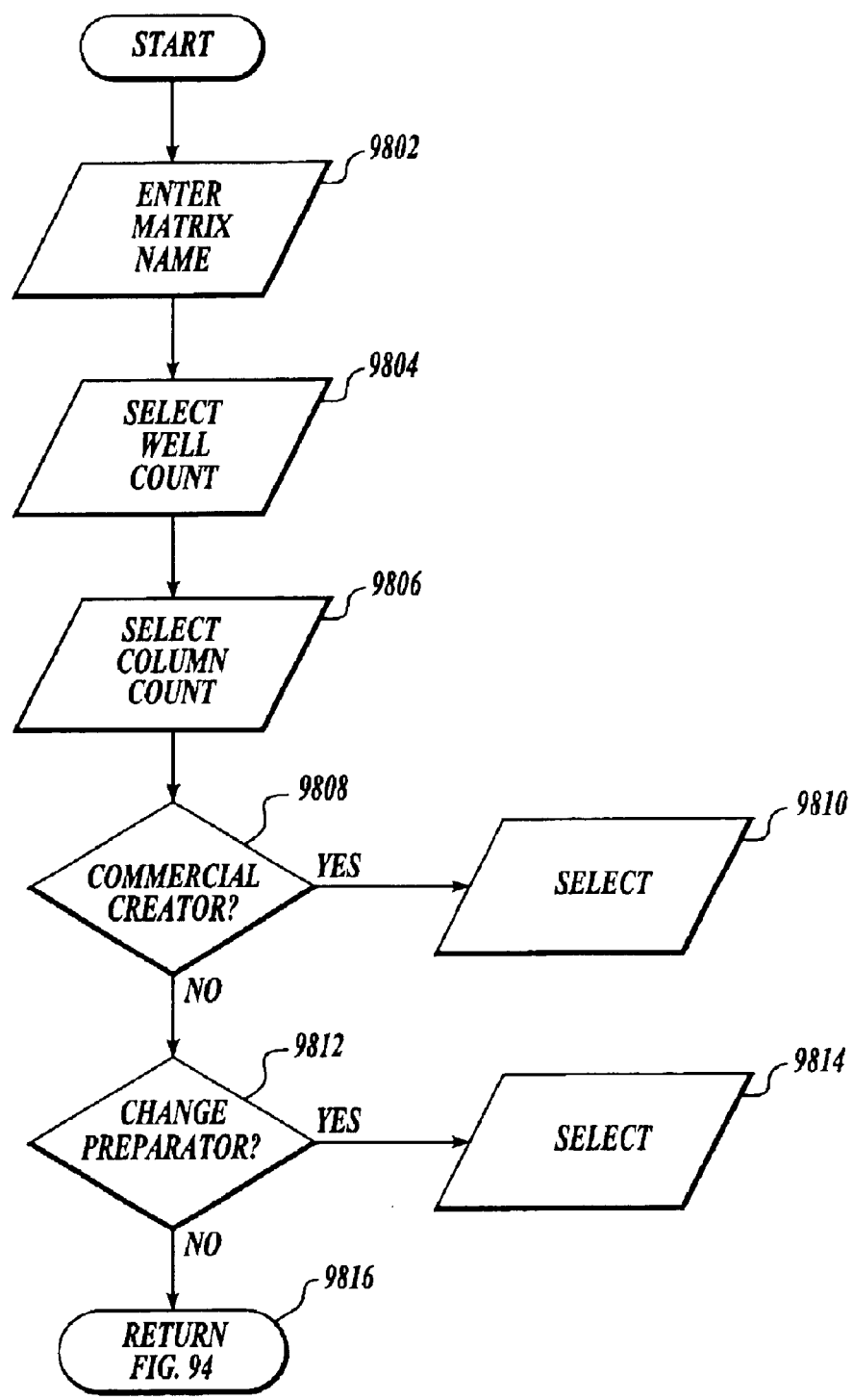
FIG. 98 shows a functional flow diagram for a matrix attributes builder according to the present invention.

When a user clicks on a new command button 8318 in the matrix manager dialog window 8300 (FIG. 83). A matrix attributes builder dialog window 9700, an example of which is shown in FIG. 97, opens. A functional flow diagram of a matrix attributes builder formed in accordance with this invention is shown in FIG. 98. A user enters the name of the matrix in a matrix name field box 9701 of the matrix attributes builder dialog window in 9700 by selecting this field box and inserting the name using a keyboard or other suitable input device. This action is represented by step 9802 of FIG. 98. The matrix name must be a unique name. Next, a user enters the well count into a well count field box 9702 using left and right arrows 9704, 9706 located adjacent to the well count field box 9702. The well count indicates how many conditions (wells) the new matrix will have. A user increments or decrements the number of well counts by either clicking on the left arrow button 9704 to lower the well count or on the right arrow button 9706 to raise the well count. This action is represented by step 9804 of FIG. 98. A user enters a column count in the same manner. The column count indicates the number of columns in the matrix. More specifically, located alongside a column count field 9708 is a left arrow button 9710 and a right arrow button 9712. The user sets the column count by either clicking on the left arrow button 9710 to decrease the column count or on the right arrow button 9712 to increment the column count. This action is illustrated as step 9806 in FIG. 98.

A user checks a check box 9714 if the matrix being created is commercially available. More specifically, clicking on the check box 9714 renames the preparator field to a manufacturer field text box. Located alongside the manufacturer field box is a down arrow button. Clicking on the down arrow opens a drop down list of manufacturers. Clicking on a manufacturer enters the manufacturer in the manufacturer field box and closes the list. This action is represented by steps 9808 and 9810 of FIG. 98. If the commercial check box 9714 is not selected, a preparator field text box appears in place of a manufacturing field and defaults to the current logged in user. If desired, the user can select a different preparator by clicking on a down arrow button 9718 located alongside the preparator field. Clicking on the down arrow opens a drop down list of all the available preparators. Clicking on a preparator enters the preparator's name in the preparator field and closes the drop down list. This action is shown by steps 9812 and 9814 of FIG. 98

The dialog window of FIG. 97 also includes a next command button 9722, a cancel command button 9724 and a help command button 9726. A back command button is grayed out, i.e., disabled. Clicking on the next command button 9722 cycles the program to a matrix mix builder (described below), provided a matrix name has been entered. If a matrix name has not been entered, an error message dialog box appears that warns the user of the error. This action is represented by steps 9404, 9406, 9408, and 9410 of FIG. 94.

Clicking on the cancel command button 9724 cancels the attributes builder matrix and cycles the program to the dialog window shown in FIG. 83. This action is represented by steps 9412, 9414, and 9416 of FIG. 94. The dialog window of FIG. 97, also includes a help command button 9726. Clicking on the help command button 9726 opens the help files. This action is represented by steps 9418 and 9420 of FIG. 94.

Matrix Manager: New Matrix: Matrix Mix Builder

Figure 99:
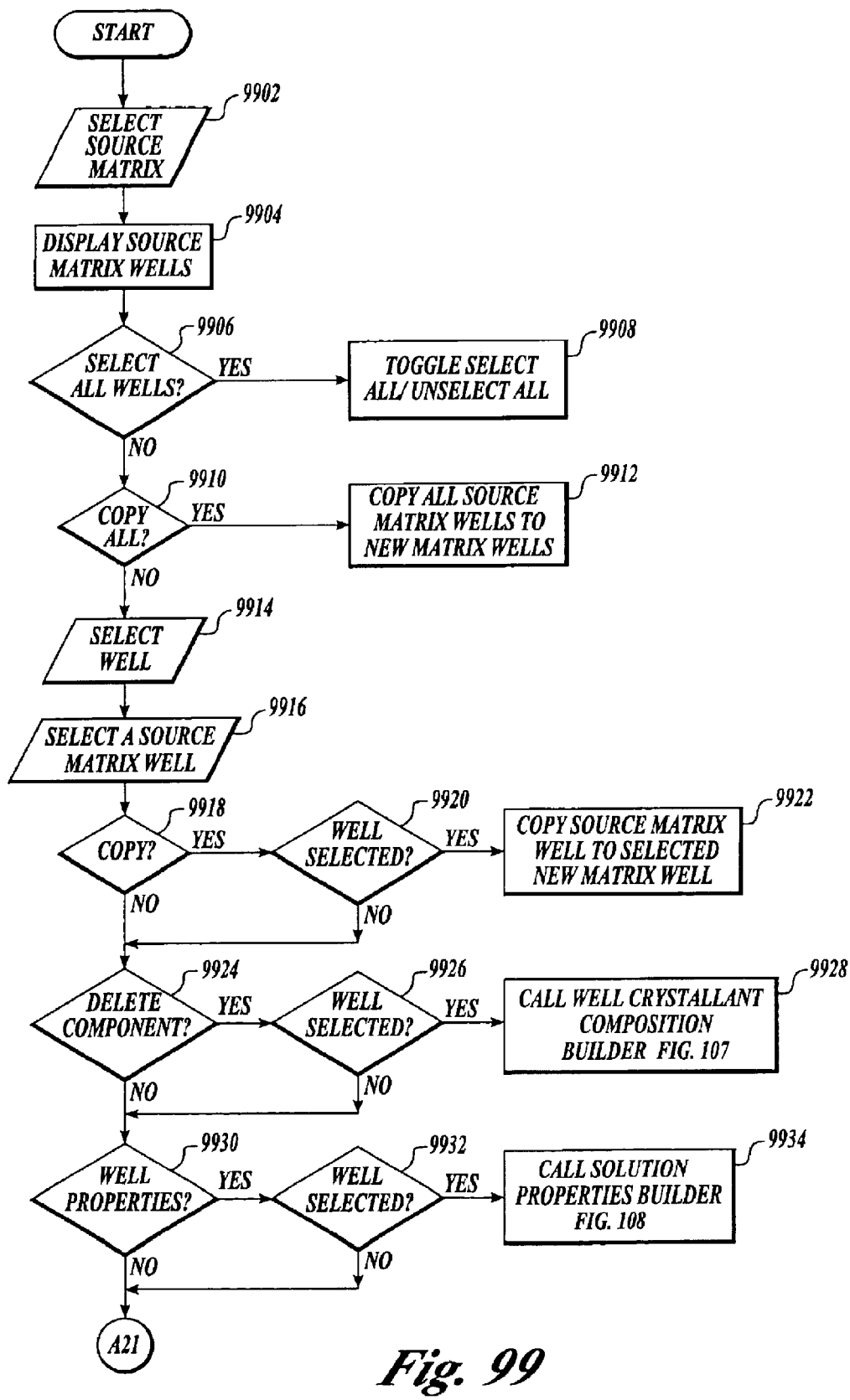
FIGS. 99–100 show a functional flow diagram for matrix mix builder according to the present invention.
Figure 100:
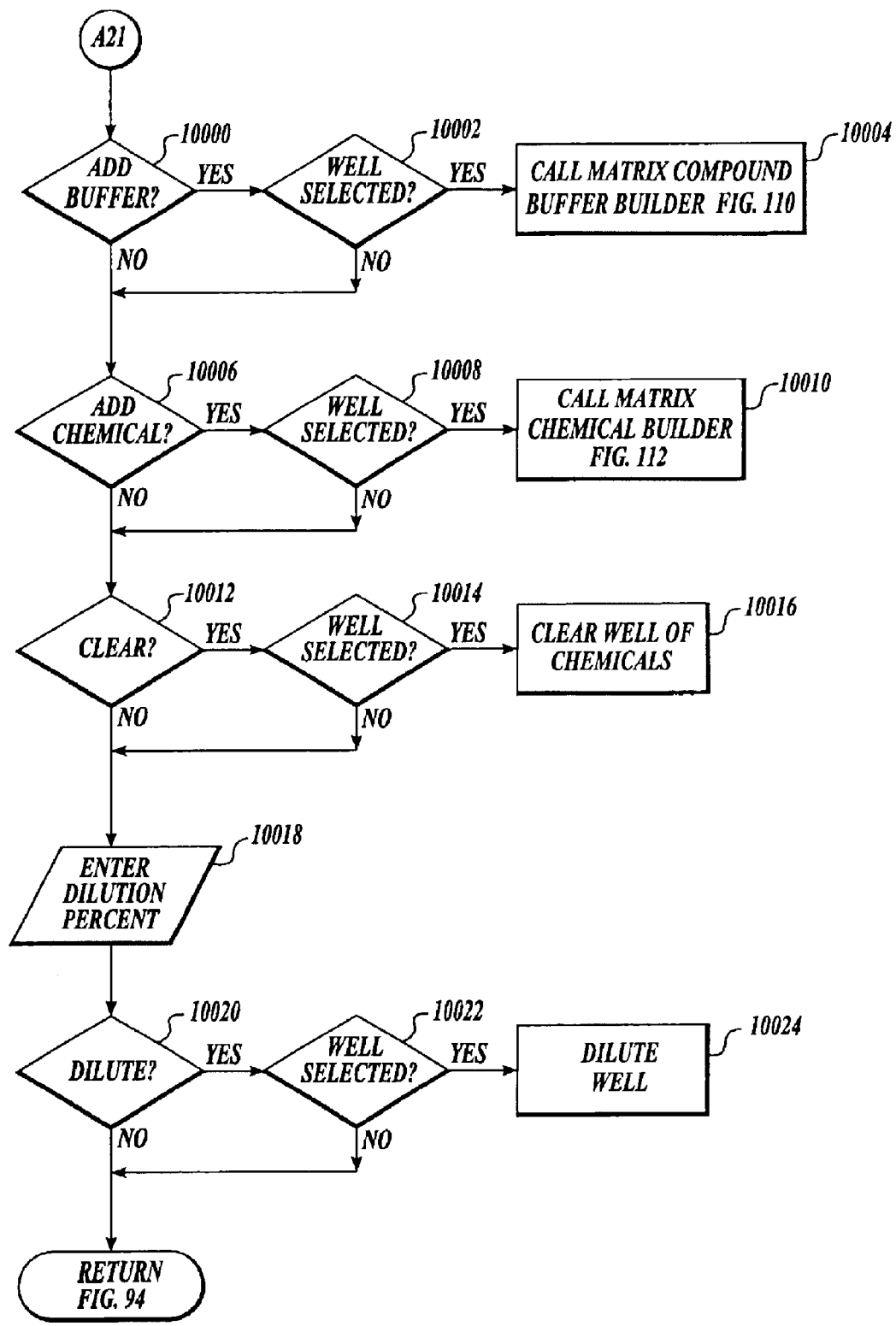
Figure 101:
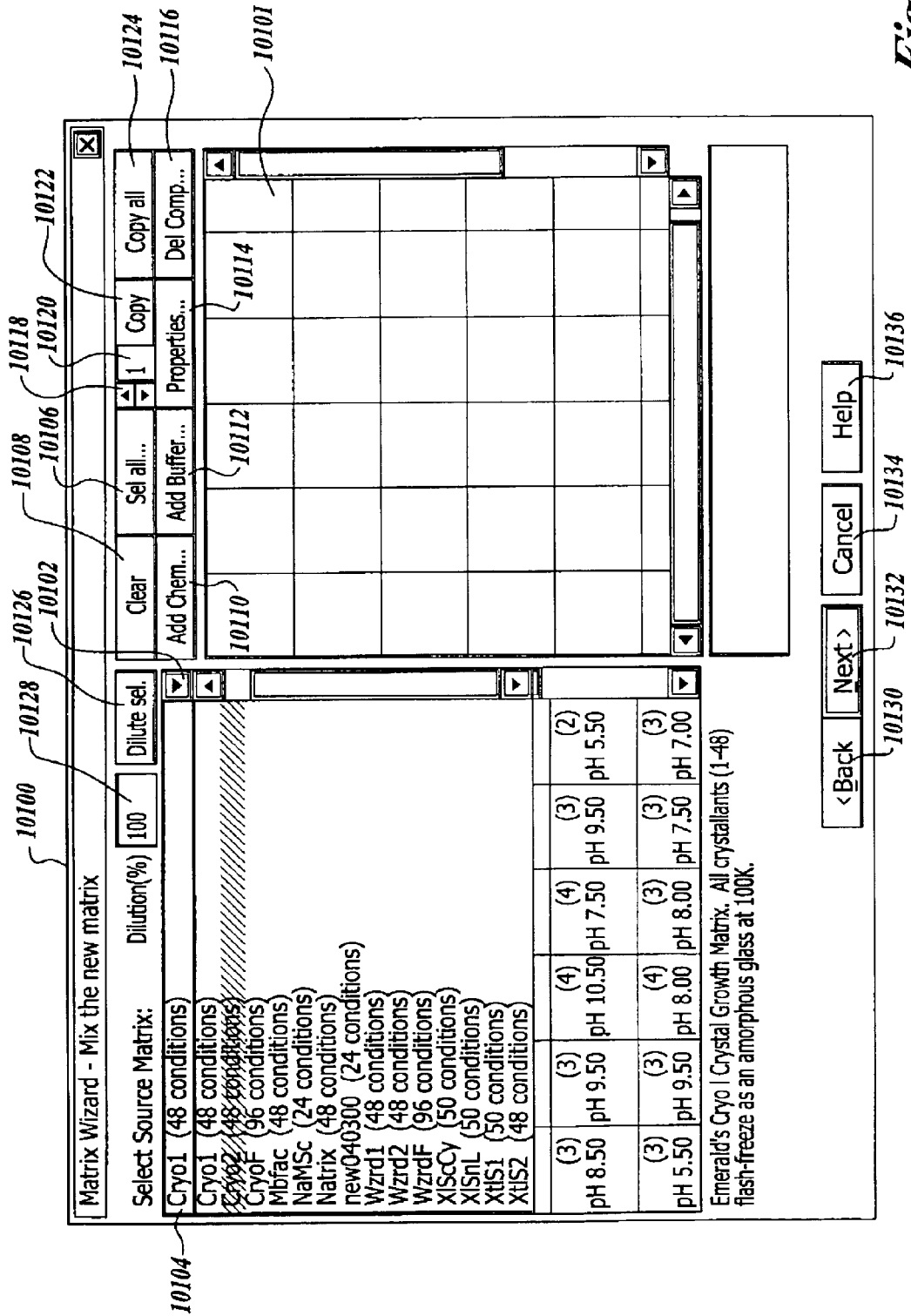
FIG. 101 shows a GUI for a matrix mix builder according to the present invention.

A matrix mix builder dialog window 10100 formed in accordance with this invention is shown in FIG. 101. A matrix mix builder functional flow diagram formed in accordance with this invention is shown in FIGS. 99 and 100.

The matrix mix builder dialog window 10100 shown in FIG. 101 includes a new matrix template display 10101 on the right side of the window. A user selects a source matrix by using a down arrow button 10102 alongside a select source matrix field box 10104. Clicking on the down arrow button 10102 opens a drop down list of all available matrices. Clicking on a matrix enters the matrix name in the source matrix field box 10104 and displays the source matrix conditions on the left side of the dialog window, as more clearly shown in FIG. 102. This action is represented by steps 9902 and 9904. There are several ways to transfer a condition from the selected source matrix to the new matrix. In one method, a user clicks on a select all/unselect all wells command button 10106. (The select all command button 10106 is a toggle that becomes an unselect all command button when clicked on again.) Placing the select all/unselect all wells command button 10106 in the select all wells state highlights all of the wells in the new matrix template. This action is represented by steps 9906 and 9908 of FIG. 99. Clicking on a copy all command button 10124 when the select all/unselect all command button is in the select all state copies all the source matrix rows to the new matrix rows.

Figure 102:
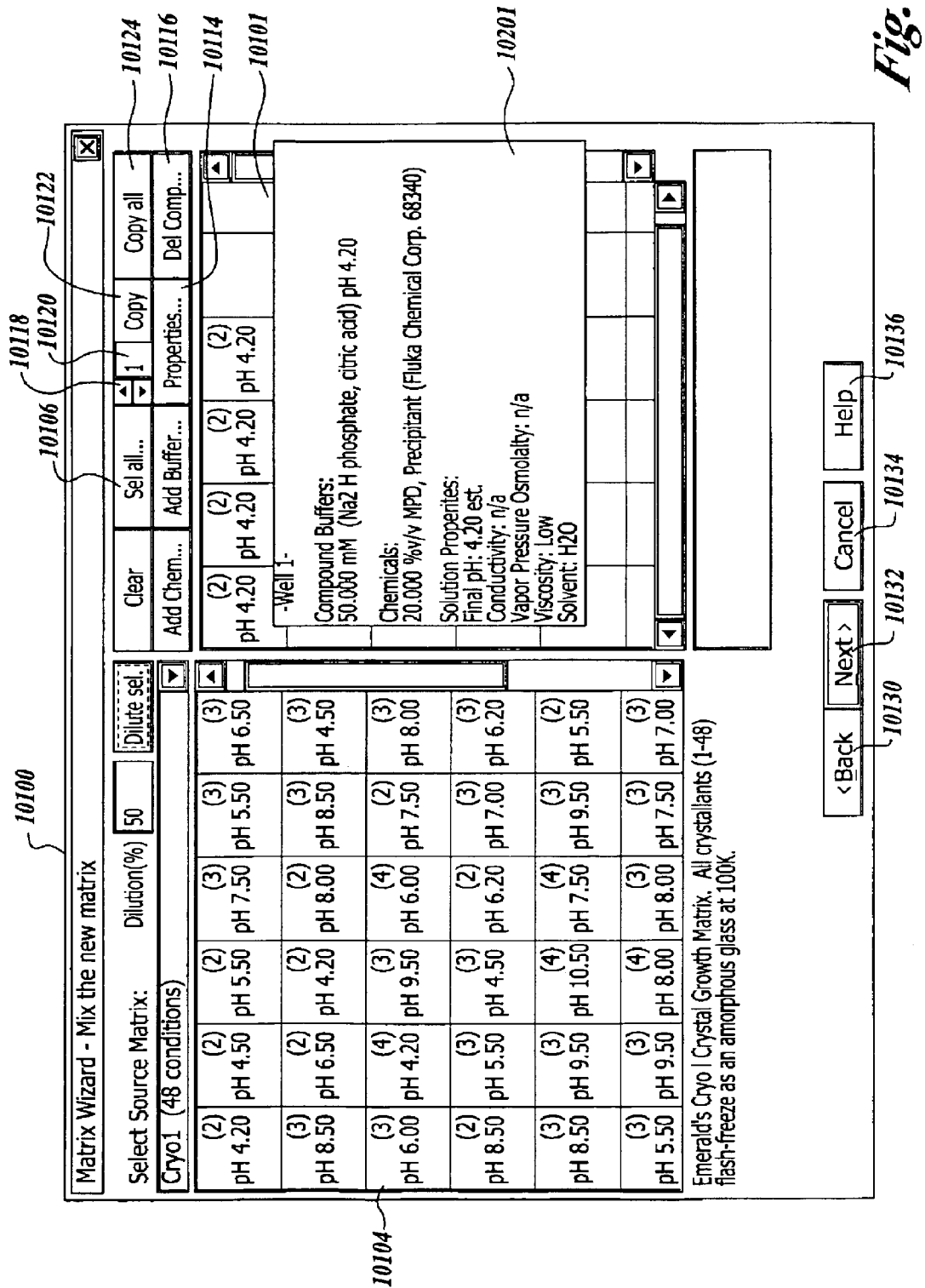
FIG. 102 shows a GUI for matrix mix builder according to the present invention.

Another transfer method requires a user to highlight selected well positions in the new matrix template display 10101 by right click dragging over the well positions, i.e., pacing a cursor controlled arrow on a first well and dragging the arrow across desired wells while actuating a predetermined key, e.g., the right key of the cursor control device. This action is represented by step 9914 of FIG. 99. Then, in a copy field 10120, the user enters the well number of the selected matrix whose condition is to be transferred to the highlighted wells of the new matrix template display. In this regard, located alongside the well field 10120 are an up arrow button 10118 and a down arrow button. Clicking on the up arrow 10118 increments the well number. Clicking on the down arrow decrements the well number. This action is illustrated as step 9916 of FIG. 99. Thereafter, when a user clicks on a copy command button 10122, the transfer takes place. This action is represented by steps 9918, 9920 and 9922, of FIG. 99. More specifically, if a well has been selected (step 9920), the source matrix well condition is copied to the selected new matrix wells (step 9922). Hovering a mouse over a well in the new matrix template launches a window 10201 that displays the chemical composition of the well's condition, as shown in FIG. 102.

In a similar fashion, the new matrix template can be filled completely with conditions from one or more existing matrices. Conditions can also be transferred from the selected source matrix to the new matrix template by left click dragging a condition from a selected matrix well to a desired well in the new matrix template and releasing the "clicked" key. The well position in the new matrix template does not have to be highlighted prior to this drag and drop procedure. In accordance with conventional Microsoft windows procedures, highlighted wells can be deselected by right click dragging over the highlighted well positions.

Figure 103:
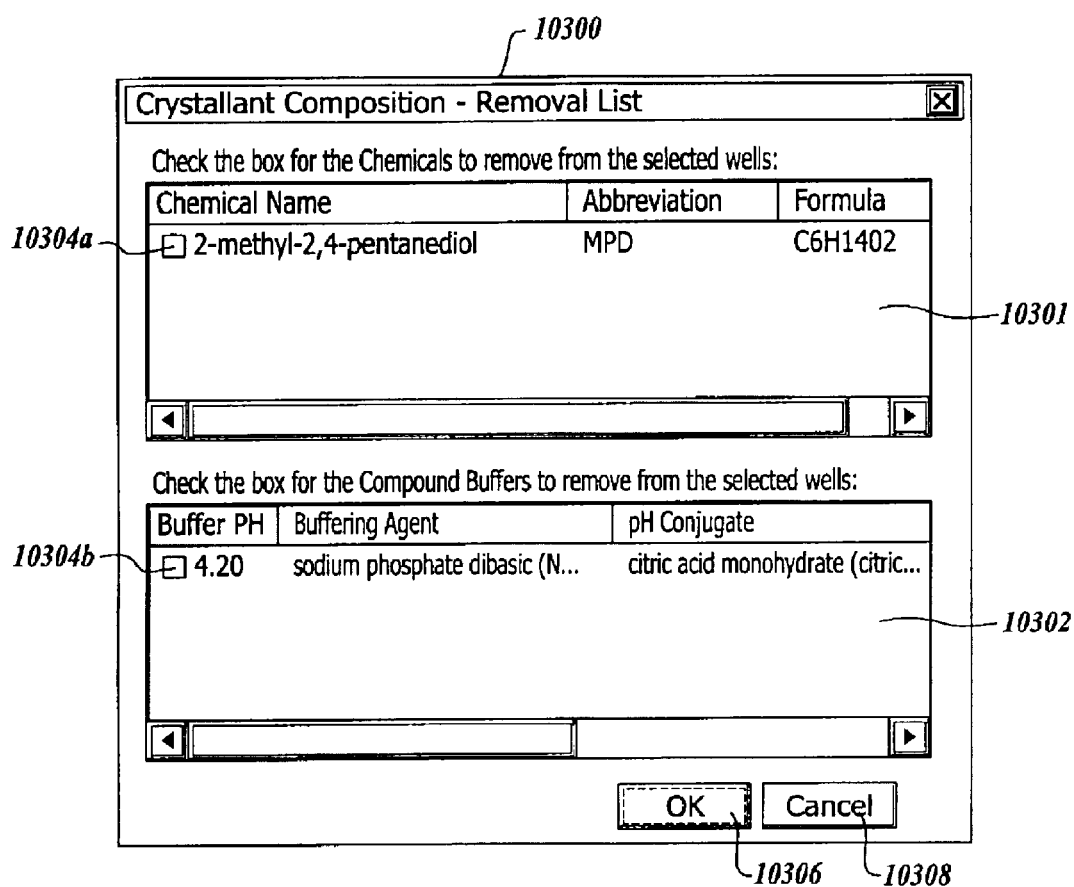
FIG. 103 shows a GUI for a well crystallant composition builder according to the present invention.
Figure 107:
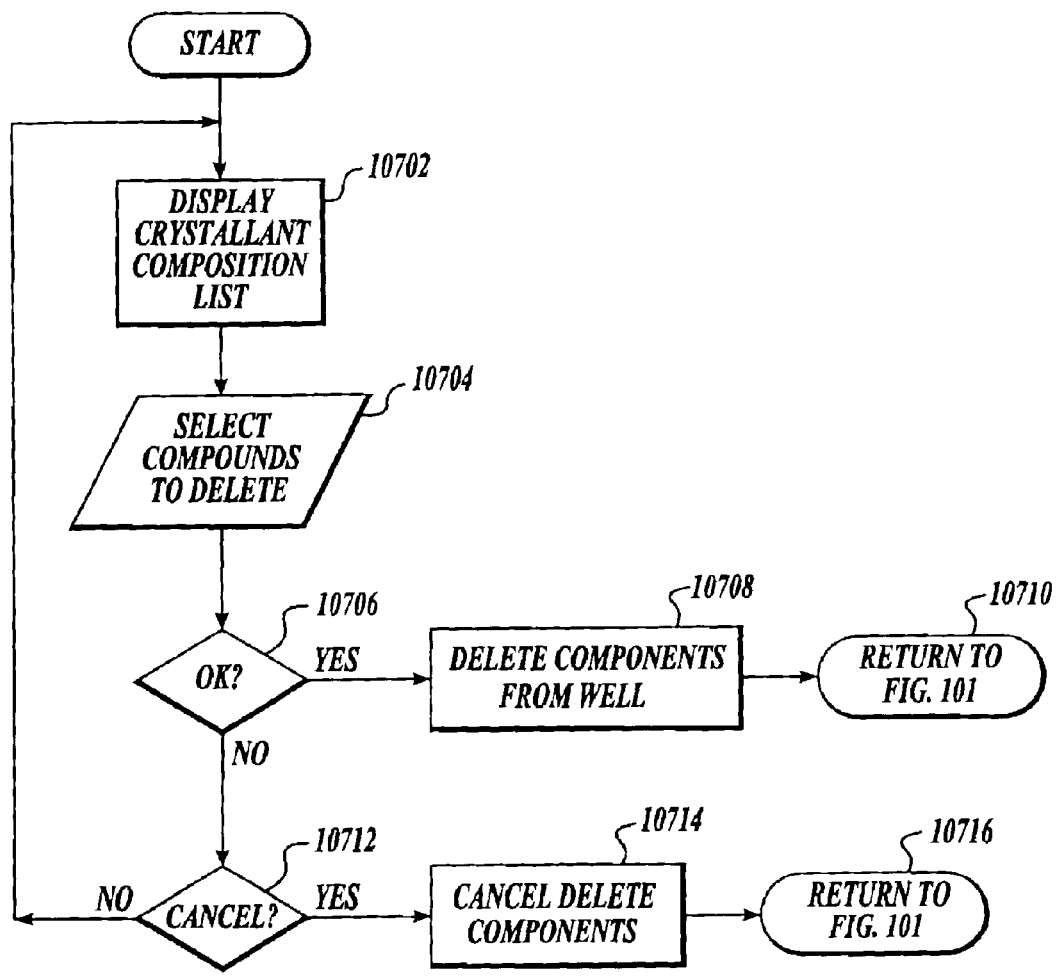
FIG. 107 shows a functional flow diagram for a well crystallant composition builder according to the present invention.

A user can remove components from a new matrix template by highlighting the well whose component or components are to be deleted and clicking on a DELETE component command button 10116. This action is shown by steps 9924, 9926 and 9928 of FIG. 99. More specifically, if a well has been selected (step 9926), a well crystallant composition builder dialog window 10300 (FIG. 103) opens. A functional flow diagram of a well crystallant composition builder formed in accordance with this invention is shown in FIG. 107.

The well crystallant composition builder dialog window includes a chemical list box 10301 and a compound buffer list box 10302. The display of these boxes is represented by step 10702 of FIG. 107. Located alongside the chemical name of each of the components is a checkbox 10304*a*, 10304*b*. A user deletes components by checking the box 10304*a*, 10304*b* next to the components desired to be removed from the well condition. This action is represented by step 10704 of FIG. 107. Then, clicking on an OK command button 10306 deletes the components from the well condition, and returns the user to the matrix mix builder dialog window 10100 (FIGS. 101 and 102). Clicking on a cancel command button 10308 returns the user to the matrix mix builder dialog window 10100 without canceling any components as shown by steps 10712, 10714 and 10716.

Figure 108:
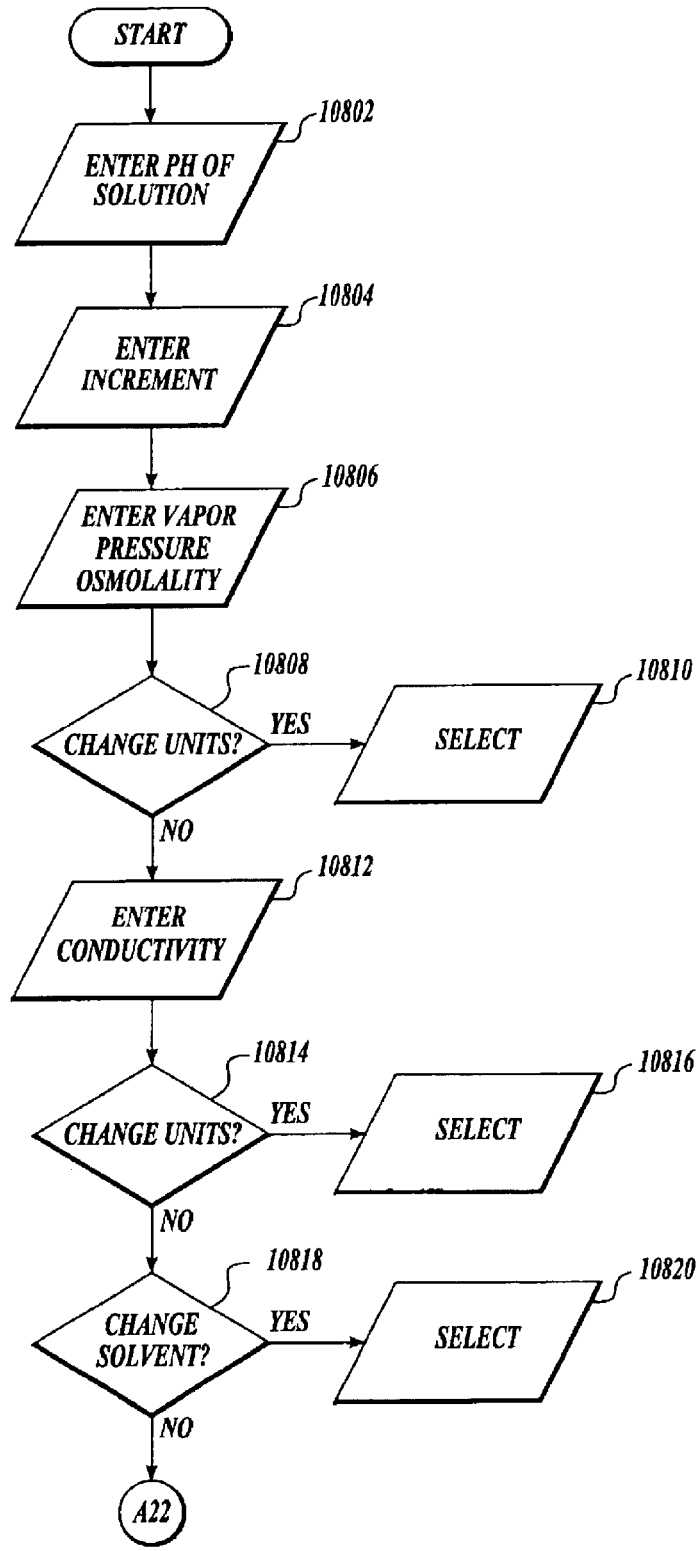
FIGS. 108–109 show a functional flow diagram for a solution properties builder according to the present invention.
Figure 109:
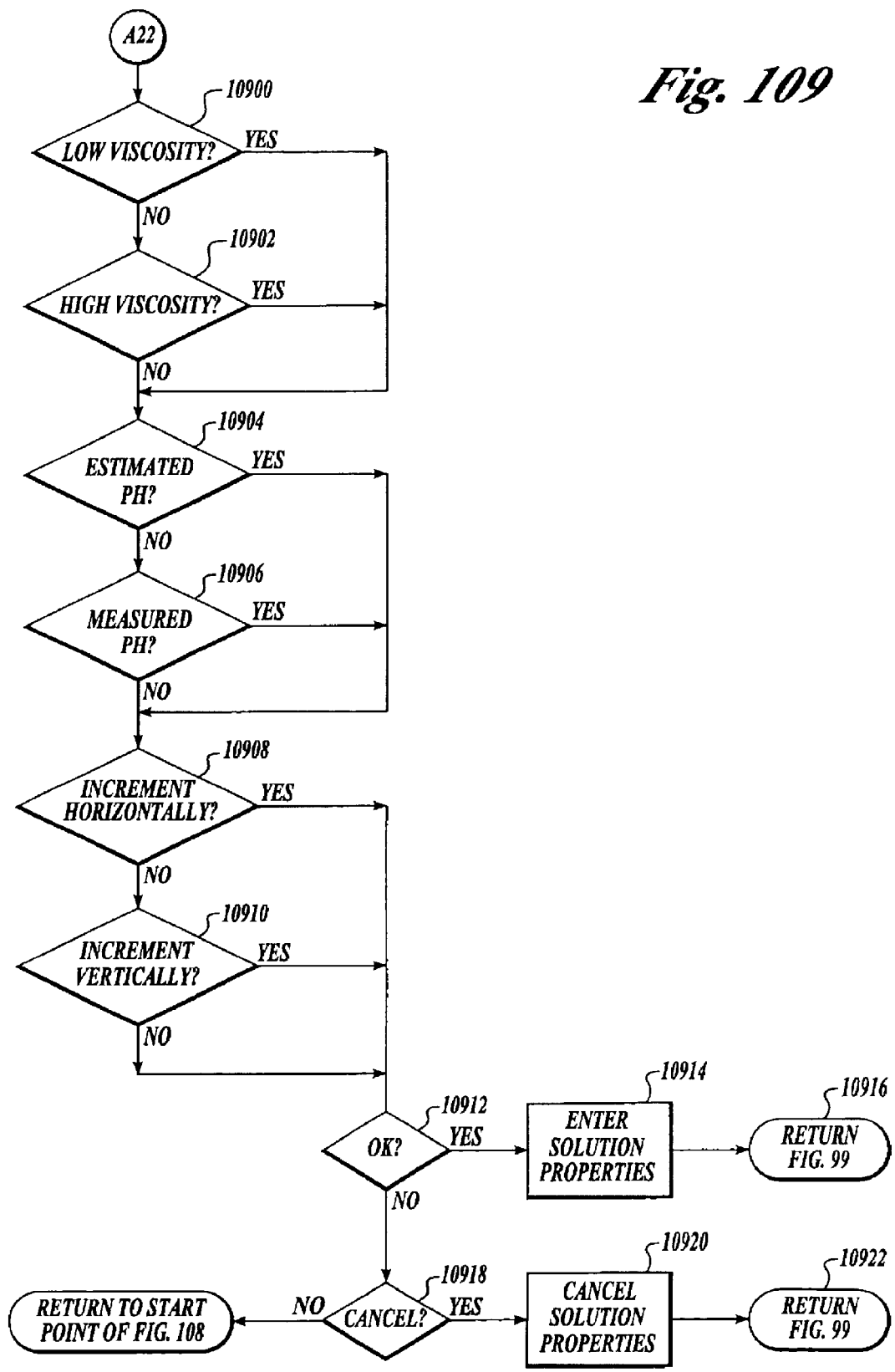

After a well position in the new matrix template has been filled with a crystallization condition, the condition can be changed One way of changing the condition is by clicking on a well properties command button 10114 (FIG. 101). This action is shown as steps 9930, 9932, and 9934 of FIG. 99. More specifically, if a well has been selected (step 9932), a dialog window (not shown), which is used to enter any new solution attributes, opens. A functional flow diagram of a suitable solution attributes entry process formed in accordance with this invention is shown in FIGS. 108 and 109. The new solution attributes entry dialog window, which is similar to previously described windows, provides a field box for entering the pH of the solution. This is step 10802 in FIG. 108. The user can specify systematic variation by entering the increment to vary the pH parameter along either the X or the Y axis. This action is represented by step 10804 of FIG. 108. The solution attributes dialog window also provides a field box for entering the vapor pressure osmolality. This action is represented by step 10806. Osmolality units are changed by clicking on a down arrow button located alongside an osmolality field units box. Clicking on the down arrow button opens a drop down list of the unit choices. Clicking on a selection enters the units into the osmolality units field box and closes the drop down list. This action is shown as steps 10808 and 10810 in FIG. 108.

The solution attributes dialog window also provides a field box for entering the conductivity of the solution. This action is represented by step 10812. The conductivity units are changed by clicking on the down arrow button alongside a conductivity units field. Clicking on the down arrow opens a drop down list of the available unit choices. Clicking on a selection enters the units into the conductivity units field box and closes the drop down list. This action is represented by steps 10814 and 10816 of FIG. 108.

The solution attributes dialog window also includes a solvent field box. The solvent in the field box is changed by clicking on a down arrow button alongside the solvent field box. Clicking on the down arrow button opens a drop down list of the available solvents. Clicking on a selection enters the solvent into the solvent field text box and closes the drop down list. This action is represented by steps 10818 and 10820 of FIG. 108. Low or high viscosity is selected by clicking on either a low radio button or a high radio button. This action is shown as steps 10900 and 10902 in FIG. 109. Radio buttons are also used to denote if the pH is either estimated or measured. This action is represented by steps 10904 and 10906 of FIG. 109. A user can select either increment horizontal or increment vertical, which applies only to the pH of the solution. Clicking on an increment horizontal radio button varies the pH by an increment selected previously along the horizontal axis. Clicking on an increment vertical radio button varies the pH by an increment selected previously along the vertical axis. This action is shown as steps 10908 and 10910 of FIG. 109. Clicking an OK command button enters the solution properties and cycles the program to the matrix mix builder dialog window 10100 (FIGS. 101 and 102). This action is represented by steps 10912, 10914, and 10916 of FIG. 109. Alternatively, clicking on a cancel command button cancels the solution properties before cycling the program, to the matrix mix builder dialog window 10100. This action is shown by steps 10918, 10920, and 10922 of FIG. 109.

Referring again to the matrix mix builder dialog window 10100 (FIGS. 101 and 102), conditions in the new matrix template can also be modified by adding chemical components. Chemical components are added to conditions in the new matrix template by selecting the well positions to be modified. Thereafter, clicking on an add buffer command button 10112 adds a compound buffer to the well condition. This action is shown by steps 10000, 10002 and 10004 of FIG. 100. More specifically, if at least one well has been selected (step 10002), an add compound buffer builder dialog window is opened (step 10004). Since this dialog window is similar to previously described dialog windows, it is not shown.

Figure 110:
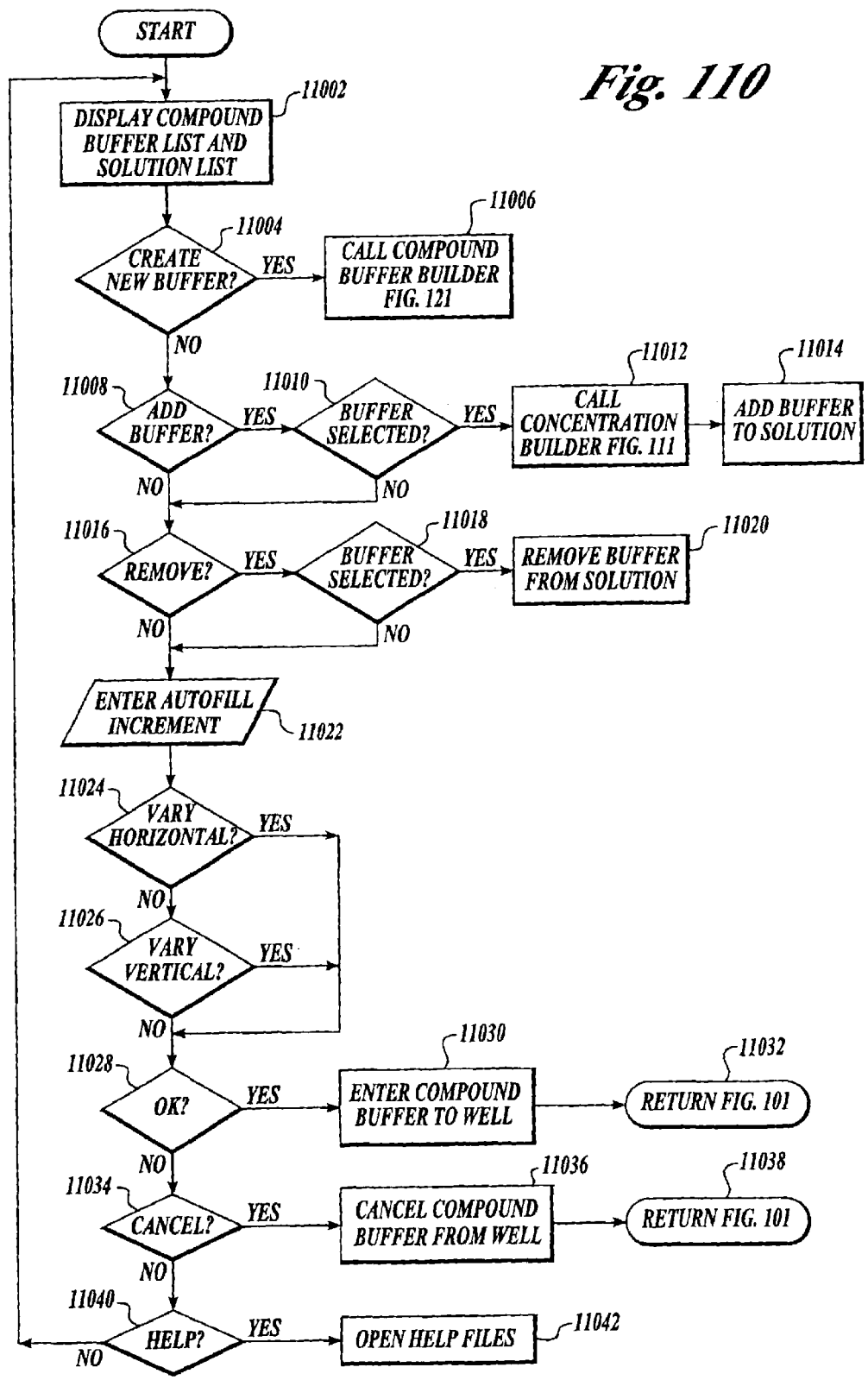
FIG. 110 shows a functional flow diagram for a matrix compound buffer builder according to the present invention.

FIG. 110 is a functional flow diagram of a matrix compound buffer builder formed in accordance with this invention. The matrix compound buffer builder dialog window includes a compound buffer source list box and a solution buffer list box. The compound buffer source list box shows all the buffer systems in the database. The solution buffer list box shows the current buffer systems in the well condition. The displays of these boxes is represented by a step 11002 of FIG. 110. If a user desires to create a new buffer, a new buffer command button is clicked on. This action is represented by step 11004 of FIG. 110. Clicking on the new buffer command button cycles the program to a new compound buffer builder dialog window (FIG. 121), which is described below. This action is shown as steps 11004 and 11006 of FIG. 110. An existing buffer is added to the solution buffer list by clicking on an ADD command button. This action is represented by steps 11008, 11010, 11012 and 11014. If a compound buffer system has been selected (11010), the previously described concentration builder dialog box opens, which prompts the user to enter a concentration value. As previously described, clicking on the OK command button in the concentration builder dialog box adds the selected buffer to the solution list (step 11014, FIG. 110). Buffers can also be removed from the solution list. This action is shown by step 11016, 11018 and 11020 of FIG. 110. If a buffer has been selected (step 11018), clicking on a REMOVE command button deletes the buffer from the solution list box (step 11020). The buffer condition can be incremented by entering an increment value in an increment field box. This action is represented by step 11022 of FIG. 110. Clicking on either a horizontal radio button or a vertical radio button increments the concentration of the buffer by the chosen increment along either the X or the Y axis. This action is shown as steps 11024 and 11026 of FIG. 110.

The matrix compound buffer builder dialog window also includes an OK command button. Clicking on the OK command button enters the compound buffer to the well condition and cycles the program to the matrix mix builder dialog window 10100 of FIGS. 101 and 102. This action is shown as steps 11028, 11030, and 11032 of FIG. 110. The matrix compound buffer builder dialog window also includes a cancel command button. Clicking on the cancel command button cancels the compound buffer from the well condition before cycling the program to the matrix mix builder dialog window 10100. This action is represented by steps 11034, 11036, and 11038 of FIG. 101. Clicking on a HELP command button opens the help file as represented by steps 11040 and 11042.

Figure 104:
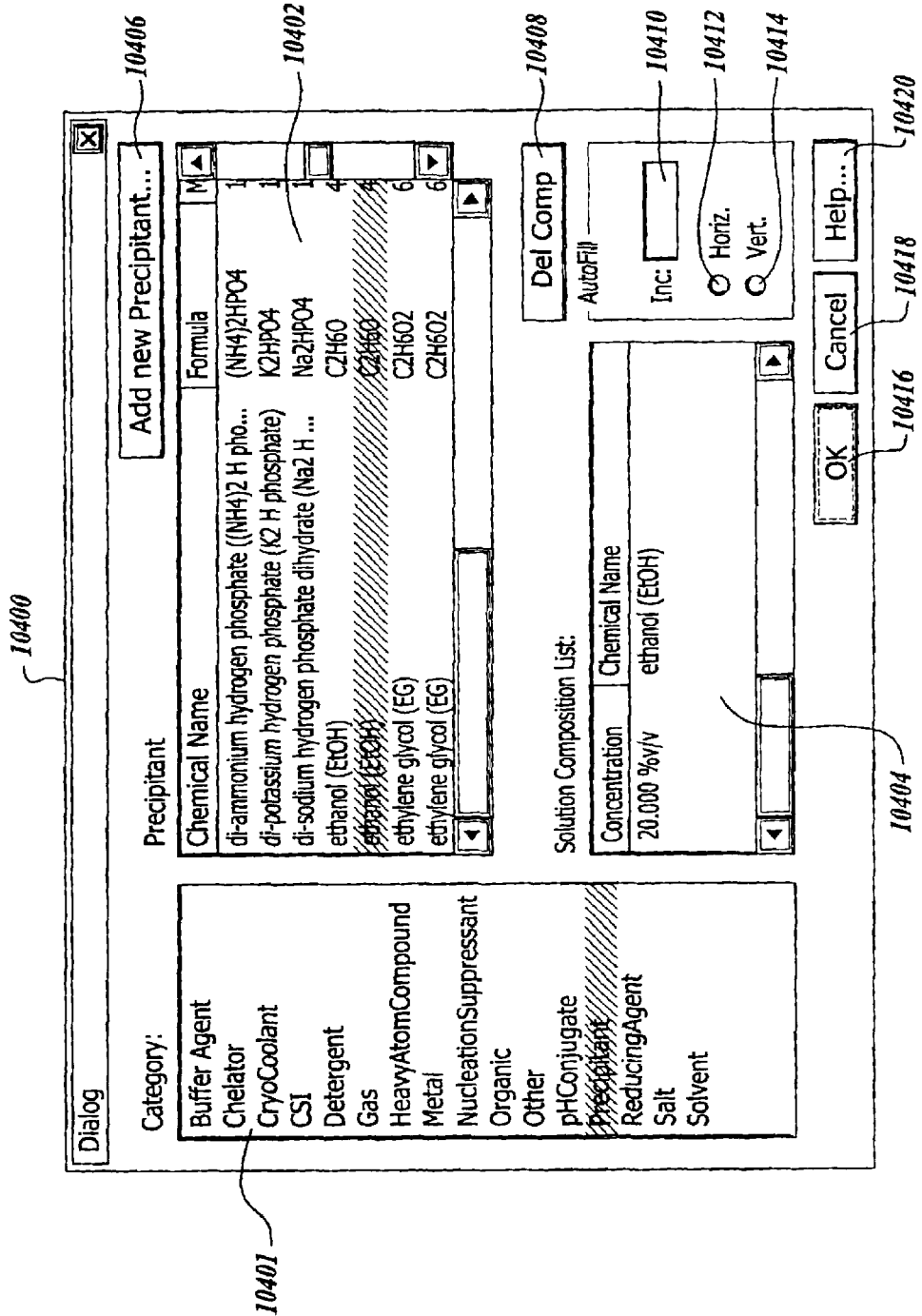
FIG. 104 shows a GUI for a matrix chemical builder according to the present invention.

Referring again to the matrix mix builder dialog window 10100 (FIGS. 101 and 102), the conditions in the new matrix template also can be modified by adding chemical components. Prior to adding chemical components to conditions in the new matrix template, the well positions to be modified are selected. This action is shown by steps 10006 and 10008 in FIG. 100. Thereafter, clicking on an add chemical command button 10100 launches a matrix chemical builder. This action is shown as step 10010 in FIG. 100. FIG. 104 illustrates a functional flow diagram of a matrix chemical builder formed in accordance with this invention.

Figure 112:
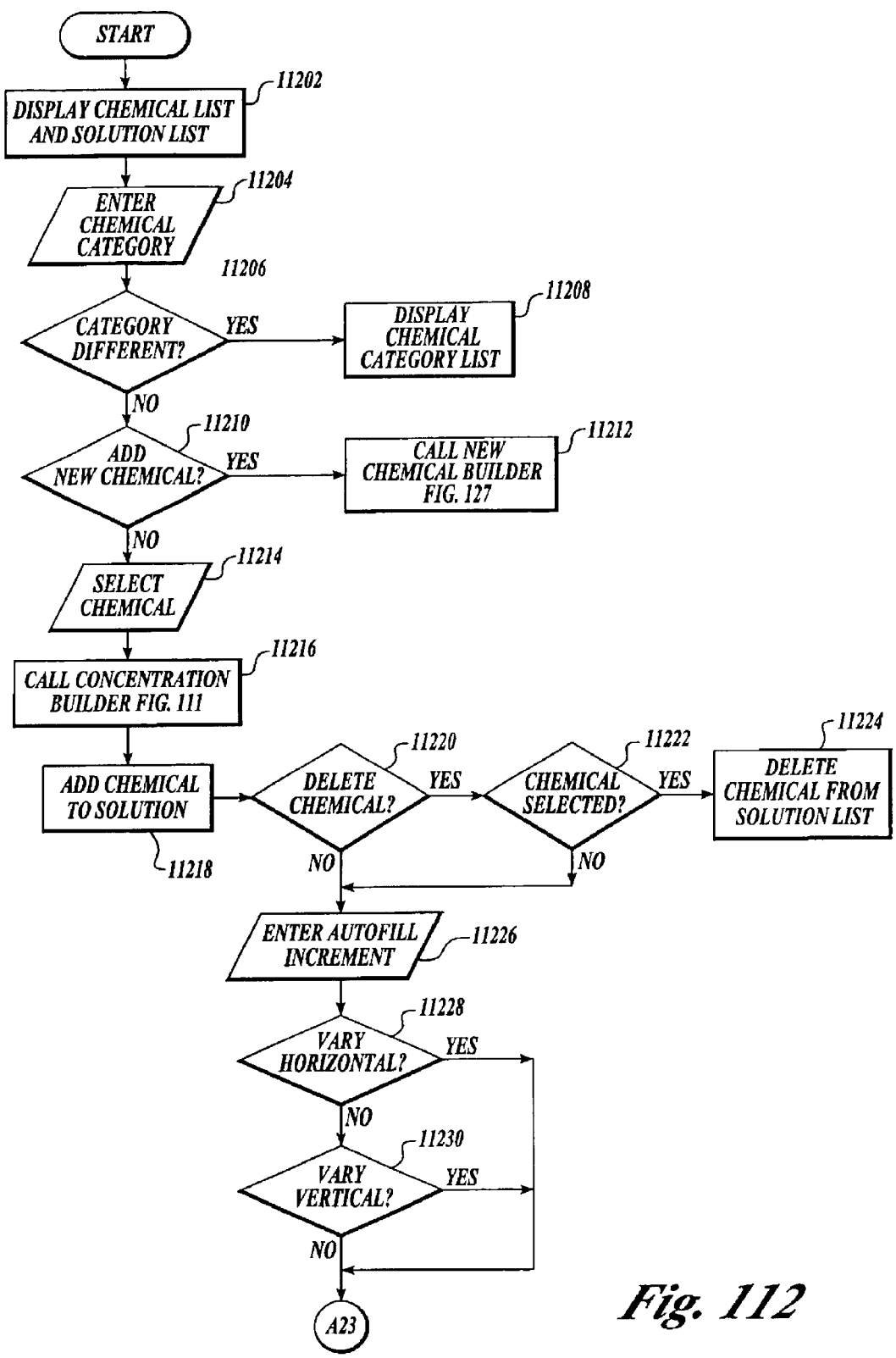
FIGS. 112–113 show a functional flow diagram for a matrix chemical builder according to the present invention.

Referring now to FIG. 104, the matrix chemical builder dialog window 10400 includes a chemical category list box 10401 that displays all available chemical categories and, a chemical list box 10402 that displays all of the chemicals in a chosen chemical category. The matrix chemical builder dialog window 10400 also includes a solution composition list box 10404. The display of these lists is represented by step 11202 of FIG. 112. As noted, selecting a chemical category lists all the chemicals in the database for that category in the chemical list box 10402. This action is represented by step 11204 of FIG. 112. Selecting a different category causes a different chemical list to be displayed. This change is represented by steps 11206 and 11208 of FIG. 112.

Figure 125:
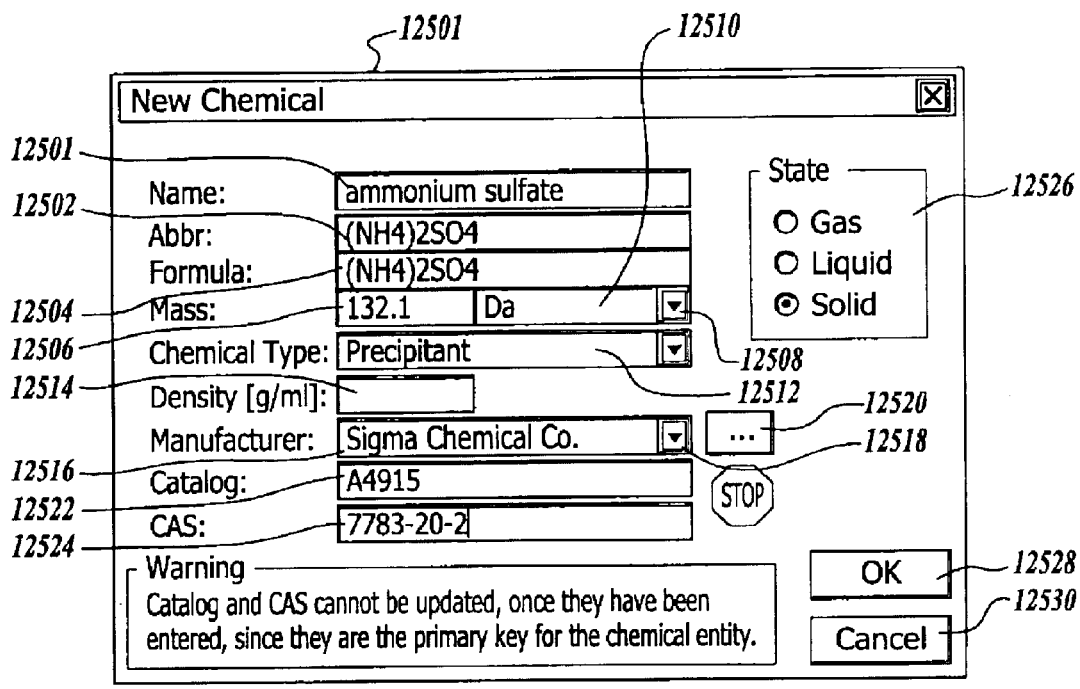
FIG. 125 shows a GUI for a new chemical builder according to the present invention.

A new chemical can be added to the database from the matrix chemical builder by clicking on an add new precipitant command button 10406. Clicking on the add new precipitant command button 10406 calls or launches a new chemical builder dialog window an example of which is illustrated in FIG. 125 and described below. This action is shown as steps 11210 and 11212 of FIG. 112. A chemical can be added to the solution list 10404 by double clicking on the chemical name, which launches the concentration builder (FIG. 111) where the concentration of the selected chemical is entered. This action is shown as step 11214 and step 11216 in FIG. 112. The functional flow diagram of the concentration dialog box is shown in FIG. 111. This figure has been described previously and will not be described in greater detail. Clicking on the OK command button in the concentration dialog box will add the chemical and the chemical concentration to the solution list box 10404 in the dialog window of FIG. 104. This is shown as step 11218 in FIG. 112. Chemicals can be deleted from the solution composition list box by selecting the chemical and clicking on a delete component command button 10408. This action is represented by steps 11220, 11222, and 11224 of FIG. 112. Concentration can be varied either across the horizontal or the vertical axis by entering an increment in an increment field box 10410 (step 11226, FIG. 112).

Chemical concentration can be varied either horizontally or vertically by selecting either a horizontal radio button 10412 or a vertical radio button 10414. This action is represented by steps 11228 and 11230 of FIG. 112.

Figure 113:
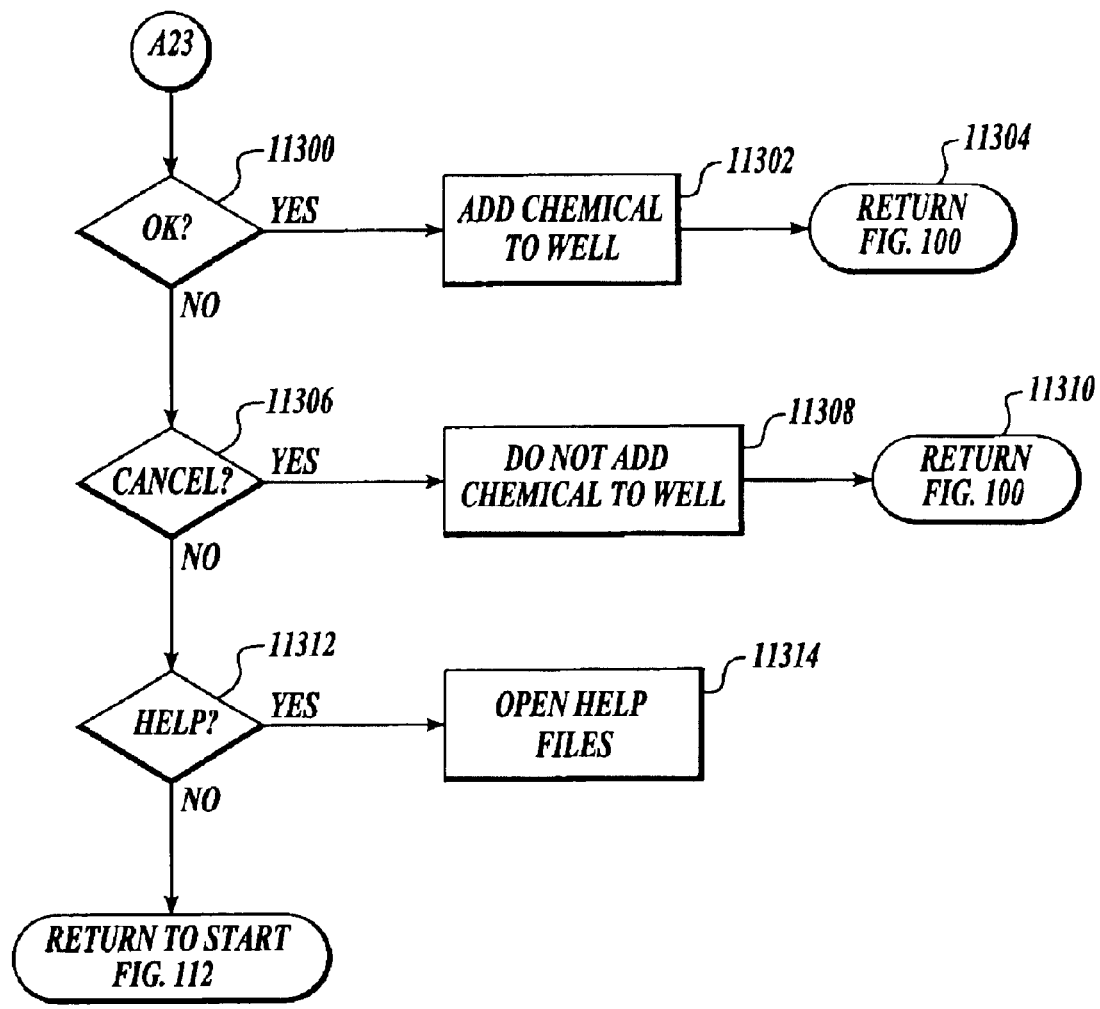

Clicking on an OK command button 10416 adds the chemical to the well condition and cycles the program to the matrix mix builder dialog window 10100 (FIG. 101 or 102). This action is represented by steps 11300, 11302, and 11304 of FIG. 113. Clicking on a cancel command button 10420 cancels the matrix chemical builder entries and cycles the program to the matrix mix builder dialog window 10100. This action is represented by steps 11306, 11308, and 11310 of FIG. 113. Clicking on a held command button 10422 opens the help file. This action is shown as steps 11312 and 11314 of FIG. 113.

Referring again to the matrix mix builder dialog window 10100 (FIGS. 101 and 102), all of the conditions of a well can be deleted by selecting the well and clicking on a clear command button 10108. This action is represented by steps 10012, 10014, and 10016 of FIG. 100. If a well has been selected (step 10014), the well is cleared of all conditions (step 10016).

Returning again to the matrix mix builder dialog window 10100 a constant dilution to all chemical components in the selected wells of the new matrix template by clicking on a dilute command button 10126. Prior to doing so, a dilution percent is entered in a dilution percent field box 10128. This action is represented step 10018 of FIG. 100. Clicking the DILUTE command button 10126 dilutes the selected wells. This action is shown by steps 10020, 10022, and 10024. More specifically, if a well had been selected (step 10022), the selected well or wells are diluted to the dilution percent indicated in the dilution field box 10128 (step 10024). Using the dilute feature removes the name of the condition (if obtained from a commercial source matrix), since the condition has changed from what it originally was.

Figure 105:
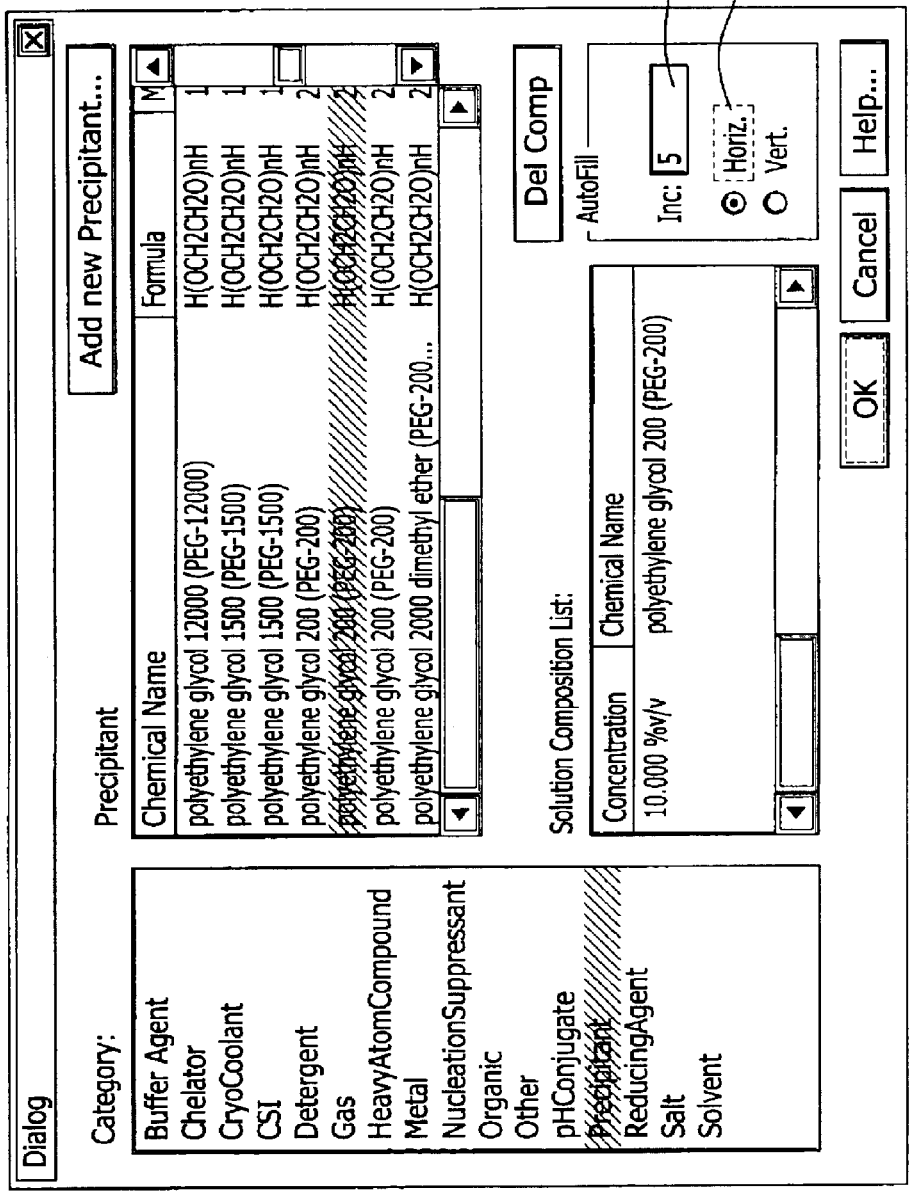
FIG. 105 shows a GUI for a matrix chemical builder according to the present invention.

A new matrix template can be built from scratch by using the add buffer and add chemical command buttons and the corresponding matrix compound buffer builder and matrix chemical builder that are launched. Taking advantage of the autofill feature of the builders allows a user to build a systematic matrix by varying the concentration of the buffer or chemical, either horizontally or along the vertical axis. FIG. 105, which replicates FIG. 104, shows how a systematically varied matrix is created. Specifically, a systematically varied matrix is created by filling in an increment field 10500 and specifying horizontal variation by checking the horizontal radio button 10502.

Referring again to FIG. 101, the matrix mix builder dialog window 10100 also includes a back command button 10130. Clicking on the back command button 10130 cycles the program to the matrix attributes builder dialog window 9700 (FIG. 97). This action is shown by steps 9424 and 9426 of FIG. 94. The matrix mix builder dialog window 10100 also includes a next command button 10132. Clicking on the next command button 10132 launches a systematic variation builder described below, provided all the wells have at least one chemical. This action is shown as steps 9428, 9430, and 9432 in FIG. 94. If all of the wells do not have at least one chemical, an error message appears that prompts the user to complete mixing the new matrix, step 9434 of FIG. 94. The matrix mix builder dialog window 10100 also includes a cancel command button 10134. Clicking on the cancel command button 10134 cancels the new matrix and returns the user to the matrix manager dialog window 8300 (FIG. 83). This action is shown as steps 9436, 9438, and 9440 in FIG. 94. The dialog window of FIG. 101 also includes a HELP command button 10136. Finally, as in the other windows, clicking on command button opens the help files. This action is represented by steps 9500 and 9502 of FIG. 95.

Matrix Manager: New Matrix: Systematic Variation Builder

Figure 114:
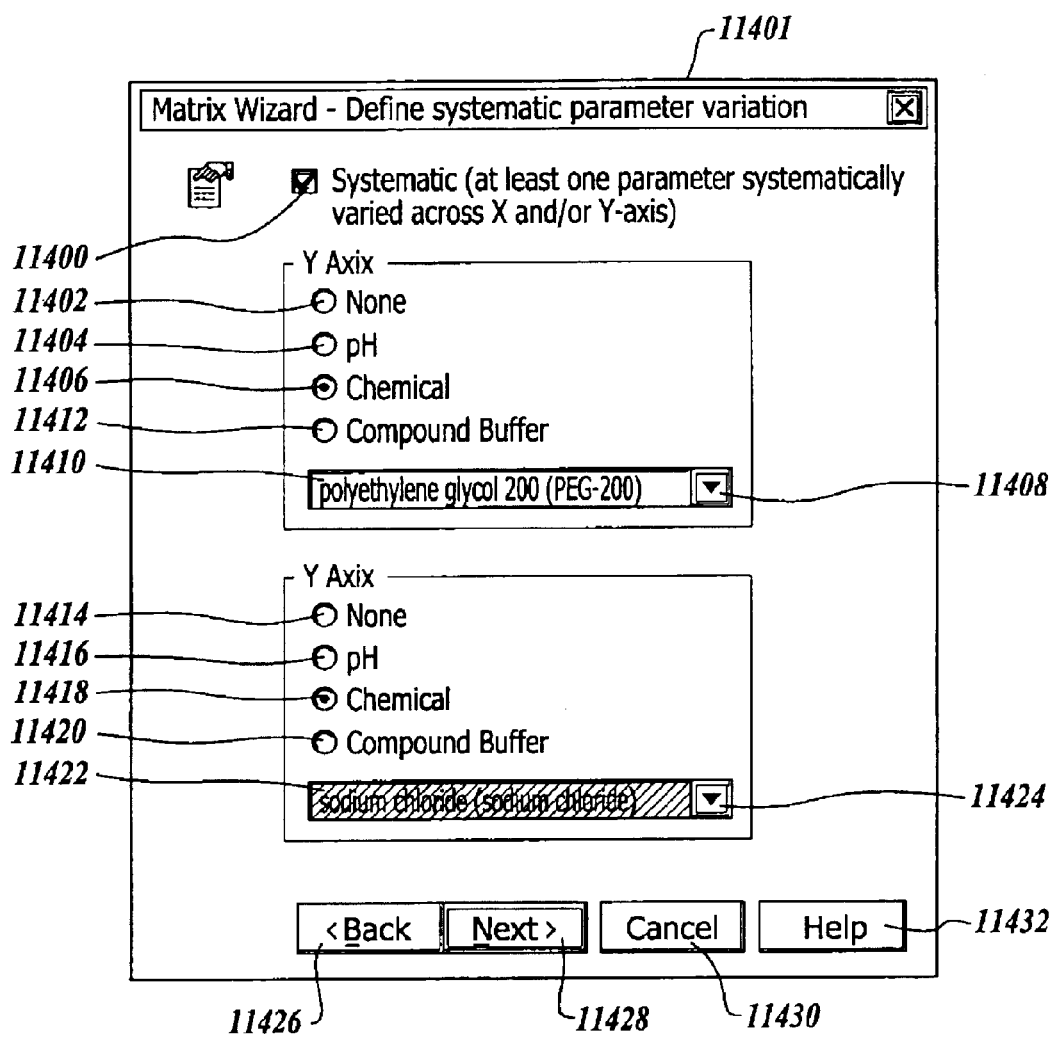
FIG. 114 shows a GUI for a systematic variation builder according to the present invention.
Figure 115:
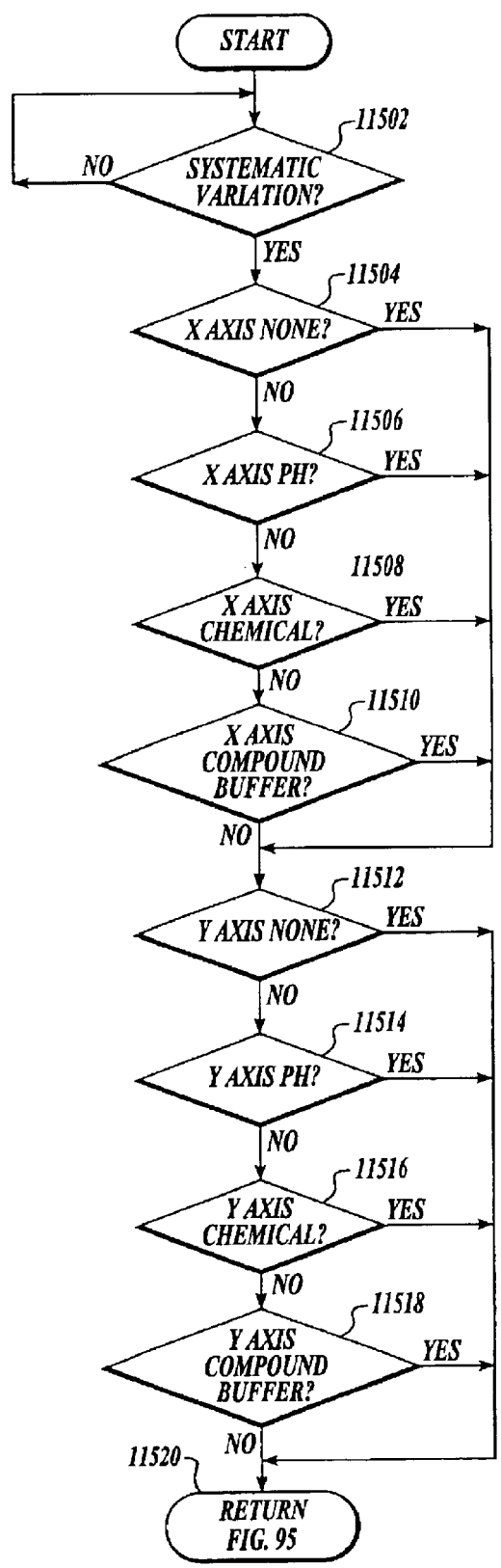
FIG. 115 shows a functional flow diagram for a systematic variation builder according to the present invention.

A systematic variation builder dialog window 11400 formed in accordance with this invention is illustrated in FIG. 114 and a systematic variation builder functional flow diagram formed in accordance with this invention is shown in FIG. 115. Use of the systematic variation builder is only appropriate if a user has previously specified horizontal or vertical systematic variation of at least one chemical or a buffer system, or the pH of a solution.

Referring to FIG. 114, the systematic variation builder dialog window 11400 includes a check box 11401. This box is checked if systematic variation was specified in an earlier process step. A test of this check box is shown as step 11502 of FIG. 115. If the systematic variation check box is checked, systematic variation along the X axis and the Y axis is enabled. Four systematic variation choices are available along both the X and Y axes, all represented by radio buttons. The radio button associated with the parameter that has been systematically varied in a previous step is checked. The radio buttons are controlled so that a user can only select one button. Clicking on an X axis radio button 11402 labeled none selects no variation across the X axis. Clicking on the X axis radio button 11404 labeled pH selects systematic pH variation. Clicking an X axis on radio button 11406 labeled chemical selects systematic chemical variation. If a chemical qualifies for systematic variation, clicking on the chemical radio button enables a drop down list of the chemicals. Else, a message box will appear to warn the user, systematic variation is not available. Clicking on a down arrow 11408 opens a list box containing the chemicals that have been entered in the matrix. Clicking on an item cause the chemical to be entered into a field box 11410. Finally clicking on radio button 11412 labeled compound buffer selects systematically varying the compound buffer. If a compound buffer qualifies for systematic variation, it will appear in field box 11410. Else, a message box will appear to warn the user, systematic variation is not available. These actions are illustrated by steps 11504, 11506, 11508, and 11510 of FIG. 115.

Turning now to the Y axis, clicking on a radio button 11414 labeled none selects no variation across the Y axis. Clicking on a Y axis radio button 11416 labeled pH selects to systematically vary the pH of the solution. Clicking on a Y axis radio button 11418 labeled chemical selects to systematically varying a chemical. Clicking on a Y axis radio button 11420 labeled compound buffer selects varying a compound buffer across the Y axis. If either a chemical or a buffer qualifies for systematic variation it will be displayed in field box 11422, else, a message box will open to warn the user, systematic variation is not available. These choices are illustrated by steps 11512, 11514, 11516, and 11518 of FIG. 115. The systematic variation builder dialog window (FIG. 114) also includes a back command button 11426. Clicking on the back command button 11426 returns the user to matrix mix builder the dialog window 10100 (FIG. 101 or 102). This is shown as steps 9506 and 9508 in FIG. 95. The systematic variation builder dialog window 11400 also includes a next command button 11428. Clicking on the next command button 11428 cycles the program a display the new matrix properties process. This action is shown as steps 9510 and 9512 of FIG. 95. The systematic variation builder dialog window 11411 also includes a cancel command button 11430. Clicking on the cancel command button 11430 cancels the new matrix and returns the user to the matrix manager dialog window (FIG. 83). This action is represented by steps 9514, 9516, and 9518 of FIG. 95. The systematic variation dialog window 11400 also includes a help command button 11432. Clicking on the help command button 11432 opens the help files. This action is shown as steps 9520 and 9522 of FIG. 95.

Matrix Manager: New Matrix: Display Matrix Properties

FIG. 116, illustrates a new matrix properties dialog window 11600 formed in accordance with this invention. The purpose of this dialog window is to warn the user that he or she is about to create a new matrix. The new matrix properties dialog window contains a list of the following matrix properties: matrix name, date created, well count, column count, preparator, matrix type, X axis systematic variation, Y axis systematic variation and comments. The new matrix properties dialog window 11600 also includes a back command button 11601. Clicking on the back command button 11601 returns a user to the systematic variation builder dialog window 11400 (FIG. 114). This action is shown by steps 9526 and 9528 of FIG. 95. The new matrix properties dialog window 11600 also includes a finish command button 11602. Clicking on the finish command button 11602 creates the new matrix and returns the user to the matrix manager dialog window 8300 (FIG. 83). This action is shown as steps 9530, 9532, and 9534 of FIG. 95. The new matrix properties dialog window 11600 also includes a cancel command button 11604. Clicking on the cancel command button 11604 cancels the new matrix before returning the user to the matrix manager dialog window (FIG. 83). This action is represented by steps 9600, 9602, and 9604 of FIG. 96. The new matrix properties dialog window also includes a help command button 11606 that, when clicked on, calls up the help files. This action is shown as steps 9606 and 9608 in FIG. 96.

Matrix Manager: Delete Matrix

Returning now to the matrix manager dialog window 8300 (FIG. 83), when a delete command button 8320 is clicked on, a matrix is deleted from the database, provided a matrix from the matrix list was previously selected by clicking on it. Clicking on the delete command button 8320 opens a dialog window which asks the user to confirm the deletion. Clicking a yes command button 8320 cause the matrix to be deleted from the database. This action is represented by steps 8414, 8416, 8418, and 8420 of FIG. 84. The matrix manager dialog window 8300 also includes an import matrix command button 8322. Clicking on the import matrix command button 8322 opens a dialog window that contains a directory of matrices that can be imported. This action is represented by steps 8422 and 8424 of FIG. 84. The matrix manager dialog window 8300 also includes a view in browser command button 8324. To view the matrix in a browser format, a user must first select a matrix to be viewed by clicking on the matrix. Then, clicking on the view in browser command button 8324 opens a browser, and displays the matrix in tabular format. This action is represented by steps 8426 and 8428 of FIG. 84. The matrix manager dialog window 8300 also includes a help command button 8320. Clicking on the help command button 8320 opens the help files. This action is shown by steps 8430 and 8432. The matrix manager dialog window also includes a close command button 8328. Clicking on the close command button 8328 closes the matrix manager and returns the user to the main manager dialog window (FIG. 2). This action is shown by steps 8432 and 8434 of FIG. 84.

Compound Buffer Manager

Preferred embodiments of the present invention also include a compound buffer manager that is used to create and maintain buffer systems in a database. Each buffer system is composed of a buffering agent and a pH conjugate, which is used to adjust the pH of the buffer system.

Figure 117:
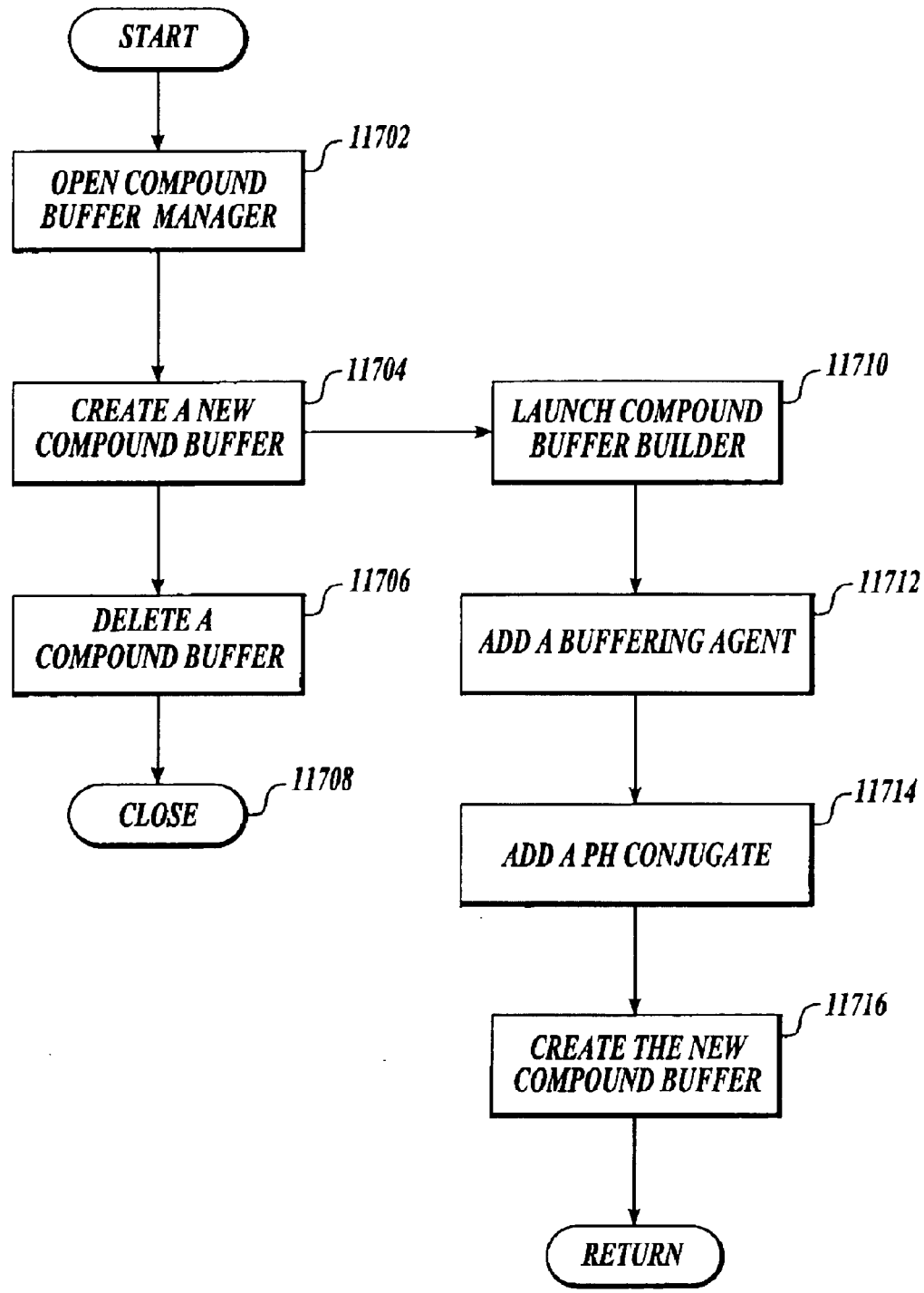
FIG. 117 shows a generic functional flow diagram for a compound buffer manager according to the present invention.

FIG. 117 is a functional flow diagram of a compound buffer manager according to the present invention. FIG. 117 illustrates a sequence of executable steps performed by a compound buffer manager formed in accordance with the present invention. Initially, the compound buffer manager launches a GUI or dialog window. This is step 11702 of FIG. 117. The buffer manager has the ability to create a new compound buffer (step 11704), or delete a compound buffer (step 11706). If a new compound buffer is to be created, a compound buffer builder is launched. This is step 11710. The compound buffer builder provides a buffering agent (step 11712)and a pH conjugate (step 11714). Finally, a user is given the choice of either creating the new compound buffer or deleting the new compound buffer (step 11716).

Figure 118:
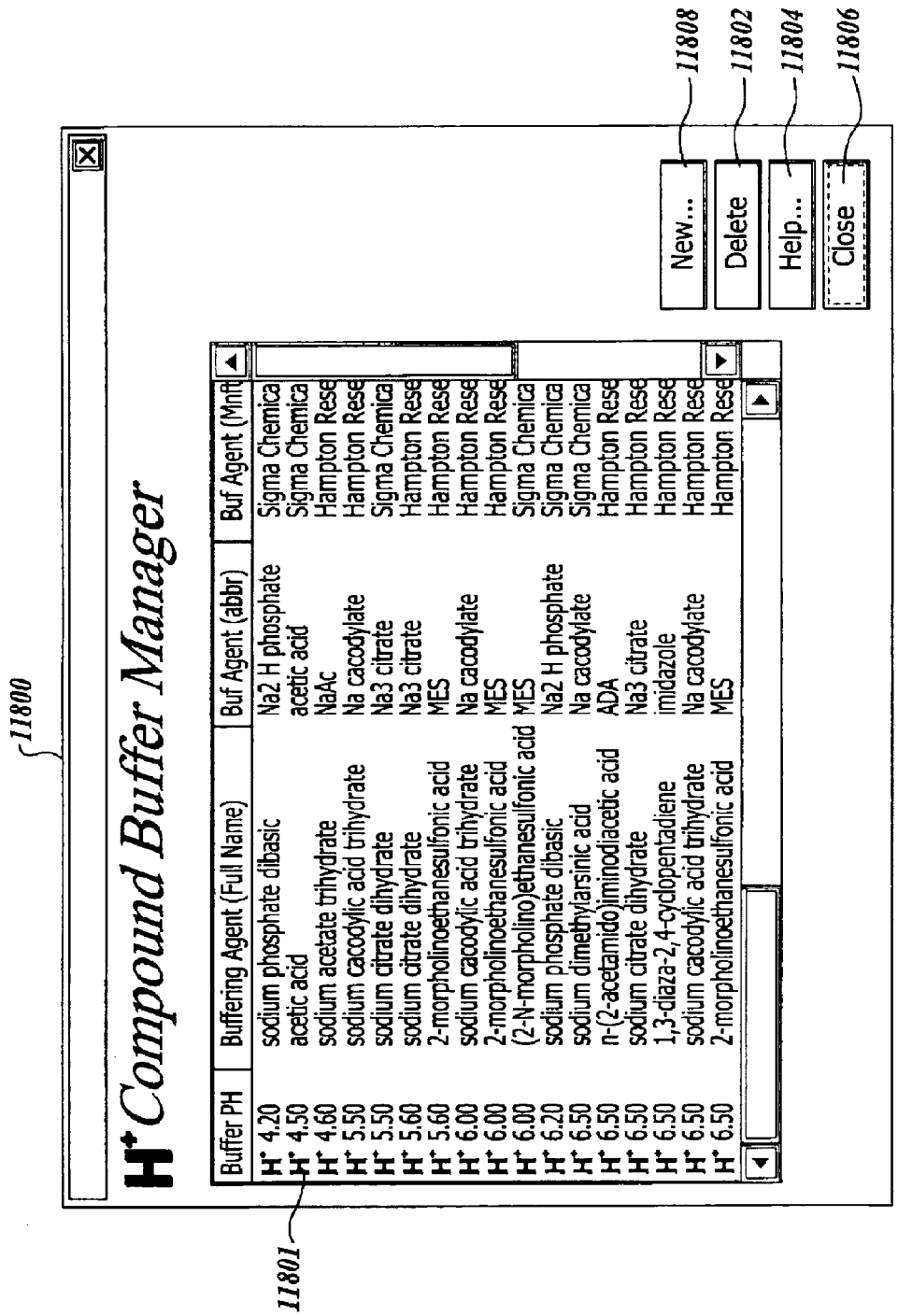
FIG. 118 shows a GUI for a compound buffer manager according to the present invention.

FIG. 118 illustrates a compound buffer manager dialog window formed in accordance with this invention and FIG. 19 illustrates a corresponding functional flow diagram of a compound buffer manager formed in accordance with this invention. The compound buffer manager dialog window 11800 displays all of the available compound buffers in a database. The compound buffers are displayed in tabular format with the compound buffer attributes displayed across the top of a compound buffer list box 11801.

The compound buffer manager dialog window 11800 also includes a new command button 11808, a delete command button 11808, a help command button 11804 and a close command button 11806.

Figure 119:
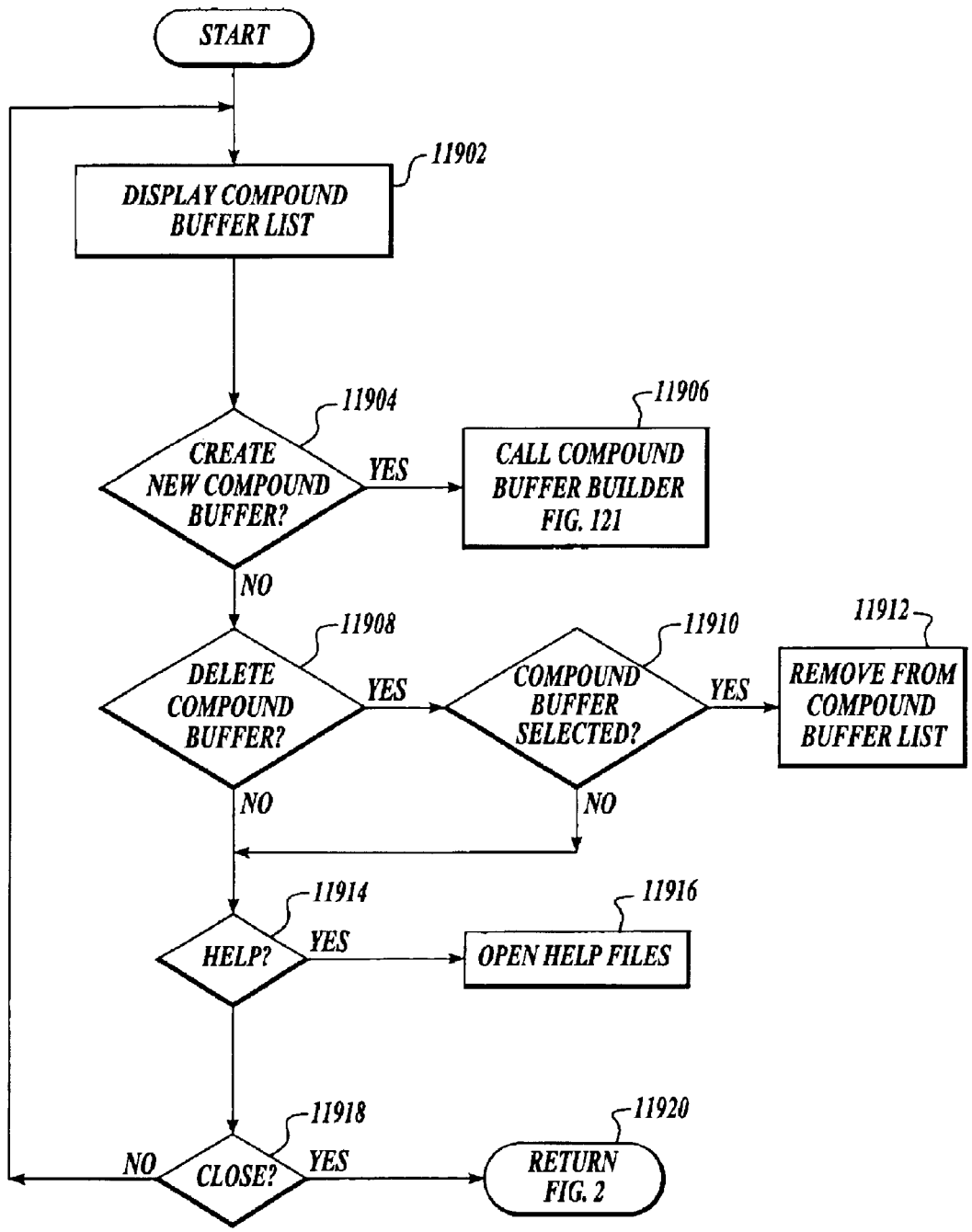
FIG. 119 shows a functional flow diagram for a compound buffer manager according to the present invention.

Displaying the compound buffers list box 11801 of all the available compound buffers in the database is represented by step 11902 of FIG. 19. Clicking on the new command button 11808 calls or launches a compound buffer builder, shown in FIGS. 120, 121 and 122, and described below. See steps 11904 and 11906 of FIG. 19. The delete command button 11802 is used to remove a compound buffer from the compound buffer list as shown by steps 11908, 11910 and 11912 of FIG. 119. Finally, a compound buffer is deleted by selecting a compound buffer system from the compound buffer list box 11800 by, for example, highlighting the compound buffer. Clicking on the delete command button 11802 deletes the compound buffer, removing from the database. Clicking on the help command button 11804 opens the help files. This action is represented by steps 11914 and 11916 of FIG. 119. Clicking on the close command button 11806 closes the compound buffer manager dialog window 11800 and returns the user to the main manager dialog window FIG. 2). This action is shown as steps 11918 and 11920 of FIG. 119.

Compound Buffer Manager: Compound Buffer Builder

Figure 120:
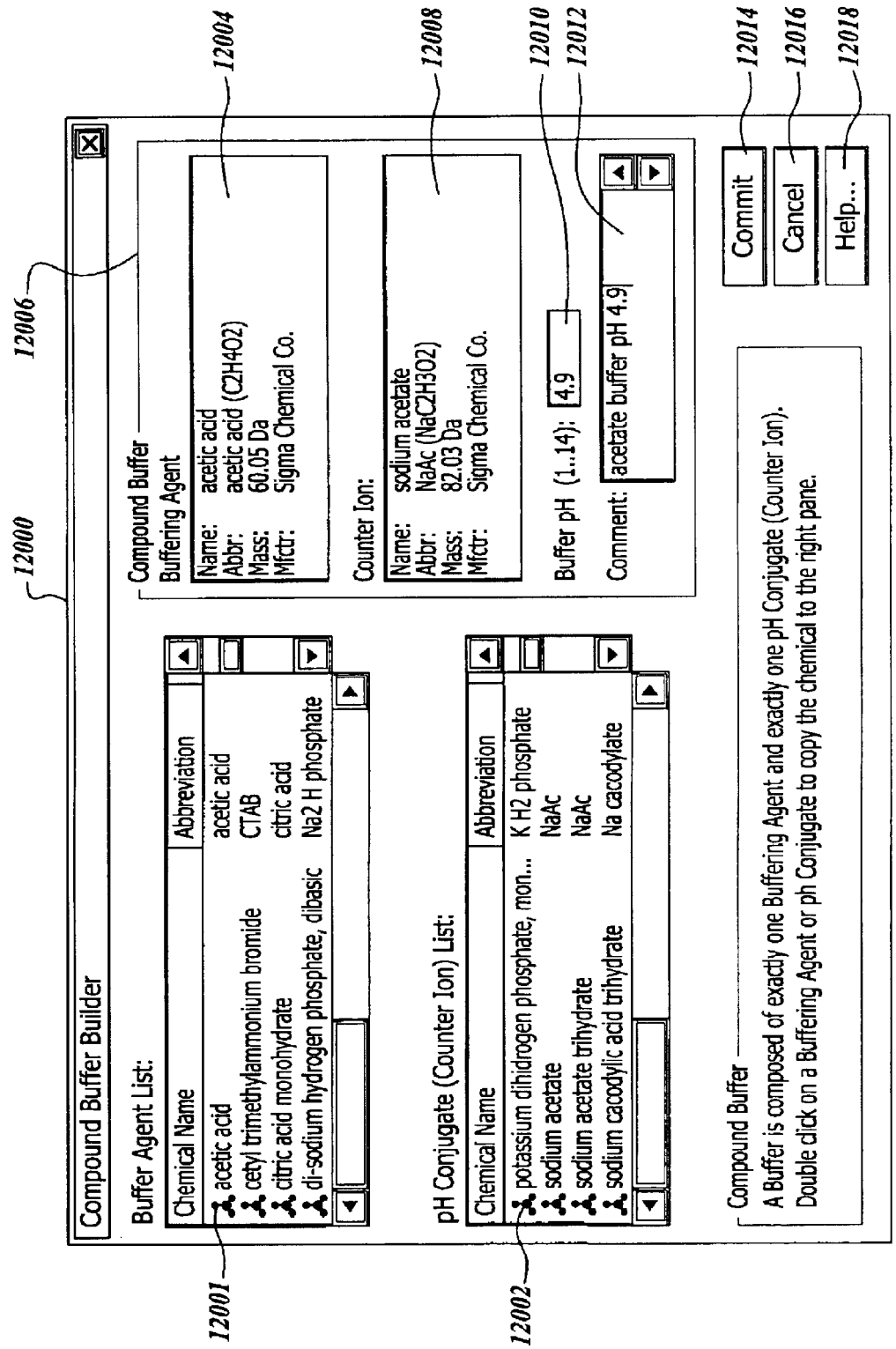
FIG. 120 shows a GUI for a compound buffer builder according to the present invention.
Figure 121:
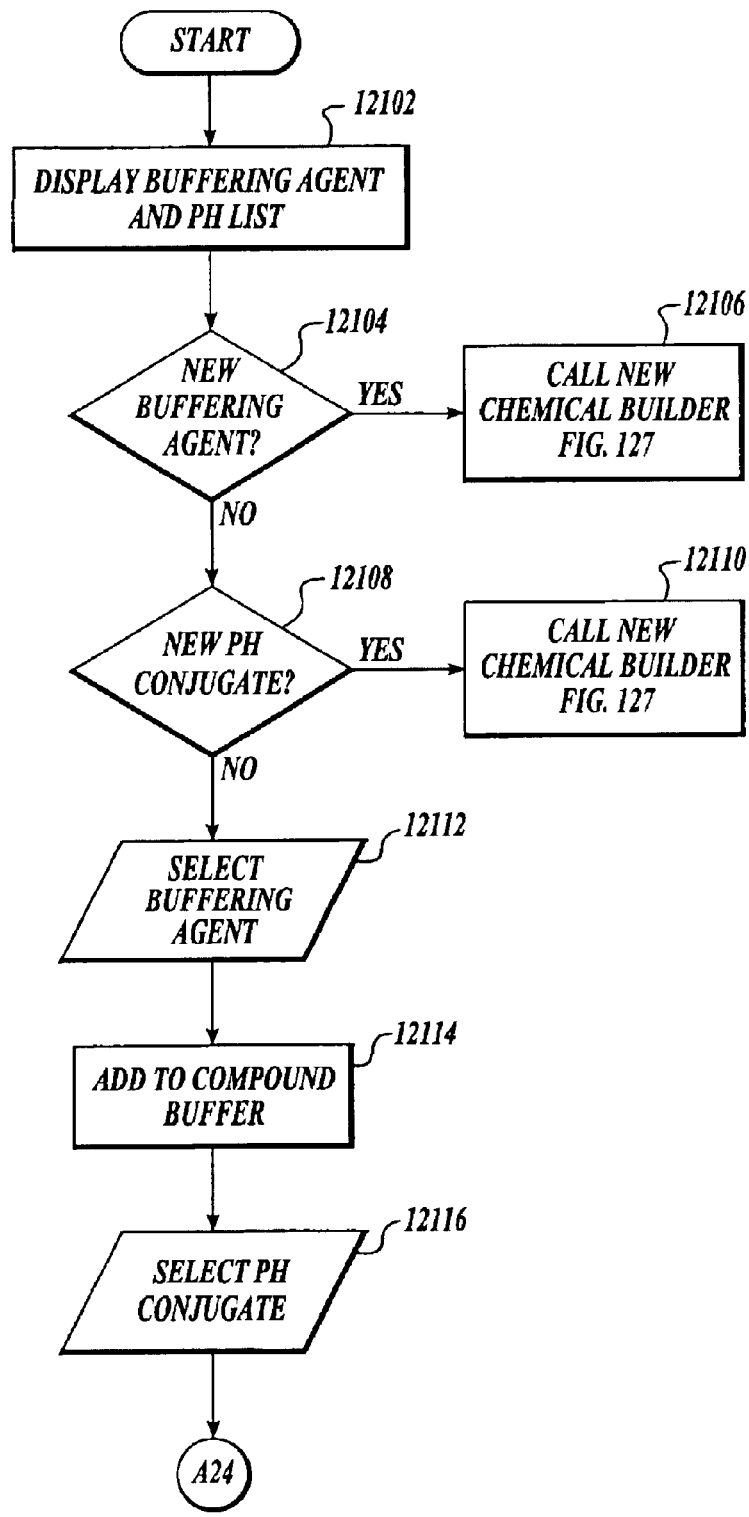
FIGS. 121–122 show a functional flow diagram for a compound buffer builder according to the present invention.
Figure 122:
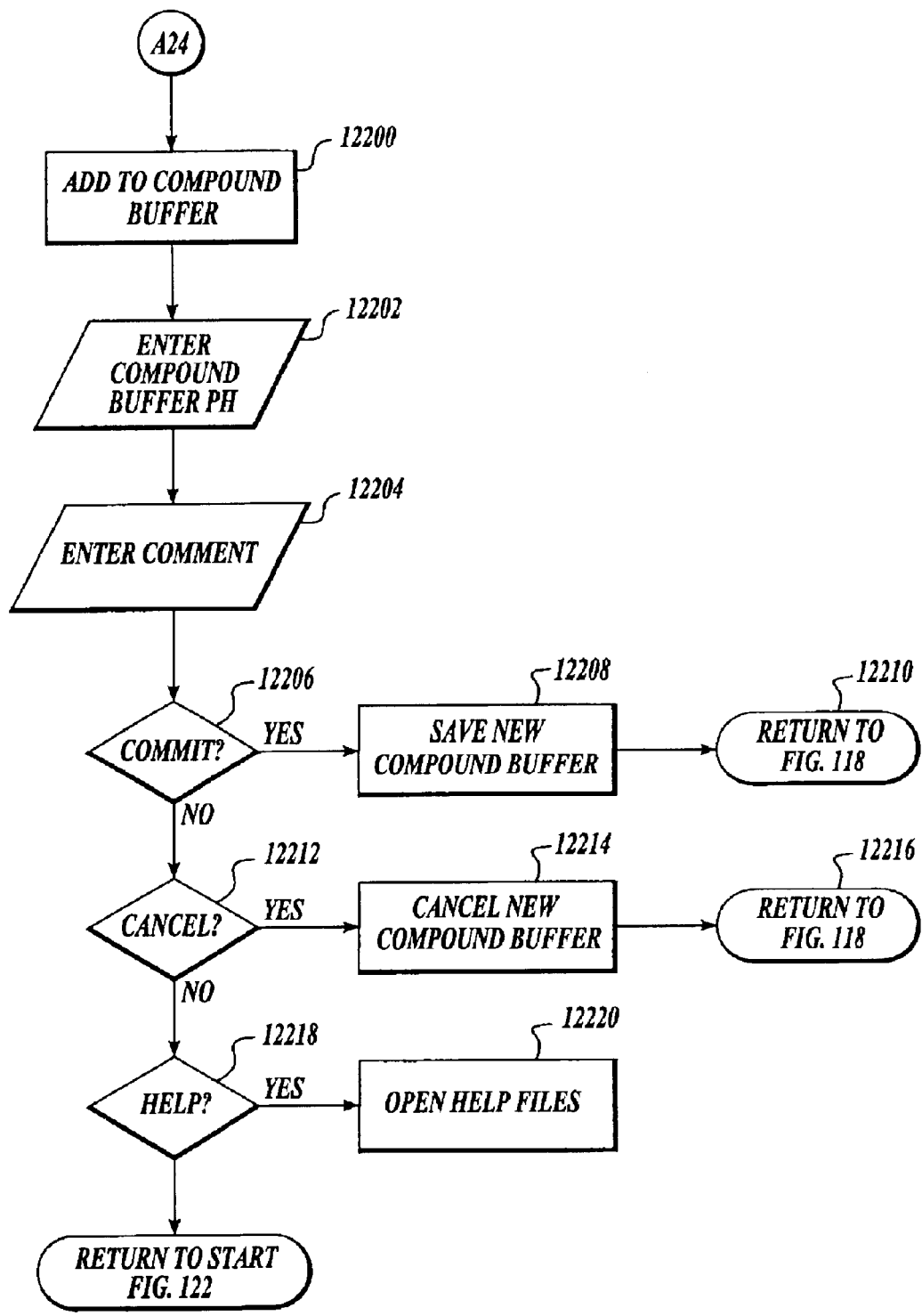

FIG. 120 illustrates a compound buffer builder dialog window 1200 formed in accordance with this invention and FIG. 121 and 122 form a functional flow diagram of compound buffer builder formed in accordance with this invention.

The compound buffer builder dialog window 12000 includes a buffering agent list box 12001 and a pH conjugate (counter ion) list box 12002. The buffering agent list box 12000 includes the names and properties of all the buffering agents in a database. The buffering agent list box 12001 includes horizontal and vertical scroll bars. The pH conjugate list box 12002 includes the names and properties of the pH conjugates in a database. The pH conjugate list box 12002 also includes vertical and horizontal scroll bars, located on one side, i.e., the right side, of the compound buffer builder dialog window 12000 is a frame 12006 for a new compound buffer. The frame 12006 includes a buffering agent box 12004 and a counter ion box 12008. The foregoing list box display is represented by step 12102 of FIG. 121.

The compound buffer builder dialog window 12000 also includes a new buffering agent command button (not shown). Clicking on the new buffering agent command button opens or launches a new chemical builder without leaving the compound buffer builder dialog window. This action is shown as steps 12104 and 12106 of FIG. 121. An example of a new chemical builder is illustrated in FIG. 125 and described below.

The compound buffer builder dialog window 12000 also includes a new pH conjugate command button (not shown). Clicking on the new pH conjugate command button also launches the new chemical builder as shown by steps 12108 and 12110 of FIG. 121. The new chemical builder is used to add all new chemicals to a database, however, when entering from the compound buffer builder dialog window, the chemical category will have been selected.

Adding a buffering agent to a compound buffer is accomplished by double-clicking on a chemical in the buffering agent list box 12000. Double-clicking on the chemical adds the buffering agent to the buffering agent box 12004 of the compound buffer frame 12006. This action is represented by steps 12112 and 12114 of FIG. 121. The user next selects a pH conjugate from the pH conjugate list box 12002. Double-clicking on a chemical in the pH conjugate list box adds the pH conjugate to the counter ion box 12008 of the compound buffer frame 12006. This action is represented by step 12116 of FIG. 121 and step 12200 of FIG. 122. The compound buffer pH also can be added in the buffer pH field box 12010. This action is shown as step 12202 of FIG. 121. Comments can be entered in a comment field box 12012 in the compound buffer box dialog window 12000 by selecting the command field box and entering the comment using a keyboard or other suitable input device. This action is illustrated by step 12204 of FIG. 122.

Clicking on a commit command button 12014 saves the new compound buffer in the database and returns a user to the compound buffer manager dialog window 11800 (FIG. 118). This action is represented by steps 12206, 12208 and 12210 of FIG. 122. Clicking on a cancel command button 12016 prevents the new compound buffer from being entered into the database. More specifically, clicking on the cancel command button 12016 cancels the new compound buffer. Thereafter the program returns a user to the compound buffer manager dialog window 11800. This action is shown by steps 12212, 12214, and 12216 of FIG. 122. Finally, clicking on a help command button 12018 opens the help files. This action is shown by steps 12218 and 12220 of FIG. 122.

Chemical Manager

Figure 123:
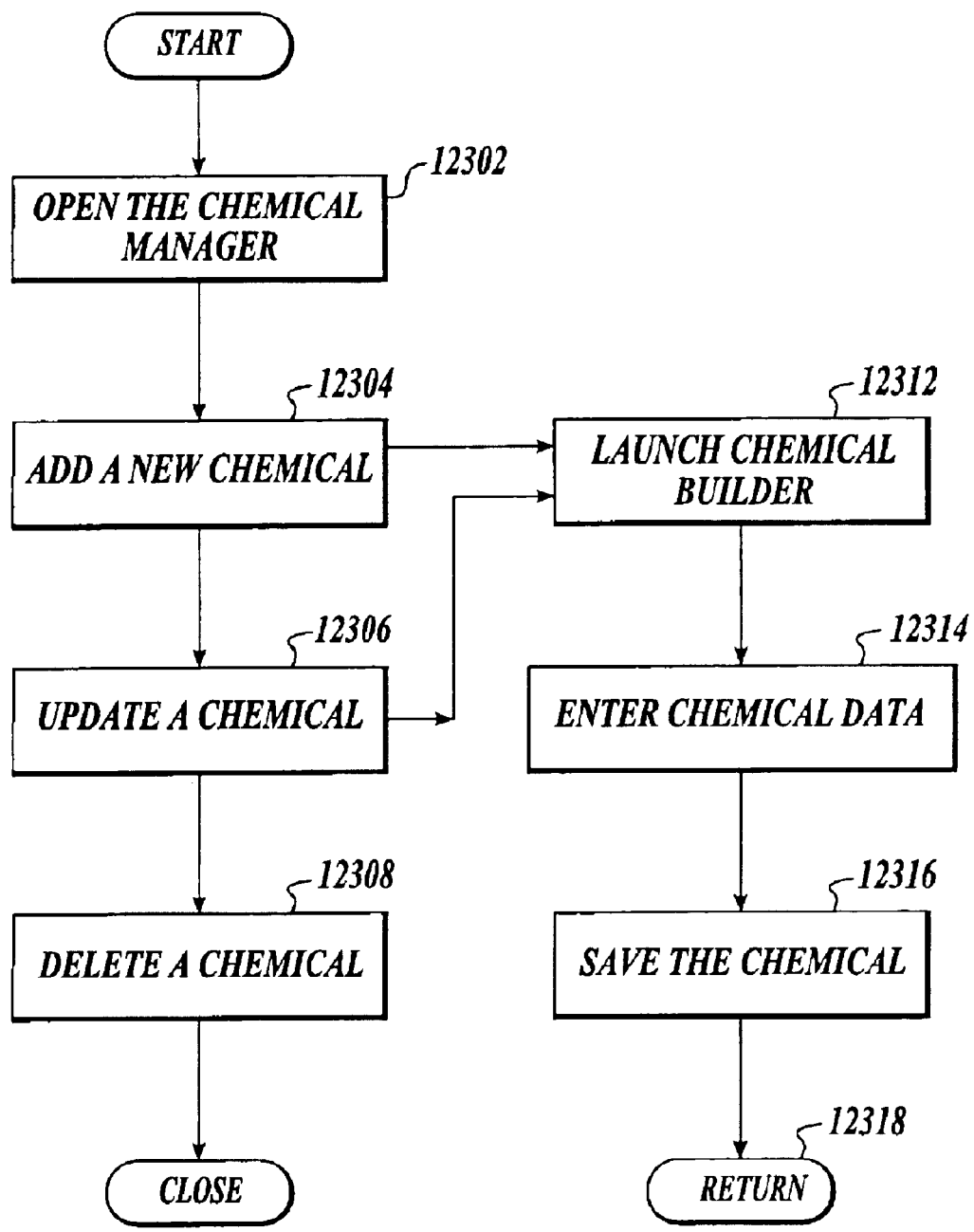
FIG. 123 shows a generic functional flow diagram for a chemical manager according to the present invention.

Preferred embodiments of the present invention also includes a chemical manager that organizes and creates new chemicals to be added to a database. The chemicals of the database are categorized according to their putative role in the macromolecule storage and crystallization. A generalized functional flow diagram of a chemical manager formed in accordance with the present invention is shown in FIG. 123. FIG. 123 illustrates a sequence of executable steps to be performed by a chemical manager formed in accordance with the present invention.

Initially, the chemical manager launches a GUI or dialog window. This is shown by step 12302 of FIG. 123. If desired the chemical manager can be used to add a new chemical to a database (step 12304), or the chemical manager can be used to update the properties of a chemical (step 12306). Further, the chemical manager can delete a chemical from the database (step 12308). Adding a chemical or updating a chemical's properties launches chemical builders, as shown by step 12312. After launch chemical data can be entered (step 12314). If desired, the new chemical or the updated chemical can be saved (step 12316).

Figure 124:
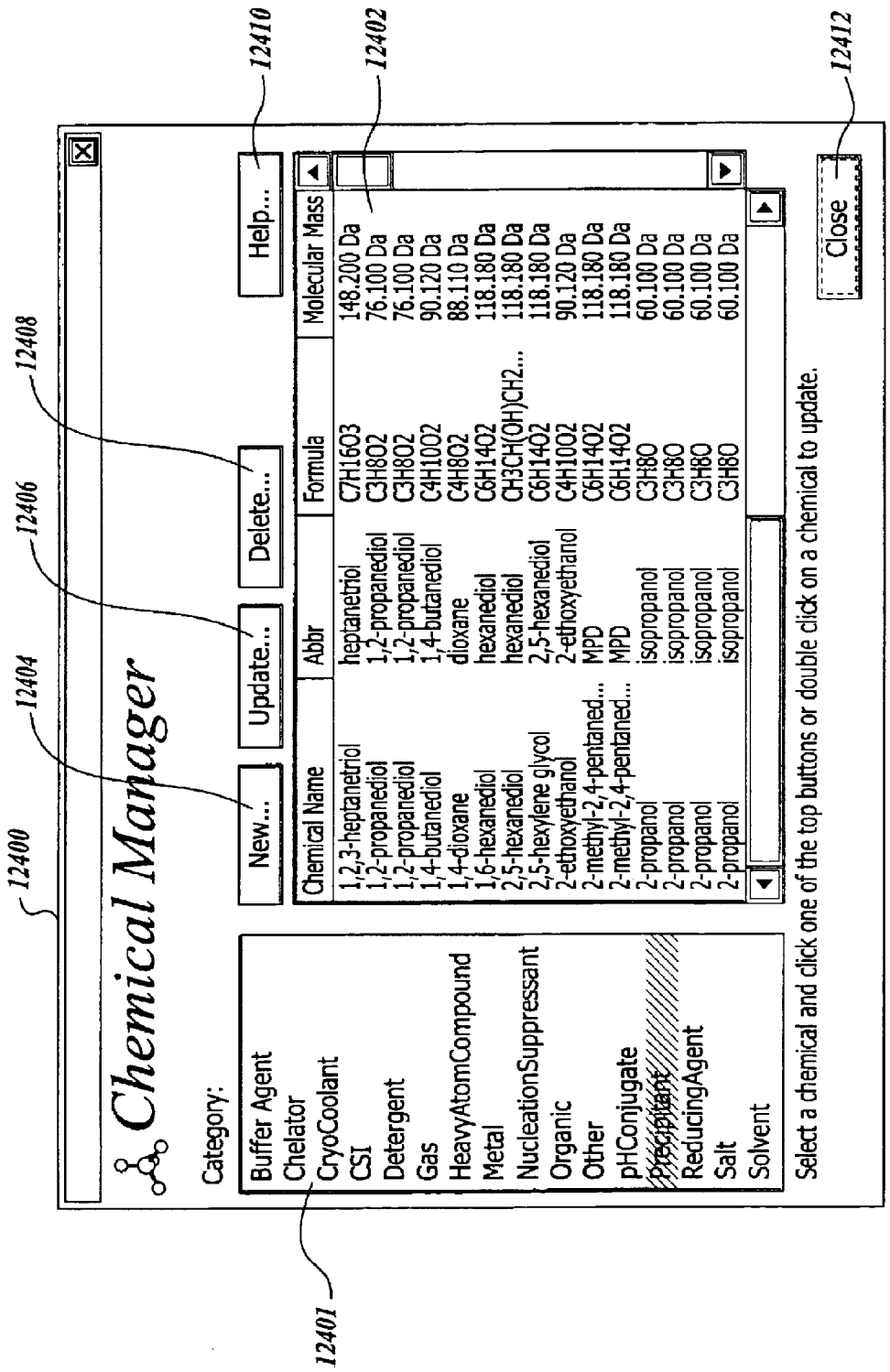
FIG. 124 shows a GUI for a chemical manager according to the present invention.
Figure 126:
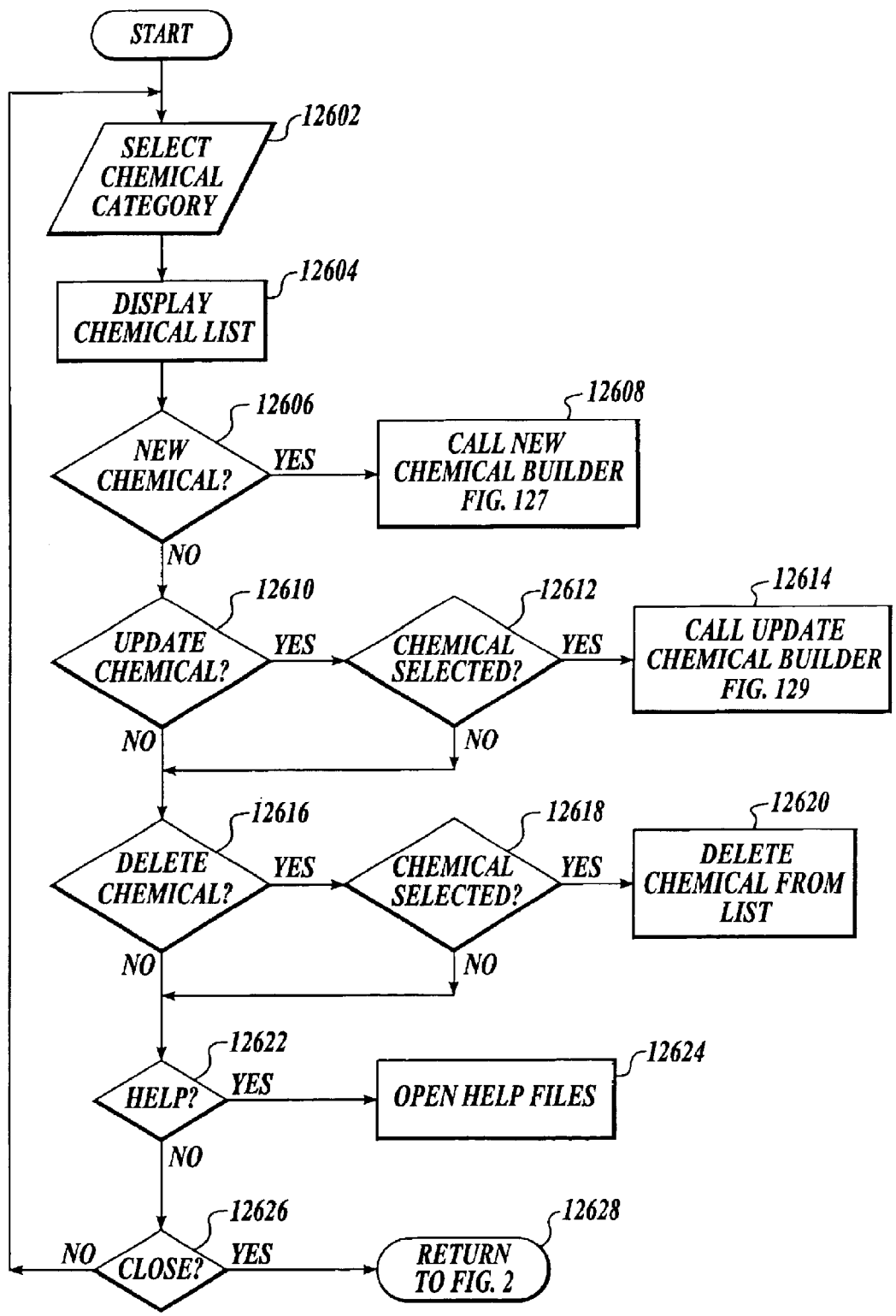
FIG. 126 shows a functional flow diagram for a new chemical builder according to the present invention.

FIG. 124 illustrates a chemical manager dialog window 12400 formed in accordance with the present invention and FIG. 126 is a corresponding functional flow diagram of a chemical manager formed in accordance with this invention.

On one side, e.g., the left side of the chemical manager dialog window 12400, is a category list box 12401. Chemicals are divided by the roles (categories) they play in crystallization. The following chemical categories are listed: buffering agent, chelator, cryocoolant, CSI, detergent, gas, heavy atom compound, metal, nucleation suppressant, organic, solvent, pH conjugate, precipitant, reducing agent, salt, and other. The chemical manager dialog window 12400 also includes a chemical list box 12402 the chemicals of a selected category in a database. The chemical list box 12402 includes all relevant properties of the chemicals. The chemical manager dialog window 12400 also includes a new command button 12404, an update command button 12406, a delete command button 12408, a help command button 12410, and a close command button 12412.

In order to enter a new chemical in the database, a category from the category list box 12400 must be first selected. This action is shown by step 12602 of FIG. 126. Clicking on a category displays the chemicals available in the database in the chemical list box 12402. When a user desires to add a new chemical to the category, he or she clicks on the new command button 12404. Clicking on the new command button 12404 calls or launches the new chemical builder, which is described below. This action is represented by steps 12606 and 12608 of FIG. 126.

Clicking on the update command button 12406 calls an update chemical builder (described below), provided that a chemical has been selected. This action is shown as steps 12610, 12612, and 12614 in FIG. 126. Clicking on the delete command button 12408 deletes a chemical from the database, provided that a chemical has been selected. A user selects a chemical by clicking on the chemical in the chemical list box 12402. This is shown as steps 12616, 12618, and 12620 in FIG. 126. Clicking on the help command button 12410 opens the help files. This action is represented by steps 12622 and 12624 in FIG. 126. Clicking on the close command button 12412 closes the chemical manager and returns the user to the main manager dialog window of FIG. 2. This action is shown as steps 12626 and 12628 of FIG. 126.

Chemical Manager: New Chemical Builder

Figure 127:
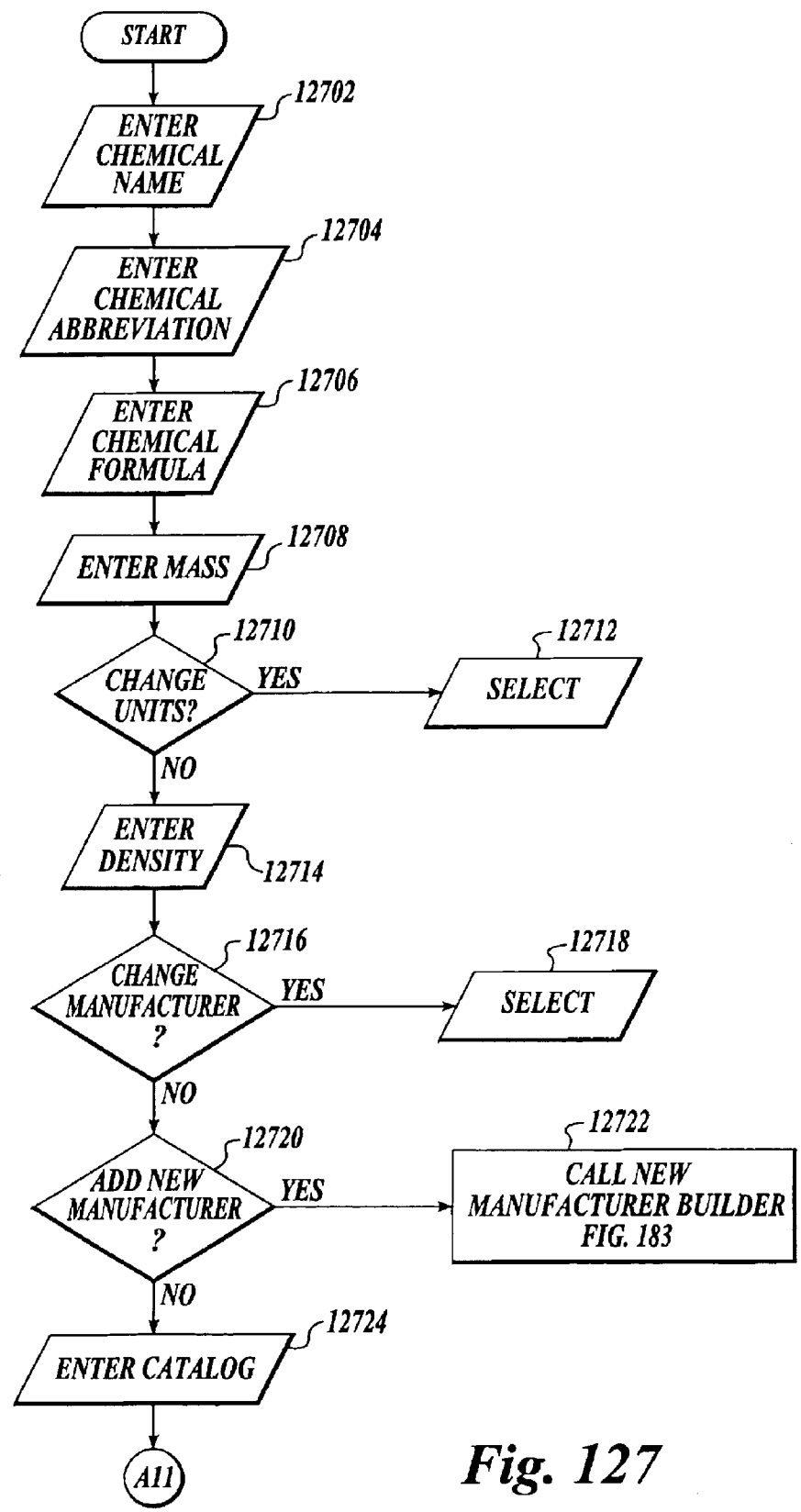
FIGS. 127–128 show a functional flow diagram for a new chemical builder according to the present invention.
Figure 128:
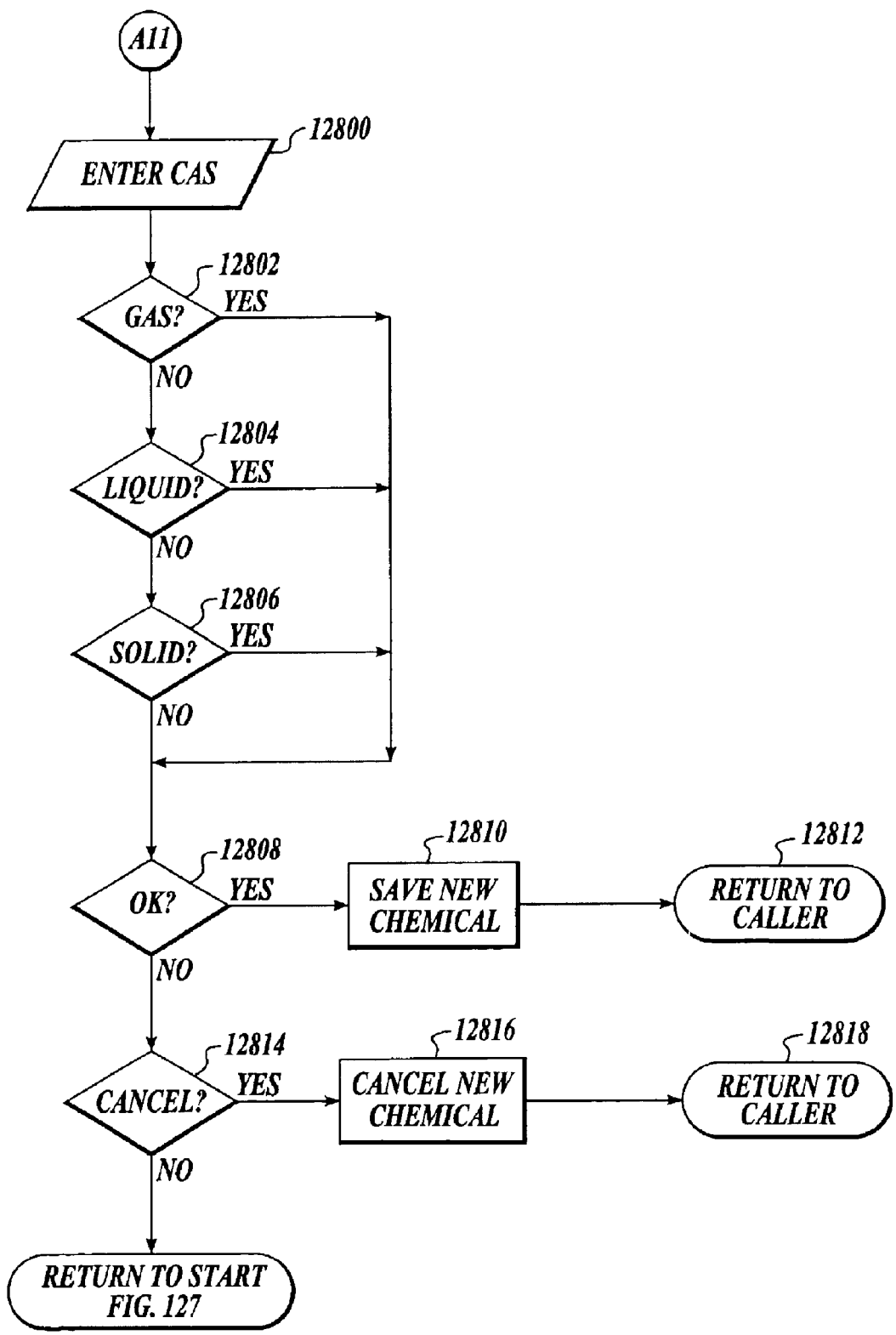

FIG. 125 illustrates a new chemical builder dialog window 12500 formed in accordance with this invention and FIGS. 127 and 128 form a corresponding functional flow diagram of a new chemical builder formed in accordance with this invention.

Referring to FIG. 125, the new chemical builder dialog window 12500 includes a chemical name field box 12501 into which a user enters a chemical name by selecting this field and entering the name using a keyboard or other suitable data entry device. This action is shown as step 12702 of FIG. 127. An abbreviation of the new chemical is entered by a user in the same way in an abbreviation field box 12502. This action is shown as step 12704 in FIG. 127. The chemical formula of the new chemical is entered by a user in the same way in a formula field box 12504. This action is shown as step 12706 of FIG. 127. The chemical mass of the new chemical is entered by a user in the same way in the mass field box 12506. This action is shown as step 12708 in FIG. 127.

The mass units of the new chemical is entered by a user by clicking on a down arrow button 12508 alongside a mass units field box 12510. Clicking on the down arrow button 12508 opens a drop-down list of available units. Clicking on a selection enters the selection into the mass field 12510 and closes the drop-down list. This action is represented by steps 12710 and 12712. While the chemical type can be viewed in a chemical type field 12512, a user cannot change the chemical type from the new chemical builder dialog window 12500. Rather, a user must return to the chemical manager dialog window 12400 (FIG. 124) to make this change. The density in grams per milliliter of the new chemical is entered by a user in the density field box 12514 in the same way a user enters data in other field boxes. This action is shown as step 12714 in FIG. 127. The chemical manufacturer is listed in a chemical manufacturer field box 12516. The current manufacturer can be changed by clicking on a down arrow button 12518 located alongside the manufacturer field box 12516. Clicking on the down arrow button 12518 opens a drop-down list of chemical manufacturers. Clicking on a manufacturer's name enters the manufacturer's name into the manufacturer field box 12516 and closes the drop-down list. This action is represented by steps 12716 and 12718 of FIG. 127. New manufacturers can be added to the chemical manufacturers database by clicking on an ellipsis command button 12520. Clicking on the command button 12520 launches a new manufacturer builder without the user leaving the new chemical builder dialog window 12500 (FIG. 125). This action is shown as steps 12720 and 12722 of FIG. 127. A manufacturer builder formed in accordance with this invention is described below. Chemical catalog numbers are entered into a catalog field box 12522 in the same way other data is entered by a user. This is represented by step 12724 of FIG. 127. Chemical Abstracts Registry (CAS) numbers are entered in a CAS field box 12524 in the same way. This action is shown as step 12800 of FIG. 128. The state of the new chemical is described by clicking on one of three radio buttons 12526 labeled gas, liquid, and solid. Clicking on one choice cancels a previously selected choice. This action is represented by steps 12802, 12804, and 12806 of FIG. 128.

Preferably a database formed in accordance with the present invention uses a combination of the catalog and the CAS numbers of a chemical to uniquely identify the chemical. Preferably a sign is placed alongside the catalog and the CAS field boxes, for example an orange cone or a red stop sign, as a warning to alert users that once a chemical is committed to the database, its catalog and CAS numbers cannot be changed. The chemical category names illustrated in FIG. 124 and listed above are self-explanatory, with the possible exception of CSI, which stands for "cofactors, substrates, inhibitors."

Returning to FIG. 125 clicking on an OK command button 12528 in the new chemical builder dialog window 12500 adds the new chemical to the database and returns a user to the chemical manager dialog window 12400 (FIG. 124). This action is represented by steps 12808, 12810, and 12812 of FIG. 128. Clicking on a cancel command button 12530 cancels the input data whereby the new chemical is not added to chemical to the database. Clicking on the cancel command button also returns a user to the chemical manager dialog window 12401. This action is represented by steps 12814, 12816 and 12818 of FIG. 128.

Chemical Manager: Update Chemical Builder

Figure 129:
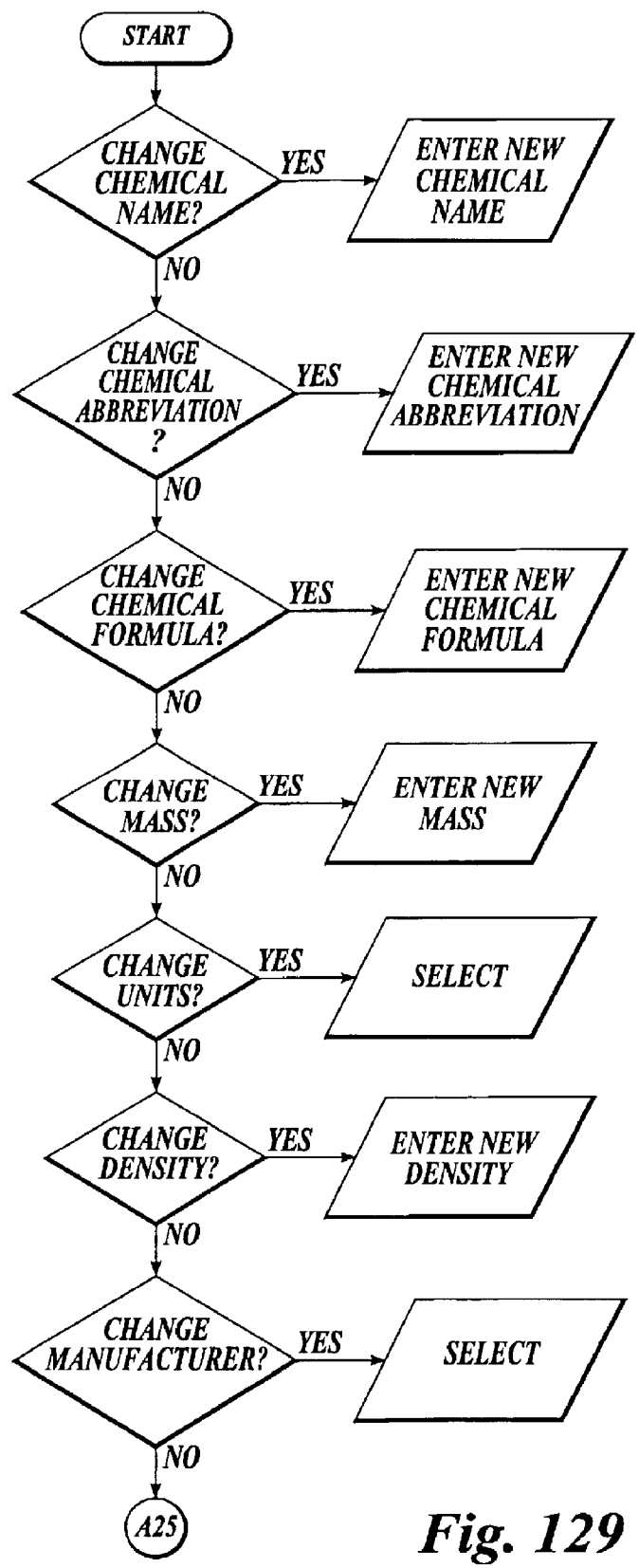
FIGS. 129–130 show an update chemical builder according to the present invention.
Figure 130:
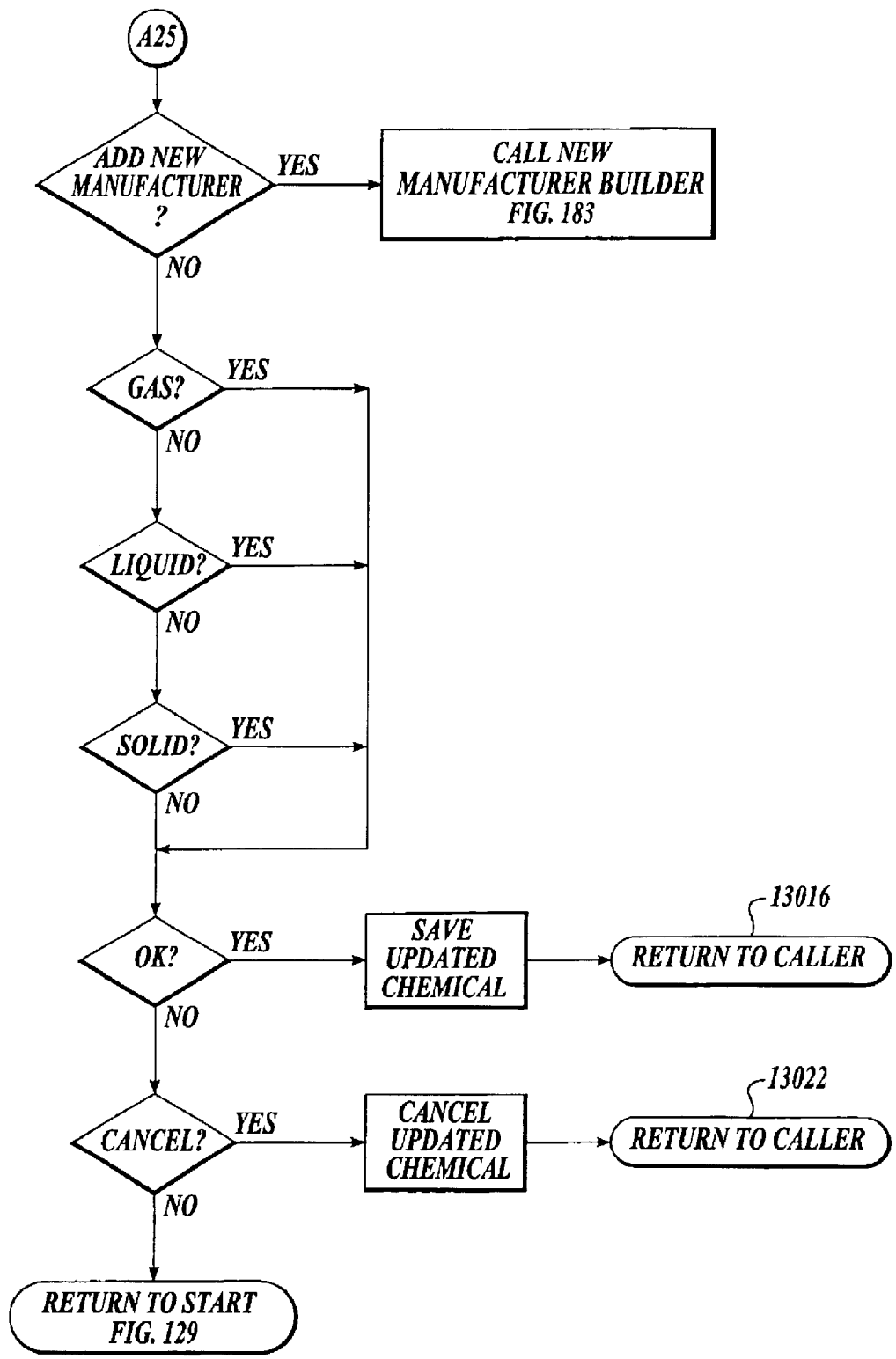

Returning to FIG. 124, chemical properties can be updated by selecting a chemical and clicking on an update command button 12406. Clicking on the update command button 12406 opens a dialog window similar to the dialog window of FIG. 125, except that the title includes the word UPDATE to remind a user that the chemical already exists in the database. The other difference between the update chemical builder and the new chemical builder of FIG. 125 is that the update chemical builder has the field text boxes filled with the previously entered attributes for that chemical. Therefore, the user does not need to enter new values in the field boxes if the value has not changed. Another difference between the update chemical builder and the new chemical builder of FIG. 125 is that the update chemical builder does not allow a user to enter a new catalog or CAS number. A functional flow diagram of a update chemical formed in accordance with this invention is illustrated in FIGS. 129 and 130. Since this functional flow diagram, except for the differences noted above, is virtually identical to the functional flow diagram illustrated in FIGS. 127 and 128, it is not described here.

Apparatus Manager

Preferred embodiments of the present invention also include an apparatus manager for use in creating crystallization apparatuses with crystallization compartments in an M rows by N columns arrangement.

Figure 131:
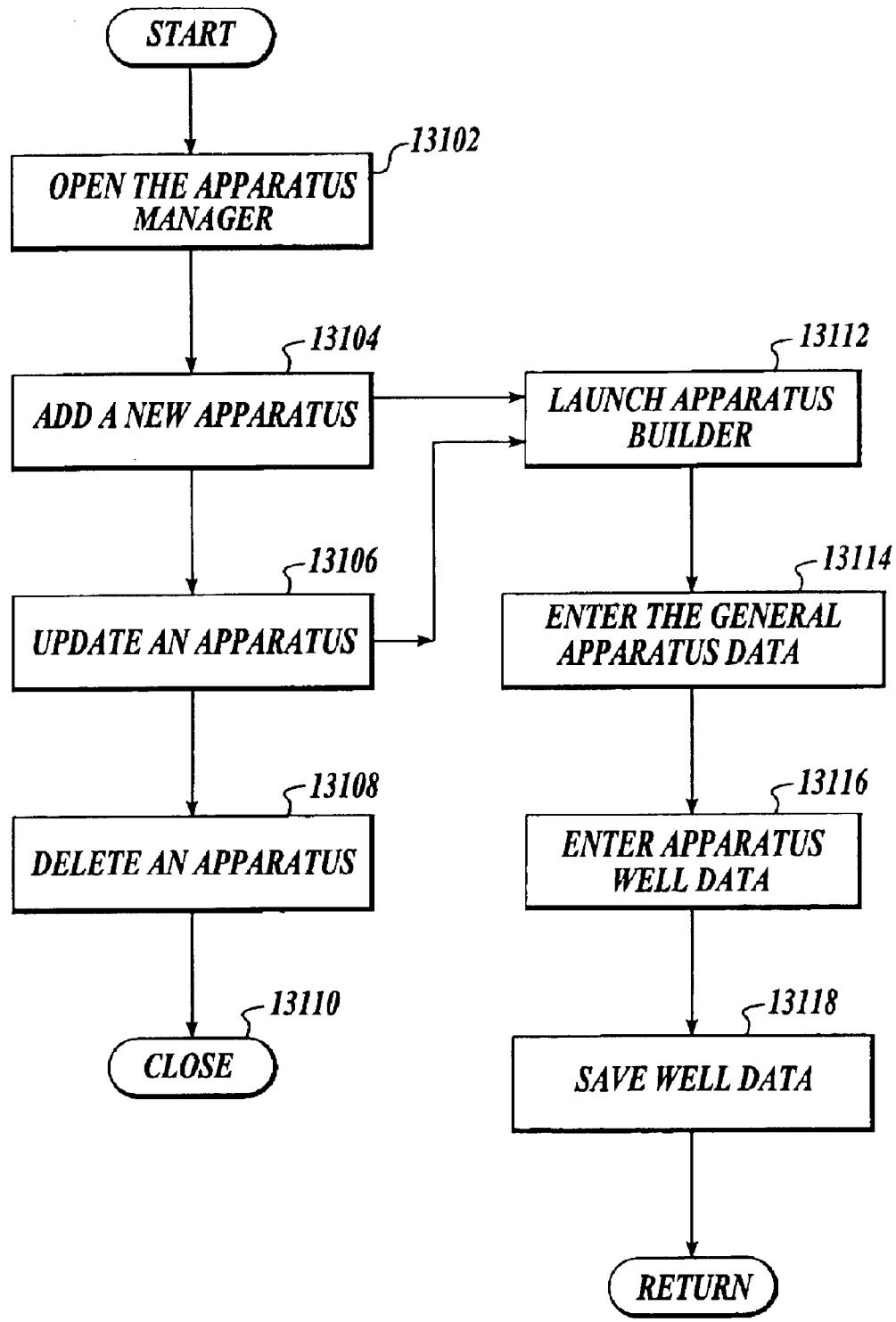
FIG. 131 shows a generic functional flow diagram for an apparatus manager according to the present invention.

FIG. 131 is a functional flow diagram that generically illustrates an apparatus manager formed in accordance with the present invention. When the apparatus manager is opened, a list of all the apparatuses in the database are displayed (step 13102). A new apparatus can be added to the database (step 13106), or the properties of an apparatus can be updated (step 13106). An apparatus can be deleted from the database (step 13110). Adding or updating an apparatus opens or launches apparatus builders (step 13112). The apparatus builder allows a user to enter general apparatus data (step 13114) and/or well data (step 13116). If desired, the well data can be added to the database (step 13118).

Figure 132:
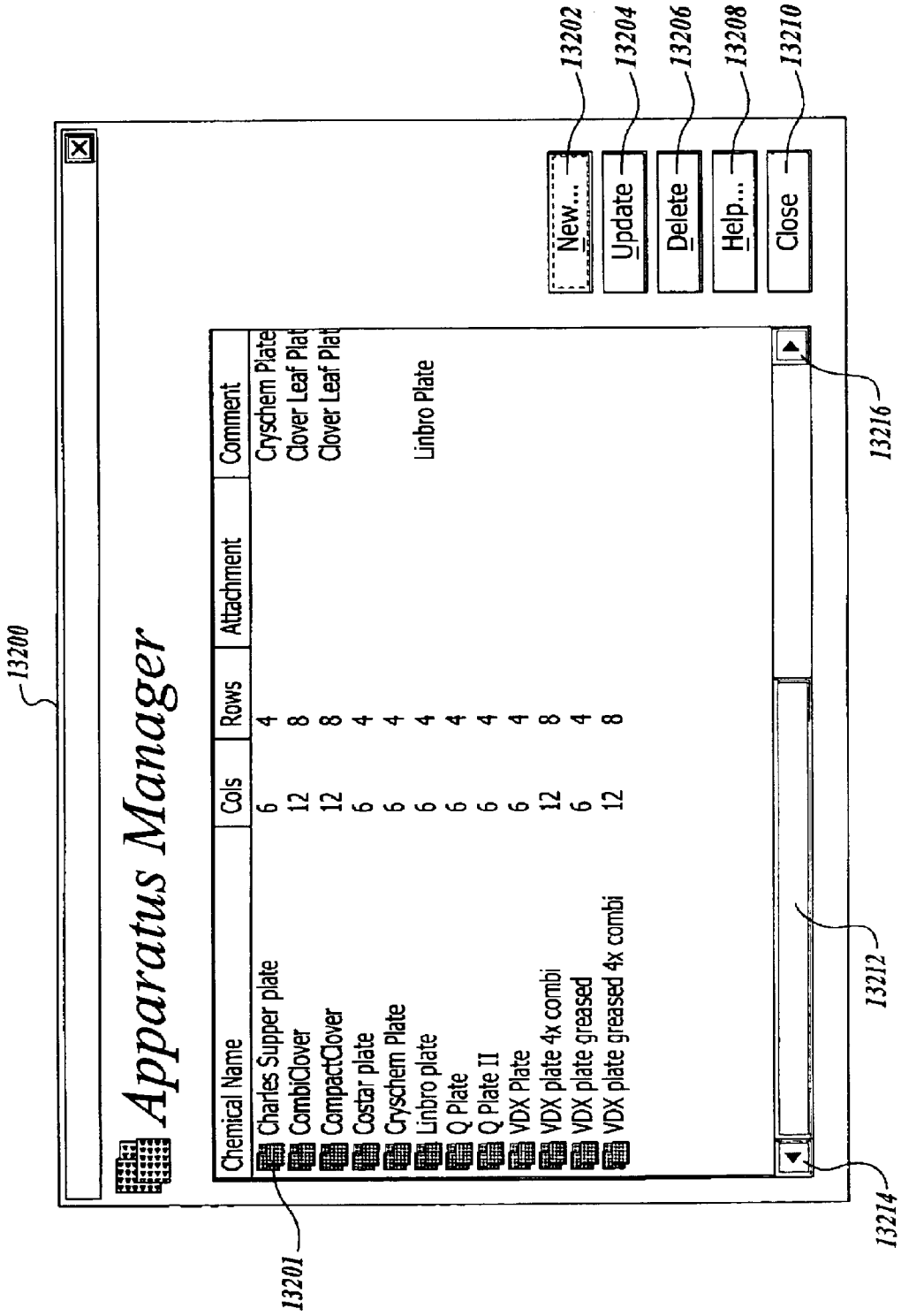
FIG. 132 shows a GUI for an apparatus manager according to the present invention.
Figure 133:
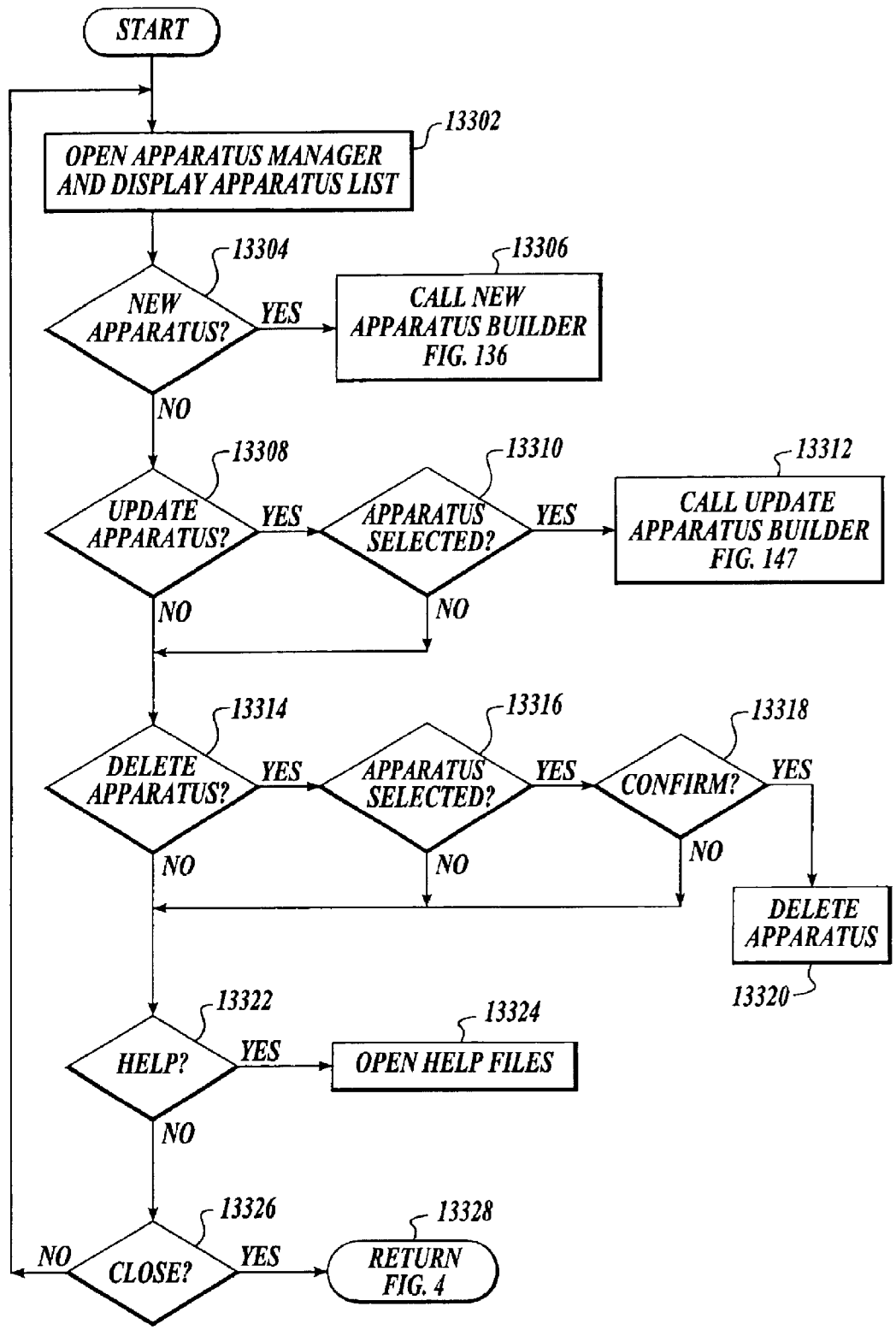
FIG. 133 shows a functional flow diagram for an apparatus manager according to the present invention.

FIG. 132 illustrates an apparatus manager dialog window 13200 formed according to the present invention and FIG. 133 is a corresponding functional flow diagram of an apparatus manager formed in accordance with this invention.

The apparatus manager dialog window 13200 includes an apparatus list box 13201 that lists all of the apparatuses in a database. The list box 13201 includes apparatus properties. The list box includes a horizontal scroll bar 13212. Located on the ends of the scroll bar 13212 are a left arrow button 13214 and a right arrow button 13216. In a conventional manner, clicking on either the left arrow or the right arrow buttons scrolls the apparatus list in a horizontal direction. The apparatus list can also be scrolled by dragging the horizontal scroll bar 13212. The apparatus manager dialog window 13200 also includes a new command button 13202, an update command button 13204, a delete command button 13206, a help command button 13208, and a close command button 13210.

When the apparatus manager is launched, the attributes of all of the apparatuses in the database are displayed. This action is represented by step 13302 of FIG. 133. Clicking on the new command button 13202 opens or launches the new apparatus builder. This is represented by steps 13304 and 13306 in FIG. 133. An example of a new apparatus builder formed in accordance with this invention is described below.

Clicking on the update command button 13204 launches an update apparatus builder provided an apparatus has been previously selected by clicking on the apparatus in the apparatus list box 13201. An example of an update apparatus builder formed in accordance with this invention is described below. This action is shown as steps 13308, 13310, and 13312 of FIG. 133. Clicking on the delete command button 13206, if an apparatus was previously selected, opens a confirm question window. If the user confirms deletion, the selected apparatus is deleted from the database. This action is represented by steps 13314, 13316, 13318, and 13320 of FIG. 133. Clicking on the help command button 13208 opens the help files, as shown by steps 13322 and 13324 of FIG. 133. Clicking on the close command button closes the apparatus manager dialog window and returns the user to the main manager dialog window shown in FIG. 2. This action is represented by steps 13326 and 13328.

Apparatus Manager: New Apparatus Builder

Figure 134:
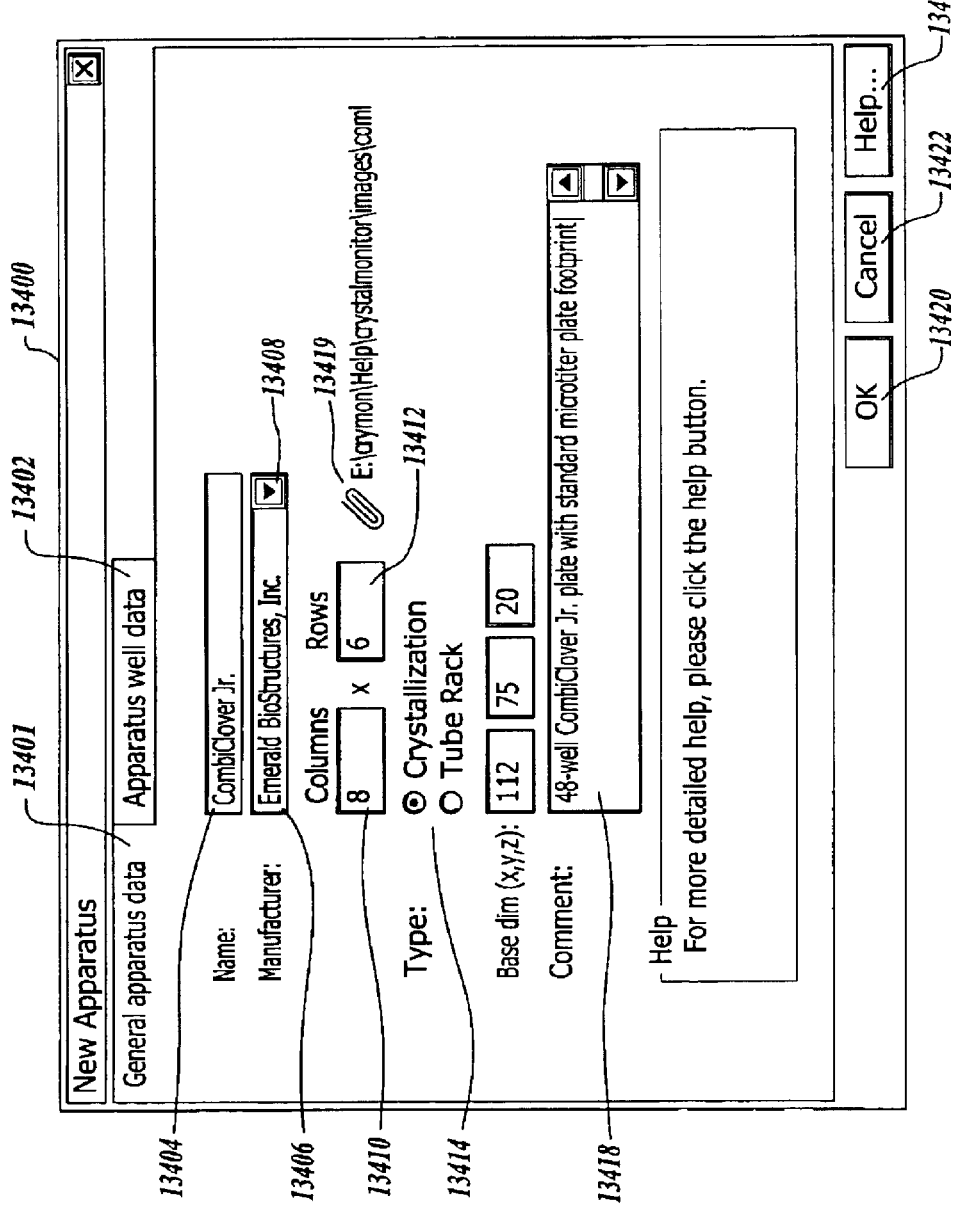
FIG. 134 shows a GUI for a general apparatus data tab according to the present invention.
Figure 135:
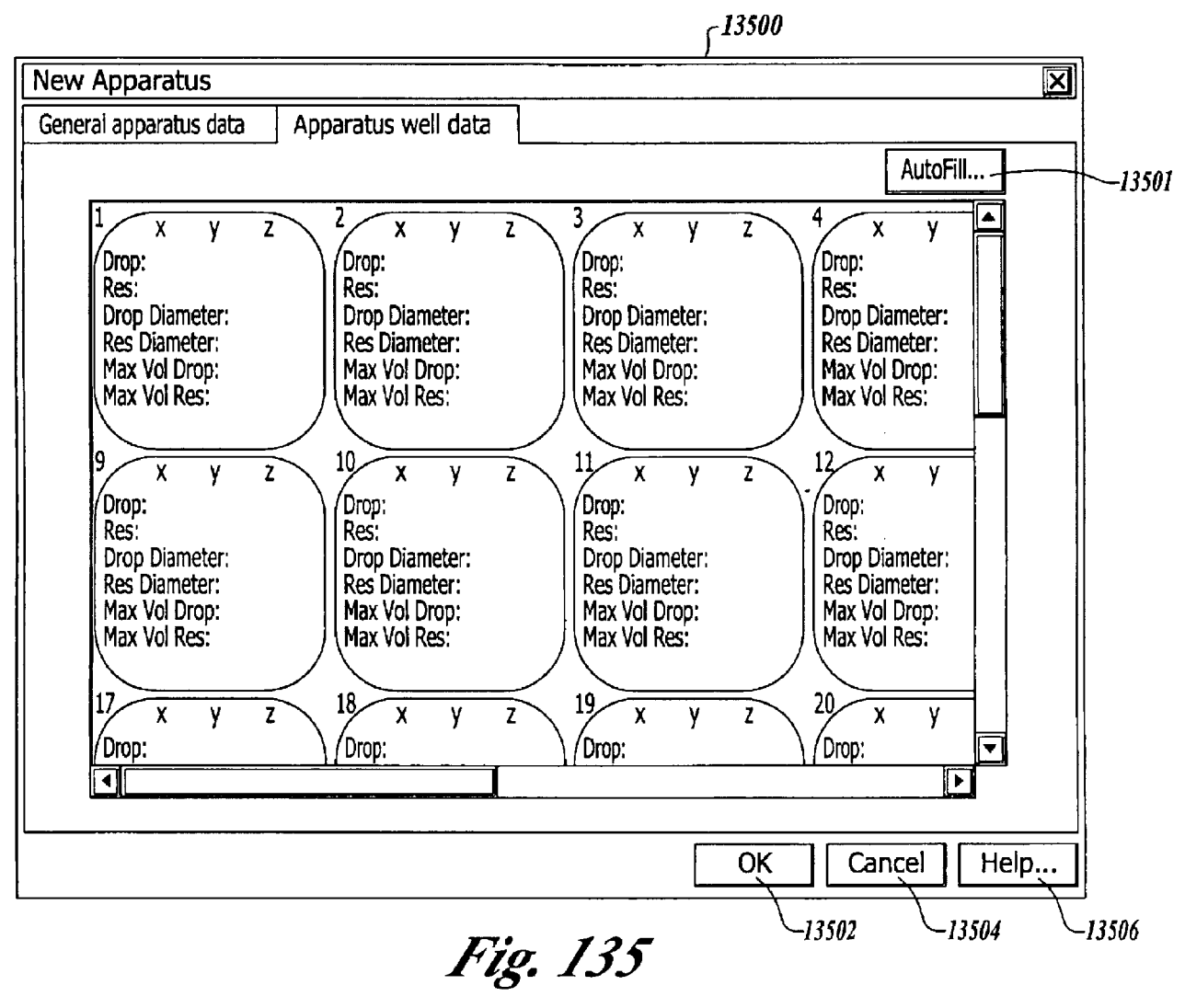
Figure 136:
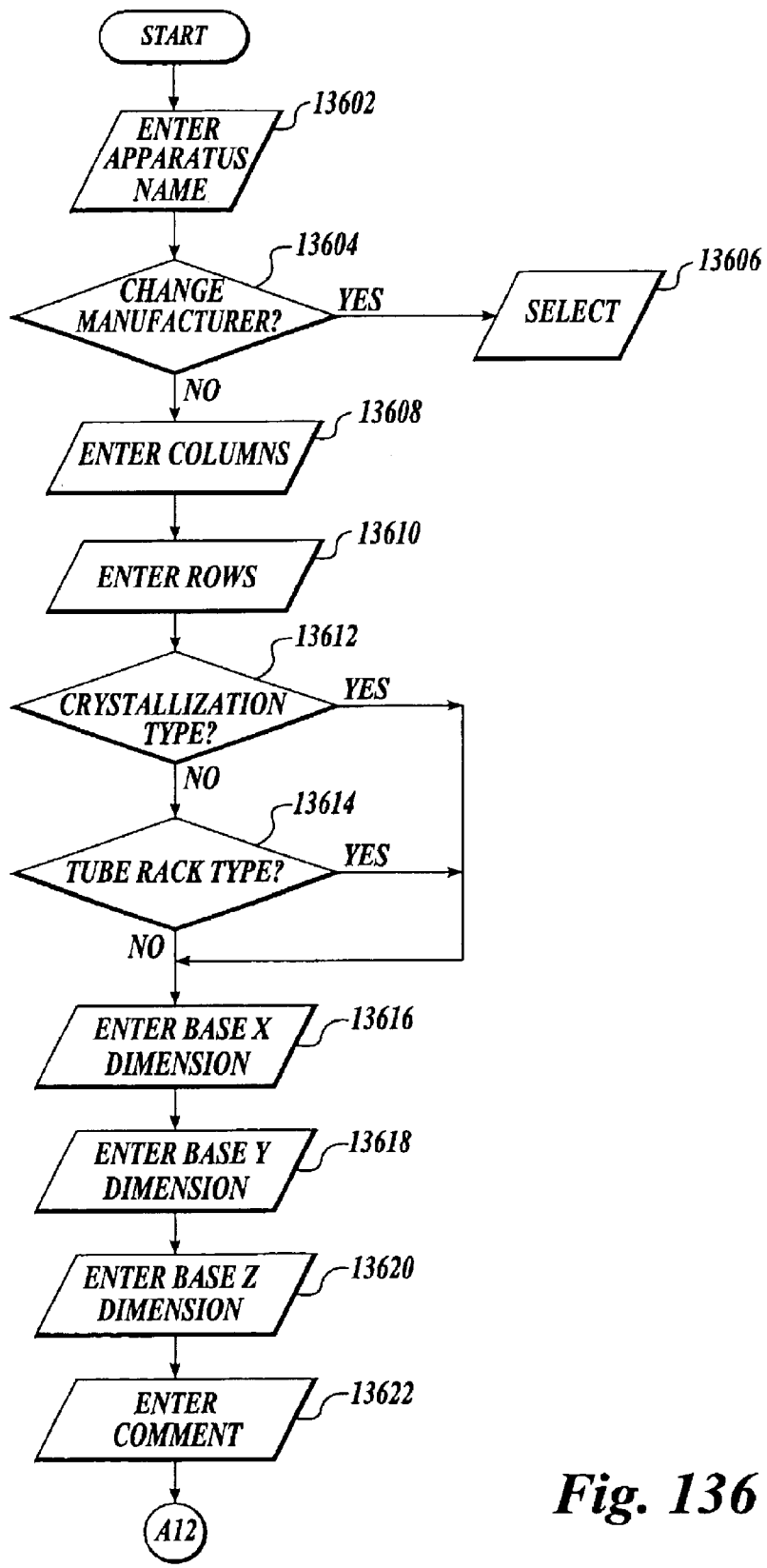
FIGS. 136–137 show a functional flow diagram for a new apparatus builder according to the present invention.
Figure 137:
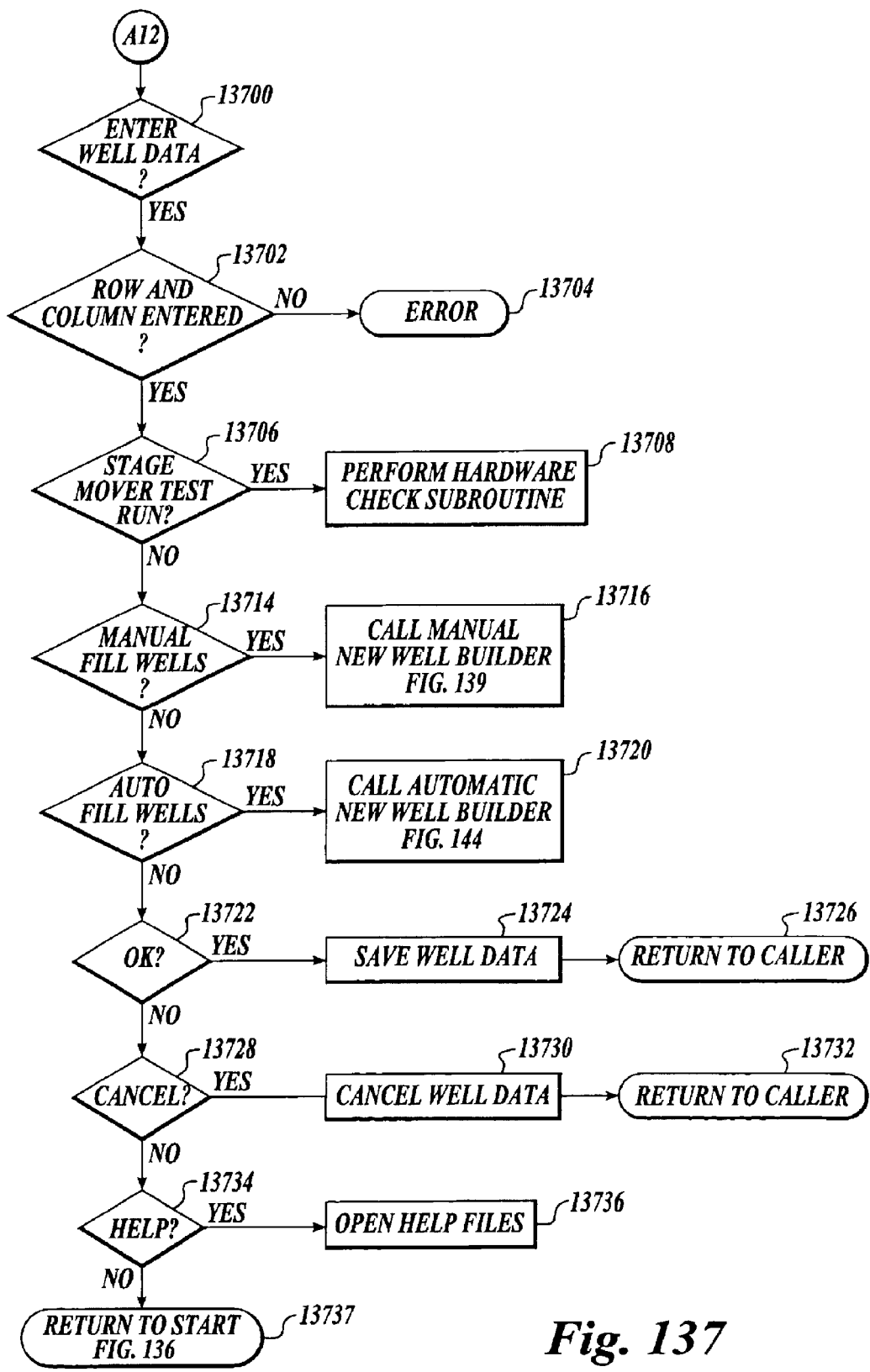

FIGS. 134 and 135 illustrate new apparatus builder dialog windows 13400 and 13500 formed according to the present invention and FIGS. 136 and 137 form a corresponding functional flow diagram of a new apparatus builder formed in accordance with this invention. The new apparatus builder dialog window 13400 includes two tabs—a general apparatus data tab 13401 and an apparatus well data tab 13402. In order for the apparatus well data tab to be enabled, a valid row and column must be specified in the general apparatus data tab.

The FIG. 134 new apparatus builder dialog window 13400 depicts what is shown when the general apparatus data tab is enabled. The new apparatus builder dialog window 13400 shown in FIG. 134 includes a name field box 13404 for receiving an apparatus name, which is entered by a user selecting the field box and entering a name using a keyboard or other suitable data entry device. This action is shown as step 13602 in FIG. 136. The name of the manufacturer is inserted into a manufacturer field box 13406 by clicking on the down arrow button 13408 located alongside the manufacturer field 13406. Clicking on the down arrow button 13408 opens a drop-down list of manufacturers. Clicking on a specified manufacturer enters the manufacturer's name into the manufacturer field box 13406 and closes the drop-down list. This action is shown as steps 13604 and 13606 of FIG. 136. The number of columns in the apparatus is entered into an apparatus columns field box 13410 in the same way other data is entered. This action is represented by step 13608 of FIG. 136. The number of rows in the apparatus is entered into a rows field box 13412 in the same way. This action is represented by step 13610 of FIG. 136.

Apparatus type is entered by clicking on one of two radio buttons 13414 labeled crystallization and a tube rack, respectively. A choice is made by clicking on one of the radio buttons. Clicking on one radio button cancels the selection of the other radio button. This action is shown by steps 13612 and 13614 of FIG. 136.

X, Y, and Z axes base dimensions are entered in X, Y, and Z field text boxes 13416 in the same way other data is entered. This action is represented by steps 13616, 13618, and 13620 of FIG. 136. If desired, a comment can be entered in the comment field box 13418. This action is shown as step 13622. Preferably embodiments of this invention employ a database preloaded with the major commercially available crystallization plates. If desired, a file can be attached to an apparatus by dragging the file from a file manager, such as Microsoft Windows Explorer, and dropping the file on paper clip icon 13419.

Before continuing data can be entered into the new apparatus builder dialog window 13500 associated with apparatus well data tab, valid apparatus geometry must be specified in both the column field and the row field boxes 13410. The apparatus geometry is used to construct an apparatus well data template by creating rows and columns equal in number to those specified in the column and rows field boxes. This test is represented by steps 13700, 13702, and 13704 of FIG. 137. If a valid row/column geometry data has not been entered, an error message appears.

Referring now to FIG. 135, which shows the new apparatus builder dialog window 13500 associated with the apparatus well data tab. Clicking on a stage mover test run button (not shown) allows the stage mover apparatus to be tested. This action is shown as steps 13706 and 13708 of FIG. 137.

For integration with crystallization robots, the preferred embodiments of the present invention are designed to accept a very detailed description of the physical dimensions of a plate and its chambers. The new apparatus builder dialog window 13500 associated with the apparatus well data tab shows each of the crystallization drop chambers in the plate.

The physical dimensions of the plate chambers can be described in two ways. One method is to enter the dimensions chamber-by-chamber. This is accomplished by double clicking on a chamber to open or launch a manual new well builder via which the absolute positions of each drop chamber and its crystallant reservoir chamber are entered, preferably in millimeters. An example of a manual new well builder formed in accordance with this invention is described below. This method is represented by steps 13714 and 13716 in FIG. 137. When using this method, the origin of the coordinate system is assumed to be the upper left corner of the plate when viewed from the top. The x positions give the left to right positions when viewing the plate from the top. The y positions give the top to bottom positions when viewing the plate from the top. The z position of the chamber is the position relative to the top deck of the plate, as given in the general apparatus data tab.

Instead of entering the chamber positions one at a time for each chamber, an autofill command button 13501 can be clicked on. Clicking on the autofill command button 13501 launches an automatic new well builder. An example of an automatic new well builder formed in accordance with this invention is described below. This action is represented by steps 13718 and 13720 of FIG. 137. In general, clicking on the auto field command button 13500 allows a user to enter the appropriate values for the plate's drop and crystallant reservoir chambers. The autofill feature assumes that the spacing between chambers within a row, and between chambers with any column are constant. The row spacing and the column spacing, however, do not have to be the same. After the chamber spacings and dimensions have been entered, the new apparatus builder dialog window 13500 associated with the apparatus well data tab will show the coordinate positions and dimensions of all the chambers in the plate.

Clicking on an OK command button 13502, after all of the coordinate positions and dimensions of all the chambers have been entered, saves the well data in the database and returns a user to the apparatus manager dialog window 13200 (FIG. 132). This action is shown as steps 13722, 13724, and 13726 of FIG. 137. Clicking on a cancel command button 13504 cancels the well data and, then, returns the user to the apparatus manager dialog window 13200. This action is shown as steps 13728, 13730, and 13732 of FIG. 137. Clicking on a help command button 13506 opens the help files. This action is represented by steps 13734 and 13736 of FIG. 137. The new apparatus builder dialog window 13400 associated with general apparatus data tab includes okay 13420, cancel 13422 and help 13424 command buttons that function in a similar manner.

Figure 138:
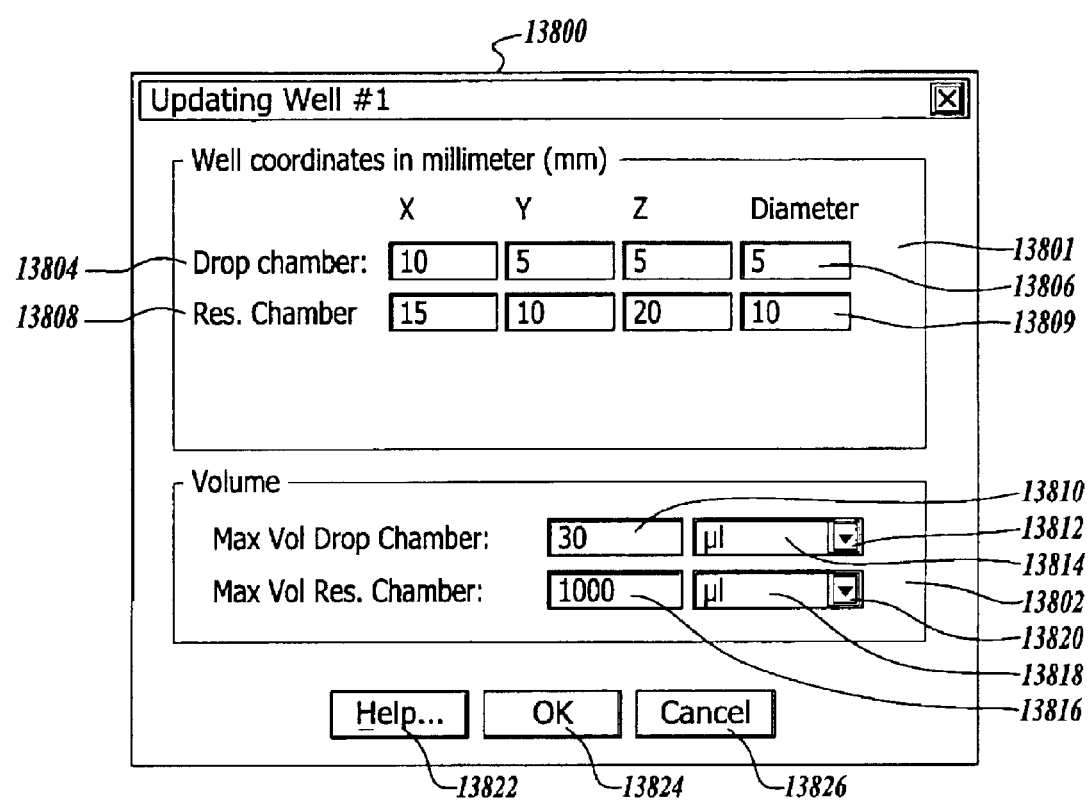
FIG. 138 shows a GUI for a manual update well builder according to the present invention.
Figure 139:
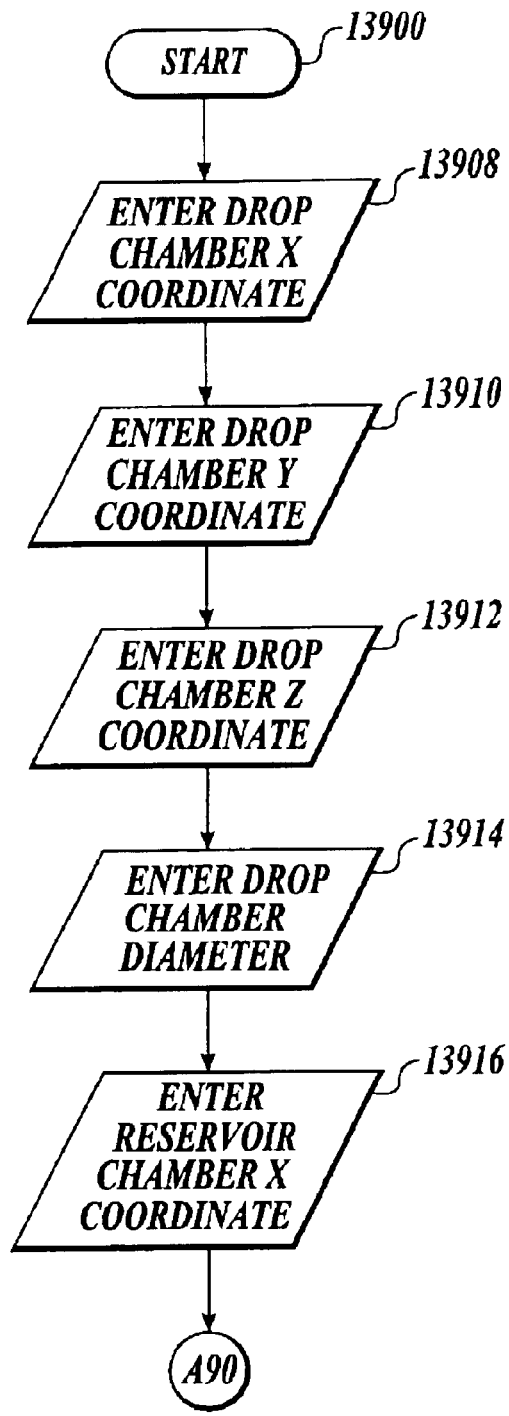
FIGS. 139–141 show a functional flow diagram for a new manual well data builder according to the present invention.
Figure 140:
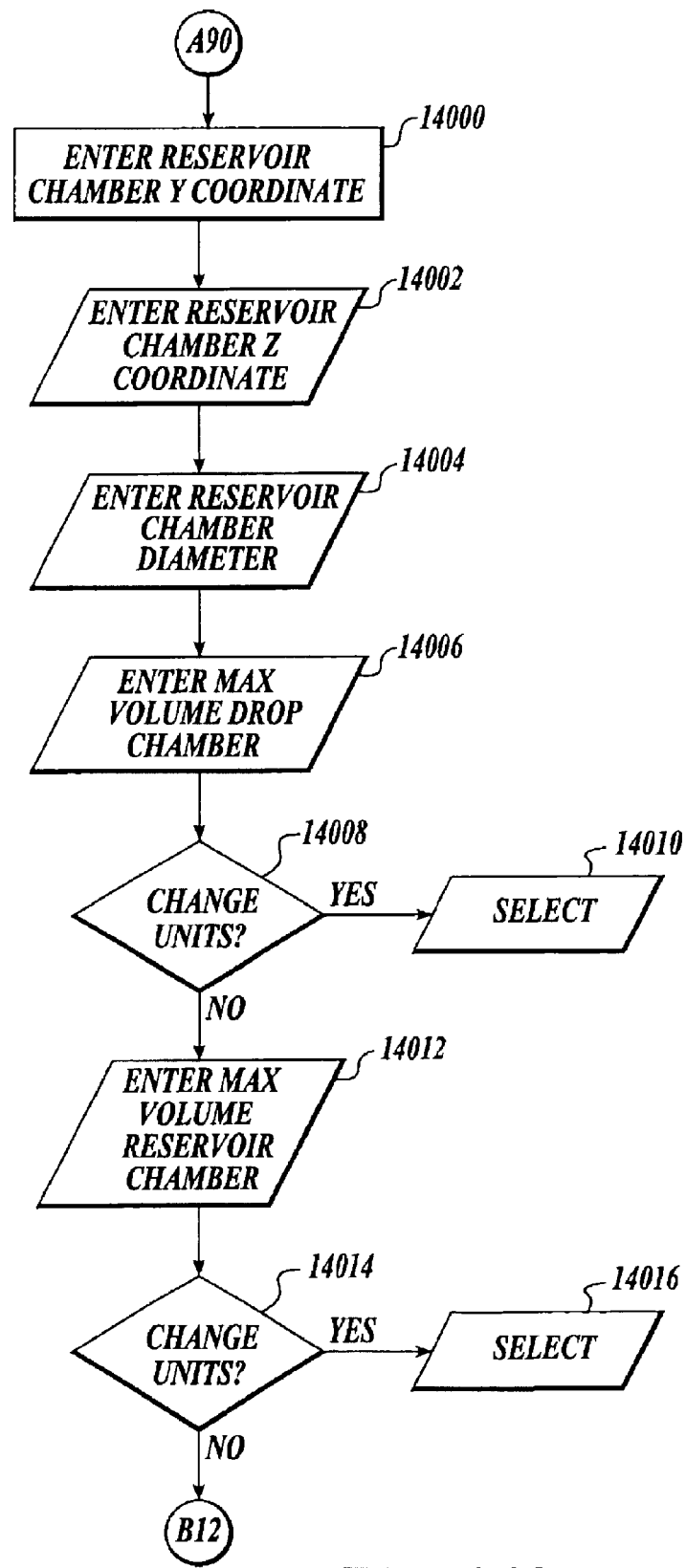
Figure 141:
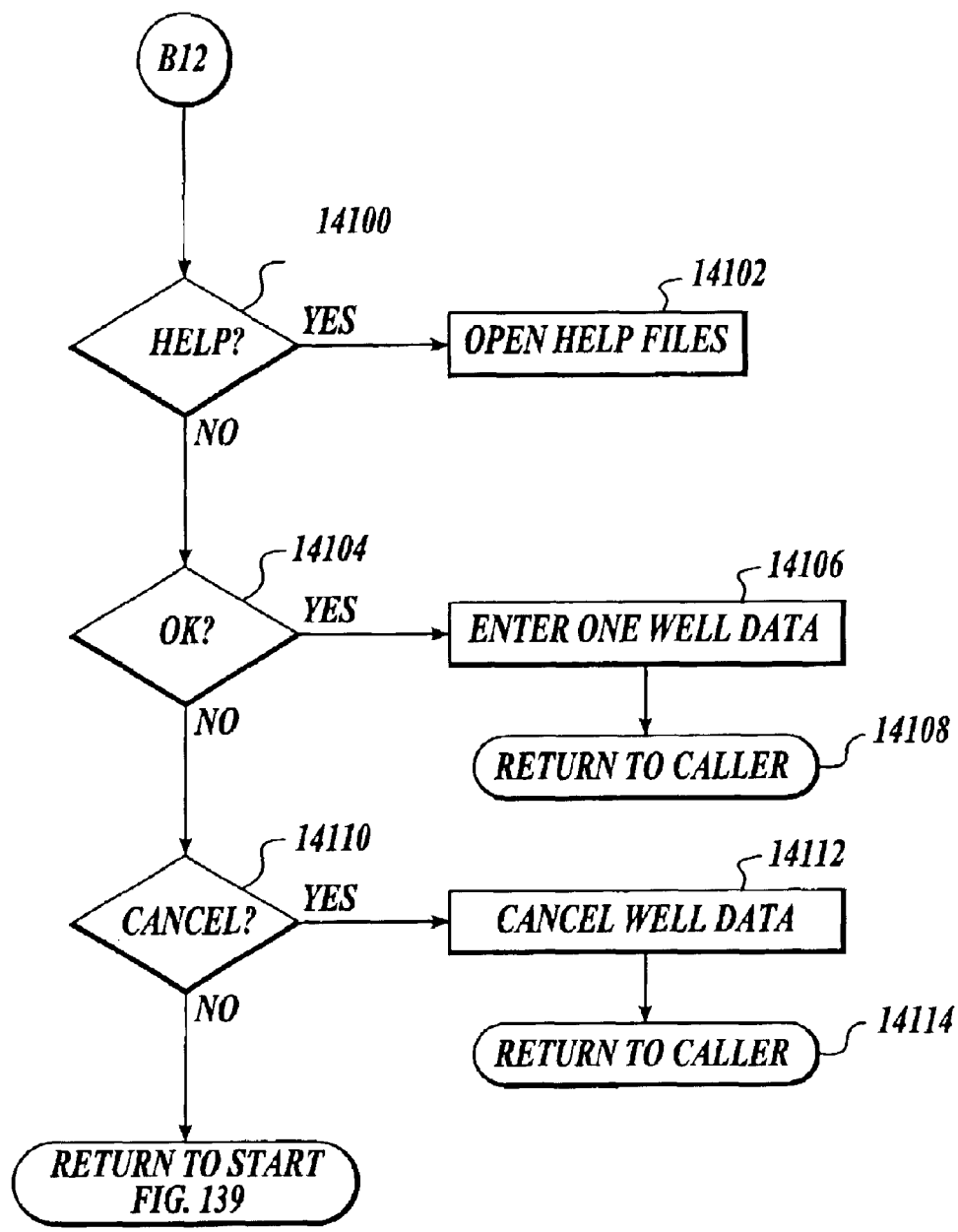

FIG. 138 illustrates a manual well builder dialog window 13801 formed in accordance with the invention, and FIGS. 139, 140, and 141 from a corresponding functional flow diagram.

The manual well builder dialog window 13800 includes a well coordinates box 13801 and a volume box 13802. The absolute positions of each drop chamber and the crystallant reservoir chamber are entered in the fields, preferably in millimeters. The origin of the coordinates system is assumed to be the upper left corner of the plate when viewed from the top. The X positions gives the left to right positions when viewing the plate from the top. The Y positions gives the top to bottom positions when viewing the plate from the top. The Z position of the chamber is the position relative to the top deck of the plate, as described above (FIG. 134).

The drop chamber X, Y and Z coordinates are entered into three field boxes 13804 labeled X, Y and Z, respectively. An associated drop chamber diameter value is entered into an associated drop chamber field box 13806. Entry is accomplished in the manner described above, i.e., selecting the field box and entering a value using a keyboard or other suitable data entry device. This action is shown by steps 13908, 13910, 13912, and 13914 of FIG. 139. The reservoir chamber X, Y and Z coordinates are similarly entered into respective field boxes 13808, along with a reservoir chamber diameter value in an associated reservoir chamber diameter field box 13809. This action is represented by step 13916 of FIG. 139 and steps 14000, 14002, and 14004 of FIG. 140.

The drop chamber maximum volume is entered into a maximum volume drop chamber field box 13810. This action is shown as step 14006 of FIG. 140. Volume units are changed by clicking on a down arrow button 13812 located alongside of a units field box 13814. Clicking on the down arrow button 13812 opens a drop down list of available volume units. Clicking on a selection enters the selection in the units field of box 13814 and closes the drop down list. This action is shown as steps 14008 and 14010 of FIG. 140.

The reservoir chamber maximum volume is entered into a maximum volume reservoir chamber field box 13816. This action is represented by step 14012 of FIG. 140. The volume units are changed by clicking on a down arrow button 13820 located alongside of a units field box 13818. Clicking on the down arrow 13820 opens a drop down list of available volume units. Clicking on a selection enters the selection in the units field box 13818 and closes the drop down list. This action is shown by steps 14014 and 14016 of FIG. 140. The manual well builder dialog window 13800 also includes a help command button 13822. Clicking on the help command button 13822 opens the help files. This action is shown as steps 14100 and 14102 of FIG. 141. The manual well builder dialog window also includes an okay command button 13824. Clicking on the okay command button 13824 enters the well data for one chamber, and returns the user to the dialog window shown in FIG. 135 and described above. This action is shown as steps 14104, 14106 and 14108 of FIG. 141. Clicking on a cancel command button 13826 cancels the well data and returns the user to the dialog window shown in FIG. 135. This action is represented by steps 14110, 14112, and 14114 of FIG. 141.

Figure 142:
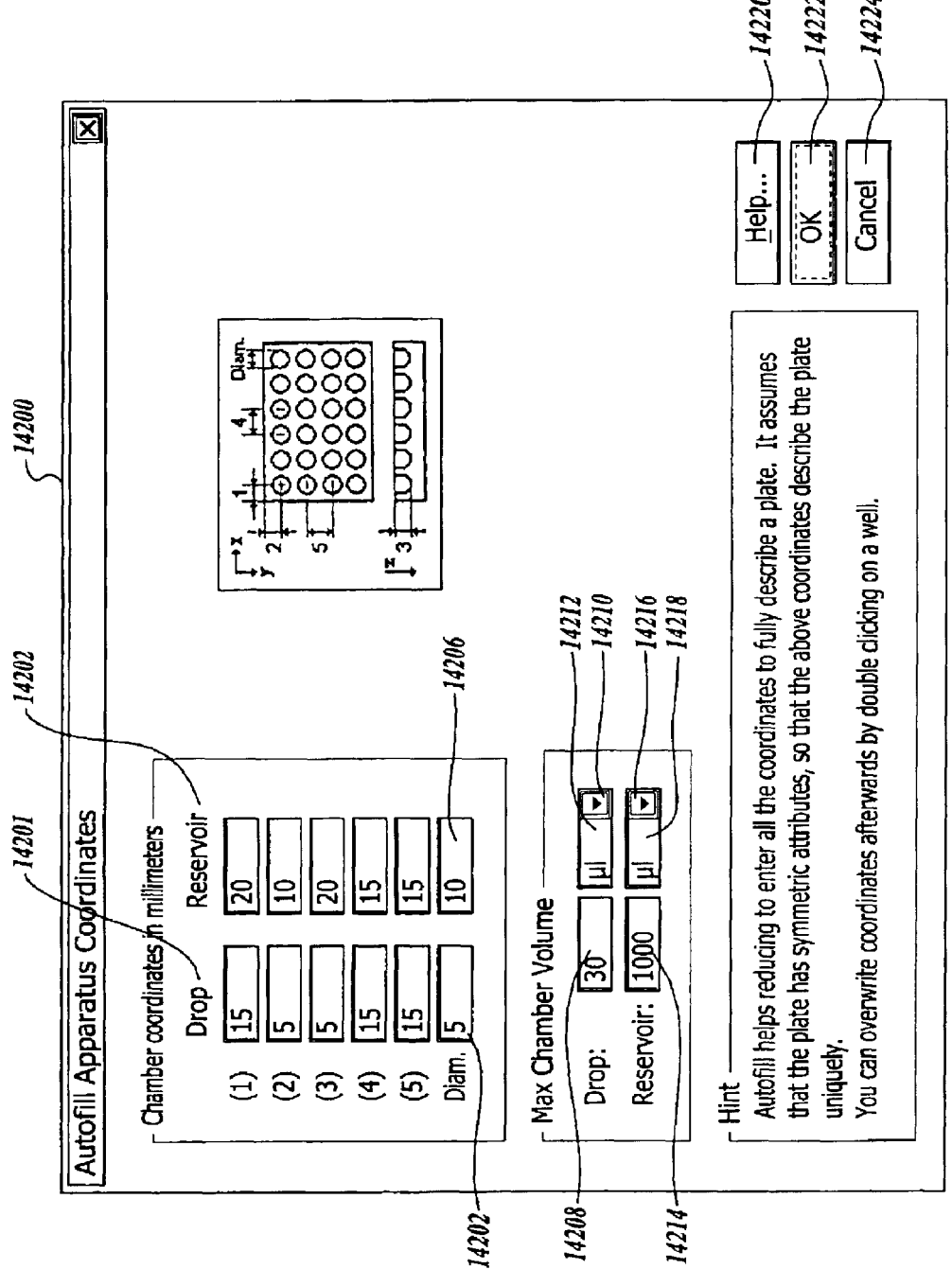
FIG. 142 shows a GUI for an automatic well builder according to the present invention.
Figure 144:
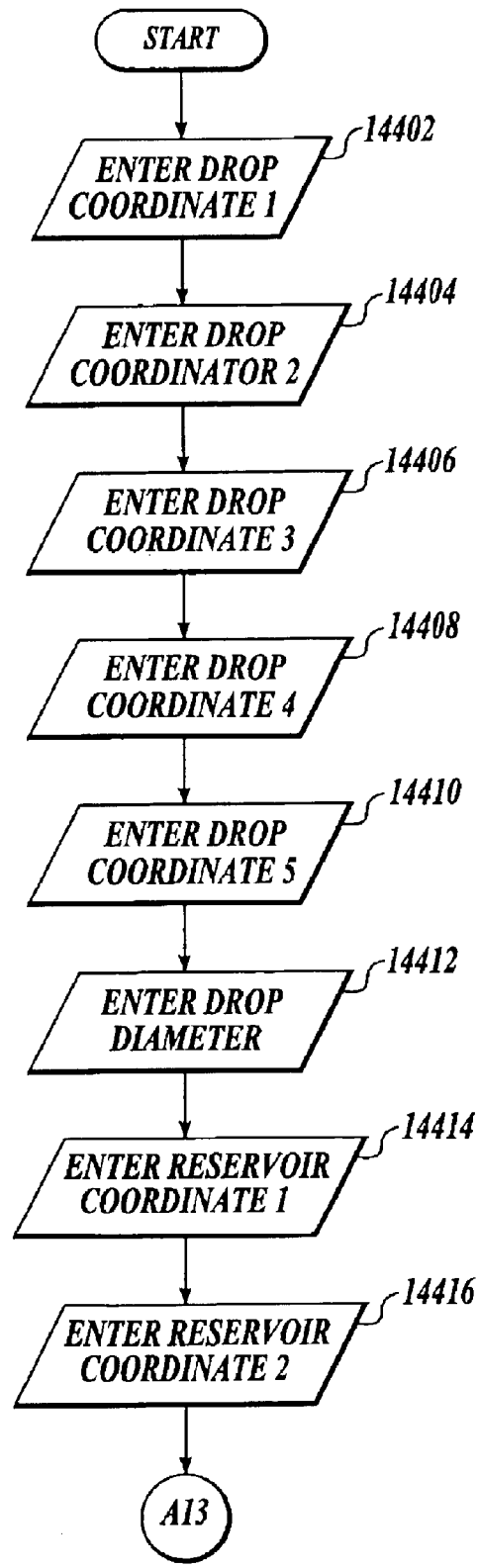
FIGS. 144–146 show a functional flow diagram for an automatic new well builder according to the present invention.
Figure 145:
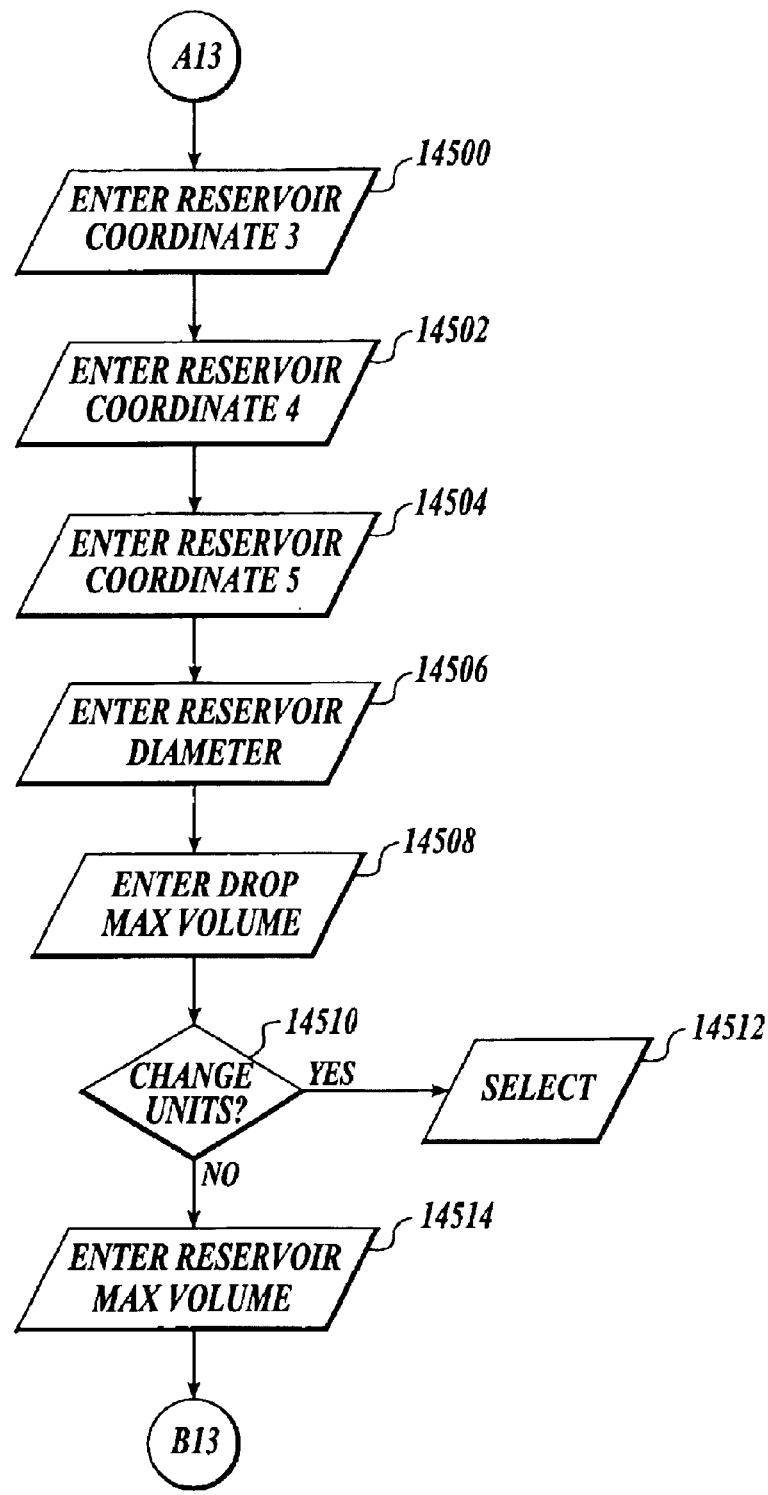
Figure 146:
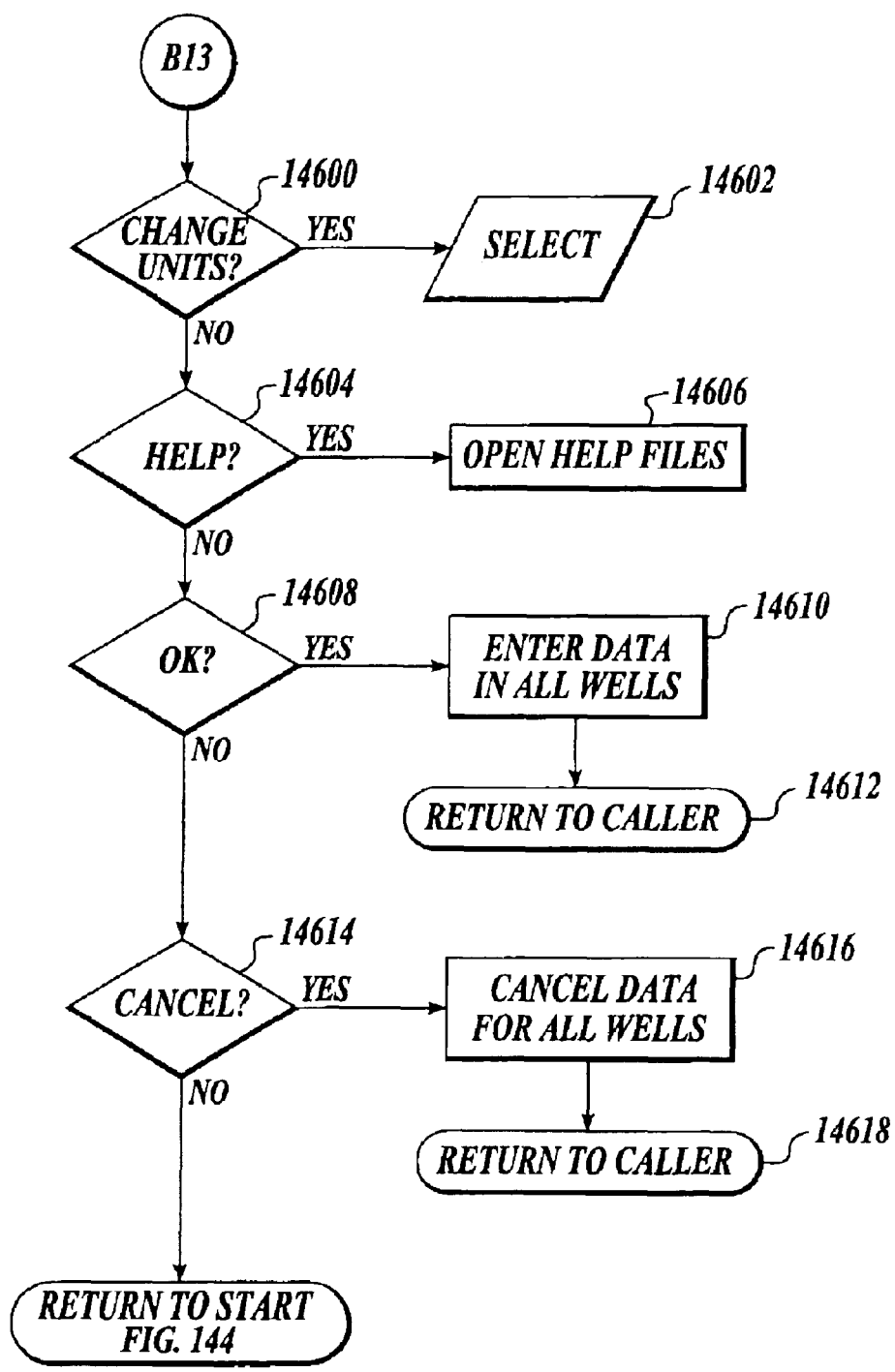

FIG. 142 illustrates an automatic well builder dialog window 14200 formed in accordance with this invention and FIGS. 144, 145 and 146 form a corresponding functional flow diagram.

Referring now to FIG. 142, drop coordinates 1–5 are entered into five related field boxes 14201. The coordinates are pictorially described in a diagram on one side, i.e., the right side, of the automatic well builder dialog window 14200. Entering the drop coordinates are represented by steps 14402–14410 of FIG. 144. The drop diameter is entered into a drop diameter field box 14202. This action is shown as step 14412 of FIG. 144. Reservoir coordinates 1–5 are entered into five related field boxes 14204. This action is represented by steps 14414 and 14416 of FIG. 144 and steps 14500–14504 of FIG. 145. The reservoir diameter is entered into a reservoir diameter field box 14206. This action is shown as step 14506 of FIG. 145.

The maximum chamber drop volume is entered into a drop field box 14208. This action is shown as step 14508 of FIG. 145. Volume units are changed by clicking on a down arrow button 14210 located adjacent to a units field box 14212. Clicking on the down arrow button 14210 opens a drop down list of available volume units. Clicking on a selection enters the selection in the units field box 14212 and closes the drop down list. This action is shown as steps 14510 and 14512 in FIG. 145. The maximum chamber reservoir volume is entered into a reservoir field box 14214. This action is shown as step 14514 in FIG. 145. Volume units are changed by clicking on a down arrow 14216 located alongside a volume units field box 14218. Clicking on the down arrow button 14216 opens a drop down list of available volume units. Clicking on a selection enters the selection in the units field 14218 and closes the list. This action is shown as steps 14600 and 14602 in FIG. 146.

Figure 143:
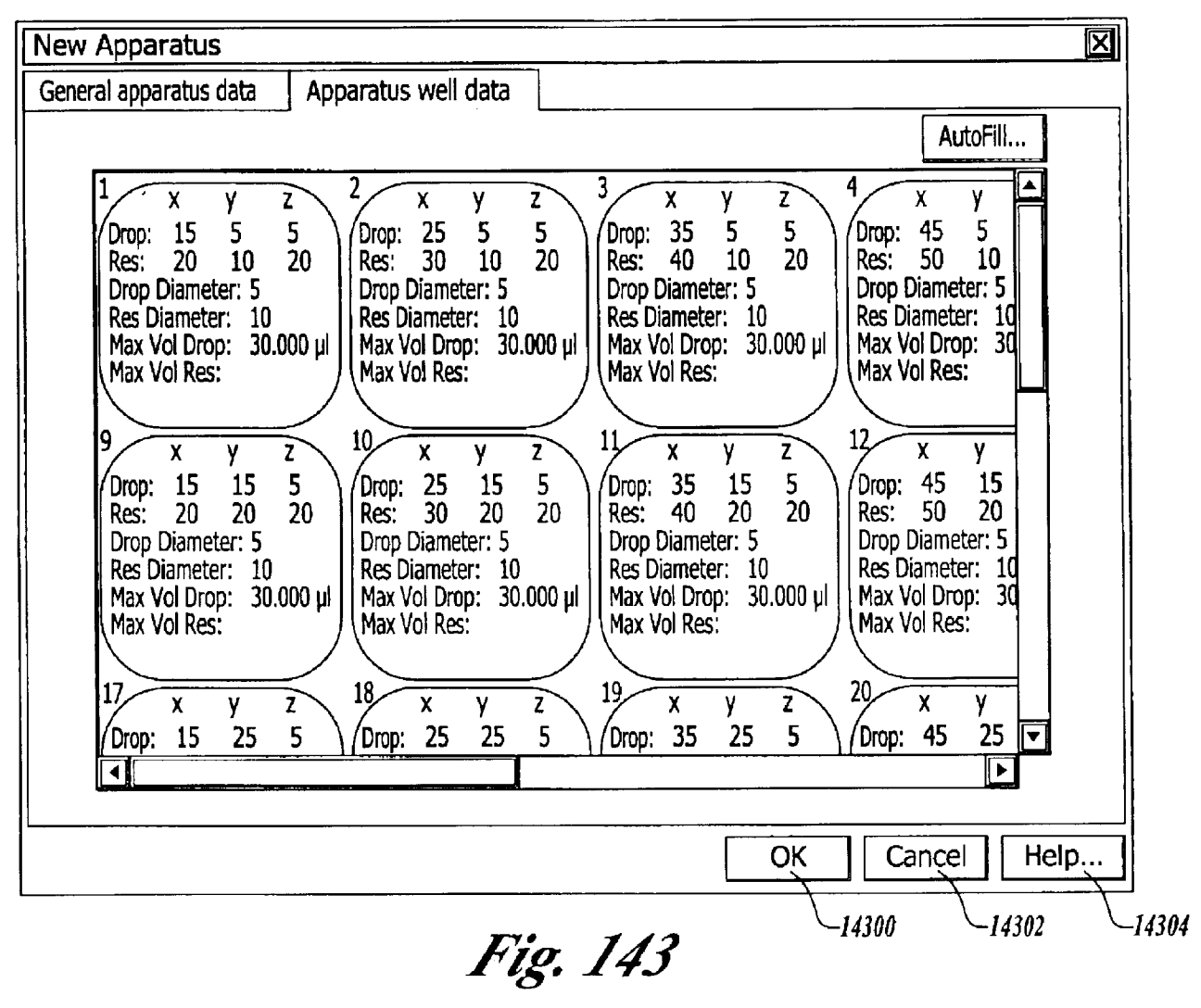

The automatic well builder dialog window 14200 also includes a help command button 14220. Clicking on the help command button 14220 opens the help files. This action is represented by steps 14604 and 14606 of FIG. 146. The automatic well builder dialog window also includes an okay command button 14222. Clicking on the okay command button 14222 enters the data for all the chambers in the apparatus and returns the user to the dialog window shown in FIG. 135 and described above. By way of example, FIG. 143 shows an apparatus well data tab having all the well data filled. In any event, this action is shown as steps 14608, 14610, and 14612 in FIG. 146. The automatic well builder dialog window also includes a cancel command button 14224. Clicking on the cancel command button 14224 cancels the autofill apparatus coordinates for all the wells and returns the user to the dialog window shown in FIG. 135.

Upon returning to the new apparatus builder dialog window 13500 associated with the apparatus well data tab, a user can either click on the okay command button 13502 to save the well data, or cancel the well data by clicking on the cancel command button 13504. A user also can click on the help command button 13506 to open the help files. As previously described, clicking on the okay or cancel command buttons returns the user to the apparatus manager dialog window 13200 (FIG. 132).

Apparatus Manager: Update Apparatus Builder

Figure 147:
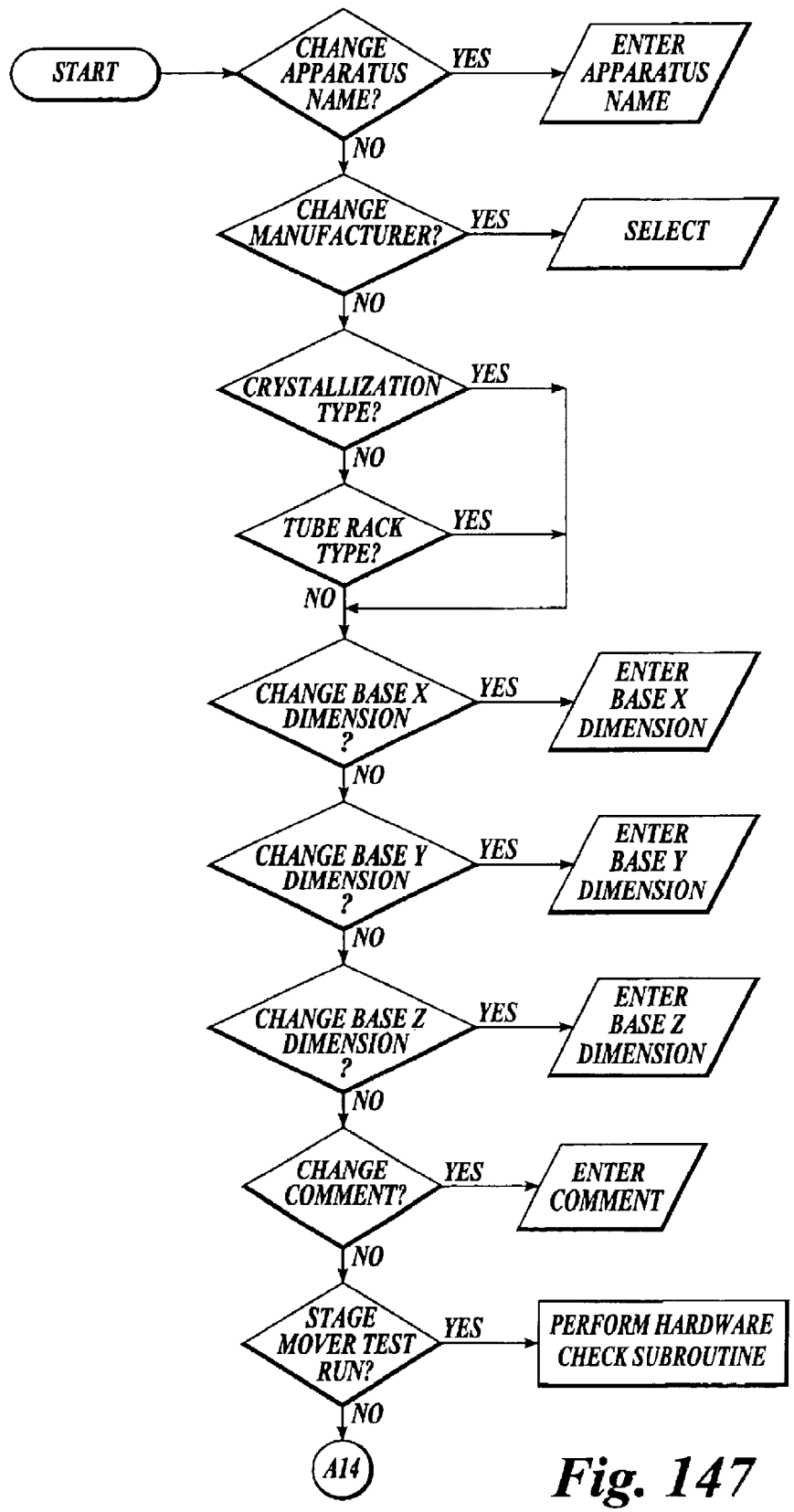
FIGS. 147–148 show a functional flow diagram for an update apparatus builder according to the present invention.
Figure 148:
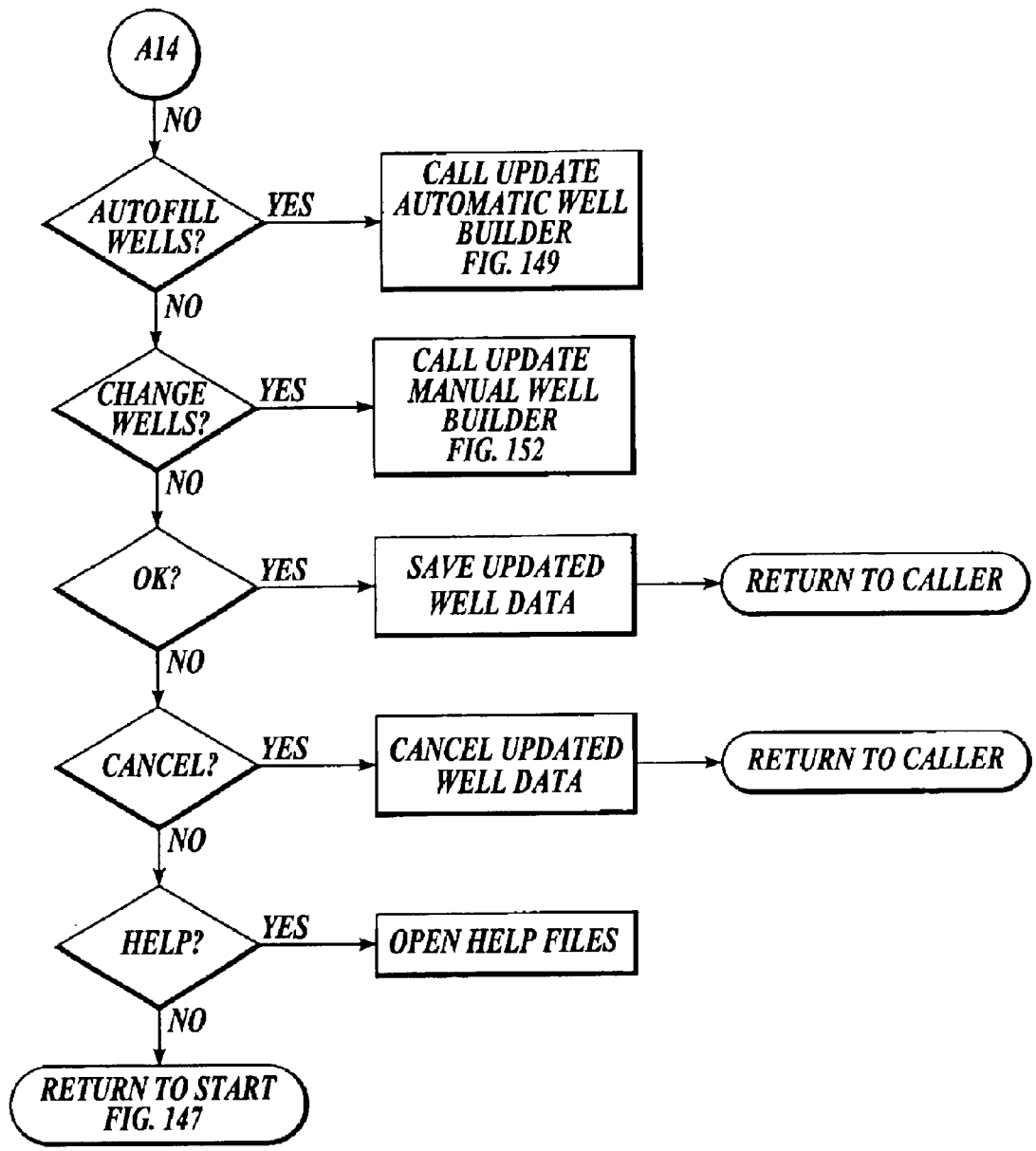
Figure 149:
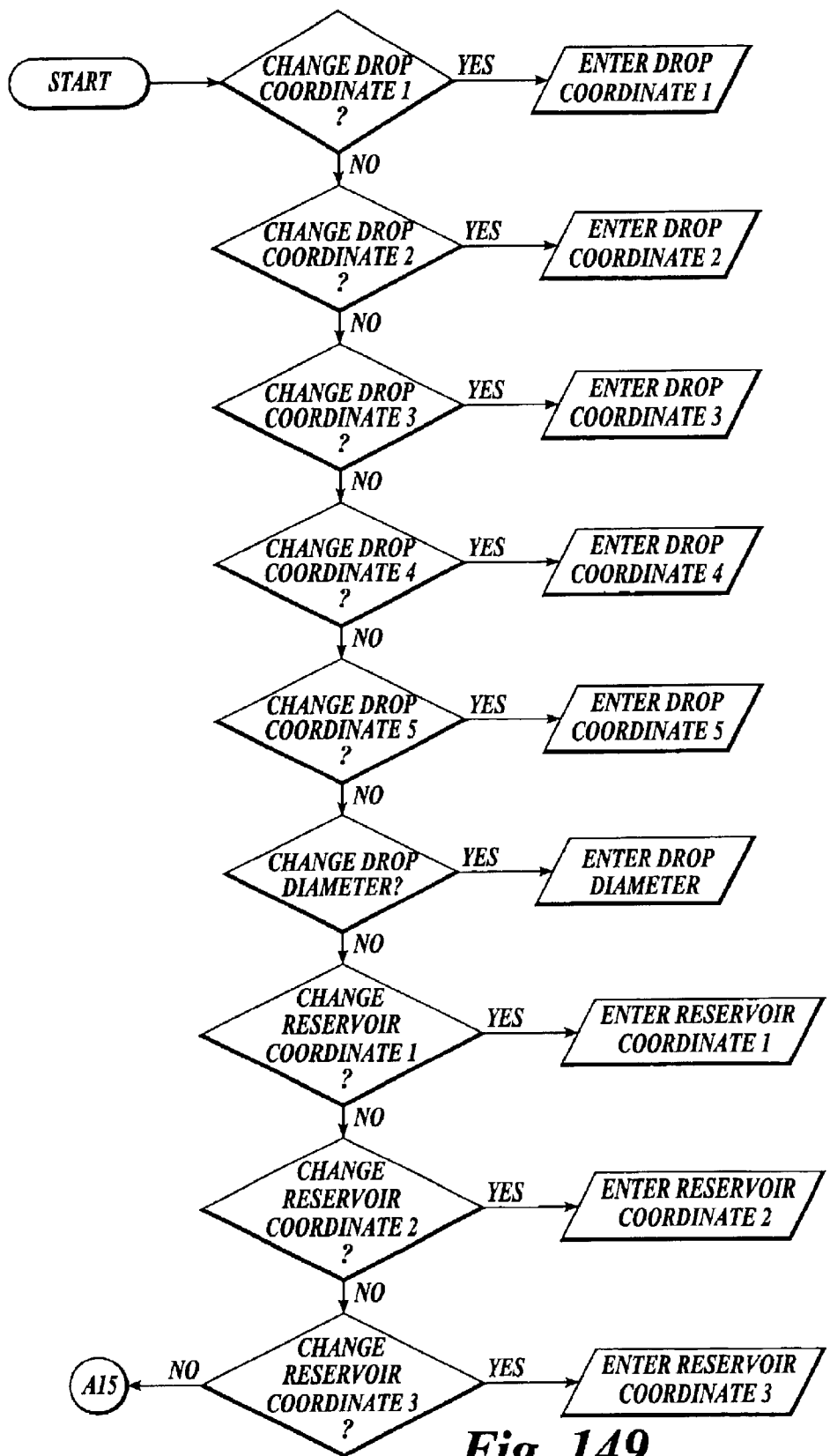
FIGS. 149–151 show an update automatic well builder according to the present invention.
Figure 150:
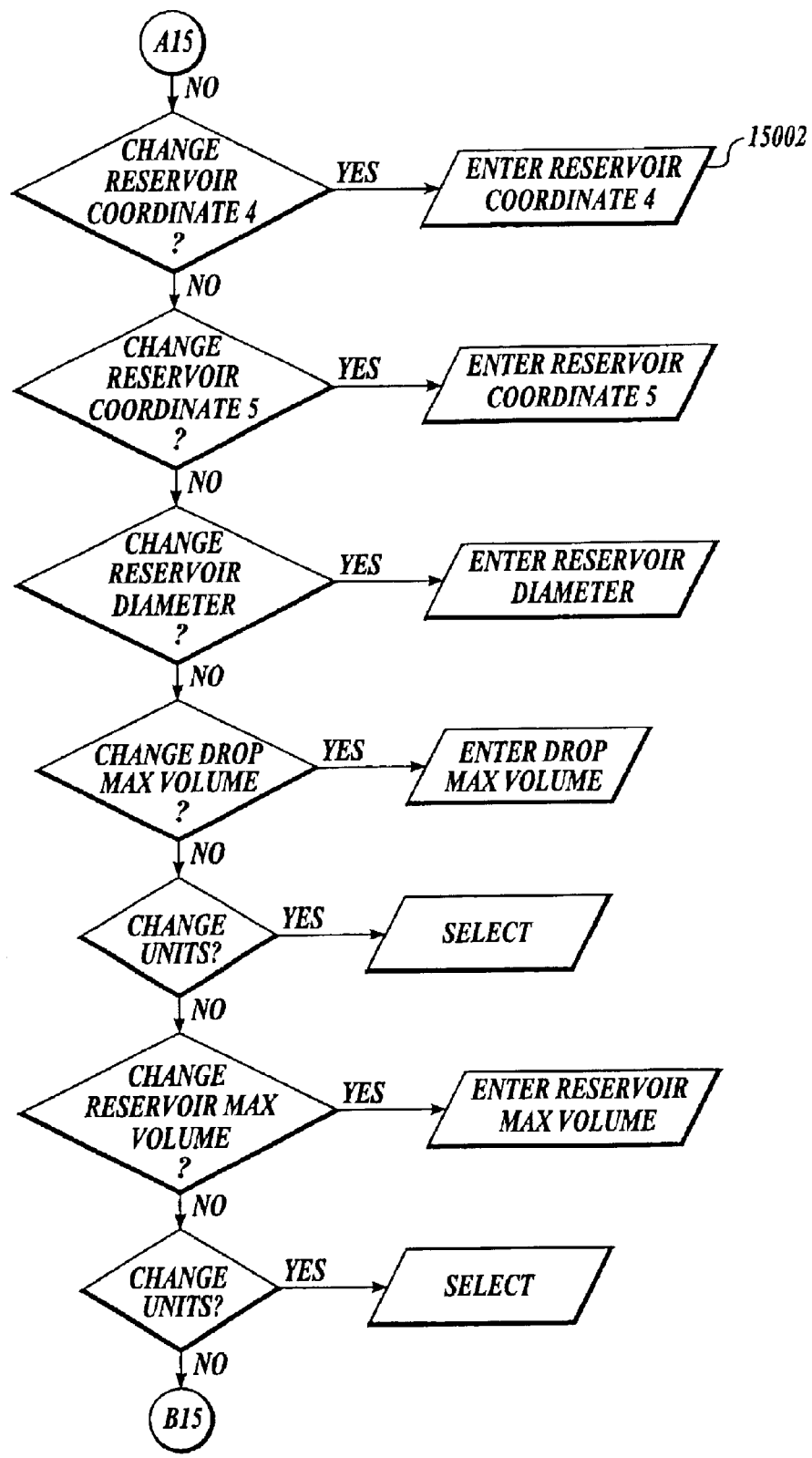
Figure 151:
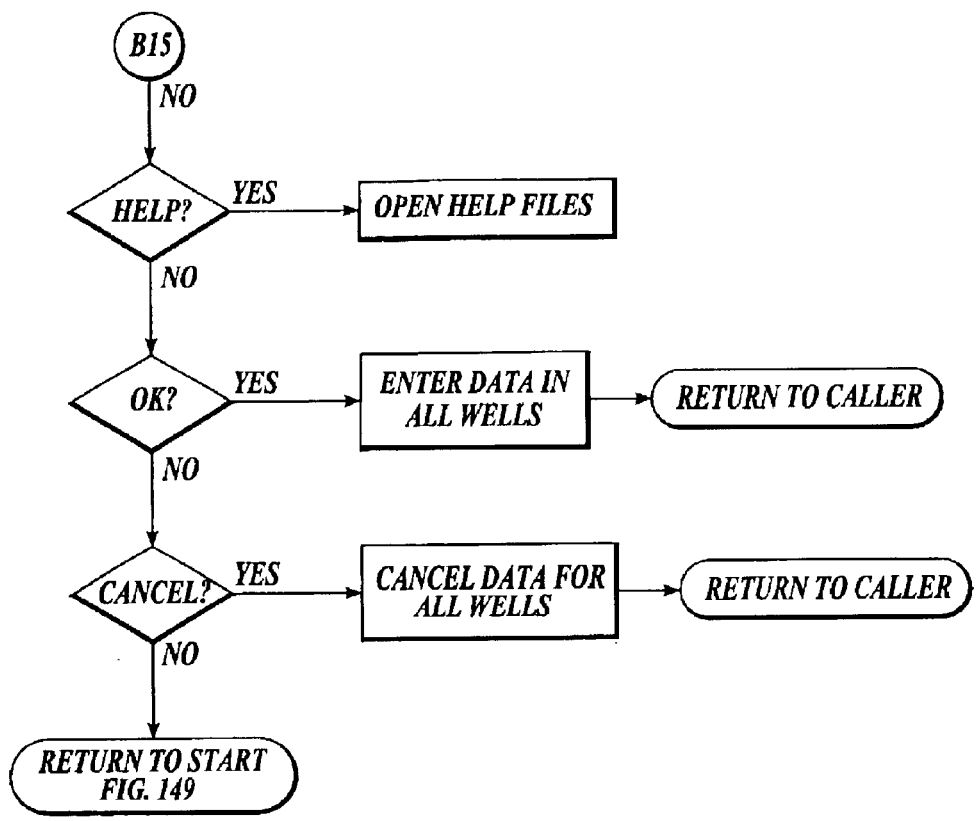
Figure 152:
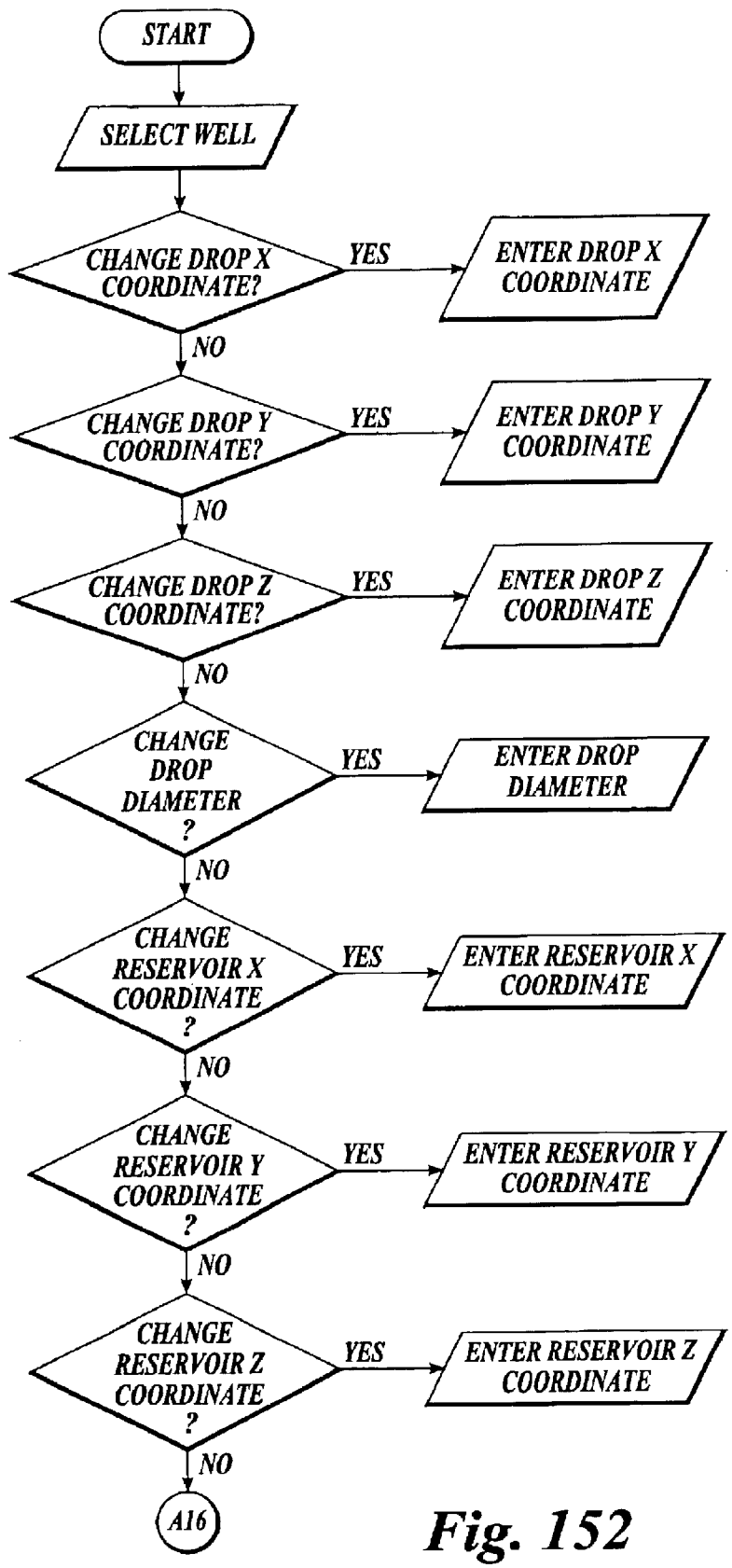
FIGS. 152–153 show a functional flow diagram an update manual well builder according to the present invention.
Figure 153:
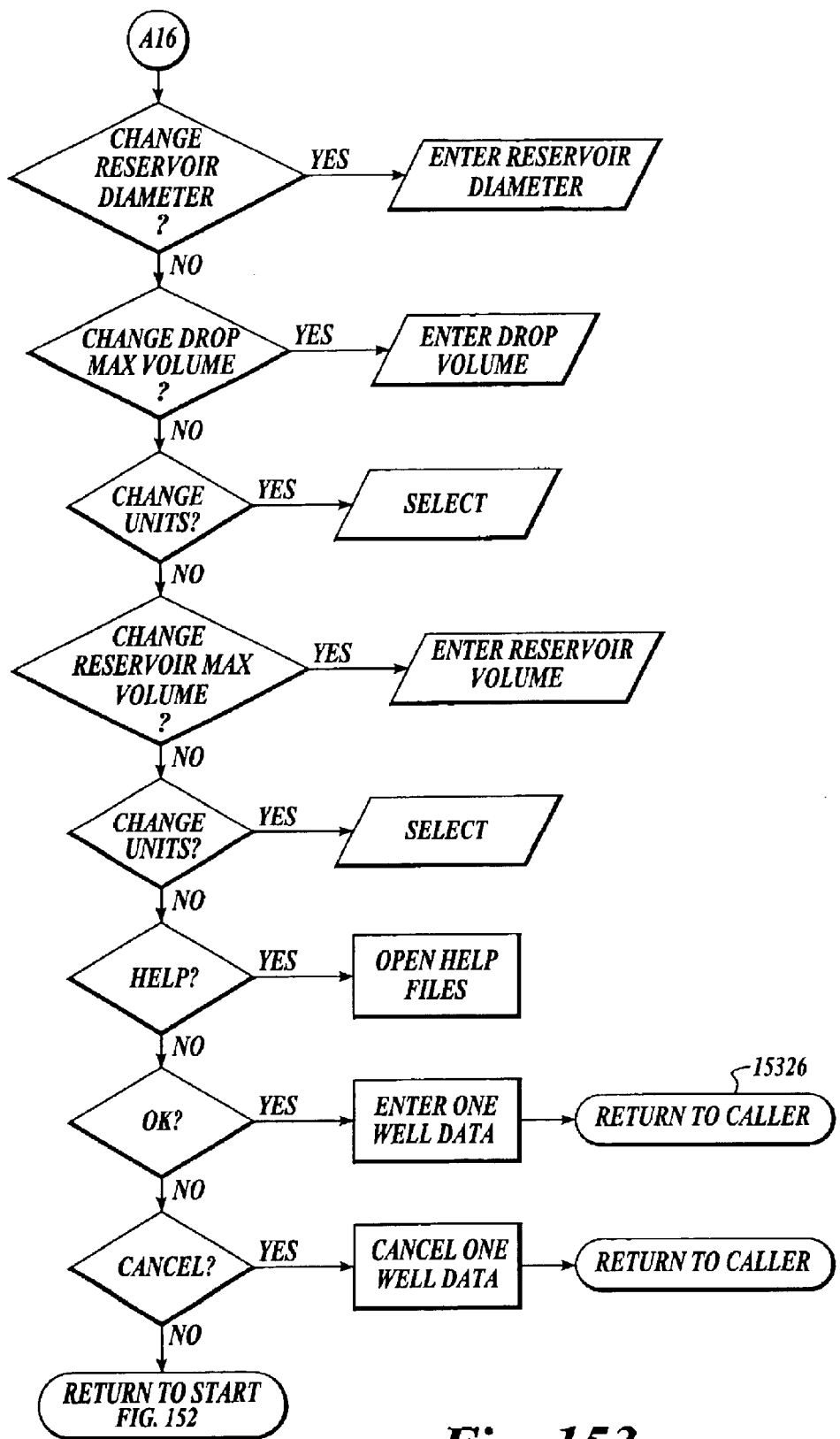

Returning to the apparatus manager dialog window 13200 and the related functional flow diagram (FIG. 133), apparatus data is updated by clicking on the update command button 13204. As noted above, clicking on the update command button 13204 opens or launches an update apparatus builder. This action is represented by steps 13308, 13310 and 13312 of FIG. 133. The update apparatus builder dialog window (not shown) includes a general apparatus data tab and an apparatus well data tab similar to the similarly named tabs of the new apparatus builder dialog window shown in FIGS. 134 and 135. However, the fields in the update apparatus builder are filled with the previously entered data. The column field and the row field can not be changed from the update apparatus builder. Otherwise, any data which has been previously entered can be changed or left unchanged. FIGS. 147 and 148 form a functional flow diagram of an update apparatus builder formed in accordance with this invention. But for the changes noted above, the functional flow diagram is substantially the same as the new apparatus builder shown in FIGS. 136–137. The update apparatus functional flow diagrams are not further described. Within the update apparatus builder, dialog windows for updating well data chamber by chamber and the autofill apparatus coordinates dialog window, represented by the functional flow diagrams of FIGS. 149–151, and FIGS. 152 and 153 respectively, are launched. Since these functional flow diagrams are very similar to the functional flow diagrams shown in FIGS. 144–148 and 139–141, respectively, except that they start with values that can be changed. The FIGS. 149–153 functional flow diagrams are not further described.

Subunit Manager

Preferred embodiments of the present invention also include a subunit manager for organizing and creating new macromolecule subunits. The subunits can be protein, DNA, RNA and their macromolecule complexes.

Figure 154:
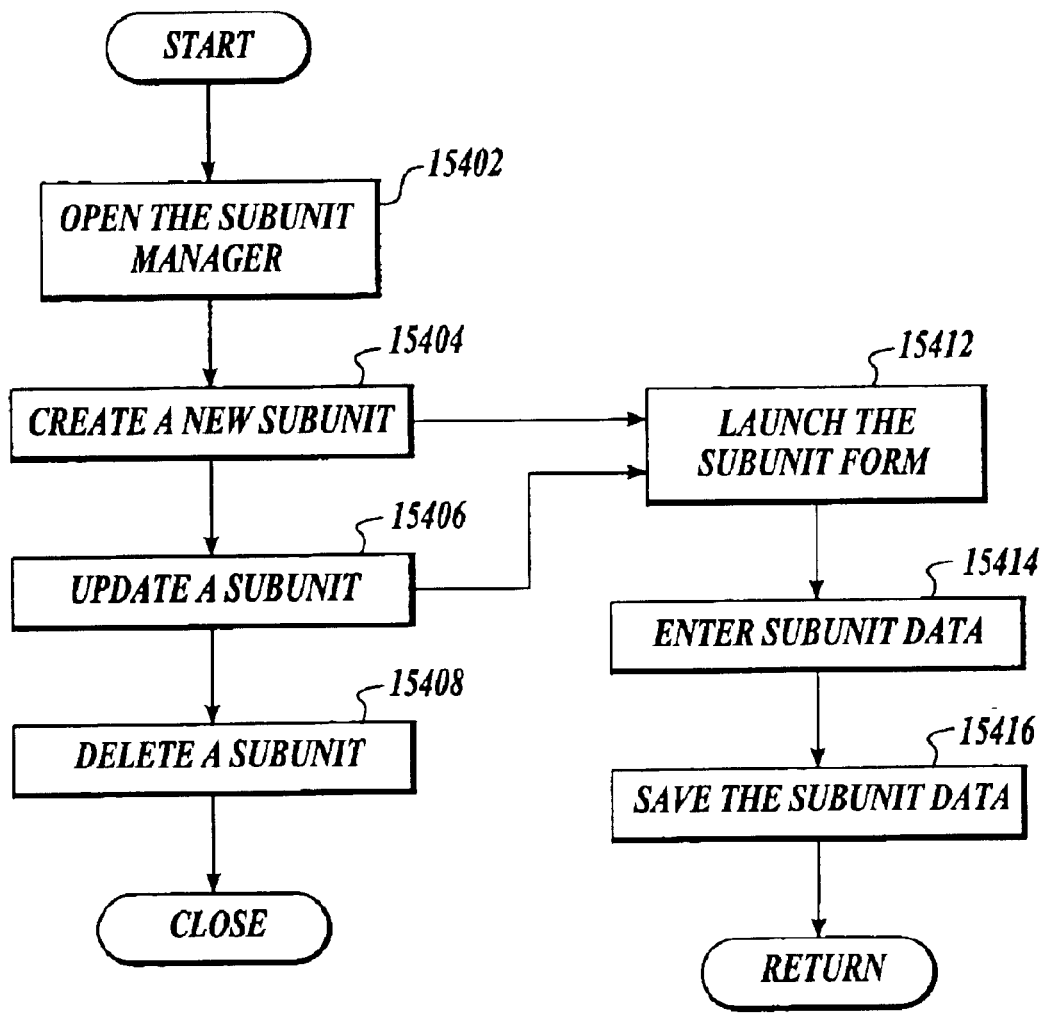
FIG. 154 shows a generic functional flow diagram for a subunit manager according to the present invention.

FIG. 154 shows a generalized functional flow diagram of a subunit manager formed in accordance with the present invention. When launched, the subunit manager displays all of the available macromolecule subunits in the database (step 15402). If desired, a user can create a new subunit (step 15404). Or, a user can update an existing subunit in the database (step 15406). Or, a user can delete a subunit from the database (step 15408). Both steps of creating a new subunit and updating an existing subunit launch a subunit builder (step 15412). The subunit builders are used to enter new subunit data or change existing subunit data (15414). New or changed subunit data can be saved (step 15416).

Figure 155:
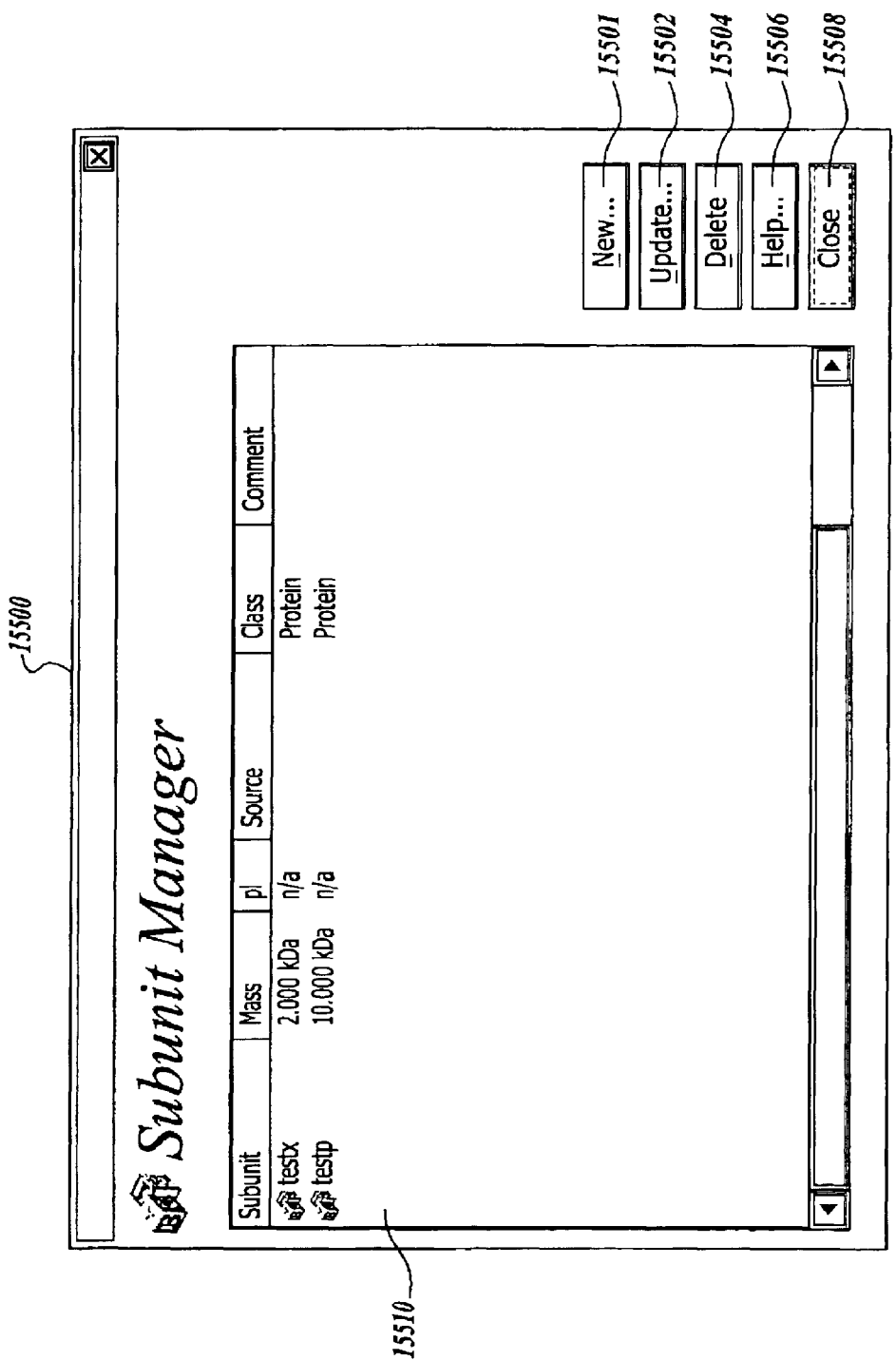
Figure 156:
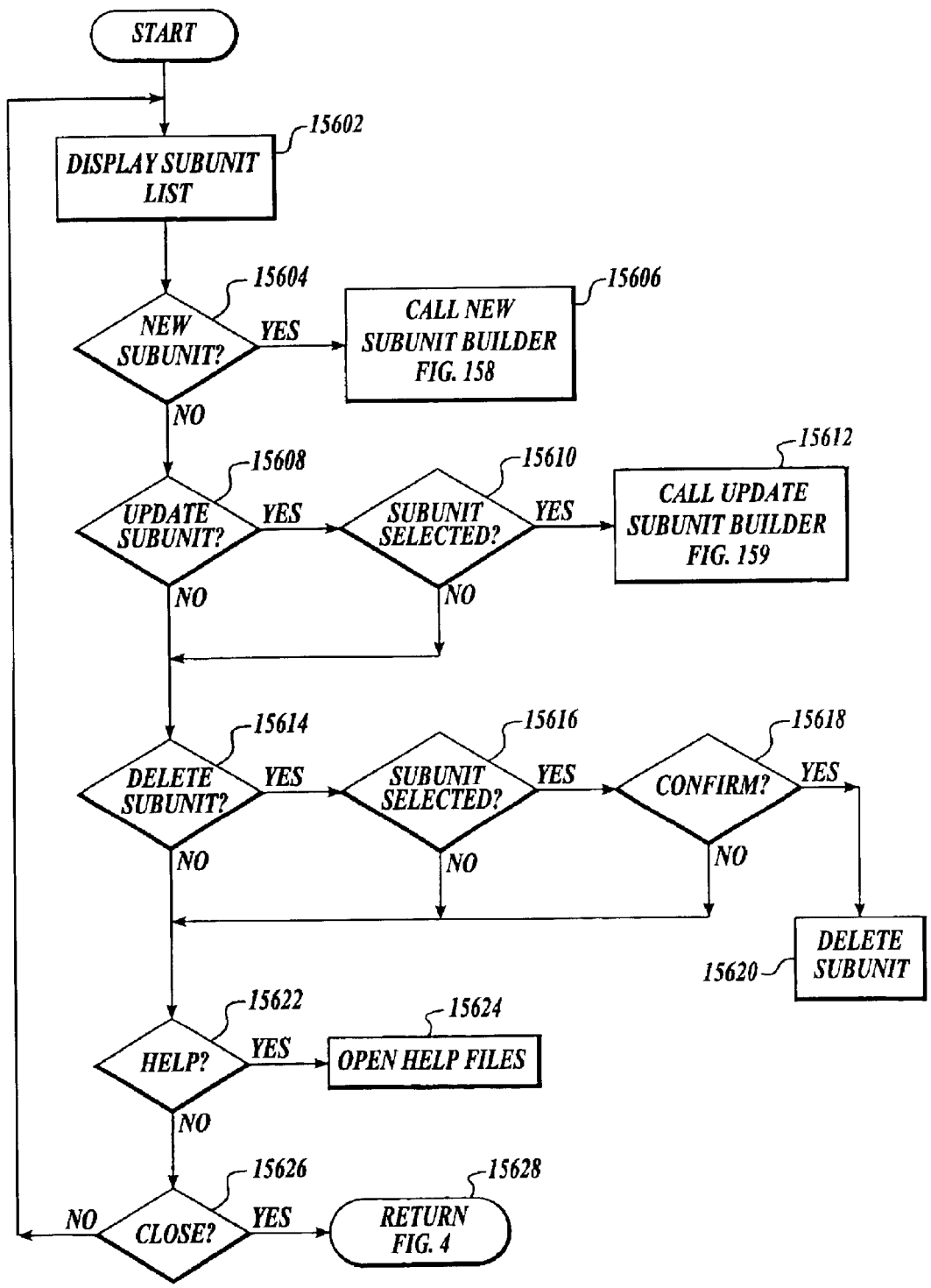

FIG. 155 illustrates a subunit manager dialog window 15500 formed in accordance with the present invention for displaying all of the available macromolecule subunits in the database and FIG. 156 is a corresponding functional flow diagram. The subunit manager dialog window 15510 includes a subunit list box 15510 showing all of the available subunits in the database. The list box includes a row of subunit attributes in tabular form. The subunit manager dialog window 15500 also includes a new command button 15501, an update command button 15502, a delete command button 15504, a help command button 15506, and a close command button 15508.

When the subunits manager is launched as noted above, a subunit list is displayed. This is represented by step 15602 of FIG. 156. Clicking on the new command button opens or launches a new subunit builder. An example of a new subunit builder formed in accordance with this invention is described below. This action is represented by steps 15604 and 15606 of FIG. 156.

Clicking on the update command button 15502 opens or launches an update subunit builder. An example of an update subunit builder formed in accordance with this invention is described below. This action is represented by steps 15608, 15610, and 15612 of FIG. 156.

If a subunit has been previously selected, clicking on the delete command button 15504 opens a warning dialog box. If the selected subunit is to be deleted from the database, clicking on the yes command button in the warning box (not shown) results in the deletion of the subunit. This action is shown as steps 15614, 15616, 15618, and 15620 of FIG. 156. Clicking on the help command button 15506 opens the help files. This action is shown as steps 15622 and 15624 of FIG. 156. Clicking on the close command button 15508 closes the subunit manager dialog window 15500 and returns the user to the main menu dialog window shown in FIG. 2. This action is represented by steps 15626 and 15628 in FIG. 156.

Subunit Manager: New Subunit

Figure 157:
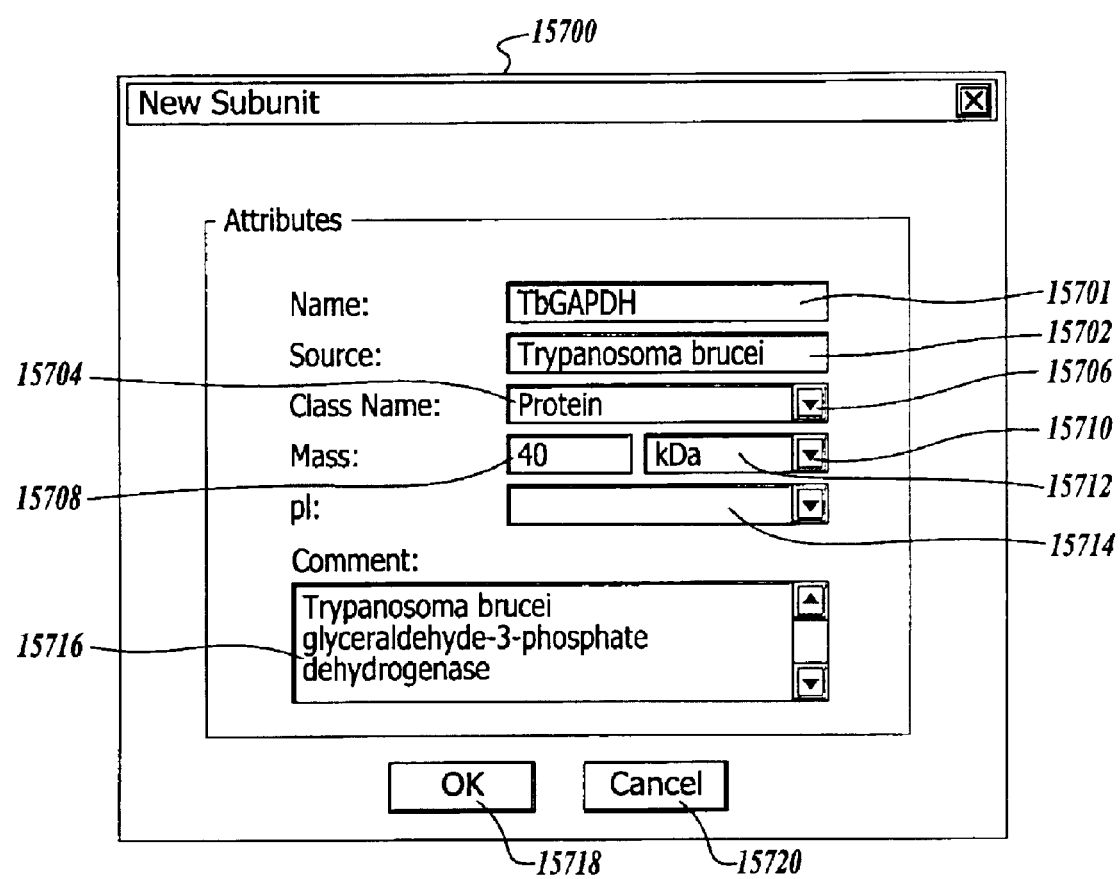
Figure 158:
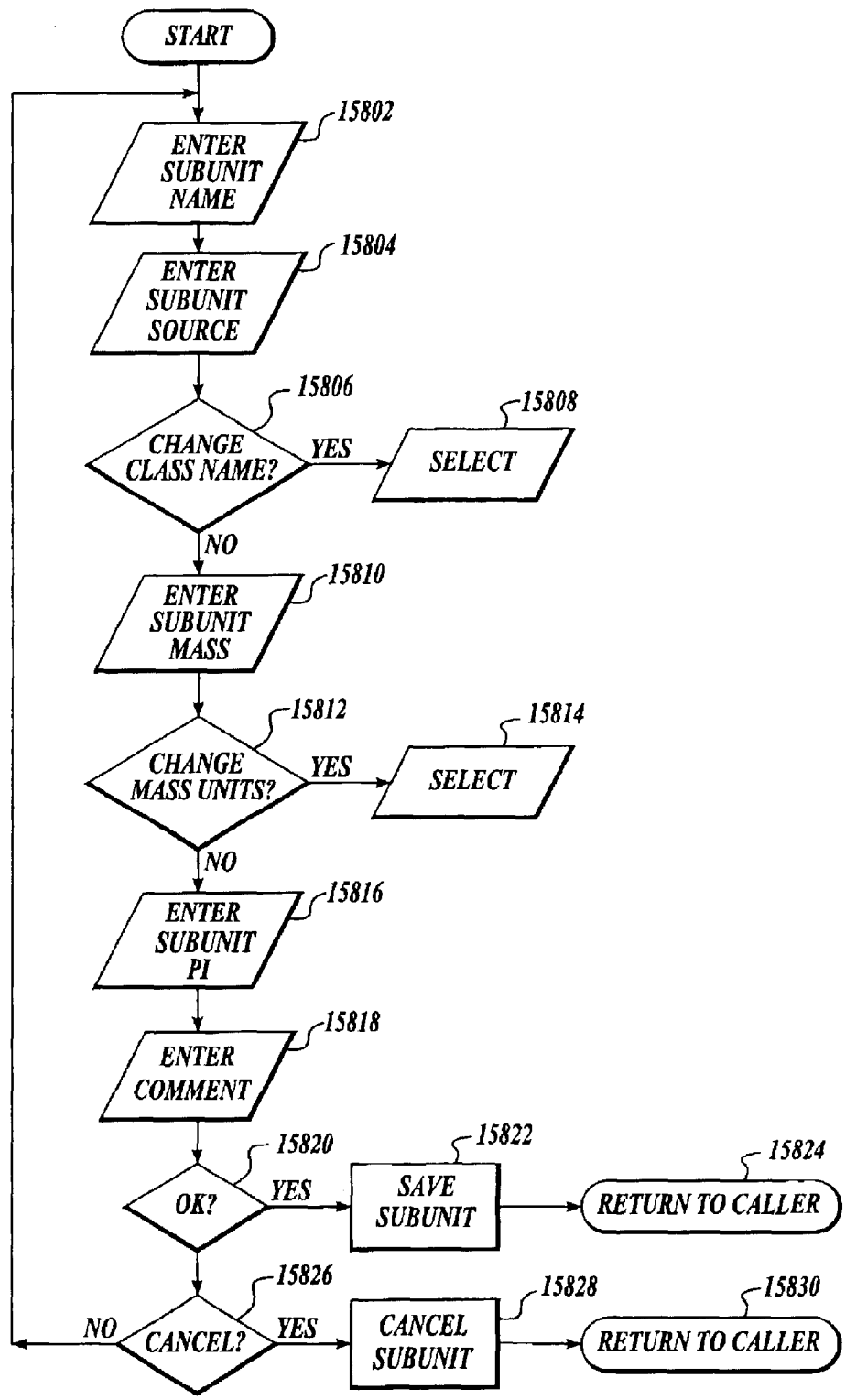

FIG. 157 illustrates a new subunit builder dialog window 15700 formed in accordance with this invention and FIG. 158 is a corresponding functional flow diagram. The new subunit builder allows a user to enter attributes that create a new subunit and add the new subunit to the database.

In a conventional manner, the name of the new subunit is entered in a name field box 15701, i.e., by selecting the name field box and entering a name using a keyboard or other suitable data entry device. This action is shown by step 15802 of FIG. 158. The source of the new subunit is entered in a source field box 15702 in the same manner. This action is shown by step 15804 of FIG. 158. The new subunit class name is entered in a class name field box 15704 by clicking on a down arrow button 15706 located alongside the class name field box 15704. Preferably, the database comes preloaded with classes such as, but not limited to, proteins, DNA, RNA, glycoproteins, phosphoprotein, and membrane proteins, and their complexes and duplexes and any combination thereof, such as protein-DNA complex, protein-RNA complex, DNA duplex, RNA duplex, DNA-RNA duplex and the like. Clicking on the down arrow button 15706 opens a drop-down list of available class names. Clicking on the desired class name enters the class name in the class name field 15704 and closes the drop-down list. This action is represented by steps 15806 and 15808 of FIG. 158.

The new subunit mass is entered in the mass field box 15708 in the same way other data is entered. This action is shown by step 15816 of FIG. 158. Mass units are changed by clicking on a down arrow button 15710 located alongside a mass units field box 15712. Clicking on the down arrow 15710 opens a drop-down list which shows all the available mass units. Clicking on a selection enters the selection in the mass unit field box 15712 and closes the drop-down list. This is action is shown by steps 15812 and 15814 of FIG. 158.

A pI (isoelectric point) value for the new subunit is entered in a pI field box 15714 the same way other data is entered. This action is shown by step 15816 of FIG. 158. If desired, a comment can be entered in a comment field box 15716 the same way other data is entered. This action is represented by step 15818 of FIG. 158.

Clicking on an ok command button 15718 saves the new subunit in the database and returns a user to the subunit manager dialog window 15500 shown in FIG. 155. This action is shown by steps 15820, 15822, and 15824 of FIG. 158. Alternatively, clicking on the cancel command button 15720 cancels the new subunit before returning the user to the subunit manager dialog window. This action is shown by steps 15826, 15828, and 15830 of FIG. 158.

Subunit Manager: Update Subunit

Figure 159:
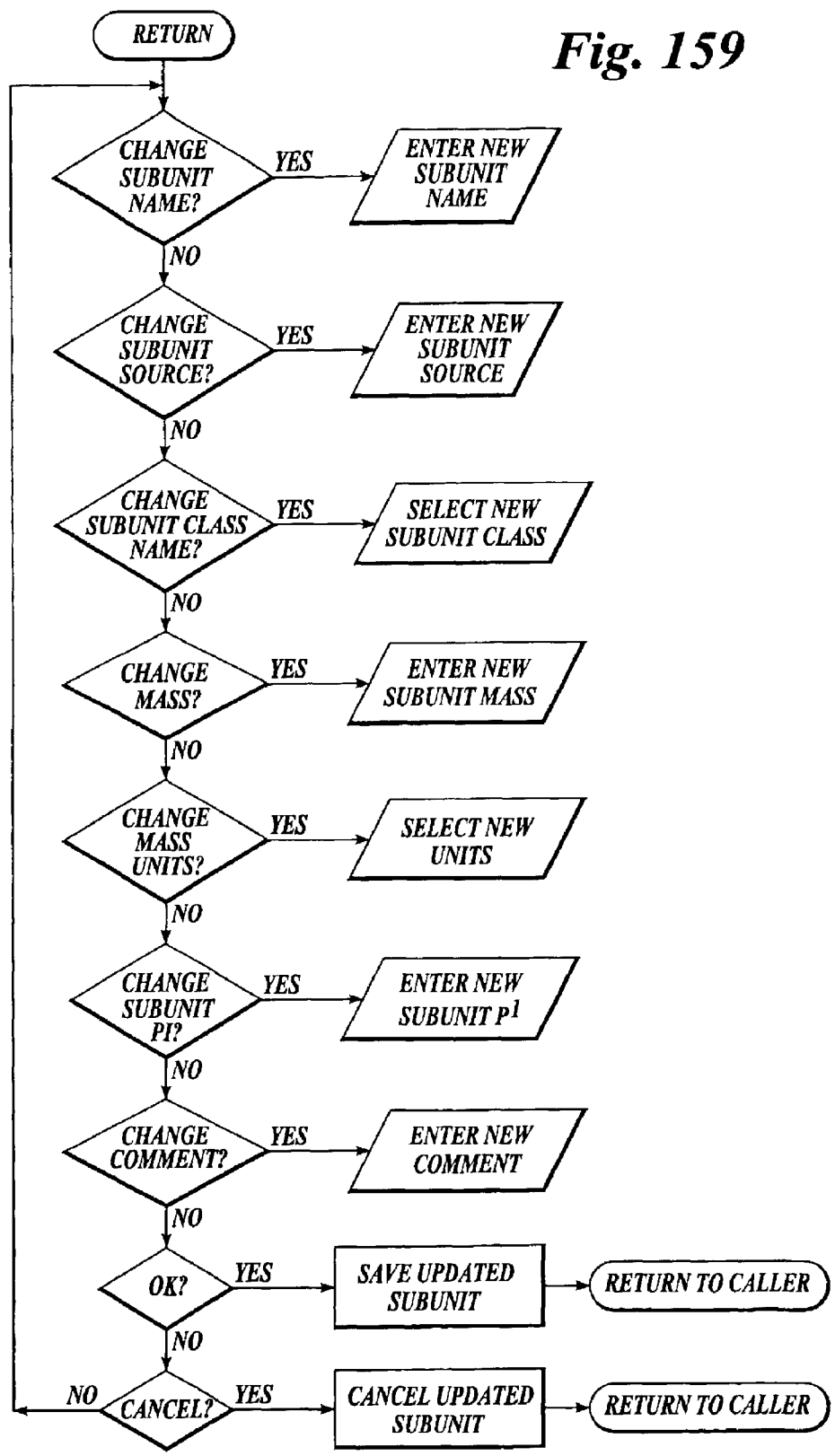

Referring again to the subunit manager dialog window 15500 shown in FIG. 155, the properties of an existing subunit in the database can be updated by clicking on the update command button 15502, after the subunit has been selected, i.e., highlighted in the subunit list box. The update subunit builder dialog window is similar to the new subunit dialog window 15700 shown in FIG. 157, the difference being that the attribute field boxes are filled with previously entered data. An existing subunit is updated by a user changing the desired attribute or attributes. FIG. 159 is a functional flow diagram of an update subunit builder formed in accordance with this invention. Since the update subunit builder flow diagram is substantially the same as the new subunit builder functional flow diagram shown in FIG. 158. The update subunit builder functional flow diagram will not be further described except to note that a decision block precedes each entering or selecting step. Decision blocks are included to make it clear that any data entering step can be skipped.

Macromolecule Manager

Figure 160:
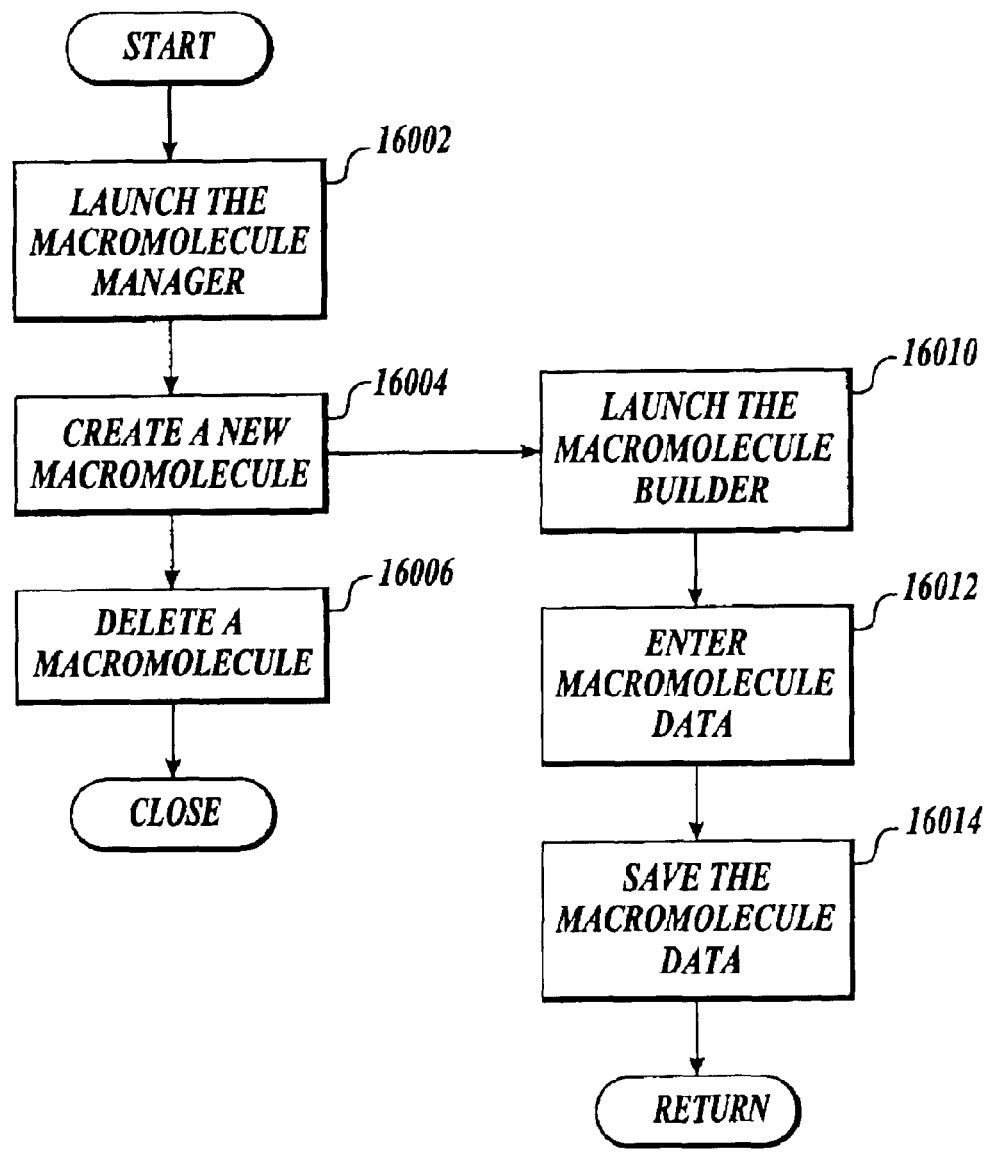

Preferred embodiments of a present invention also include a macromolecule manager for use in creating new macromolecules from available macromolecule subunits. FIG. 160 is a generalized functional flow diagram of a macromolecule manager formed according to the present invention. When the macromolecule manager is opened or launched, a GUI or dialog window is displayed (step 16002). A new macromolecule can be created and added to the database (step 16004). Or, an existing macromolecule can be deleted from the database (16006). If a new macromolecule is to be created, a macromolecule builder is launched (step 16010). Macromolecule data is entered through the macromolecule builders (step 16012). The macromolecule data can be saved if desired (step 16014).

Figure 161:
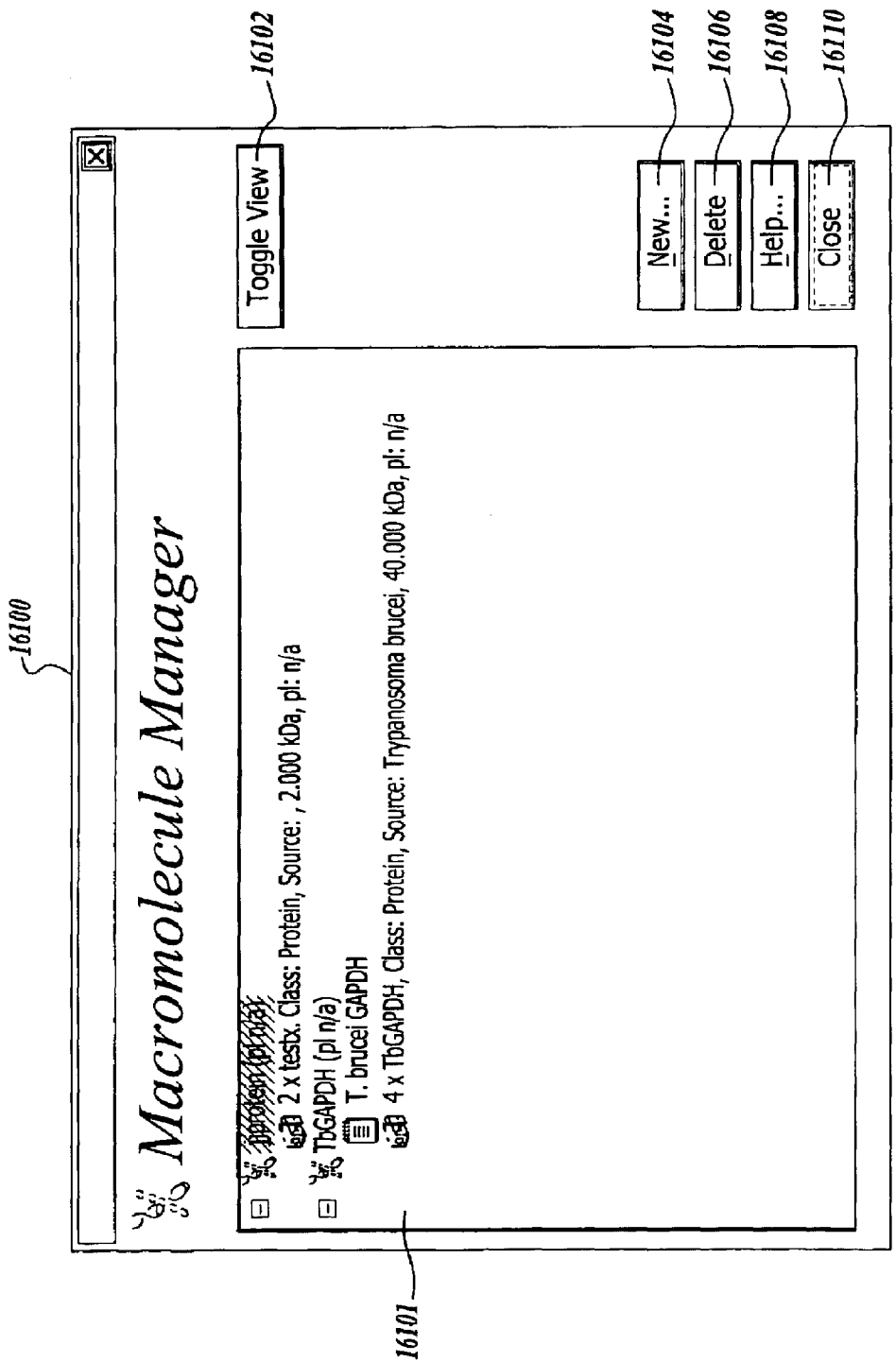
Figure 162:
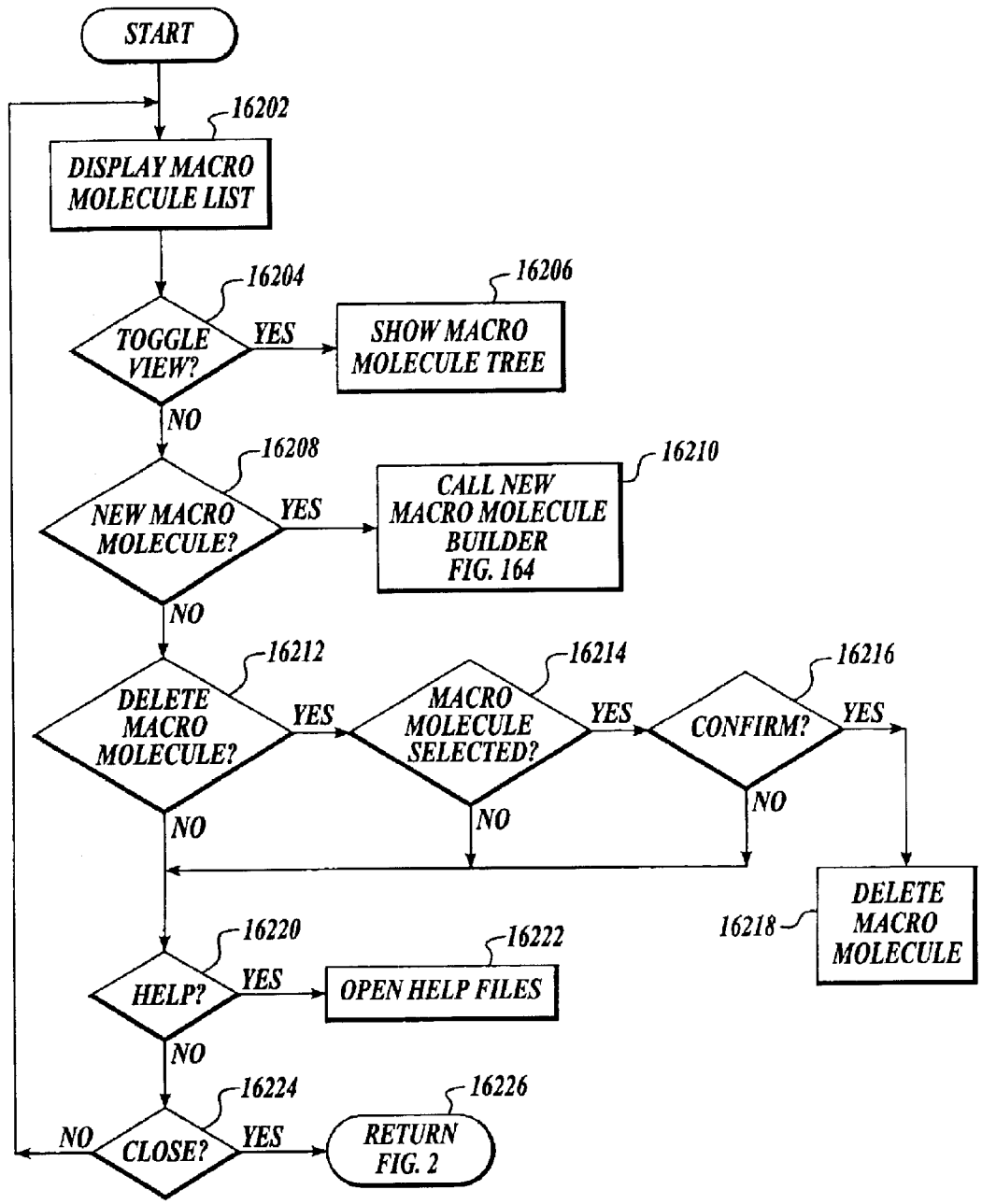

FIG. 161 illustrates a macromolecule manager dialog window 16100 formed according to the present invention and FIG. 162 is a corresponding functional flow diagram. When the macromolecule manager is launched, the macromolecule manager dialog window 16100 opens. The macromolecule manager dialog window includes a macromolecule list box 16101 showing all of the macromolecules in the database. This action is represented by step 16202 of FIG. 162. The macromolecules can be displayed in either list format or tree format, clicking on a toggle view command button 16102 changes the display of the macromolecule list. This action is represented by steps 16204 and 16206 of FIG. 162. In the list format, the list box 16101 includes macromolecule attributes in tabular form. In the tree format, the macromolecules can be expanded to show the individual subunits making up the macromolecule. If desired, the macromolecule manager dialog window can include a usage list box (not shown) that displays all the projects in which the macromolecule is being used.

The macromolecule manager dialog window 16100 also includes a new command button 16104, a delete command button 16106, a help command button 16108, and a close command button 16110.

A new macromolecule is created by clicking on the new command button 16104. Clicking on the new command button 16104 opens or launches a macromolecule builder to create the new macromolecule. An example of a macromolecule builder is described below. This action is represented by steps 16208 and 16210 of FIG. 162. Clicking on the delete command button 16106 after a macromolecule is selected opens a warning box (not shown) requiring the user to confirm that the macromolecule is to be deleted from the database. Clicking yes in the warning box deletes the macromolecule from the database. This action is represented by steps 16212, 16214, 16216, and 16218 of FIG. 162. Clicking on the help command button 16108 opens the help file. This is shown by steps 16220 and 16222, of FIG. 162. Clicking on the close command button 16110 closes the macromolecule manager without adding the macromolecule to the database and returns the user to the main manager dialog window shown in FIG. 2. This action is shown by steps 16224 and 16226, of FIG. 162.

Macromolecule Manager: New Macromolecule

Figure 163:
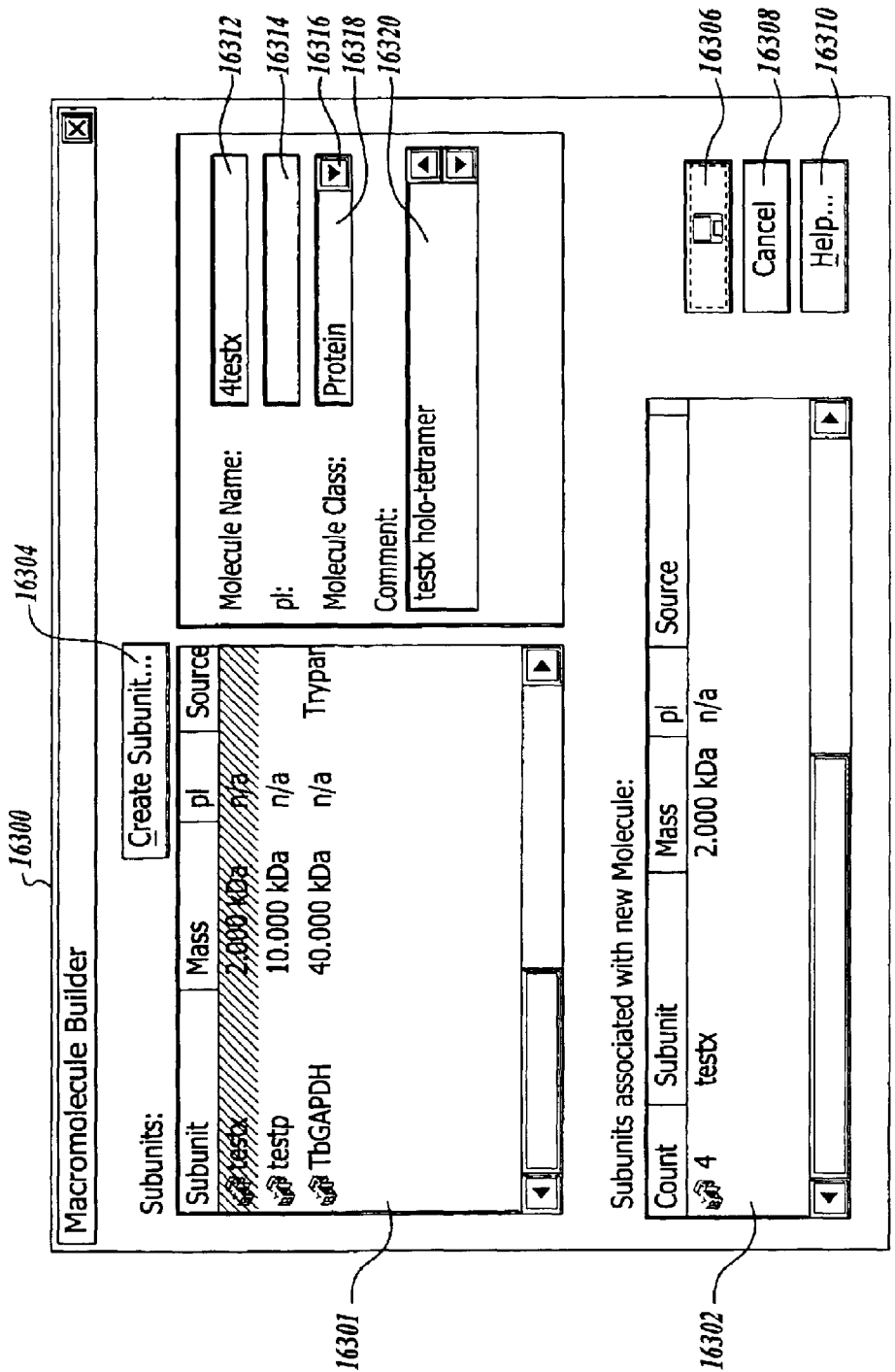
Figure 164:
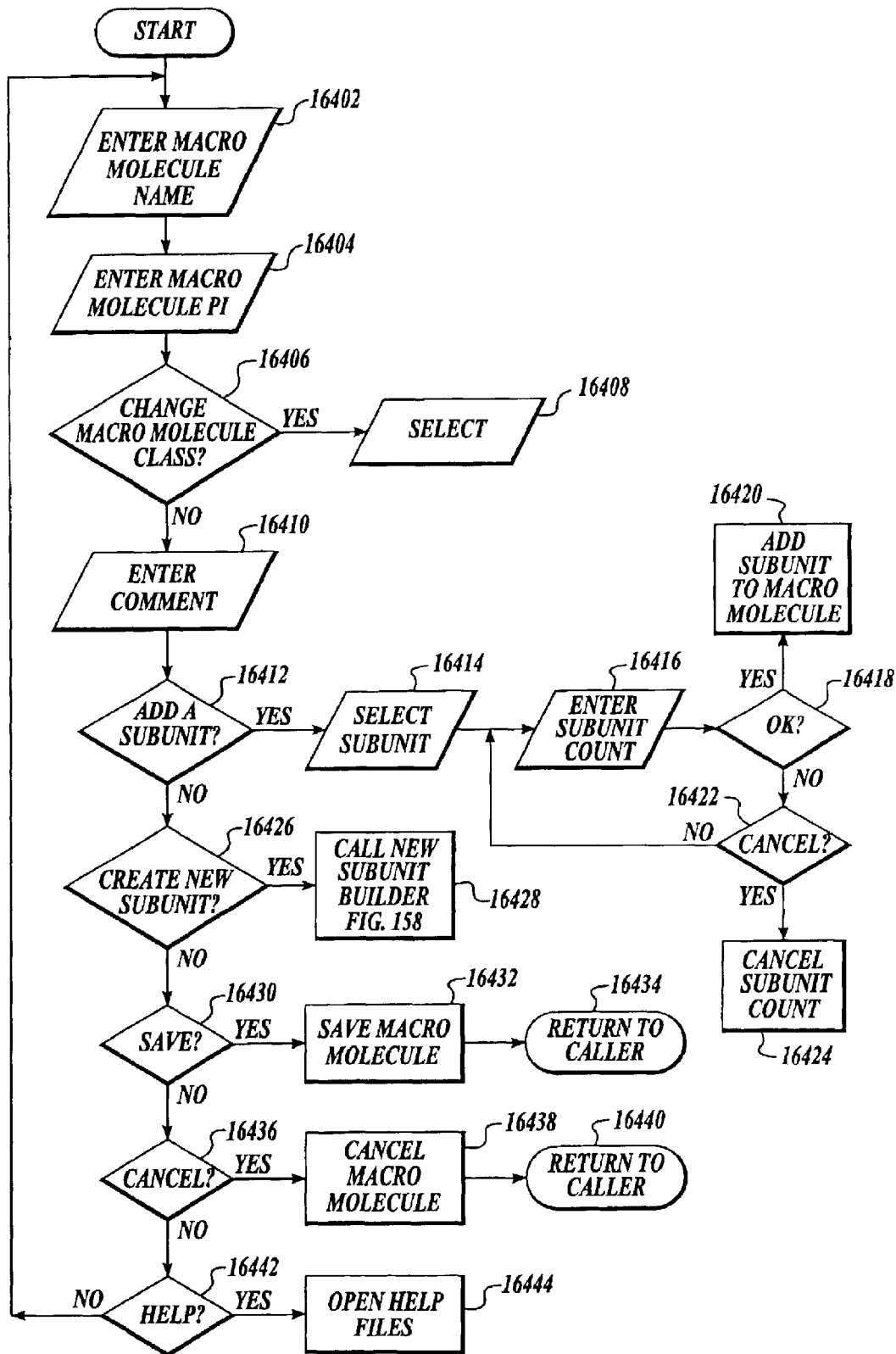

FIG. 163 illustrates a macromolecule builder dialog window 16300 formed according to the present invention and FIG. 164 forms a corresponding functional flow diagram. The macromolecule builder dialog window includes a subunits list box 16301 that lists all the available subunits in the database. The subunits list box is located on one side, e.g., the left side, of the macromolecule builder dialog window. Molecule attribute field boxes are located on the other (right) side and a list box 16302 showing all the subunits associated with the current new molecule appears in the lower portion of the macromolecule builder dialog window. The macromolecule builder dialog window also includes a create subunit command button 16304 that allows missing subunits to be created without the user leaving the macromolecule builder dialog window. The macromolecule builder dialog window further includes a save command button 16306, a cancel command button 16308, and a help command button 16310.

The name of the molecule is entered in a molecule name field box 16312. As with previously described windows, data is entered by selecting the name field box and entering a name using a keyboard or other suitable data entry device. This action is shown by step 16402 of FIG. 164. The pI value of the molecule is entered in pI field box 16314 in a similar manner. This action is shown by step 16404 of FIG. 164.

The molecule class is entered by clicking on a down arrow button 16316 located alongside a molecule class field box 16318. Clicking on the down arrow button 16316 opens a drop-down list of available molecule classes. These are similar to the subunits classes and include proteins, DNA, RNA, glycoproteins, phosphoprotein, and membrane proteins, and their complexes and duplexes and any combination thereof, such as protein-DNA complex, protein-RNA complex, DNA duplex, RNA duplex, DNA-RNA duplex and the like. Clicking on a selection enters the selection in the molecule class field box 16318 and closes the list. This action is represented by steps 16406 and 16408 of FIG. 164. If desired, comments can be entered into a comment field box 16320. This action is shown by step 16410 of FIG. 164.

New macromolecules are built from the list of available subunits in the database. To add a subunit to the new molecule, the subunit is double-clicked on, which opens an add subunit dialog box (not shown). The add subunit dialog box provides for the entry of a subunit count in a field box. The add subunit dialog box also includes an okay command button and a cancel command button. Clicking on the okay command button adds the subunit to the macromolecule and returns the user to the macromolecule builder dialog window 16300. Clicking on the cancel command button cancels the subunit count without the subunit count being added to the macromolecule list and returns the user to the macromolecule builder dialog window. Adding a subunit to a macromolecule is represented by steps 16412–16424 of FIG. 164.

If the subunit is not available in the database, a new subunit is created by clicking on the create subunit command button 16304, which launches the previously described new subunit builder. See FIGS. 157 and 158. This action is shown by steps 16426 and 16428 of FIG. 164.

Clicking on the save command button 16306 saves the macromolecule in the database and returns the user to the macromolecule manager dialog window shown in FIG. 161. This action is represented by steps 16430 and 16432 of FIG. 164. Clicking on the cancel command button 16308 cancels the macromolecule and, then, returns the user to the macromolecule manager dialog window 16100. This action is shown as steps 16436, 16438, and 16440, in FIG. 164. Clicking on the help command button 16310 opens the help files. This is represented by steps 16442 and 16444 of FIG. 164.

Macromolecule Formulation Manager

Figure 165:
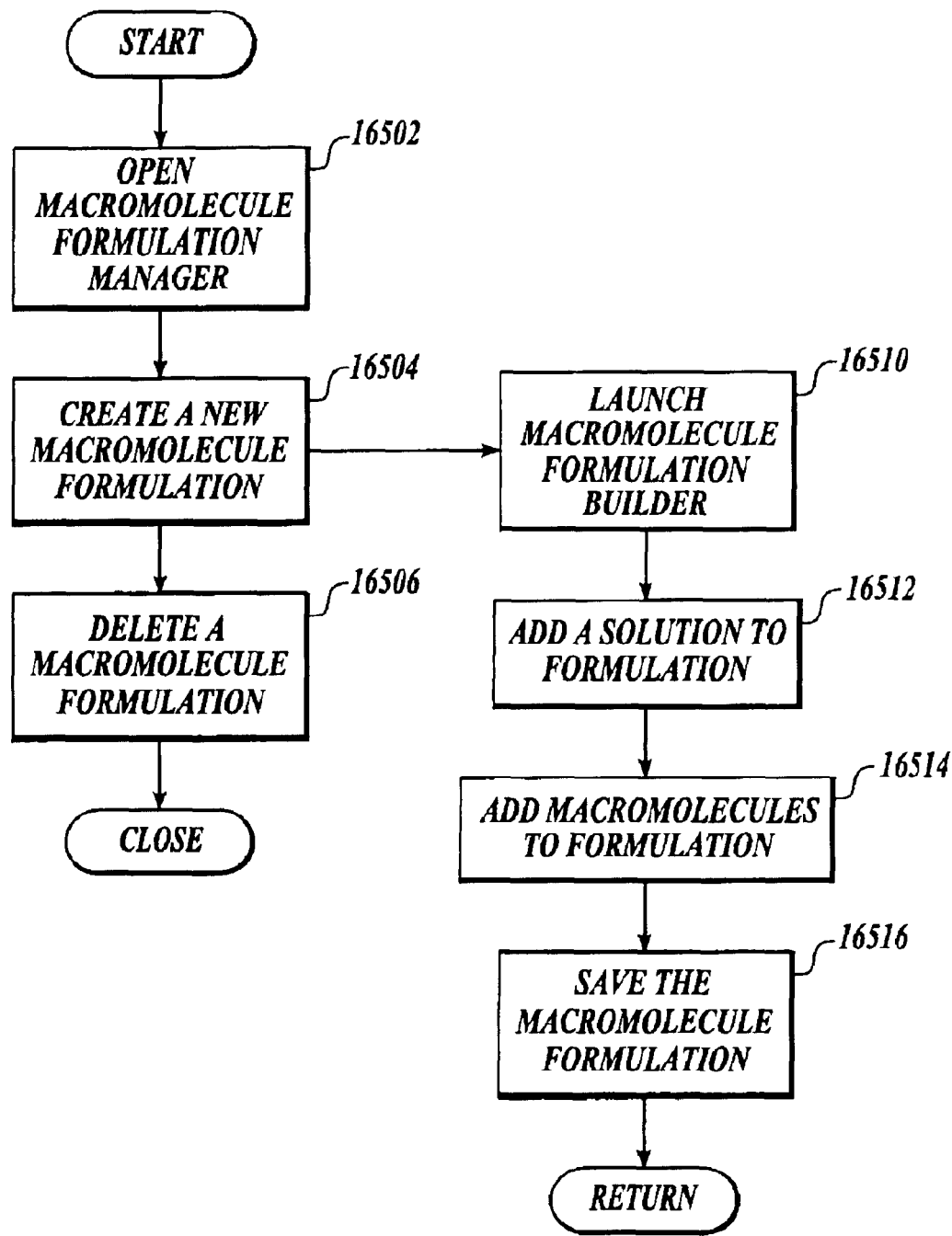

Preferred embodiments of the invention include a macromolecule formulation manager for use in creating macromolecule formulations from available macromolecules and solutions. FIG. 165 is a generalized functional flow diagram of a macromolecule formulation manager formed according to the present invention. When the macromolecule formulation manager is opened, a dialog window is opened (step 16502). A new macromolecule formulation can be created and saved to a database (step 16504) or an existing macromolecule formulation can be deleted from the database (step 16506). If a new macromolecule formulation is to be created, a macromolecule formulation builder is launched (step 16510). The macromolecule formulation builder allows a user to: add a solution to the formulation (step 16512) or add a macromolecule to the formulation (step 16514). If desired, the macromolecule formulation can be added to the database (step 16516).

Figure 166:
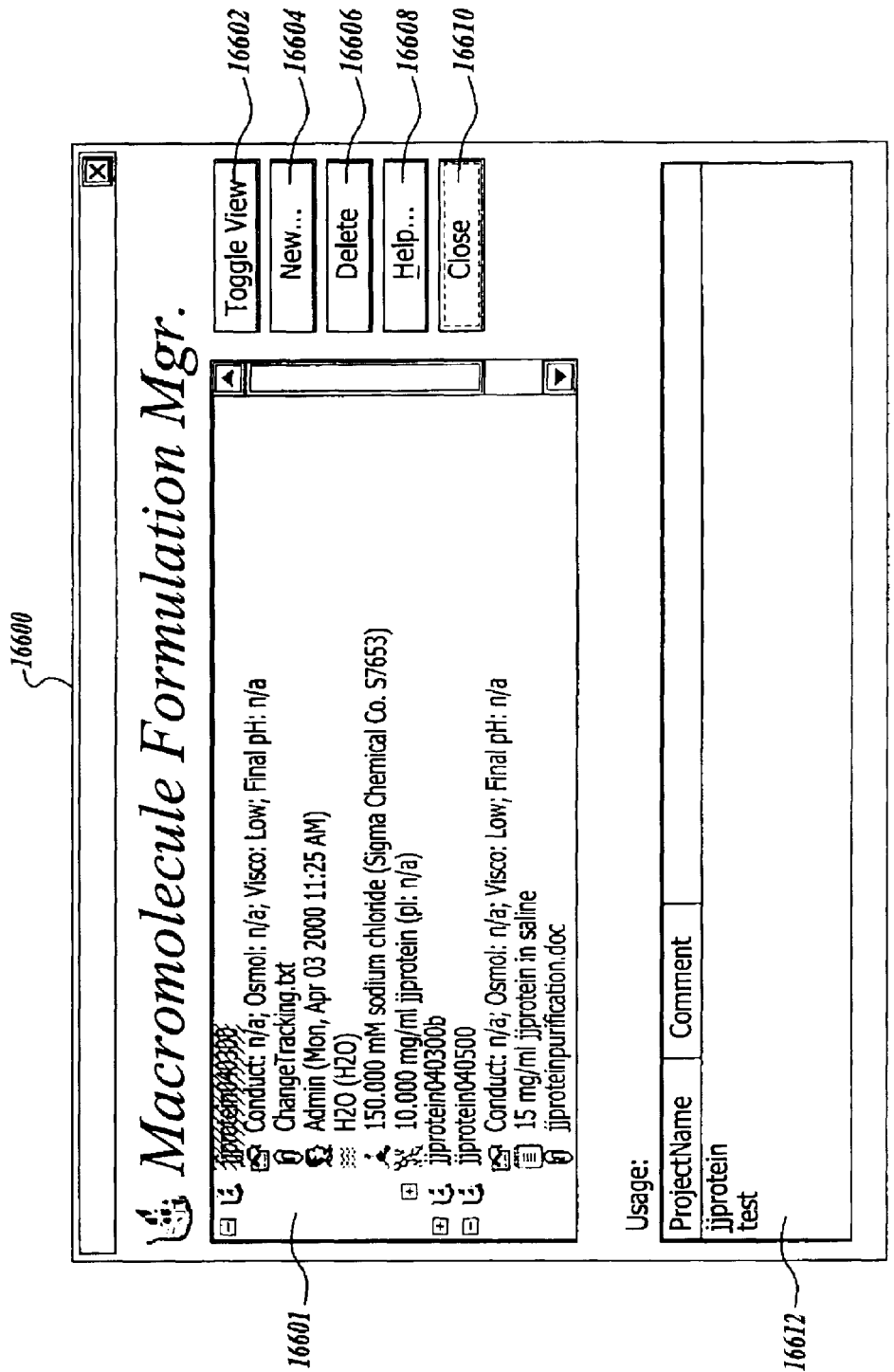

FIG. 166 illustrates a macromolecule formulation manager dialog window 16600 formed according to the present invention and FIG. 167 is a corresponding functional flow diagram.

Referring now to FIG. 166, the macromolecule formulation manager dialog window 16600 includes a macromolecule formulation list box 16601 that lists all the available macromolecule formulations. The macromolecule formulation manager dialog window also includes a usage list box 16612 for displaying the projects which use the selected macromolecule formulation. These displays are represented by step 16702 of FIG. 167. The macromolecule formulation manager dialog window 16600 also includes a toggle view command button 16602. The toggle view command button 16602 toggles the macromolecule formulation list box between a list format and a tree format. This action is shown as steps 16704 and 16706 of FIG. 167. In a conventional manner, when in the tree format, clicking on a plus button expands the macromolecule formulation to show all of the components and properties of the formulation. In the list format, the properties of the macromolecule formulation are displayed in tabular format.

The macromolecule formulation manager dialog window 16600 also includes a new command button 16604. Clicking on the new command button 16604 opens or launches a macromolecule formulation builder. An example of a macromolecule formulation builder formed in accordance with this invention is described below. This action is shown by steps 16708 and 16710 of FIG. 167. A macromolecule formulation is deleted from the database by first selecting a macromolecule formulation to be deleted from the list box 16600 by, for example, highlighting the macromolecule formulation. Thereafter, clicking on a delete command button 16600 opens a confirm dialog box (not shown). Clicking on the yes command button in the confirm dialog box results in the macromolecule formulation being deleted from the database. This action is represented by steps 16712, 16714, 16716, and 16718, of FIG. 167.

Clicking on a help command button 16608 opens the help files. This action is represented by steps 16720 and 16722 of FIG. 167. Clicking on a close command button 16610 closes the macromolecule formulation dialog window 16610, and returns the user to the main menu dialog window (FIG. 2). This action is shown by as steps 16724 and of FIG. 167.

Macromolecule Formulation Manager: New Macromolecule Formulation Builder

FIG. 168 illustrates a macromolecule formulation builder dialog window 16800 formed according to the present invention. FIGS. 169 and 170 form a corresponding functional flow diagram.

The macromolecule formulation builder dialog window 16800 displays all of the available solutions and macromolecules in the database. The solutions are listed under a solutions tab (not shown) and the macromolecules are listed under a macromolecules tab. When the solutions tab is enabled, the solutions appear in a solution list box. The list box can be toggled between list and tree formats by clicking on a toggle command button. To enter a solution in the formulation, the solution type is selected by clicking on the appropriate radio button. The solution types are: additive, formulation, heavy item, buffer solution, stock solution. A solution is added to the formulation by double clicking on the solution in the solution list box. This action is shown by steps 16902, 16904, and 16906 of FIG. 169.

Only one solution is allowed per formulation. The solution appears in a solution field box 16801 shown on the right side of the macromolecule formulation builder dialog window 16800. If the solution is not in the database, a new solution can be created without exiting the macromolecule formulation builder dialog window by clicking on an add new solution command button (not viewable in FIG. 168). Clicking on the add new solution command button launches the previously described solution builder. This action is shown by steps 16908 and 16910 of FIG. 169.

A macromolecule is added to the formulation by clicking on the macromolecules tab 16802, using a cursor control device to position a pointer over the desired molecule and dragging the desired macromolecule from a macromolecule list box 16804 to a molecule list box 16806. When a macromolecule is released into the molecule list box 16806, a concentration builder dialog window (not shown, but previously described) appears. The concentration builder dialog window includes a concentration field box. Concentration is entered into the concentration field box in the same way other data is entered. The concentration field units identified in a concentration units field box are changed by clicking on a down arrow button located alongside the concentration units field box. Clicking on the down arrow button opens a drop-down list of available concentration units. Clicking on a selection enters the selection into the units field box and closes the drop-down list. The concentration builder dialog window also includes okay and cancel command buttons. Clicking on the okay command button enters the concentration and the molecule in the molecule list box. Clicking on the cancel command button cancels the concentration and does not enter the molecule in the molecule list box. Clicking on either the okay or the cancel command buttons closes the concentration dialog box and returns the user to the macromolecule formulation builder dialog window 16800. The foregoing procedure for adding macromolecules to the molecule list box is represented by steps 16912, 16914, 16916, and 16918 of FIG. 169.

Any number of macromolecules can be added to the molecule list box but only one solution is permissible. If the macromolecule is not available in the database, a new macromolecule is created by clicking on the new macromolecule command button 16808, which launches the macromolecule builder without closing the macromolecule formulation builder dialog window 16800. This action is shown by steps 16920 and 16922 of FIG. 169. A preparation date is entered in a date field box 16810 by clicking on a down arrow button 16812 located alongside the date field box 16810. Clicking on the down arrow button 16812 opens a calendar. Clicking on a date enters the date into the date field box 16810 and closes the calendar. This action is represented by steps 16924 and 16926 of FIG. 169. Storage temperature is entered in temperature field box 16814 in the same way other data is entered. This action is shown by step 16928 of FIG. 169. Temperature units are changed by clicking on a down arrow button 16818 located alongside a temperature units field box 16816. Clicking on the down arrow button 16818 opens a drop-down list of available temperature units. Clicking on a selection enters the selection in the temperature units field box 16816 and closes the drop-down list.

A preparator is entered in a preparator field box 16820 by clicking on a down arrow button 16822 located adjacent to the preparator field box. Clicking on the down arrow button opens a drop-down list of all available users. Clicking on a selection enters the selection in the preparator field box 16820 and closes the list. This action is shown as steps 17000 and 17002 of FIG. 170.

A formulation name is entered in a name field box 16824 in the same way other data is entered. This action is shown by step 17004 of FIG. 170. Macromolecule formulations can also accept attachments. Attachments are added by dragging and dropping a file from a file manager, such as Microsoft's Windows Explorer, to a paperclip icon box 16825 located in the macromolecule formulation builder dialog window 16800. Comments are entered in a comment field box 16827 in the same way other data is entered. This action is shown by step 17006 of FIG. 170. Clicking on a save command button 16828 saves the macromolecule formulation in the database, closes the macromolecule formulation builder dialog window and returns the user to the macromolecule formulation manager dialog window 16600 as shown in FIG. 166. This action is represented by steps 17008, 17010, and 17012 of FIG. 170. Clicking on a cancel command button 16828 closes the macromolecule formulation builder dialog window and returns the user to the macromolecule formulation manager dialog window without saving the macromolecule formulation. This action is shown by steps 17014, 17016, and 17018 of FIG. 170. Clicking on a help command button 16830 opens the help files. This action is shown by steps 17020 and 17022 of FIG. 170.

Complex Macromolecule Formulation Manager

Preferred embodiments of the invention include a complex macromolecule formulation manager for use in creating complex macromolecule formulations by mixing two or more of all the available solutions in the database, including macromolecule formulations and other complex macromolecule formulations.

FIG. 171 is a generalized functional flow diagram of a complex macromolecule formulation manager according to the present invention. When opened or launched, the complex macromolecule formulation manager opens a dialog window (step 17102). A new complex macromolecule formulation can be created (step 17104) or an existing complex macromolecule formulation can be deleted from the database (step 17106). If a new complex macromolecule formulation is to be created, a complex macromolecule formulation builder is launched (step 17108). The complex macromolecule formulation builder allows a user to: add solutions to the complex formulation (step 17110) or enter properties for the complex formulation (step 17112). The new complex formulation can be saved to the database (step 17114).

FIG. 172 illustrates a complex macromolecule formulation manager dialog window 17200 according to the present invention and FIG. 173 is a corresponding functional flow diagram. The complex macromolecule formulation manager dialog window 17200 includes a list box 17201 for displaying all of the complex formulations in the database. The formulations can be displayed in tree or list format. When in tree format, in a conventional manner, clicking on a plus button expands the formulation to show all of the components of the formulation. The initial display is represented by step 17302 of FIG. 173. Toggling between a tree format and a list format is controlled by clicking on a toggle view command button 17202. This action is represented by steps 17304 and 17306 of FIG. 173. The complex macromolecule formulation manager dialog window 17200 also includes a usage list box 17204. Clicking on a complex macromolecule formulation in the formulation list box 17200 displays the projects in which the particular formulation is used in the usage list box 17204. The complex macromolecule formulation manager dialog window 17200 also includes a new command button 17206. Clicking on the new command button 17206 opens or launches a complex macromolecule formulation builder. An example of a complex macromolecule formulation builder formed in accordance with this invention is described below. This action is shown by steps 17308 and 17310 in FIG. 173.

The complex macromolecule formulation manager dialog window 17200 also includes a delete command button 17208. A complex macromolecule formulation is deleted from the database by first selecting the formulation to be deleted from the formulation list box 17201 by, for example, highlighting the formulation. Then, clicking on the delete command button 17208 opens a warning dialog box (not shown) which prompts the user to confirm the decision to delete. A suitable warning dialog box formed in accordance with the present invention would have okay and cancel (or yes and no) command buttons. Clicking on the okay command button results in the selected complex macromolecule formulation being deleted from the database. Otherwise, clicking on the cancel command button cancels the delete operation. Clicking on either the okay or the cancel command buttons returns the user to the complex macromolecule formulation manager dialog window 17200. The deletion operation is represented by steps 17312, 17314, 17316, and 17318 of FIG. 173. Clicking on a help command button 17210 opens the help files. This action is shown by steps 17320 and 17322 of FIG. 173. Clicking on a close command button 17212 closes the complex macromolecule formulation manager dialog window and returns the user to the main manager dialog window (FIG. 2). This action is shown by steps 17324 and 17326 of FIG. 173.

Complex Macromolecule Formulation Manager: New Complex Macromolecule Formulation FIG. 174 illustrates a complex macromolecule formulation builder dialog window 17400 according to the present invention and FIGS. 176–178 form a corresponding functional flow diagram.

The complex macromolecule formulation builder dialog window 17400 has a solutions tab 17401 and a properties tab 17402. When the solutions tab 17401 is enabled, the solution categories are listed. Clicking on a radio button 17404 located alongside a desired solution category displays all of the solutions in the database belonging to that category. The solutions are shown in a solution list box 17406. The solutions can be displayed in tree or list format. When in tree format, in a conventional manner, clicking on a plus command button expands the solution to show all of the components of the solution. Clicking on a toggle command button 17408 toggles the solution list from tree format to list format. The list format displays solution properties in tabular form.

A solution is added by first selecting a solution category. This action is shown by steps 17602 and 17604 of FIG. 176. As noted above, all solutions belonging to the selected category are displayed in the solution list box 17406, as shown by step 17606 of FIG. 176. Double clicking on a solution icon opens or launches a solution volume builder (not shown). A suitable solution volume builder, according to the present invention, is illustrated in FIGS. 19 and 20. As previously described, the solution volume builder includes a volume field box into which data is entered. Volume units are changed by clicking on a down arrow button located alongside a volume units field box. Clicking on the down arrow button opens a drop-down list of all available volume units. Clicking on a selection enters the selection in the volume units field and closes the drop-down list. The volume builder dialog window also includes an okay command button and a cancel command button. Clicking on the okay command button enters the volume and the solution into the final complex macromolecule formulation list box, closes the solution volume dialog window, and returns the user to the complex macromolecule formulation builder dialog window 17400 (FIG. 174). Clicking on the cancel command button of the solution volume builder does not enter the solution in the final complex macromolecule formulation list box, but closes the solution volume builder and returns the user to the complex macromolecule formulation builder dialog window 17400. This sequence of steps for entering a solution into the formulation solution list box 17406 is represented by steps 17608, 17610, and 17612 of FIG. 176.

If a solution does not exist in the database, a new solution is created by clicking on an add new solution command button 17410. Clicking on the add new solution command button 17410 opens or launches the solution builder. A suitable solution builder according to the present invention is illustrated in FIGS. 73 and 74 and was previously described. This action is represented by steps 17614 and 17616 of FIG. 176. After having added the desired ones of available solutions to create a new complex macromolecule formulation, the properties tab 17402 is clicked on to allow a user to enter the attributes for the complex macromolecule formulation. When the properties tab is enabled, the complex macromolecule formulation builder dialog window 17500 takes the form shown in FIG. 175.

The timestamp of the complex formulation is entered by clicking on a down arrow 17508 located adjacent to a time stamp field box 17501. Clicking on this down arrow opens a calendar. Clicking on a date enters the date into the timestamp field box 17501 and closes the calendar. This action is shown by steps 17618 and 17620 of FIG. 176. Storage temperature is entered into a storage temperature field box 17502 in the same way other data is entered using a keyboard or other suitable data entry device. This action is shown by step 17622 of FIG. 176. Temperature units are changed by clicking on a down arrow button 17510 located alongside a temperature units/field box 17504. Clicking on the down arrow button 17510 opens a drop-down list of available temperature units. Clicking on a selection enters the selection in the temperature units field box 17504 and closes the drop-down list. This action is shown by steps 17624 and 17626 of FIG. 176. The name of the preparator is changed by clicking on a down arrow button 17512 located alongside the preparator field box 17506. Clicking on the down arrow button 17512 opens a drop-down list of all available preparators (users). Clicking on a selection enters the selection in the preparator field box 17506 and closes the drop-down list. This action is represented by steps 17628 and 17630 of FIG. 176. A final pH value is entered in a final pH field box 17520 the same way other data is entered. This action is shown by step 17632. In the same way, the conductivity is entered in a conductivity field box 17522. This action is shown by step 17634 of FIG. 176. Conductivity units are changed by clicking on a down arrow button 17514 located alongside a conductivity units field box 17528. Clicking on the down arrow button 17514 opens a drop-down list of available conductivity units. Clicking on a selection enters the selection in the units field box 17528 and closes the drop-down list. This action is shown by steps 17700 and 17702 of FIG. 177. Vapor pressure osmolality is entered in an osmolality field box 17524 the same way other data is entered. This action is shown by step 17004 of FIG. 177. Osmolality units are changed by clicking on a down arrow button 17516 located alongside an osmolality units field box 15730. Clicking on the down arrow button 17516 opens a drop-down list of available osmolality units. Clicking on a selection enters the selection into the units field box 17530 and closes the drop-down list. This action is shown by steps 17706 and 17708 of FIG. 177.

A solvent is entered by clicking on a down arrow button 17518 located alongside a solvent field box 17526. Clicking on the down arrow button 17518 opens a drop-down list of all available solvents. Clicking on a selection enters the selection into the solvent field box 17526 and closes the drop-down list. This action is shown by steps 17710 and 17712 of FIG. 177. A unique solution name is entered in a solution name field box 17534 the same way other data is entered. This action is represented by step 17714 of FIG. 177. High or low viscosity is specified by clicking on the appropriate radio button 17536. This action is shown by steps 17716 and 17718 of FIG. 177. If desired, comments are entered in comment field box 17538 the same way other data is entered. This action is shown by step 17720 of FIG. 177.

Clicking on a save command button 17540 saves the complex formulation in the database, closes the complex formulation builder and returns the user to the complex macromolecule formulation manager dialog window shown in FIG. 172. This action is represented by steps 17800, 17802, and 17804 of FIG. 178. Clicking on a cancel command button 17542 cancels the new complex macromolecule formulation, closes the complex macromolecule formulation builder dialog window and returns the user to the complex macromolecule formulation manager dialog window 17200. This action is represented by steps 17806, 17808, and 17810 of FIG. 178. Clicking on the help command button 17544 opens the help files. This action is shown by steps 17812 and 17814 of FIG. 178.

Manufacturer Manager

Preferred embodiments of this invention include a manufacturer manager for organizing and creating a list of the manufacturers of all of the objects in the database, such as chemicals and crystallization apparatuses. FIG. 179 is a generalized functional flow diagram of an apparatus manager formed according to the present invention. When the manufacturer manager is launched or opened, a list of all the manufacturers in the database is displayed (step 17902). Data on new manufacturers can be added to the database (step 17904), data on an existing manufacturer can be updated (step 17906), an existing manufacturer can be deleted from the database (step 17908), or a manufacturer can be linked to a collaborator table (17910). Adding a new manufacturer or updating an existing manufacturer launches a manufacturer builder (step 17914). The manufacturer builders, allow a user to enter manufacturer data (step 17916). The user entered manufacturer data can be saved (step 17918).

FIG. 180 illustrates a manufacturer manager dialog window 18000 formed in accordance with the present invention and FIG. 181 is a corresponding functional flow diagram.

The manufacturer manager dialog window 18000 includes a list box 18001 that lists all of the manufacturers in the database. The list box 18001 includes manufacturer attributes in tabular format. The list box 18001 may include a horizontal and a vertical scroll bar. Displaying the manufacturer list is illustrated as step 18102 of FIG. 181. A new manufacturer is added by clicking on a new command button 18002. Clicking on the new command button 18002 opens or launches the new manufacturer builder. An example of a new manufacturer builder formed in accordance with this invention is described below. This action is shown by steps 18104 and 18106 of FIG. 181. Manufacturer properties are updated by clicking on a update command button 18004. Clicking on the update command button 18004 launches an update manufacturer builder. An example of an update manufacturer builder formed in accordance with this invention is described below. This action is shown by steps 18108, 18110 and 18112 of FIG. 181. A manufacturer is deleted by first selecting a manufacturer from the manufacturer list box 18001. Clicking on the delete command button 18006 opens a warning message box. (not shown). A suitable message box according to the present invention will warn the user that he or she is about to delete a manufacturer from the database. A warning dialog box can also include OK or yes and cancel or no command buttons. Clicking on the yes command button of the warning dialog box deletes the manufacturer from the database, closes the warning dialog box and returns the user to the manufacturer manager dialog window 18000. Clicking on the cancel command button in the warning message box cancels the deletion operation, closes the warning message box and returns the user to the manufacturer manager dialog window 18000. This action is represented by steps 18114, 18116, 18118, and 18120 of FIG. 181. A manufacturer is linked to a collaborator table by clicking on an add to collaborator command button 18008 after the manufacturer is selected. This action is illustrated by steps 18122, 18124 and 18126 of FIG. 181.

Clicking on a help command button 18010 opens the help files. This action is shown by steps 18128 and 18130 of FIG. 181. Clicking on a close command button 18012 closes the manufacturer manager dialog window. This action is shown by steps 18132 and 18134 of FIG. 181.

Manufacturer Manager: Update Manufacturer

FIG. 182 illustrates an update manufacturer builder formed according to the present invention, and FIGS. 185 and 186 form a corresponding functional flow diagram.

When updating manufacturer properties, the previously entered data appears in the hereinafter described field boxes. Therefore, only those fields which are outdated need to be changed. The remaining fields can be left in their current state. Referring to FIG. 182, the user is first prompted to change the name of the manufacturer. To change names, the new name of the manufacturer is entered into a manufacturer field box 18200. This action is shown by steps 18502 and 18504 of FIG. 185. To change the manufacturer's phone number, the manufacturer's new phone number is entered into a phone field box 18202. This action is shown by steps 18506 and 18508 of FIG. 185. The manufacturer's street is changed by entering a new street in a street field box 18204. This is shown by steps 18510 and 18512. The manufacturer's city is changed by entering a new city in a city field box 18206. This action is shown by steps 18514 and 18516 of FIG. 185. The manufacturer's state is changed by entering a new state in a state field box 18208. This action is shown by steps 18518 and 18520 of FIG. 185. The manufacturer's zip code is changed by entering a new zip code in a zip code field box 18210. This action is shown by steps 18522 and 18524 of FIG. 185. The manufacturer's country is changed by entering a new country in a country field box 18212. This action is shown as steps 18526 and 18528 of FIG. 185. The manufacturer's email address is changed by entering a new e-mail address in an e-mail field box 18214. This action is shown by steps 18530 and 18532 of FIG. 185. The manufacturer's HTTP address is changed by entering a new HTTP address in an HTTP address field box 18218. This action is shown by steps 18534 and 18536 of FIG. 185. The manufacturer's fax number is changed by entering a new fax number in a fax number field box 18220. This action is shown as steps 18538 and 18540 in FIG. 185. A manufacturer's department is changed by entering a new department in a department field box 18222. This action is shown by steps 18600 and 18602 of FIG. 186. In general, some fields can be left blank if no information is available. If a user wishes to connect to a manufacturer's Web site, the user clicks on a connect command button 18216, which results in a browser, such as Microsoft's Internet Explorer opening. This is shown by steps 18604 and 18606 of FIG. 186. If all of the data is acceptable to the user, the user can click on the OK command button 18224 which results in the updated manufacturer data being saved. Clicking on the OK command button 18224 also closes the update manufacturer builder dialog window and returns the user to the manufacturer manager dialog window 18000 shown in FIG. 180. This action is represented by steps 18608, 18610, and 18612 of FIG. 186. Clicking on a cancel command button 18226 cancels the updated manufacturer data, closes the update manufacturer window and returns the user to the manufacturer manager dialog window 18000 (FIG. 180). This action is shown by steps 18614, 18616, and 18618 of FIG. 186.

Manufacturer Manager: New Manufacturer

As noted above, clicking on the new command button 18002 in the manufacturer manager dialog window 18000 (FIG. 180), opens a new manufacturer builder. A functional flow diagram of a new manufacturer builder formed in accordance with this invention is shown in FIGS. 183 and 184. A suitable new manufacturer builder dialog window is the same as the update manufacturer builder dialog window shown in FIG. 182 except that it does not contain any existing data since none has been previously entered. Entry of data into the fields for the new manufacturer is not described in detail since it is the same as entering update manufacturer data, which has been described above and shown in FIGS. 183 and 184.

Collaborator Manager

Preferred embodiments of this invention include a collaborator manager for assisting in organizing and creating a list of collaborators.

FIG. 187 is a generic functional flow diagram of a collaborator manager formed in accordance with the present invention. When the collaborator manager is opened a list of all of the collaborators in the database is displayed (step 18702). A new collaborator can be added to the database (step 18704), collaborator attributes can be updated (step 18706), an existing collaborator can be deleted from the database (step 18708) or a collaborator can be linked to a manufacturer (step 18710). Both the step of adding a new collaborator and the step of updating an existing collaborator launch a collaborator builder (step 18714). The collaborator builders allow a user to enter collaborator data (step 18716), which can be saved (step 18718).

Since a collaborator manager dialog window formed in accordance with the present invention would be similar to the manufacturer manager dialog window shown in FIG.

180 one is not illustrated. However, a functional flow diagram of a collaborator manager formed in accordance with the present invention is shown in FIG. 188. A suitable collaborator manager dialog window would include a list box showing all of the collaborators in the database. Preferably, the collaborators would be displayed in table format with a listing of the collaborator attributes in tabular form. This action is shown by step 18802 of FIG. 188. The collaborator manager dialog window would also include a new command button for adding new collaborators to the database. Clicking on the new collaborator button calls or launches a new collaborator builder. This action is shown by steps 18804 and 18806 of FIG. 188. The collaborator manager dialog window also includes an update command button. Clicking on the update command button would open or launch an update collaborator builder. This action is shown as steps 18808, 18810 and 18812 of FIG. 188.

The collaborator manager dialog window would also include a delete command button. As with prior examples, a collaborator would be deleted from the database by first selecting a collaborator from the collaborator list box and then clicking on the delete command button. A warning message box would appear to prompt the user whether he or she wishes to continue with the delete operation. The warning message box would include OK or yes command and cancel or no command buttons. Clicking on the yes command button would close the warning message box, delete the collaborator from the database and return the user to the collaborator manager dialog window. Clicking on the no command button in the warning message box would cancel the delete operation, close the warning message dialog box and return the user to the collaborator manager dialog window. The delete operation is shown in steps 18814, 18816, 18818 and 18820 of FIG. 188.

The collaborator manager dialog window would include a command button for linking a collaborator to a manufacturer. This action is shown by steps 18822, 18824 and 18826 of FIG. 188. The collaborator manager dialog window would also include a help command button. Clicking on the help command button would open the help files. This action is shown by steps 18828 and 18830 of FIG. 188. The collaborator manager dialog window would also include a close command button. Clicking on the close command button would close the collaborator manager and return the user to the main menu dialog window (FIG. 2). This action is shown by steps 18832 and 18834 of FIG. 188.

Collaborator Manager: New Collaborator Builder

FIG. 189 is a functional flow diagram for a new collaborator builder formed according to the present invention. A new collaborator builder dialog window for accessing the functions shown in FIG. 189 and described below would be similar to the update manufacturer dialog window 18200 shown in FIG. 182. The new collaborator builder dialog window would have field boxes for entering collaborator attributes. This would include a collaborator name field for receiving a collaborator's name. This entry is represented by step 18902 of FIG. 189. The fields would also include a collaborator phone field (step 18904), a collaborator street field (step 18906), a collaborator city field (step 18908), a collaborator state field (step 18910), a collaborator zip code field (step 18912), a collaborator country field (step 18914), a collaborator e-mail address field (step 18916), a collaborator HTTP address field (step 18918), a collaborator fax number field (step 18920), and a collaborator department field (step 18922). The new collaborator builder dialog window would have a connect command button. Clicking on the connect command button would open an Internet browser, and connect the user to the collaborator, provided that the user is connected to the Internet. The new collaborator builder dialog window would have an OK command button. Clicking on the OK command button would save the new collaborator data in the database, close the new collaborator builder dialog window and return the user to the collaborator manager. This action is shown by steps 18928, 18930 and 18932 of FIG. 189. The new collaborator builder dialog window would have a cancel command button. Clicking on the cancel command button would cancel the new collaborator builder, close the new collaborator builder dialog window and return the user to the collaborator manager dialog window.

Collaborator Manager: Update Collaborator Builder

FIG. 190 is a functional flow diagram for an update collaborator builder formed according to the present invention. A suitable update collaborator builder dialog window would be similar to the update manager dialog window 18200 shown in FIG. 182. When opening the update collaborator dialog window, the field boxes would be filled with the previously entered collaborator data. Only the field requiring updating would be changed, the remaining fields being left with their present data.

Project Manager

Preferred embodiments of the present invention also include a project manager for use in organizing and creating projects in the database. FIG. 191 is a generalized functional flow diagram of a project manager formed in accordance with the present invention. When the project manager is opened or launched a list of all the projects in the database is displayed (step 19102). Depending on a user's desires, new projects can be created (step 19104), existing projects can be updated (step 19106), existing projects can be deleted (step 19108), or trials can be opened (step 19110). If a new project is to be created, or an existing project is to be updated, the project manager launches a project builder (step 19114), which can be saved (step 19118).

FIG. 192 illustrates a project manager dialog window 19200 according to the present invention, and FIG. 193 is a corresponding functional flow diagram.

The project manager dialog window 19200 includes a project list box 19201 that lists all of the projects available in the database. The project manager dialog window also includes a usage list box 19212 that lists all of the trials associated with a project. These displays are represented by step 19302 of FIG. 193. The project manager dialog window also includes a new command button 19202. Clicking on the new command button 19202 opens or launches a new project builder. An example of a new project builder formed in accordance with this invention is described below. This action is shown as steps 19304 and 19306 of FIG. 193. The project manager dialog window also includes an update command button 19204. An existing project is updated by first selecting a project from the project list box 19201, and, then, clicking on the update command button 19204. Clicking on the update command button 19204 opens an update project builder. An example of an update project builder formed in accordance with this invention is described below. This action is shown by steps 19308, 19310 and 19312 of FIG. 193.

The project manager dialog window also includes a delete command button 19206. A project is deleted from the database by first selecting a project in the project list box 19201. Clicking on the delete command button 19206 opens a warning message box (not shown) warning the user that he or she is about to delete a project from the database. The warning message box includes a yes or OK command button and a No or cancel command button. Clicking on the yes command button closes the warning message box, deletes the project from the database, and returns the user to the project manager dialog window 19200. Clicking on the cancel command button in the warning message box cancels the delete operation, closes the warning message box and returns the user to the project manager dialog window 19200. The delete operation is shown by steps 19314, 19316, 19318 and 19320 of FIG. 193.

The project manager dialog window also includes a help command button 19208. Clicking on the help command button 19208 opens the help files. This action is shown by steps 19322 and 19324 of FIG. 193. The project manager dialog window also includes a close command button 19210. Clicking on the close command button 19208 closes the project manager and returns the user to the main menu dialog window (FIG. 2). This action is shown by steps 19332 and 19334 of FIG. 193. Any trials associated with a selected project can be opened by selecting the trial in the usage list box 19212. Clicking on an open select trials command button 19214 opens the existing trial dialog window shown in FIG. 45 and previously described. This action is shown by steps 19326, 19328 and 19330 of FIG. 193.

Project Manager: New Project

FIG. 195 is a functional flow diagram of a new project builder formed according to the present invention. While not shown, the new project builder includes a new project builder dialog window. The new project builder would include a field box for entering the project name. This action is shown by step 19402 of FIG. 194. The project manager dialog window would also include a field box for entering comments. This action is shown by step 19404 of FIG. 194. The new project builder dialog window would also include an OK command button. Clicking on the OK command button saves the new project in the database, closes the new project builder dialog window and returns the user to the project manager dialog window 19200 (FIG. 192). This action is shown by steps 19406, 19408, and 19410 of FIG. 194. The new project builder dialog window would also include a cancel command button. Clicking on the cancel command button cancels the new project, closes the new project builder dialog window, and returns the user to the project manager dialog window 19200. This action is shown by steps 19412, 19414, and 19416 of FIG. 194.

Project Manager: Update Project

FIG. 195 is the functional flow diagram of an update project builder formed according to the present invention. While not shown, the update project builder includes an update project builder dialog window similar to the new project builder dialog window, i.e., a dialog window having a project name and comment field boxes and OK and cancel command buttons, the difference being that project attributes appear in the field boxes. Because a user need only enter data in fields which need to be updated. Fields that do not need to be changed can be skipped. Since the update project builder and the new project builder are substantially the same, the update project builder is not further described.

User Manager

Preferred embodiments of the invention also include a user manager for use in creating new database user accounts. Preferably, only administration level users will have access to the user manager. FIG. 196 is a generic functional flow diagram of a user manager formed according to the present invention. When the user manager is launched or opened a list of all the users in the database is displayed (step 19602).

New users can be added to the database (step 19604), information on existing users can be updated (step 19606) or users can be deleted from the database (step 19608). If a new user is to be added, a new user or information on an existing user is to be updated, a user builder is launched (step 19612). The user builders allow a user to enter data (step 19614), which can be saved (step 19616).

FIG. 197 illustrates a user manager dialog window 19700 formed in accordance with the present invention and FIG. 198 is a corresponding functional flow diagram. The user manager dialog window 19700 includes a user list but 19701 that lists all of the users currently available in the database dialog window. This action is shown by step 19802 of FIG. 198. The user manager dialog window also includes a new command button 19702. Clicking on the new command button 19702 opens or launches a new user builder. An example of a new user builder formed in accordance with this invention is described below. This action is shown by steps 19804 and 19806 of FIG. 198. The user manager dialog window includes an update command button 19704. An existing user is updated by selecting a user in the user list box 19700 and, then, clicking on the update command button 19704, which opens or launches an update user builder. An example of an update user builder formed in accordance with this invention is described below. This action is shown by steps 19808, 19810, and 19812 of FIG. 198.

The user manager dialog window also includes a delete command button 19706. An existing user is deleted from the database by first selecting a user from the user list box 19701. Thereafter, clicking on the delete command button 19706 opens a warning dialog box (not shown) prompting the user to reconsider whether the user wants to continue with the delete operation. The warning message box includes an OK or yes command button and a no or cancel command button. Clicking on the yes command button deletes the user from the database, closes the message warning box and returns the user to the user manager dialog window 19700 (FIG. 197). Clicking on the no command button in the warning message box cancels the delete operation, closes the warning message box and returns the user to the user manager dialog window 19700. This action is shown by steps 19814, 19816, 19818 and 19820 of FIG. 198. The user manager dialog window also includes a help command button 19708. Clicking on the help command button opens the help files. This action is shown by steps 19822 and 19824 of FIG. 198. The user manager dialog window also includes a close command button 19710. Clicking on the close command button 19710 closes the user manager dialog window and returns the user to the main manager dialog window (FIG. 2). This action is shown by steps 19826 and 19828 of FIG. 198.

User Manager: New User

FIG. 199 shows a new user builder dialog window 19900 formed according to the present invention and FIG. 200 is a corresponding functional flow diagram. The new user builder dialog window includes a role box 19901. Located within the role box are four choices represented by four radio buttons. The four choices are restricted 19902, user 19904, power user 19906, and administrator 19908. Administrative users can create any database entry, and have access to all crystallization trials. Power users can create any database entry except new users. Power users have access to all crystallization trials except those created by administrative level users. Users can create any database entry except for new users. Users have access to only their own crystallization trials. Restricted users cannot create new users.

Restricted users cannot create or observe any crystallization trials. Restricted users can, however, create things like new solutions, matrices, and macromolecules.

A role is chosen by clicking on the associated radio button. Only one role choice is allowed. This action is represented by steps 20002–20008 of FIG. 200. The new user's name is entered in a name field box 19910 the same way other data is entered, as previously described. This action is shown by step 20010 of FIG. 200. In the same way, a new user's password is entered in a password field box 19912. This action is shown by step 20012 of FIG. 200. The new user builder dialog window 19900 also includes an OK command button 19914. Clicking on the OK command button 19914 saves the new user's name and password settings to the database, closes the new user dialog window and returns the user to the user manager dialog window 19700 (FIG. 197). This action is shown by steps 20014, 20016 and 20018 of FIG. 200. The new user dialog window also includes a cancel command button 19916. Clicking on the cancel command button 19916 cancels the new user settings without their being entered in the database, closes the new user dialog window and returns the user to the user manager dialog window 19700. This action is shown by steps 20020, 20022 and 20024 of FIG. 200.

User Manager: Update User

FIG. 201 is a functional flow diagram of an update user builder formed according to the present invention. The update user builder includes an update user builder dialog window (not shown) that is similar to the new user builder dialog window shown in FIG. 199. The update user builder is substantially the same as the new user builder, except that the update user builder does not allow the name field to be changed.

The update user dialog window would include four radio buttons for selecting the user's role labeled restricted, user, power user, or administrator.

The update user dialog window includes a password field box. If the user decides to change the password, the user can enter a new password in the password field. The update user dialog window also includes an OK command button and a cancel command button. These buttons operate in a fashion similar to the same named command buttons of the new user dialog window 19900.

Crystal Query

Preferred embodiments of the invention also include a crystal query for use in retrieving crystallization conditions from open trial observation sessions containing crystallization results selected by the user. To start a crystal query, the trial observation sessions desired to be examined are opened. If desired, multiple trial observations sessions from multiple trials can be opened simultaneously and displayed.

FIG. 202 is a generalized functional flow diagram of a crystal query formed according to the present invention. After the crystal query is opened (step 20202), crystallization search parameters are entered (step 20204), the query is run (step 20206) and the results are displayed (step 20208). If desired, the results can be plotted (step 20210), columns resized (step 20212), and the results saved in HTML format (step 20214). The results can be viewed using a browser (step 20216).

FIG. 203 illustrates a crystal query dialog window 20300 formed in accordance with the present invention and FIGS. 204 through 206 form a corresponding functional flow diagram.

The crystal query dialog window 20300 includes a list box 20301 that displays query results. Located on one side, e.g., the left side, of the crystal query dialog window are categories of crystallization results to be queried. Categories of crystal results include types, shapes, sizes, miscellaneous, and user defined. Checkboxes 20302 are used to select the type of crystallization results to be queried. Alongside each checkbox is a label to define the crystallization result. Under the category types are spherulite, phase separation, skin, precipitate, microcrystal. Under the category shapes are needle, plate, pyramid, block, hexagon, leaf, urchin, rod. Under the category sizes are tiny, small, medium, and big. Under the category miscellaneous are twin, clear, and image. There are three user-defined labels. This selection of crystallization parameters are represented by steps 20404 through 20442 of FIG. 204, steps 20500 through 20534 of FIG. 205, and steps 20600 through 20602 of FIG. 206. All boxes that are checked are included in crystallization results query.

Clicking a query command button 20306 calls the query subroutine and displays the results in a list box 20301. This action is shown by steps 20604, 20606 and 20608 of FIG. 206. A plot is drawn by clicking on a draw plot command button 20304. Clicking on the draw plot command button calls a plot subroutine and displays the plot. This action is represented by steps 20610, 20612, and 20614 of FIG. 206. The columns of the results display are resized by clicking on an auto resize command button 20308. Clicking on the auto resize command button 20308 calls an auto resize subroutine which resizes the columns. This action is represented by steps 20616, 20618, and 20620 of FIG. 206. The auto size command button toggles between auto resize and fixed resize. The program returns to fixed size columns by clicking on a fixed resize command button 20308. Clicking on the fixed resize command button 20308 resizes the columns to a fixed location. This action is represented by steps 20622, 20624, and 20626 of FIG. 206.

Results are exported by clicking on an export to HTML command button 20310. Clicking on the export to HTML command button 20310 opens a "save as" dialog window which allows a user to scroll through the save directories. This action is represented by steps 20628 and 20630 of FIG. 206. Clicking on a view in browser command button 20312 opens a browser, such as Microsoft's Internet Explorer. This action is shown by steps 20632 and 20634 of FIG. 206. The crystal query dialog window 20300 also includes a close command button 20314. Clicking on the close command button 20314 closes the crystal query and returns a user to the main manager dialog window (FIG. 206). This action is shown by steps 20636 and 20638 of FIG. 206. Clicking on a help command button 20316 opens the help files. This action is shown by steps 20640 and 20642 of FIG. 206.

Superquery

Preferred embodiments of the invention will also include a superquery. Superquery is a user-friendly process for executing structured query language (SQL) queries that is designed to allow a database formed in accordance with the present invention to be searched by users without any knowledge of SQL syntax. FIG. 207 is a generalized functional flow diagram of a superquery formed according to the present invention. When launched, a superquery dialog window is displayed (step 20702). Thereafter, a specific query can be entered (step 20704), run (step 20706) and the results are displayed (step 20708).

FIG. 208 shows a superquery dialog window 20800 formed in accordance with the present invention and FIG. 209 is a corresponding functional flow diagram.

The superquery dialog window 20800 includes a list box 20801 that displays the results of a superquery. This action is shown by step 20902 of FIG. 209. Parameters defined by the query language are entered in query fields 20802, 20804. In this example, the entire database is to be searched for the crystallization trial conditions using catalog number 81268 and CAS number 25322-68-3. This action is shown by step 20904 of FIG. 209. The superquery dialog window 20800 includes a query command button 20806. Clicking on the query command button 20806 causes the query to run. Running the query results in the database being searched and the results of the search being displayed in the list box 20801. This action is shown by steps 20906, 20908, and 20910 of FIG. 209. The superquery is closed by clicking on an OK command button 20808, which returns the user to the main manager dialog window (FIG. 2). This action is shown by steps 20912 and 20914 of FIG. 209. The superquery dialog window also includes a cancel command button 20810. Clicking on the cancel command button 20810 also closes the superquery dialog window and returns the user to the main manager dialog window (FIG. 2). This action is shown by steps 20916 and 20918 of FIG. 209.

Database Object Manager

Preferred embodiments of the invention also include a database object manager that contains all of the base tables of all the object entries. FIG. 210 is an upper level functional flow diagram of a database object manager according to the present invention. When the database object manager is launched, the broad categories of the database objects are displayed (step 21002). There are three broad categories of database objects. The first category is base objects, the second category is chemicals and the third category is solutions. A user can open: base objects to reveal further categories (steps 21004 and 21006); chemicals to reveal further categories (steps 21008 and 21010); and solutions to reveal further categories (steps 21012 and 21014). Entering an SQL query string sets up querying a selected category (step 21016) which can be executed (21018). Extending the query results in the database being searched and the results being displayed (steps 21020 and 21022, respectively). A user can call up help documentation (steps 21024 and 21026).

FIG. 211 illustrates a database object manager dialog window formed in accordance with the present invention and FIGS. 212–216 form a corresponding functional flow diagram. One side, e.g., the left side, of the database object manager dialog window includes a database objects 21201 that displays the database objects. The other side, i.e., the right side of the database object manager dialog window 31100 is a components list box 21202. The database object manager dialog window also includes an execute SQL query command button 21102 and a help command button 21104. The database objects box includes the three broad categories of objects—base objects 21106, chemical 21108 and solutions 21110. The chemical category is shown expanded which occurred as a result of clicking on a plus button, which turned to a minus button 21112 as a result of the expansion. Expansion caused the subcategories of chemicals to be displayed. Clicking on a subcategory results in the components of the subcategory being displayed in the components list box 21102. Generally, for all components in the database, clicking on a component displayed in the components list box, calls up a builder or other subroutine associated with the selected component. This is shown for base objects in FIGS. 212 and 213, chemicals in FIGS. 214 and 215 and solutions in FIG. 216.

Preferably, "right" clicking on any base object opens a menu to delete or update the object. Right clicking of any chemical object brings up a menu to add a new chemical, export the chemical category table to an HTML file, or export the entire chemical base table to a delimited text file. The HTML file can be viewed and printed from a browser window. The delimited file can be imported into a spreadsheet application, such as Excel by the Microsoft Corporation.

Right clicking on any of the chemical components brings up a menu to delete or update the entry, or associate the chemical entry with one or more additional chemical categories. Since the present invention is designed to be built on top of an SQL server relation with database management system, powerful structured query language (SQL) searches can be executed through the database object manager. SQL queries can be entered in plain text and the field at the bottom of the window, and run by clicking the execute SQL query command button. For example, an SQL query can be run to find all of the chemicals in the database which contain a particular element. In the dialog window, chemicals are represented by groups according to their assigned competitive role and crystallization. However, one may want to know all of the chemicals in the database which contain a certain element, such as potassium. Instead of having to go through each chemical category in the chemical manager, one could execute an SQL query in the database object manager to quickly search the entire database. The SQL would query returns all chemicals containing potassium in the database, for example, chemicals can be reassociated by using the database object manager. All of the chemicals in the database are assigned to one or more of 16 different chemical types, according to their competitive roles in crystallization. Some chemicals can have different roles in crystallization, depending on the type of solution therein and their concentrations. For example, at high concentration, NaCl is typically considered a precipitant, and at low concentrations, NaCl is typically considered a salt. Instead of reentering the information for a chemical for each different chemical type, a chemical can be quickly associated with another chemical type in the database object manager. An example of an SQL query string 21700 is shown in FIG. 217. An example of associating a chemical with a different chemical category or type is shown in FIG. 218.

Database Structure: Table Relationships

In a further aspect of the invention, the database includes tables, having fields or attributes, and forming relationships with none or more tables. Data is mined via the use of keys that link tables to each other. Thus, one field can be mapped to any other table. In this manner, the entire database can be searched for data. For example, use of the field "Type ID" in the ChemTypeRelation table maps the chemicals used in the crystallization trials according to chemical type. The types recognized by the database are: buffering agent, pH conjugate, precipitant, salt, CSI, chelator, detergent, reducing agent, cryocoolant, nucleation suppressant, organic, heavy atom compound, metal, gas type, solvent or other. Use of the fields "catalog" and "CAS" can map any chemical, since these identifiers are unique for a chemical. Use of the field "macromolecule class ED" in the macromolecules classes table can be used to map according to the macromolecule class, such as proteins, DNA, RNA, glycoproteins, phosphoprotein, and membrane proteins, and their complexes and duplexes and any combination thereof, such as protein-DNA complex, protein-RNA complex, DNA duplex, RNA duplex, DNA-RNA duplex and the like. Use of the fields "crystal type" "crystal shape" "crystal size" and "crystal count" in the observations table represent certain data types which are useful in mapping according to crystallization results. Use of the field "session ID" is useful for mapping according to one of several observation sessions for a particular trial. The foregoing are meant to be given by way of example and should not be construed as limiting on the number of fields capable of being mapped by the present invention. The following paragraphs describe the tables of the invention. While a first level relationship is shown in the figures, it is to be understood tables form higher level relationships as well.

Figure 219:
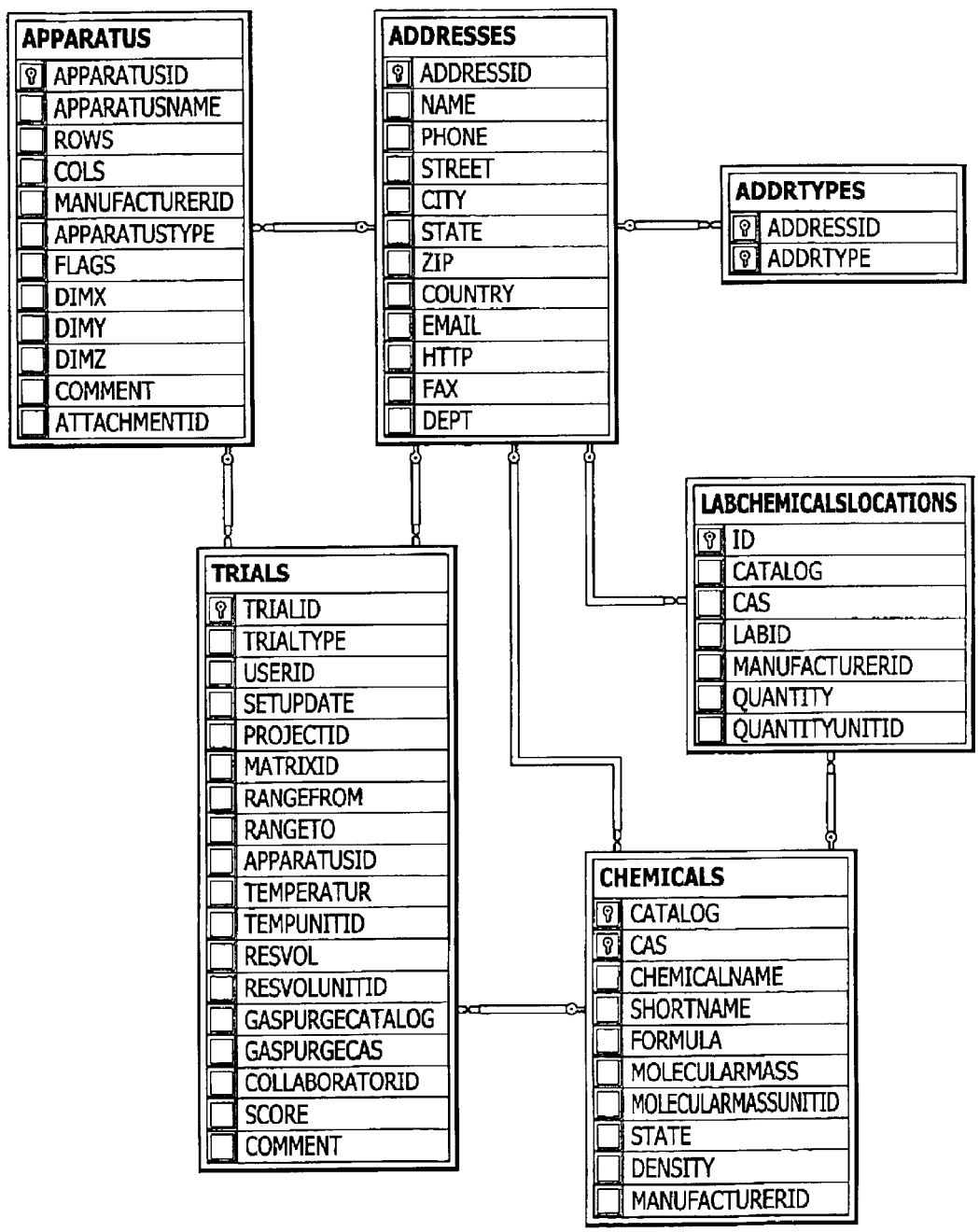

FIG. 219 show the relationships for the addresses table. Address ID is the key for the key for the addresses table. The addresses table includes the following fields: ID, name, phone, street, city, state, zip, country, c-mail, http, fax, and department.

Figure 220:
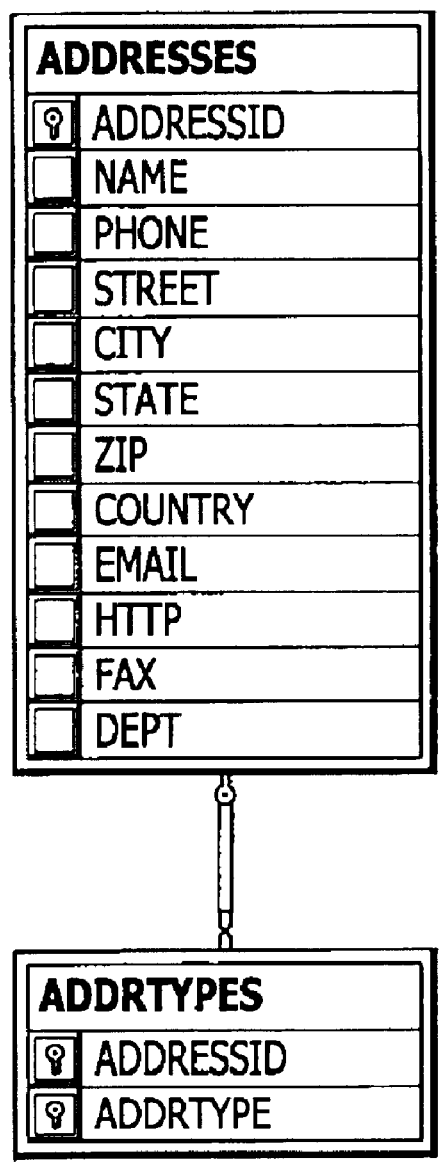

FIG. 220 shows the relationships for the address types table. The key for the address types table is address ID and address type. The address types table has the following fields: address ID, address type, apparatus, apparatus ID, apparatus name, rows, columns, manufacturer ID, apparatus type, flags, dimension x, dimension y, dimension z, comment and attachment ID.

Figure 221:
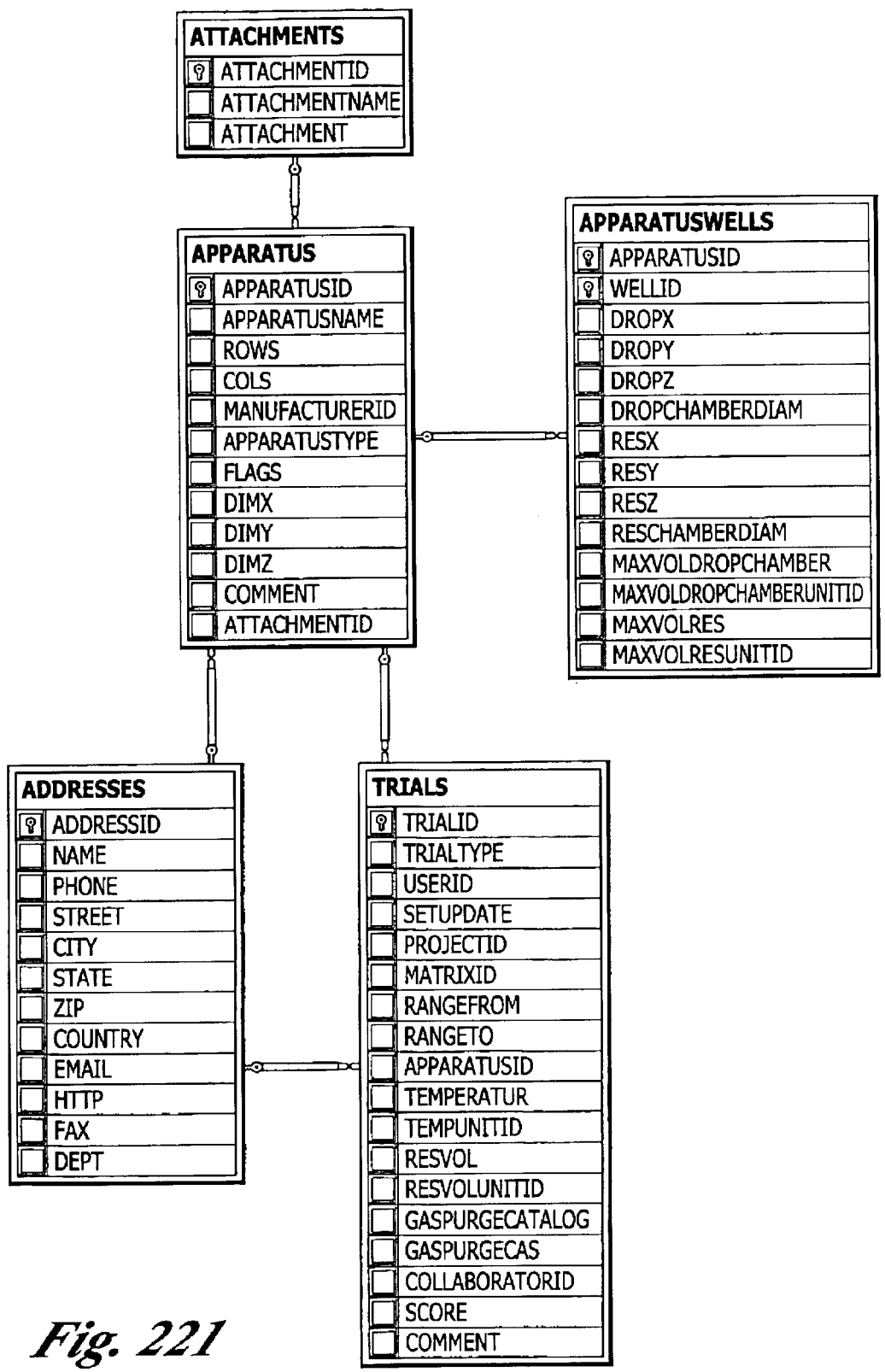

FIG. 221 shows the relationships for the apparatus table. Apparatus ID is the key for the apparatus table. The apparatus table has the following fields: apparatus ID, apparatus name, rows, columns, manufacturer ID, apparatus type, flags, dimension x, dimension y, dimension z, comment and attachment ID.

Figure 222:
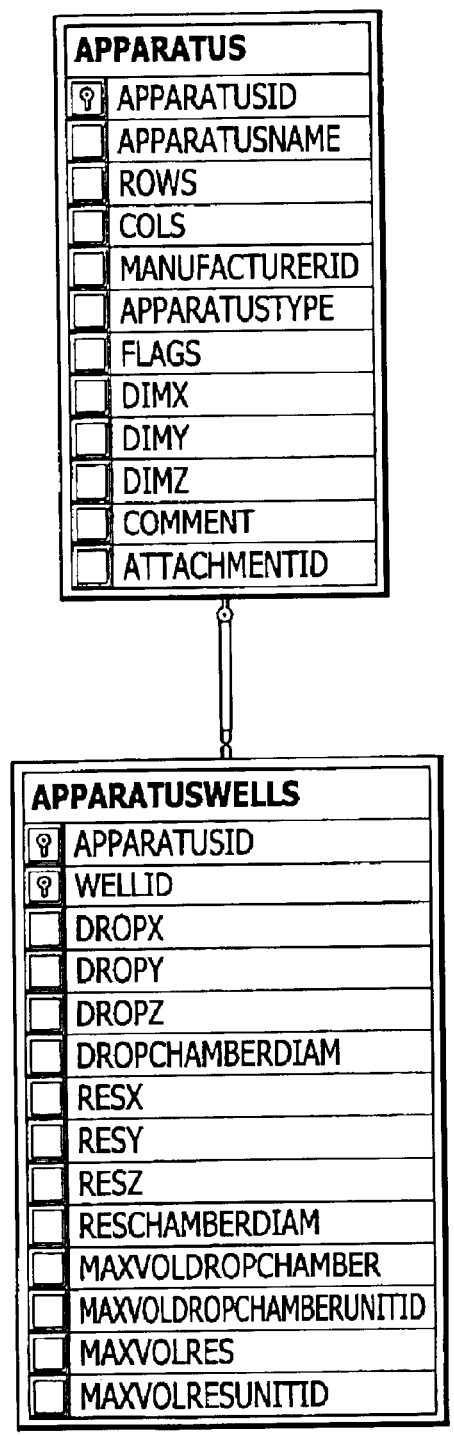

FIG. 222 shows the relationships for the apparatus wells table. The key for the apparatus wells table is apparatus ID and well ID. The apparatus wells table includes the following fields: apparatus ID, well ID, drop dimension x, drop dimension y, drop dimension z, drop chamber diameter, reservoir dimension x, reservoir dimension y, reservoir dimension z, reservoir chamber diameter, maximum volume drop chamber, maximum volume drop chamber unit ID, maximum, volume reservoir, and maximum volume reservoir unit ID.

Figure 223:
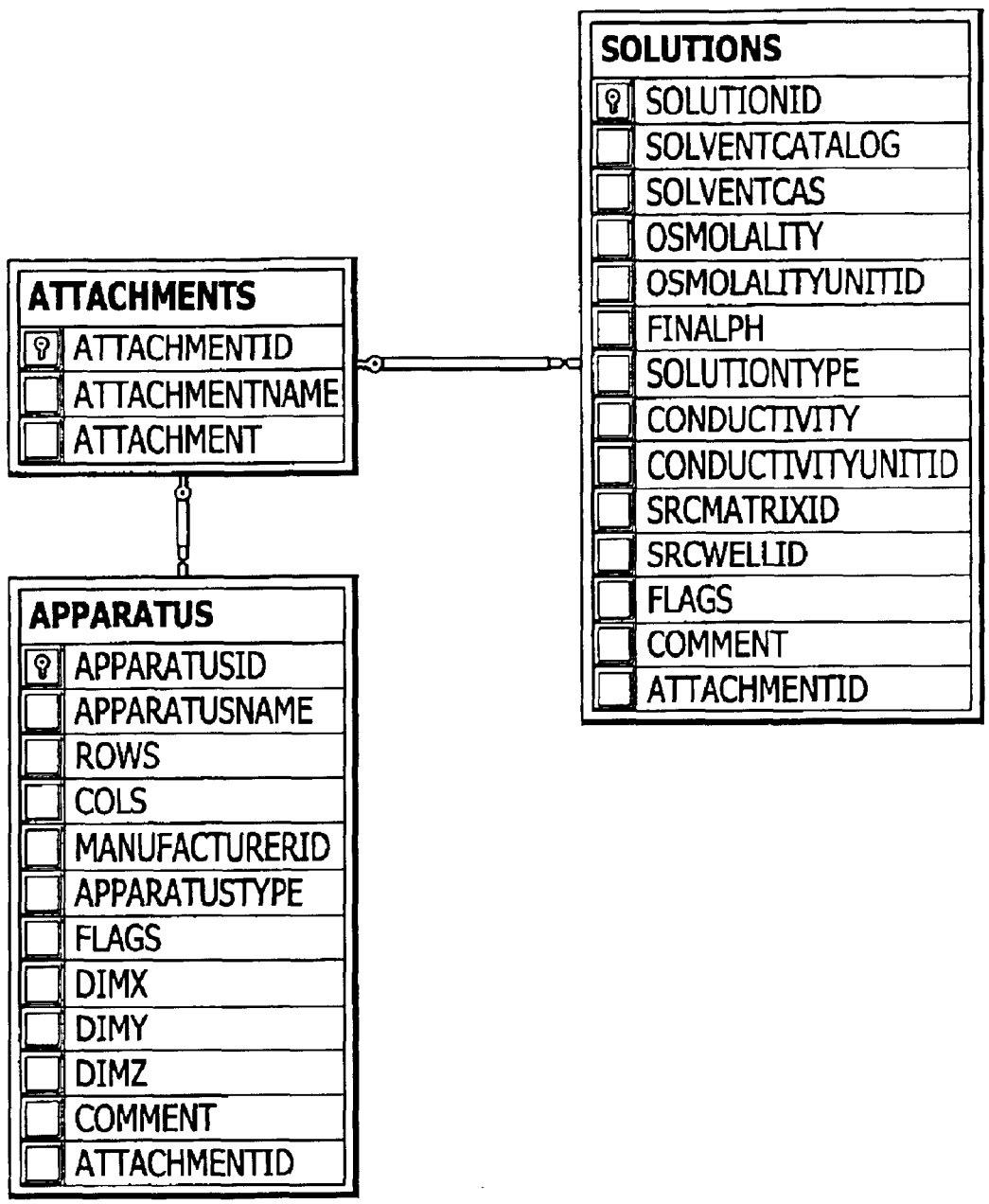

FIG. 223 shows the relationships for the attachments table. Attachment ID is the key for the attachments table. The attachments table includes the following fields: attachment ID, attachment name, and attachment.

Figure 224:
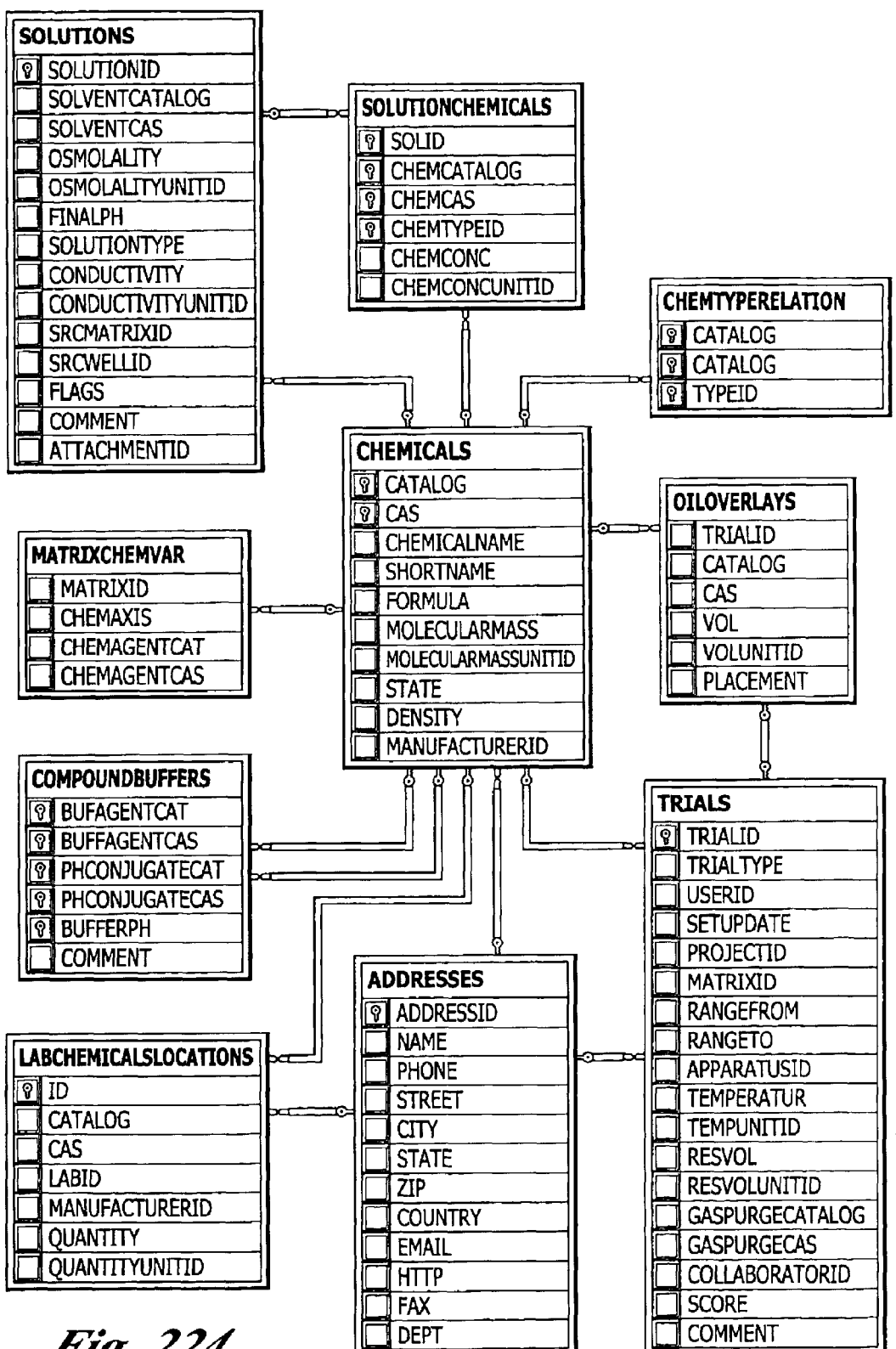

FIG. 224 shows the relationships for the chemicals table. The key to the chemicals table is catalog and CAS number. The chemicals table includes the following fields: catalog, CAS No. chemical name, short name, formula, molecular mass, molecular mass units, state, density, and manufacturer ID.

Figure 225:
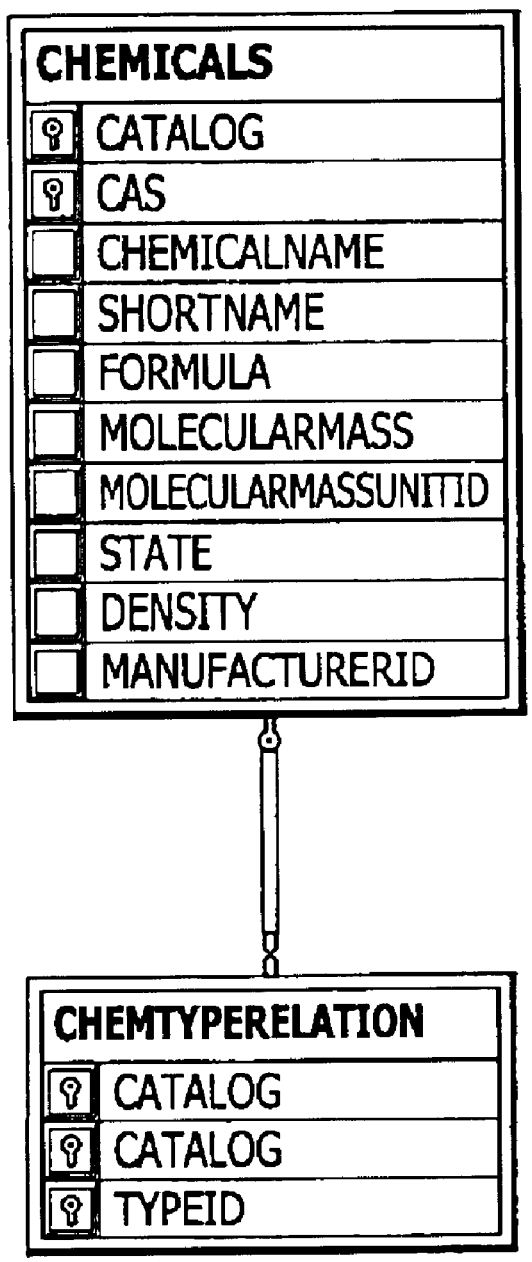

FIG. 225 shows the chemical type relation table. The key to the chemical type relation table is catalog cast and type ID. The chemical type relation table includes the following fields: catalog, CAS No., and type ID.

Figure 226:
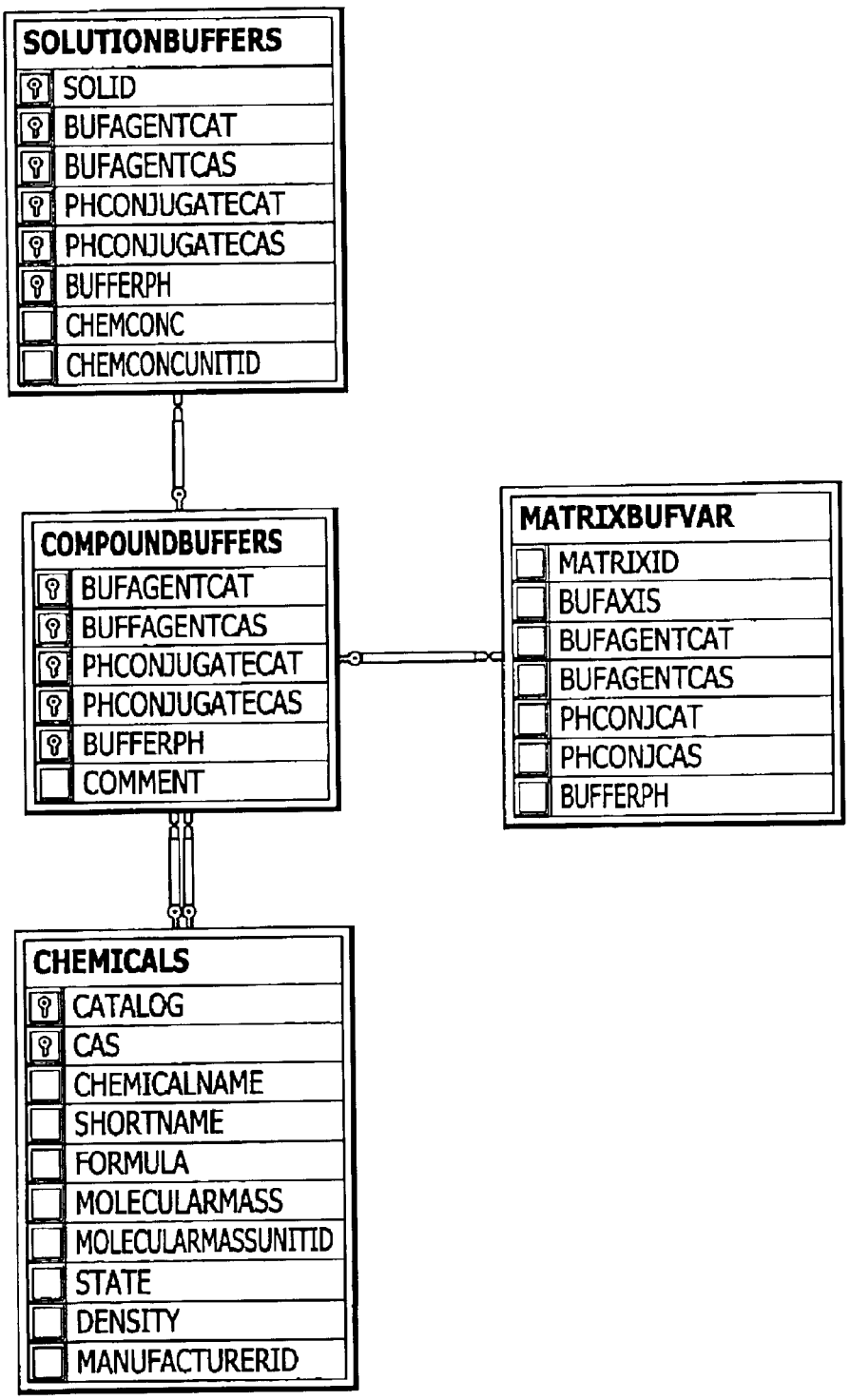

FIG. 226 shows the relationships for the compound buffers table. The key to the compound buffers table is buffer agent catalog number, buffer agent cast number, pH conjugate catalog number, pH conjugate cast number and the buffer pH. The compound buffers table includes the following fields: buffer agent catalog, buffer agent CAS, pH conjugate catalog, pH conjugate CAS, buffer pH, and comment.

Figure 227:
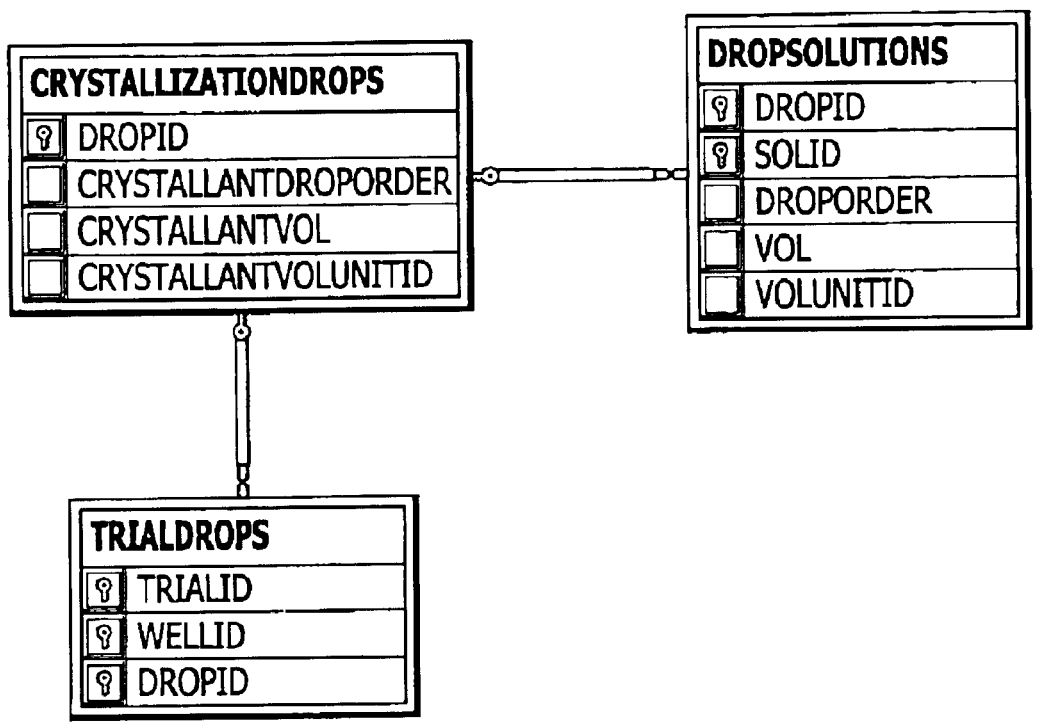

FIG. 227 shows the relationships for the crystallization drops table. The key to the crystallization drops table is drop ID. The crystallization drops table includes the following fields: drop ID, crystallant drop order, crystallant volume, and crystallant volume unit ID.

Figure 228:
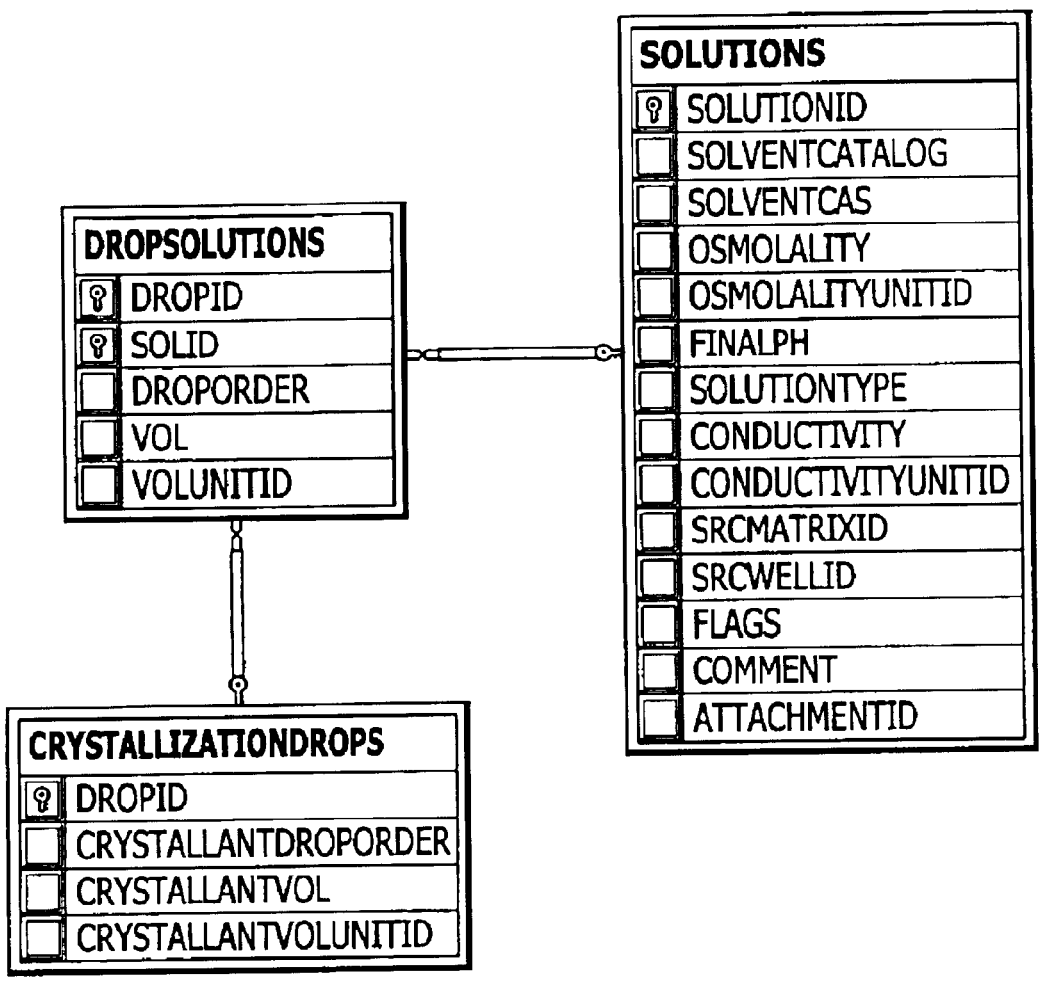

FIG. 228 shows the relationships for the drop solutions table. The key to the drop solutions table is drop ID and solvent ID. The drops solution table includes the following fields: drop ID, solution ID, drop order, volume, and volume unit ID.

Figure 229:
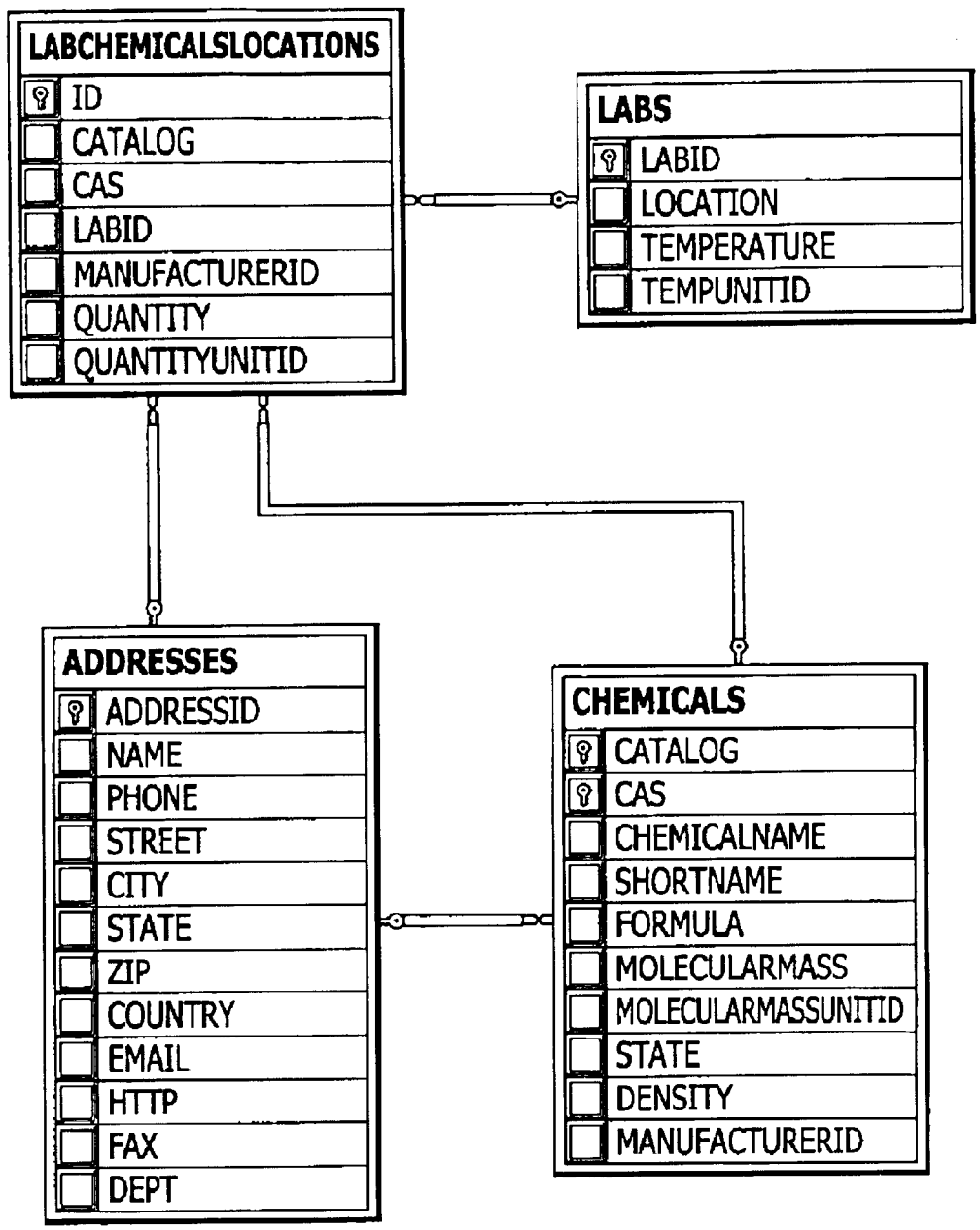

FIG. 229 shows the relationships for the lab chemicals locations table. The key to the lab chemicals locations table is ID number. The lab chemicals locations table includes the following fields: ID, catalog, CAS No., lab ID, manufacturer ID, quantity, and quantity unit ID.

Figure 230:
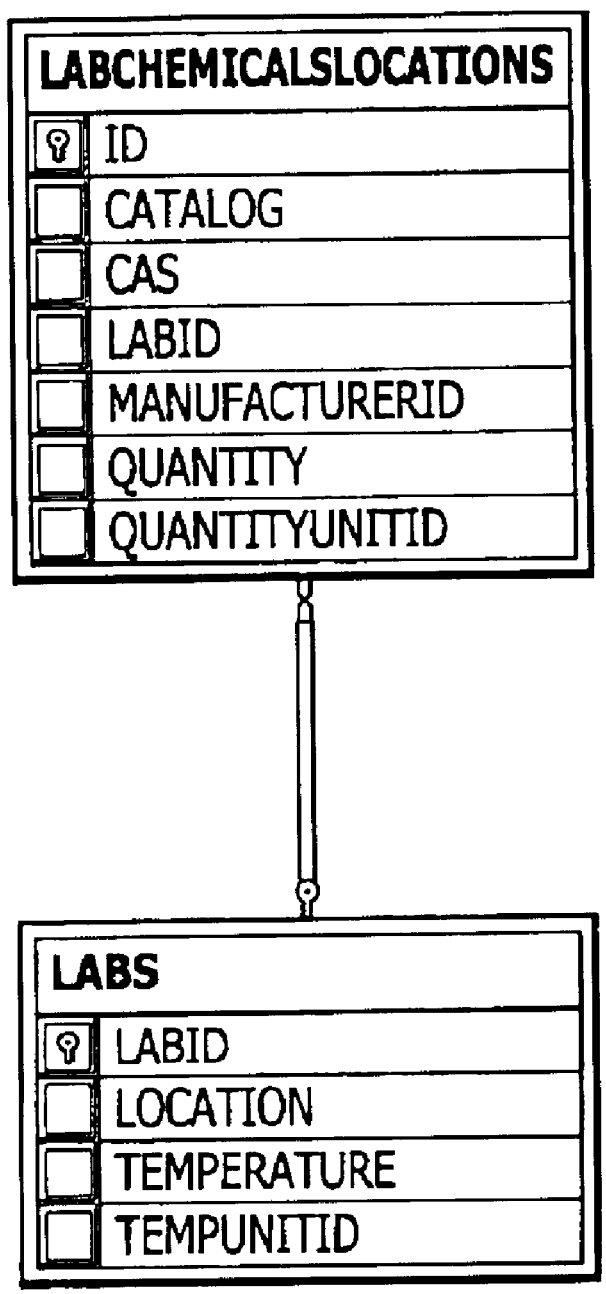

FIG. 230 shows the relationships for the labs table. The key to the labs table is lab ID. The labs table includes the following fields: lab ID, location, temperature, and temperature unit ID.

Figure 231:
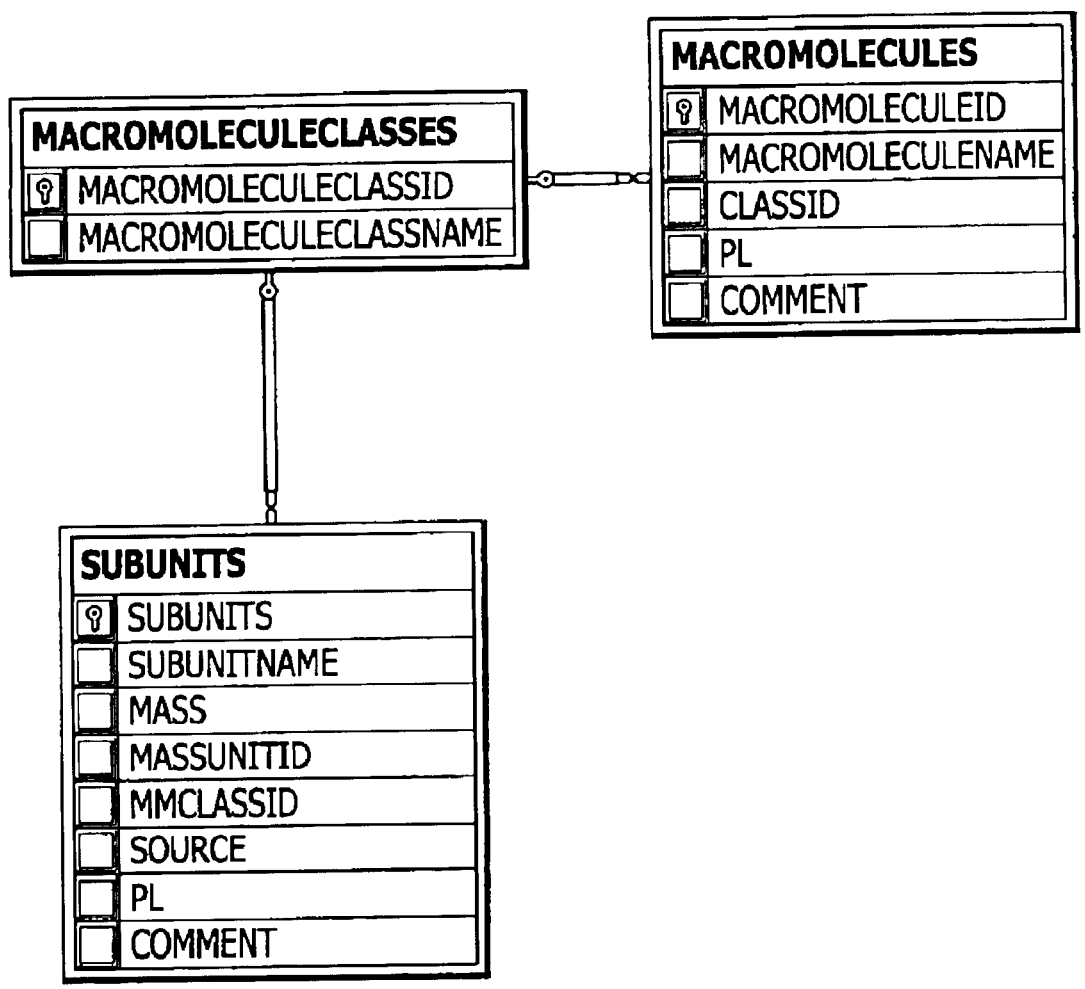

FIG. 231 shows the relationships for the macromolecule classes table. The key to the macromolecule classes table is macromolecule class ID.

Figure 232:
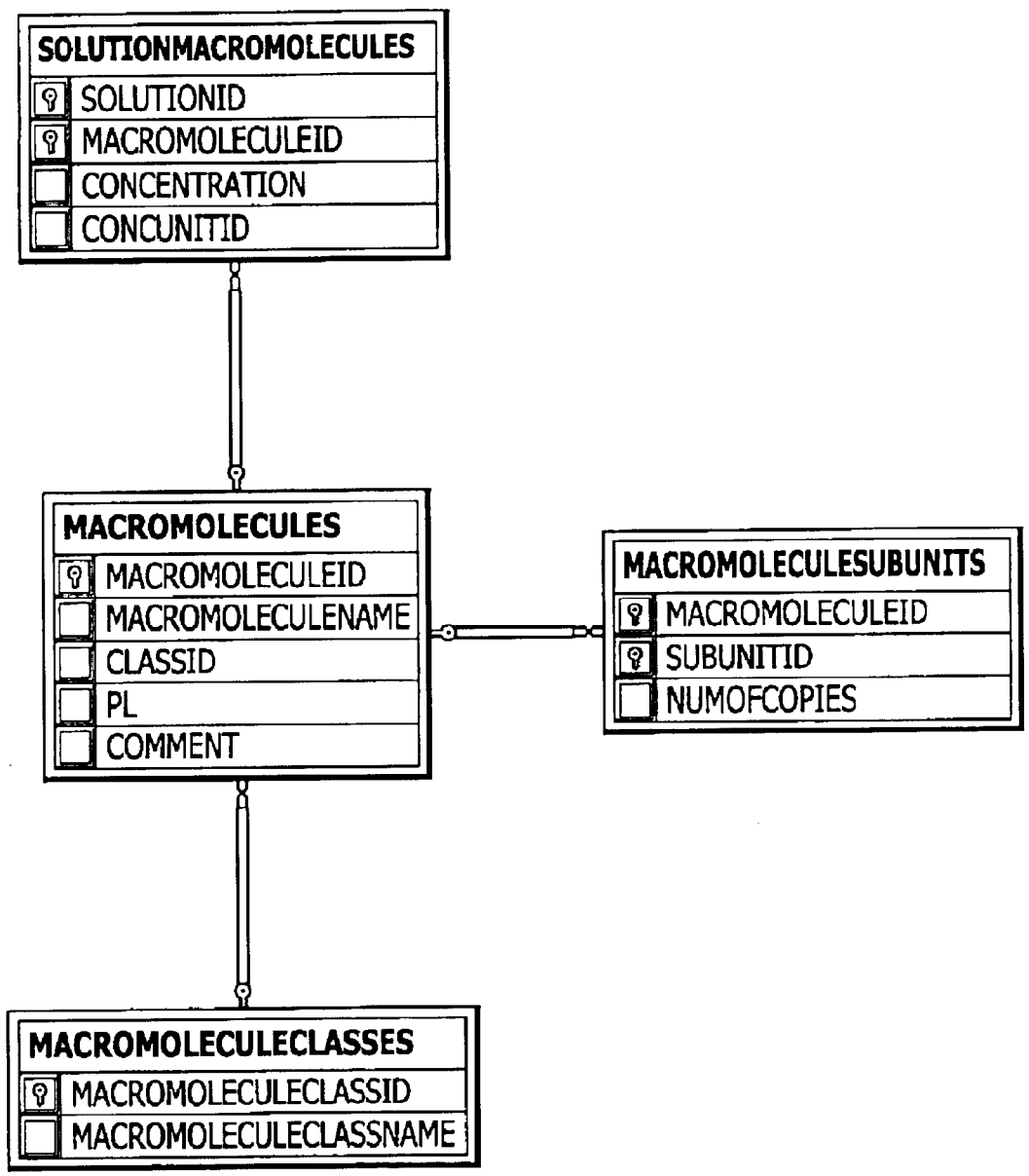

FIG. 232 shows the relationships for the macromolecules table. The key to the macromolecules table is macromolecule ID. The macromolecules table includes the following fields: macromolecule ID, macromolecule name, class ID, pI, and comment.

Figure 233:
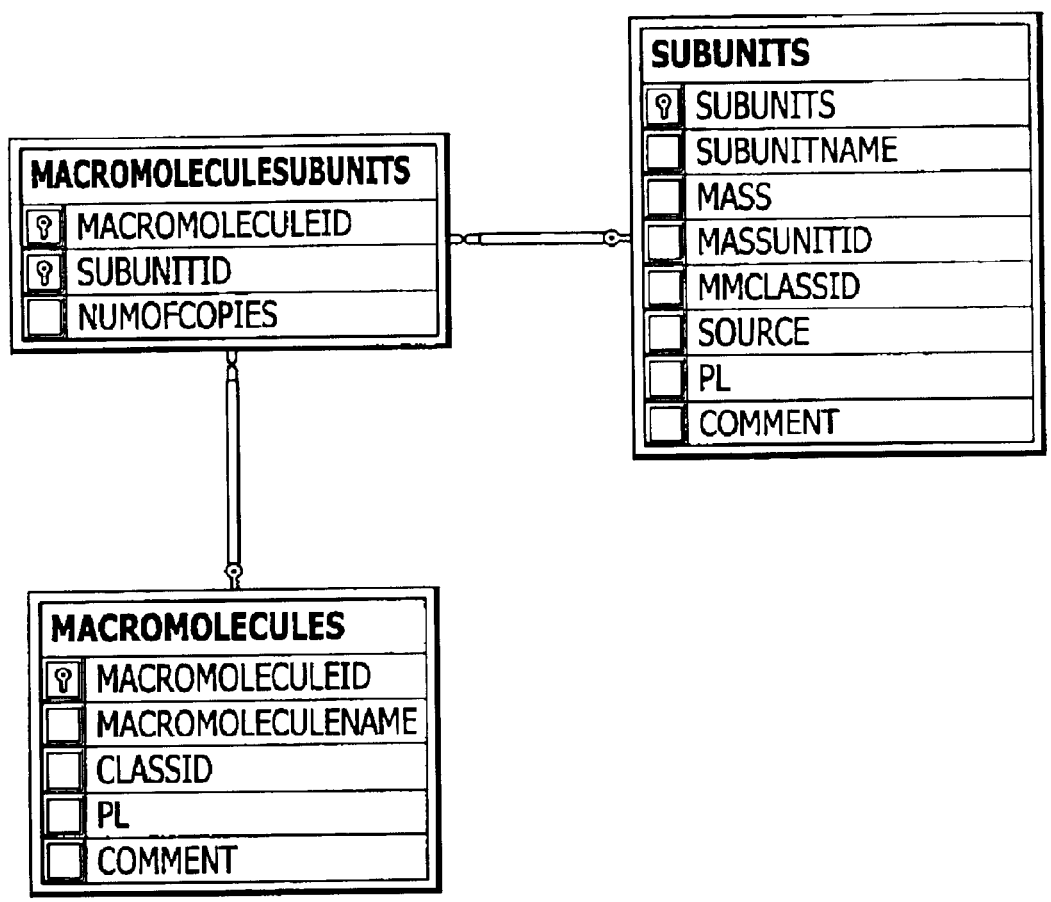

FIG. 233 shows the relationships for the macromolecule subunits table. The key to the macromolecule subunits table is macromolecule ID and subunit ID. The macromolecule subunits table includes the following fields: macromolecule ID, subunit ID, and number of copies.

Figure 234:
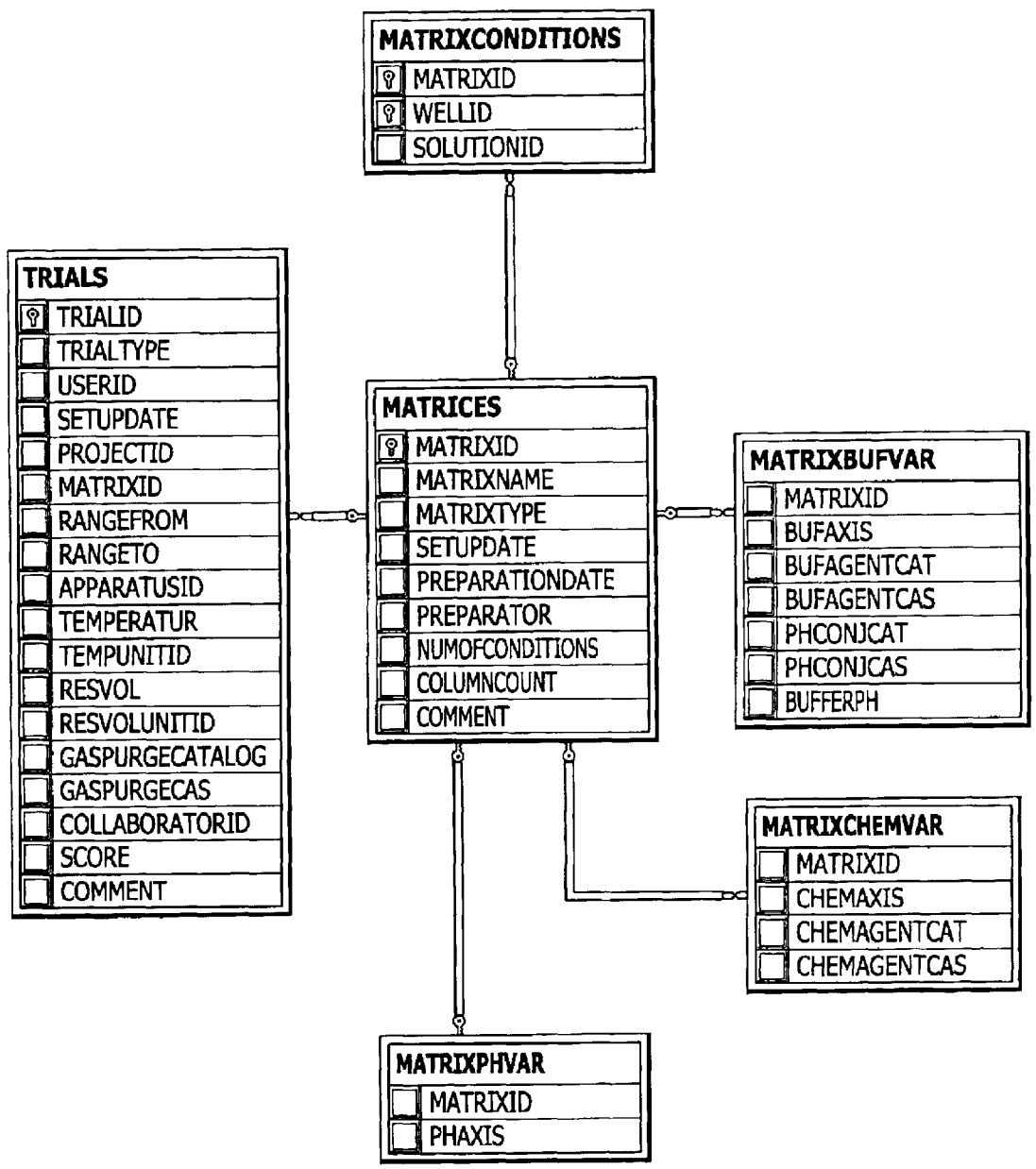

FIG. 234 shows the relationships for the matrices table. The key to the matrices table is the matrix ID. The matrices table includes the following fields: matrix ID, matrix name, matrix type, setup date, preparation date, preparator, number of conditions, column count and column comment.

Figure 235:
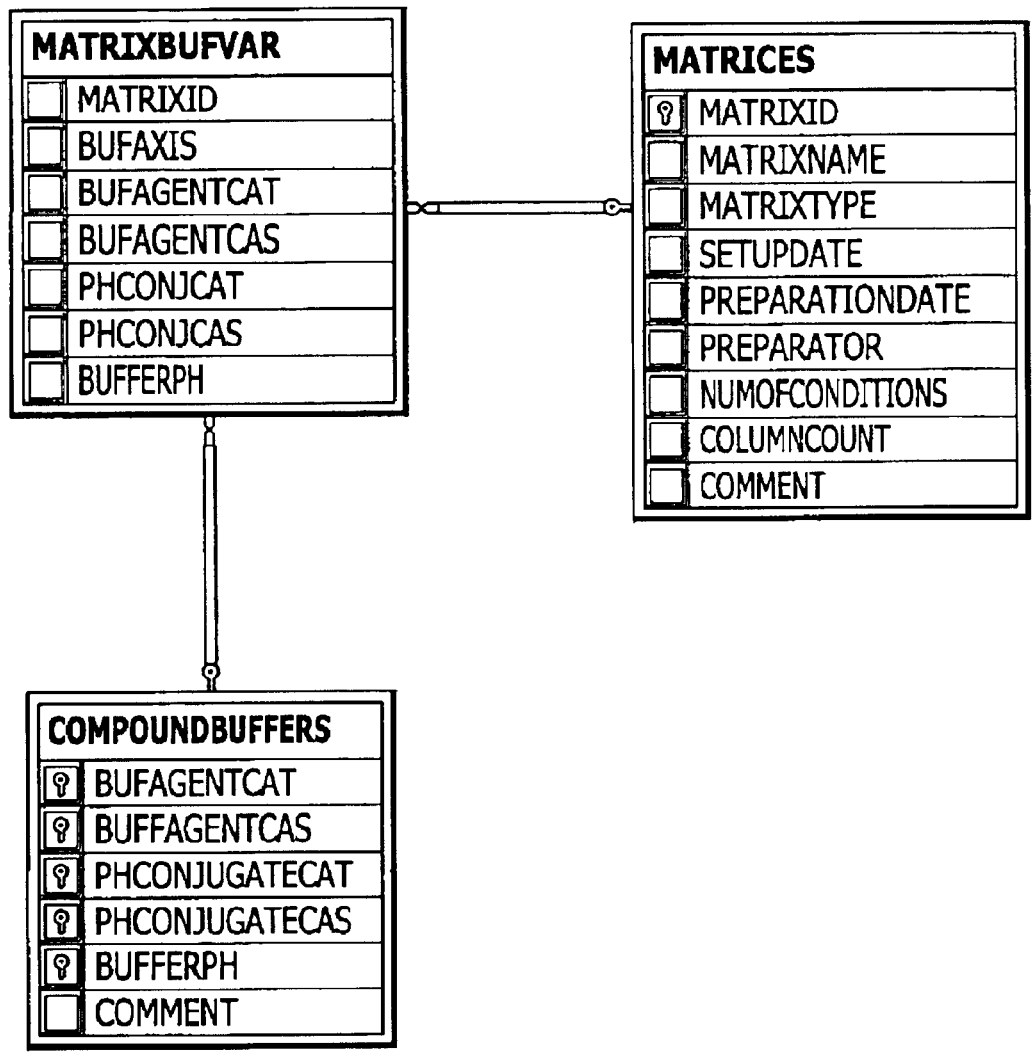

FIG. 235 shows the relationships for the matrix buffer variable table. The matrix buffer variable table includes the following fields: matrix ID, buffer axis, buffer agent catalog, buffer agent CAS, pH conjugate catalog, pH conjugate CAS, and buffer pH.

Figure 236:
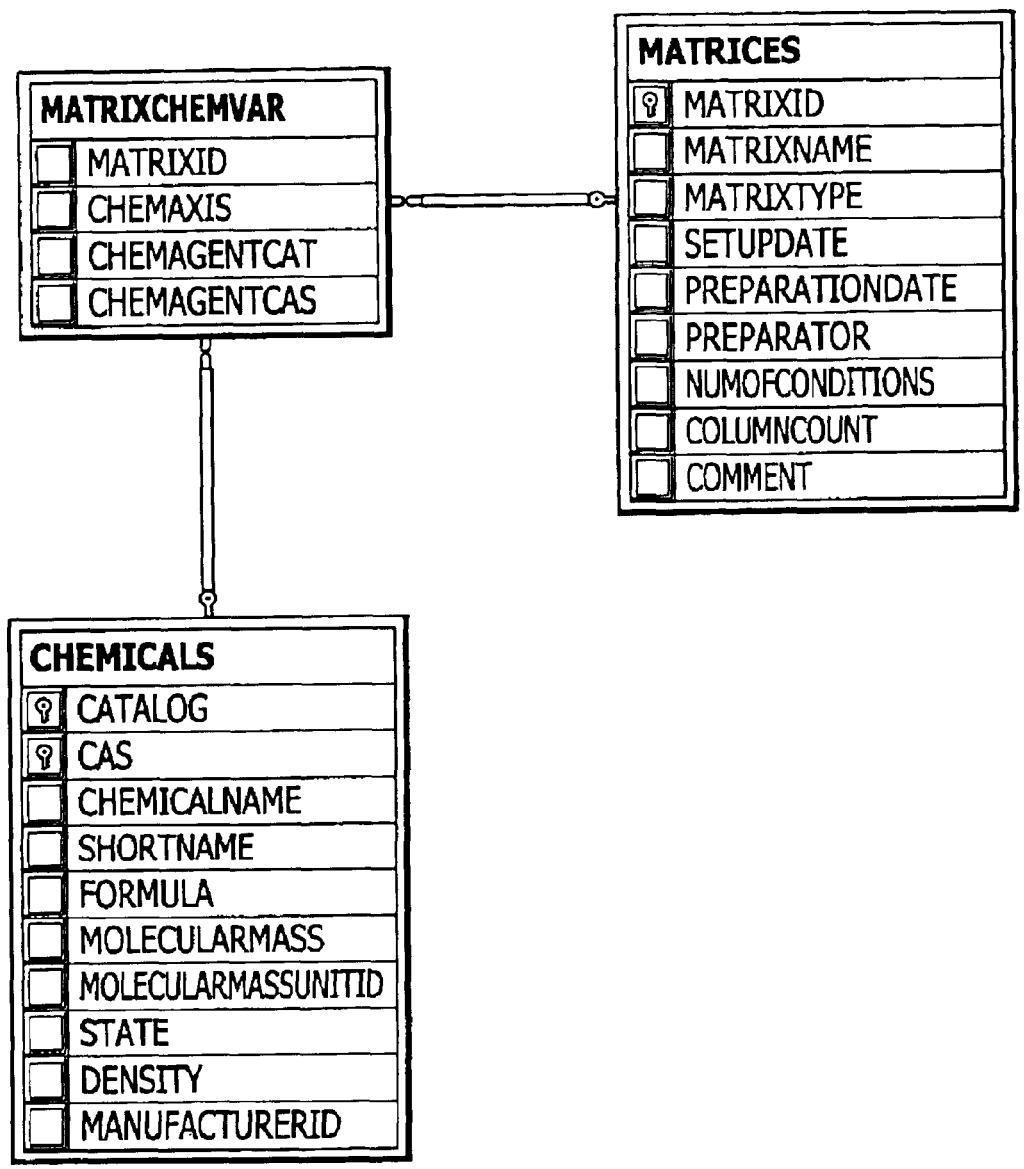

FIG. 236 shows the relationships for the matrix chemical variable table. The matrix chemical variable table includes the following fields: matrix ID, chemical axis, chemical agent catalog, and chemical agent CAS.

Figure 237:
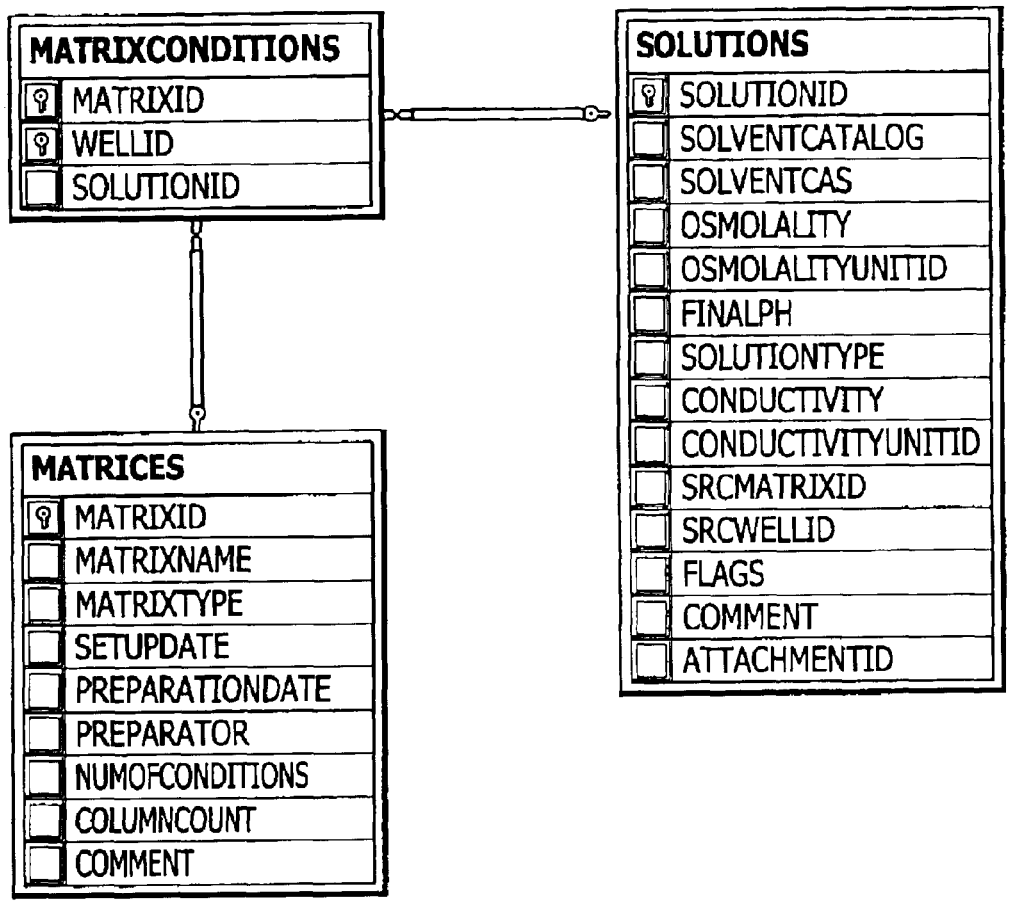

FIG. 237 shows the relationships for the matrix conditions table. The key to the matrix conditions table is the matrix ID and the well ID. The matrix conditions table includes the following fields: matrix ID, well ID and solution ID.

Figure 238:
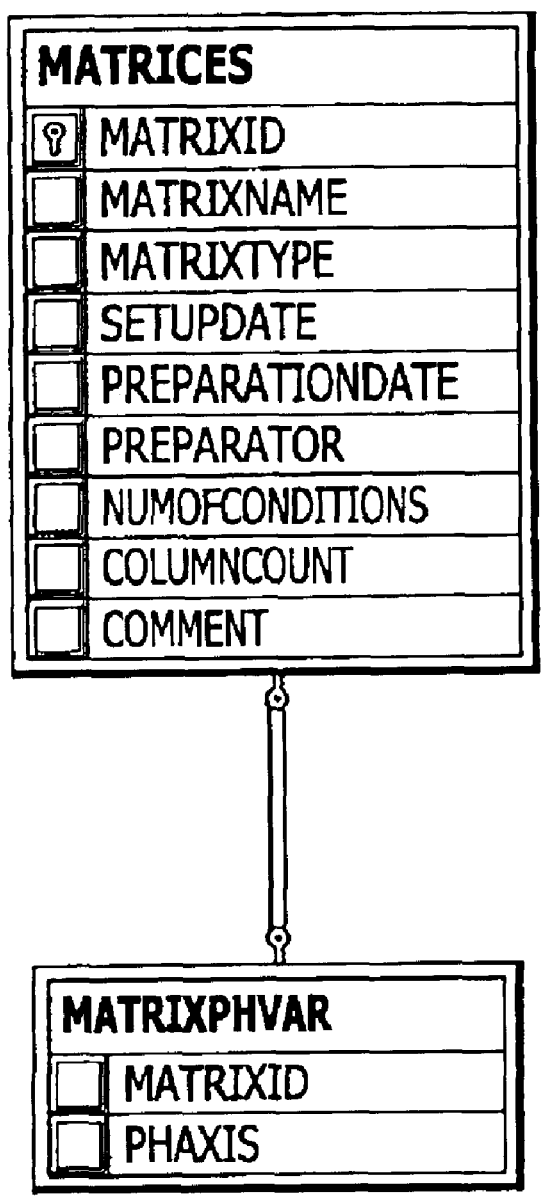

FIG. 238 shows the relationships for the matrix pH variable table. The matrix pH variable table includes the following fields: matrix ID and pH axis.

Figure 239:
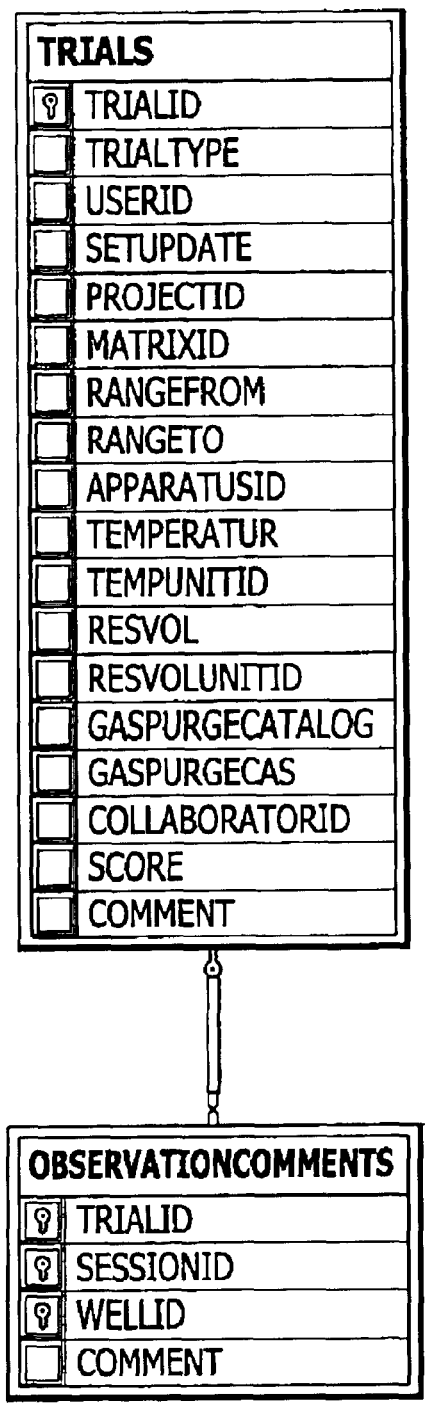

FIG. 239 shows the relationships for the observation comments table. The key to the observation comments table is trial ID, session ID, and well ID. The observation comments table includes the following fields: trial ID, session ID, well ID, and comment.

Figure 240:
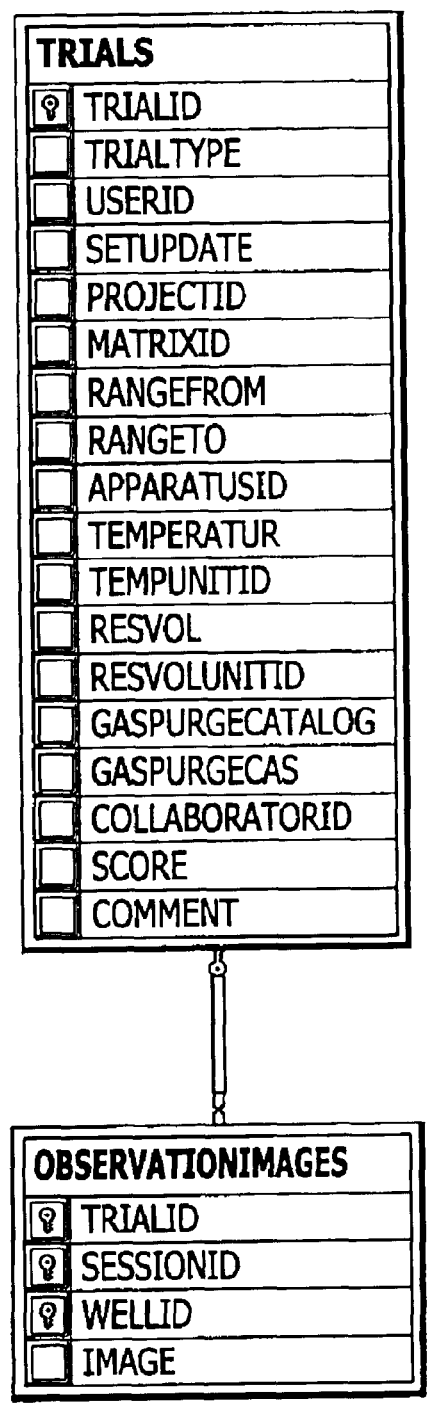

FIG. 240 shows the relationships for the observation images table. The key to the observation images table is trial ID, session ID, and well ID. The observation images table includes the following fields: trial ID, session ID, well ID, and image.

Figure 241:
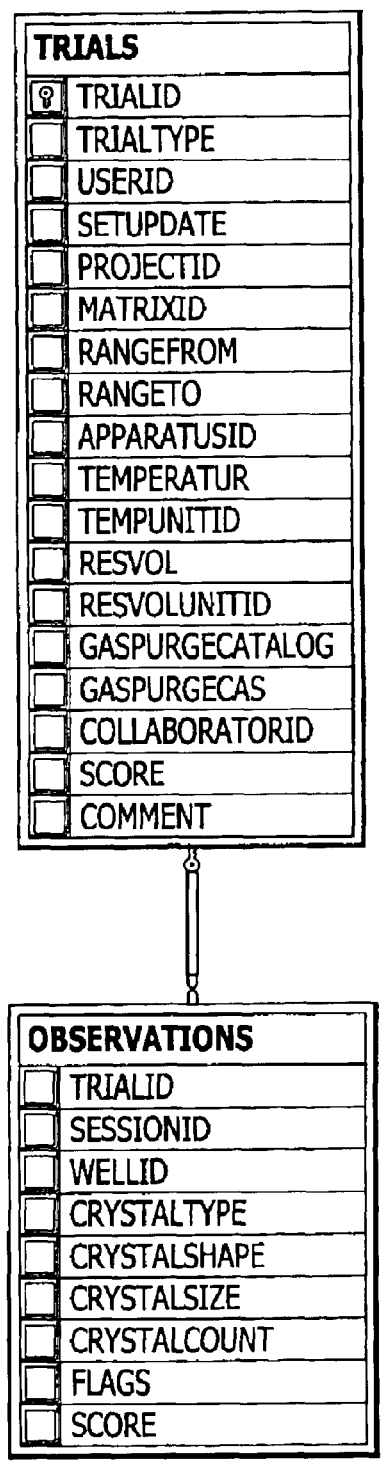

FIG. 241 shows the relationships for the observations table. The observations table includes the following fields: trial ID, session ID, well ID, crystal type, crystal shape, crystal size, crystal count, flags and score.

Figure 242:
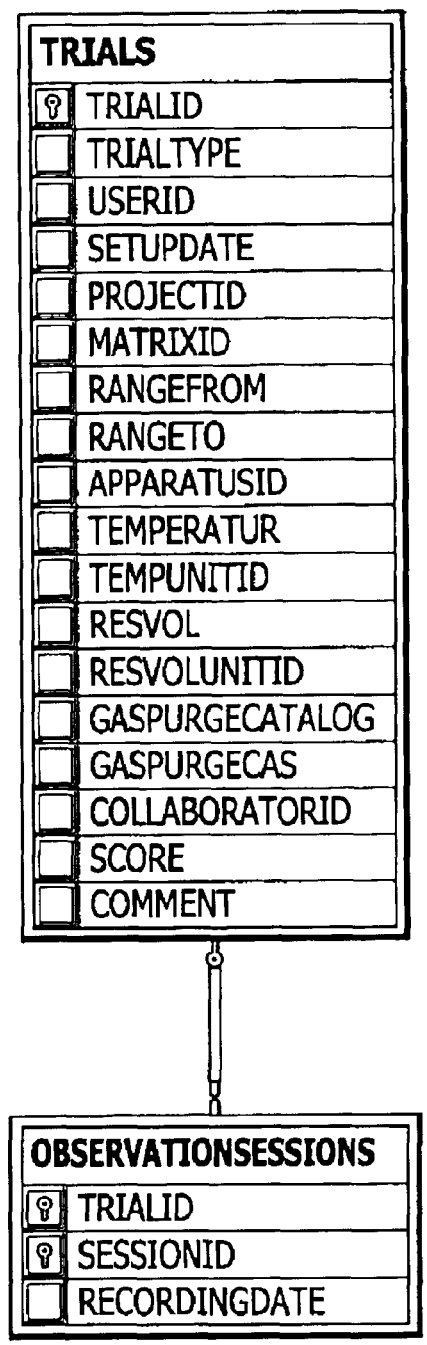

FIG. 242 shows the relationships for the observations sessions table. The key to the observations table is trial ID and session ID. The observation sessions table includes the following fields: trial ID, session ID and recording date.

Figure 243:
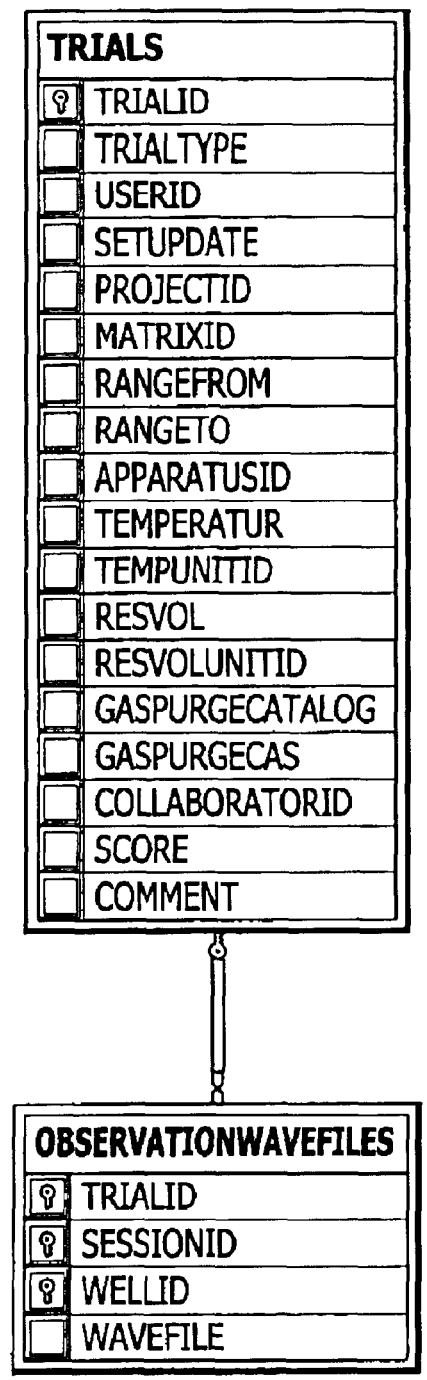

FIG. 243 shows the relationships for the observation wave files table. The key to the observation wave files table is trial ID, session ID, and well ID. The observation wave files table includes the following fields: trial ID, session ID, well ID, and wave file.

Figure 244:
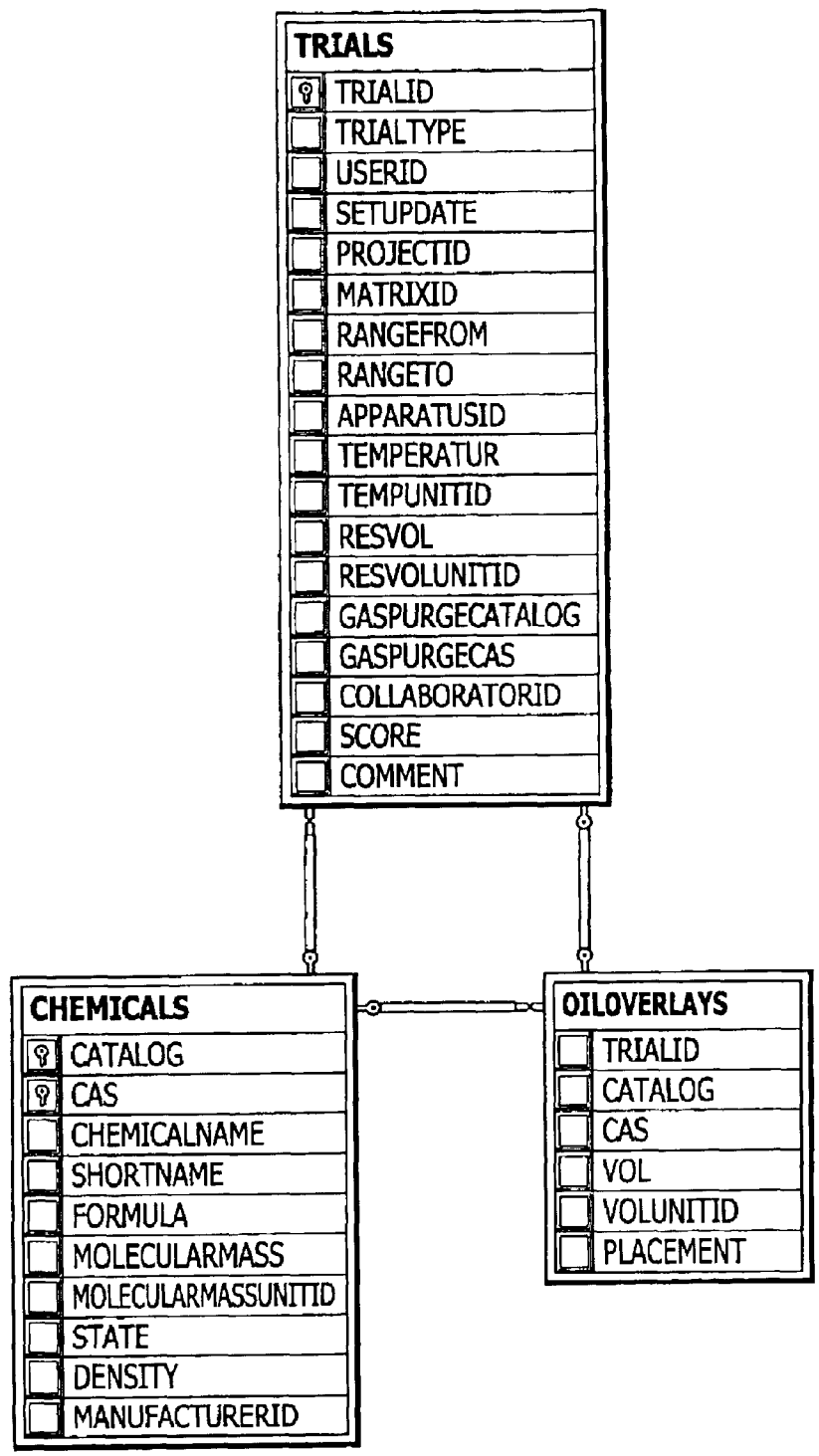

FIG. 244 shows the relationships for the oil overlays table. The oil overlays table includes the following fields: trial ID, catalog, CAS No., volume, volume unit ID, and placement.

FIG. 245 shows the relationships for the preparators table. The key to the preparators table is preparator ID. The preparator's table includes the following fields: preparator ID, and preparator name.

FIG. 246 shows the relationships for the projects table. The key to the projects table is the project ID. The projects table includes the following fields: project ID, project name, and comment.

Figure 247:
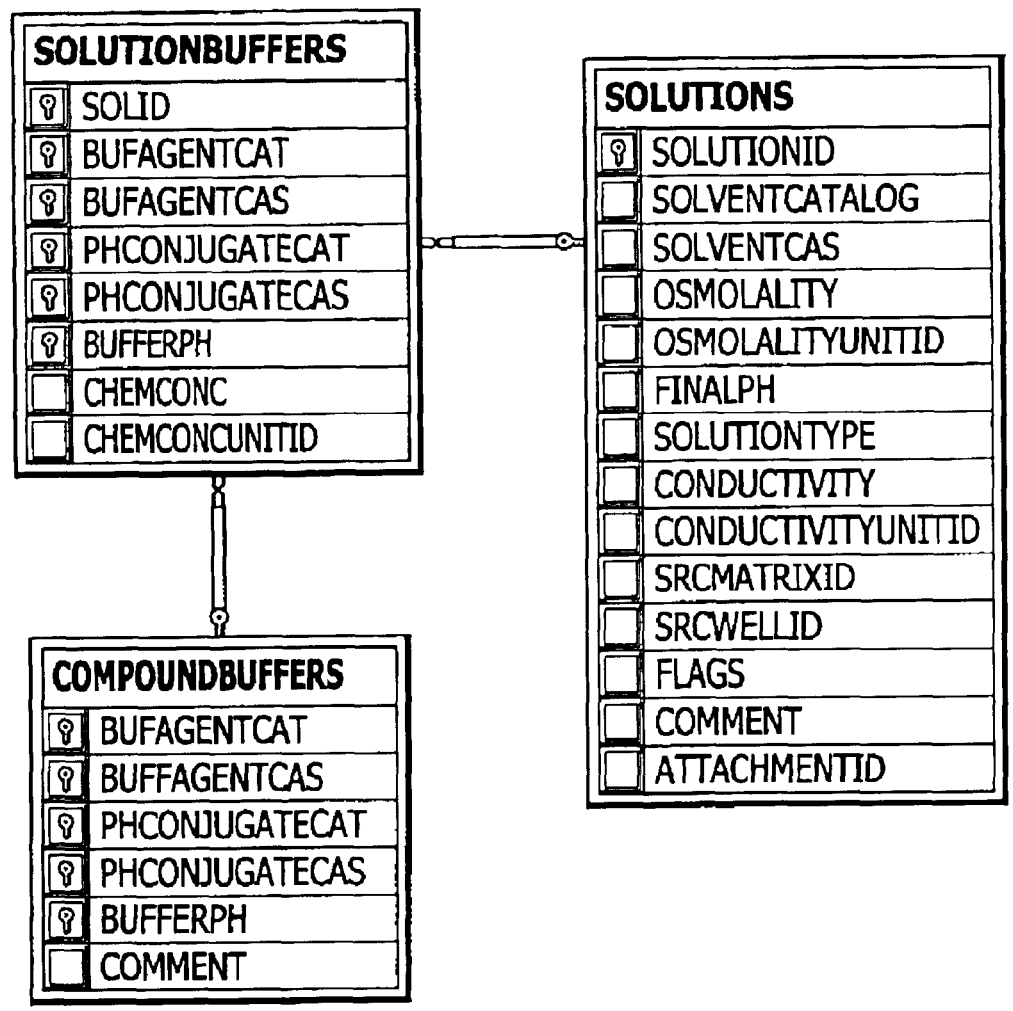

FIG. 247 shows the relationships for the solution buffers table. The key to the solution buffers table is solvent ID, buffer agent catalog number, buffer agent cast number, pH conjugate catalog number, pH conjugate cast number, and buffer pH. The solution buffers table includes the following fields: solution ID, buffer agent catalog, buffer agent CAS, pH conjugate catalog, pH conjugate CAS, buffer pH, chemical concentration, and chemical concentration unit ID.

Figure 248:
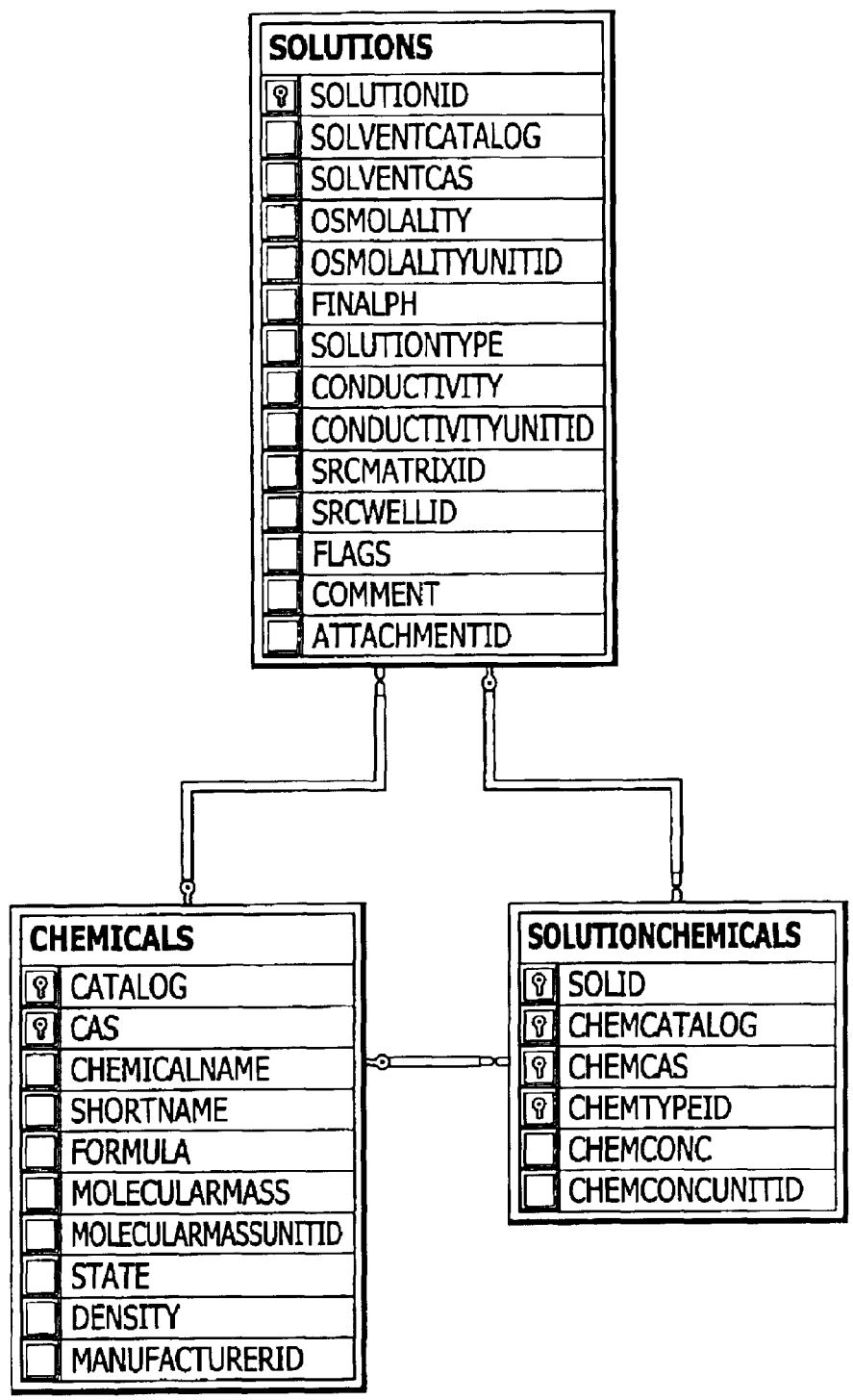

FIG. 248 shows the relationships for the solution chemicals table. The key to the solution chemicals table is solvent ID, chemical catalog number, chemical cast number, chemical type ID. The solution chemicals table includes the following fields: solution ID, chemical catalog, chemical CAS, chemical type ID, chemical concentration, and chemical concentration unit ID.

Figure 249:
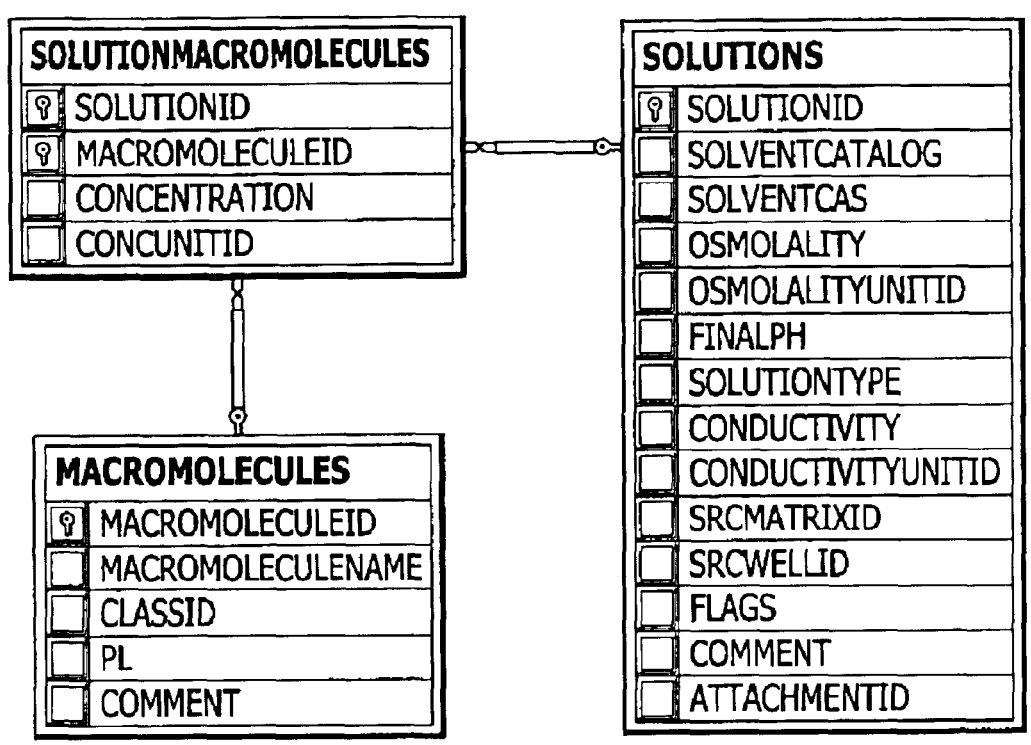

FIG. 249 shows the relationships for the solution macromolecules table. The key to the solution macromolecules table is solution ID and macromolecule ID. The solution macromolecules table includes the following fields. Solution ID, macromolecule ID, concentration, and concentration unit ID.

Figure 250:
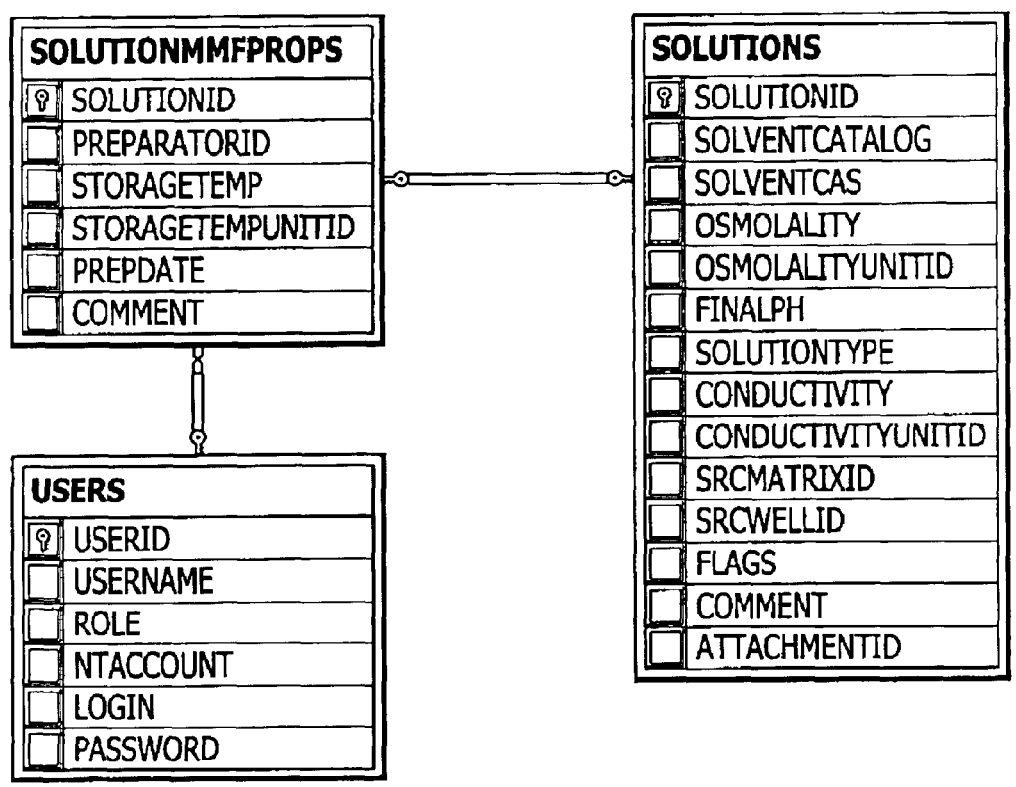

FIG. 250 shows the relationships for the solution macromolecule formulation properties table. The key to the solution macromolecule formulations properties table is solution ID. The solution macromolecule formulation properties table includes the following fields: solution ID, preparator ID, storage temperature, storage temperature unit ID, preparation date, and comment.

Figure 251:
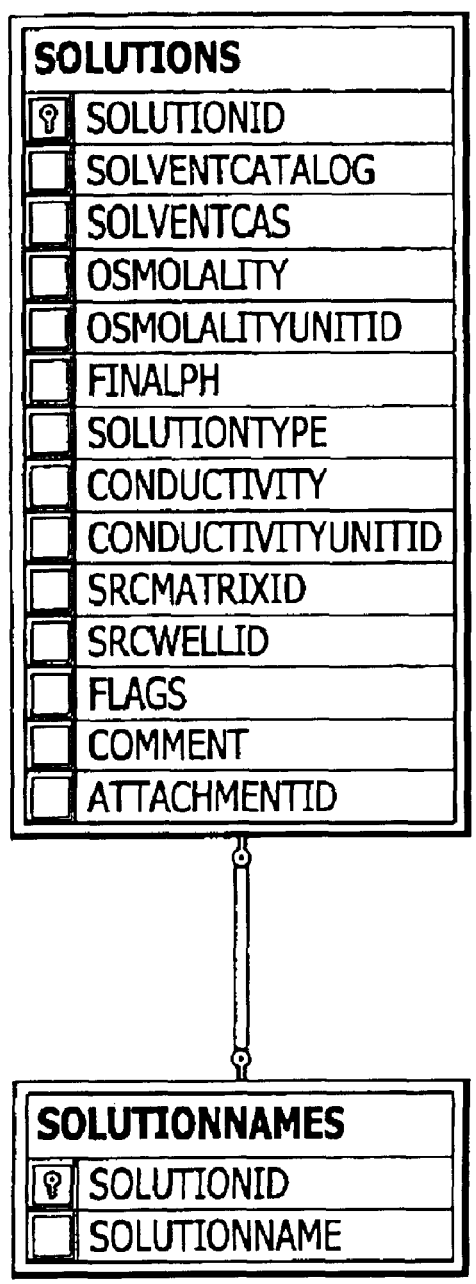

FIG. 251 shows the relationships for the solution names table. The key to the solution names table is solution ID. The solution names table includes the following fields: solution ID, and solution name.

Figure 252:
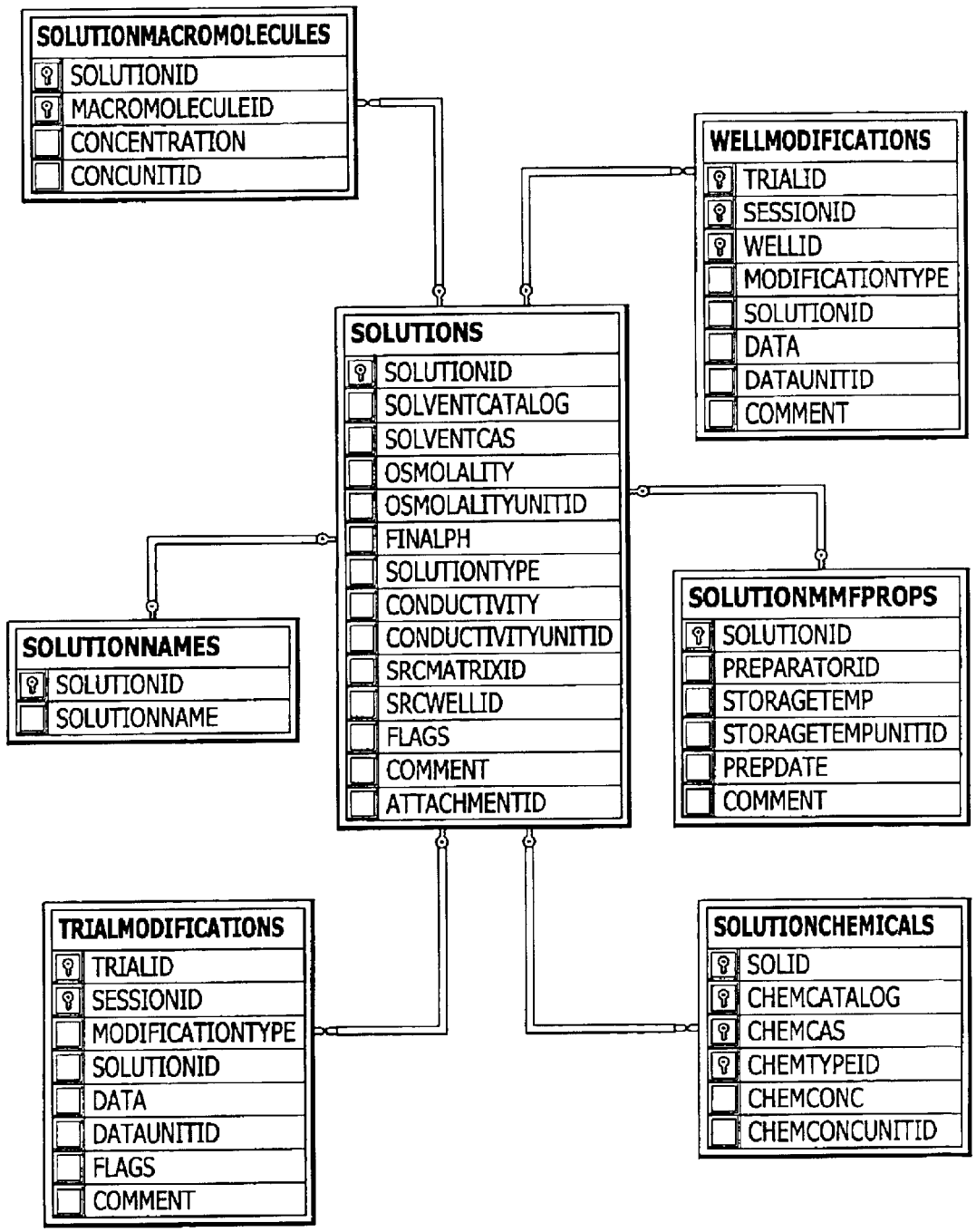
Figure 253:
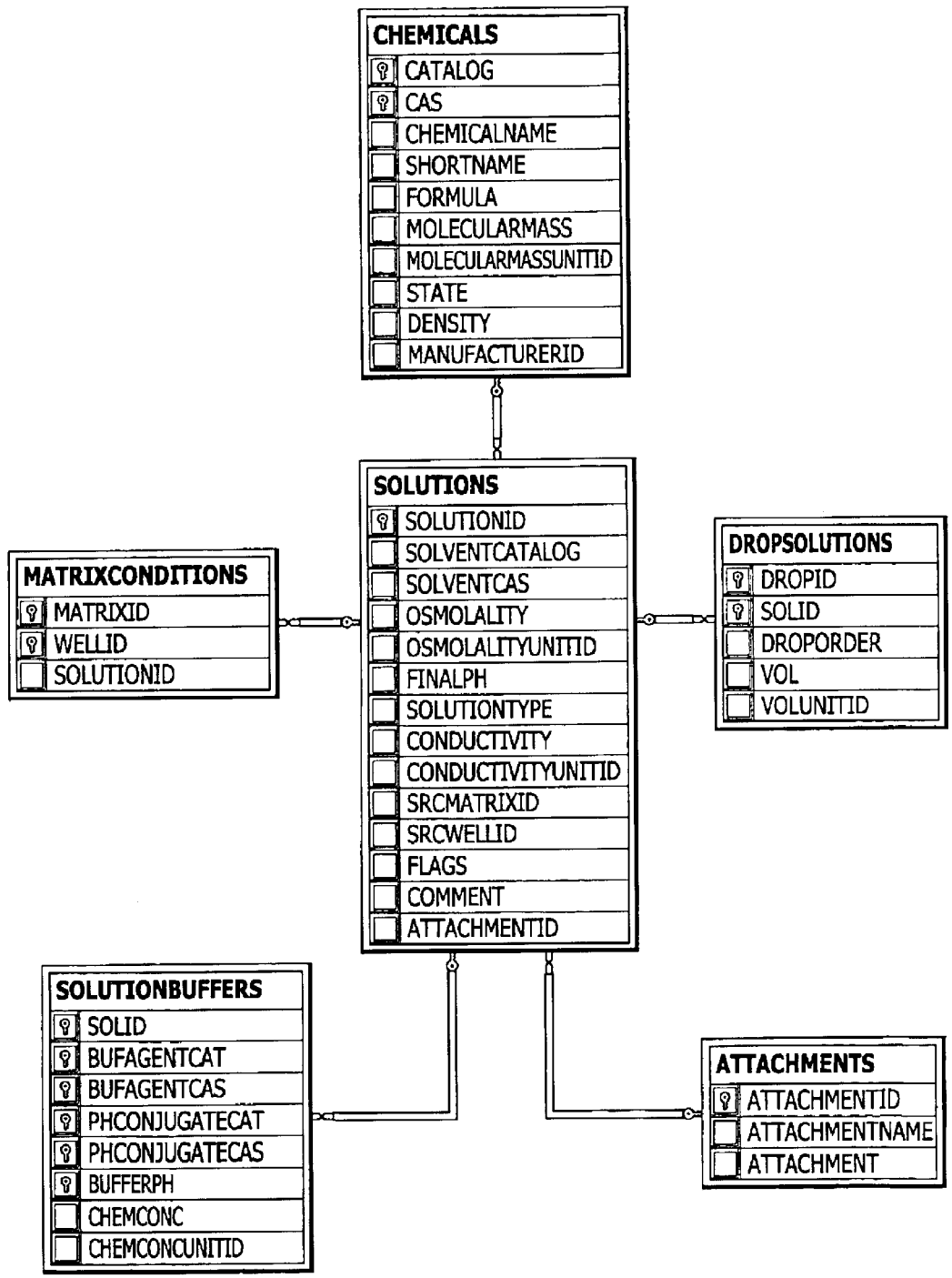

FIGS. 252–253 show the relationships for the solutions table. The key to the solutions table is solution ID. The solutions table includes the following fields: solution ID, solvent catalog, solvent cast, osmolality, osmolality unit ID, final pH, solution type, conductivity, conductivity unit ID, SRC matrix ID, SRC well ID, flags, comment, and attachment ID.

Figure 254:
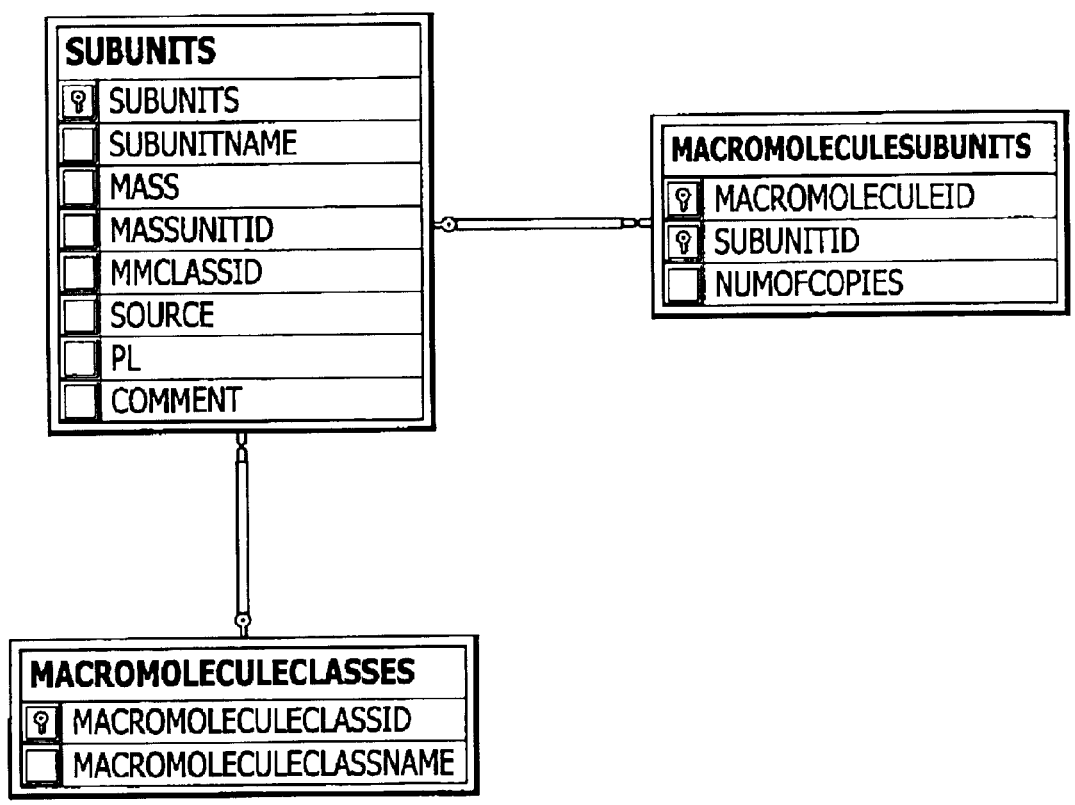

FIG. 254 shows the relationships for the subunits table. The key to the subunits table is subunit ID. The subunits table includes the following fields: subunit ID, subunit name, mass, mass unit ID, macromolecule class ID, source, PI, and comment.

Figures 255, 256:
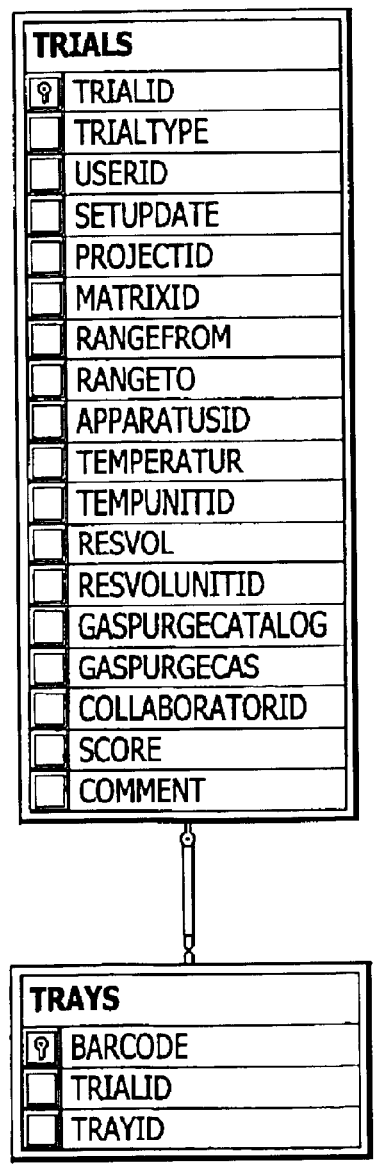

FIG. 255 shows the relationships for the system information table. The key to the system information table is attributes. The system information table has the following fields: attributes, and value.

FIG. 256 shows the relationships for the trays table. The key to the trays table is barcode. The trays table includes the following fields: barcode, trial ID, and tray ID.

Figure 257:
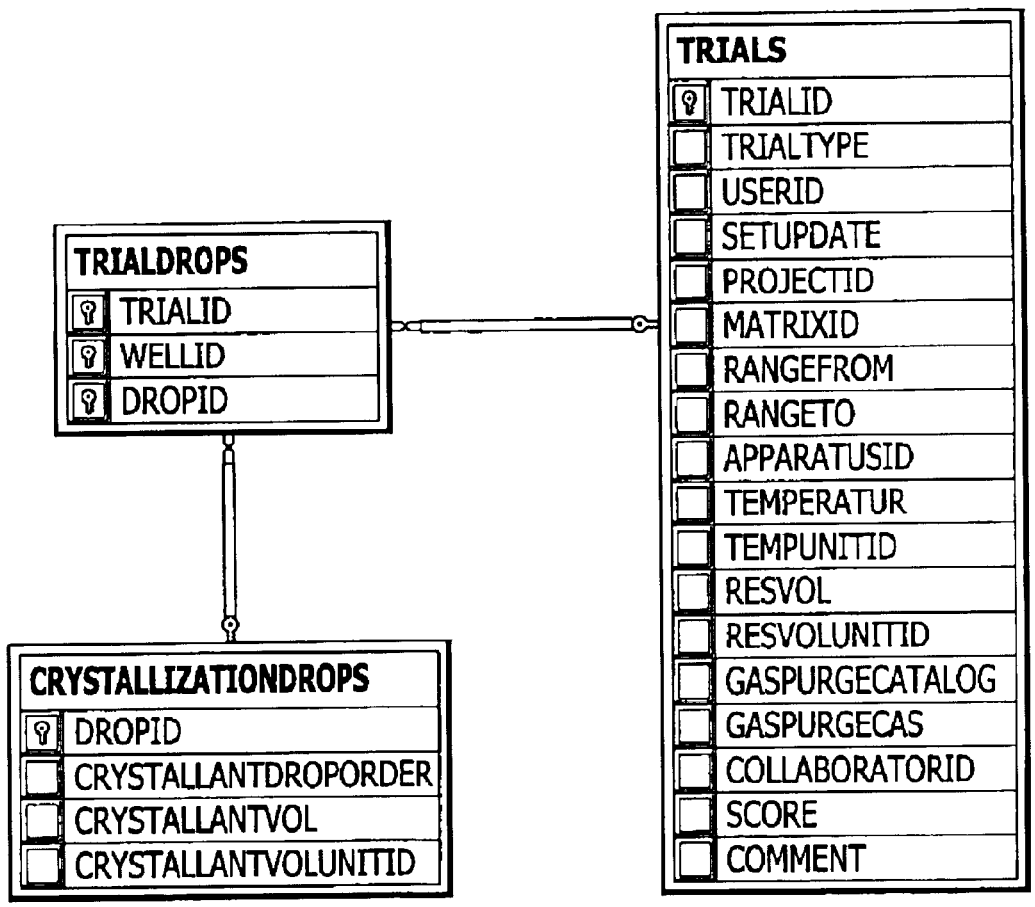

FIG. 257 shows the relationships for the trial drops table. The key to the trial drops table is trial ID, well ID, and drop ID. The trial drops table includes the following fields: trial ID, well ID, and drop ID.

Figure 258:
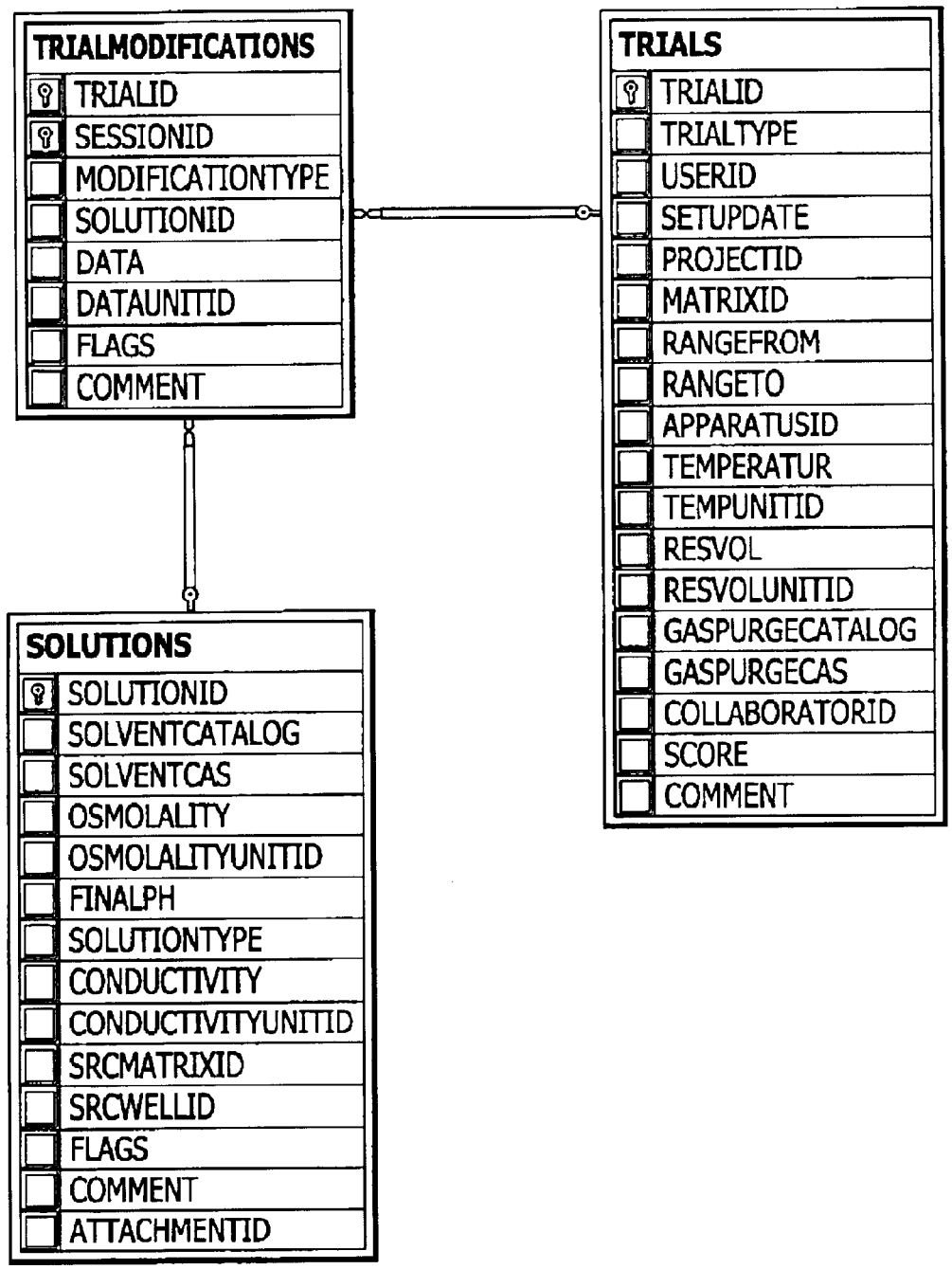

FIG. 258 shows the relationships for the trial modifications table. The key to the trial modifications table is trial ID and session ID. The trial modifications table includes the following fields: trial ID, session ID, modification type, solution ID, data, data unit ID, flags, and comment.

Figure 259:
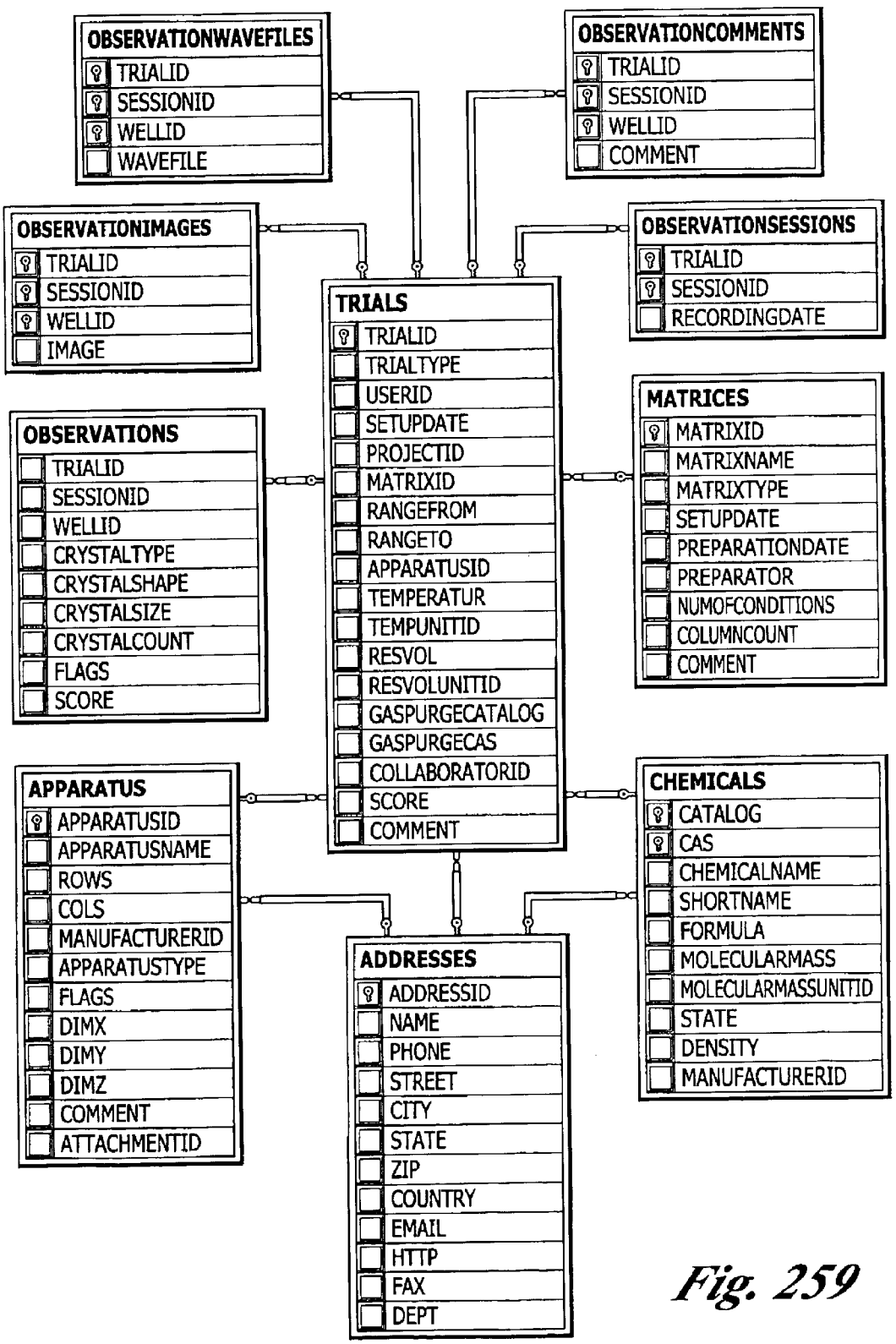
Figure 260:
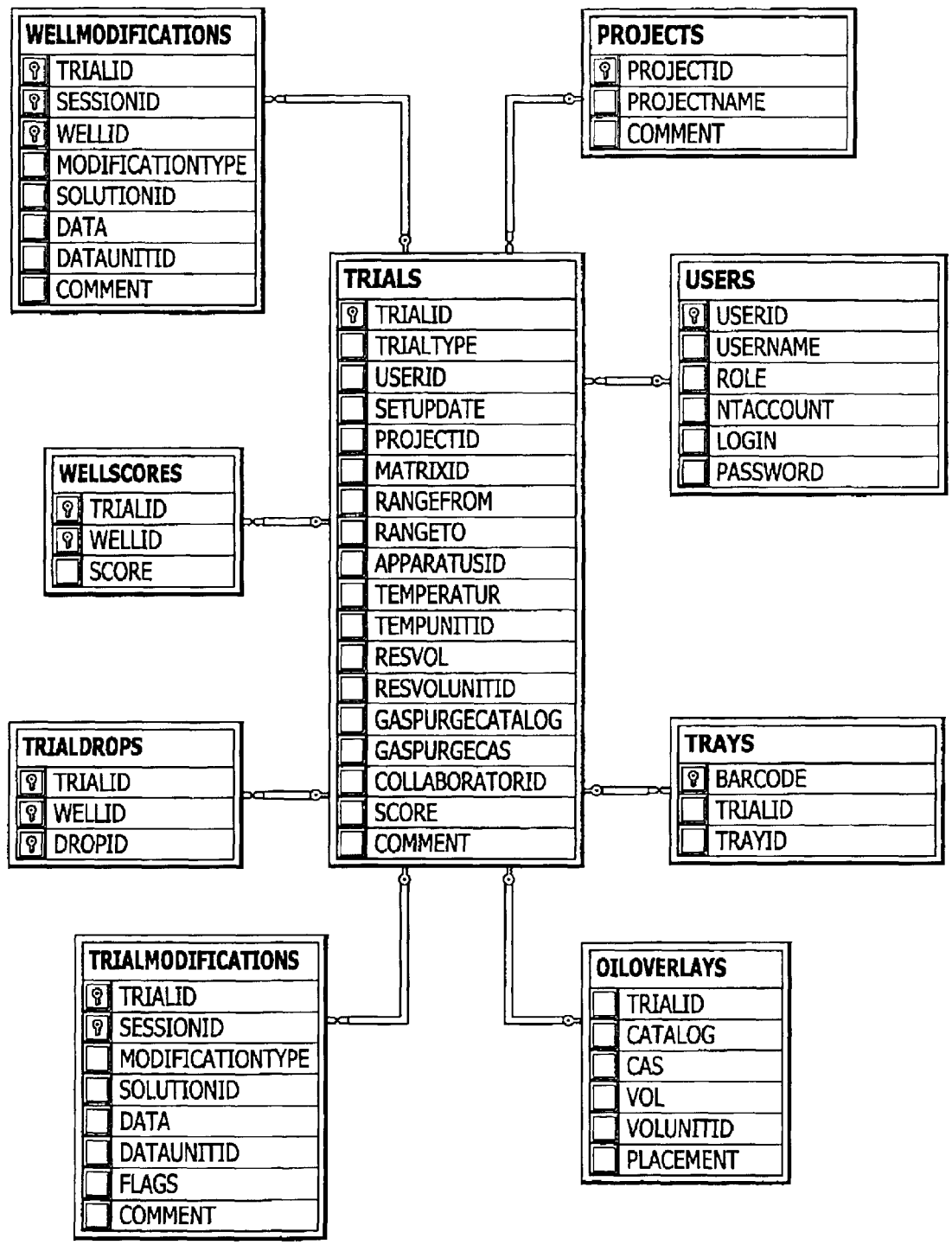

FIGS. 259–260 show the relationships for the trials table. The key to the trials table is trial ID. The trials table includes the following fields. Trial ID, trial type, user ID, setup date, project ID, matrix ID, range from, range to, apparatus ID, temperature, temperature unit ID, reservoir volume, reservoir volume unit ID, gas purge catalog, gas purge CAS, collaborator ID, score, and comment.

Figure 261:
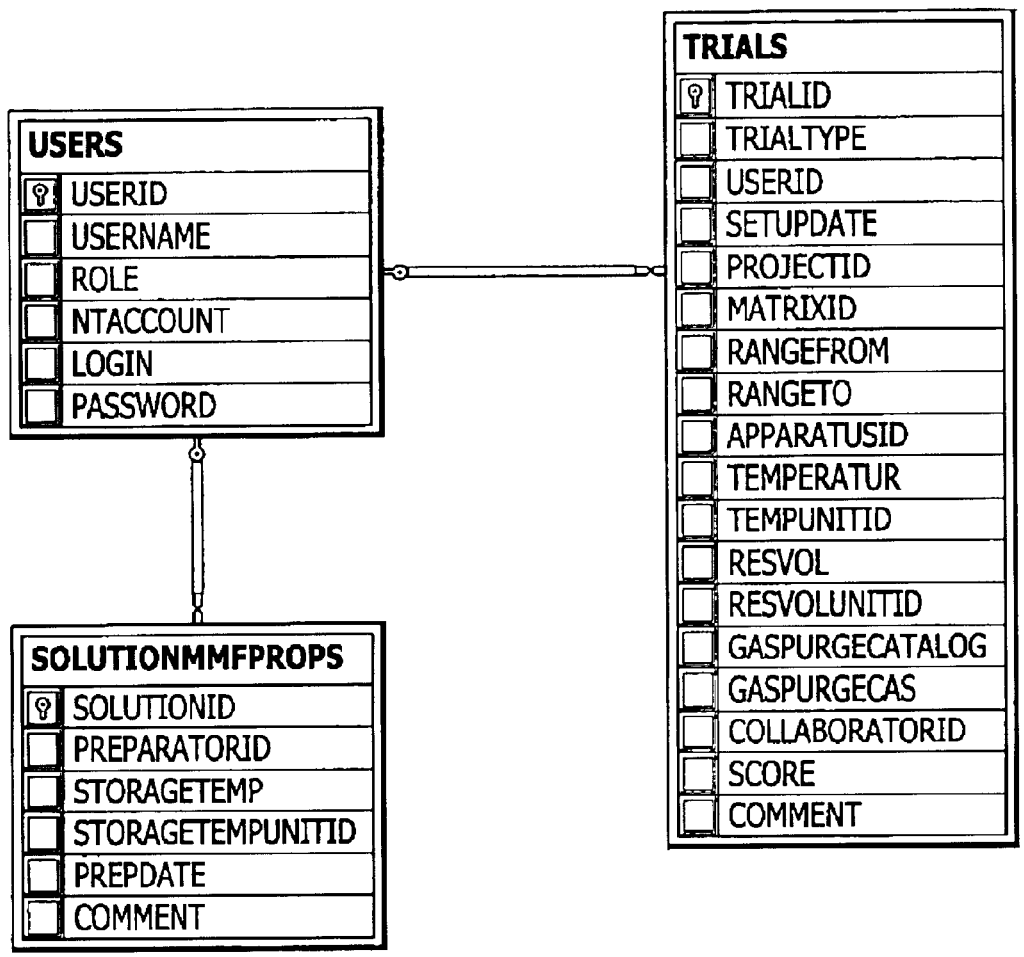

FIG. 261 shows the relationships for the users table. The key to the users table is user ID. The user's table includes the following fields: user ID, user name, row, NT account, login, and password.

Figure 262:
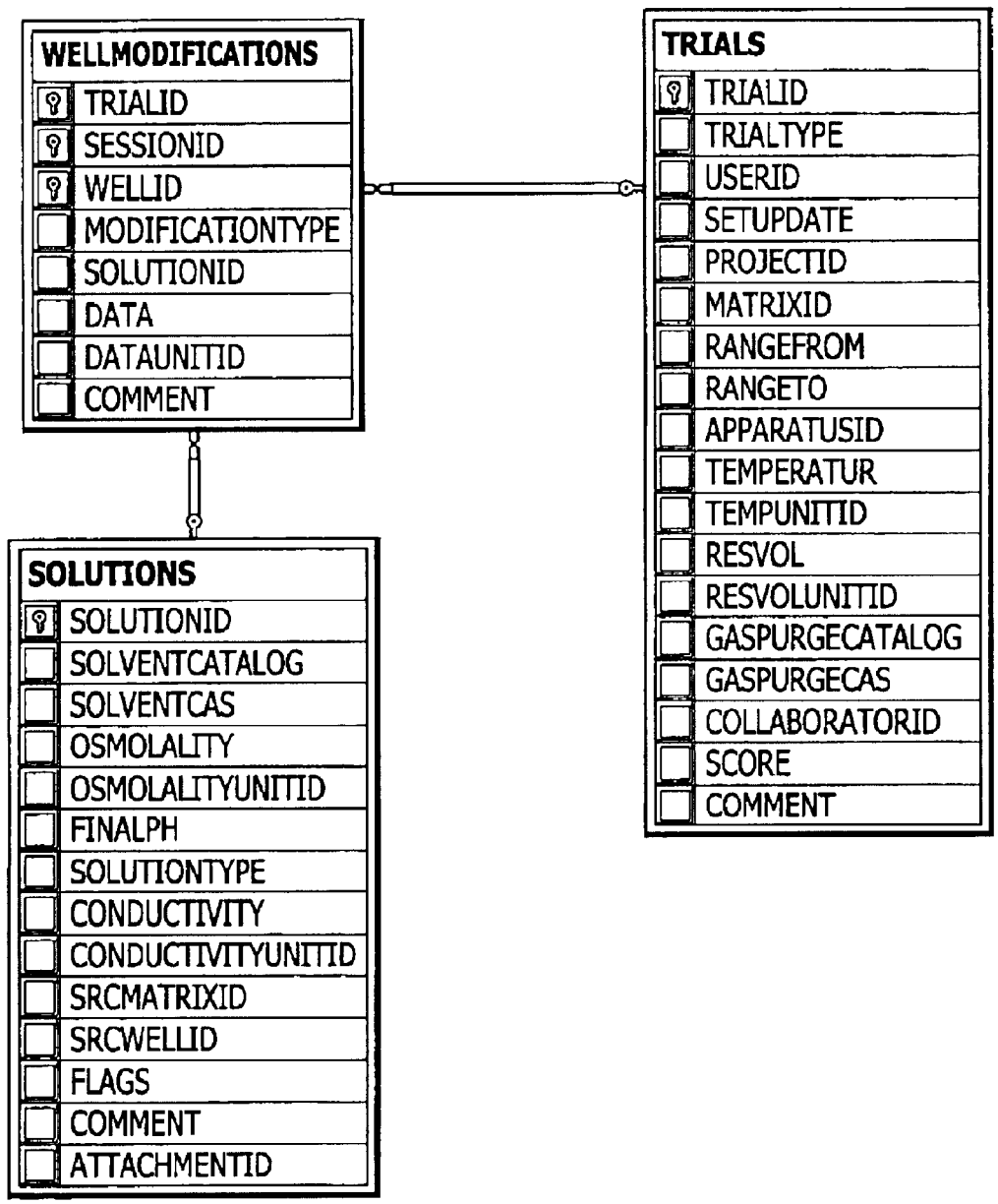

FIG. 262 shows the relationships for the well modifications table. The key to the well modifications table is trial ID, session ID, and well ID. The well modifications table includes the following fields: trial ID, session ID, well ID, modification type, solution type, data, data unit ID, and comment.

Figure 263:
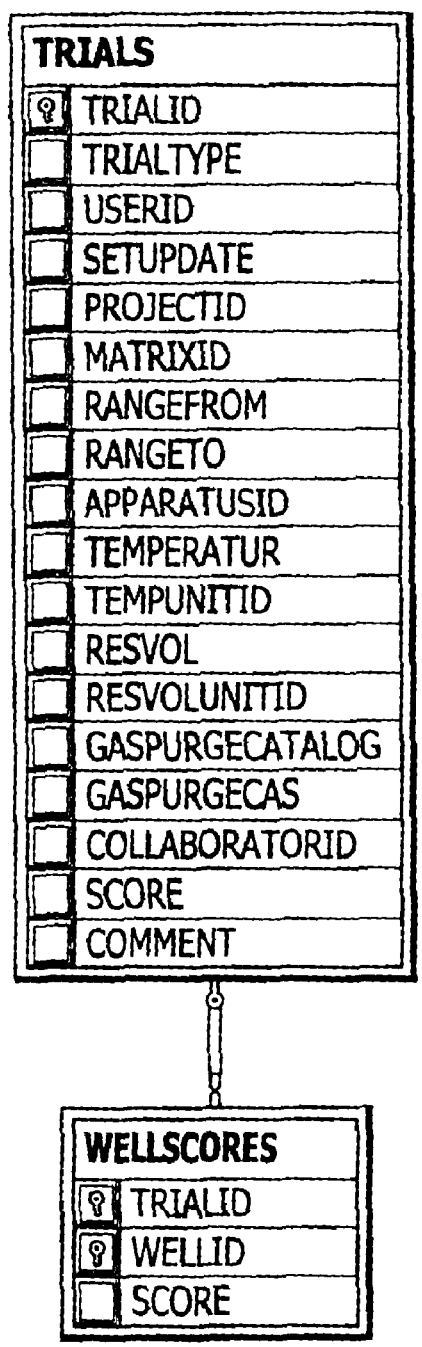

FIG. 263 shows the relationship for the well scores table. The key to the well scores table is trial ID and well ID. The well scores table includes the following fields: trial ID, well ID, and score.

While the preferred embodiment of the invention has been illustrated and described, it will be appreciated that various changes can be made therein without departing from the spirit and scope of the invention.

What is claimed is:

1. Apparatus for creating a database containing the results of crystallization trials, said apparatus comprising:

a visual light microscopy observation system for observing the results of crystallization trials;

a data input system for inputting the results of observing crystallization trials and related information; and a database generator coupled to said data input system for receiving the results of observing crystallization trials and related information and creating a database for storing the results of observing crystallization trials and related information, wherein said data input system further comprises a speech recognition utility to convert a voice command into data characteristic of said crystallization trials.

2. The apparatus claimed in claim 1 wherein said observation system includes an optical system for observing a plurality of trays each including the results of a crystallization trial and a positioning system for selectively positioning a tray of said plurality of trays in an observation position.

3. The apparatus claimed in claim 2 wherein said positioning system is coupled to and controlled by said database generator.

4. The apparatus claimed in claim 1 wherein said data input system includes a microphone for receiving verbal data.

5. The apparatus claimed in claim 4 wherein said data input system includes a feedback speaker for producing said verbal data as it is spoken.

6. The apparatus claimed in claim 5 wherein said data input system includes a bar code scanner.

7. The apparatus claimed in claim 1, wherein said data input system includes a display for displaying the data as pictographs on the display.

8. The apparatus claimed in claim 1, wherein said data generator includes a programmed data processor for processing the results of observing crystallization trials and other information and a storage system for storing the results of said processing.

9. The apparatus claimed in claim 8 wherein said programmed data processor includes a program having a plurality of database managers.

10. The apparatus claimed in claim 9, wherein said plurality of database managers include:
a new trial manager for managing information relating to a crystallization trial set up.

11. The apparatus claimed in claim 10, wherein the new trial manager includes a drop composition builder to capture information relating to crystallization drop components.

12. The apparatus claimed in claim 11, wherein the new trial manager includes a normal trial builder.

13. The apparatus claimed in claim 12, wherein the normal trial builder includes a copy wells builder to capture well condition information from a single matrix of crystallants.

14. The apparatus claimed in claim 11, wherein the new trial manager includes a complex trial builder.

15. The apparatus claimed in claim 14, wherein the complex trial builder includes a copy wells builder to capture well condition information from a plurality of matrices having crystallants.

16. The apparatus claimed in claim 11, wherein the new trial manager includes a combinatorial trial builder.

17. The apparatus claimed in claim 16, wherein the combinatorial trial builder includes a copy wells builder to capture well condition information in quad form.

18. The apparatus claimed in claim 10, further comprising an existing trial manager to manage information relating to an existing trial.

19. The apparatus claimed in claim 18, wherein the existing trial manager includes a drop composition calculator.

20. The apparatus claimed in claim 18, wherein the existing trial manager includes a trial observation recording builder to capture crystallization trial results.

21. The apparatus claimed in claim 20, wherein the trial observation recording builder includes a speech recognition builder for providing options for structuring verbal data input.

22. The apparatus claimed in claim 21, wherein the speech recognition builder includes a voice command builder for customizing voice commands to include descriptors.

23. The apparatus claimed in claim 22, wherein the voice command builder includes user definable voice commands for recognizing any one of a plurality of voice commands.

24. The apparatus claimed in claim 10, further comprising a solution manager to manage information relating to solutions.

25. The apparatus claimed in claim 24, wherein the solution manager includes a solution builder to capture information relating to a solution.

26. The apparatus claimed in claim 25, wherein the solution includes a chemical selected from at least one of buffering agents, chelators, cryocoolants, CSIs, detergents, gases, heavy atom compounds, metals, nucleation suppressants, organic compounds, pH conjugates, precipitants, reducing agents, salts or solvents.

27. The apparatus claimed in claim 25, wherein the solution builder can build a solution selected from at least one of additive, formulation, heavy atom, stock or buffer solutions.

28. The apparatus claimed in claim 10, further comprising a matrix manager to manage information relating to a matrix of crystallant conditions.

29. The apparatus claimed in claim 28, wherein the matrix manager includes a stock solution volume calculator to create new stock solutions for use in building matrices.

30. The apparatus claimed in claim 29, wherein the matrix manager includes a new matrix builder to capture data relating to a new matrix of crystallants.

31. The apparatus claimed in claim 10, further comprising a compound buffer manager to manage information relating to compound buffer systems.

32. The apparatus claimed in claim 31, wherein the compound buffer manager includes a new compound buffer builder to capture data relating to a buffering system.

33. The apparatus claimed in claim 10, further comprising a chemical manager to manage information relating to chemicals.

34. The apparatus claimed in claim 33, wherein the chemical manager includes a chemical builder to capture data relating to chemicals relating to crystallization trials.

35. The apparatus claimed in claim 34, wherein the chemical is selected from at least one of buffering agents, chelators, cryocoolants, CSIs, detergents, gases, heavy atom compounds, metals, nucleation suppressants, organic compounds, pH conjugates, precipitants, reducing agents, salts or solvents or any combination thereof.

36. The apparatus claimed in claim 10, further comprising an apparatus manager to manage information relating to an apparatus used in a crystallization trial environment.

37. The apparatus claimed in claim 36, wherein the apparatus manager includes a new apparatus builder for capturing data relating to a new crystallization plate.

38. The apparatus claimed in claim 37, wherein the new apparatus builder includes an automatic fill wells builder for capturing information relating to the crystallization plate.

39. The apparatus claimed in claim 37, wherein the new apparatus builder includes a manual fill wells builder for capturing information relating to the crystallization plate.

40. The apparatus claimed in claim 36, wherein the apparatus manager includes an update apparatus builder for capturing information relating to an existing apparatus.

41. The apparatus claimed in claim 10, further comprising a subunit manager for managing information relating to a macromolecule subunit.

42. The apparatus claimed in claim 41, wherein the subunit manager includes a new subunit builder for capturing information relating to a new macromolecule subunit.

43. The apparatus claimed in claim 41, wherein the subunit manager includes an update subunit builder for capturing information relating to an existing macromolecule subunit.

44. The apparatus claimed in claim 41, wherein the subunit is from the class selected from at least one of proteins, DNA, RNA, protein-DNA complexes, protein-RNA complexes, DNA duplexes, RNA duplexes, DNA-RNA duplexes, glycoproteins, phosphoproteins, membrane proteins or any combination thereof.

45. The apparatus claimed in claim 10, further comprising a macromolecule manager for managing information relating to a macromolecule relating to a crystallization trial.

46. The apparatus claimed in claim 45, wherein the macromolecule manager includes a new macromolecule builder for capturing information relating to a new macromolecule relating to a crystallization trial.

47. The apparatus claimed in claim 45, wherein the macromolecule is selected from at least one of proteins, DNA, RNA, protein-DNA complexes, protein-RNA complexes, DNA duplexes, RNA duplexes, DNA-RNA duplexes, glycoproteins, phosphoproteins, membrane proteins or any combination thereof.

48. The apparatus claimed in claim 10, further comprising a macromolecule formulation manager for managing macromolecule formulations relating to a crystallization trial.

49. The apparatus claimed in claim 48, wherein the macromolecule formulation manager includes a new macromolecule formulation builder for capturing information relating to a macromolecule formulation.

50. The apparatus claimed in claim 10, further comprising a complex macromolecule formulation manager for managing information relating to a complex macromolecule formulation relating to a crystallization trial.

51. The apparatus claimed in claim 50, wherein the complex macromolecule formulation manager includes a new complex macromolecule formulation builder for capturing information relating to a complex macromolecule formulation.

52. The apparatus claimed in claim 10, further comprising a manufacturer manager for managing information relating to manufacturers of chemicals and apparatuses relating to crystallization trials.

53. The apparatus claimed in claim 52, wherein the manufacturer manager includes a new manufacturer builder to capture information relating to a new manufacturer.

54. The apparatus claimed in claim 52, wherein the manufacturer manager includes an update manufacturer builder to capture information relating to an existing manufacturer.

55. The apparatus claimed in claim 10 further comprising a collaborator manager to manage information relating to a collaborator.

56. The apparatus claimed in claim 55, wherein the collaborator manager includes a new collaborator builder to capture information relating to a new collaborator.

57. The apparatus claimed in claim 55, wherein the collaborator manager includes an update collaborator builder for capturing information relating to an existing collaborator.

58. The apparatus claimed in claim 10, further comprising a project manager for managing information relating to a project.

59. The apparatus claimed in claim 58, wherein the project manager includes a new project builder for capturing information relating to a new project.

60. The apparatus claimed in claim 58, wherein the project manager includes an update project builder for capturing information relating to an existing project.

61. The apparatus claimed in claim 10, further comprising a user manager for managing information relating to a user associated with a crystallization trial.

62. The apparatus claimed in claim 61, wherein the user manager includes a new user builder for capturing information relating to a new user associated with a crystallization trial.

63. The apparatus claimed in claim 61, wherein the user manager includes an update user builder to capture information relating to an existing user of a crystallization trial.

64. A computer implementable method of creating a database of crystallization trials and related information, said method comprising:
receiving via a dialog window, trial data, said trial data including information regarding the crystallization conditions to be used in a crystallization trial;
storing said received trial data in the database;
receiving, via a verbal input device, crystallization result data observed through visual light microscopy, said data including crystal type, crystal size, crystal shape, and crystal count; and
storing said received crystallization result data in the database.

65. The method claimed in claim 64, further comprising:
receiving, via a dialog window, solution data, said solution data including solution type selected from at least one of additive, formulation, heavy atom, buffer solution, or stock solution; and
storing said solution data in the database.

66. The method claimed in claim 64, further comprising:
receiving, via a dialog window, matrix data, said matrix data including matrix well conditions; and
storing said matrix data in a database.

67. The method claimed in claim 64, further comprising:
receiving, via a dialog window, chemical data, said chemical data including chemical category selected from at least one of buffering agents, chelators, cryocoolants, CSIs, detergents, gasses, heavy atom compounds, metals, nucleation suppressants, organics, pH conjugates, precipitants, reducing agents, salts, or solvents; and
storing said chemical data in the database.

68. The method claimed in claim 64, further comprising:
receiving, via a dialog window, apparatus data, said apparatus data including drop chamber coordinates, reservoir chamber coordinates, drop chamber diameter, reservoir chamber diameter, drop chamber maximum volume, and reservoir chamber maximum volume;
and storing said apparatus data in the database.

69. The method claimed in claim 64, further comprising:
receiving via a dialog window, subunit data, said subunit data including subunit class selected from at least one of proteins, DNAs, RNAs, protein-DNA complexes, protein-RNA complexes, DNA duplexes, RNA duplexes, DNA-RNA duplexes, glycoproteins, phosphoproteins, membrane proteins or any combination thereof; and
storing said subunit data in the database.

70. The method claimed in claim 64, further comprising macromolecule data, said macromolecule data including molecule class selected from at least one of proteins, DNAs, RNAs, protein-DNA complexes, protein-RNA complexes, DNA duplexes, RNA duplexes, DNA-RNA duplexes, glycoproteins, phosphoproteins, membrane proteins or any combinations thereof; and
storing said macromolecule data in the database.

71. A computer readable medium having a plurality of computer executable database managers for creating a database of the results of crystallization trials and related information, said database manager including:
a trial manager for entering into the database trial information.

72. The computer readable medium of claim 71, further comprising a normal trial builder, a complex trial builder, and a combinatorial trial builder.

73. A computer readable medium having a plurality of computer executable database managers for creating a database of the results of crystallization trials and related information, wherein said results are observed by visual light microscopy, said database manager including:
a matrix manager for entering into the database matrix information; and
a chemical manager for entering into the database chemical information.

74. The computer readable medium of claim 73, further comprising a new matrix builder for entering new matrix information into the database.

75. The computer readable medium of claim 73, further comprising a new chemical builder and an update chemical builder for entering new and updated chemical information.

76. A computer readable medium having a plurality of computer executable database managers for creating a database of the results of crystallization trials and related information, wherein said results are observed by visual light microscopy, said database managers including:

an apparatus manager for entering into the database apparatus information; and a manufacturer manager for entering into the database manufacturer information.

77. The computer readable medium of claim 76, further comprising a new and an update apparatus builder, for entering into the database new and updated apparatus information.

78. The computer readable medium of claim 76, further comprising a new and an update manufacturer builder, for entering into the database new and updated manufacturer information.

79. A computer readable medium having a plurality of computer executable database managers for creating a database of the results of crystallization trials and related information, wherein said results are observed by visual light microscopy, said database managers including:

a subunit manager for entering into the database subunit information.

80. The computer readable medium of claim 79, further comprising a new and an update subunit builder, for entering into the database new and updated subunit information.

81. The computer readable medium of claim 80 further including:

a macromolecule manager for entering into the database macromolecule information.

82. The computer readable medium of claim 81, further including:

a new macromolecule builder for entering into the database new macromolecule information.

83. The computer readable medium of claim 80 further including:

a macromolecule formulation manager for entering into the database macromolecule formulation information.

84. The computer readable medium of claim 83, further including a new macromolecule formulation builder for entering into the database new macromolecule formulation information.

85. The computer readable medium of claim 80 further including:

a complex macromolecule formulation manager for entering into the database complex macromolecule formulation information.

86. The computer readable medium of claim 85, further including:

a new complex macromolecule formulation builder for entering into the database new complex macromolecule formulation information.

87. A computer readable medium having stored thereon a crystallization trial results data structure, wherein said results are observed by visual light microscopy, said data structure including at least the following fields:

a chemical type ID field;

a CAS field; and a catalog field.

88. The computer readable medium of claim 87, wherein the chemical type is selected from at least one of buffering agents, chelators, cryocoolants, CSIs, detergents, gasses, heavy atom compounds, metals, nucleation suppressants, organic compounds, pH conjugates, precipitants, reducing agents, salts, solvents, or any combination thereof.

89. A computer readable medium having stored thereon a crystallization trial results data structure as claimed in claim 1, further including the following fields:

crystal type;

crystal size;

crystal count; and crystal shape.

90. A computer readable medium having stored thereon a crystallization trial results data structure as claimed in claim 89, further including the following field:

macromolecule class ID.

91. The computer readable medium of claim 90, wherein the macromolecule class is selected from at least one of proteins, DNAs, RNAs, protein-DNA complexes, protein-RNA complexes, DNA duplexes, RNA duplexes, DNA-RNA duplexes, glycoproteins, phosphoproteins, membrane proteins, or any combination thereof.

92. A computer readable medium having stored thereon a crystallization trial results data structure as claimed in claim 89, further including the following field:

session ID.

93. The apparatus of claim 1, further comprising a digital camera mounted to the visual light microscopy observation system, wherein said digital camera captures images of said results of crystallization trials.

94. The apparatus of claim 1, wherein said visual light microscopy observation system includes a microscope for observing the results of crystallization trials.

* * * * *